United States Patent
Yu et al.

(10) Patent No.: US 6,617,098 B1
(45) Date of Patent: Sep. 9, 2003

(54) MERGED-MASK MICRO-MACHINING PROCESS

(75) Inventors: Lianzhong Yu, Stafford, TX (US); Robert P. Ried, Stafford, TX (US); Howard D. Goldberg, Sugar Land, TX (US); Duli Yu, Sugar Land, TX (US)

(73) Assignee: Input/Output, Inc., Stafford, TX (US)

( * ) Notice: Subject to any disclaimer, the term of this patent is extended or adjusted under 35 U.S.C. 154(b) by 0 days.

(21) Appl. No.: 09/352,025

(22) Filed: Jul. 13, 1999

(51) Int. Cl.⁷ .............................. G03F 7/00; G03F 7/207
(52) U.S. Cl. ........................ 430/323; 430/311; 430/312; 430/313; 430/314; 430/316; 430/324
(58) Field of Search .................. 430/311, 312, 430/313, 314, 316, 323, 394

(56) References Cited

U.S. PATENT DOCUMENTS

| | | | | |
|---|---|---|---|---|
| 4,791,046 A | * | 12/1988 | Ogura | 430/296 |
| 4,902,377 A | | 2/1990 | Berglund et al. | 156/643 |
| 4,985,374 A | | 1/1991 | Tsuji et al. | 437/229 |
| 5,006,202 A | | 4/1991 | Hawkins et al. | 156/644 |
| 5,091,339 A | | 2/1992 | Carey | 437/187 |
| 5,131,978 A | | 7/1992 | O'Neill | 156/653 |
| 5,185,055 A | * | 2/1993 | Temple et al. | 156/630 |
| 5,329,152 A | * | 7/1994 | Janai et al. | 257/529 |
| 5,589,303 A | * | 12/1996 | DeMarco et al. | 430/5 |
| 5,635,337 A | * | 6/1997 | Bartha et al. | 430/323 |
| 5,641,610 A | * | 6/1997 | Bartha et al. | 430/313 |
| 5,667,940 A | * | 9/1997 | Hsue et al. | 430/312 |
| 5,738,757 A | | 4/1998 | Burns et al. | 156/644.1 |
| 5,753,417 A | | 5/1998 | Ulrich | 430/312 |
| 5,858,620 A | * | 1/1999 | Ishibashi et al. | 430/313 |
| 5,914,801 A | | 6/1999 | Dhuler et al. | 359/230 |
| 5,922,218 A | | 7/1999 | Miyata et al. | 216/27 |
| 5,935,734 A | * | 8/1999 | Pierrat | 430/5 |
| 5,959,760 A | | 9/1999 | Yamada et al. | 359/224 |
| 5,989,783 A | * | 11/1999 | Huggins et al. | 430/316 |
| 6,110,624 A | * | 8/2000 | Hibbs et al. | 430/5 |
| 6,110,648 A | * | 8/2000 | Jang | 430/312 |
| 6,190,809 B1 | * | 2/2001 | Tzu et al. | 430/5 |
| 6,200,906 B1 | * | 3/2001 | Bartha et al. | 438/708 |
| 6,277,543 B1 | * | 8/2001 | Furukawa et al. | 430/311 |
| 6,379,869 B1 | * | 4/2002 | Schroeder et al. | 430/313 |

FOREIGN PATENT DOCUMENTS

EP  0359417 A2 A3  3/1990

OTHER PUBLICATIONS

IBM Technical Disclosure Bulletin, vol. 32, No. 8A, Jan. 1990, *Method to Incorporate Three Sets of Pattern Information into Two Photo–masking steps*, pp. 218 & 219.

* cited by examiner

*Primary Examiner*—Janet Baxter
*Assistant Examiner*—Amanda C. Walke
(74) *Attorney, Agent, or Firm*—Madan, Mossman & Sriram, P.C.

(57) ABSTRACT

A merged-mask micro-machining process is provided that includes the application of a plurality of layers of masking material that are patterned to provide a plurality of etching masks.

55 Claims, 153 Drawing Sheets

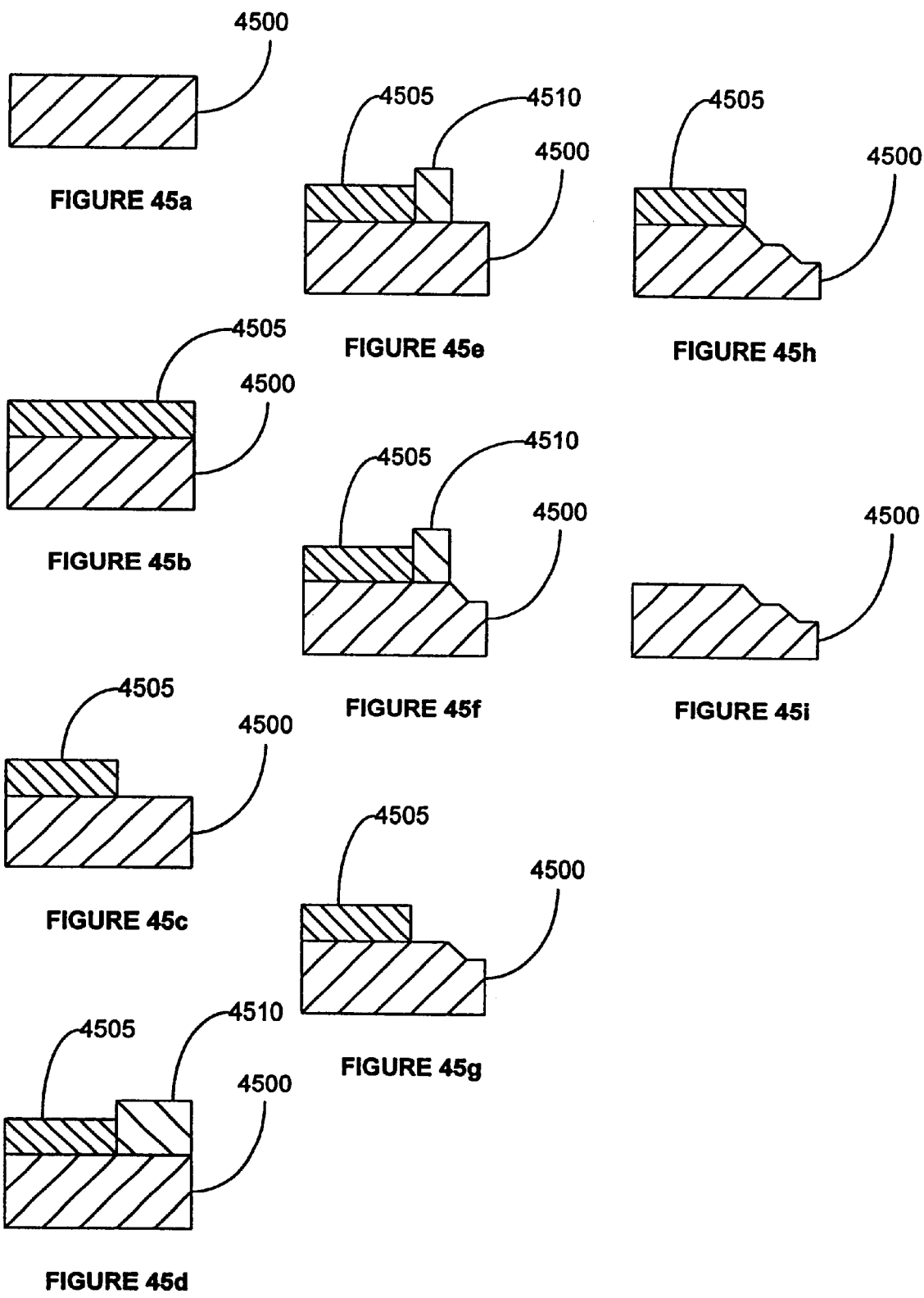

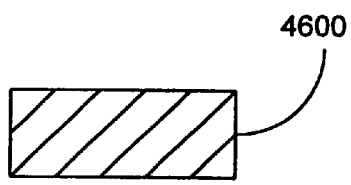
FIGURE 46a
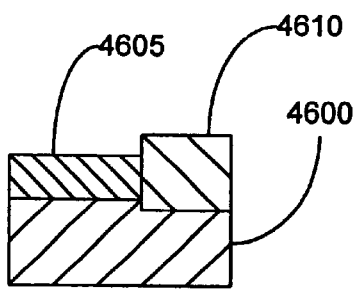
FIGURE 46e
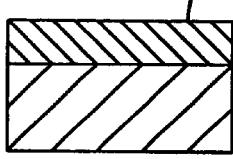
FIGURE 46b
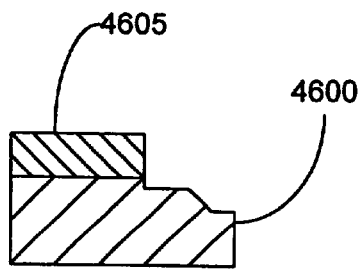
FIGURE 46h
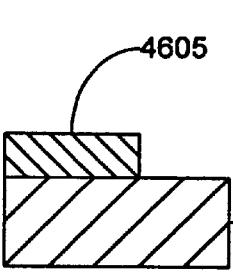
FIGURE 46c
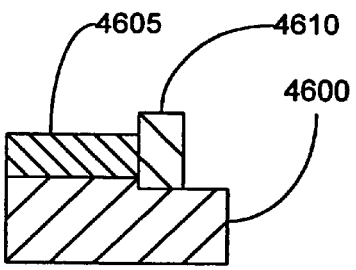
FIGURE 46f
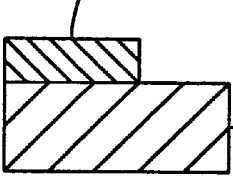
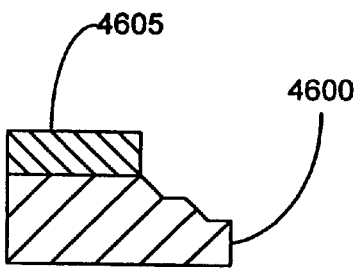
FIGURE 46i
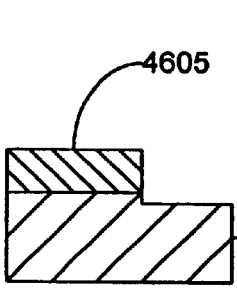
FIGURE 46d
FIGURE 46g
FIGURE 46j

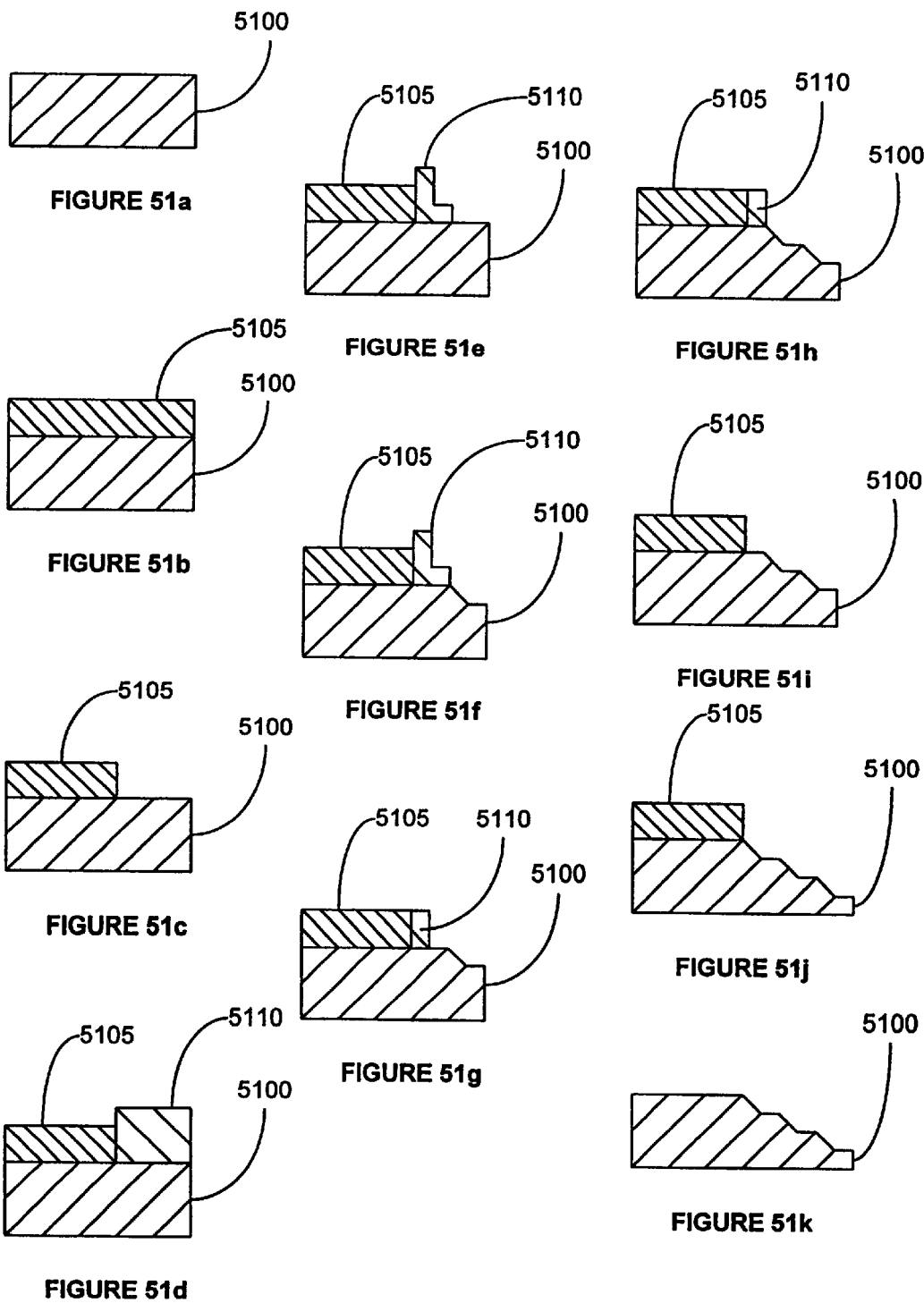

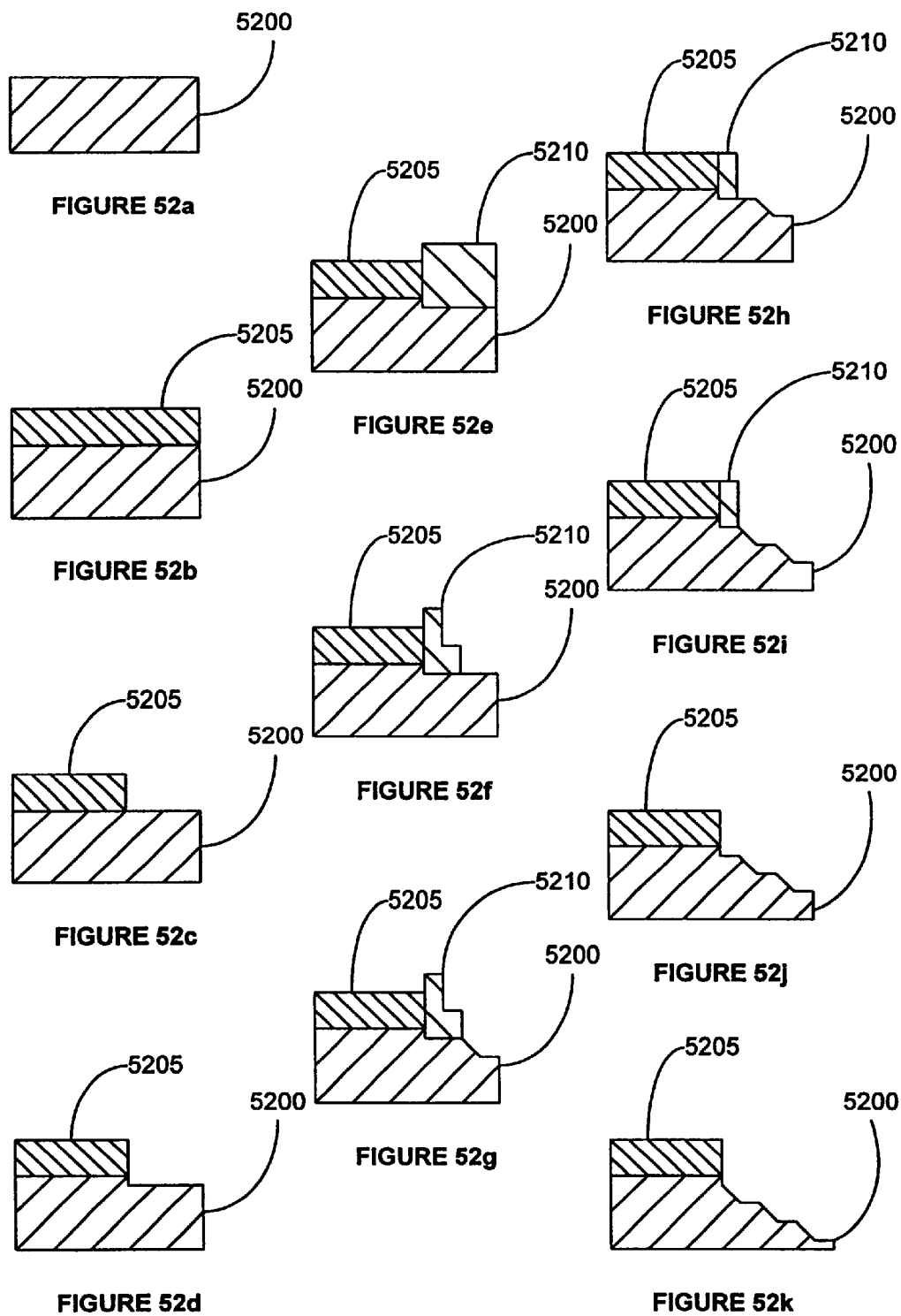

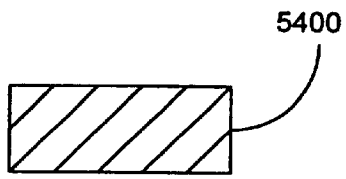
FIGURE 54a
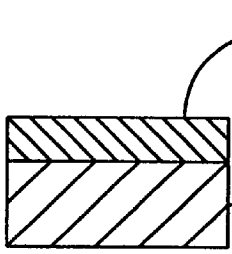
FIGURE 54b
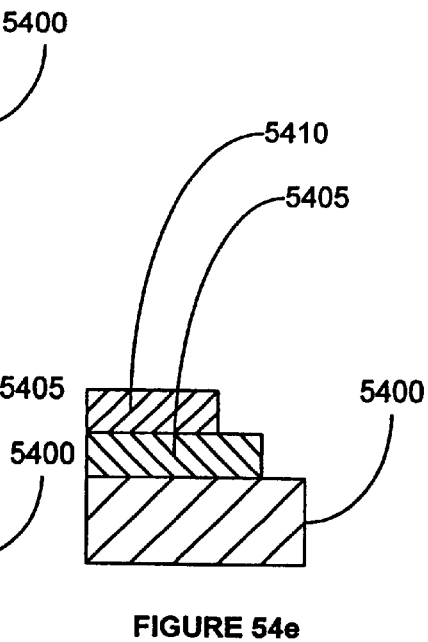
FIGURE 54e
FIGURE 54f
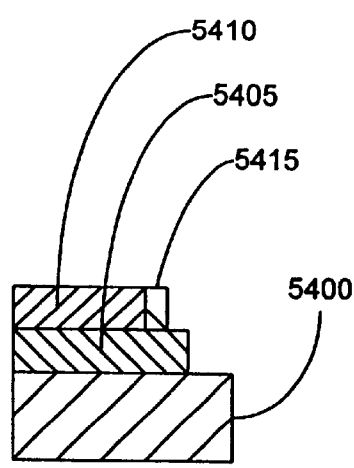
FIGURE 54g
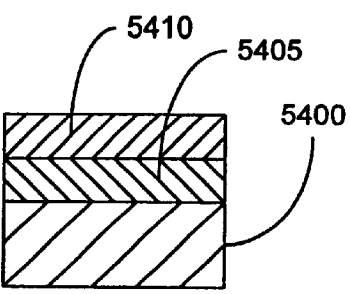
FIGURE 54c
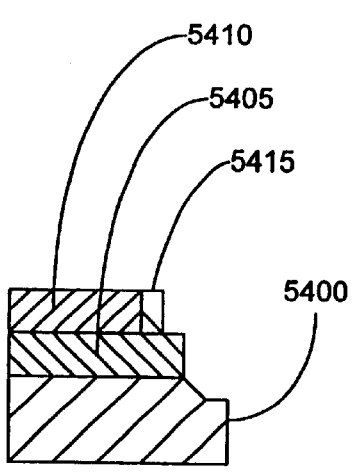
FIGURE 54h
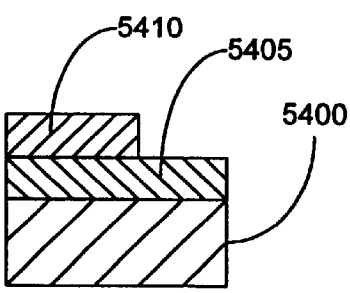
FIGURE 54d
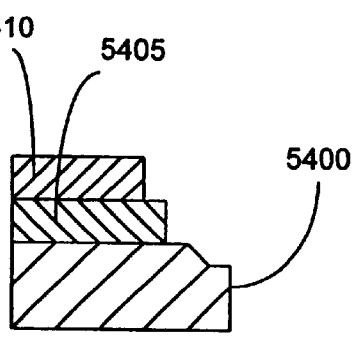
FIGURE 54i

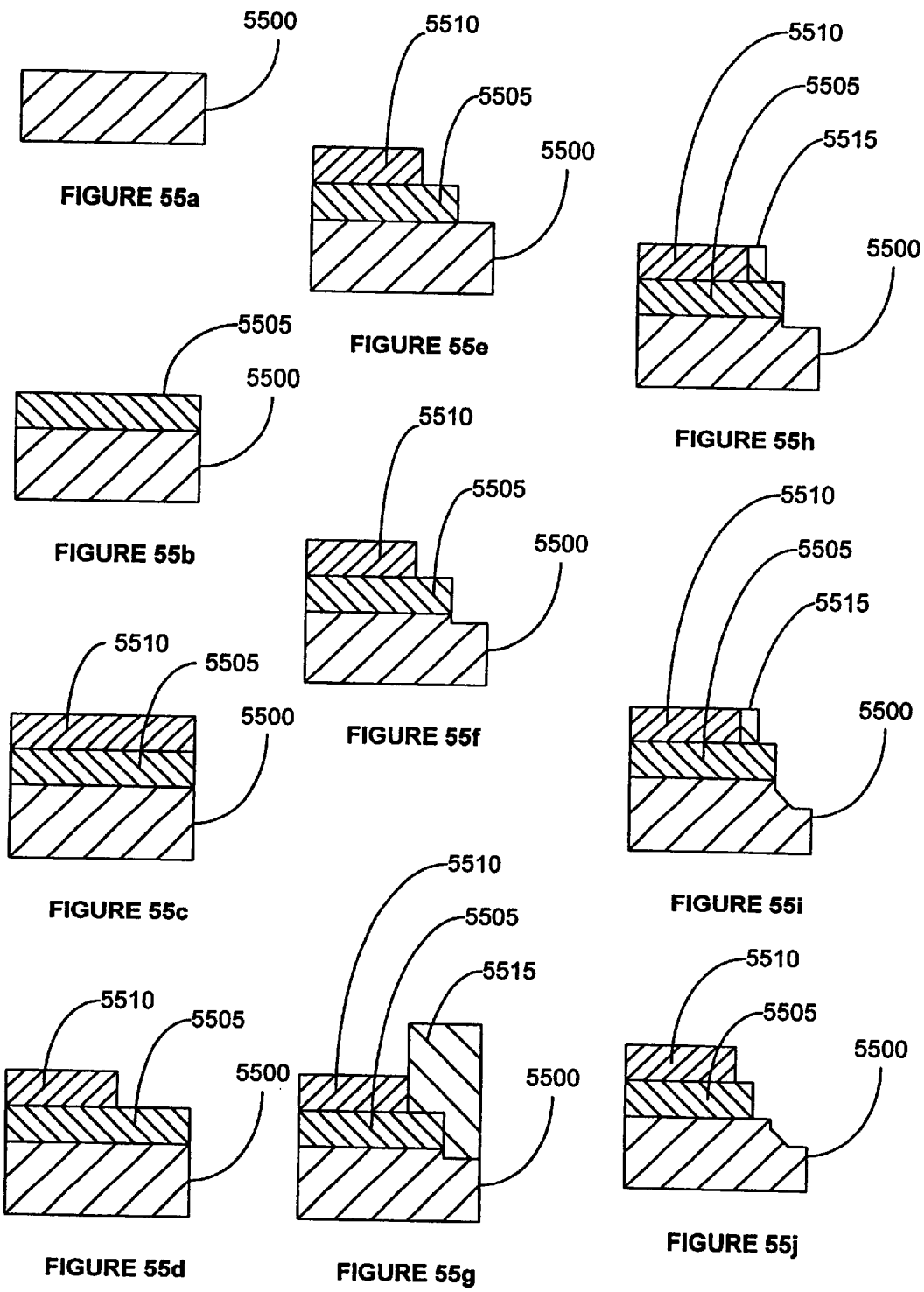

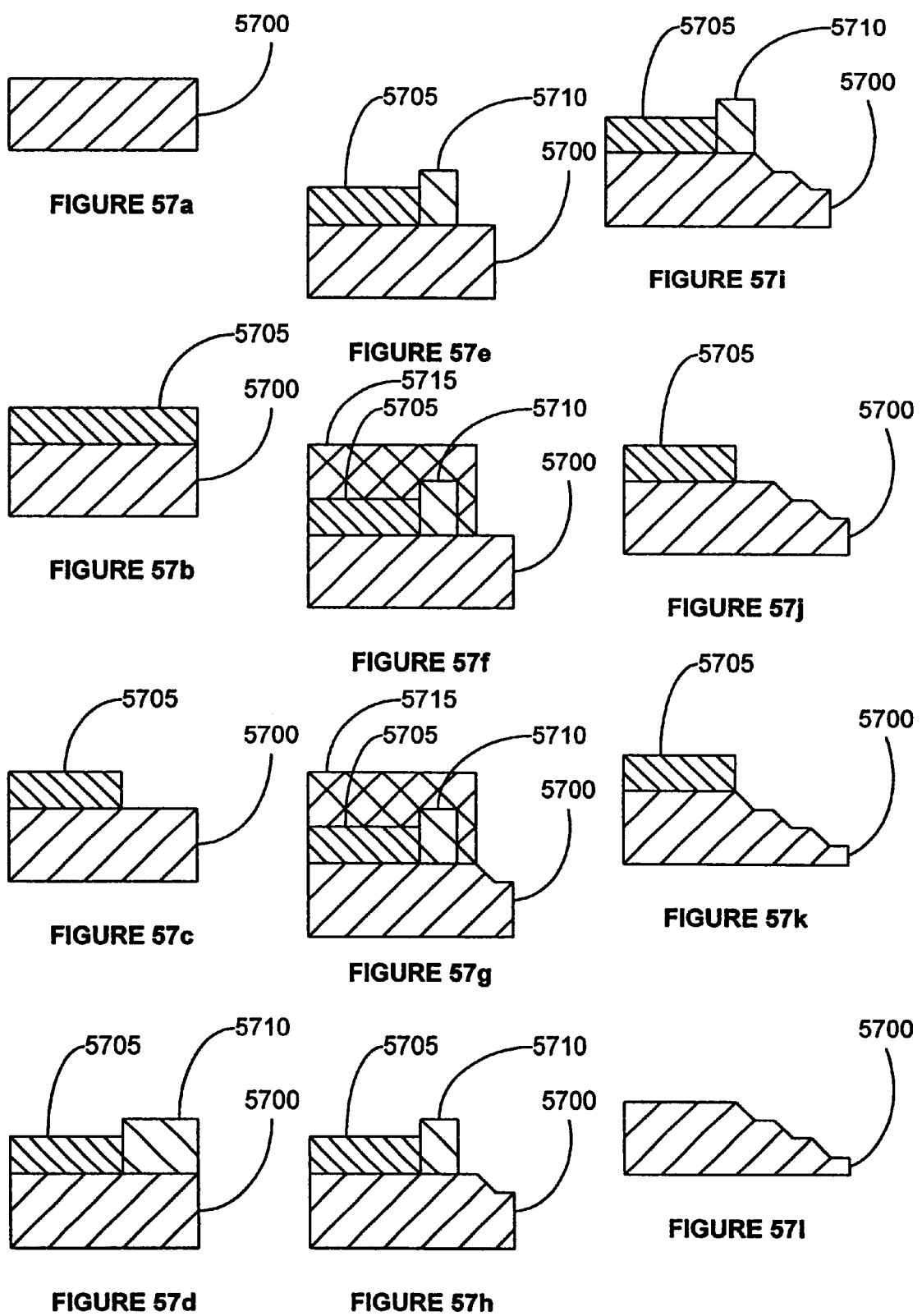

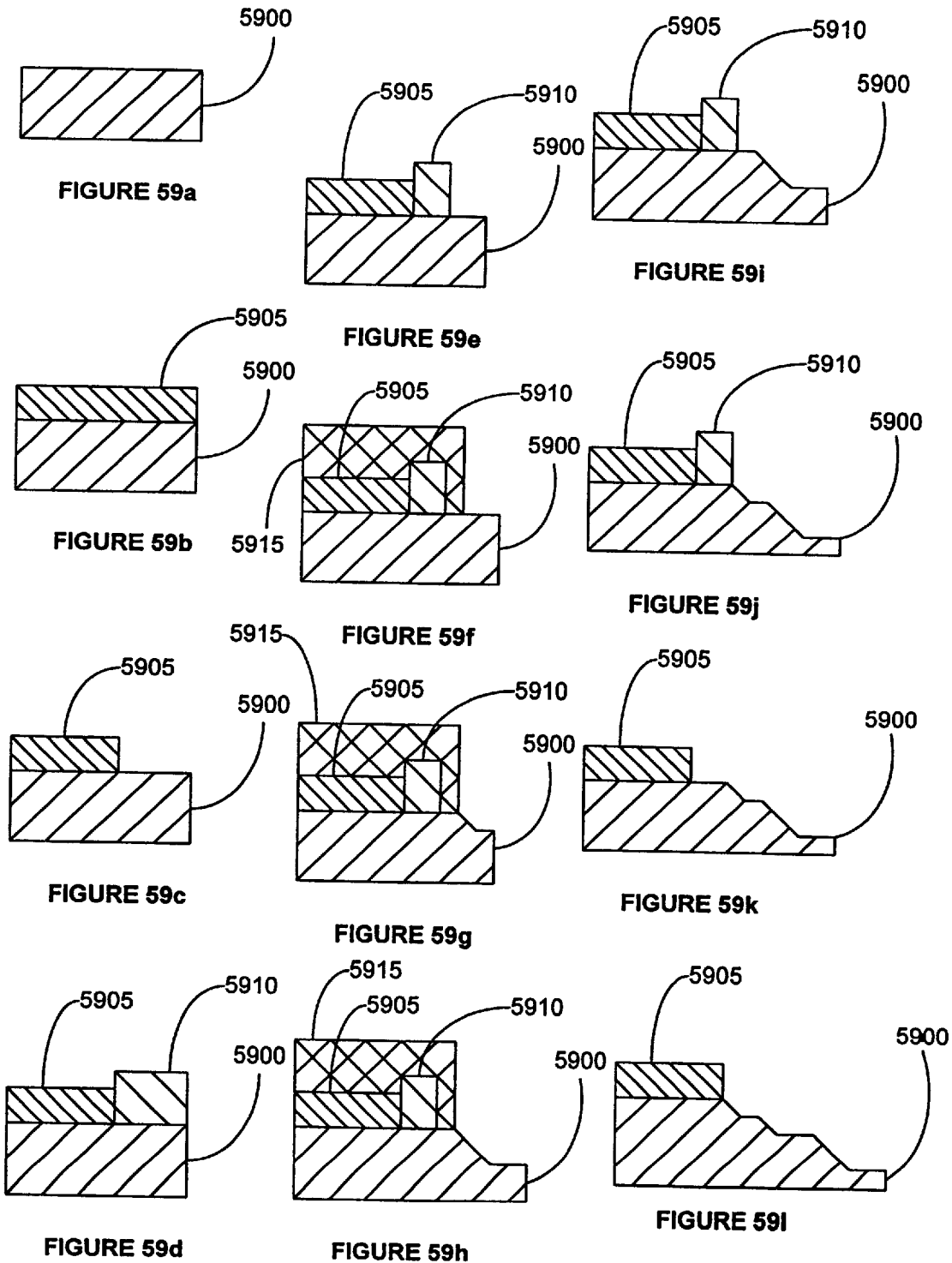

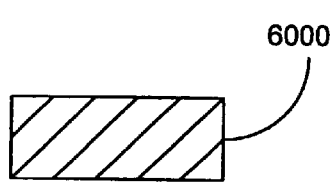
FIGURE 60a
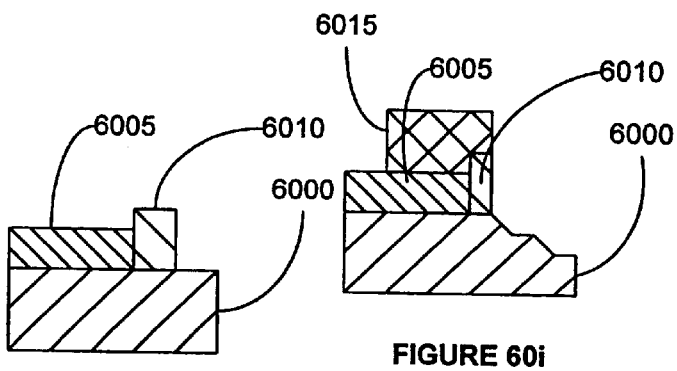
FIGURE 60e
FIGURE 60i
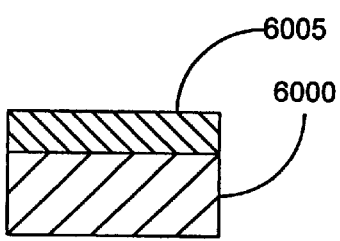
FIGURE 60b
FIGURE 60f
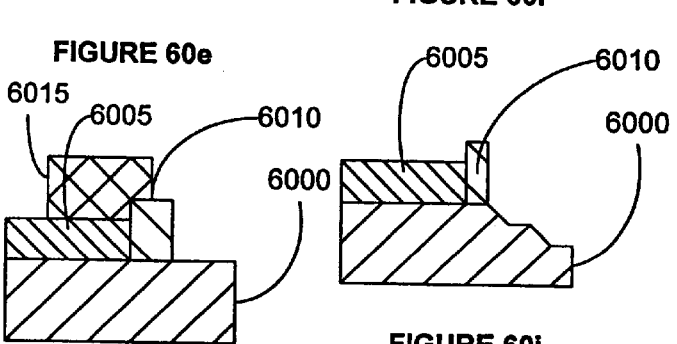
FIGURE 60j
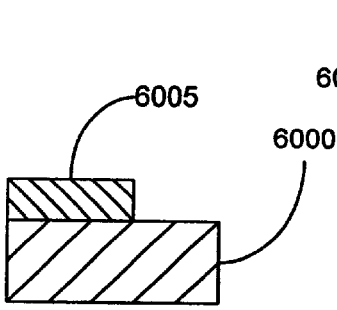
FIGURE 60c
FIGURE 60g
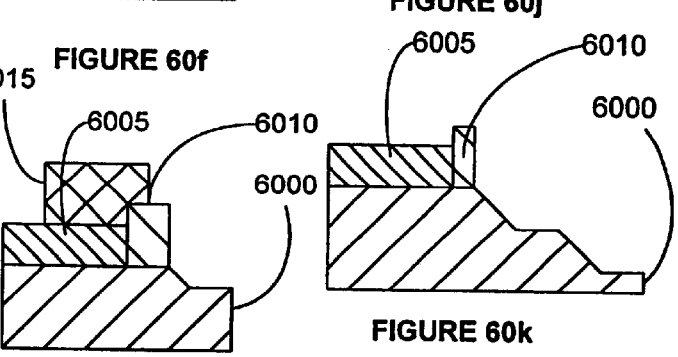
FIGURE 60k
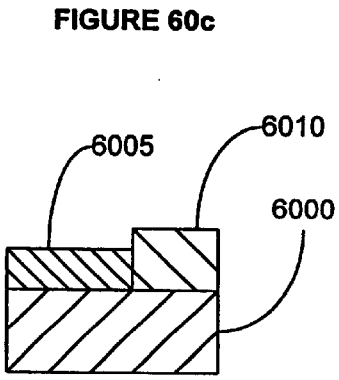
FIGURE 60d
FIGURE 60h
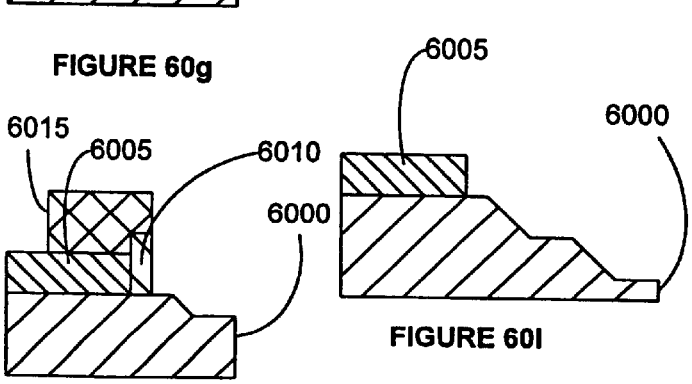
FIGURE 60l

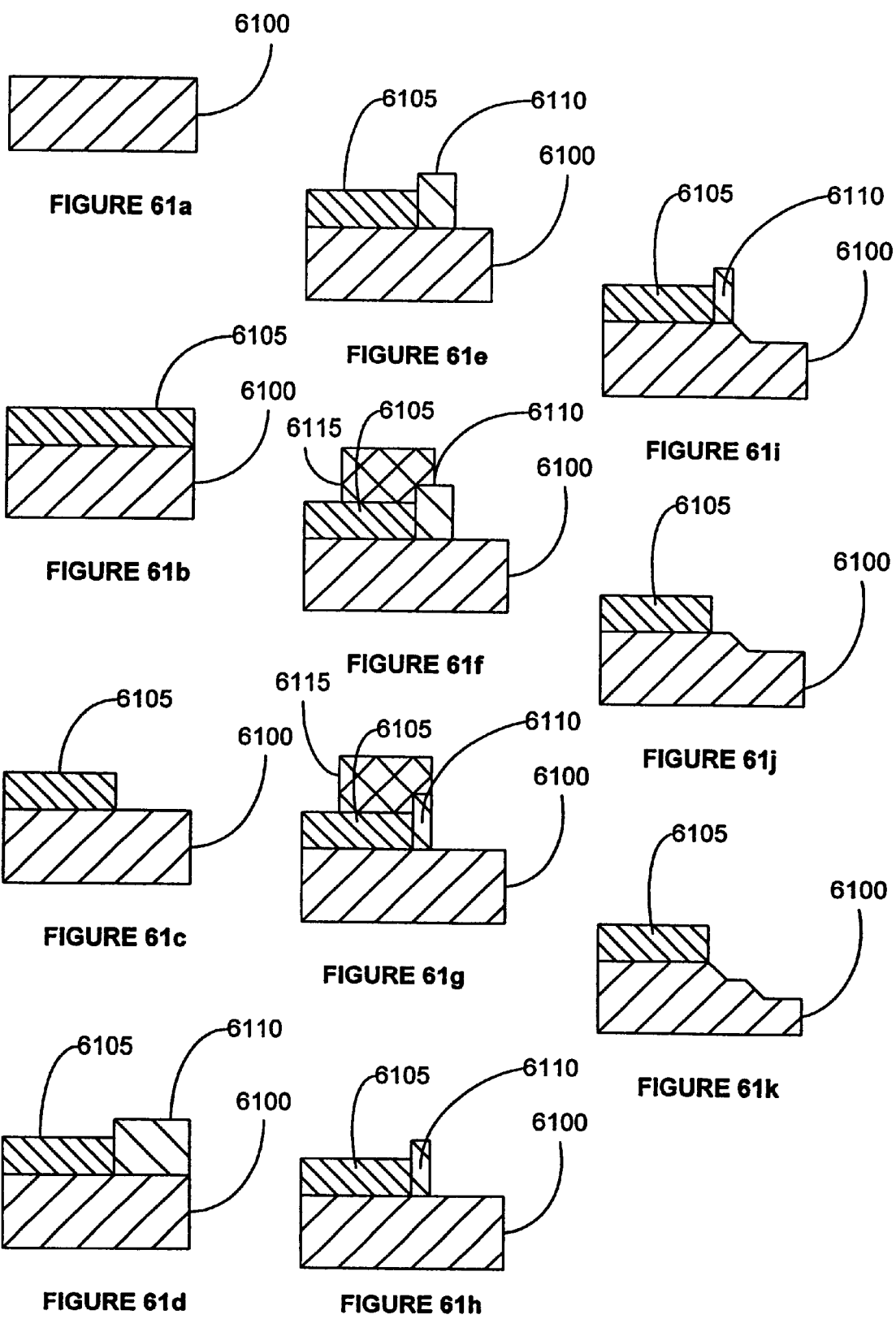

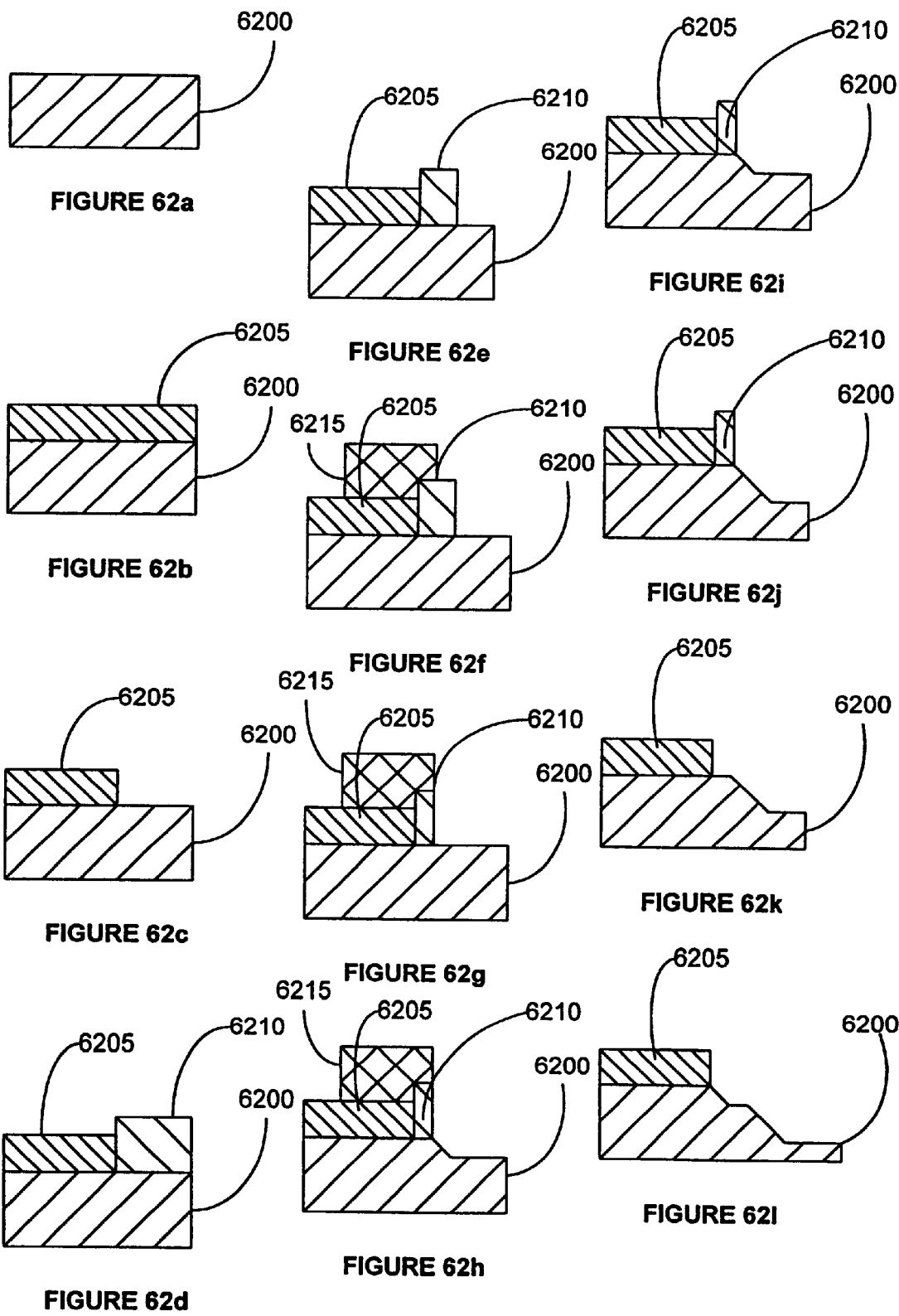

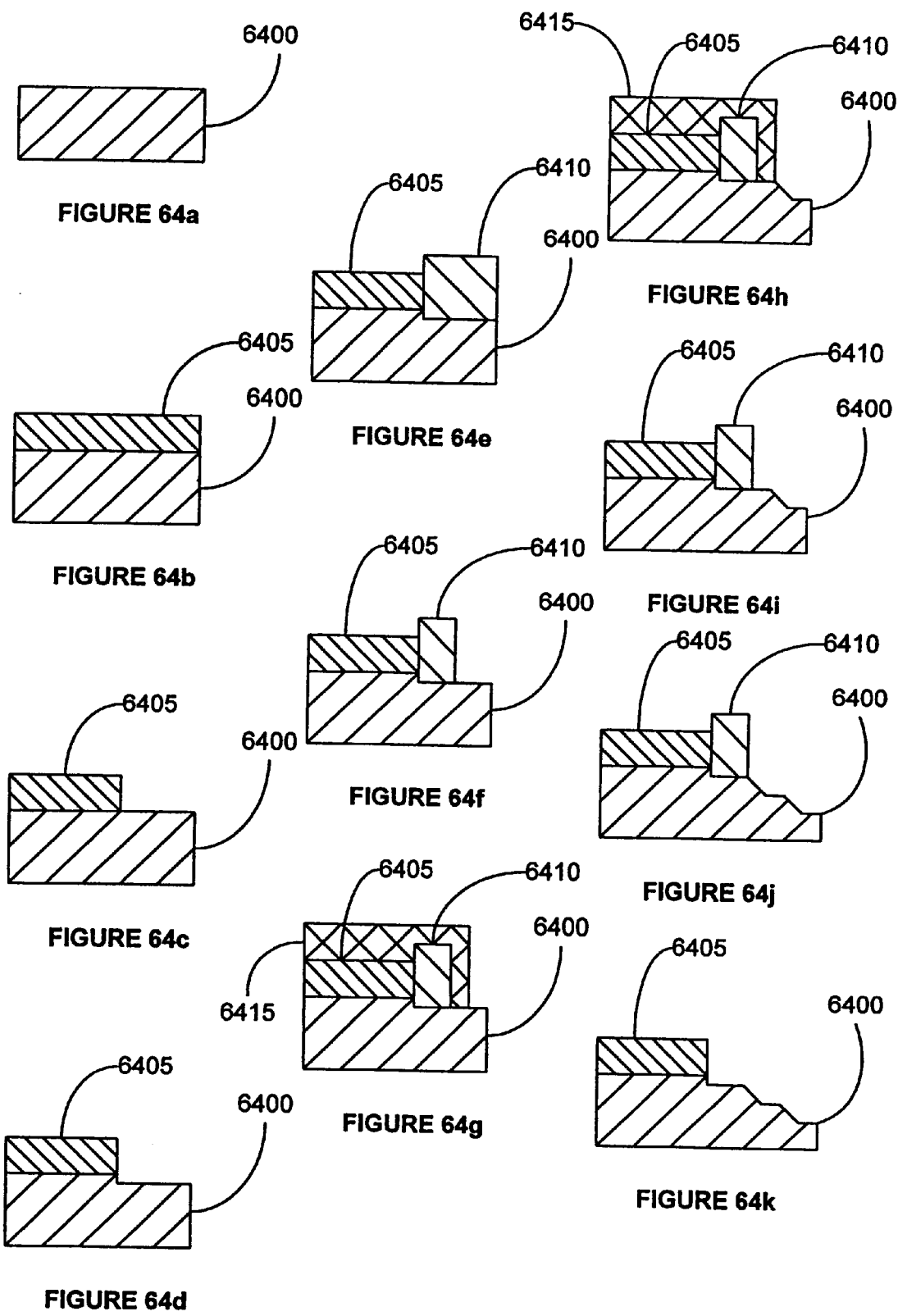

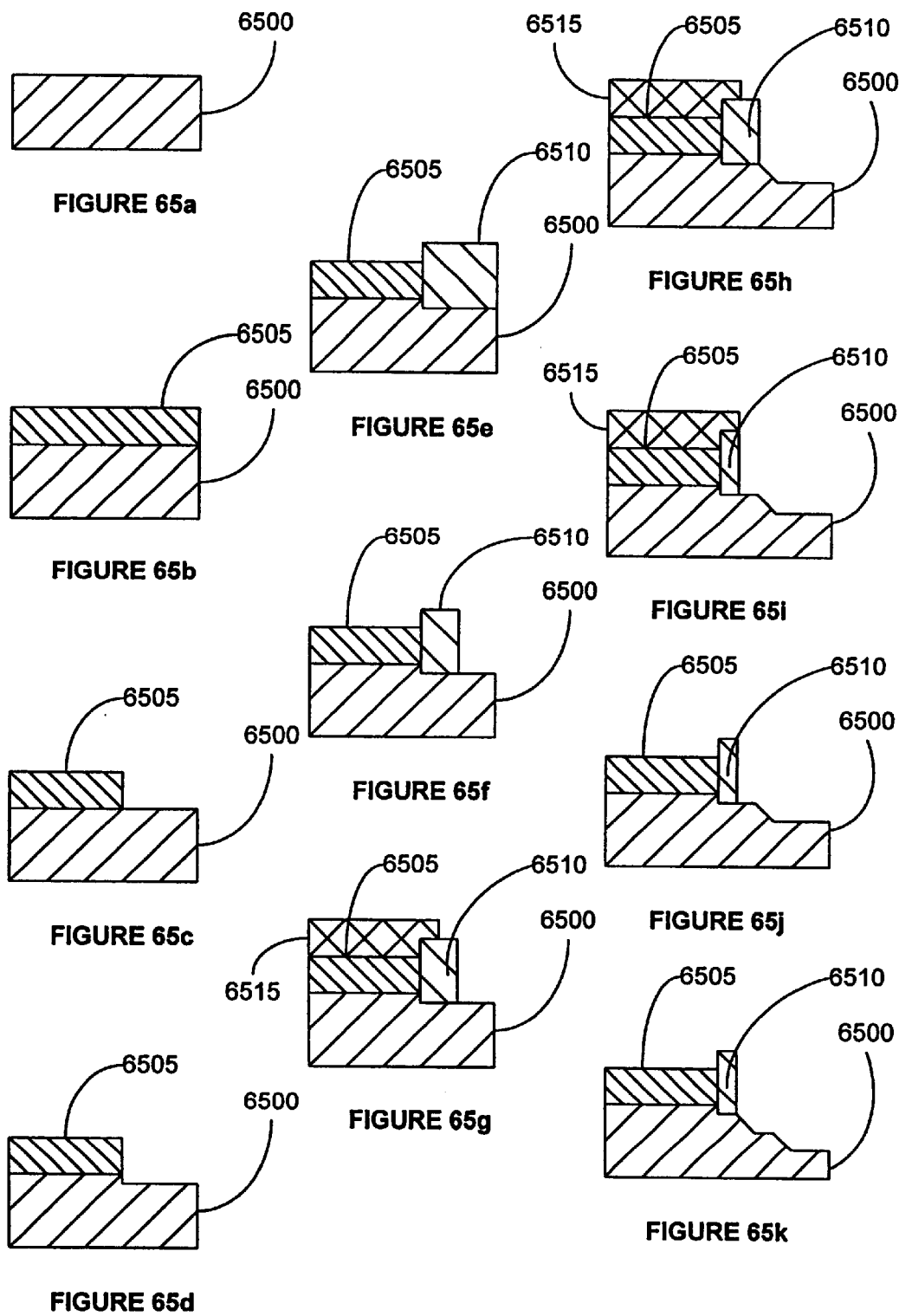

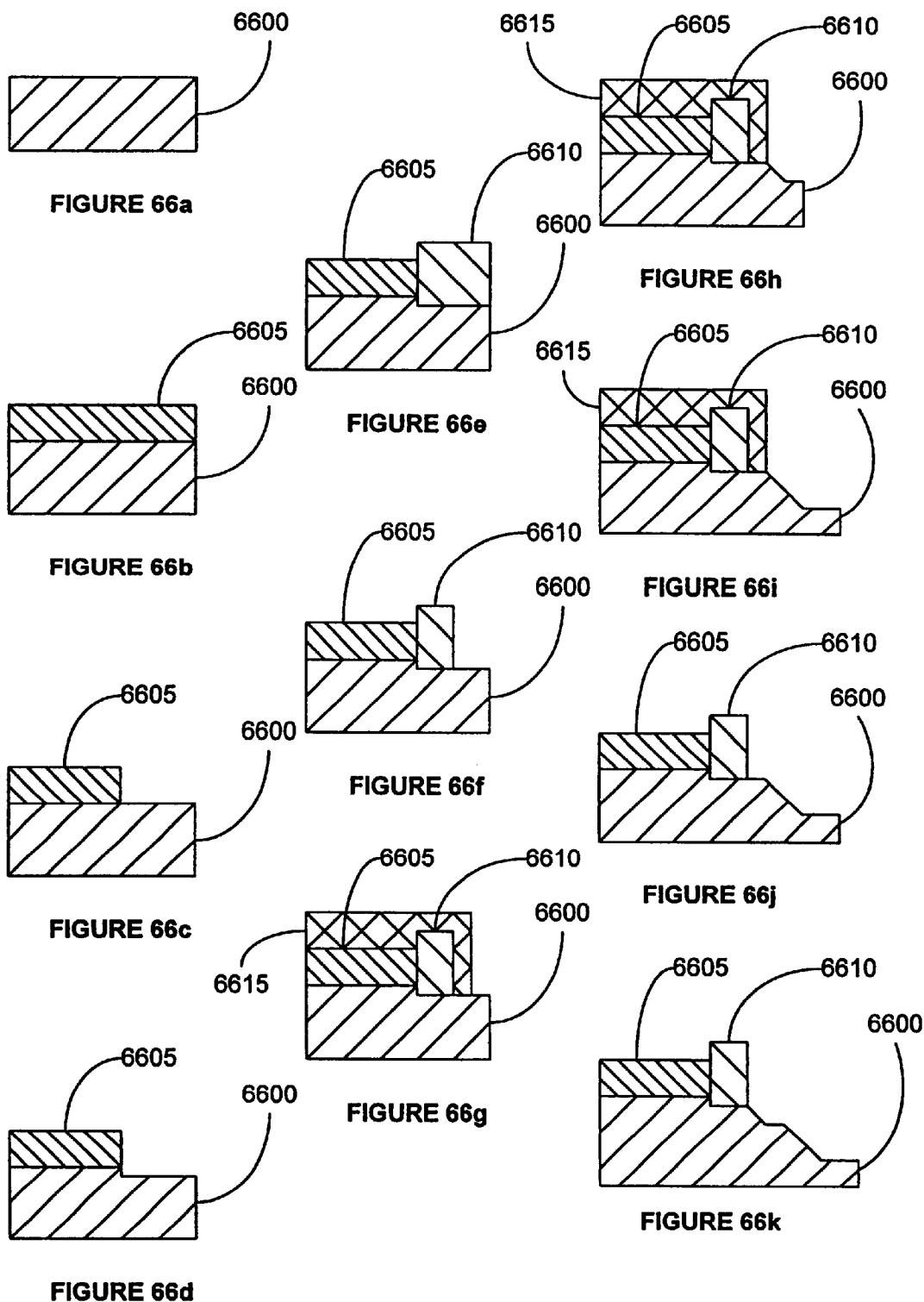

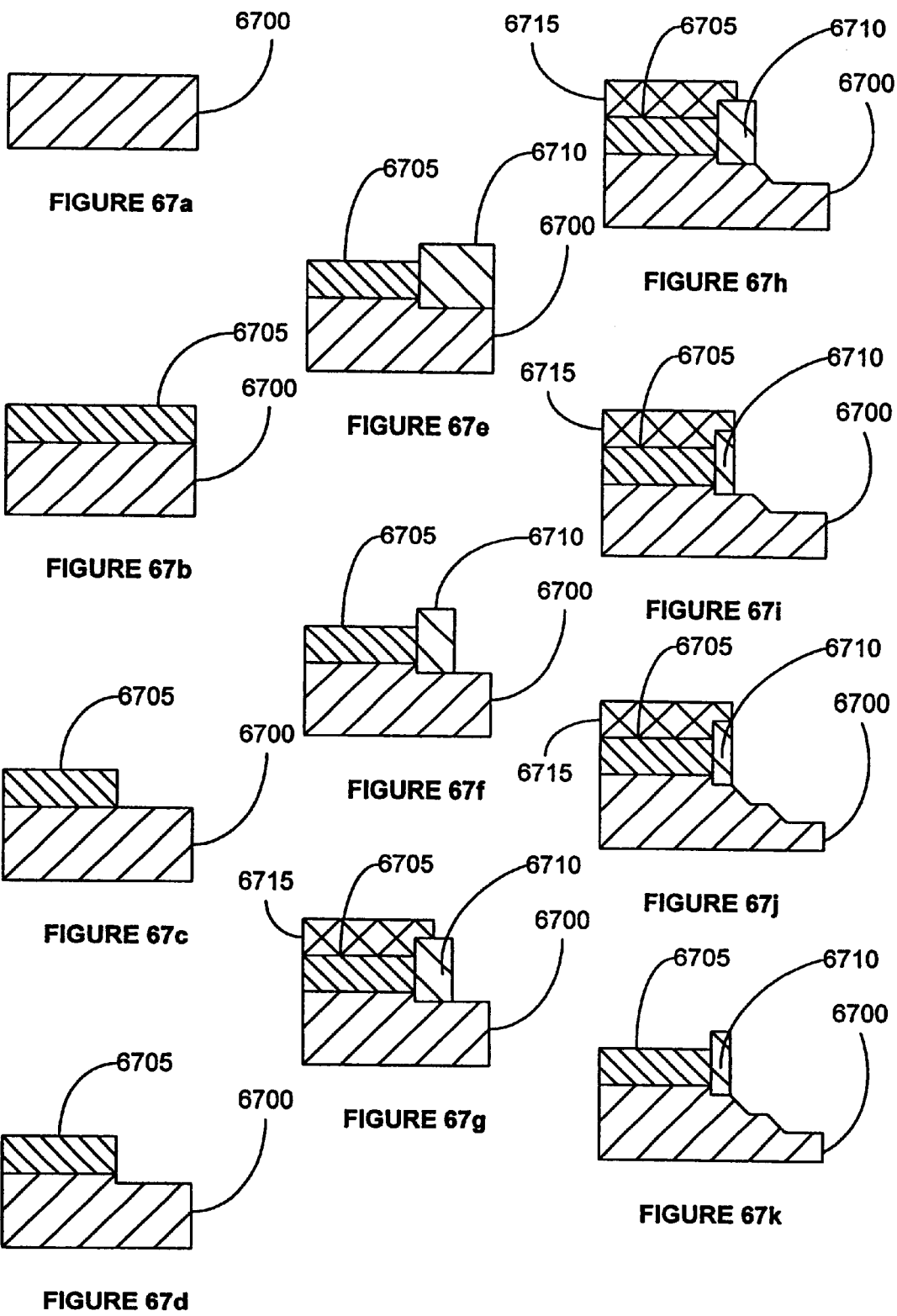

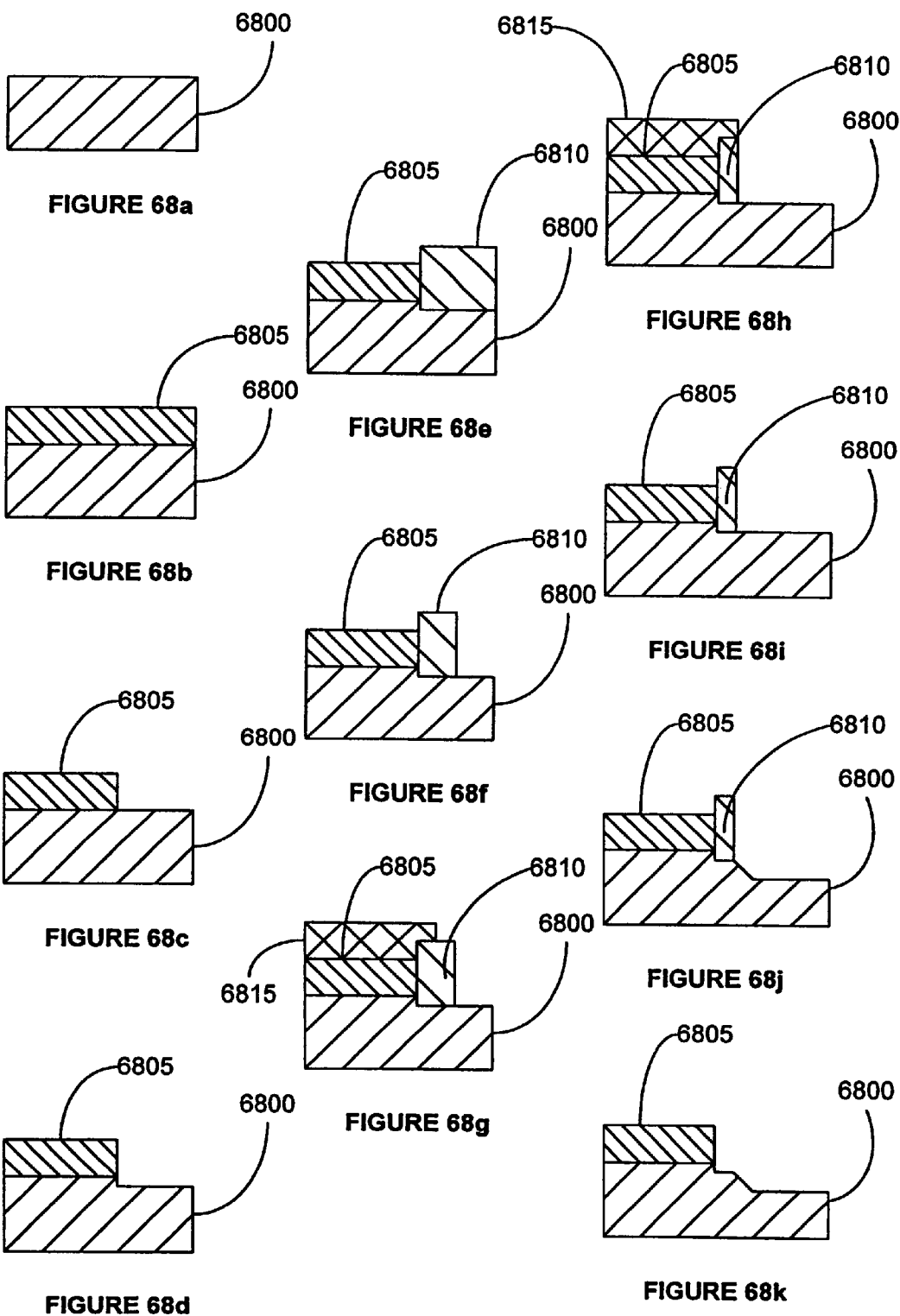

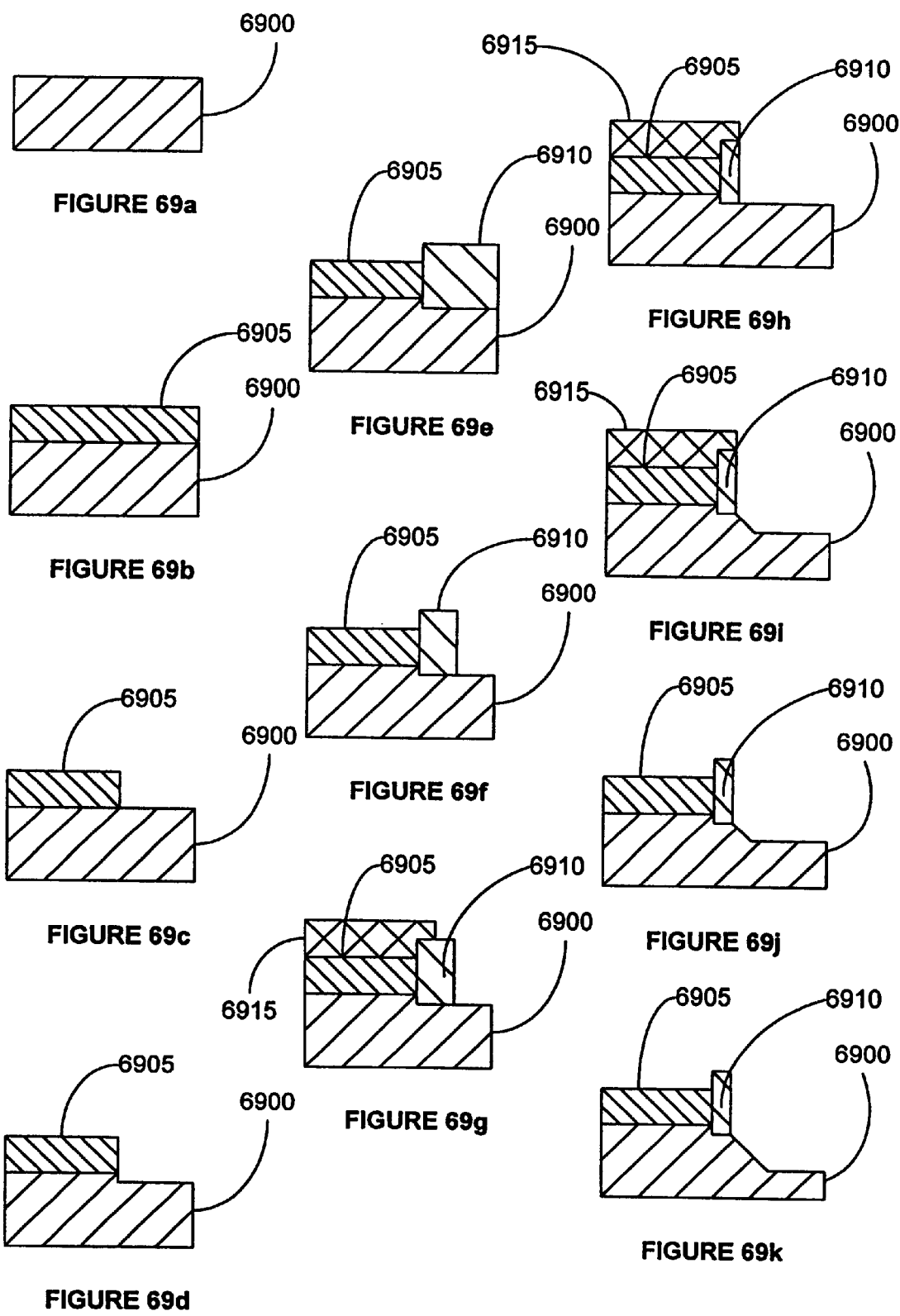

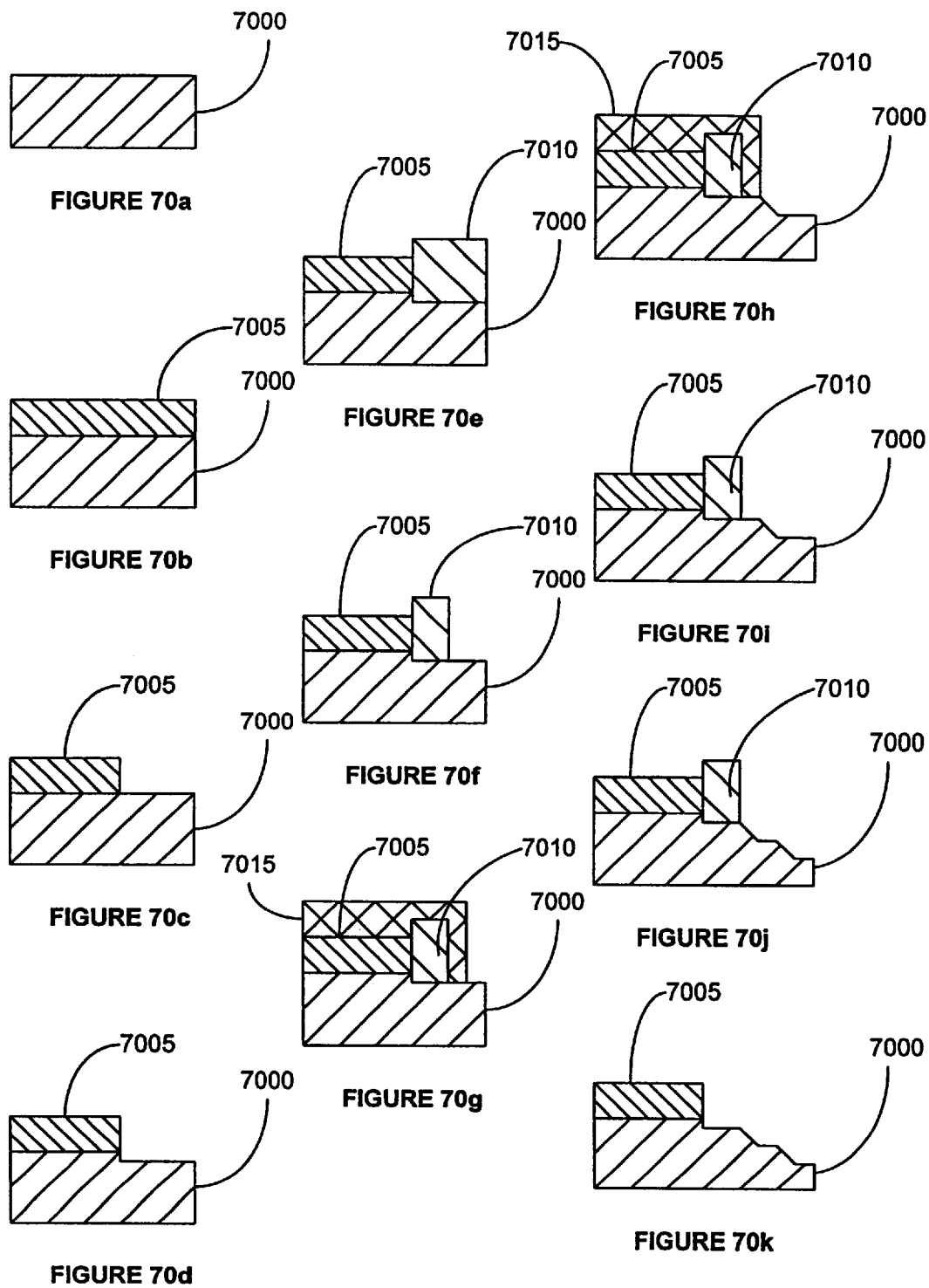

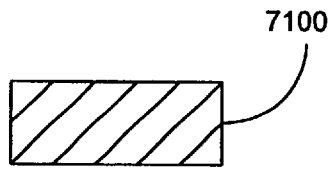
FIGURE 71a
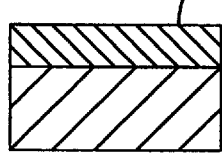
FIGURE 71b
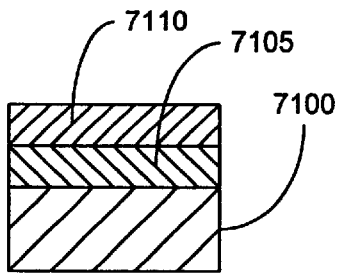
FIGURE 71c
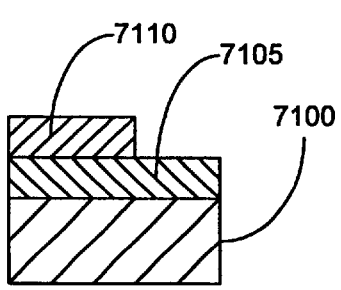
FIGURE 71d
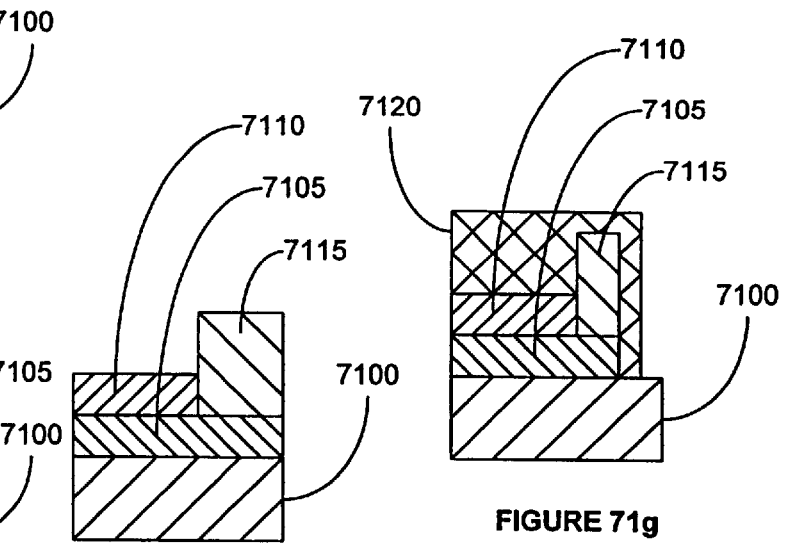
FIGURE 71e
FIGURE 71g
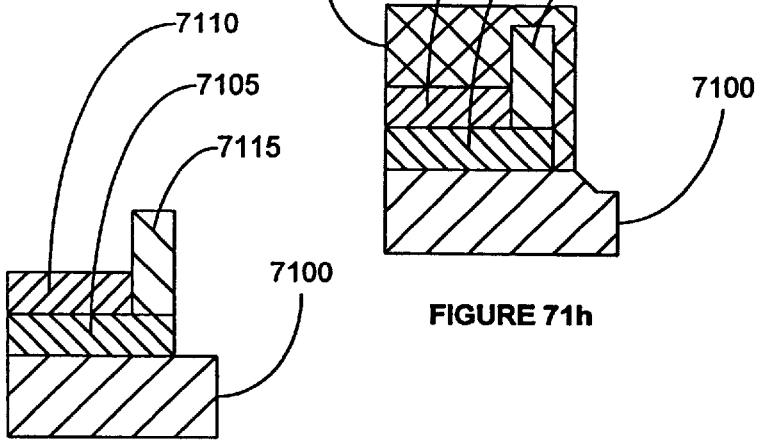
FIGURE 71f
FIGURE 71h

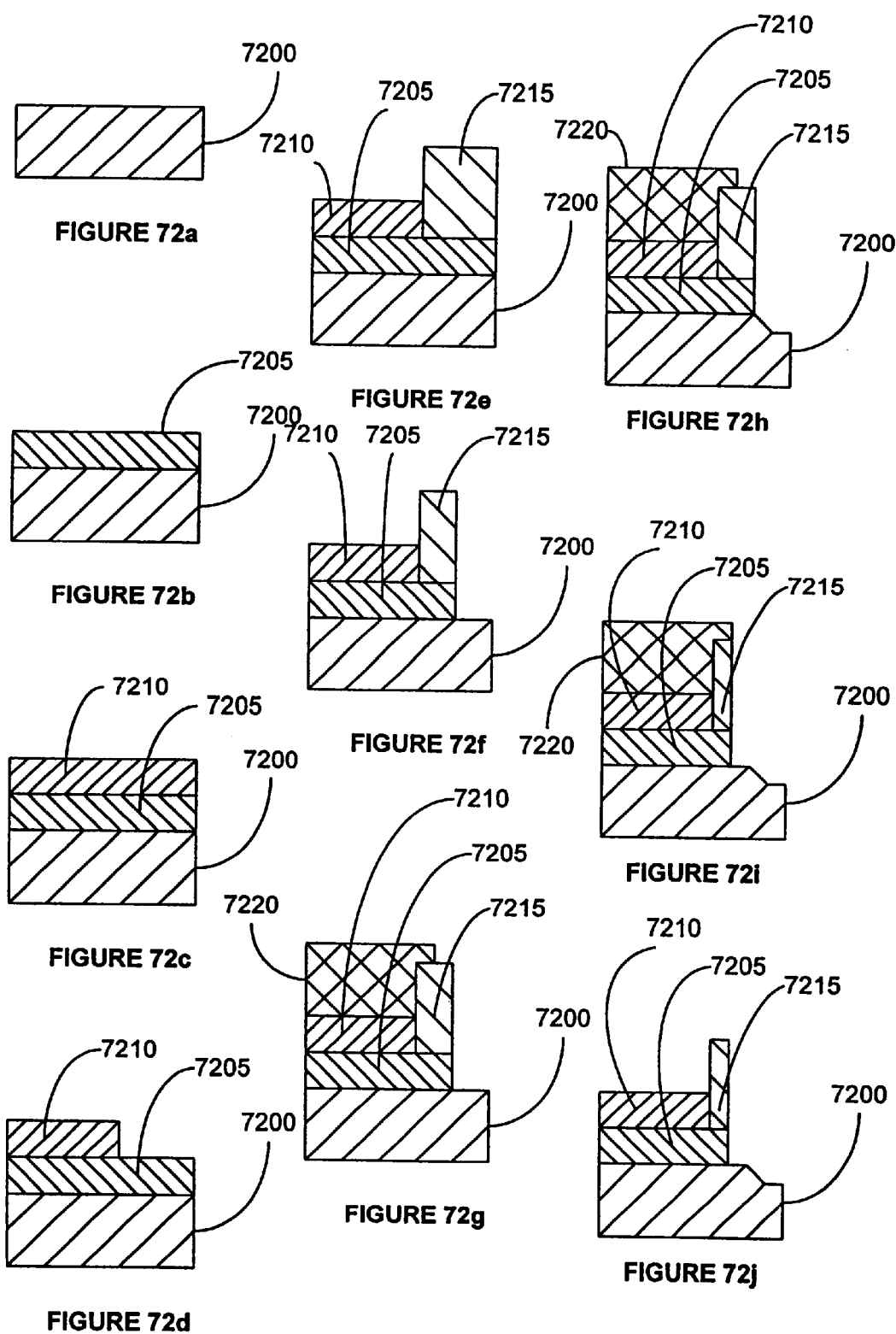

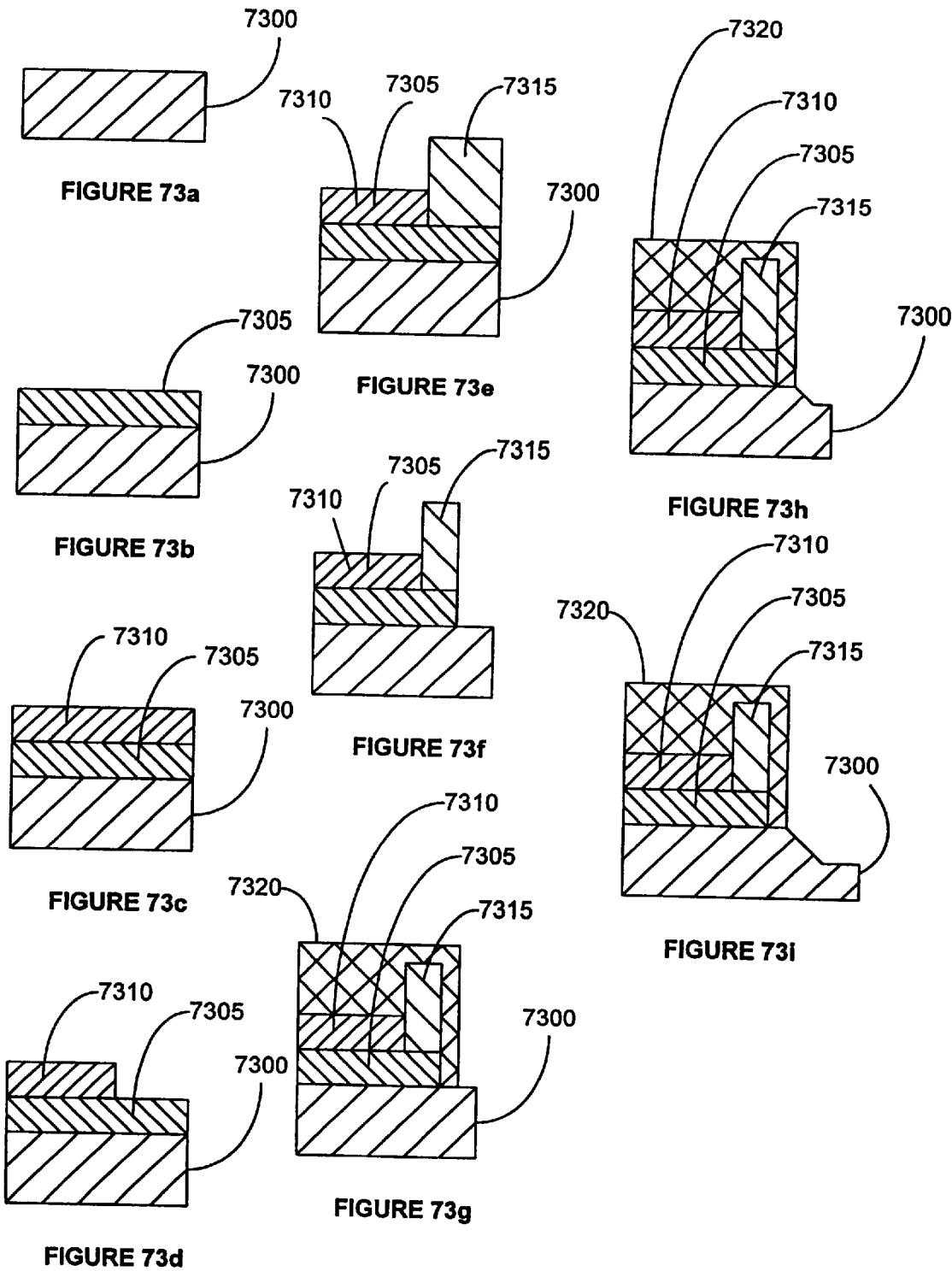

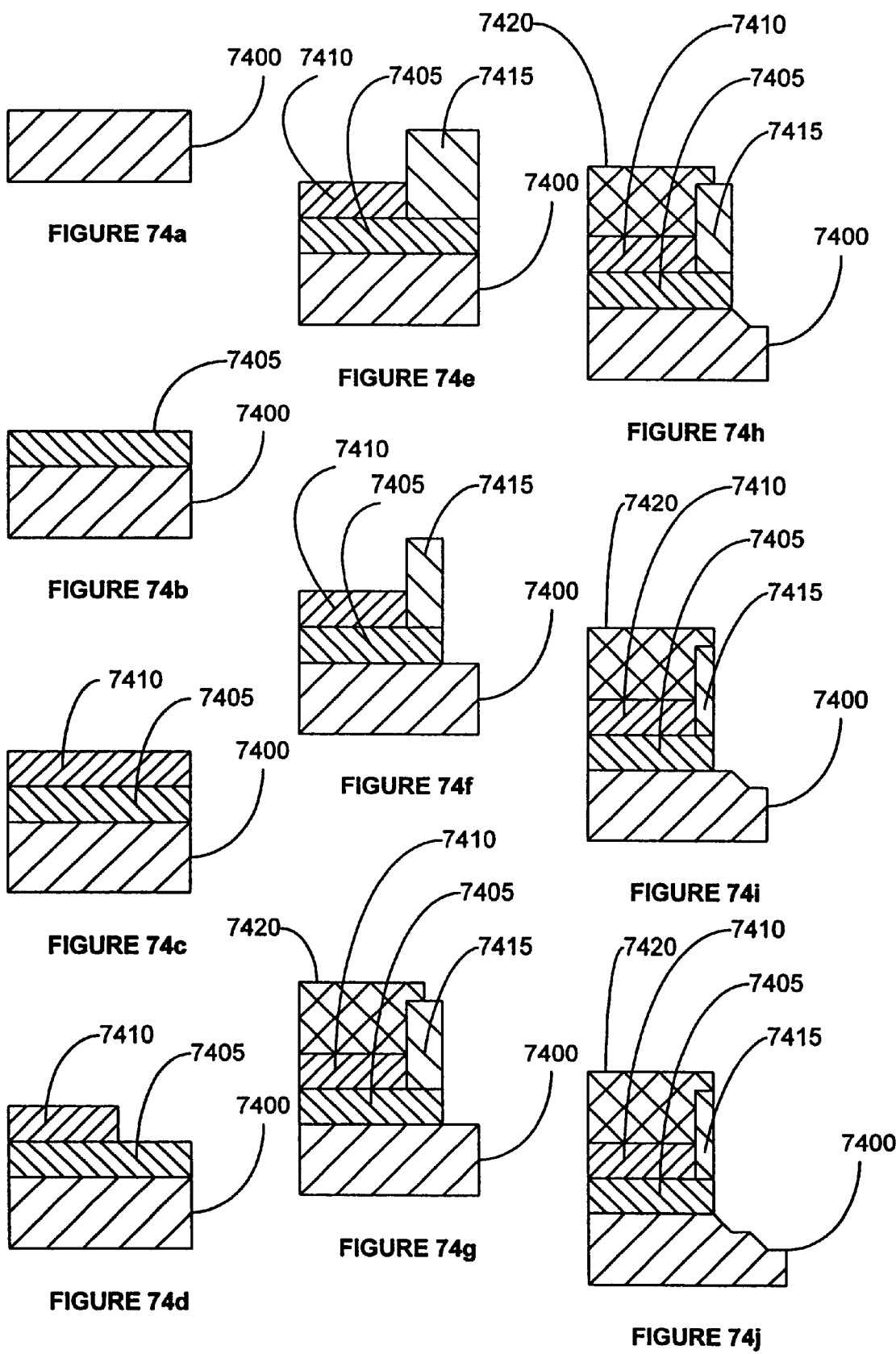

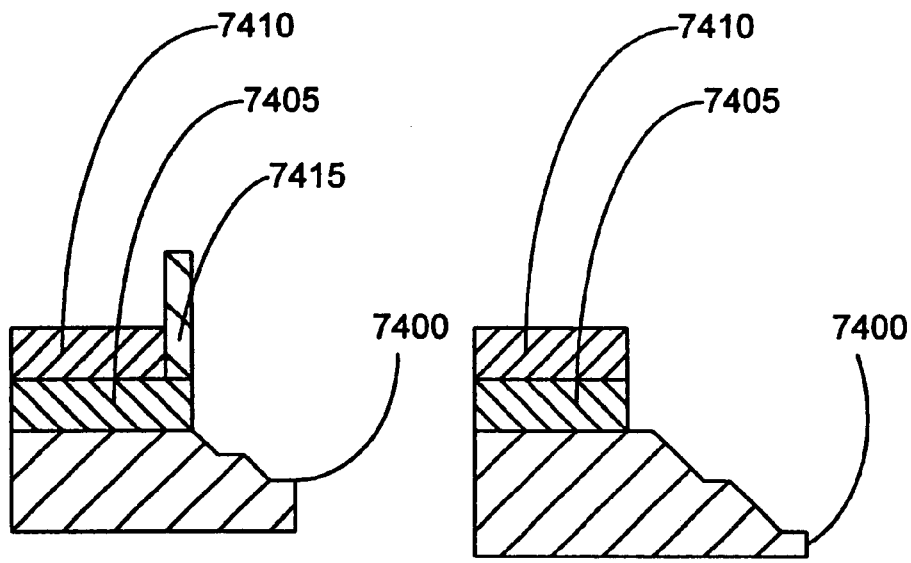
FIGURE 74k
FIGURE 74m
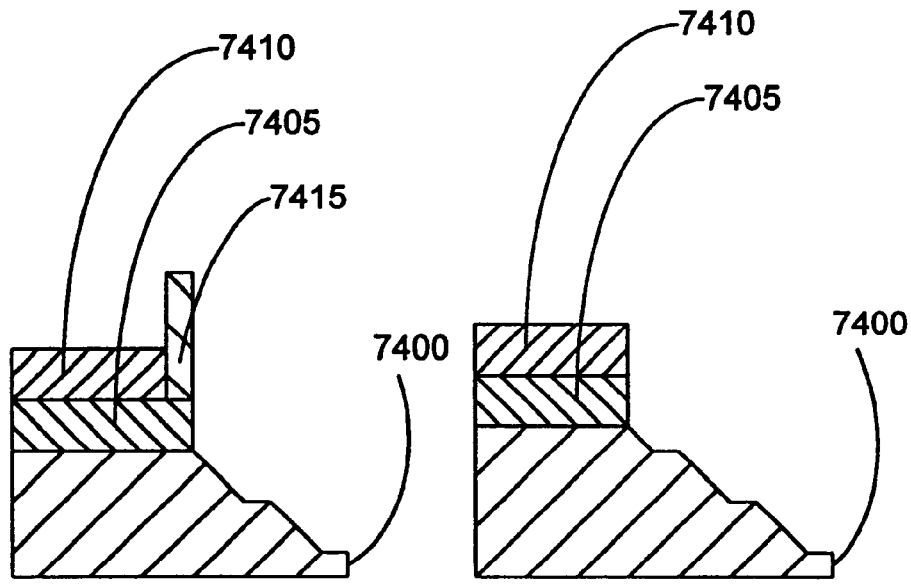
FIGURE 74l
FIGURE 74n
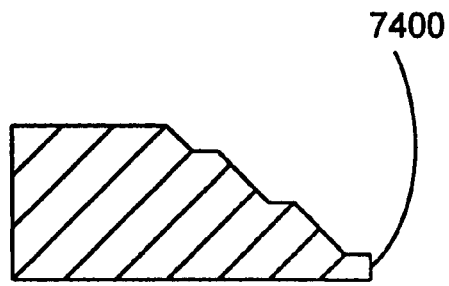
FIGURE 74o

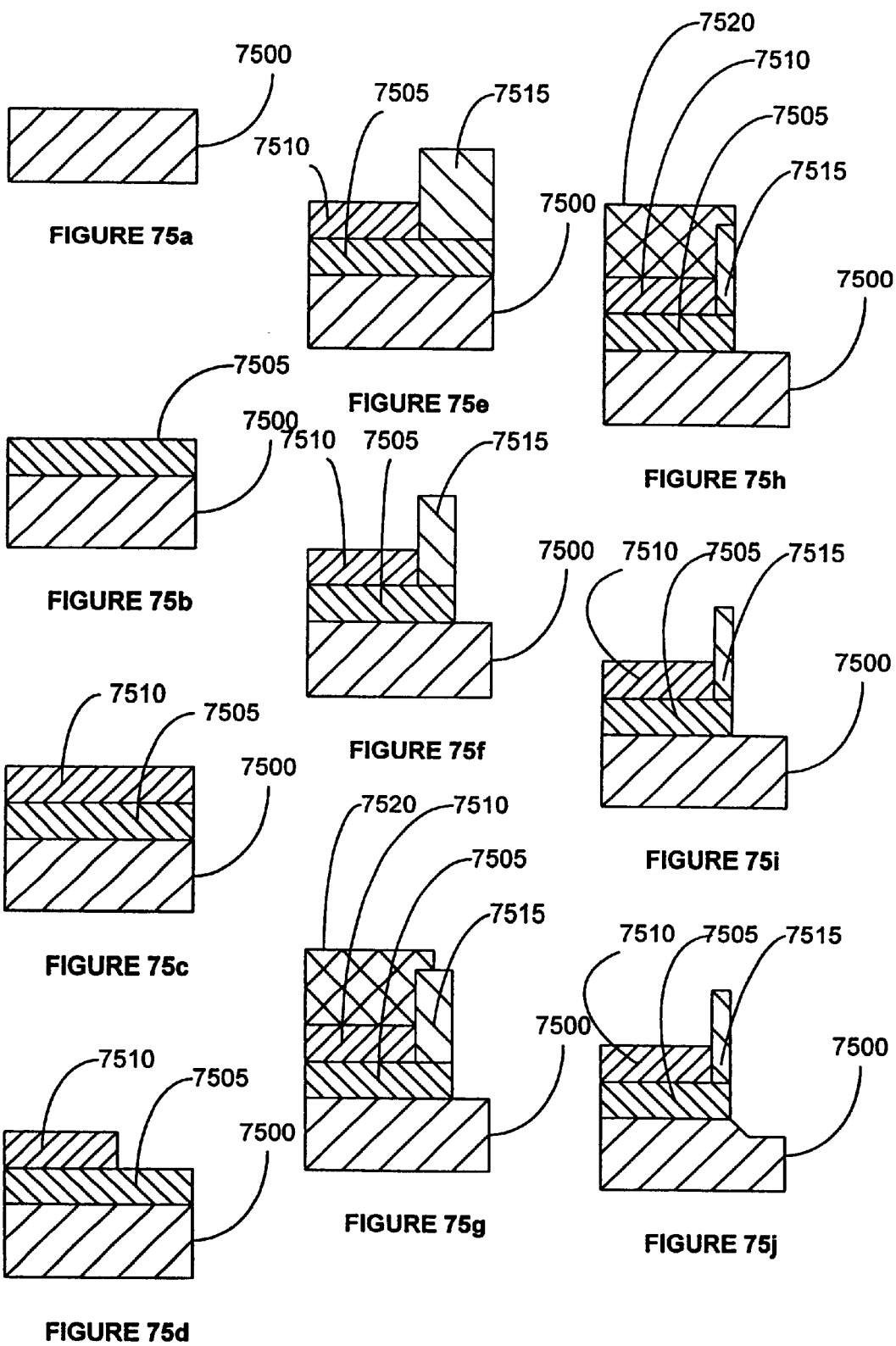

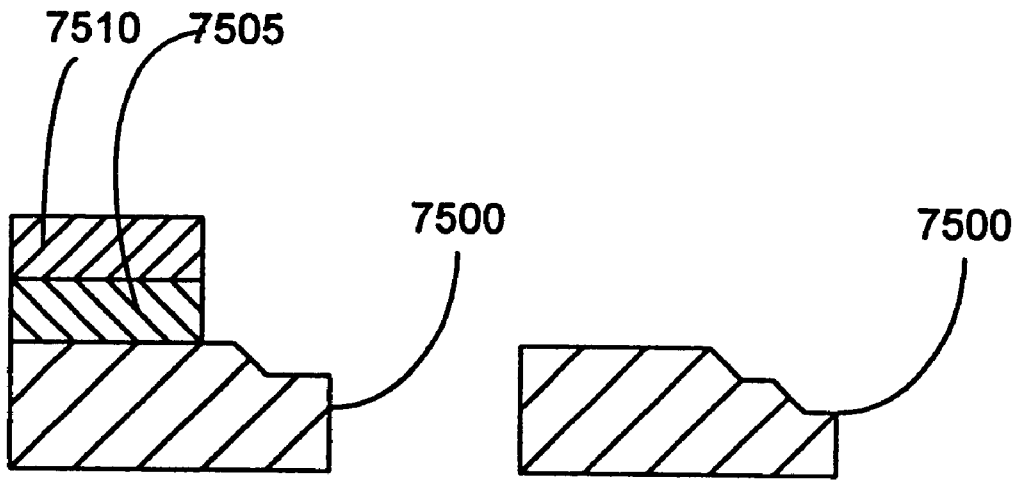
FIGURE 75k  FIGURE 75m
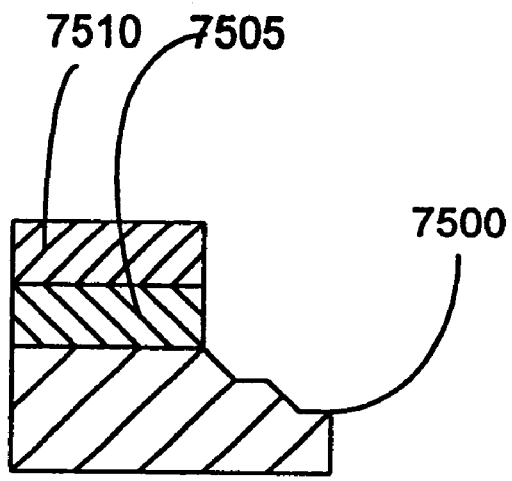
FIGURE 75l

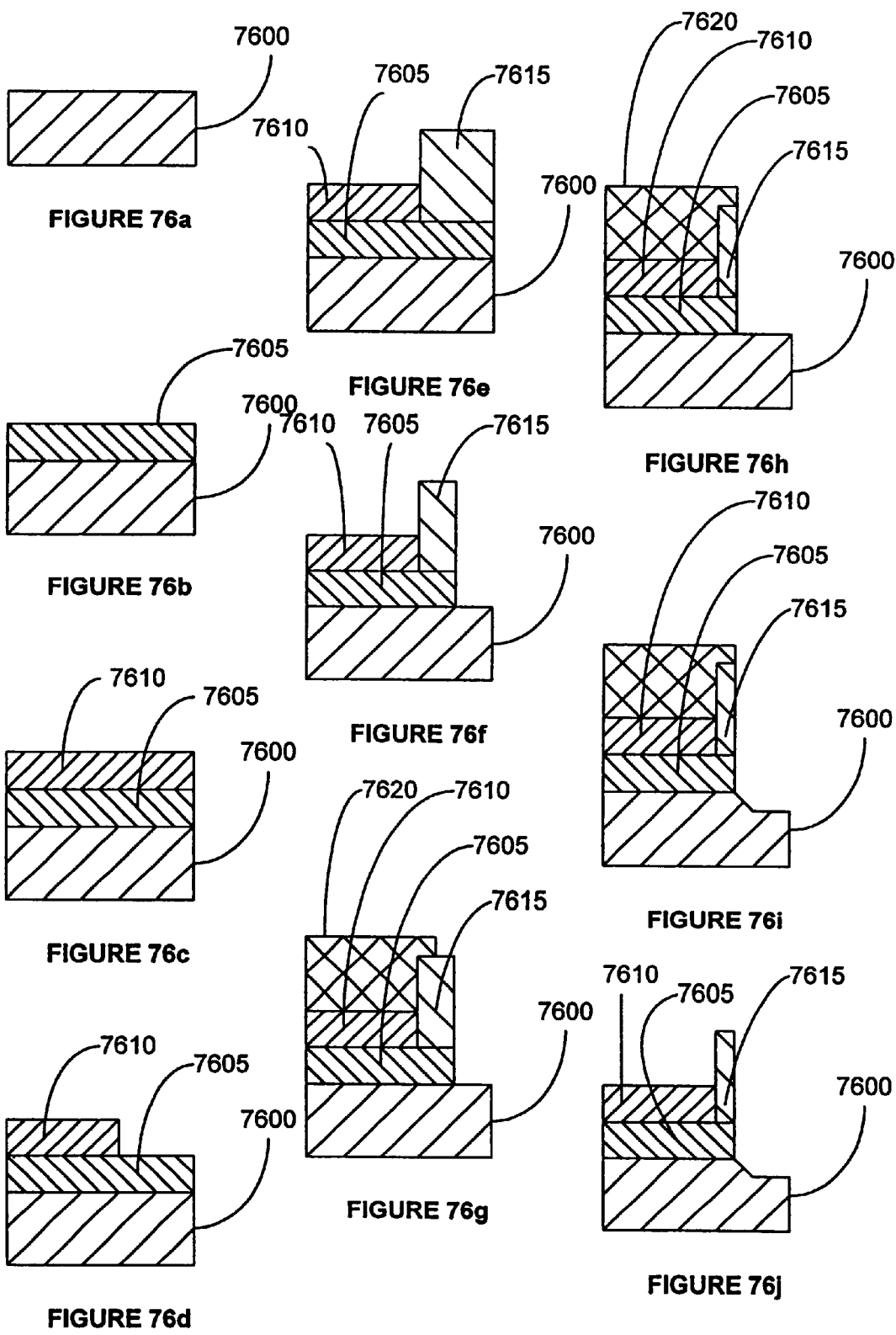

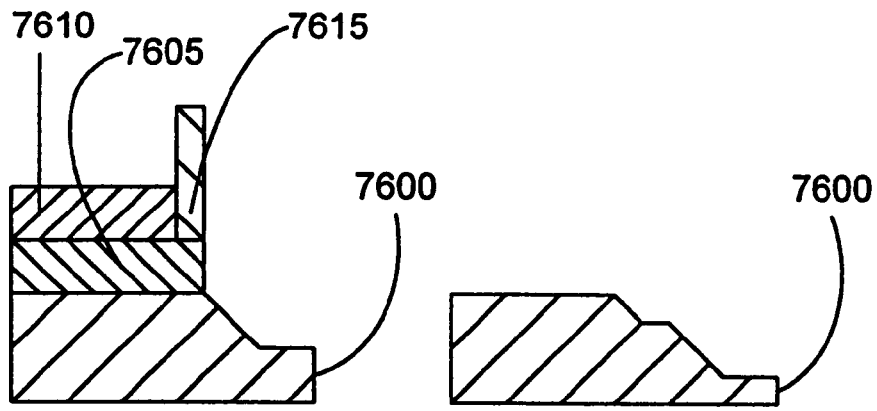
FIGURE 76k   FIGURE 76n
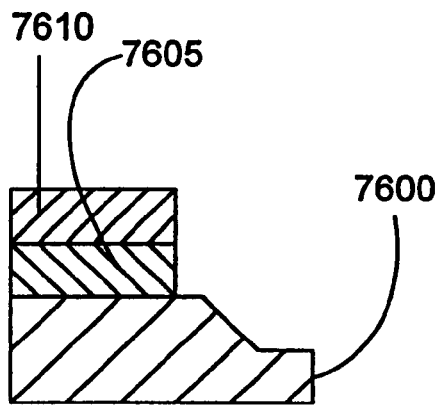
FIGURE 76l
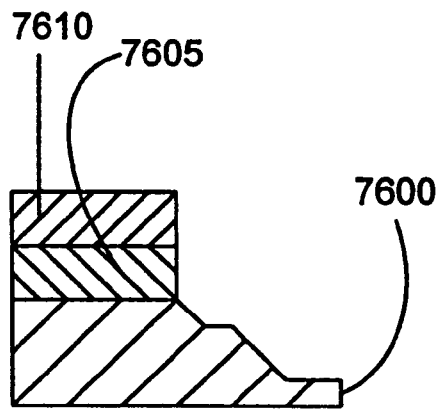
FIGURE 76m

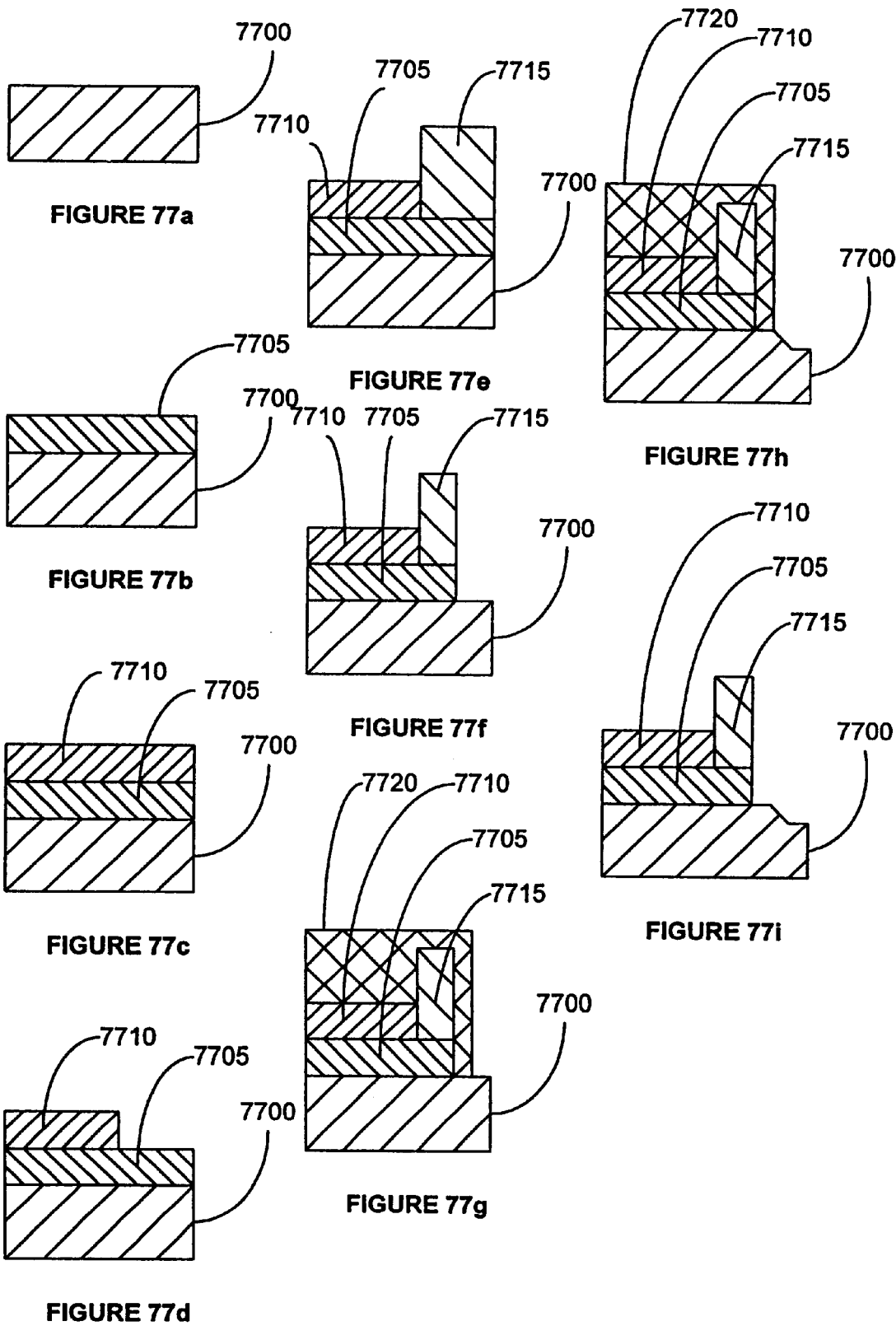

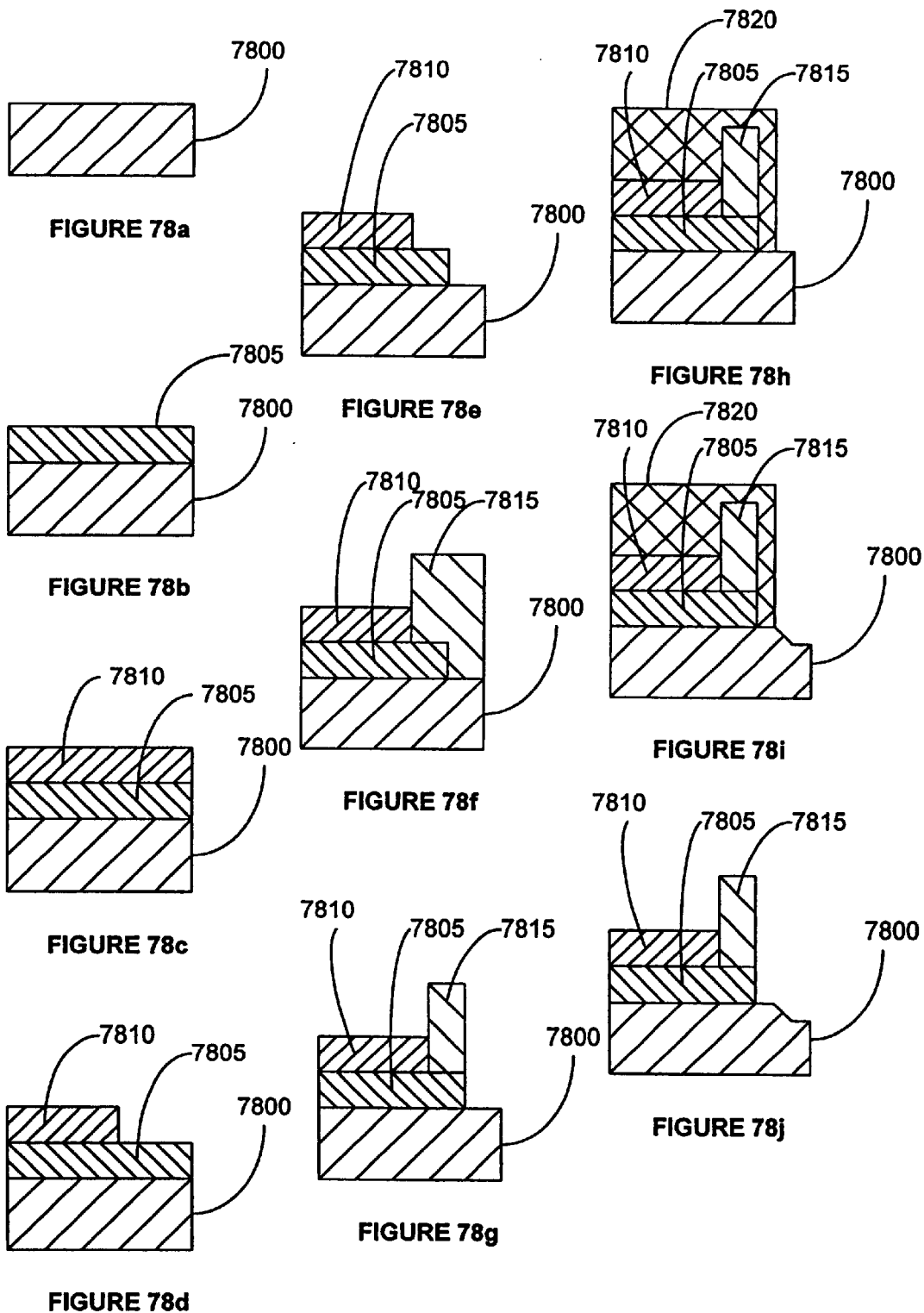

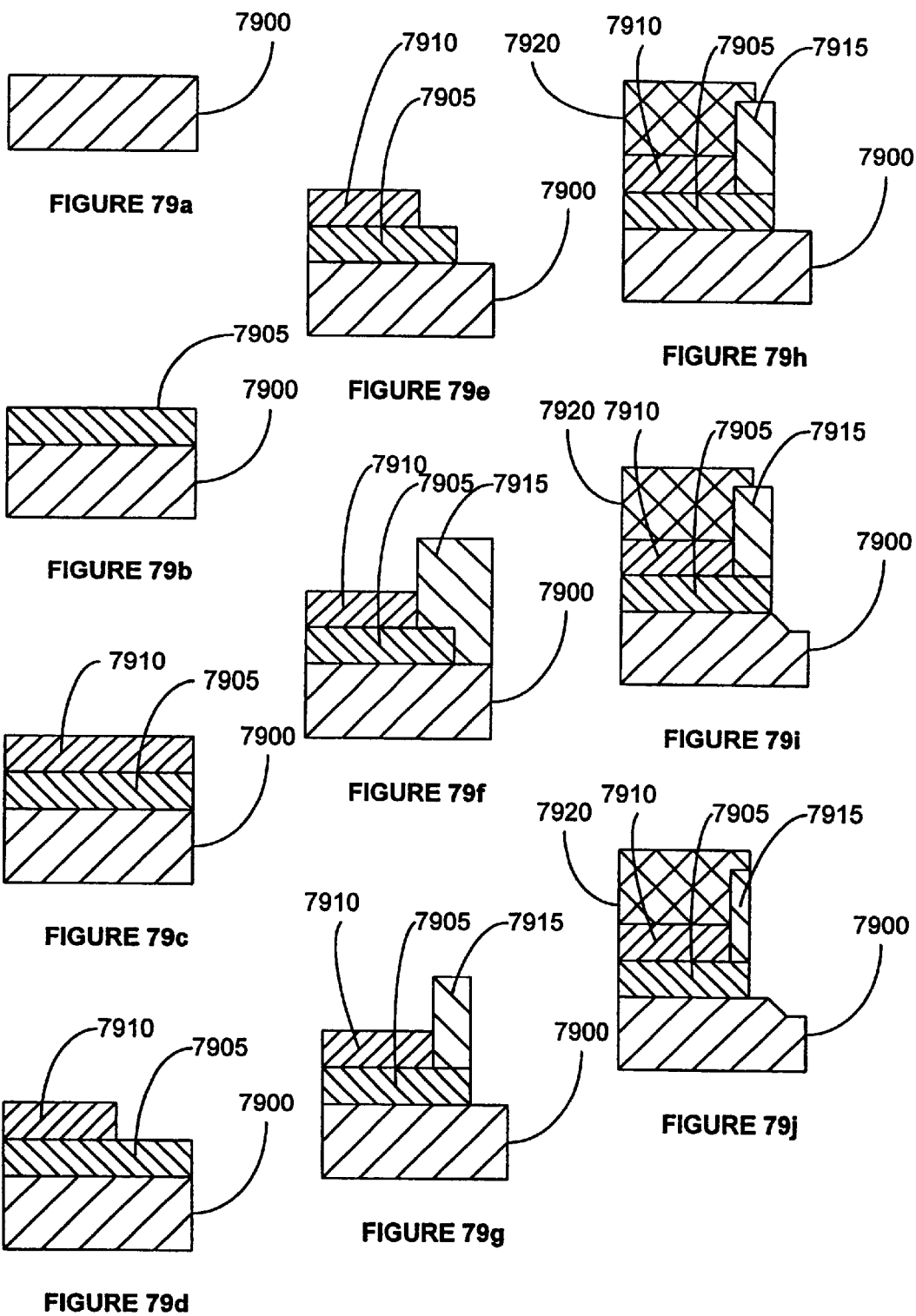

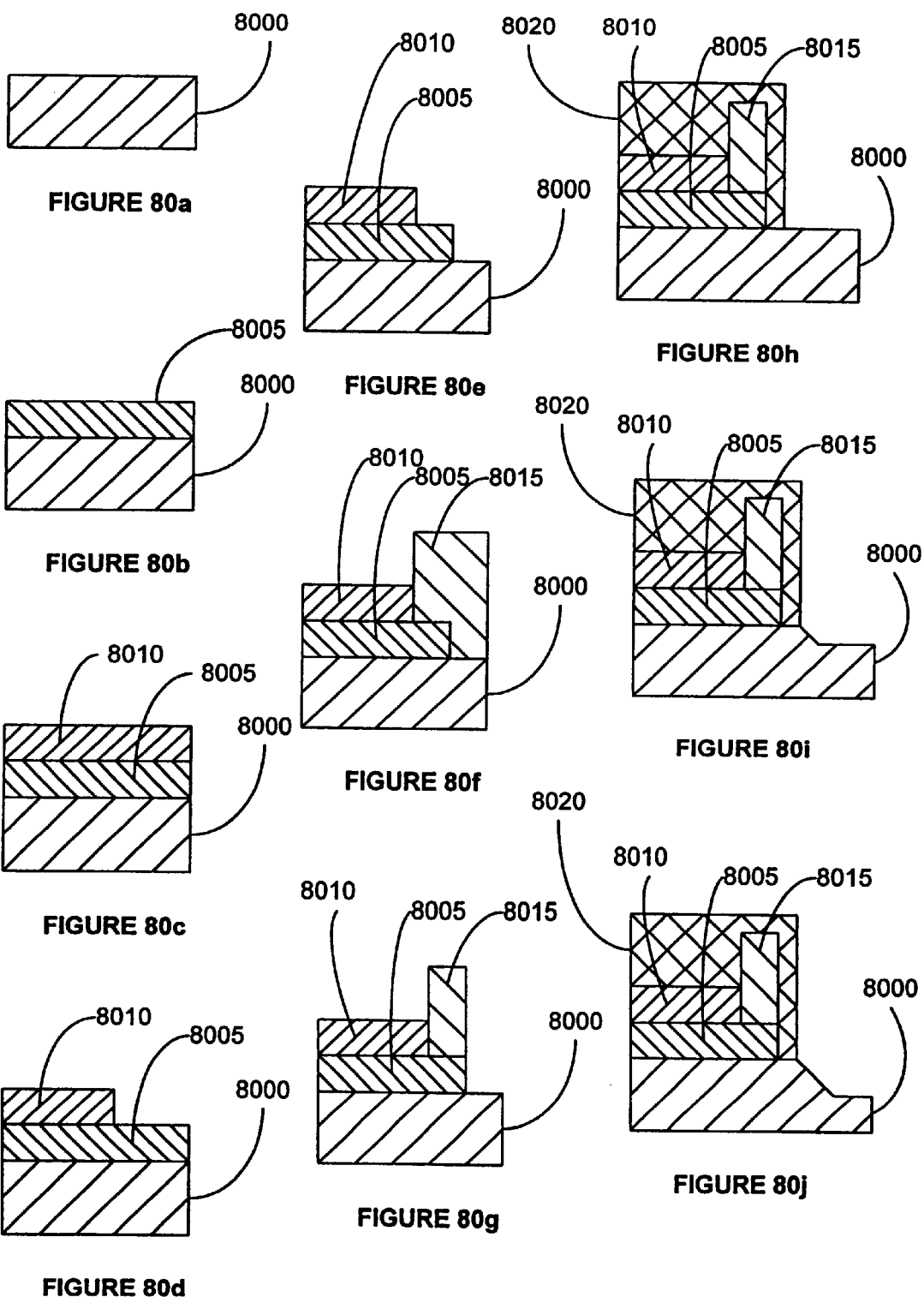

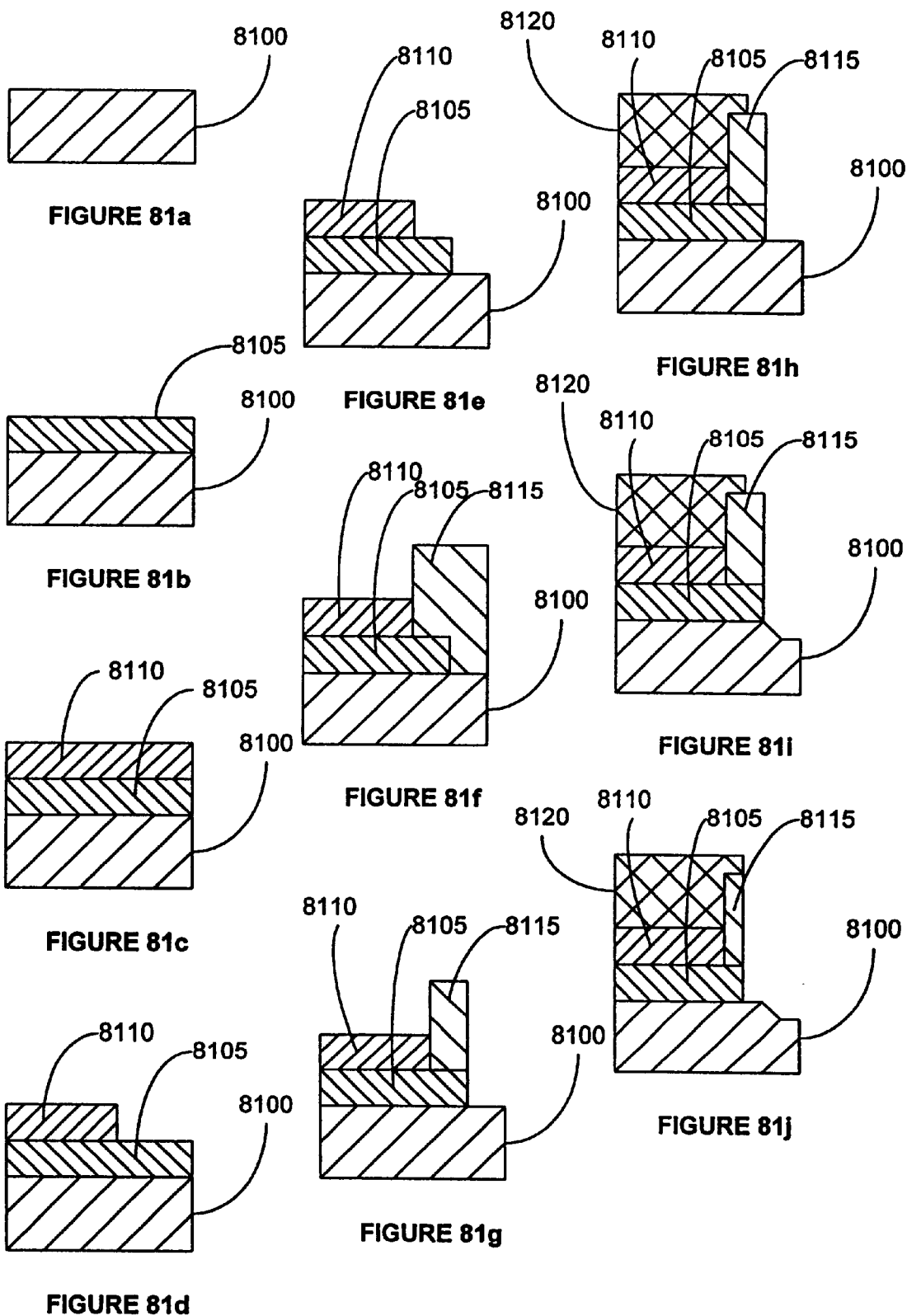

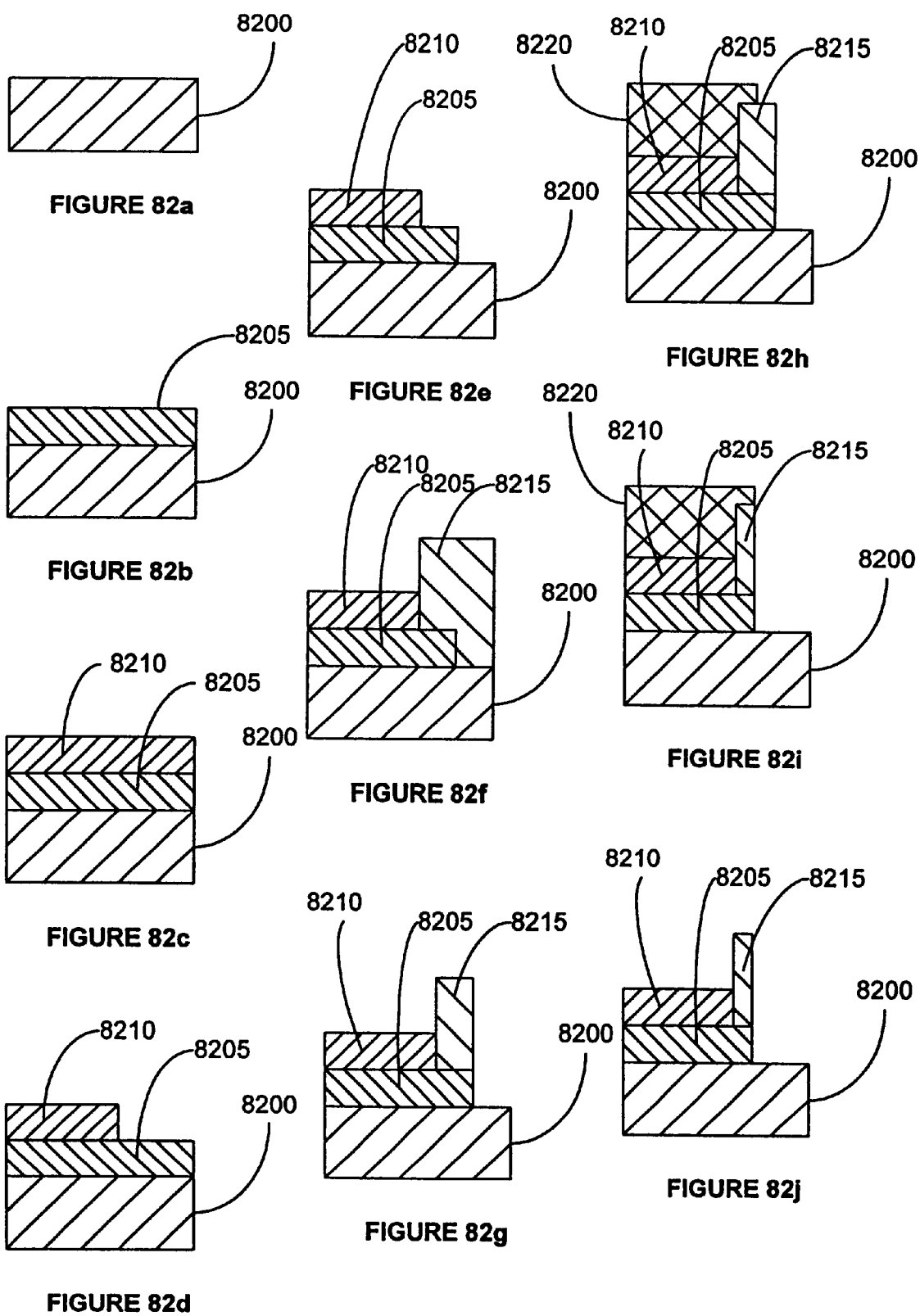

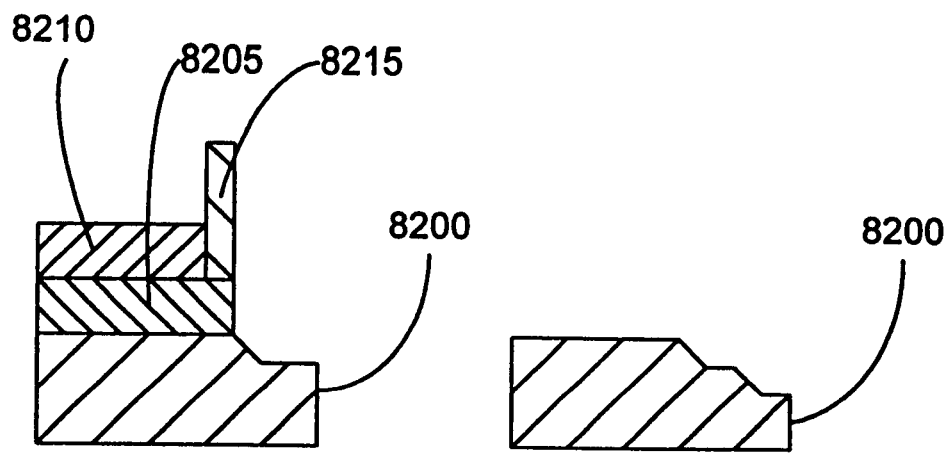
FIGURE 82k
FIGURE 82n
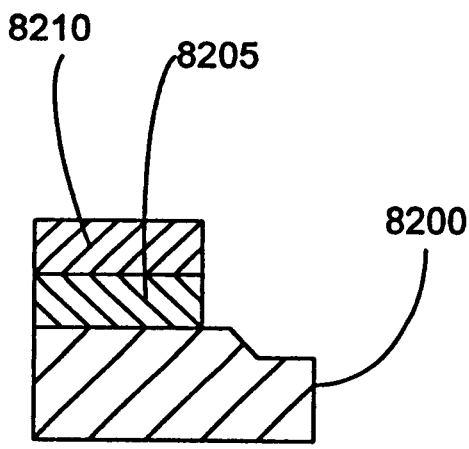
FIGURE 82l
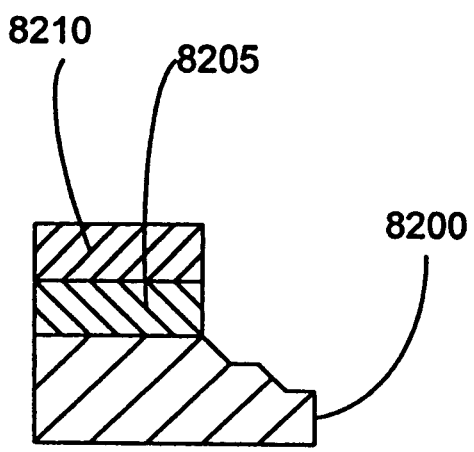
FIGURE 82m

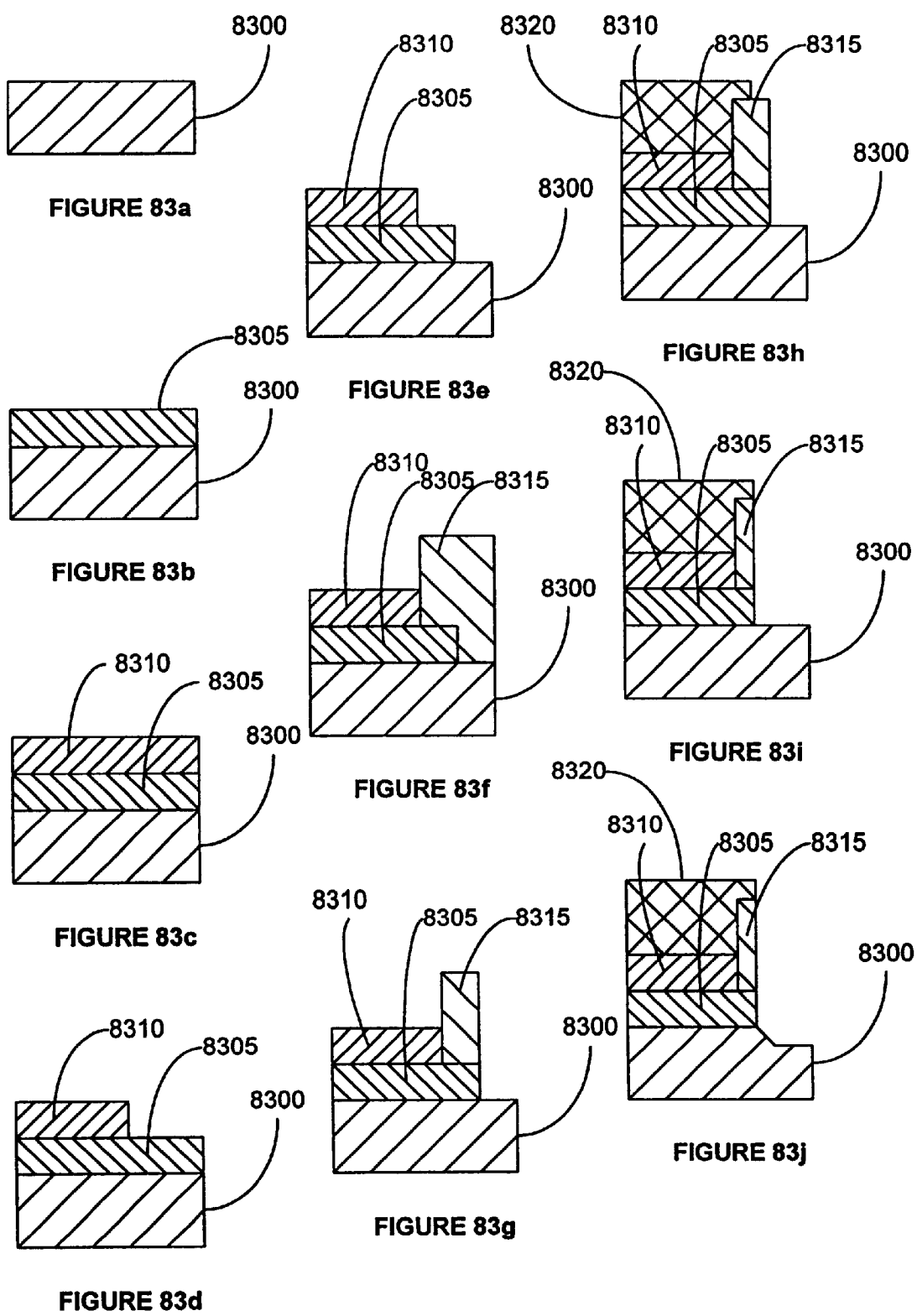

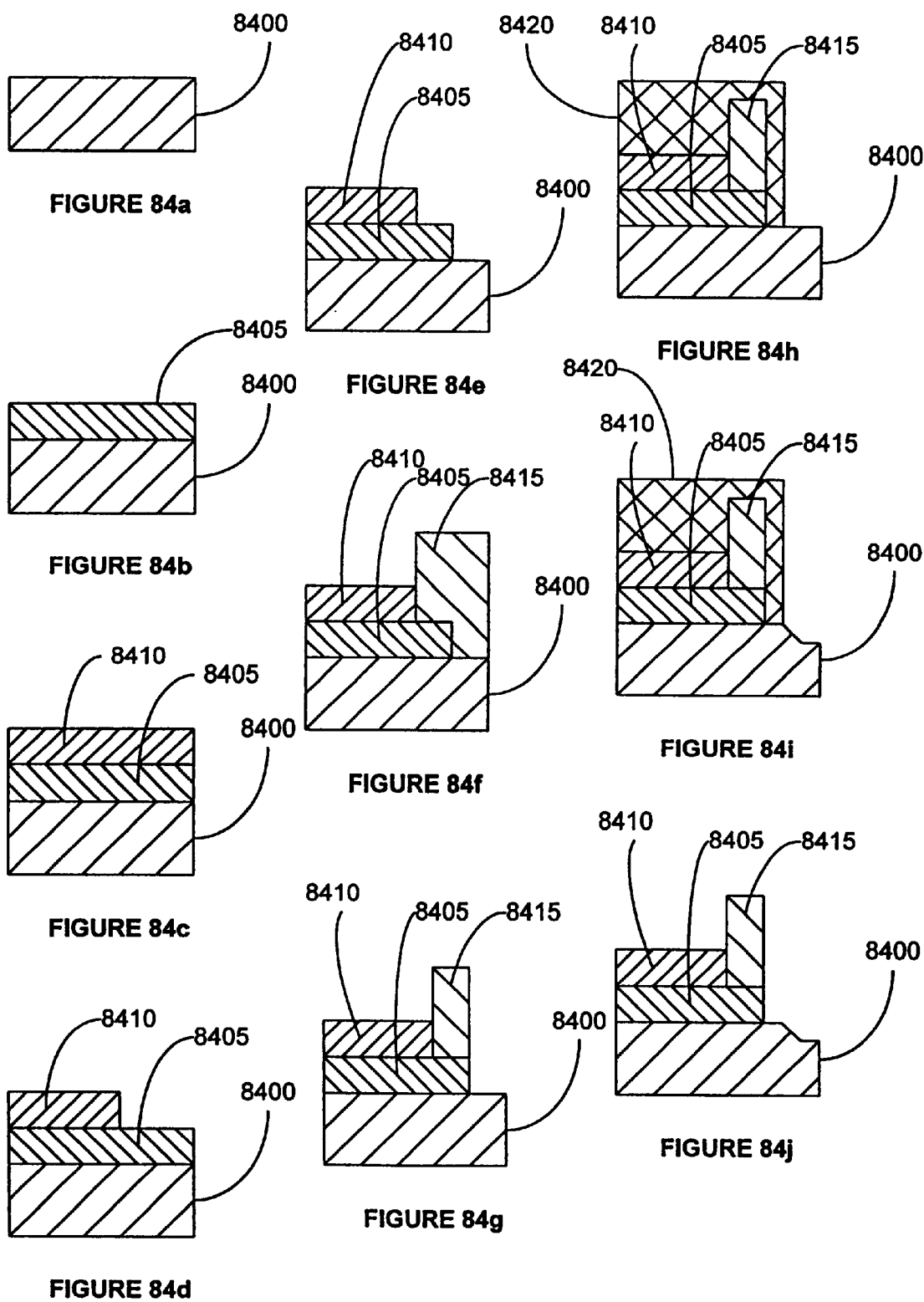

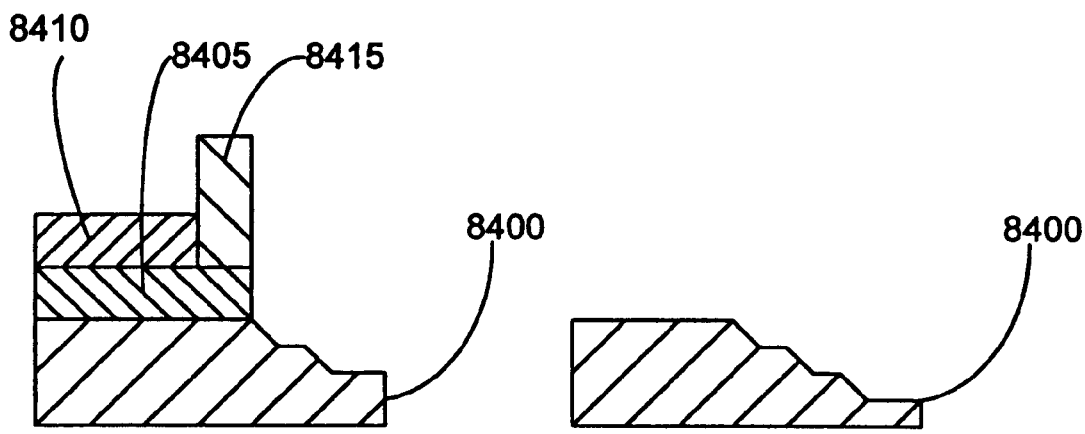
FIGURE 84k
FIGURE 84n
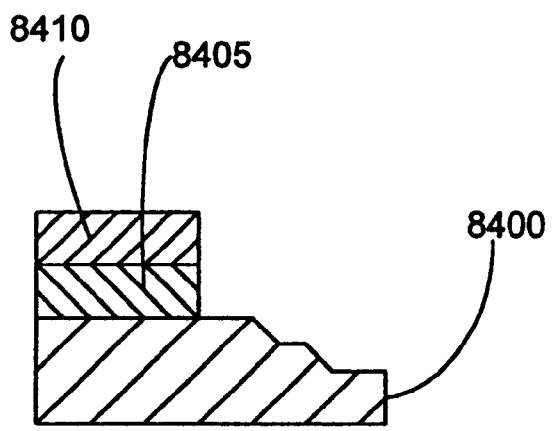
FIGURE 84l
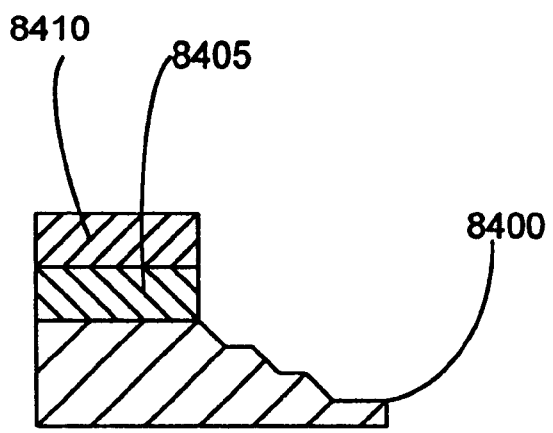
FIGURE 84m

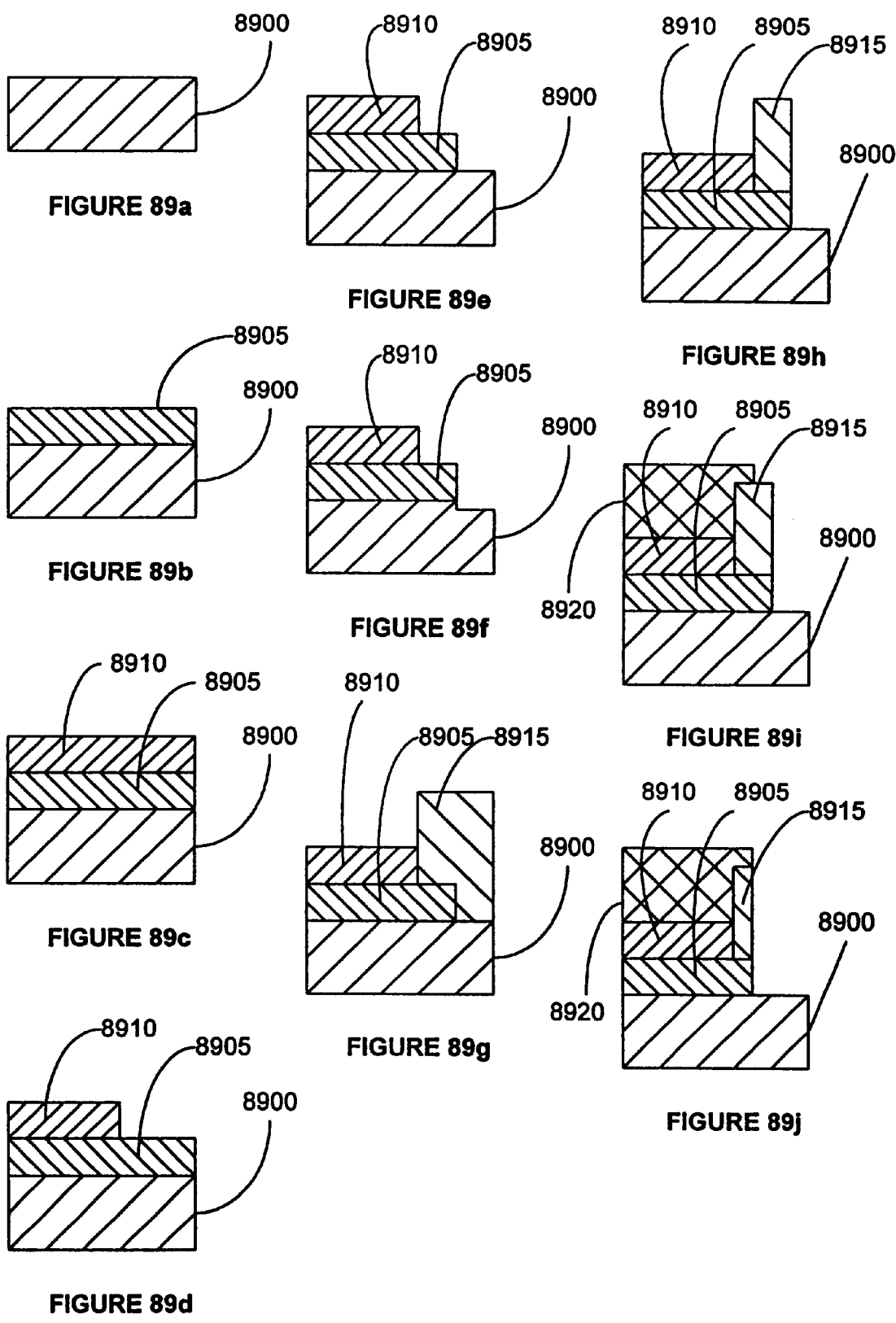

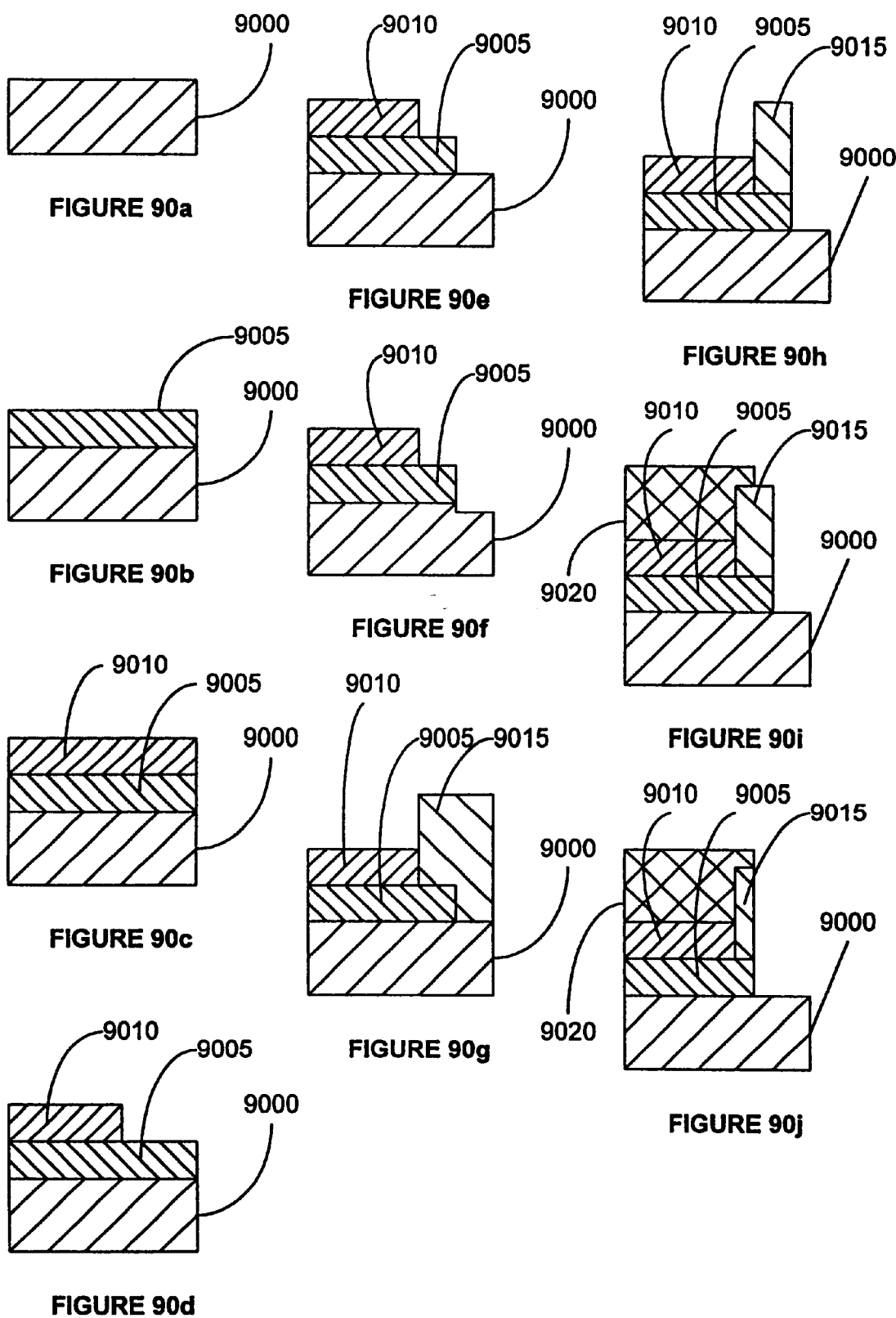

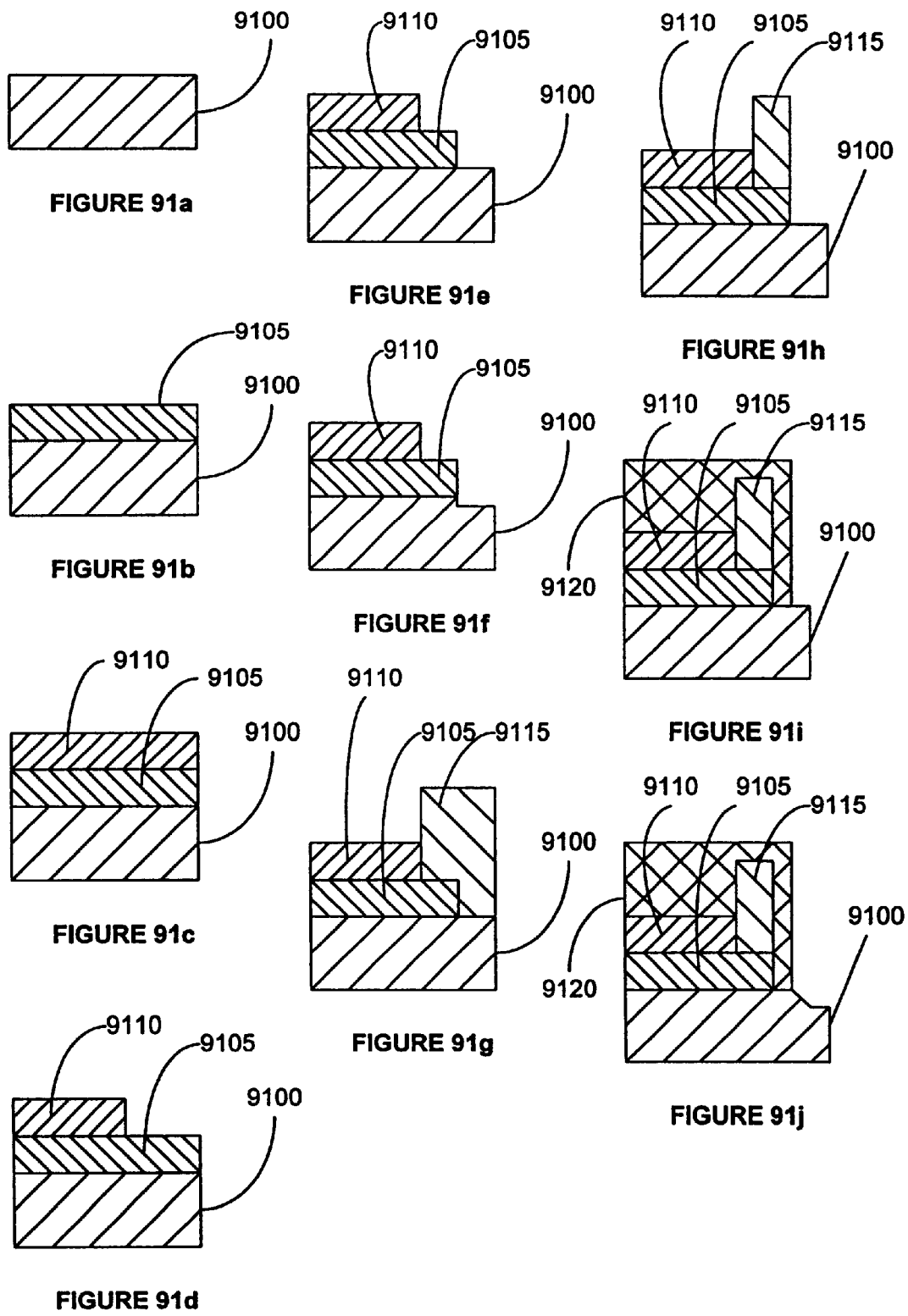

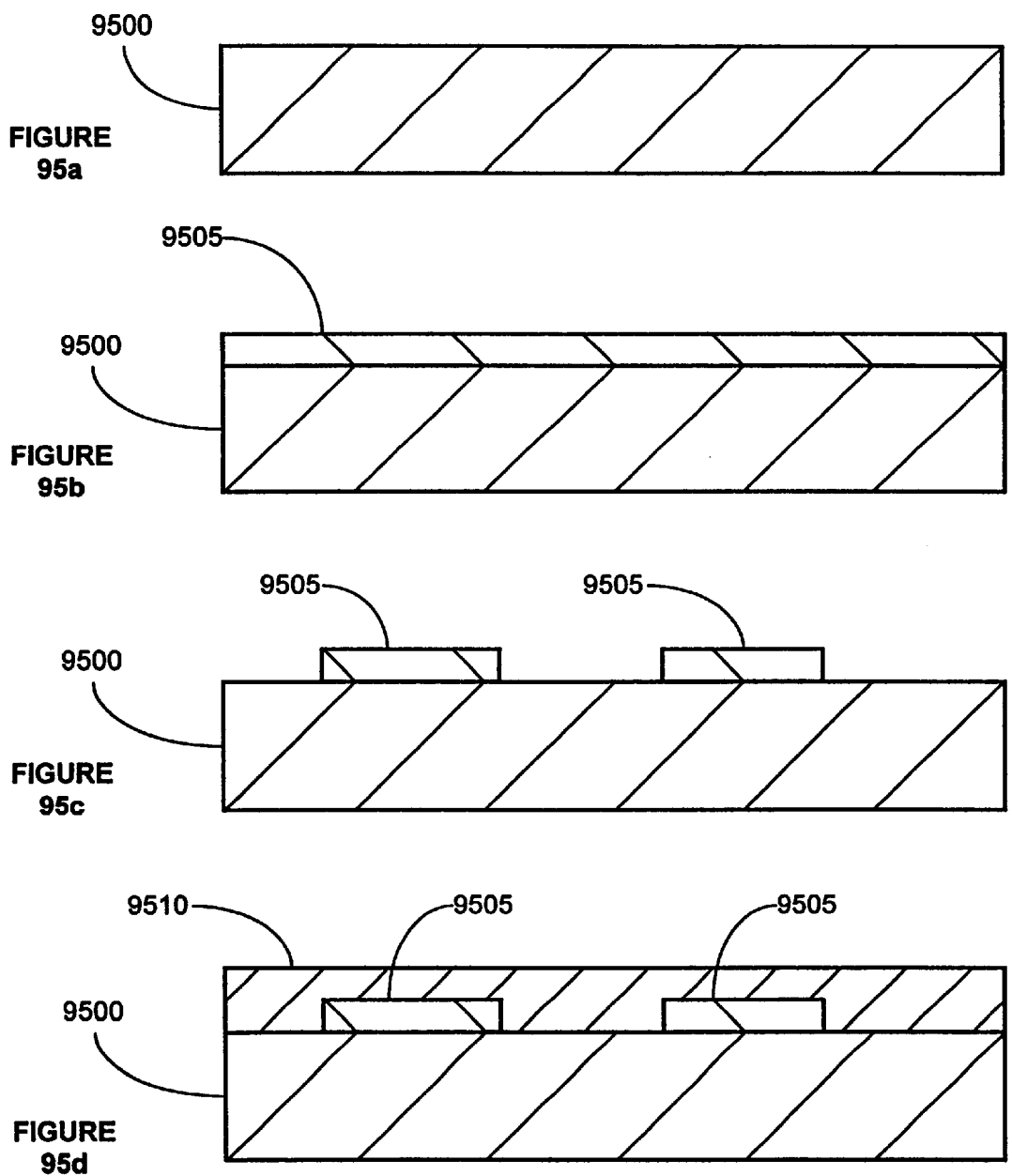

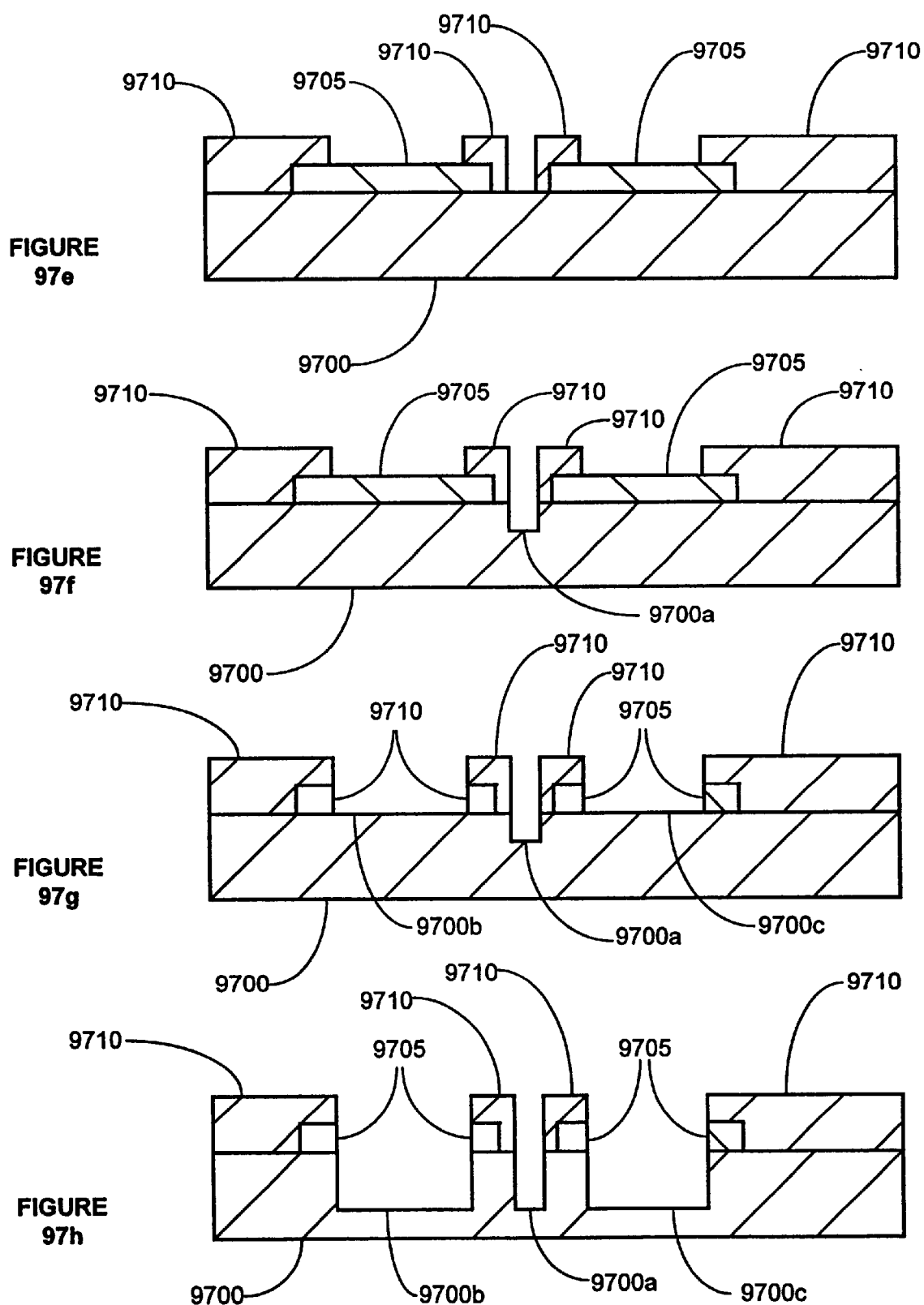

MERGED-MASK MICRO-MACHINING PROCESS

CROSS REFERENCE TO RELATED APPLICATION

This application is related to patent application Ser. No. 09/352,835, filed on Jul. 13, 1999, the disclosure of which is incorporated herein by reference.

BACKGROUND OF THE INVENTION

This invention relates generally to micro-machined three dimensional structures, and in particular to micro-machined movable structures.

Conventional bar code scanners are used to scan a surface with a laser beam. Conventional bar code scanners further typically utilize mirrors that are oscillated to permit the laser beam to scan. Conventional mirrors for bar code scanners are relatively large and imprecise.

In order to manufacture smaller and more precise bar code mirrors, micromachining processes are commonly used in which a silicon substrate is micromachined to produce a mirror. However, conventional micromachining processes suffer from a number of limitations.

For example, in micromachining an initially planar substrate using repeated iterations of photolithographic patterning and etching, it is typically desirable to etch the substrate to achieve etch depth variations that are greater than those appropriate for conventional photolithographic patterning methods used in manufacturing integrated circuits. In some cases, the etch depth variation of the substrate may exceed the depth of focus of the optical lithography equipment. The variation in etch depth may also be sufficiently large to preclude the application of a thin, uniform layer of photoresist using the conventional technique of pouring photoresist onto the substrate and then rapidly spinning the substrate to distribute the photoresist. If photoresist is spun onto a surface having significant topography, then the resulting thickness of the photoresist may vary by more than 1000%. As a result, lithography of fine features in uneven photoresist is difficult because of the overexposure of the thinner photoresist regions. However, in typical micromachining applications, it is typically desirable to subsequently pattern such a substrate having significant topography.

An additional complication arises during micromachining if relatively deep recesses are formed on one side of a substrate and then the other side of the substrate is micromachined. Typical vacuum chucks of conventional automatic wafer handling equipment may not be able to hold such wafers due to the uneven micromachined surface.

In order to overcome some of the difficulties of micromachining, a number of so-called merged-mask micromachining processes have been developed. The typical processing steps in a merged-mask micromachining process include forming all of the etching masks onto the substrate, and then micromachining the substrate. In this manner, the etching masks are formed on a substantially planar surface resulting in relatively consistent and even film thicknesses. However, the conventional merged-mask micromachining processes still suffer from a number of limitations.

The present invention is directed to overcoming one or more of the limitations of the existing micromachining processes.

SUMMARY OF THE INVENTION

According to one aspect of the present invention, a method of fabricating a three-dimensional structure is provided that includes (1) providing a substrate; (2) applying a layer of a first masking material onto the substrate; (3) patterning the layer of the first masking material; (4) applying a layer of a second masking material onto the exposed portions of the substrate, the layer of the second masking material is at least as thick as the layer of the first masking material; (5) patterning the layer of the second masking material; (6) etching the exposed portions of the substrate; (7) etching the exposed portions of the layer of the second masking material; and (8) etching the exposed portions of the substrate.

According to another aspect of the present invention, a method of fabricating a three-dimensional structure is provided that includes providing a substrate; applying a layer of a first masking material onto the substrate; patterning the layer of the first masking material; applying a layer of a second masking material onto the exposed portions of the substrate, the layer of the second masking material is at least as thick as the layer of the first masking material; patterning the layer of the second masking material; etching the exposed portions of the substrate; etching the exposed portions of the layer of the second masking material; and etching the exposed portions of the substrate.

According to another aspect of the present invention, a method of fabricating a three-dimensional structure is provided that includes providing a substrate; applying a layer of a first masking material onto the substrate; patterning the layer of the first masking material; thin etching the exposed portions of the substrate; applying a layer of a second masking material onto the exposed portions of the substrate, the layer of the second masking material is at least as thick as the layer of the first masking material; patterning the layer of the second masking material; etching the exposed portions of the substrate; etching the exposed portions of the layer of the second masking material; and etching the exposed portions of the substrate.

According to another aspect of the present invention, a method of fabricating a three-dimensional structure is provided that includes providing a substrate; applying a layer of a first masking material onto the substrate; applying a layer of a second masking material onto the layer of the first masking material; patterning the layer of the second masking material; applying a layer of a third masking material onto the portions not covered by the patterned layer of the second masking material, the layer of the third masking material is at least as thick as the combined thickness of the layers of the first and second masking materials; patterning the layers of the first and third masking materials; etching the exposed portions of the substrate; etching the exposed portions of the layers of the first and third masking materials; and etching the exposed portions of the substrate.

According to another aspect of the present invention, a method of fabricating a three-dimensional structure is provided that includes providing a substrate; applying a layer of a first masking material onto the substrate; applying a layer of a second masking material onto the layer of the first masking material; patterning the layer of the second masking material; patterning the layer of the first masking material; applying a layer of a third masking material onto the portions not covered by the patterned layer of the second masking material, the layer of the third masking material is at least as thick as the combined thickness of the layers of the first and second masking materials; patterning the layers of the first and third masking materials; etching the exposed portions of the substrate; etching the exposed portions of the layers of the first and third masking materials; and etching the exposed portions of the substrate.

According to another aspect of the present invention, a method of fabricating a three-dimensional structure is provided that includes providing a substrate; applying a layer of a first masking material onto the substrate; applying a layer of a second masking material onto the layer of the first masking material; patterning the layer of the second masking material; patterning the layer of the first masking material; thin etching the exposed portions of the substrate; applying a layer of a third masking material onto the portions not covered by the patterned layer of the second masking material, the layer of the third masking material is at least as thick as the combined thickness of the layers of the first and second masking materials; patterning the layers of the first and third masking materials; etching the exposed portions of the substrate; etching the exposed portions of the layers of the first and third masking materials; and etching the exposed portions of the substrate.

According to another aspect of the present invention, a method of fabricating a three-dimensional structure is provided that includes providing a substrate; applying a layer of a first masking material onto the substrate; patterning the layer of the first masking material; applying a layer of a second masking material onto the patterned layer of the first masking material; patterning the layer of the second masking material; dry etching the exposed portions of the substrate; etching the exposed portions of the patterned layer of the first masking material; and dry etching the exposed portions of the substrate.

According to another aspect of the present invention, a method of fabricating a three-dimensional structure is provided that includes (1) providing a substrate; (2) applying a layer of a first masking material onto the substrate; (3) patterning the layer of the first masking material; (4) applying a layer of a second masking material onto the exposed portions of the substrate, the layer of the second masking material is at least as thick as the layer of the first masking material; (5) patterning a fraction of the thickness of the layer of the second masking material a plurality of times; (6) etching the exposed portions of the substrate; (7) etching a fraction of the thickness of the exposed portions of the layer of the second masking material; (8) etching the exposed portions of the substrate; and (9) repeating steps (7) and (8) a plurality of times.

According to another aspect of the present invention, a method of fabricating a three-dimensional structure is provided that includes (1) providing a substrate; (2) applying a layer of a first masking material onto the substrate; (3) patterning the layer of the first masking material; (4) applying a layer of a second masking material onto the exposed portions of the substrate, the layer of the second masking material is at least as thick as the layer of the first masking material; (5) patterning the layer of the second masking material; (6) applying a layer of a third masking material onto substrate; (7) patterning the layer of the third masking material; (8) etching the layer of the third masking material; (9) etching the exposed portions of the substrate; (10) etching the exposed portions of the layer of the second masking material; and (11) etching the exposed portions of the substrate.

According to another aspect of the present invention, a method of fabricating a three-dimensional structure is provided that includes (1) providing a substrate; (2) applying a layer of a first masking material onto the substrate; (3) patterning the layer of the first masking material; (4) applying a layer of a second masking material onto the exposed portions of the substrate, the layer of the second masking material is at least as thick as the layer of the first masking material; (5) patterning a fraction of the thickness of the layer of the second masking material a plurality of times; (6) applying a layer of a third masking material onto substrate; (7) patterning the layer of the third masking material; (8) etching the layer of the third masking material; (9) etching the exposed portions of the substrate; (10) etching a fraction of the thickness of the exposed portions of the layer of the second masking material; (11) etching the exposed portions of the substrate; and (12) repeat steps (10) and (11) a plurality of times.

According to another aspect of the present invention, a method of fabricating a three-dimensional structure is provided that includes (1) providing a substrate; (2) applying a layer of a first masking material onto the substrate; (3) patterning a fraction of the thickness of the layer of the first masking material a plurality of times; (4) applying a layer of a second masking material onto substrate; (5) patterning the layer of the second masking material; (6) etching the layer of the second masking material; (7) etching the exposed portions of the substrate; (8) etching a fraction of the thickness of the exposed portions of the layer of the first masking material; (9) etching the exposed portions of the substrate; and (10) repeat step's (8) and (9) a plurality of times.

According to another aspect of the present invention, a method of fabricating a three-dimensional structure is provided that includes providing a substrate; applying a layer of a first masking material onto the substrate; patterning the layer of the first masking material; applying a layer of a second masking material onto the patterned first layer of masking material; patterning the layer of the second masking material; dry etching a first group of exposed portions of the substrate for a first time period; etching the exposed portions of the layer of the first masking material; and dry etching a second group of exposed portions of the substrate for a second time period; wherein the first time period and the second time period are a function of the size of the exposed portions of the substrate.

According to another aspect of the present invention, a method of micro-machining a substrate is provided that includes wet etching the substrate using a merged-mask micro-machining process and dry etching the substrate using a merged-mask micro-machining process.

According to another aspect of the present invention, a method of creating multiple masking layers for use in micro-machining a substrate is provided that includes applying a layer of an etch resistant material onto the substrate and eroding different areas of the layer at different rates to form a multiple thickness layer.

According to another aspect of the present invention, a method of micromachining a substrate is provided that includes using a combination of different etchants having different anisotropic properties.

According to another aspect of the present invention, a method of micromachining a substrate is provided that includes decoupling a first etching process from a second etching process.

According to another aspect of the present invention, a mirror assembly is provided that includes a mirror, a top cap and a bottom cap. The mirror includes a mirror support structure, a pair of T-shaped hinges coupled to the mirror support structure and a mirrored plate coupled to the T-shaped hinges. The mirrored plate includes one or more travel stops for limiting movement of the mirrored plate. The top cap is coupled to one side of the mirror. The top cap includes a top cap support structure including an opening for permitting light to reflect off of the mirrored plate and one or more travel stops coupled to the top cap support structure for limiting movement of the mirrored plate. The bottom cap is coupled to another side of the mirror. The bottom cap includes a bottom cap support structure including an opening and one or more travel stops coupled to the bottom cap support structure for limiting movement of the mirrored plate. The mirror is fabricated using a process comprising a merged-mask micro-machining process.

According to another aspect of the present invention, a mirror assembly is provided that includes a support structure, a pair of T-shaped hinges coupled to the support structure and a mirrored plate coupled to the T-shaped hinges. The mirrored plate includes one or more travel stops for limiting movement of the mirrored plate. The mirror is fabricated using a process comprising a merged-mask micro-machining process.

According to another aspect of the present invention, an apparatus is provided that includes one or T-shaped springs and a mass coupled to the T-shaped springs. The apparatus is fabricated using a merged-mask micro-machining process.

BRIEF DESCRIPTION OF THE DRAWINGS

FIG. 23b is an illustration of the growth of a field oxide layer onto the exposed areas of silicon of the silicon wafer of FIG. 23a.

FIG. 29b is a cross-sectional illustration of the silicon wafer of FIG. 29a.

FIG. 30a is an illustration of the gold depositioning, gold lithography and gold etching of the front side of the silicon wafer of FIG. 29a.

FIG. 30b is a cross sectional illustration of the silicon wafer of FIG. 30a.

FIG. 30c is an illustration of the application and patterning of a layer of photoresist onto the front side of the silicon wafer of FIG. 30a.

FIG. 35b is an illustration of the growth of a field layer of silicon dioxide onto the exposed areas of silicon of the silicon wafer of FIG. 35a.

FIG. 45a is a cross-sectional illustration of a silicon wafer.

FIG. 45b is a cross-sectional illustration of the silicon wafer of FIG. 45a including a layer of silicon nitride.

FIG. 45c is a cross-sectional illustration of a silicon wafer of FIG. 45b after patterning the layer of silicon nitride.

FIG. 45d is a cross-sectional illustration of the silicon wafer of FIG. 45c after growing a layer of silicon dioxide on the exposed portions of the silicon wafer.

FIG. 45e is a cross-sectional illustration of the silicon wafer of FIG. 45d after patterning the layer of silicon dioxide.

FIG. 45f is a cross-sectional illustration of the silicon wafer of FIG. 45e after etching the exposed portions of the silicon wafer.

FIG. 45g is a cross-sectional illustration of the silicon wafer of FIG. 45f after removing the exposed portions of the layer of silicon dioxide.

FIG. 45h is a cross-sectional illustration of the silicon wafer of FIG. 45g after etching the exposed portions of the silicon wafer.

FIG. 45i is a cross-sectional illustration of the silicon wafer of FIG. 45h after removing the layer of silicon nitride.

FIG. 46a is a cross-sectional illustration of a silicon wafer.

FIG. 46b is a cross-sectional illustration of the silicon wafer of FIG. 46a including a layer of silicon nitride.

FIG. 46c is a cross-sectional illustration of a silicon wafer of FIG. 46b after patterning the layer of silicon nitride.

FIG. 46d is a cross-sectional illustration of the silicon wafer of FIG. 46c after a thin etch of the exposed portions of the silicon wafer.

FIG. 46e is a cross-sectional illustration of the silicon wafer of FIG. 46d after growing a layer of silicon dioxide on the exposed portions of the silicon wafer.

FIG. 46f is a cross-sectional illustration of the silicon wafer of FIG. 46e after patterning the layer of silicon dioxide.

FIG. 46g is a cross-sectional illustration of the silicon wafer of FIG. 46f after etching the exposed portions of the silicon wafer.

FIG. 46h is a cross-sectional illustration of the silicon wafer of FIG. 46g after removing the exposed portions of the layer of silicon dioxide.

FIG. 46i is a cross-sectional illustration of the silicon wafer of FIG. 46h after etching the exposed portions of the silicon wafer.

FIG. 46j is a cross-sectional illustration of the silicon wafer of FIG. 46i after removing the layer of silicon nitride.

FIG. 51a is a cross sectional view of a silicon wafer.

FIG. 51b is a cross sectional view of the silicon wafer of FIG. 51a including a layer of silicon nitride.

FIG. 51c is a cross sectional view of the silicon wafer of FIG. 51b after patterning the layer of silicon nitride.

FIG. 51d is a cross sectional view of the silicon wafer of FIG. 51c after growing a field layer of oxide on the exposed portions of silicon.

FIG. 51e is a cross sectional view of the silicon wafer of FIG. 51d after multiple patterning operations performed on the field layer of oxide.

FIG. 51f is a cross sectional view of the silicon wafer of FIG. 51e after etching the exposed portions of silicon.

FIG. 51g is a cross sectional view of the silicon wafer of FIG. 51f after etching portions of the exposed portions of the field layer of silicon dioxide.

FIG. 51h is a cross sectional view of the silicon wafer of FIG. 51g after etching the exposed portions of silic.

FIG. 51i is a cross sectional view of the silicon wafer of FIG. 51h after etching portions of the exposed portions of the field layer of silicon dioxide.

FIG. 51j is a cross sectional view of the silicon wafer of FIG. 51i after etching the exposed portions of silicon.

FIG. 51k is a cross sectional view of the silicon wafer of FIG. 51j after etching the exposed portions of the layer of silicon nitride.

FIG. 52a is a cross sectional view of a silicon wafer.

FIG. 52b is a cross sectional view of the silicon wafer of FIG. 52a including a layer of silicon nitride.

FIG. 52c is a cross sectional view of the silicon wafer of FIG. 52b after patterning the layer of silicon nitride.

FIG. 52d is a cross sectional view of the silicon wafer of FIG. 52c after a thin etch of the exposed portions of silicon.

FIG. 52e is a cross sectional view of the silicon wafer of FIG. 52d after growing a field layer of oxide on the exposed portions of silicon.

FIG. 52f is a cross sectional view of the silicon wafer of FIG. 52e after multiple patterning operations performed on the field layer of oxide.

FIG. 52g is a cross sectional view of the silicon wafer of FIG. 52f after etching the exposed portions of silicon.

FIG. 52h is a cross sectional view of the silicon wafer of FIG. 52g after etching portions of the exposed portions of the field layer of silicon dioxide.

Figure 52I:
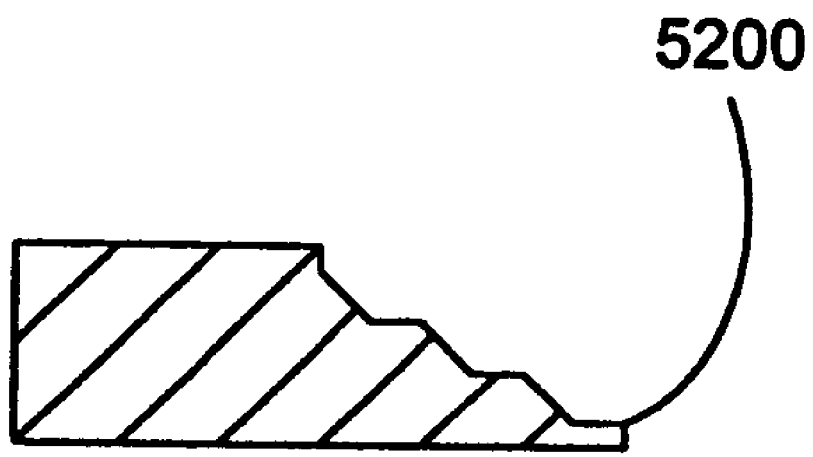

FIG. 52i is a cross sectional view of the silicon wafer of FIG. 52h after etching the exposed portions of silicon.

FIG. 52j is a cross sectional view of the silicon wafer of FIG. 52i after etching portions of the exposed portions of the field layer of silicon dioxide.

FIG. 52k is a cross sectional view of the silicon wafer of FIG. 52j after etching the exposed portions of silicon.

FIG. 52l is a cross sectional view of the silicon wafer of FIG. 52k after etching the exposed portions of the layer of silicon nitride.

Figure 53A:
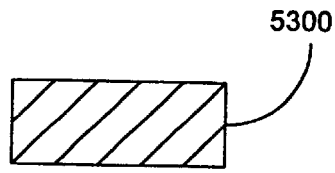

FIG. 53a is a cross sectional view of a silicon wafer.

Figure 53B:
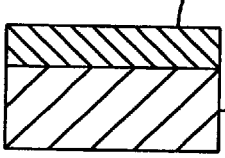

FIG. 53b is a cross sectional view of the silicon wafer of FIG. 53a including a pad layer of silicon dioxide.

Figure 53E:
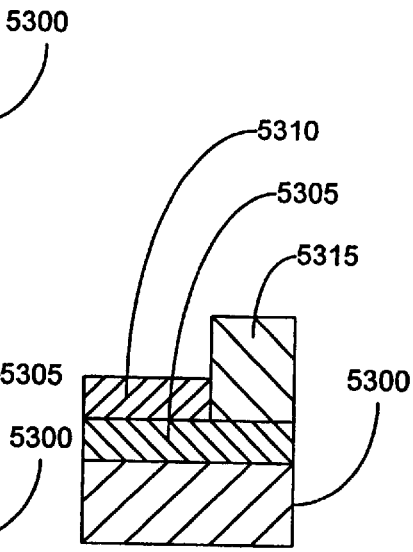
Figure 53G:
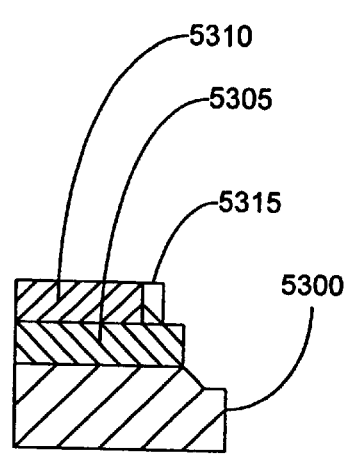
Figure 53C:
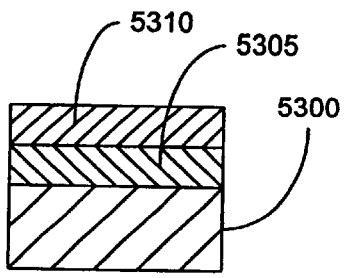

FIG. 53c is a cross sectional view of the silicon wafer of FIG. 53b including a layer of silicon nitride.

Figure 53F:
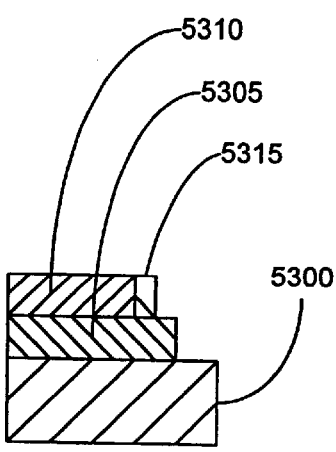
Figure 53D:
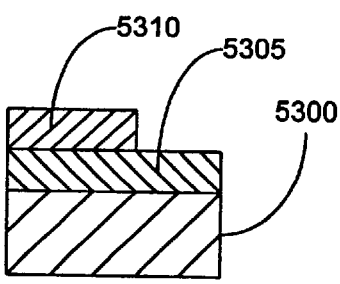

FIG. 53d is a cross sectional view of the silicon wafer of FIG. 53c after patterning the layer of silicon nitride.

FIG. 53e is a cross sectional view of the silicon wafer of FIG. 53d after growing a field layer of oxide on the portions not covered by the patterned layer of silicon nitride.

FIG. 53f is a cross sectional view of the silicon wafer of FIG. 53e after multiple patterning operations performed on the layers of silicon dioxide.

FIG. 53g is a cross sectional view of the silicon wafer of FIG. 53f after etching the exposed portions of silicon.

Figure 53H:
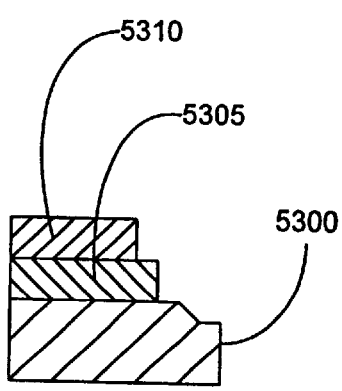

FIG. 53h is a cross sectional view of the silicon wafer of FIG. 53g after etching portions of the exposed portions of the layers of silicon dioxide.

Figure 53I:
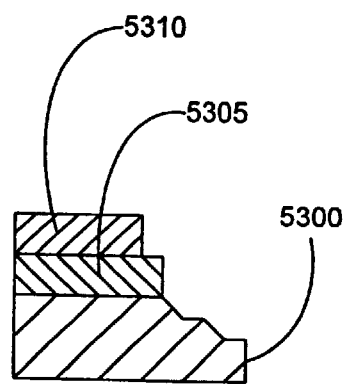

FIG. 53i is a cross sectional view of the silicon wafer of FIG. 53h after etching the exposed portions of silicon.

Figure 53J:
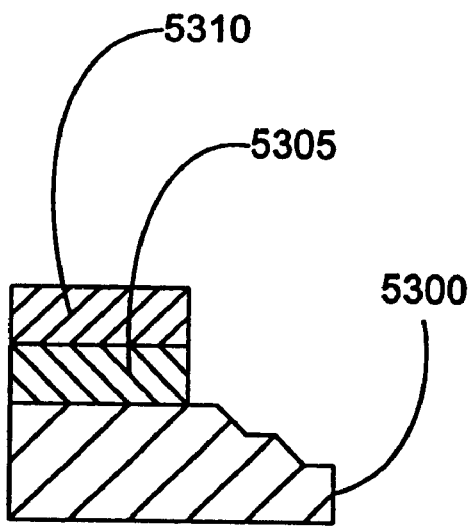

FIG. 53j is a cross sectional view of the silicon wafer of FIG. 53i after etching portions of the exposed portions of the layers of silicon dioxide.

Figure 53L:
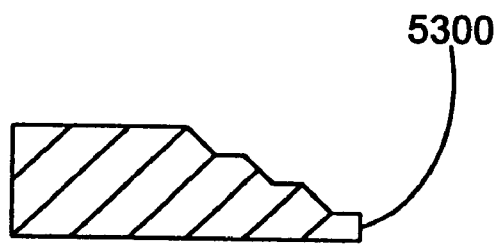
Figure 53K:
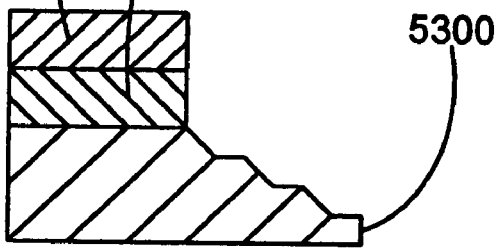

FIG. 53k is a cross sectional view of the silicon wafer of FIG. 53j after etching the exposed portions of silicon.

FIG. 53l is a cross sectional view of the silicon wafer of FIG. 53k after removing the remaining portions of the layers of silicon dioxide and silicon nitride.

FIG. 54a is a cross sectional view of a silicon wafer.

FIG. 54b is a cross sectional view of the silicon wafer of FIG. 54a including a pad layer of silicon dioxide.

FIG. 54c is a cross sectional view of the silicon wafer of FIG. 54b including a layer of silicon nitride.

FIG. 54d is a cross sectional view of the silicon wafer of FIG. 54c after patterning the layer of silicon nitride.

FIG. 54e is a cross sectional view of the silicon wafer of FIG. 54d after patterning the pad layer of silicon dioxide.

FIG. 54f is a cross sectional view of the silicon wafer of FIG. 54e after growing a field layer of oxide on the portions not covered by the patterned layer of silicon nitride.

FIG. 54g is a cross sectional view of the silicon wafer of FIG. 54f after multiple patterning operations performed on the layers of silicon dioxide.

FIG. 54h is a cross sectional view of the silicon wafer of FIG. 54g after etching the exposed portions of silicon.

FIG. 54i is a cross sectional view of the silicon wafer of FIG. 54h after etching portions of the exposed portions of the layers of silicon dioxide.

Figure 54J:
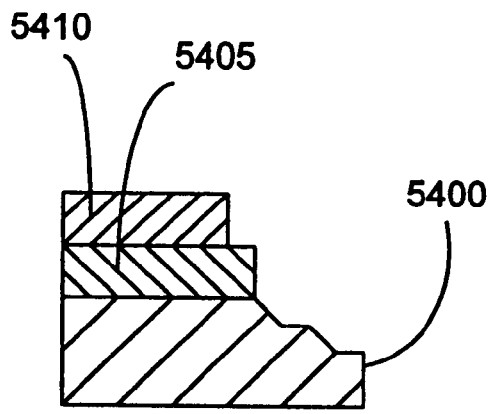

FIG. 54j is a cross sectional view of the silicon wafer of FIG. 54i after etching the exposed portions of silicon.

Figure 54K:
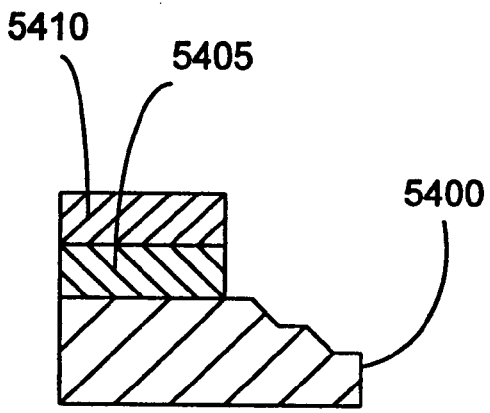

FIG. 54k is a cross sectional view of the silicon wafer of FIG. 54j after etching portions of the exposed portions of the layers of silicon dioxide.

Figure 54M:
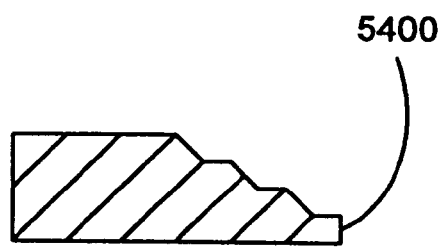
Figure 54L:
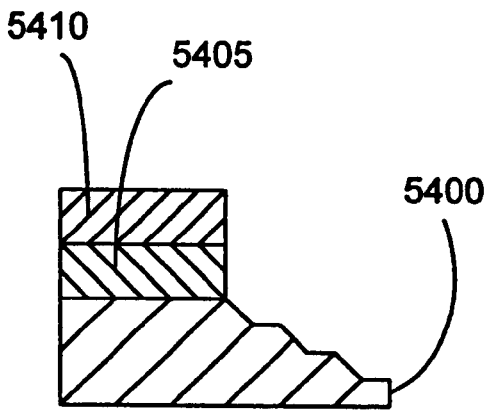

FIG. 54l is a cross sectional view of the silicon wafer of FIG. 54k after etching the exposed portions of silicon.

FIG. 54m is a cross sectional view of the silicon wafer of FIG. 54l after etching the exposed portions of the layers of silicon dioxide and silicon nitride.

FIG. 55a is a cross sectional view of a silicon wafer.

FIG. 55b is a cross sectional view of the silicon wafer of FIG. 55a including a pad layer of silicon dioxide.

FIG. 55c is a cross sectional view of the silicon wafer of FIG. 55b including a layer of silicon nitride.

FIG. 55d is a cross sectional view of the silicon wafer of FIG. 55c after patterning the layer of silicon nitride.

FIG. 55e is a cross sectional view of the silicon wafer of FIG. 55d after patterning the pad layer of silicon dioxide.

FIG. 55f is a cross sectional view of the silicon wafer of FIG. 55e after a thin etch of the exposed areas of silicon.

FIG. 55g is a cross sectional view of the silicon wafer of FIG. 55f after growing a field layer of oxide on the portions not covered by the patterned layer of silicon nitride.

FIG. 55h is a cross sectional view of the silicon wafer of FIG. 55g after multiple patterning operations performed on the layers of silicon dioxide.

FIG. 55i is a cross sectional view of the silicon wafer of FIG. 55h after etching the exposed portions of silicon.

FIG. 55j is a cross sectional view of the silicon wafer of FIG. 55i after etching portions of the exposed portions of the layers of silicon dioxide.

Figure 55K:
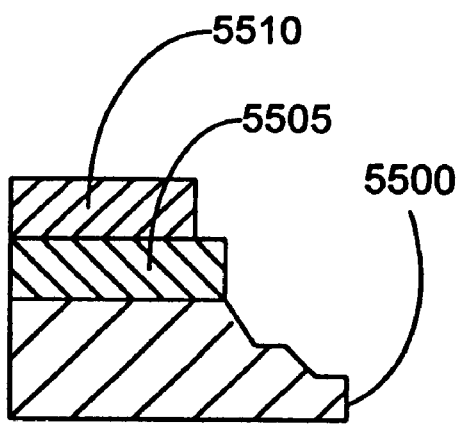

FIG. 55k is a cross sectional view of the silicon wafer of FIG. 55j after etching the exposed portions of silicon.

Figure 55L:
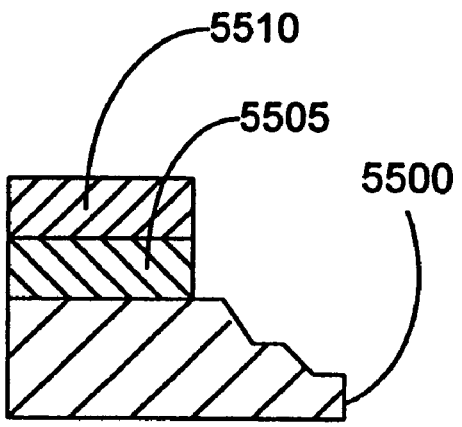

FIG. 55l is a cross sectional view of the silicon wafer of FIG. 55k after etching portions of the exposed portions of the layers of silicon dioxide.

Figure 55N:
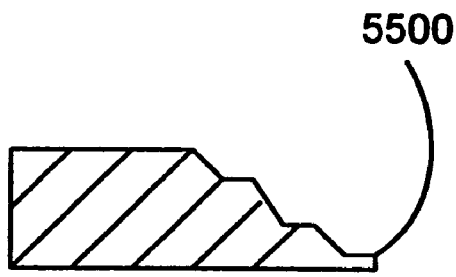
Figure 55M:
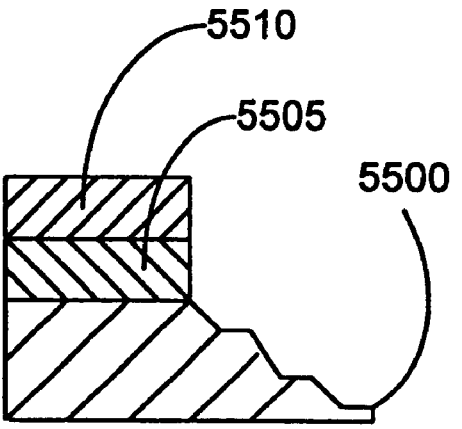

FIG. 55m is a cross sectional view of the silicon wafer of FIG. 55l after etching the exposed portions of silicon.

FIG. 55n is a cross sectional view of the silicon wafer of FIG. 55m after etching the exposed portions of the layers of silicon dioxide and silicon nitride.

Figure 56A:
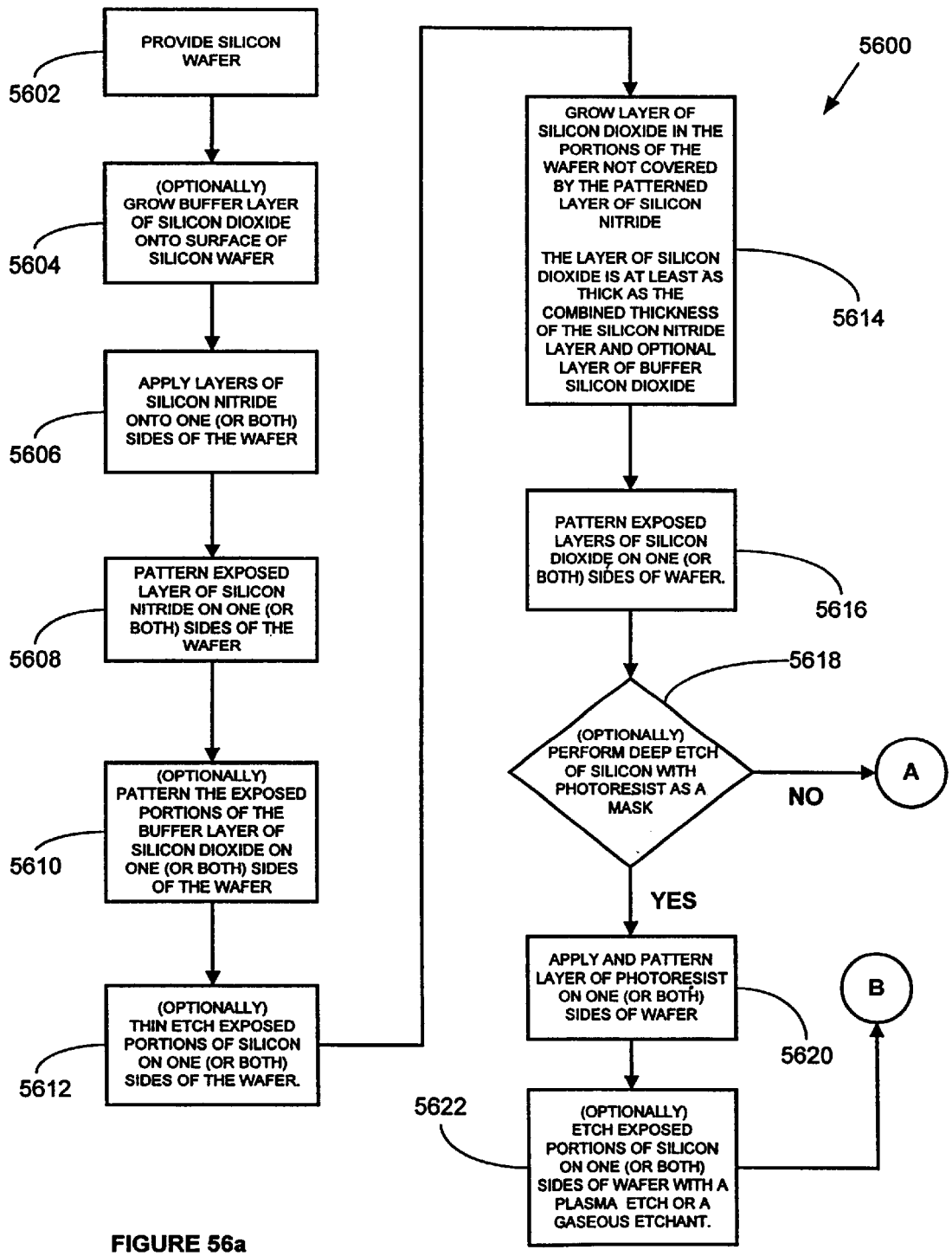
Figure 56B:
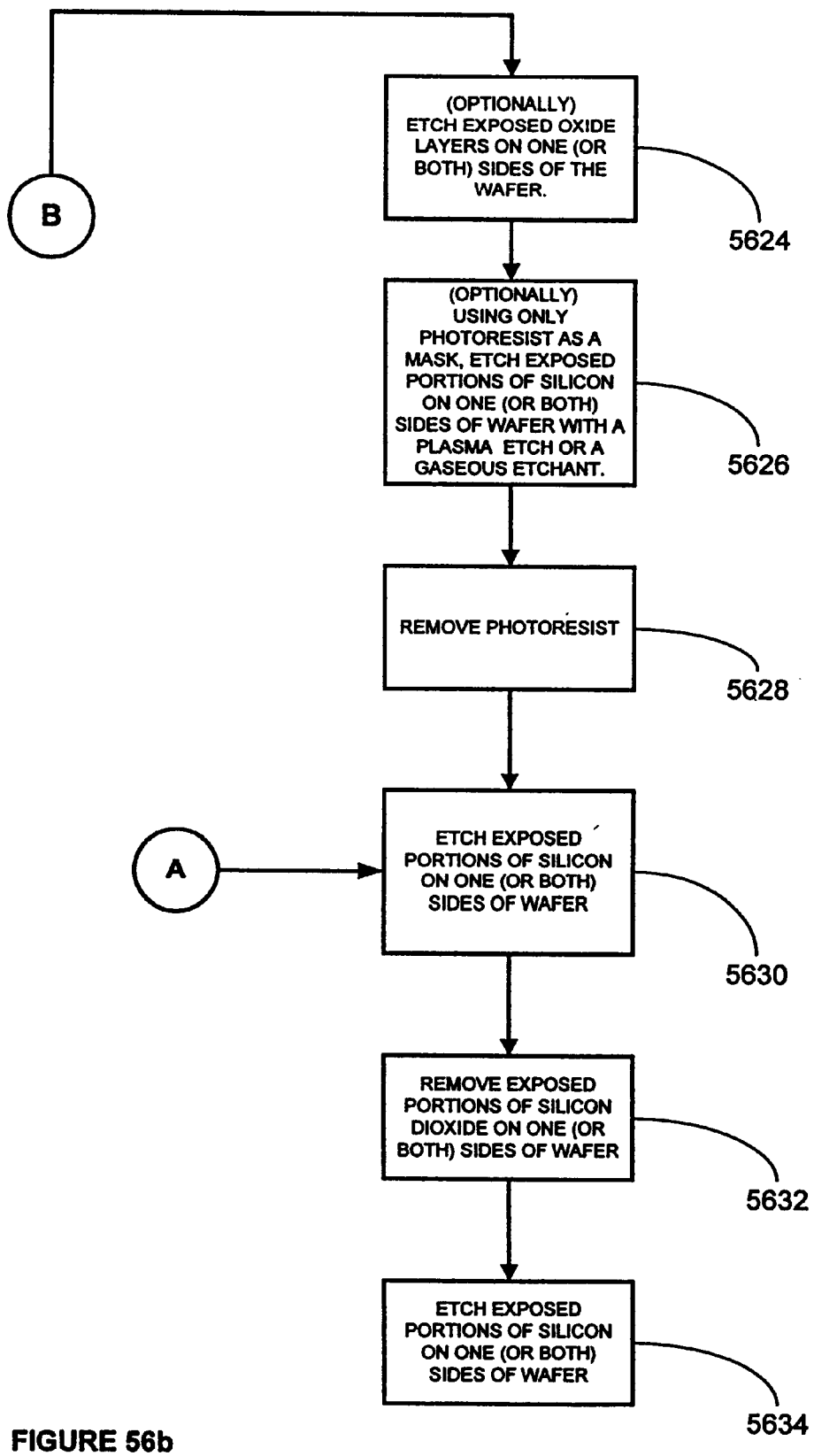

FIGS. 56a and 56b are a flow chart illustrating several embodiments of LOCOS merged-mask micromachining processes including using photoresist as a mask for deep reactive ion etching of silicon.

FIG. 57a is a cross sectional view of a silicon wafer.

FIG. 57b is a cross sectional view of the silicon wafer of FIG. 57a including a layer of silicon nitride.

FIG. 57c is a cross sectional view of the silicon wafer of FIG. 57b after patterning the layer of silicon nitride.

FIG. 57d is a cross sectional view of the silicon wafer of FIG. 57c after growing a field layer of oxide on the exposed portions of silicon.

FIG. 57e is a cross sectional view of the silicon wafer of FIG. 57d after patterning the field layer of oxide.

FIG. 57f is a cross sectional view of the silicon wafer of FIG. 57e after applying and patterning a layer of photoresist onto the silicon wafer.

FIG. 57g is a cross sectional view of the silicon wafer of FIG. 57f after etching the exposed portions of silicon.

FIG. 57h is a cross sectional view of the silicon wafer of FIG. 57g after removing the photoresist.

FIG. 57i is a cross sectional view of the silicon wafer of FIG. 57h after etching the exposed portions of silicon.

FIG. 57j is a cross sectional view of the silicon wafer of FIG. 57i after etching the exposed portions of the field layer of silicon dioxide.

FIG. 57k is a cross sectional view of the silicon wafer of FIG. 57j after etching the exposed portions of silicon.

FIG. 57l is a cross sectional view of the silicon wafer of FIG. 57k after etching the exposed portions of the layer of silicon nitride.

Figure 58A:
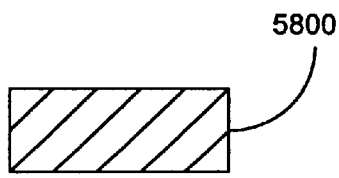

FIG. 58a is a cross sectional view of a silicon wafer.

Figure 58E:
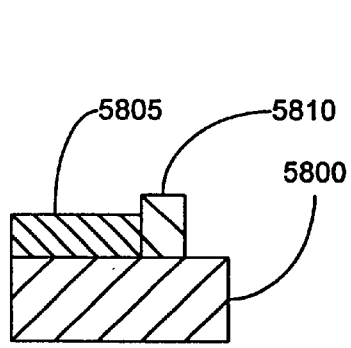
Figure 58I:
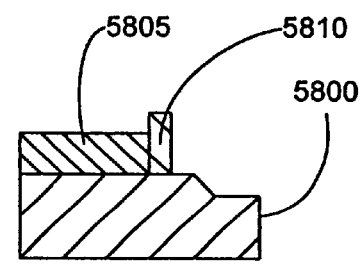
Figure 58B:
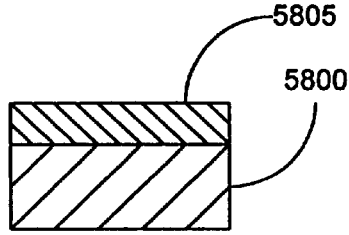

FIG. 58b is a cross sectional view of the silicon wafer of FIG. 58a including a layer of silicon nitride.

Figure 58F:
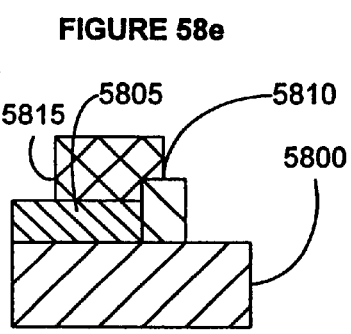
Figure 58J:
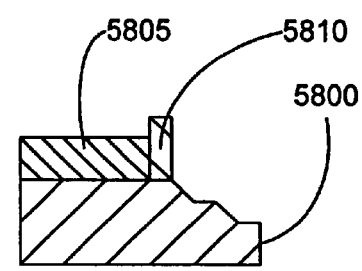
Figure 58C:
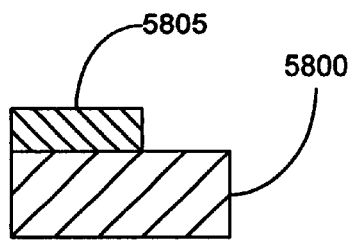

FIG. 58c is a cross sectional view of the silicon wafer of FIG. 58b after patterning the layer of silicon nitride.

Figure 58G:
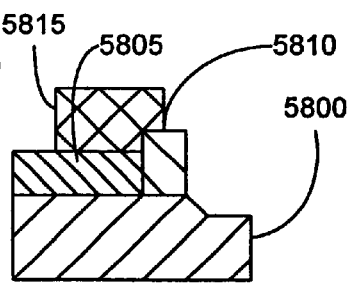
Figure 58K:
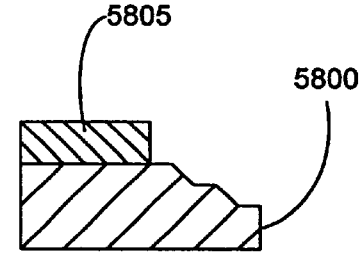
Figure 58D:
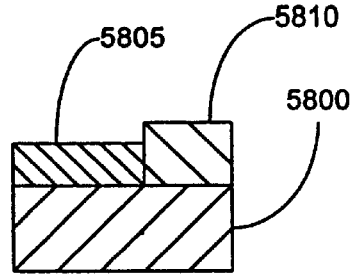

FIG. 58d is a cross sectional view of the silicon wafer of FIG. 58c after growing a field layer of oxide on the exposed portions of silicon.

FIG. 58e is a cross sectional view of the silicon wafer of FIG. 58d after patterning the field layer of oxide.

FIG. 58f is a cross sectional view of the silicon wafer of FIG. 58e after applying and patterning a layer of photoresist onto the silicon wafer.

FIG. 58g is a cross sectional view of the silicon wafer of FIG. 58f after etching the exposed portions of silicon.

Figure 58H:
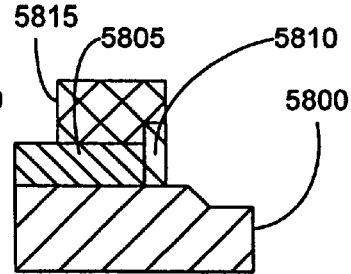

FIG. 58h is a cross sectional view of the silicon wafer of FIG. 58g after etching the exposed portions of the field layer of silicon dioxide.

FIG. 58i is a cross sectional view of the silicon wafer of FIG. 58h after removing the photoresist.

FIG. 58j is a cross sectional view of the silicon wafer of FIG. 58i after etching the exposed portions of silicon.

FIG. 58k is a cross sectional view of the silicon wafer of FIG. 58j after etching the exposed portions of the field layer of silicon dioxide.

Figure 58L:
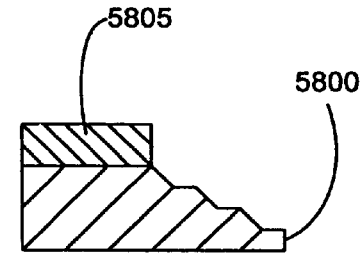

FIG. 58l is a cross sectional view of the silicon wafer of FIG. 58k after etching the exposed portions of silicon.

Figure 58M:
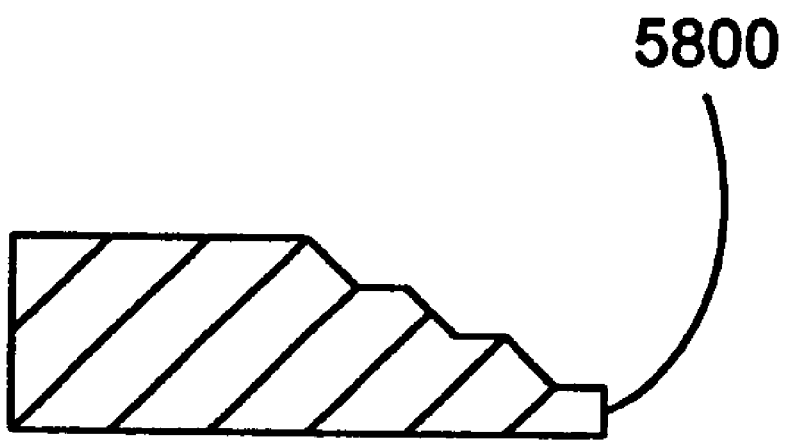

FIG. 58m is a cross sectional view of the silicon wafer of FIG. 58l after etching the exposed portions of the layer of silicon nitride.

FIG. 59a is a cross sectional view of a silicon wafer.

FIG. 59b is a cross sectional view of the silicon wafer of FIG. 59a including a layer of silicon nitride.

FIG. 59c is a cross sectional view of the silicon wafer of FIG. 59b after patterning the layer of silicon nitride.

FIG. 59d is a cross sectional view of the silicon wafer of FIG. 59c after growing a field layer of oxide on the exposed portions of silicon.

FIG. 59e is a cross sectional view of the silicon wafer of FIG. 59d after patterning the field layer of oxide.

FIG. 59f is a cross sectional view of the silicon wafer of FIG. 59e after applying and patterning a layer of photoresist onto the silicon wafer.

FIG. 59g is a cross sectional view of the silicon wafer of FIG. 59f after etching the exposed portions of silicon.

FIG. 59h is a cross sectional view of the silicon wafer of FIG. 59g after etching the exposed portions of silicon.

FIG. 59i is a cross sectional view of the silicon wafer of FIG. 59h after removing the photoresist.

FIG. 59j is a cross sectional view of the silicon wafer of FIG. 59i after etching the exposed portions of silicon.

FIG. 59k is a cross sectional view of the silicon wafer of FIG. 59j after etching the exposed portions of the field layer of silicon dioxide.

Figure 59M:
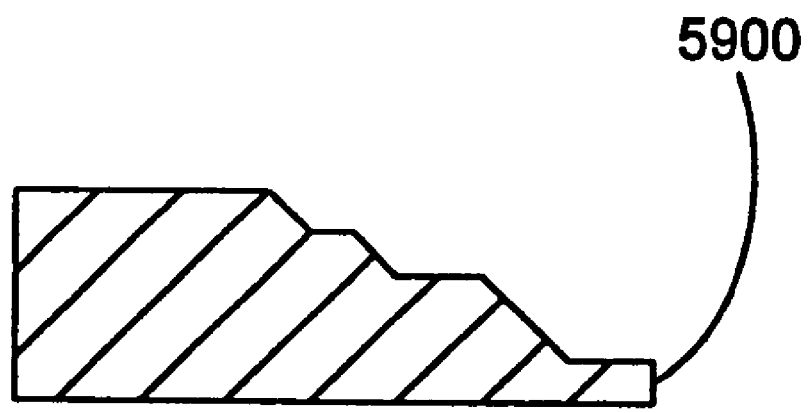

FIG. 59l is a cross sectional view of the silicon wafer of FIG. 59k after etching the exposed portions of silicon:

FIG. 59m is a cross sectional view of the silicon wafer of FIG. 59l after etching the exposed portions of the layer of silicon nitride.

FIG. 60a is a cross sectional view of a silicon wafer.

FIG. 60b is a cross sectional view of the silicon wafer of FIG. 60a including a layer of silicon nitride.

FIG. 60c is a cross sectional view of the silicon wafer of FIG. 60b after patterning the layer of silicon nitride.

FIG. 60d is a cross sectional view of the silicon wafer of FIG. 60c after growing a field layer of oxide on the exposed portions of silicon.

FIG. 60e is a cross sectional view of the silicon wafer of FIG. 60d after patterning the field layer of oxide.

FIG. 60f is a cross sectional view of the silicon wafer of FIG. 60e after applying and patterning a layer of photoresist onto the silicon wafer.

FIG. 60g is a cross sectional view of the silicon wafer of FIG. 60f after etching the exposed portions of silicon.

FIG. 60h is a cross sectional view of the silicon wafer of FIG. 60g after etching the exposed portions of the field layer of silicon dioxide.

FIG. 60i is a cross sectional view of the silicon wafer of FIG. 60h after etching the exposed portions of silicon.

FIG. 60j is a cross sectional view of the silicon wafer of FIG. 60i after removing the photoresist.

FIG. 60k is a cross sectional view of the silicon wafer of FIG. 60j after etching the exposed portions of silicon.

FIG. 60l is a cross sectional view of the silicon wafer of FIG. 60k after etching the exposed portions of the field layer of silicon dioxide.

Figure 60M:
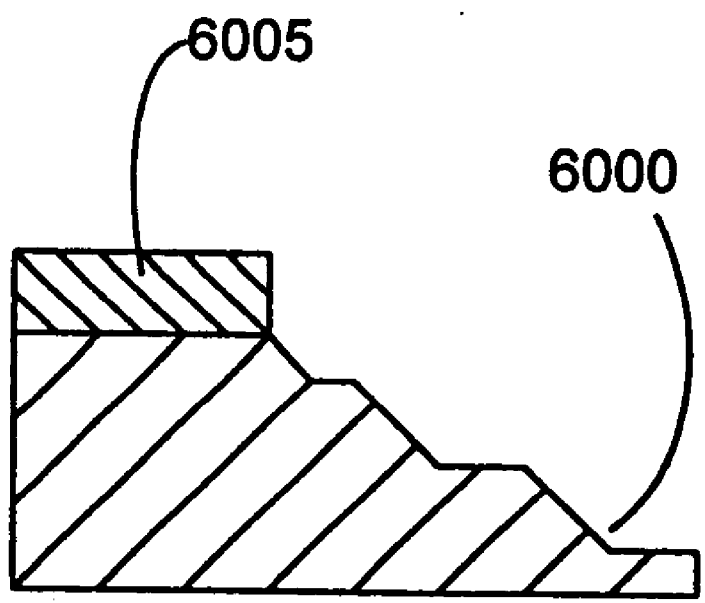

FIG. 60m is a cross sectional view of the silicon wafer of FIG. 60l after etching the exposed portions of silicon.

Figure 60N:
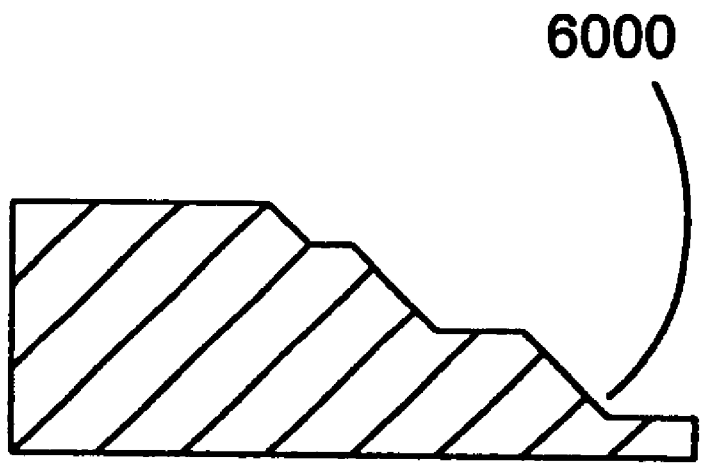

FIG. 60n is a cross sectional view of the silicon wafer of FIG. 60m after etching the exposed portions of the layer of silicon nitride.

FIG. 61a is a cross sectional view of a silicon wafer.

FIG. 61b is a cross sectional view of the silicon wafer of FIG. 61a including a layer of silicon nitride.

FIG. 61c is a cross sectional view of the silicon wafer of FIG. 61b after patterning the layer of silicon nitride.

FIG. 61d is a cross sectional view of the silicon wafer of FIG. 61c after growing a field layer of oxide on the exposed portions of silicon.

FIG. 61e is a cross sectional view of the silicon wafer of FIG. 61d after patterning the field layer of oxide.

FIG. 61f is a cross sectional view of the silicon wafer of FIG. 61e after applying and patterning a layer of photoresist onto the silicon wafer.

FIG. 61g is a cross sectional view of the silicon wafer of FIG. 61f after etching the exposed portions of the field layer of silicon dioxide.

FIG. 61h is a cross sectional view of the silicon wafer of FIG. 61g after removing the photoresist.

Figure 61I:
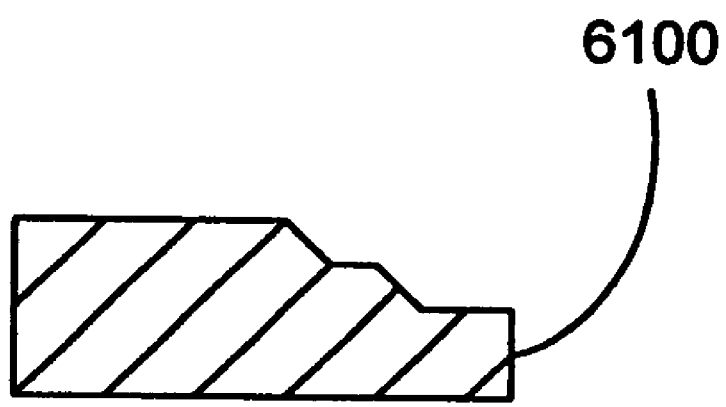

FIG. 61i is a cross sectional view of the silicon wafer of FIG. 61h after etching the exposed portions of silicon.

FIG. 61j is a cross sectional view of the silicon wafer of FIG. 61i after etching the exposed portions of the field layer of silicon dioxide.

FIG. 61k is a cross sectional view of the silicon wafer of FIG. 61j after etching the exposed portions of silicon.

FIG. 61l is a cross sectional view of the silicon wafer of FIG. 61k after etching the exposed portions of the layer of silicon nitride.

FIG. 62a is a cross sectional view of a silicon wafer.

FIG. 62b is a cross sectional view of the silicon wafer of FIG. 62a including a layer of silicon nitride.

FIG. 62c is a cross sectional view of the silicon wafer of FIG. 62b after patterning the layer of silicon nitride.

FIG. 62d is a cross sectional view of the silicon wafer of FIG. 62c after growing a field layer of oxide on the exposed portions of silicon.

FIG. 62e is a cross sectional view of the silicon wafer of FIG. 62d after patterning the field layer of oxide.

FIG. 62f is a cross sectional view of the silicon wafer of FIG. 62e after applying and patterning a layer of photoresist onto the silicon wafer.

FIG. 62g is a cross sectional view of the silicon wafer of FIG. 62f after etching the exposed portions of the field layer of silicon dioxide.

FIG. 62h is a cross sectional view of the silicon wafer of FIG. 62g after etching the exposed portions of silicon.

FIG. 62i is a cross sectional view of the silicon wafer of FIG. 62h after removing the photoresist.

FIG. 62j is a cross sectional view of the silicon wafer of FIG. 62i after etching the exposed portions of silicon.

FIG. 62k is a cross sectional view of the silicon wafer of FIG. 62j after etching the exposed portions of the field layer of silicon dioxide.

FIG. 62l is a cross sectional view of the silicon wafer of FIG. 62k after etching the exposed portions of silicon.

Figure 62M:
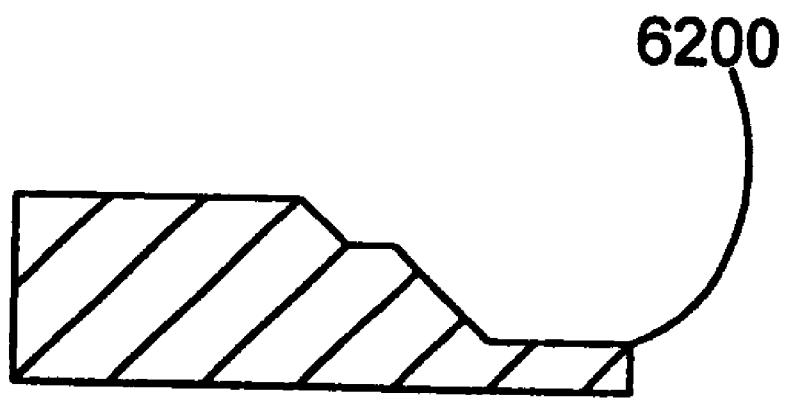

FIG. 62m is a cross sectional view of the silicon wafer of FIG. 62l after etching the exposed portions of the layer of silicon nitride.

Figures 63A, 63B, 63C, 63D, 63E, 63F, 63G, 63H, 63I, 63J, 63K, 63L:
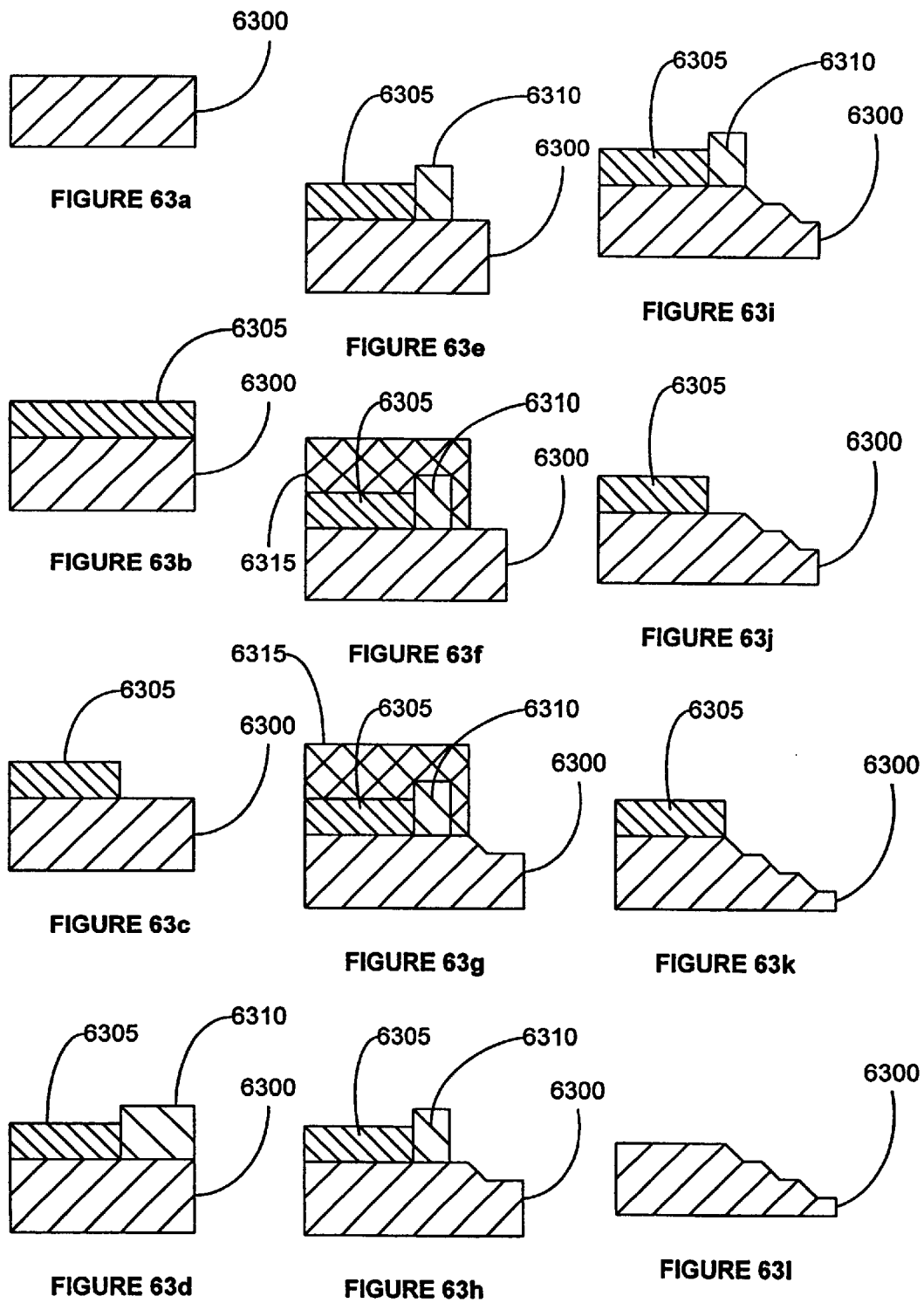

FIG. 63a is a cross sectional view of a silicon wafer.

FIG. 63b is a cross sectional view of the silicon wafer of FIG. 63a including a layer of silicon nitride.

FIG. 63c is a cross sectional view of the silicon wafer of FIG. 63b after patterning the layer of silicon nitride.

FIG. 63d is a cross sectional view of the silicon wafer of FIG. 63c after growing a field layer of oxide on the exposed portions of silicon.

FIG. 63e is a cross sectional view of the silicon wafer of FIG. 63d after patterning the field layer of oxide.

FIG. 63f is a cross sectional view of the silicon wafer of FIG. 63e after applying and patterning a layer of photoresist onto the silicon wafer.

FIG. 63g is a cross sectional view of the silicon wafer of FIG. 63f after etching the exposed portions of silicon.

FIG. 63h is a cross sectional view of the silicon wafer of FIG. 63g after removing the photoresist.

FIG. 63i is a cross sectional view of the silicon wafer of FIG. 63h after etching the exposed portions of silicon.

FIG. 63j is a cross sectional view of the silicon wafer of FIG. 63i after etching the exposed portions of the field layer of silicon dioxide.

FIG. 63k is a cross sectional view of the silicon wafer of FIG. 63j after etching the exposed portions of silicon.

FIG. 63l is a cross sectional view of the silicon wafer of FIG. 63k after etching the exposed portions of the layer of silicon nitride.

FIG. 64a is a cross sectional view of a silicon wafer.

FIG. 64b is a cross sectional view of the silicon wafer of FIG. 64a including a layer of silicon nitride.

FIG. 64c is a cross sectional view of the silicon wafer of FIG. 64b after patterning the layer of silicon nitride.

FIG. 64d is a cross sectional view of the silicon wafer of FIG. 64c after a thin etch of the exposed portions of silicon.

FIG. 64e is a cross sectional view of the silicon wafer of FIG. 64d after growing a field layer of oxide on the exposed portions of silicon.

FIG. 64f is a cross sectional view of the silicon wafer of FIG. 64e after patterning the field layer of oxide.

FIG. 64g is a cross sectional view of the silicon wafer of FIG. 64f after applying and patterning a layer of photoresist onto the silicon wafer.

FIG. 64h is a cross sectional view of the silicon wafer of FIG. 64g after etching the exposed portions of silicon.

FIG. 64i is a cross sectional view of the silicon wafer of FIG. 64h after removing the layer of photoresist.

FIG. 64j is a cross sectional view of the silicon wafer of FIG. 64i after etching the exposed portions of silicon.

FIG. 64k is a cross sectional view of the silicon wafer of FIG. 64j after etching the exposed portions of the field layer of silicon dioxide.

Figure 64L:
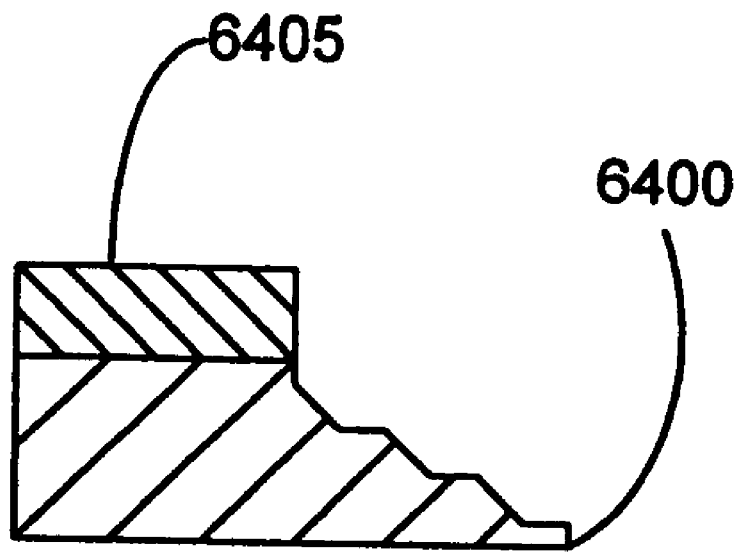

FIG. 64l is a cross sectional view of the silicon wafer of FIG. 64k after etching the exposed portions of silicon.

Figure 64M:
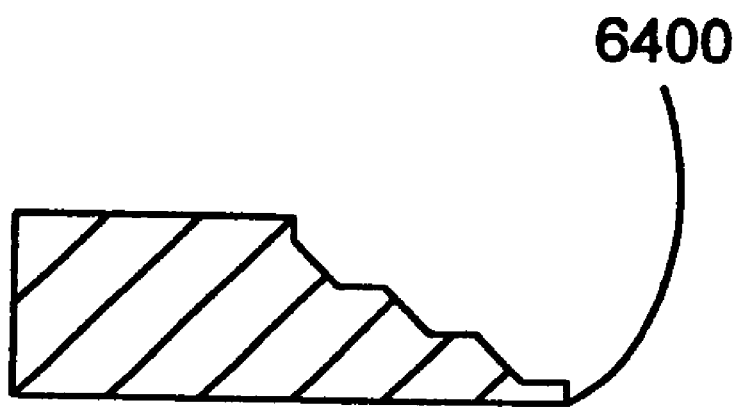

FIG. 64m is a cross sectional view of the silicon wafer of FIG. 64l after etching the exposed portions of the layer of silicon nitride.

FIG. 65a is a cross sectional view of a silicon wafer.

FIG. 65b is a cross sectional view of the silicon wafer of FIG. 65a including a layer of silicon nitride.

FIG. 65c is a cross sectional view of the silicon wafer of FIG. 65b after patterning the layer of silicon nitride.

FIG. 65d is a cross sectional view of the silicon wafer of FIG. 65c after a thin etch of the exposed portions of silicon.

FIG. 65e is a cross sectional view of the silicon wafer of FIG. 65d after growing a field layer of oxide on the exposed portions of silicon.

FIG. 65f is a cross sectional view of the silicon wafer of FIG. 64e after patterning the field layer of oxide.

FIG. 65g is a cross sectional view of the silicon wafer of FIG. 65f after applying and patterning a layer of photoresist onto the silicon wafer.

FIG. 65h is a cross sectional view of the silicon wafer of FIG. 65g after etching the exposed portions of silicon.

FIG. 65i is a cross sectional view of the silicon wafer of FIG. 65h after etching the exposed portions of the field layer of silicon dioxide.

FIG. 65j is a cross sectional view of the silicon wafer of FIG. 65i after removing the layer of photoresist.

FIG. 65k is a cross sectional view of the silicon wafer of FIG. 65j after etching the exposed portions of silicon.

Figure 65L:
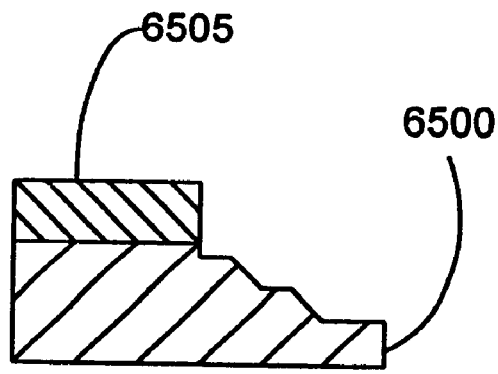

FIG. 65l is a cross sectional view of the silicon wafer of FIG. 65k after etching the exposed portions of the field layer of silicon dioxide.

Figure 65M:
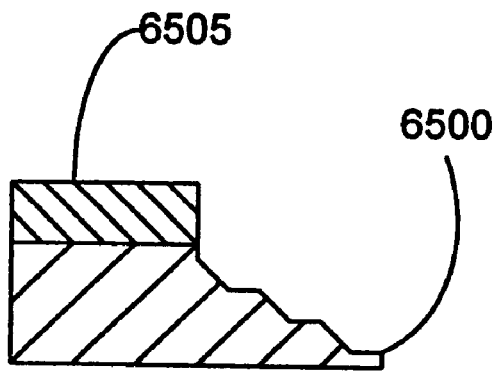

FIG. 65m is a cross sectional view of the silicon wafer of FIG. 65l after etching the exposed portions of silicon.

Figure 65N:
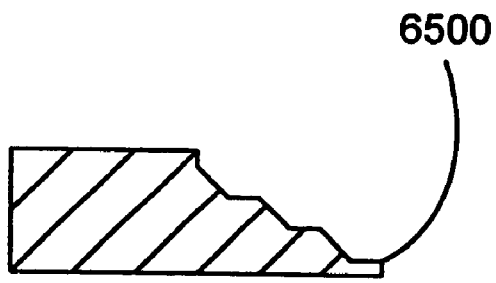

FIG. 65n is a cross sectional view of the silicon wafer of FIG. 65m after etching the exposed portions of the layer of silicon nitride.

FIG. 66a is a cross sectional view of a silicon wafer.

FIG. 66b is a cross sectional view of the silicon wafer of FIG. 66a including a layer of silicon nitride.

FIG. 66c is a cross sectional view of the silicon wafer of FIG. 66b after patterning the layer of silicon nitride.

FIG. 66d is a cross sectional view of the silicon wafer of FIG. 66c after a thin etch of the exposed portions of silicon.

FIG. 66e is a cross sectional view of the silicon wafer of FIG. 66d after growing a field layer of oxide on the exposed portions of silicon.

FIG. 66f is a cross sectional view of the silicon wafer of FIG. 66e after patterning the field layer of oxide.

FIG. 66g is a cross sectional view of the silicon wafer of FIG. 66f after applying and patterning a layer of photoresist onto the silicon wafer.

FIG. 66h is a cross sectional view of the silicon wafer of FIG. 66g after etching the exposed portions of silicon.

FIG. 66i is a cross sectional view of the silicon wafer of FIG. 66h after etching the exposed portions of silicon.

FIG. 66j is a cross sectional view of the silicon wafer of FIG. 66i after removing the layer of photoresist.

FIG. 66k is a cross sectional view of the silicon wafer of FIG. 66j after etching the exposed portions of silicon.

Figure 66L:
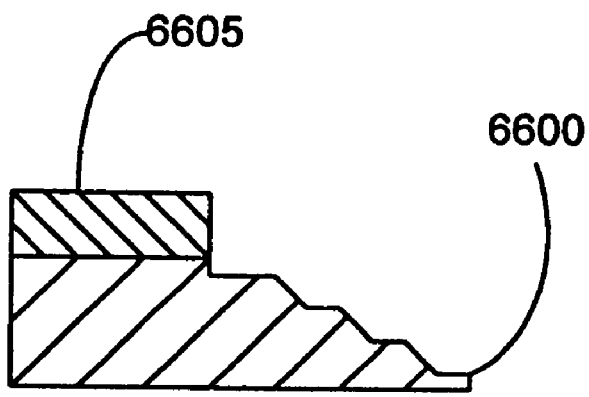

FIG. 66l is a cross sectional view of the silicon wafer of FIG. 66k after etching the exposed portions of the field layer of silicon dioxide.

Figure 66M:
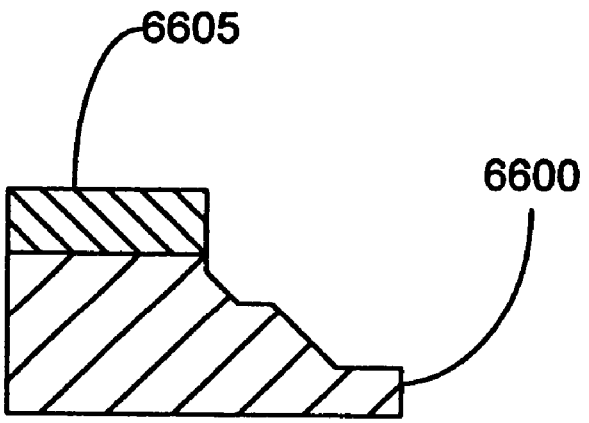

FIG. 66m is a cross sectional view of the silicon wafer of FIG. 66l after etching the exposed portions of silicon.

Figure 66N:
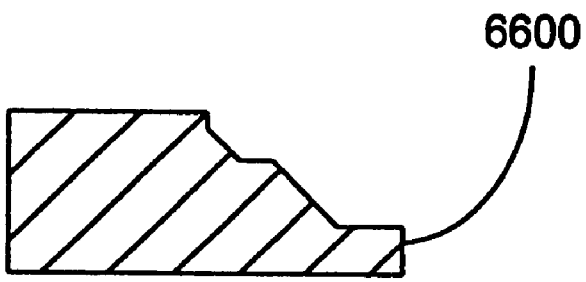

FIG. 66n is a cross sectional view of the silicon wafer of FIG. 66m after etching the exposed portions of the layer of silicon nitride.

FIG. 67a is a cross sectional view of a silicon wafer.

FIG. 67b is a cross sectional view of the silicon wafer of FIG. 67a including a layer of silicon nitride.

FIG. 67c is a cross sectional view of the silicon wafer of FIG. 67b after patterning the layer of silicon nitride.

FIG. 67d is a cross sectional view of the silicon wafer of FIG. 67c after a thin etch of the exposed portions of silicon.

FIG. 67e is a cross sectional view of the silicon wafer of FIG. 67d after growing a field layer of oxide on the exposed portions of silicon.

FIG. 67f is a cross sectional view of the silicon wafer of FIG. 67e after patterning the field layer of oxide.

FIG. 67g is a cross sectional view of the silicon wafer of FIG. 67f after applying and patterning a layer of photoresist onto the silicon wafer.

FIG. 67h is a cross sectional view of the silicon wafer of FIG. 67g after etching the exposed portions of silicon.

FIG. 67i is a cross sectional view of the silicon wafer of FIG. 66h after etching the exposed portions of the field layer of silicon dioxide.

FIG. 67j is a cross sectional view of the silicon wafer of FIG. 67i after etching the exposed portions of silicon.

FIG. 67k is a cross sectional view of the silicon wafer of FIG. 67j after removing the layer of photoresist.

Figure 67L:
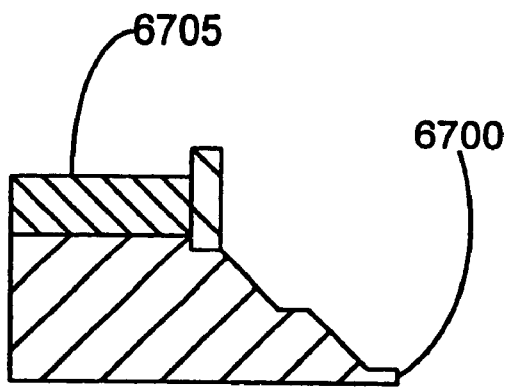

FIG. 67l is a cross sectional view of the silicon wafer of FIG. 67k after etching the exposed portions of silicon.

Figure 67O:
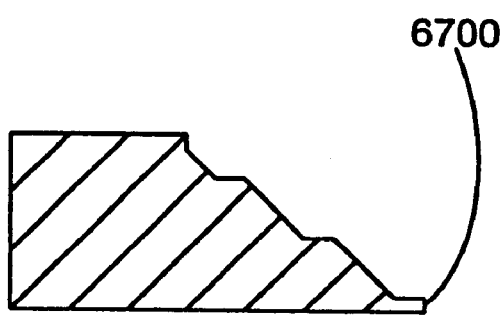
Figure 67M:
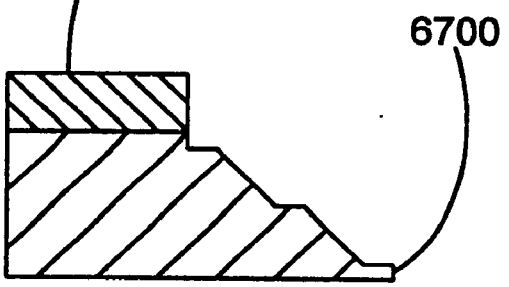

FIG. 67m is a cross sectional view of the silicon wafer of FIG. 67l after etching the exposed portions of the field layer of silicon dioxide.

Figure 67N:
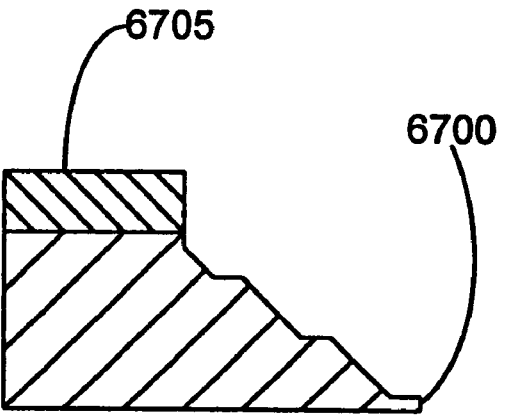

FIG. 67n is a cross sectional view of the silicon wafer of FIG. 67m after etching the exposed portions of silicon.

FIG. 67o is a cross sectional view of the silicon wafer of FIG. 67n after etching the exposed portions of the layer of silicon nitride.

FIG. 68a is a cross sectional view of a silicon wafer.

FIG. 68b is a cross sectional view of the silicon wafer of FIG. 68a including a layer of silicon nitride.

FIG. 68c is a cross sectional view of the silicon wafer of FIG. 68b after patterning the layer of silicon nitride.

FIG. 68d is a cross sectional view of the silicon wafer of FIG. 68c after a thin etch of the exposed portions of silicon.

FIG. 68e is a cross sectional view of the silicon wafer of FIG. 68d after growing a field layer of oxide on the exposed portions of silicon.

FIG. 68f is a cross sectional view of the silicon wafer of FIG. 68e after patterning the field layer of oxide.

FIG. 68g is a cross sectional view of the silicon wafer of FIG. 68f after applying and patterning a layer of photoresist onto the silicon wafer.

FIG. 68h is a cross sectional view of the silicon wafer of FIG. 68g after etching the exposed portions of the field layer of silicon dioxide.

FIG. 68i is a cross sectional view of the silicon wafer of FIG. 68h after removing the layer of photoresist.

FIG. 68j is a cross sectional view of the silicon wafer of FIG. 68i after etching the exposed portions of silicon.

FIG. 68k is a cross sectional view of the silicon wafer of FIG. 68j after etching the exposed portions of the field layer of silicon dioxide.

Figure 68L:
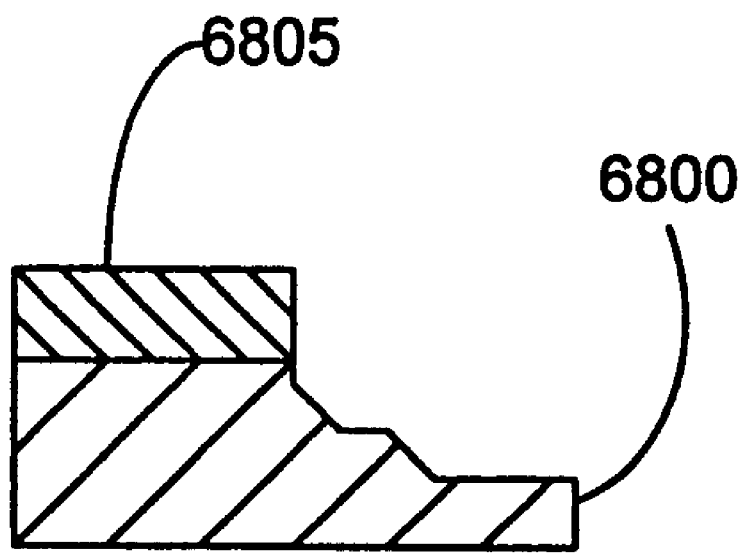

FIG. 68l is a cross sectional view of the silicon wafer of FIG. 68k after etching the exposed portions of silicon.

Figure 68M:
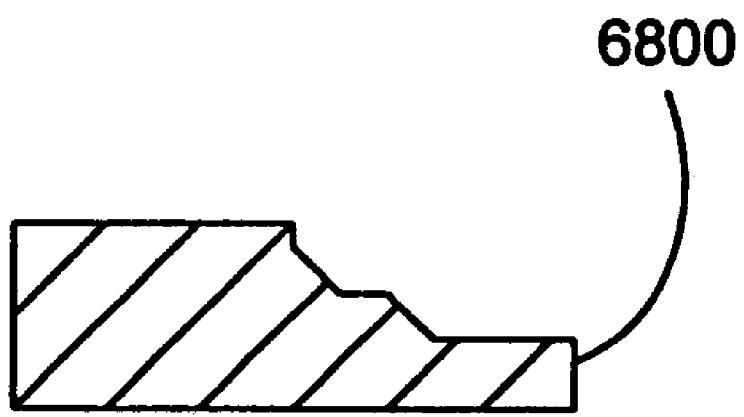

FIG. 68m is a cross sectional view of the silicon wafer of FIG. 68l after etching the exposed portions of the layer of silicon nitride.

FIG. 69a is a cross sectional view of a silicon wafer.

FIG. 69b is a cross sectional view of the silicon wafer of FIG. 69a including a layer of silicon nitride.

FIG. 69c is a cross sectional view of the silicon wafer of FIG. 69b after patterning the layer of silicon nitride.

FIG. 69d is a cross sectional view of the silicon wafer of FIG. 69c after a thin etch of the exposed portions of silicon.

FIG. 69e is a cross sectional view of the silicon wafer of FIG. 69d after growing a field layer of oxide on the exposed portions of silicon.

FIG. 69f is a cross sectional view of the silicon wafer of FIG. 69e after patterning the field layer of oxide.

FIG. 69g is a cross sectional view of the silicon wafer of FIG. 69f after applying and patterning a layer of photoresist onto the silicon wafer.

FIG. 69h is a cross sectional view of the silicon wafer of FIG. 69g after etching the exposed portions of the field layer of silicon dioxide.

FIG. 69i is a cross sectional view of the silicon wafer of FIG. 69h after etching the exposed portions of silicon.

FIG. 69j is a cross sectional view of the silicon wafer of FIG. 69i after removing the layer of photoresist.

FIG. 69k is a cross sectional view of the silicon wafer of FIG. 69j after etching the exposed portions of silicon.

Figure 69L:
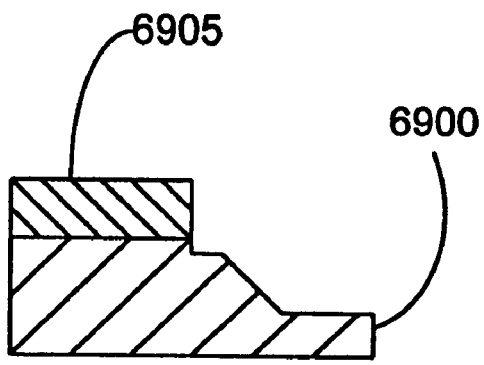

FIG. 69l is a cross sectional view of the silicon wafer of FIG. 69k after etching the exposed portions of the field layer of silicon dioxide.

Figure 69M:
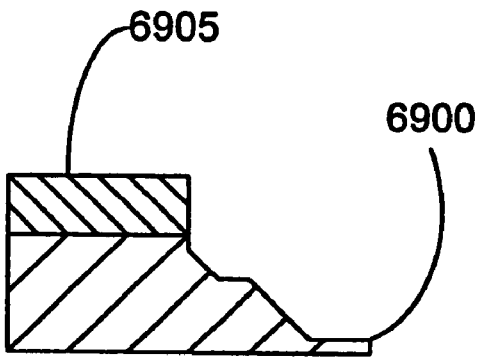

FIG. 69m is a cross sectional view of the silicon wafer of FIG. 69l after etching the exposed portions of silicon.

Figure 69N:
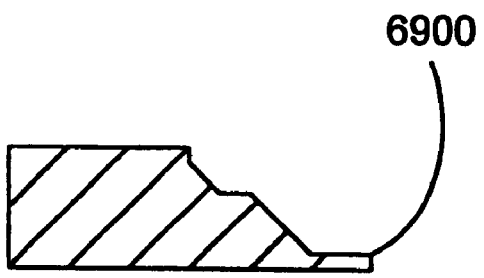

FIG. 69n is a cross sectional view of the silicon wafer of FIG. 69m after etching the exposed portions of the layer of silicon nitride.

FIG. 70a is a cross sectional view of a silicon wafer.

FIG. 70b is a cross sectional view of the silicon wafer of FIG. 70a including a layer of silicon nitride.

FIG. 70c is a cross sectional view of the silicon wafer of FIG. 70b after patterning the layer of silicon nitride.

FIG. 70d is a cross sectional view of the silicon wafer of FIG. 70c after a thin etch of the exposed portions of silicon.

FIG. 70e is a cross sectional view of the silicon wafer of FIG. 70d after growing a field layer of oxide on the exposed portions of silicon.

FIG. 70f is a cross sectional view of the silicon wafer of FI. 70e after patterning the field layer of oxide.

FIG. 70g is a cross sectional view of the silicon wafer of FIG. 70f after applying and patterning a layer of photoresist onto the silicon wafer.

FIG. 70h is a cross sectional view of the silicon wafer of FIG. 70g after etching the exposed portions of silicon.

FIG. 70i is a cross sectional view of the silicon wafer of FIG. 70h after removing the layer of photoresist.

FIG. 70j is a cross sectional view of the silicon wafer of FIG. 70i after etching the exposed portions of silicon.

FIG. 70k is a cross sectional view of the silicon wafer of FIG. 70j after etching the exposed portions of the field layer of silicon dioxide.

Figure 70L:
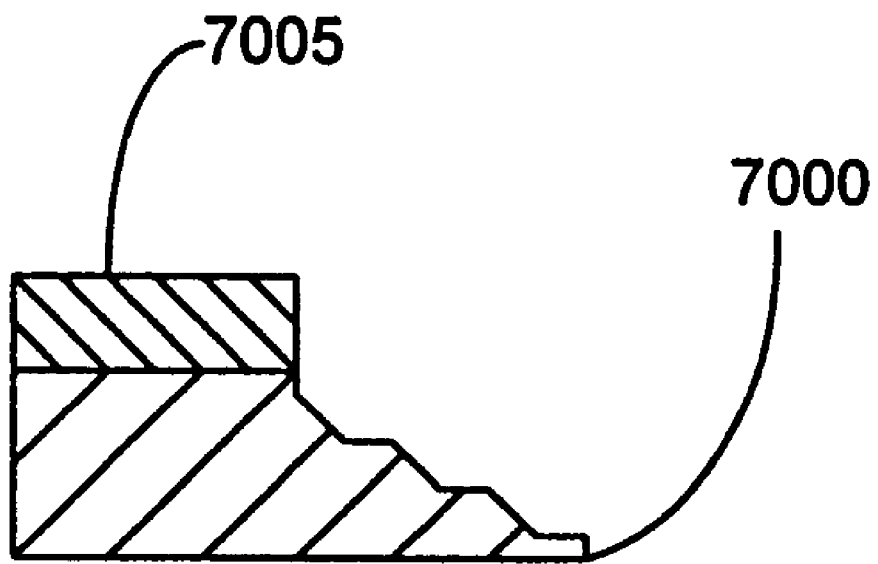

FIG. 70l is a cross sectional view of the silicon wafer of FIG. 70k after etching the exposed portions of silicon.

Figure 70M:
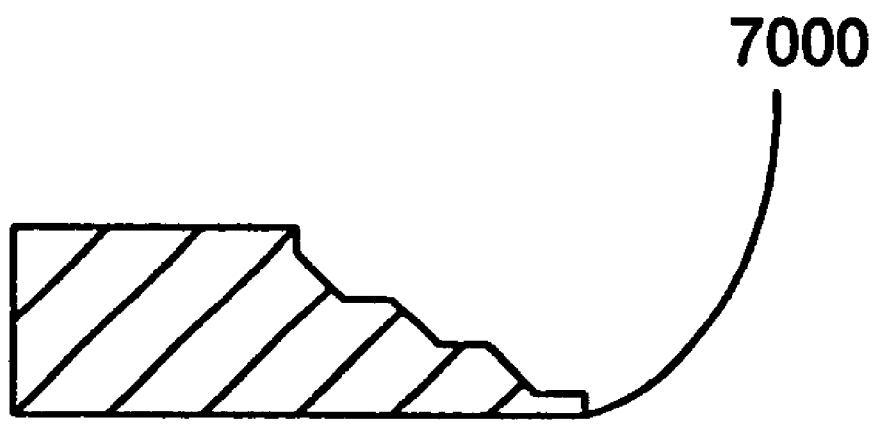

FIG. 70m is a cross sectional view of the silicon wafer of FIG. 70l after etching the exposed portions of the layer of silicon nitride.

FIG. 71a is a cross sectional view of a silicon wafer.

FIG. 71b is a cross sectional view of the silicon wafer of FIG. 71a including a pad layer of silicon dioxide.

FIG. 71c is a cross sectional view of the silicon wafer of FIG. 71b including a layer of silicon nitride.

FIG. 71d is a cross sectional view of the silicon wafer of FIG. 71c after patterning the layer of silicon nitride.

FIG. 71e is a cross sectional view of the silicon wafer of FIG. 71d after growing a field layer of oxide on the portions not covered by the patterned layer of silicon nitride.

FIG. 71f is a cross sectional view of the silicon wafer of FIG. 71e after patterning the layers of silicon dioxide.

FIG. 71g is a cross sectional view of the silicon wafer of FIG. 71f after applying and patterning a layer of photoresist onto the silicon wafer.

FIG. 71h is a cross sectional view of the silicon wafer of FIG. 71g after etching the exposed portions of silicon.

Figure 71I:
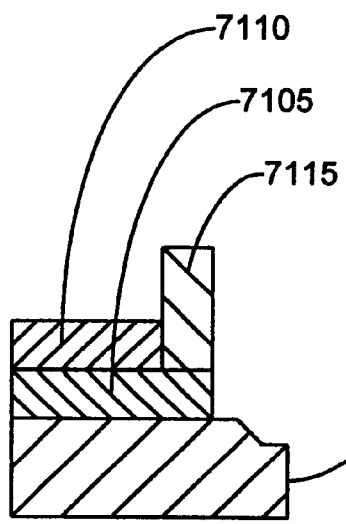

FIG. 71i is a cross sectional view of the silicon wafer of FIG. 71h after removing the layer of photoresist.

Figure 71K:
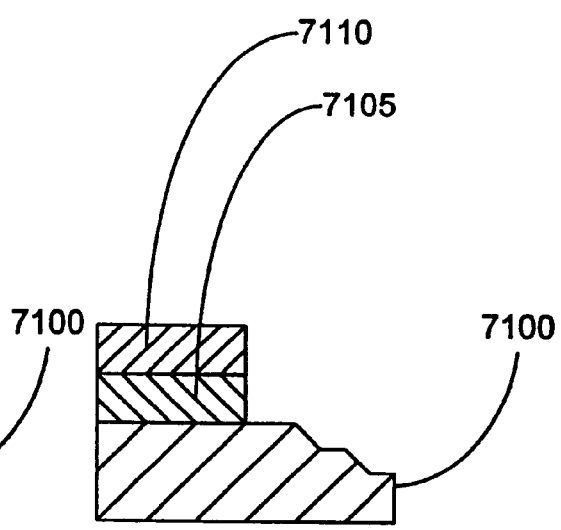
Figure 71J:
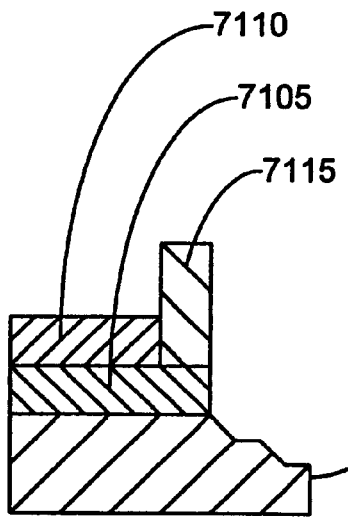

FIG. 71j is a cross sectional view of the silicon wafer of FIG. 71i after etching the exposed portions of silicon.

FIG. 70k is a cross sectional view of the silicon wafer of FIG. 71j after etching the exposed portions of the layers of silicon dioxide.

Figure 71L:
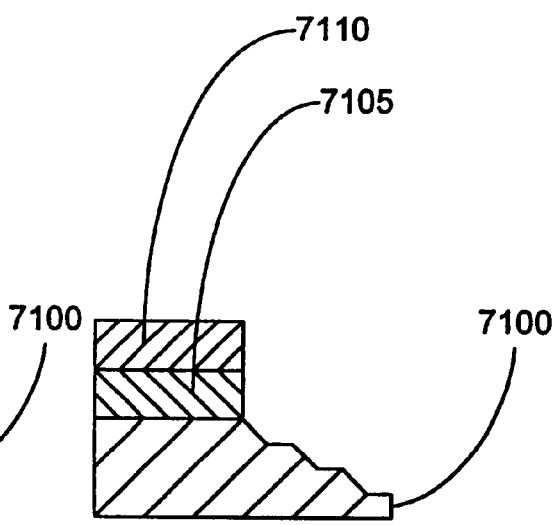

FIG. 71l is a cross sectional view of the silicon wafer of FIG. 71k after etching the exposed portions of silicon.

Figure 71M:
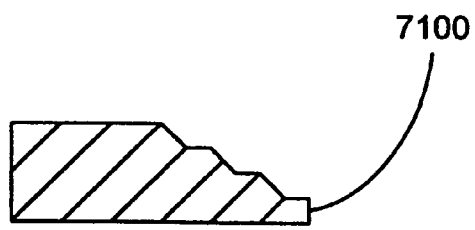

FIG. 71m is a cross sectional view of the silicon wafer of FIG. 71l after removing the remaining portions of the layers of silicon dioxide and silicon nitride.

FIG. 72a is a cross sectional view of a silicon wafer.

FIG. 72b is a cross sectional view of the silicon wafer of FIG. 72a including a pad layer of silicon dioxide.

FIG. 72c is a cross sectional view of the silicon wafer of FIG. 72b including a layer of silicon nitride.

FIG. 72d is a cross sectional view of the silicon wafer of FIG. 72c after patterning the layer of silicon nitride.

FIG. 72e is a cross sectional view of the silicon wafer of FIG. 72d after growing a field layer of oxide on the portions not covered by the patterned layer of silicon nitride.

FIG. 72f is a cross sectional view of the silicon wafer of FIG. 72e after patterning the layers of silicon dioxide.

FIG. 72g is a cross sectional view of the silicon wafer of FIG. 72f after applying and patterning a layer of photoresist onto the silicon wafer.

FIG. 72h is a cross sectional view of the silicon wafer of FIG. 72g after etching the exposed portions of silicon.

FIG. 72i is a cross sectional view of the silicon wafer of FIG. 72h after etching the exposed portions of the field layer of silicon dioxide.

FIG. 72j is a cross sectional view of the silicon wafer of FIG. 72i after removing the layer of photoresist.

Figure 72K:
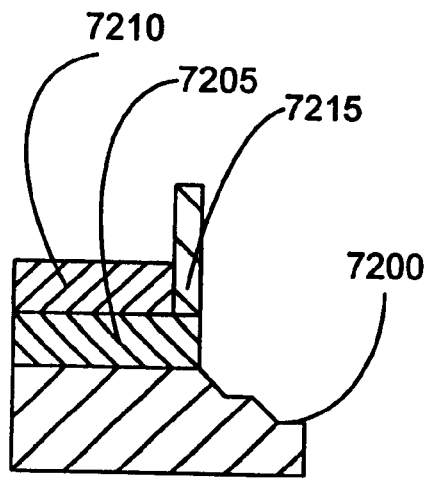

FIG. 72k is a cross sectional view of the silicon wafer of FIG. 72j after etching the exposed portions of silicon.

Figure 72N:
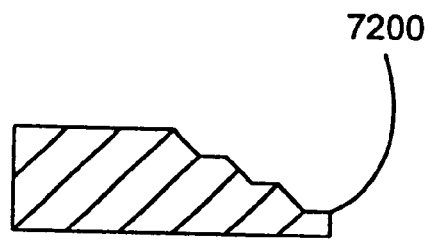
Figure 72L:
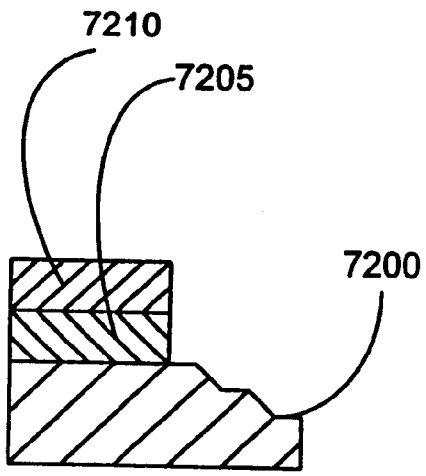

FIG. 72l is a cross sectional view of the silicon wafer of FIG. 72k after etching the exposed portions of the layers of silicon dioxide.

Figure 72M:
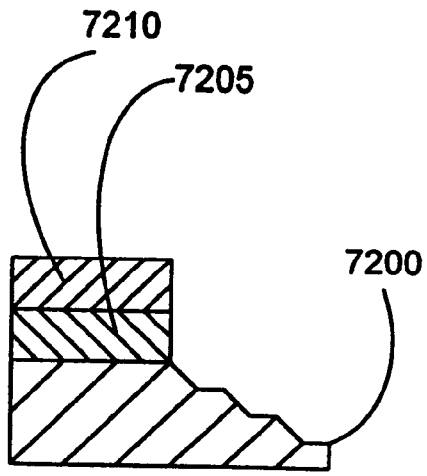

FIG. 72m is a cross sectional view of the silicon wafer of FIG. 72l after etching the exposed portions of silicon.

FIG. 72n is a cross sectional view of the silicon wafer of FIG. 72m after removing the remaining portions of the layers of silicon dioxide and silicon nitride.

FIG. 73a is a cross sectional view of a silicon wafer.

FIG. 73b is a cross sectional view of the silicon wafer of FIG. 73a including a pad layer of silicon dioxide.

FIG. 73c is a cross sectional view of the silicon wafer of FIG. 73b including a layer of silicon nitride.

FIG. 73d is a cross sectional view of the silicon wafer of FIG. 73c after patterning the layer of silicon nitride.

FIG. 73e is a cross sectional view of the silicon wafer of FIG. 73d after growing a field layer of oxide on the portions not covered by the patterned layer of silicon nitride.

FIG. 73f is a cross sectional view of the silicon wafer of FIG. 73e after patterning the layers of silicon dioxide.

FIG. 73g is a cross sectional view of the silicon wafer of FIG. 73f after applying and patterning a layer of photoresist onto the silicon wafer.

FIG. 73h is a cross sectional view of the silicon wafer of FIG. 73g after etching the exposed portions of silicon.

FIG. 73i is a cross sectional view of the silicon wafer of FIG. 73h after etching the exposed portions of silicon.

Figure 73J:
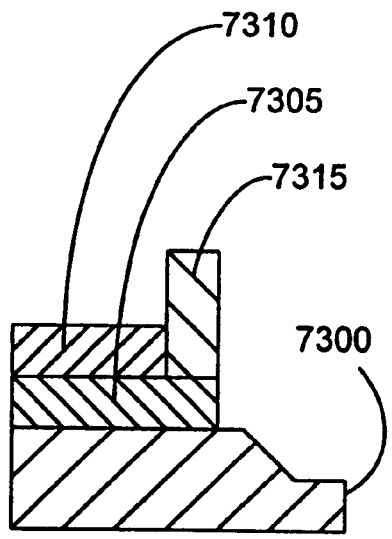

FIG. 73j is a cross sectional view of the silicon wafer of FIG. 73i after removing the layer of photoresist.

Figure 73L:
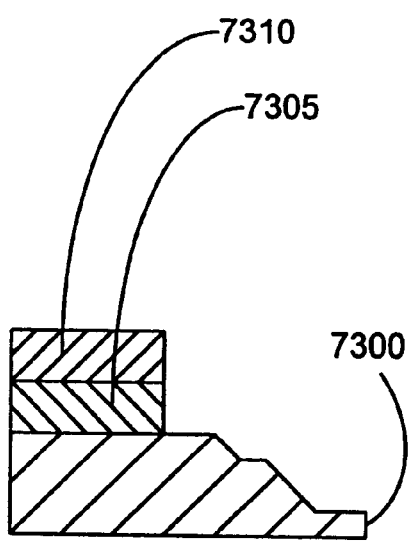
Figure 73K:
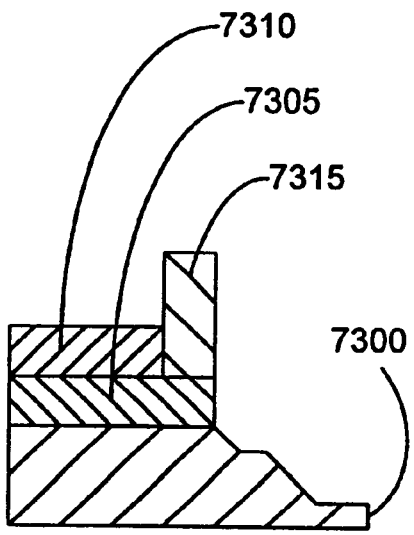

FIG. 73k is a cross sectional view of the silicon wafer of FIG. 73j after etching the exposed portions of silicon.

FIG. 73l is a cross sectional view of the silicon wafer of FIG. 73k after etching the exposed portions of the layers of silicon dioxide.

Figure 73M:
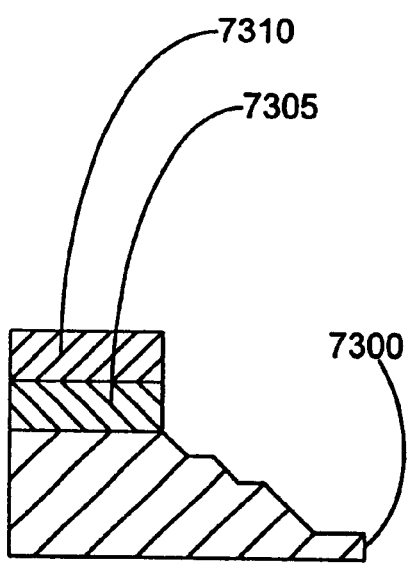

FIG. 73m is a cross sectional view of the silicon wafer of FIG. 73l after etching the exposed portions of silicon.

Figure 73N:
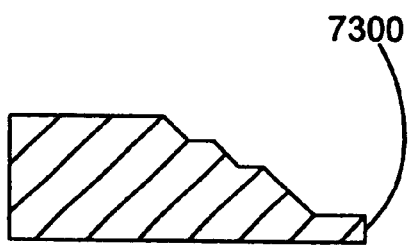

FIG. 73n is a cross sectional view of the silicon wafer of FIG. 73m after removing the remaining portions of the layers of silicon dioxide and silicon nitride.

FIG. 74a is a cross sectional view of a silicon wafer.

FIG. 74b is a cross sectional view of the silicon wafer of FIG. 74a including a pad layer of silicon dioxide.

FIG. 74c is a cross sectional view of the silicon wafer of FIG. 74b including a layer of silicon nitride.

FIG. 74d is a cross sectional view of the silicon wafer of FIG. 74c after patterning the layer of silicon nitride.

FIG. 74e is a cross sectional view of the silicon wafer of FIG. 74d after growing a field layer of oxide on the portions not covered by the patterned layer of silicon nitride.

FIG. 74f is a cross sectional view of the silicon wafer of FIG. 74e after patterning the layers of silicon dioxide.

FIG. 74g is a cross sectional view of the silicon wafer of FIG. 74f after applying and patterning a layer of photoresist onto the silicon wafer.

FIG. 74h is a cross sectional view of the silicon wafer of FIG. 74g after etching the exposed portions of silicon.

FIG. 74i is a cross sectional view of the silicon wafer of FIG. 74h after etching the exposed portions of the layers of silicon dioxide.

FIG. 74j is a cross sectional view of the silicon wafer of FIG. 74i after etching the exposed portions of silicon.

FIG. 74k is a cross sectional view of the silicon wafer of FIG. 74j after removing the layer of photoresist.

FIG. 74l is a cross sectional view of the silicon wafer of FIG. 74k after etching the exposed portions of silicon.

FIG. 74m is a cross sectional view of the silicon wafer of FIG. 74l after etching the exposed portions of the layers of silicon dioxide.

FIG. 74n is a cross sectional view of the silicon wafer of FIG. 74m after etching the exposed portions of silicon.

FIG. 74o is a cross sectional view of the silicon wafer of FIG. 74n after removing the remaining portions of the layers of silicon dioxide and silicon nitride.

FIG. 75a is a cross sectional view of a silicon wafer.

FIG. 75b is a cross sectional view of the silicon wafer of FIG. 75a including a pad layer of silicon dioxide.

FIG. 75c is a cross sectional view of the silicon wafer of FIG. 75b including a layer of silicon nitride.

FIG. 75d is a cross sectional view of the silicon wafer of FIG. 75c after patterning the layer of silicon nitride.

FIG. 75e is a cross sectional view of the silicon wafer of FIG. 75d after growing a field layer of oxide on the portions not covered by the patterned layer of silicon nitride.

FIG. 75f is a cross sectional view of the silicon wafer of FIG. 75e after patterning the layers of silicon dioxide.

FIG. 75g is a cross sectional view of the silicon wafer of FIG. 75f after applying and patterning a layer of photoresist onto the silicon wafer.

FIG. 75h is a cross sectional view of the silicon wafer of FIG. 75g after etching the exposed portions of the layers of silicon dioxide.

FIG. 75i is a cross sectional view of the silicon wafer of FIG. 75h after removing the layer of photoresist.

FIG. 75j is a cross sectional view of the silicon wafer of FIG. 75i after etching the exposed portions of silicon.

FIG. 75k is a cross sectional view of the silicon wafer of FIG. 75j after etching the exposed portions of the layers of silicon dioxide.

FIG. 75l is a cross sectional view of the silicon wafer of FIG. 75k after etching the exposed portions of silicon.

FIG. 75m is a cross sectional view of the silicon wafer of FIG. 75l after removing the remaining portions of the layers of silicon dioxide and silicon nitride.

FIG. 76a is a cross sectional view of a silicon wafer.

FIG. 76b is a cross sectional view of the silicon wafer of FIG. 76a including a pad layer of silicon dioxide.

FIG. 76c is a cross sectional view of the silicon wafer of FIG. 76b including a layer of silicon nitride.

FIG. 76d is a cross sectional view of the silicon wafer of FIG. 76c after patterning the layer of silicon nitride.

FIG. 76e is a cross sectional view of the silicon wafer of FIG. 76d after growing a field layer of oxide on the portions not covered by the patterned layer of silicon nitride.

FIG. 76f is a cross sectional view of the silicon wafer of FIG. 76e after patterning the layers of silicon dioxide.

FIG. 76g is a cross sectional view of the silicon wafer of FIG. 76f after applying and patterning a layer of photoresist onto the silicon wafer.

FIG. 76h is a cross sectional view of the silicon wafer of FIG. 76g after etching the exposed portions of the layers of silicon dioxide.

FIG. 76i is a cross sectional view of the silicon wafer of FIG. 76h after etching the exposed portions of silicon.

FIG. 76j is a cross sectional view of the silicon wafer of FIG. 76i after removing the layer of photoresist.

FIG. 76k is a cross sectional view of the silicon wafer of FIG. 76j after etching the exposed portions of silicon.

FIG. 76l is a cross sectional view of the silicon wafer of FIG. 76k after etching the exposed portions of the layers of silicon dioxide.

FIG. 76m is a cross sectional view of the silicon wafer of FIG. 76l after etching the exposed portions of silicon.

FIG. 76n is a cross sectional view of the silicon wafer of FIG. 76m after removing the remaining portions of the layers of silicon dioxide and silicon nitride.

FIG. 77a is a cross sectional view of a silicon wafer.

FIG. 77b is a cross sectional view of the silicon wafer of FIG. 77a including a pad layer of silicon dioxide.

FIG. 77c is a cross sectional view of the silicon wafer of FIG. 77b including a layer of silicon nitride.

FIG. 77d is a cross sectional view of the silicon wafer of FIG. 77c after patterning the layer of silicon nitride.

FIG. 77e is a cross sectional view of the silicon wafer of FIG. 77d after growing a field layer of oxide on the portions not covered by the patterned layer of silicon nitride.

FIG. 77f is a cross sectional view of the silicon wafer of FIG. 77e after patterning the layers of silicon dioxide.

FIG. 77g is a cross sectional view of the silicon wafer of FIG. 77f after applying and patterning a layer of photoresist onto the silicon wafer.

FIG. 77h is a cross sectional view of the silicon wafer of FIG. 77g after etching the exposed portions of silicon.

FIG. 77i is a cross sectional view of the silicon wafer of FIG. 77h after removing the layer of photoresist.

Figures 77J, 77L:
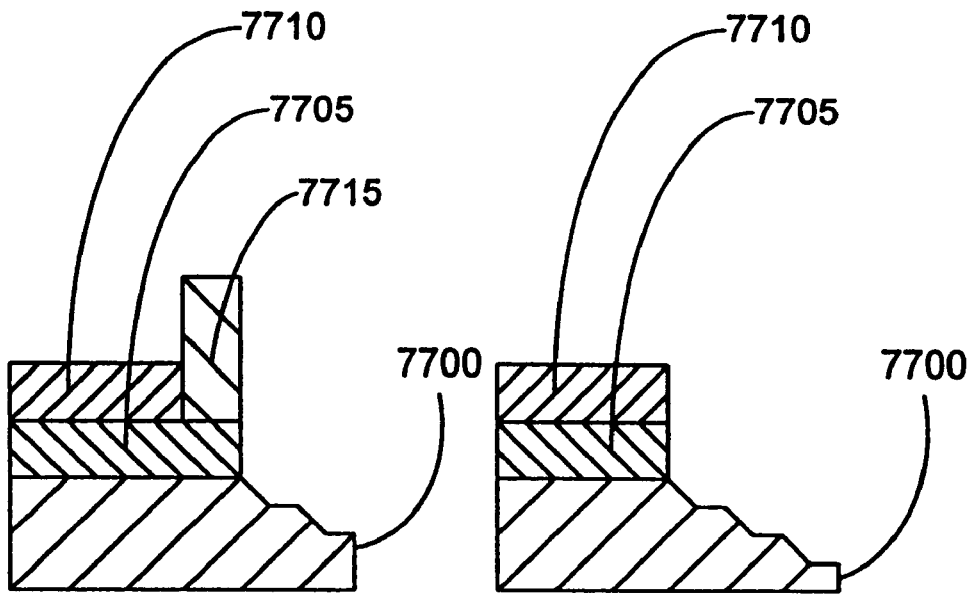

FIG. 77j is a cross sectional view of the silicon wafer of FIG. 77i after etching the exposed portions of silicon.

Figures 77K, 77M:
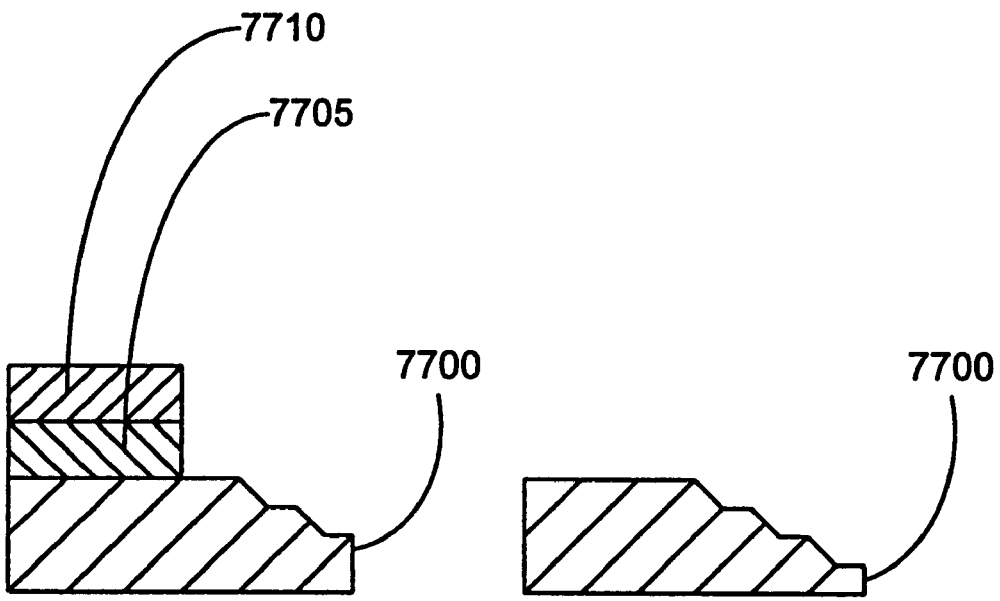

FIG. 77k is a cross sectional view of the silicon wafer of FIG. 77j after etching the exposed portions of the layers of silicon dioxide.

FIG. 77l is a cross sectional view of the silicon wafer of FIG. 77k after etching the exposed portions of silicon.

FIG. 77m is a cross sectional view of the silicon wafer of FIG. 77l after removing the remaining portions of the layers of silicon dioxide and silicon nitride.

FIG. 78a is a cross sectional view of a silicon wafer.

FIG. 78b is a cross sectional view of the silicon wafer of FIG. 78a including a pad layer of silicon dioxide.

FIG. 78c is a cross sectional view of the silicon wafer of FIG. 78b including a layer of silicon nitride.

FIG. 78d is a cross sectional view of the silicon wafer of FIG. 78c after patterning the layer of silicon nitride.

FIG. 78e is a cross sectional view of the silicon wafer of FIG. 78d after patterning the pad layer of silicon dioxide.

FIG. 78f is a cross sectional view of the silicon wafer of FIG. 78e after growing a field layer of oxide on the portions not covered by the patterned layer of silicon nitride.

FIG. 78g is a cross sectional view of the silicon wafer of FIG. 78f after patterning the layers of silicon dioxide.

FIG. 78h is a cross sectional view of the silicon wafer of FIG. 78g after applying and patterning a layer of photoresist onto the silicon wafer.

FIG. 78i is a cross sectional view of the silicon wafer of FIG. 78h after etching the exposed portions of silicon.

FIG. 78j is a cross sectional view of the silicon wafer of FIG. 78i after removing the layer of photoresist.

Figure 78K:
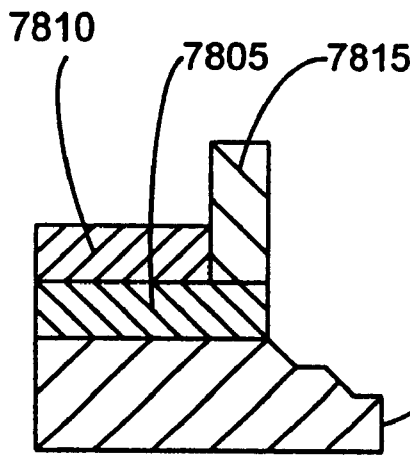

FIG. 78k is a cross sectional view of the silicon wafer of FIG. 78j after etching the exposed portions of silicon.

Figure 78M:
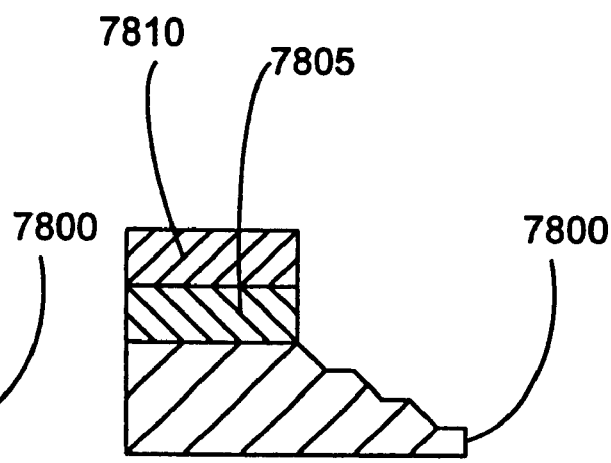
Figure 78L:
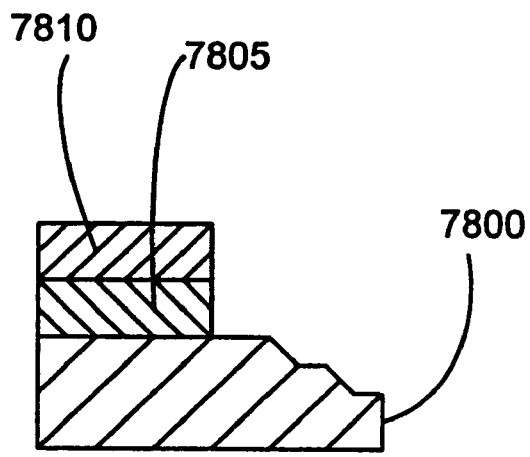

FIG. 78l is a cross sectional view of the silicon wafer of FIG. 78k after etching portions of the exposed portions of the layers of silicon dioxide.

FIG. 78m is a cross sectional view of the silicon wafer of FIG. 78l after etching the exposed portions of silicon.

Figure 78N:
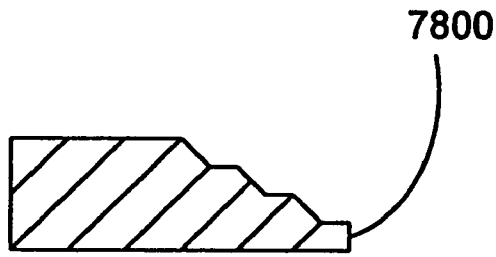

FIG. 78n is a cross sectional view of the silicon wafer of FIG. 78m after etching the remaining portions of the layers of silicon dioxide and silicon nitride.

FIG. 79a is a cross sectional view of a silicon wafer.

FIG. 79b is a cross sectional view of the silicon wafer of FIG. 79a including a pad layer of silicon dioxide.

FIG. 79c is a cross sectional view of the silicon wafer of FIG. 79b including a layer of silicon nitride.

FIG. 79d is a cross sectional view of the silicon wafer of FIG. 79c after patterning the layer of silicon nitride.

FIG. 79e is a cross sectional view of the silicon wafer of FIG. 79d after patterning the pad layer of silicon dioxide.

FIG. 79f is a cross sectional view of the silicon wafer of FIG. 79e after growing a field layer of oxide on the portions not covered by the patterned layer of silicon nitride.

FIG. 79g is a cross sectional view of the silicon wafer of FIG. 79f after patterning the layers of silicon dioxide.

FIG. 79h is a cross sectional view of the silicon wafer of FIG. 79g after applying and patterning a layer of photoresist onto the silicon wafer.

FIG. 79i is a cross sectional view of the silicon wafer of FIG. 79h after etching the exposed portions of silicon.

FIG. 79j is a cross sectional view of the silicon wafer of FIG. 79i after etching the exposed portions of the layers of silicon dioxide.

Figure 79K:
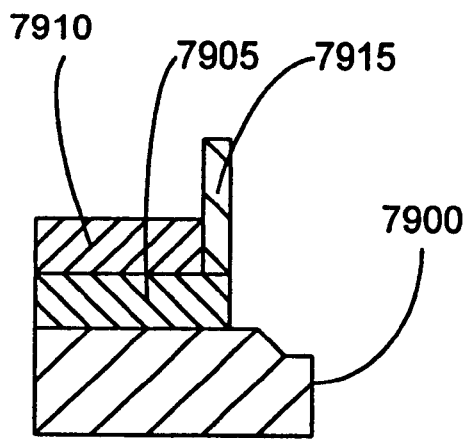

FIG. 79k is a cross sectional view of the silicon wafer of FIG. 79j after removing the layer of photoresist.

Figure 79N:
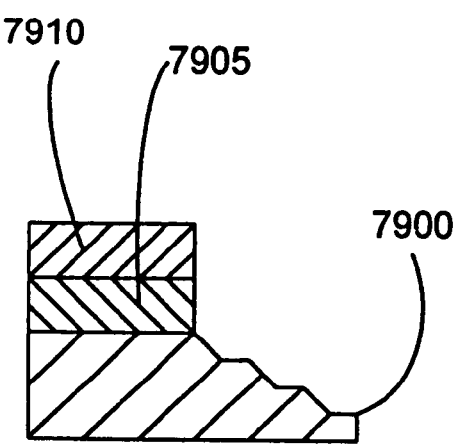
Figure 79L:
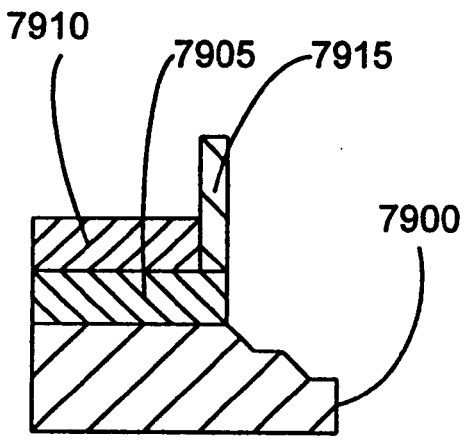

FIG. 79l is a cross sectional view of the silicon wafer of FIG. 79k after etching the exposed portions of silicon.

Figure 79O:
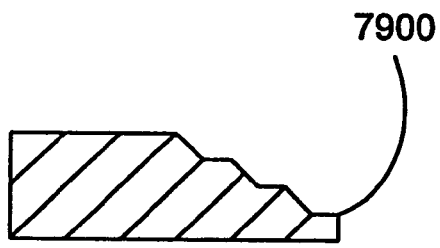
Figure 79M:
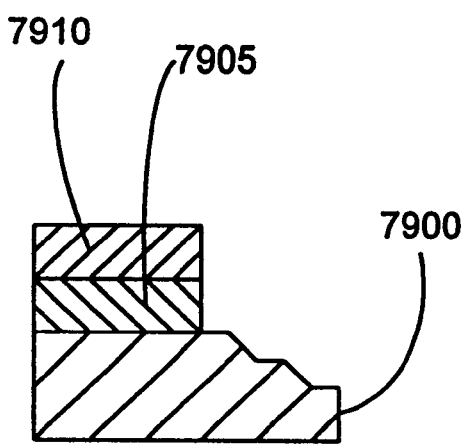

FIG. 79m is a cross sectional view of the silicon wafer of FIG. 79l after etching portions of the exposed portions of the layers of silicon dioxide.

FIG. 79n is a cross sectional view of the silicon wafer of FIG. 79m after etching the exposed portions of silicon.

FIG. 79o is a cross sectional view of the silicon wafer of FIG. 79n after etching the remaining portions of the layers of silicon dioxide and silicon nitride.

FIG. 80a is a cross sectional view of a silicon wafer.

FIG. 80b is a cross sectional view of the silicon wafer of FIG. 80a including a pad layer of silicon dioxide.

FIG. 80c is a cross sectional view of the silicon wafer of FIG. 80b including a layer of silicon nitride.

FIG. 80d is a cross sectional view of the silicon wafer of FIG. 80c after patterning the layer of silicon nitride.

FIG. 80e is a cross sectional view of the silicon wafer of FIG. 80d after patterning the pad layer of silicon dioxide.

FIG. 80f is a cross sectional view of the silicon wafer of FIG. 80e after growing a field layer of oxide on the portions not covered by the patterned layer of silicon nitride.

FIG. 80g is a cross sectional view of the silicon wafer of FIG. 80f after patterning the layers of silicon dioxide.

FIG. 80h is a cross sectional view of the silicon wafer of FIG. 80g after applying and patterning a layer of photoresist onto the silicon wafer.

FIG. 80i is a cross sectional view of the silicon wafer of FIG. 80h after etching the exposed portions of silicon.

FIG. 80j is a cross sectional view of the silicon wafer of FIG. 80i after etching the exposed portions of silicon.

Figure 80K:
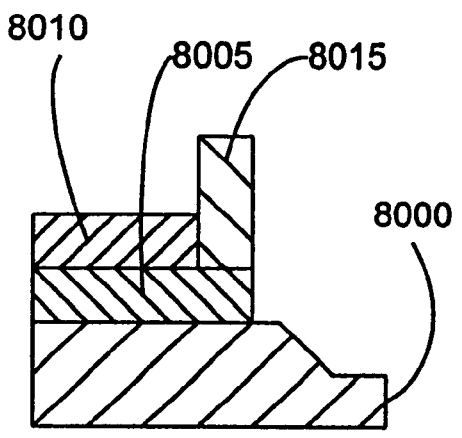

FIG. 80k is a cross sectional view of the silicon wafer of FIG. 80j after removing the layer of photoresist.

Figure 80N:
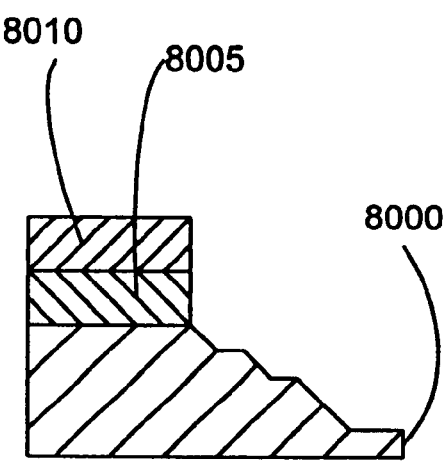
Figure 80L:
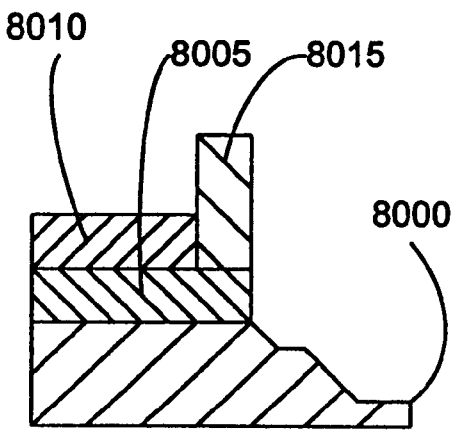

FIG. 80l is a cross sectional view of the silicon wafer of FIG. 80k after etching the exposed portions of silicon.

Figure 80O:
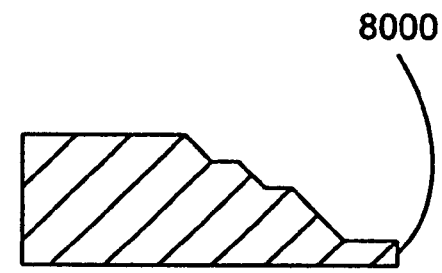
Figure 80M:
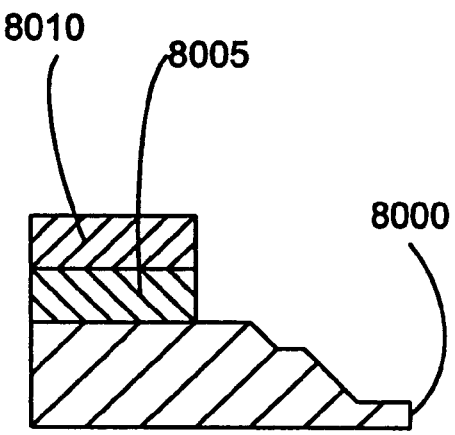

FIG. 80m is a cross sectional view of the silicon wafer of FIG. 80l after etching portions of the exposed portions of the layers of silicon dioxide.

FIG. 80n is a cross sectional view of the silicon wafer of FIG. 80m after etching the exposed portions of silicon.

FIG. 80o is a cross sectional view of the silicon wafer of FIG. 80n after etching the remaining portions of the layers of silicon dioxide and silicon nitride.

FIG. 81a is a cross sectional view of a silicon wafer.

FIG. 81b is a cross sectional view of the silicon wafer of FIG. 81a including a pad layer of silicon dioxide.

FIG. 81c is a cross sectional view of the silicon wafer of FIG. 81b including a layer of silicon nitride.

FIG. 81d is a cross sectional view of the silicon wafer of FIG. 81c after patterning the layer of silicon nitride.

FIG. 81e is a cross sectional view of the silicon wafer of FIG. 81d after patterning the pad layer of silicon dioxide.

FIG. 81f is a cross sectional view of the silicon wafer of FIG. 81e after growing a field layer of oxide on the portions not covered by the patterned layer of silicon nitride.

FIG. 81g is a cross sectional view of the silicon wafer of FIG. 81f after patterning the layers of silicon dioxide.

FIG. 81h is a cross sectional view of the silicon wafer of FIG. 81g after applying and patterning a layer of photoresist onto the silicon wafer.

FIG. 81i is a cross sectional view of the silicon wafer of FIG. 81h after etching the exposed portions of silicon.

FIG. 81j is a cross sectional view of the silicon wafer of FIG. 81i after etching the exposed portions of the layers of silicon dioxide.

Figure 81K:
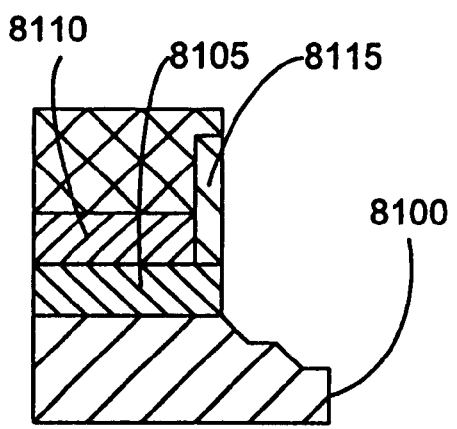

FIG. 81k is a cross sectional view of the silicon wafer of FIG. 81j after etching the exposed portions of silicon.

Figure 81N:
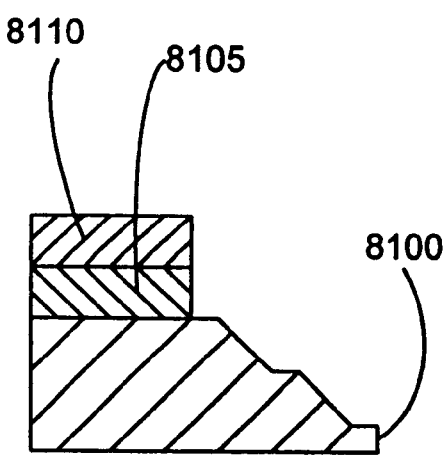
Figure 81L:
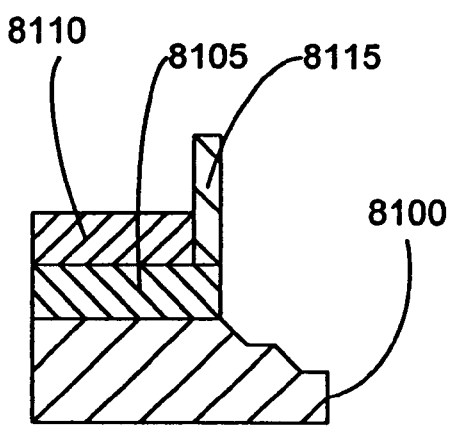

FIG. 81l is a cross sectional view of the silicon wafer of FIG. 81k after removing the layer of photoresist.

Figure 81O:
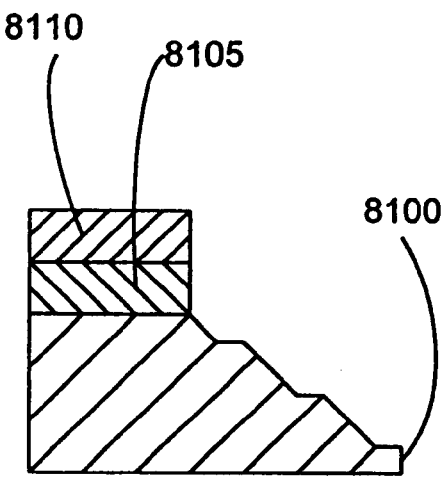
Figure 81M:
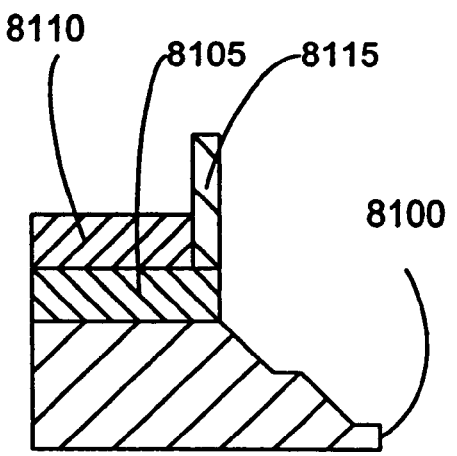

FIG. 81m is a cross sectional view of the silicon wafer of FIG. 81l after etching the exposed portions of silicon.

FIG. 81n is a cross sectional view of the silicon wafer of FIG. 81m after etching portions of the exposed portions of the layers of silicon dioxide.

FIG. 81o is a cross sectional view of the silicon wafer of FIG. 81n after etching the exposed portions of silicon.

Figure 81P:
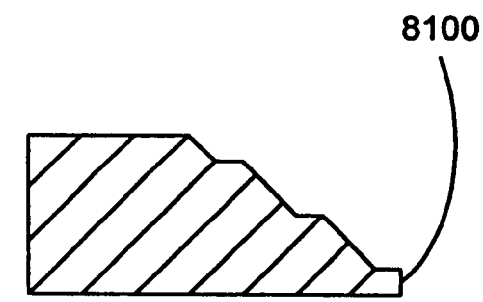

FIG. 81p is a cross sectional view of the silicon wafer of FIG. 81o after etching the remaining portions of the layers of silicon dioxide and silicon nitride.

FIG. 82a is a cross sectional view of a silicon wafer.

FIG. 82b is a cross sectional view of the silicon wafer of FIG. 82a including a pad layer of silicon dioxide.

FIG. 82c is a cross sectional view of the silicon wafer of FIG. 82b including a layer of silicon nitride.

FIG. 82d is a cross sectional view of the silicon wafer of FIG. 82c after patterning the layer of silicon nitride.

FIG. 82e is a cross sectional view of the silicon wafer of FIG. 82d after patterning the pad layer of silicon dioxide.

FIG. 82f is a cross sectional view of the silicon wafer of FIG. 82e after growing a field layer of oxide on the portions not covered by the patterned layer of silicon nitride.

FIG. 82g is a cross sectional view of the silicon wafer of FIG. 82f after patterning the layers of silicon dioxide.

FIG. 82h is a cross sectional view of the silicon wafer of FIG. 82g after applying and patterning a layer of photoresist onto the silicon wafer.

FIG. 82i is a cross sectional view of the silicon wafer of FIG. 82h after etching the exposed portions of the layers of silicon dioxide.

FIG. 82j is a cross sectional view of the silicon wafer of FIG. 82i after removing the layer of photoresist.

FIG. 82k is a cross sectional view of the silicon wafer of FIG. 82j after etching the exposed portions of silicon.

FIG. 82l is a cross sectional view of the silicon wafer of FIG. 82k after etching portions of the exposed portions of the layers of silicon dioxide.

FIG. 82m is a cross sectional view of the silicon wafer of FIG. 82l after etching the exposed portions of silicon.

FIG. 82n is a cross sectional view of the silicon wafer of FIG. 82m after etching the remaining portions of the layers of silicon dioxide and silicon nitride.

FIG. 83a is a cross sectional view of a silicon wafer.

FIG. 83b is a cross sectional view of the silicon wafer of FIG. 83a including a pad layer of silicon dioxide.

FIG. 83c is a cross sectional view of the silicon wafer of FIG. 83b including a layer of silicon nitride.

FIG. 83d is a cross sectional view of the silicon wafer of FIG. 83c after patterning the layer of silicon nitride.

FIG. 83e is a cross sectional view of the silicon wafer of FIG. 83d after patterning the pad layer of silicon dioxide.

FIG. 83f is a cross sectional view of the silicon wafer of FIG. 83e after growing a field layer of oxide on the portions not covered by the patterned layer of silicon nitride.

FIG. 83g is a cross sectional view of the silicon wafer of FIG. 83f after patterning the layers of silicon dioxide.

FIG. 83h is a cross sectional view of the silicon wafer of FIG. 83g after applying and patterning a layer of photoresist onto the silicon wafer.

FIG. 83i is a cross sectional view of the silicon wafer of FIG. 83h after etching the exposed portions of the layers of silicon dioxide.

FIG. 83j is a cross sectional view of the silicon wafer of FIG. 83i after etching the exposed portions of silicon.

Figure 83K:
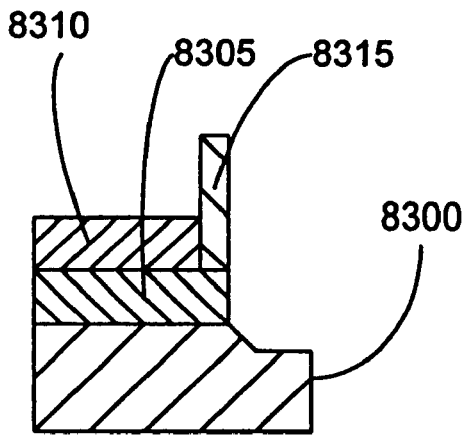

FIG. 83k is a cross sectional view of the silicon wafer of FIG. 83j after removing the layer of photoresist.

Figure 83N:
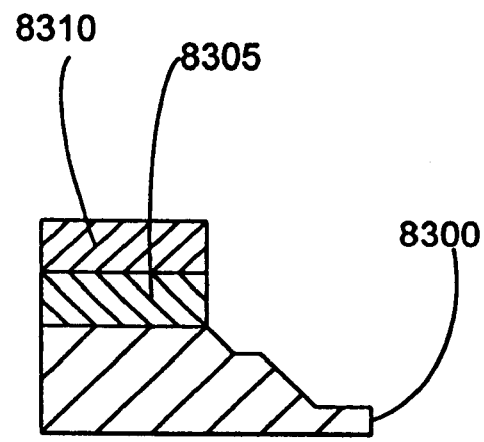
Figure 83L:
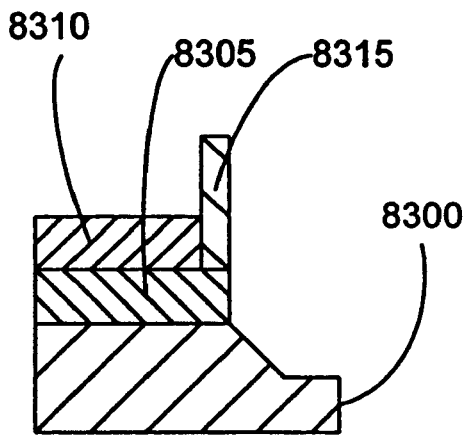

FIG. 83l is a cross sectional view of the silicon wafer of FIG. 83k after etching the exposed portions of silicon.

Figure 83O:
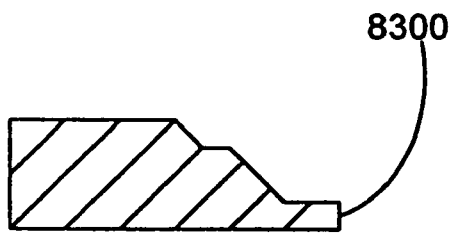
Figure 83M:
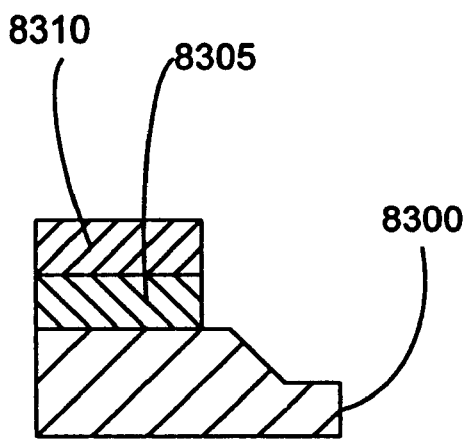

FIG. 83m is a cross sectional view of the silicon wafer of FIG. 83l after etching portions of the exposed portions of the layers of silicon dioxide.

FIG. 83n is a cross sectional view of the silicon wafer of FIG. 83m after etching the exposed portions of silicon.

FIG. 83o is a cross sectional view of the silicon wafer of FIG. 83n after etching the remaining portions of the layers of silicon dioxide and silicon nitride.

FIG. 84a is a cross sectional view of a silicon wafer.

FIG. 84b is a cross sectional view of the silicon wafer of FIG. 84a including a pad layer of silicon dioxide.

FIG. 84c is a cross sectional view of the silicon wafer of FIG. 84b including a layer of silicon nitride.

FIG. 84d is a cross sectional view of the silicon wafer of FIG. 84c after patterning the layer of silicon nitride.

FIG. 84e is a cross sectional view of the silicon wafer of FIG. 84d after patterning the pad layer of silicon dioxide.

FIG. 84f is a cross sectional view of the silicon wafer of FIG. 84e after growing a field layer of oxide on the portions not covered by the patterned layer of silicon nitride.

FIG. 84g is a cross sectional view of the silicon wafer of FIG. 84f after patterning the layers of silicon dioxide.

FIG. 84h is a cross sectional view of the silicon wafer of FIG. 84g after applying and patterning a layer of photoresist onto the silicon wafer.

FIG. 84i is a cross sectional view of the silicon wafer of FIG. 84h after etching the exposed portions of silicon.

FIG. 84j is a cross sectional view of the silicon wafer of FIG. 84i removing the layer of photoresist.

FIG. 84k is a cross sectional view of the silicon wafer of FIG. 84j after etching the exposed portions of silicon.

FIG. 84l is a cross sectional view of the silicon wafer of FIG. 84k after etching portions of the exposed portions of the layers of silicon dioxide.

FIG. 84m is a cross sectional view of the silicon wafer of FIG. 84l after etching the exposed portions of silicon.

FIG. 84n is a cross sectional view of the silicon wafer of FIG. 84m after etching the remaining portions of the layers of silicon dioxide and silicon nitride.

Figure 85A:
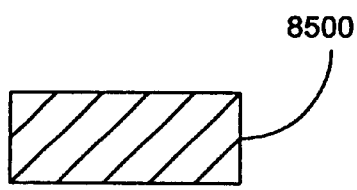

FIG. 85a is a cross sectional view of a silicon wafer.

Figure 85E:
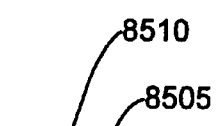
Figure 85H:
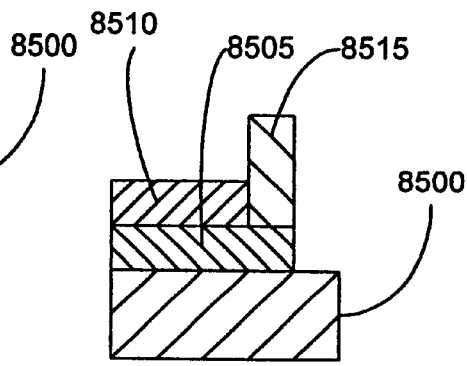
Figure 85B:
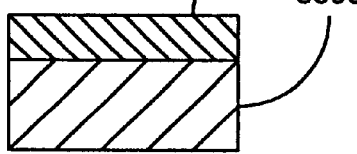

FIG. 85b is a cross sectional view of the silicon wafer of FIG. 85a including a pad layer of silicon dioxide.

Figure 85C:
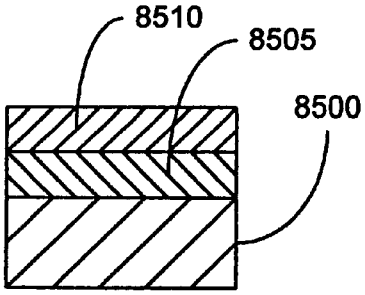

FIG. 85c is a cross sectional view of the silicon wafer of FIG. 85b including a layer of silicon nitride.

Figure 85I:
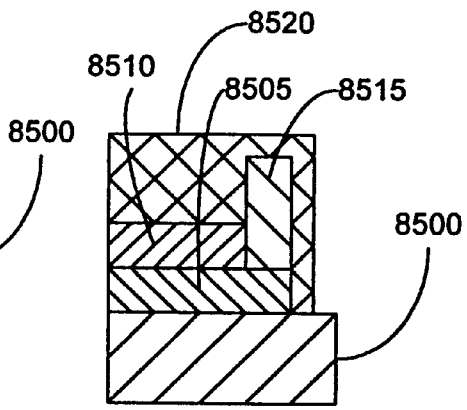
Figure 85D:
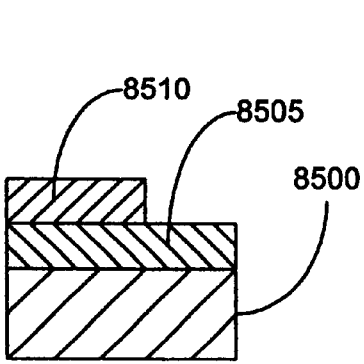

FIG. 85d is a cross sectional view of the silicon wafer of FIG. 85c after patterning the layer of silicon nitride.

FIG. 85e is a cross sectional view of the silicon wafer of FIG. 85d after patterning the pad layer of silicon dioxide.

FIG. 85f is a cross sectional view of the silicon wafer of FIG. 85e after a thin etch of the exposed areas of silicon.

Figure 85G:
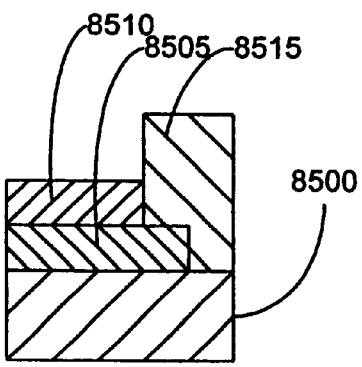

FIG. 85g is a cross sectional view of the silicon wafer of FIG. 85f after growing a field layer of oxide on the portions not covered by the patterned layer of silicon nitride.

FIG. 85h is a cross sectional view of the silicon wafer of FIG. 85g after patterning the layers of silicon dioxide.

FIG. 85i is a cross sectional view of the silicon wafer of FIG. 85h after applying and patterning a layer of photoresist onto the silicon wafer.

Figure 85J:
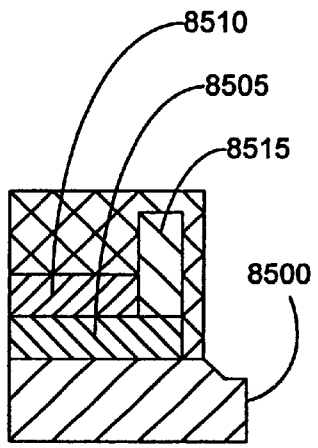

FIG. 85j is a cross sectional view of the silicon wafer of FIG. 85i after etching the exposed portions of silicon.

Figure 85L:
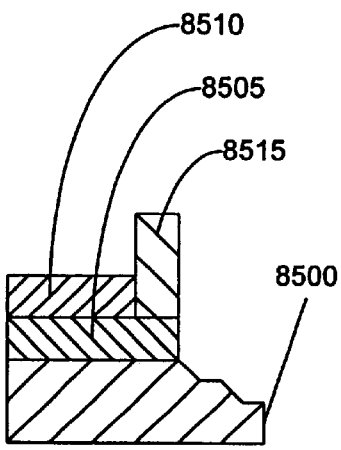
Figure 85N:
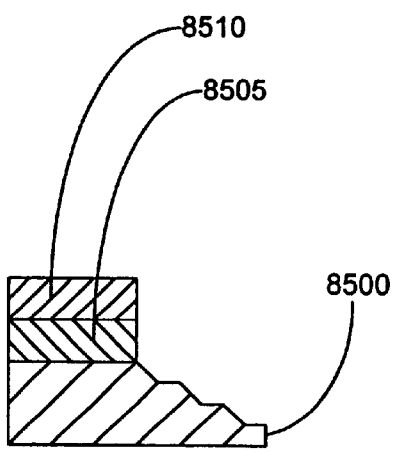
Figure 85K:
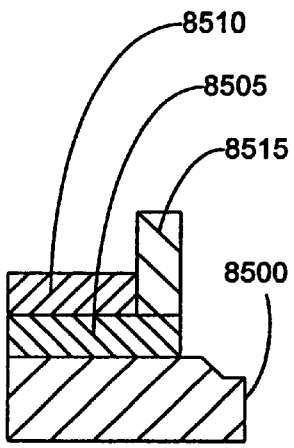

FIG. 85k is a cross sectional view of the silicon wafer of FIG. 85j after removing the layer of photoresist.

FIG. 85l is a cross sectional view of the silicon wafer of FIG. 85k after etching the exposed portions of silicon.

Figure 85M:
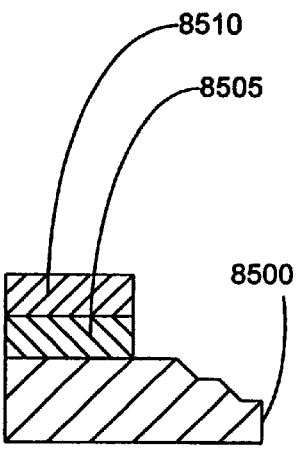

FIG. 85m is a cross sectional view of the silicon wafer of FIG. 85l after etching the exposed portions of the layers of silicon dioxide.

FIG. 85n is a cross sectional view of the silicon wafer of FIG. 85m after etching the exposed portions of silicon.

Figure 85O:
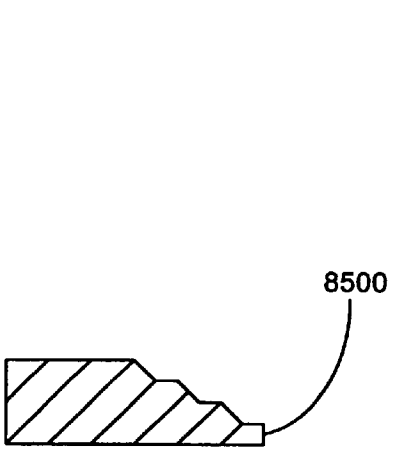

FIG. 85o is a cross sectional view of the silicon wafer of FIG. 85n after etching the remaining portions of the layers of silicon dioxide and silicon nitride.

Figure 86A:
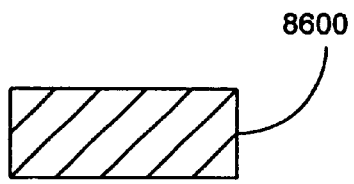

FIG. 86a is a cross sectional view of a silicon wafer.

Figure 86E:
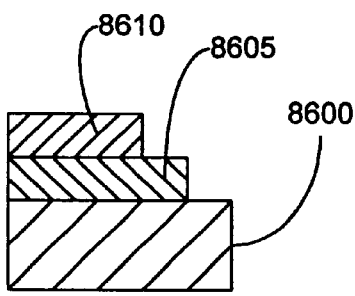
Figure 86H:
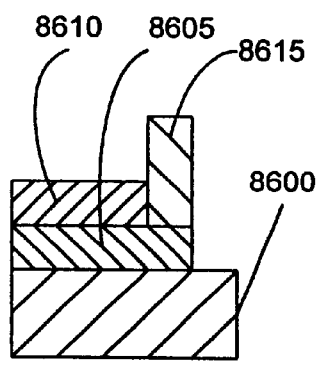
Figure 86B:
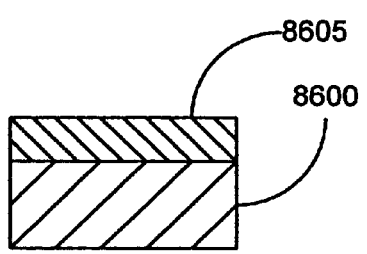

FIG. 86b is a cross sectional view of the silicon wafer of FIG. 86a including a pad layer of silicon dioxide.

Figure 86F:
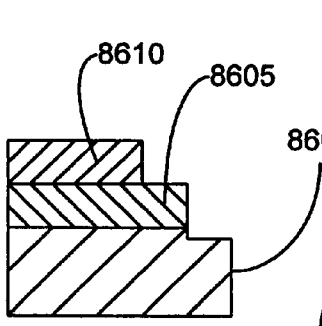
Figure 86I:
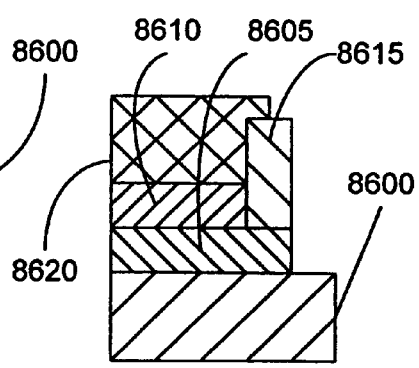
Figure 86C:
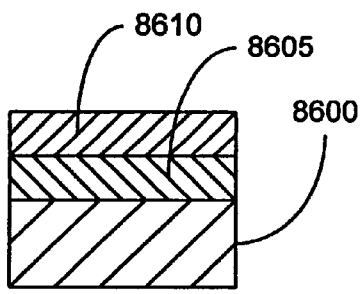

FIG. 86c is a cross sectional view of the silicon wafer of FIG. 86b including a layer of silicon nitride.

Figure 86G:
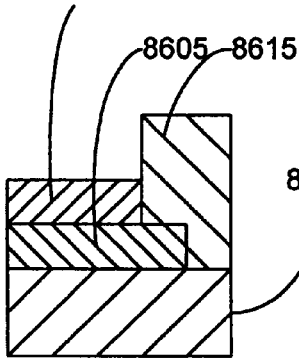
Figure 86J:
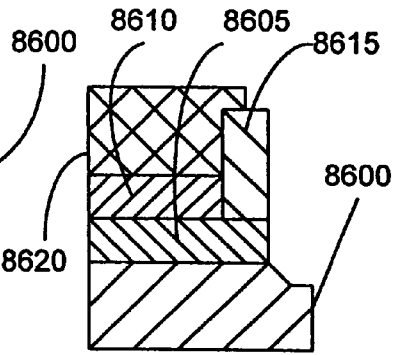
Figure 86D:
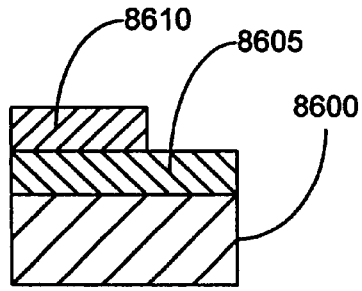

FIG. 86d is a cross sectional view of the silicon wafer of FIG. 86c after patterning the layer of silicon nitride.

FIG. 86e is a cross sectional view of the silicon wafer of FIG. 86d after patterning the pad layer of silicon dioxide.

FIG. 86f is a cross sectional view of the silicon wafer of FIG. 86e after a thin etch of the exposed areas of silicon .

FIG. 86g is a cross sectional view of the silicon wafer of FIG. 86f after growing a field layer of oxide on the portions not covered by the patterned layer of silicon nitride.

FIG. 86h is a cross sectional view of the silicon wafer of FIG. 86g after patterning the layers of silicon dioxide.

FIG. 86i is a cross sectional view of the silicon wafer of FIG. 86h after applying and patterning a layer of photoresist onto the silicon wafer.

FIG. 86j is a cross sectional view of the silicon wafer of FIG. 86i after etching the exposed portions of silicon.

Figures 86M, 86P:
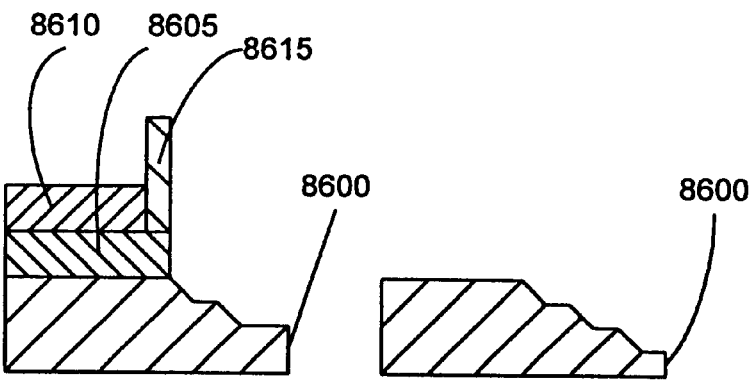
Figures 86K, 86N:
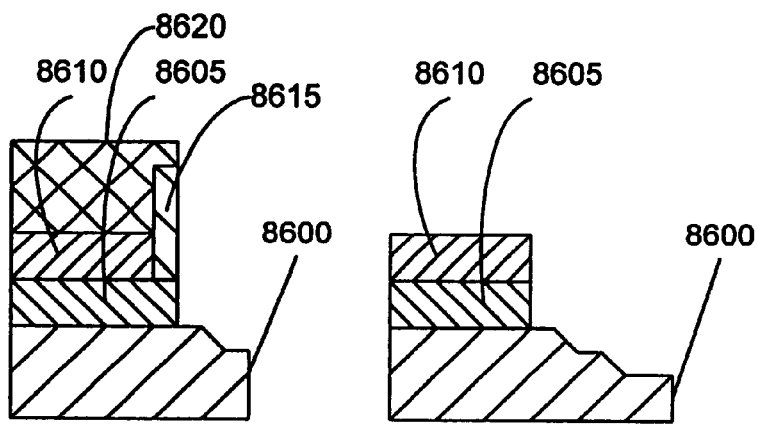

FIG. 86k is a cross sectional view of the silicon wafer of FIG. 86j after etching the exposed portions of the layers of silicon dioxide.

Figures 86L, 86O:
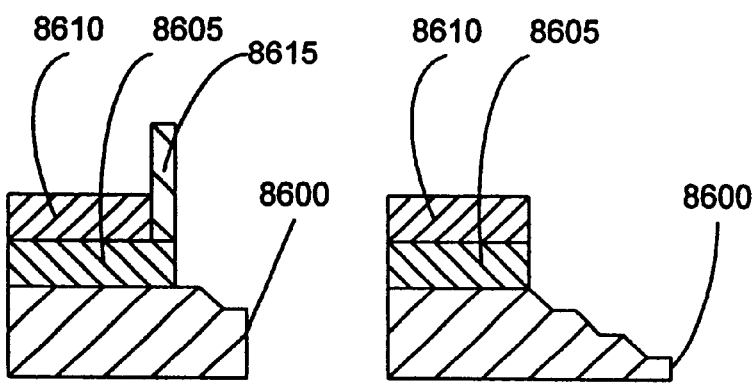

FIG. 86l is a cross sectional view of the silicon wafer of FIG. 86k after removing the layer of photoresist.

FIG. 86m is a cross sectional view of the silicon wafer of FIG. 86l after etching the exposed portions of silicon.

FIG. 86n is a cross sectional view of the silicon wafer of FIG. 86m after etching the exposed portions of the layers of silicon dioxide.

FIG. 86o is a cross sectional view of the silicon wafer of FIG. 86n after etching the exposed portions of silicon.

FIG. 86p is a cross sectional view of the silicon wafer of FIG. 86o after etching the remaining portions of the layers of silicon dioxide and silicon nitride.

Figure 87A:
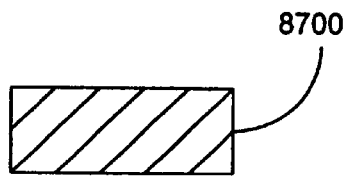

FIG. 87a is a cross sectional view of a silicon wafer.

Figure 87E:
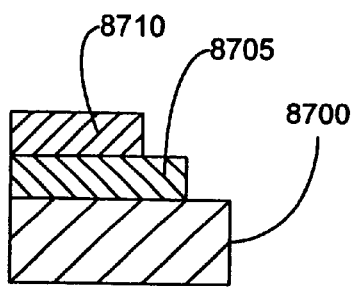
Figure 87H:
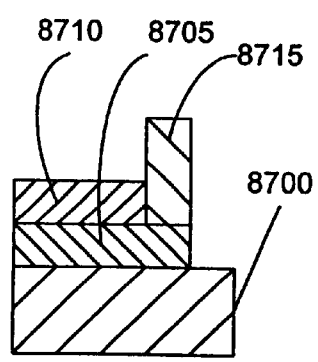
Figure 87B:
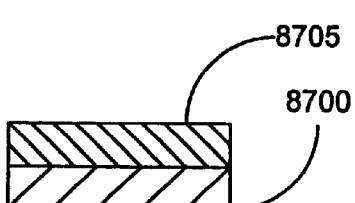

FIG. 87b is a cross sectional view of the silicon wafer of FIG. 87a including a pad layer of silicon dioxide.

Figure 87F:
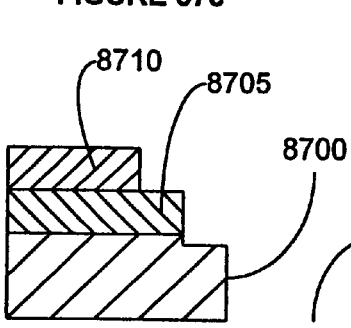
Figure 87I:
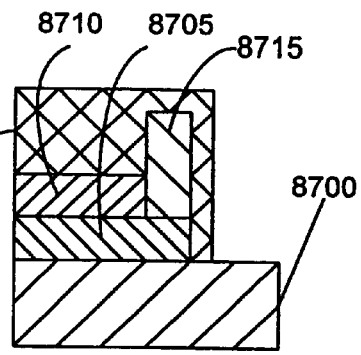
Figure 87C:
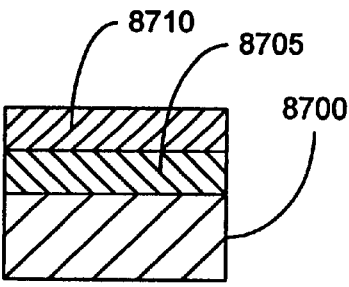

FIG. 87c is a cross sectional view of the silicon wafer of FIG. 87b including a layer of silicon nitride.

Figure 87G:
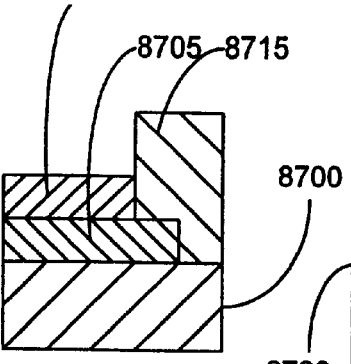
Figure 87J:
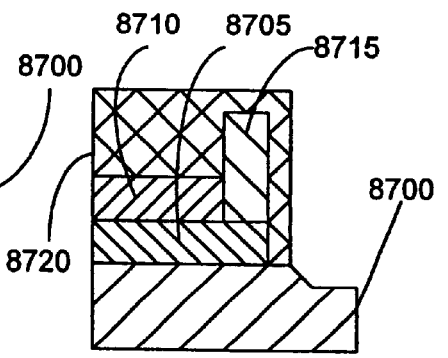
Figure 87D:
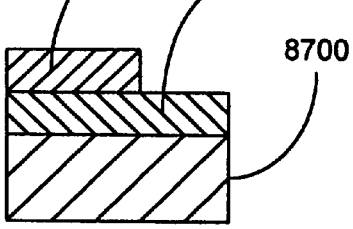

FIG. 87d is a cross sectional view of the silicon wafer of FIG. 87c after patterning the layer of silicon nitride.

FIG. 87e is a cross sectional view of the silicon wafer of FIG. 87d after patterning the pad layer of silicon dioxide.

FIG. 87f is a cross sectional view of the silicon wafer of FIG. 87e after a thin etch of the exposed areas of silicon.

FIG. 87g is a cross sectional view of the silicon wafer of FIG. 87f after growing a field layer of oxide on the portions not covered by the patterned layer of silicon nitride.

FIG. 87h is a cross sectional view of the silicon wafer of FIG. 87g after patterning the layers of silicon dioxide.

FIG. 87i is a cross sectional view of the silicon wafer of FIG. 87h after applying and patterning a layer of photoresist onto the silicon wafer.

FIG. 87j is a cross sectional view of the silicon wafer of FIG. 87i after etching the exposed portions of silicon.

Figure 87K:
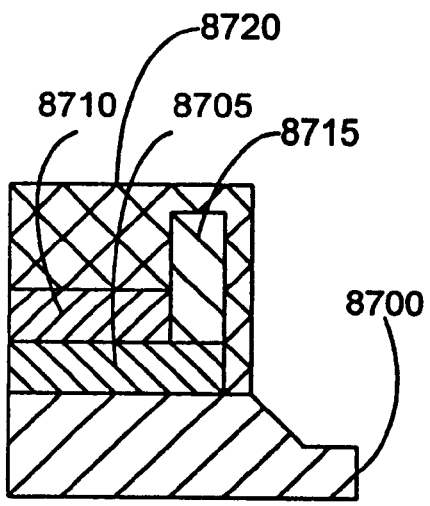

FIG. 87k is a cross sectional view of the silicon wafer of FIG. 87j after etching the exposed portions of silicon.

Figure 87N:
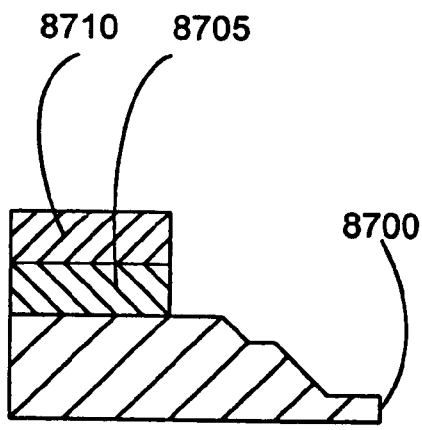
Figure 87L:
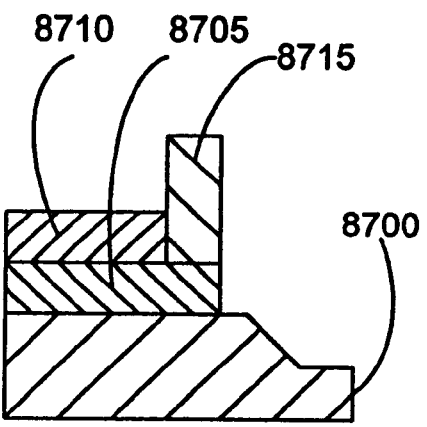

FIG. 87l is a cross sectional view of the silicon wafer of FIG. 87k after removing the layer of photoresist.

Figure 87O:
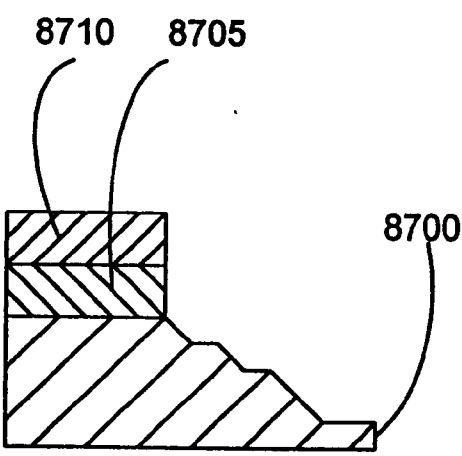
Figure 87M:
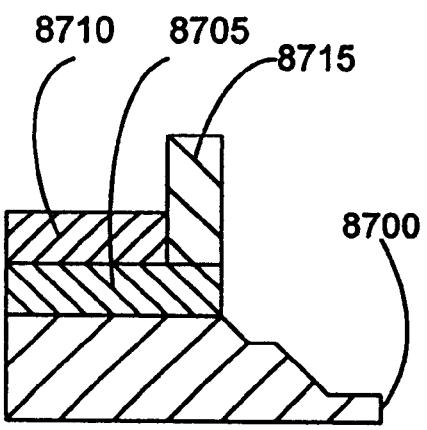

FIG. 87m is a cross sectional view of the silicon wafer of FIG. 87l after etching the exposed portions of silicon.

FIG. 87n is a cross sectional view of the silicon wafer of FIG. 87m after etching the exposed portions of the layers of silicon dioxide.

FIG. 87o is a cross sectional view of the silicon wafer of FIG. 87n after etching the exposed portions of silicon.

Figure 87P:
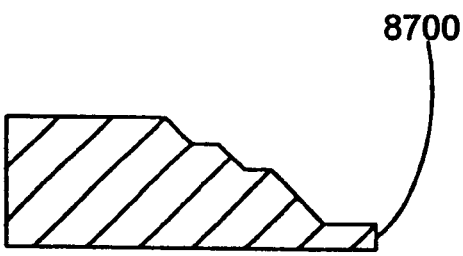

FIG. 87p is a cross sectional view of the silicon wafer of FIG. 87o after etching the remaining portions of the layers of silicon dioxide and silicon nitride.

Figure 88A:
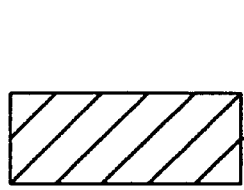

FIG. 88a is a cross sectional view of a silicon wafer.

Figure 88E:
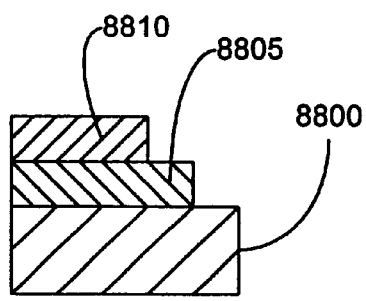
Figure 88H:
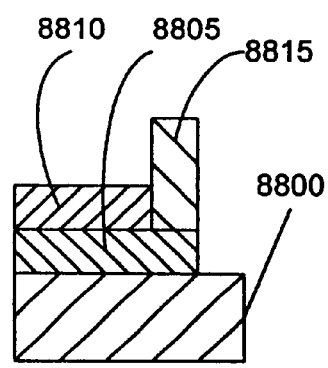
Figure 88B:
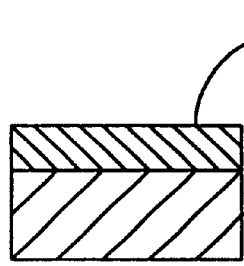

FIG. 88b is a cross sectional view of the silicon wafer of FIG. 88a including a pad layer of silicon dioxide.

Figure 88F:
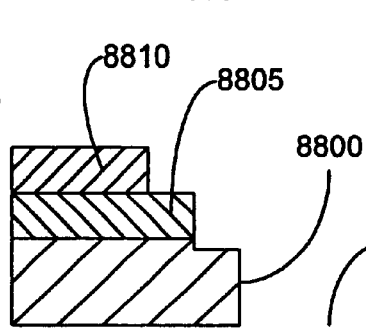
Figure 88I:
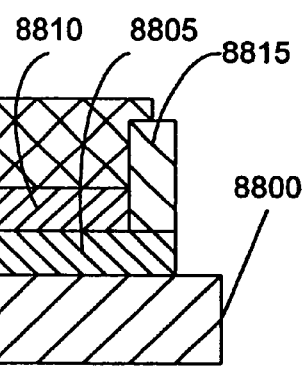
Figure 88C:
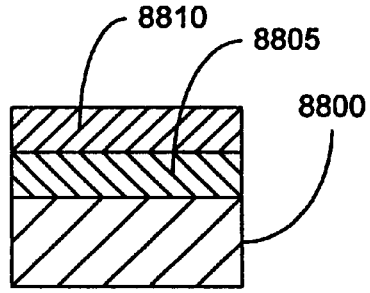

FIG. 88c is a cross sectional view of the silicon wafer of FIG. 88b including a layer of silicon nitride.

Figure 88G:
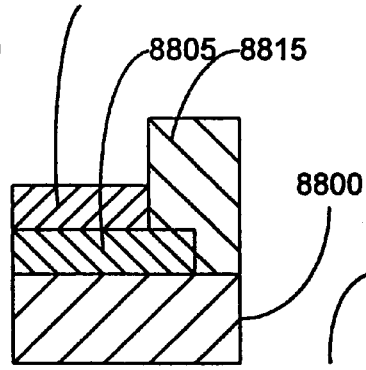
Figure 88J:
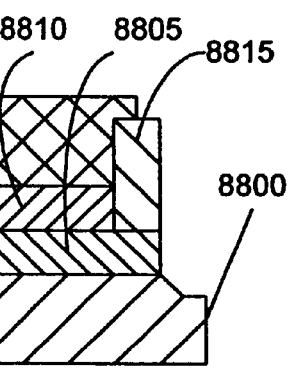
Figure 88D:
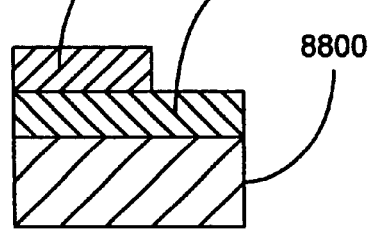

FIG. 88d is a cross sectional view of the silicon wafer of FIG. 88c after patterning the layer of silicon nitride.

FIG. 88e is a cross sectional view of the silicon wafer of FIG. 88d after patterning the pad layer of silicon dioxide.

FIG. 88f is a cross sectional view of the silicon wafer of FIG. 88e after a thin etch of the exposed areas of silicon.

FIG. 88g is a cross sectional view of the silicon wafer of FIG. 88f after growing a field layer of oxide on the portions not covered by the patterned layer of silicon nitride.

FIG. 88h is a cross sectional view of the silicon wafer of FIG. 88g after patterning the layers of silicon dioxide.

FIG. 88i is a cross sectional view of the silicon wafer of FIG. 88h after applying and patterning a layer of photoresist onto the silicon wafer.

FIG. 88j is a cross sectional view of the silicon wafer of FIG. 88i after etching the exposed portions of silicon.

Figure 88M:
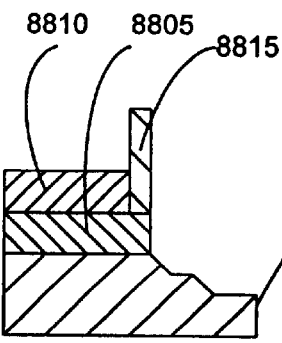
Figure 88P:
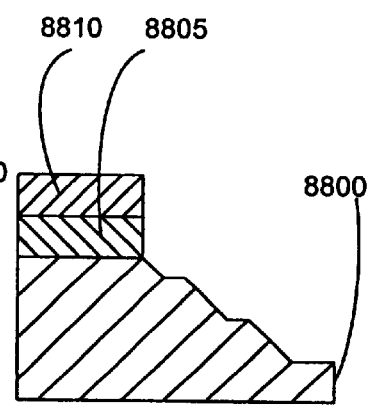
Figure 88K:
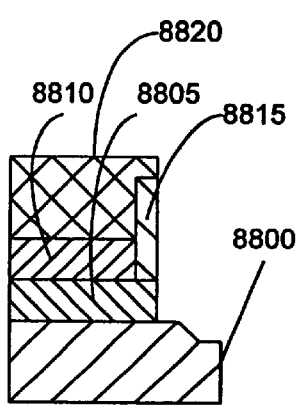

FIG. 88k is a cross sectional view of the silicon wafer of FIG. 88j after etching the exposed portions of the layers of silicon dioxide.

Figure 88N:
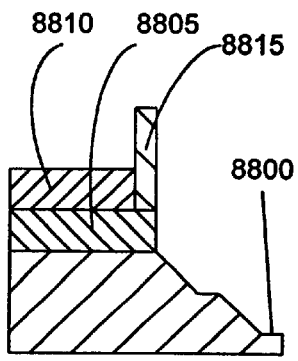
Figure 88Q:
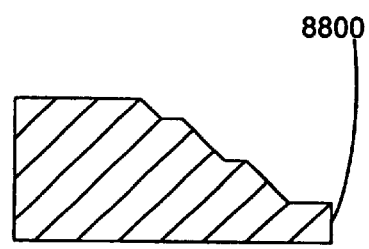
Figure 88L:
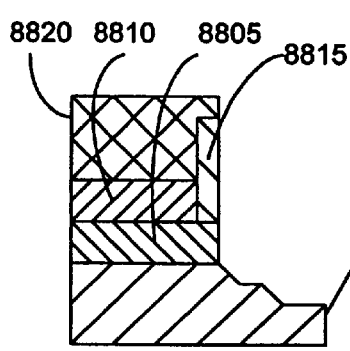

FIG. 88l is a cross sectional view of the silicon wafer of FIG. 88k after etching the exposed portions of silicon.

FIG. 88m is a cross sectional view of the silicon wafer of FIG. 88l after removing the layer of photoresist.

FIG. 88n is a cross sectional view of the silicon wafer of FIG. 88m after etching the exposed portions of silicon.

Figure 88O:
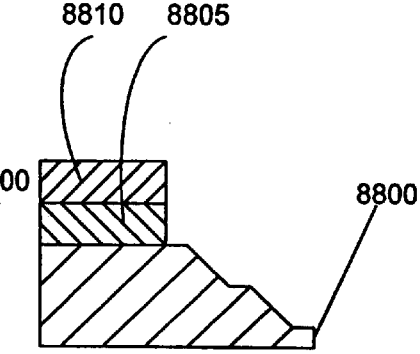

FIG. 88o is a cross sectional view of the silicon wafer of FIG. 88n after etching the exposed portions of the layers of silicon dioxide.

FIG. 88p is a cross sectional view of the silicon wafer of FIG. 88o after etching the exposed portions of silicon.

FIG. 88q is a cross sectional view of the silicon wafer of FIG. 88p after etching the remaining portions of the layers of silicon dioxide and silicon nitride.

FIG. 89a is a cross sectional view of a silicon wafer.

FIG. 89b is a cross sectional view of the silicon wafer of FIG. 89a including a pad layer of silicon dioxide.

FIG. 89c is a cross sectional view of the silicon wafer of FIG. 89b including a layer of silicon nitride.

FIG. 89d is a cross sectional view of the silicon wafer of FIG. 89c after patterning the layer of silicon nitride.

FIG. 89e is a cross sectional view of the silicon wafer of FIG. 89d after patterning the pad layer of silicon dioxide.

FIG. 89f is a cross sectional view of the silicon wafer of FIG. 89e after a thin etch of the exposed areas of silicon.

FIG. 89g is a cross sectional view of the silicon wafer of FIG. 89f after growing a field layer of oxide on the portions not covered by the patterned layer of silicon nitride.

FIG. 89h is a cross sectional view of the silicon wafer of FIG. 89g after patterning the layers of silicon dioxide.

FIG. 89i is a cross sectional view of the silicon wafer of FIG. 89h after applying and patterning a layer of photoresist onto the silicon wafer.

FIG. 89j is a cross sectional view of the silicon wafer of FIG. 89i after etching the exposed portions of the layers of silicon dioxide.

Figure 89M:
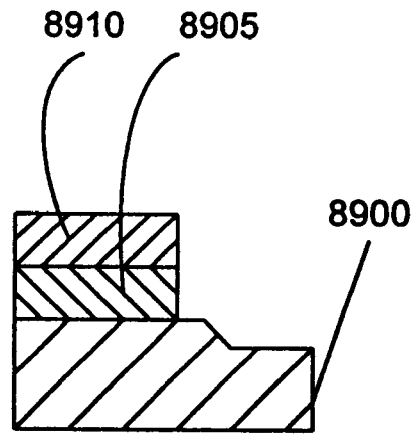
Figure 89K:
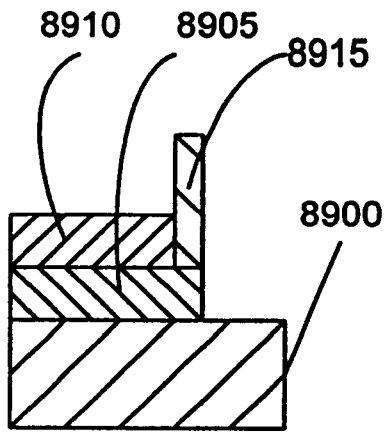

FIG. 89k is a cross sectional view of the silicon wafer of FIG. 89j after removing the layer of photoresist.

Figure 89N:
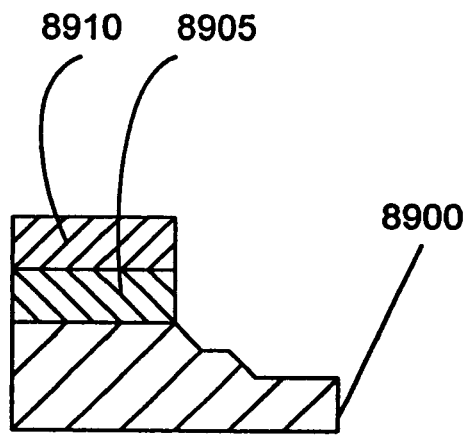
Figure 89L:
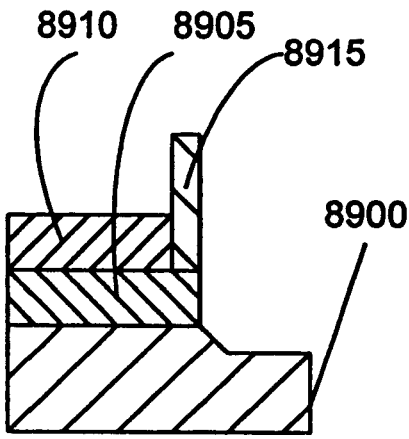

FIG. 89l is a cross sectional view of the silicon wafer of FIG. 89k after etching the exposed portions of silicon.

FIG. 89m is a cross sectional view of the silicon wafer of FIG. 89l after etching the exposed portions of the layers of silicon dioxide.

FIG. 89n is a cross sectional view of the silicon wafer of FIG. 89m after etching the exposed portions of silicon.

Figure 89O:
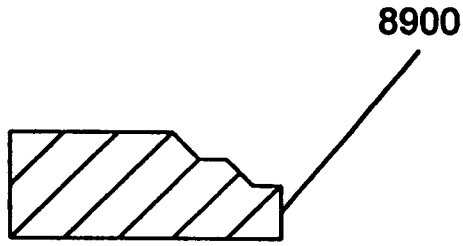

FIG. 89o is a cross sectional view of the silicon wafer of FIG. 89n after etching the remaining portions of the layers of silicon dioxide and silicon nitride.

FIG. 90a is a cross sectional view of a silicon wafer.

FIG. 90b is a cross sectional view of the silicon wafer of FIG. 90a including a pad layer of silicon dioxide.

FIG. 90c is a cross sectional view of the silicon wafer of FIG. 90b including a layer of silicon nitride.

FIG. 90d is a cross sectional view of the silicon wafer of FIG. 90c after patterning the layer of silicon nitride.

FIG. 90e is a cross sectional view of the silicon wafer of FIG. 90d after patterning the pad layer of silicon dioxide.

FIG. 90f is a cross sectional view of the silicon wafer of FIG. 90e after a thin etch of the exposed areas of silicon.

FIG. 90g is a cross sectional view of the silicon wafer of FIG. 90f after growing a field layer of oxide on the portions not covered by the patterned layer of silicon nitride.

FIG. 90h is a cross sectional view of the silicon wafer of FIG. 90g after patterning the layers of silicon dioxide.

FIG. 90i is a cross sectional view of the silicon wafer of FIG. 90h after applying and patterning a layer of photoresist onto the silicon wafer.

FIG. 90j is a cross sectional view of the silicon wafer of FIG. 90i after etching the exposed portions of the layers of silicon dioxide.

Figure 90K:
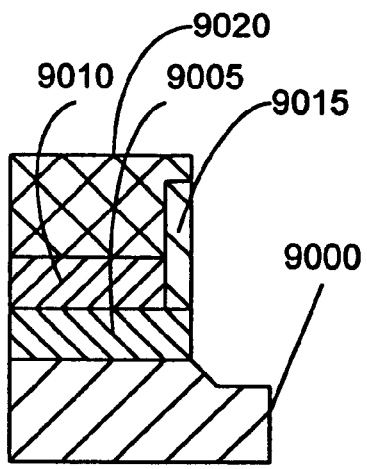

FIG. 90k is a cross sectional view of the silicon wafer of FIG. 90j after etching the exposed portions of silicon.

Figure 90N:
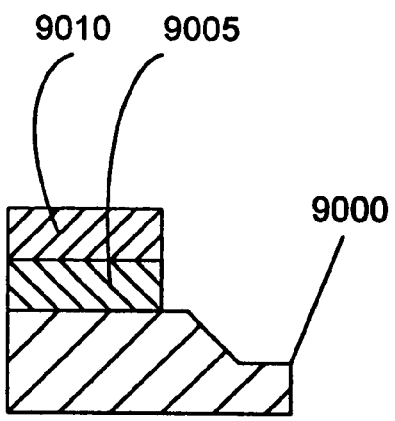
Figure 90L:
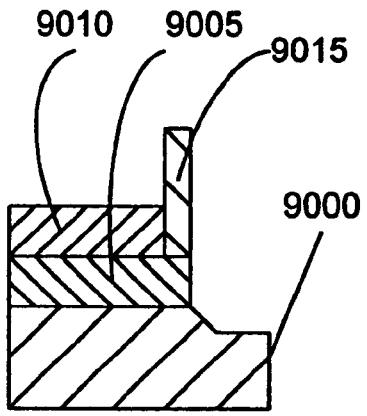

FIG. 90l is a cross sectional view of the silicon wafer of FIG. 90k after removing the layer of photoresist.

Figure 90O:
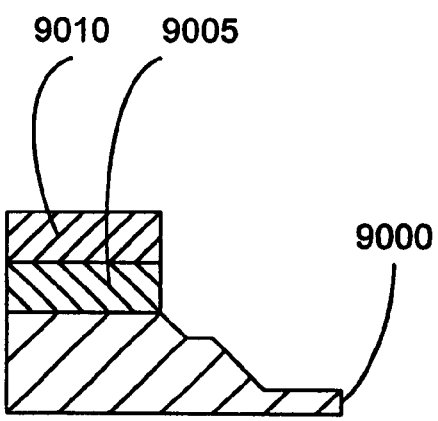
Figure 90M:
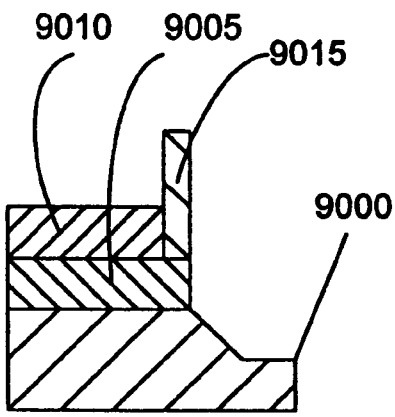

FIG. 90m is a cross sectional view of the silicon wafer of FIG. 90l after etching the exposed portions of silicon.

FIG. 90n is a cross sectional view of the silicon wafer of FIG. 90m after etching the exposed portions of the layers of silicon dioxide.

FIG. 90o is a cross sectional view of the silicon wafer of FIG. 90n after etching the exposed portions of silicon.

Figure 90P:

FIG. 90p is a cross sectional view of the silicon wafer of FIG. 90o after etching the remaining portions of the layers of silicon dioxide and silicon nitride.

FIG. 91a is a cross sectional view of a silicon wafer.

FIG. 91b is a cross sectional view of the silicon wafer of FIG. 91a including a pad layer of silicon dioxide.

FIG. 91c is a cross sectional view of the silicon wafer of FIG. 91b including a layer of silicon nitride.

FIG. 91d is a cross sectional view of the silicon wafer of FIG. 91c after patterning the layer of silicon nitride.

FIG. 91e is a cross sectional view of the silicon wafer of FIG. 91d after patterning the pad layer of silicon dioxide.

FIG. 91f is a cross sectional view of the silicon wafer of FIG. 91e after a thin etch of the exposed areas of silicon.

FIG. 91g is a cross sectional view of the silicon wafer of FIG. 91f after growing a field layer of oxide on the portions not covered by the patterned layer of silicon nitride.

FIG. 91h is a cross sectional view of the silicon wafer of FIG. 91g after patterning the layers of silicon dioxide.

FIG. 91i is a cross sectional view of the silicon wafer of FIG. 91h after applying and patterning a layer of photoresist onto the silicon wafer.

FIG. 91j is a cross sectional view of the silicon wafer of FIG. 91i after etching the exposed portions of silicon.

Figure 91K:
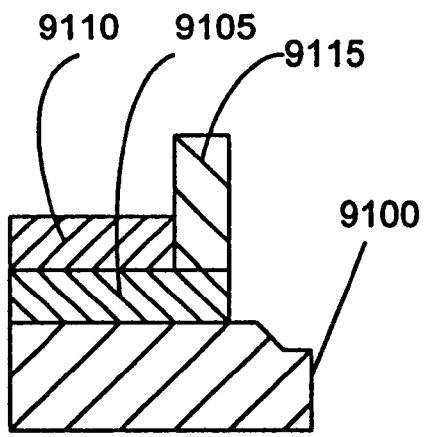

FIG. 91k is a cross sectional view of the silicon wafer of FIG. 91j after removing the layer of photoresist.

Figure 91N:
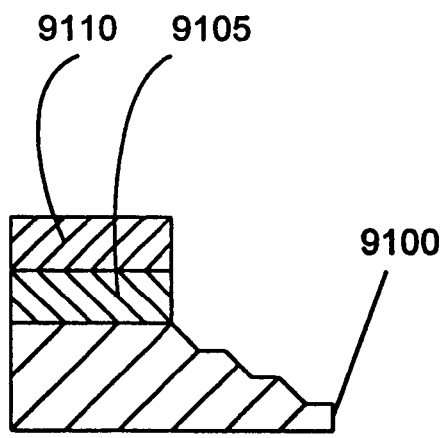
Figure 91L:
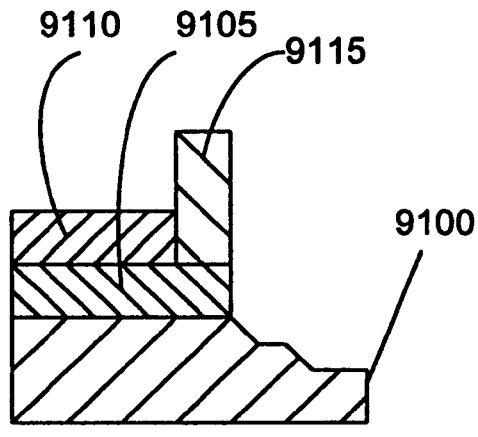

FIG. 91l is a cross sectional view of the silicon wafer of FIG. 91k after etching the exposed portions of silicon.

Figure 91O:
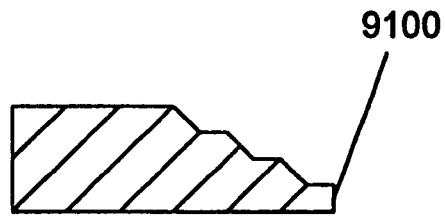
Figure 91M:
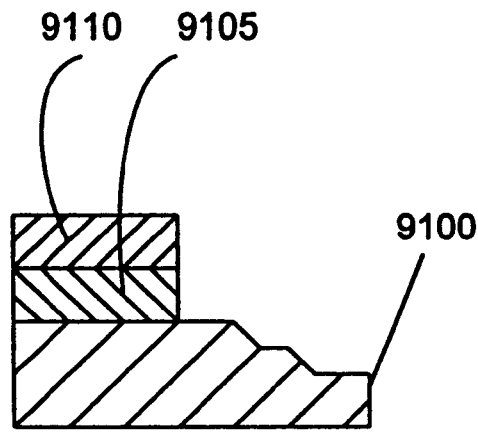

FIG. 91m is a cross sectional view of the silicon wafer of FIG. 91l after etching the exposed portions of the layers of silicon dioxide.

FIG. 91n is a cross sectional view of the silicon wafer of FIG. 91m after etching the exposed portions of silicon.

FIG. 91o is a cross sectional view of the silicon wafer of FIG. 91n after etching the remaining portions of the layers of silicon dioxide and silicon nitride.

Figure 92A:
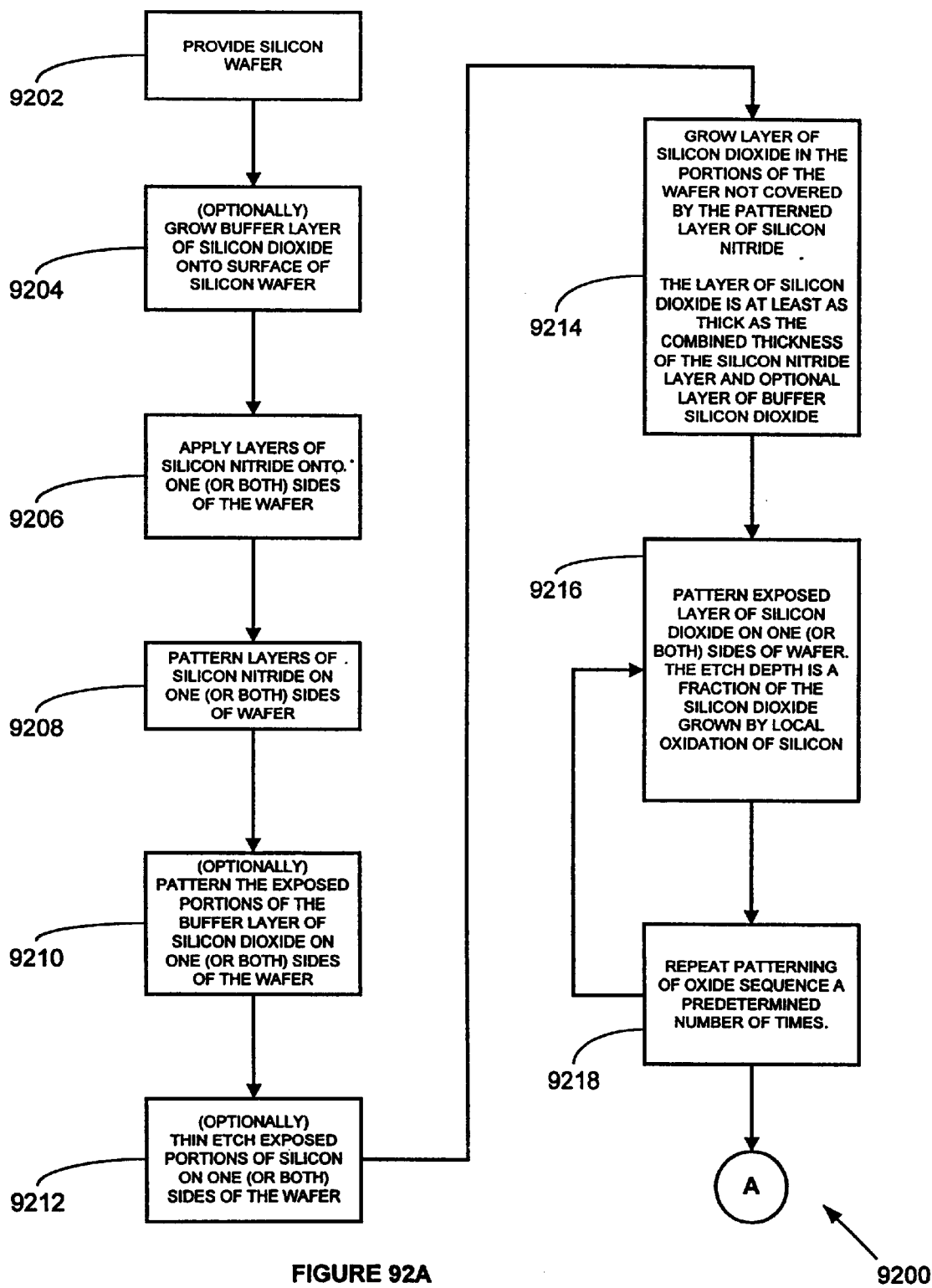
Figure 92B:
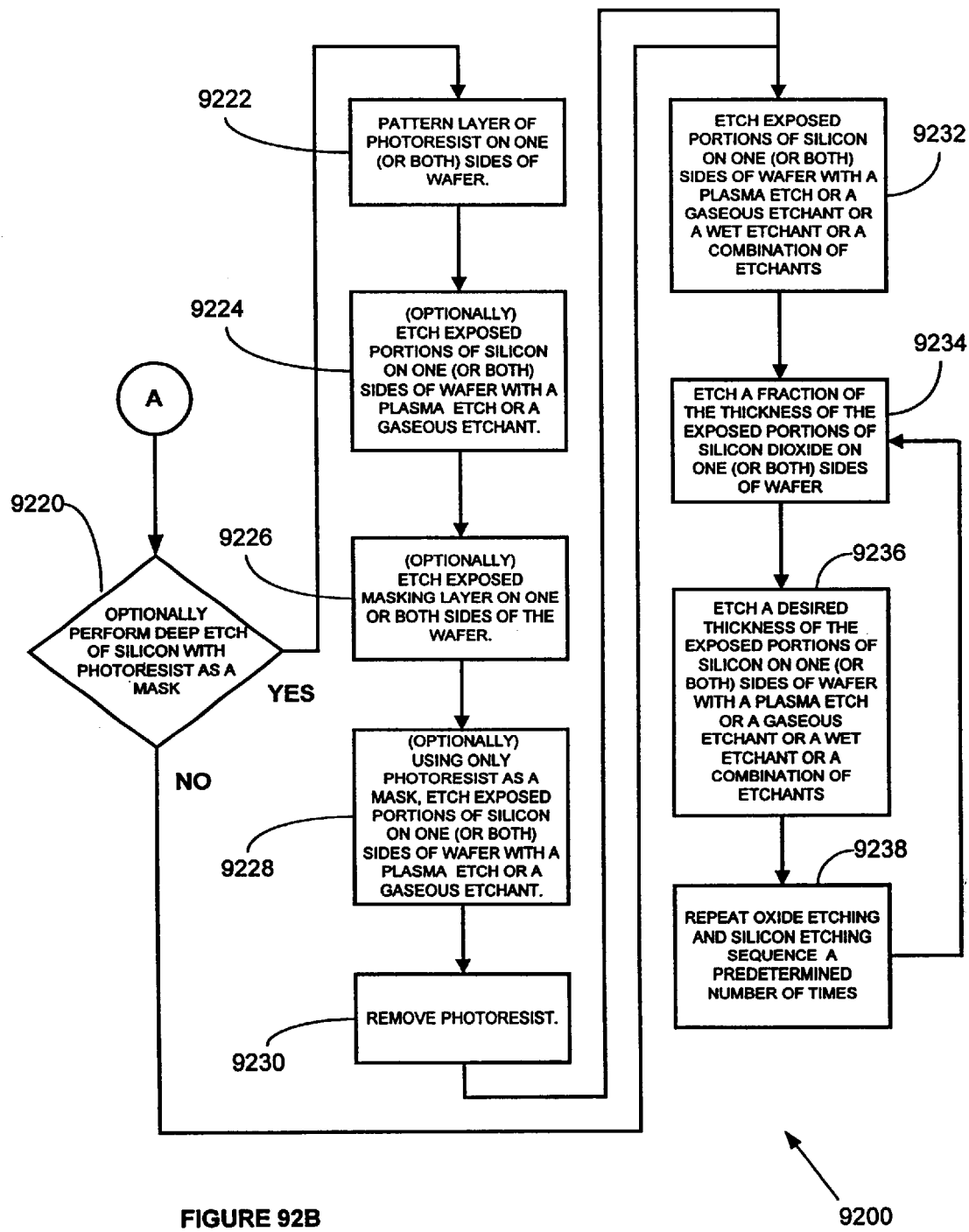

FIGS. 92a and 92b are a flow chart illustrating several embodiments of LOCOS merged-mask micromachining processes including multiple etch depths and using photoresist as a mask for deep reactive ion etching of silicon.

Figure 93A:
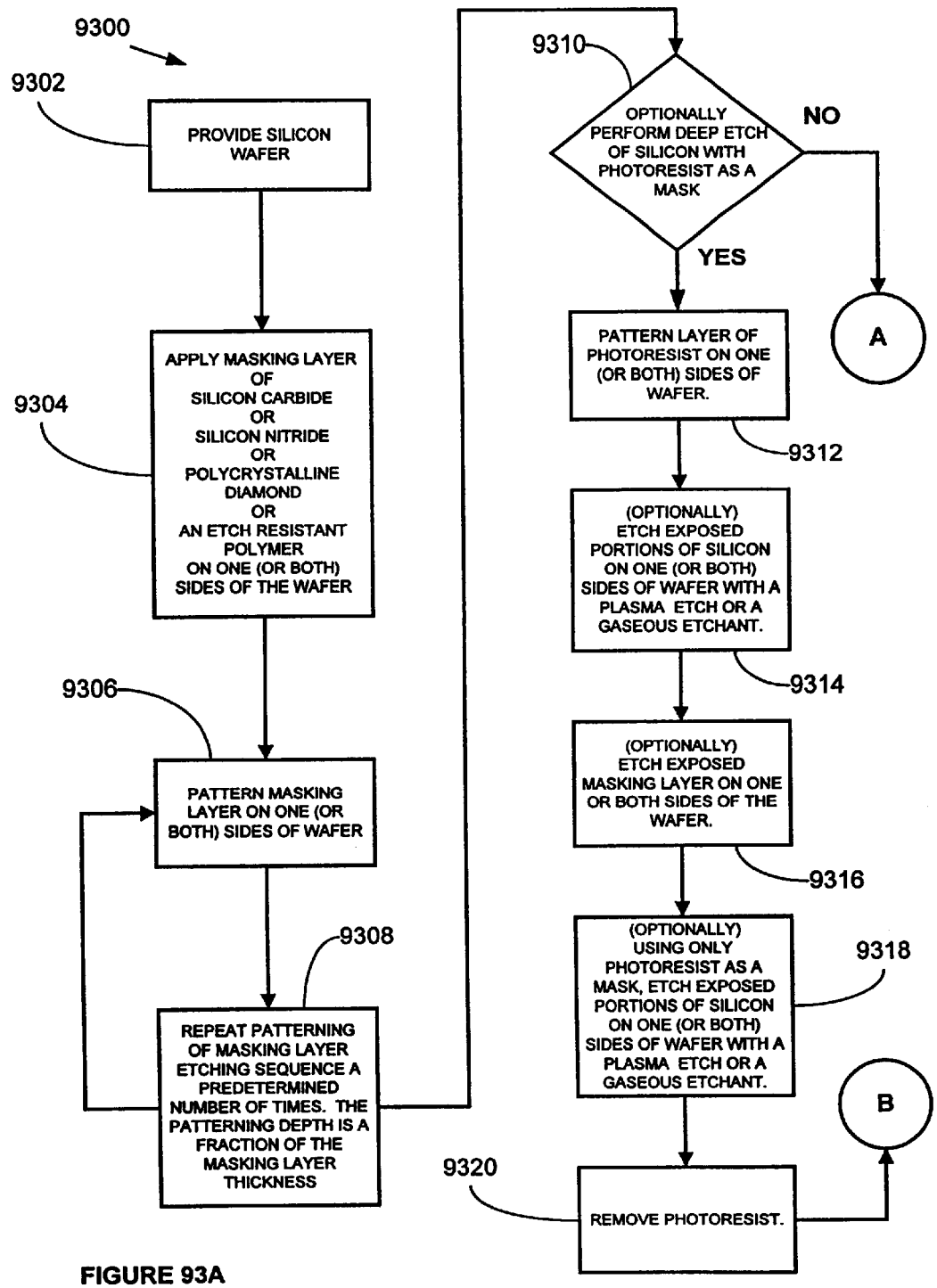
Figure 93B:
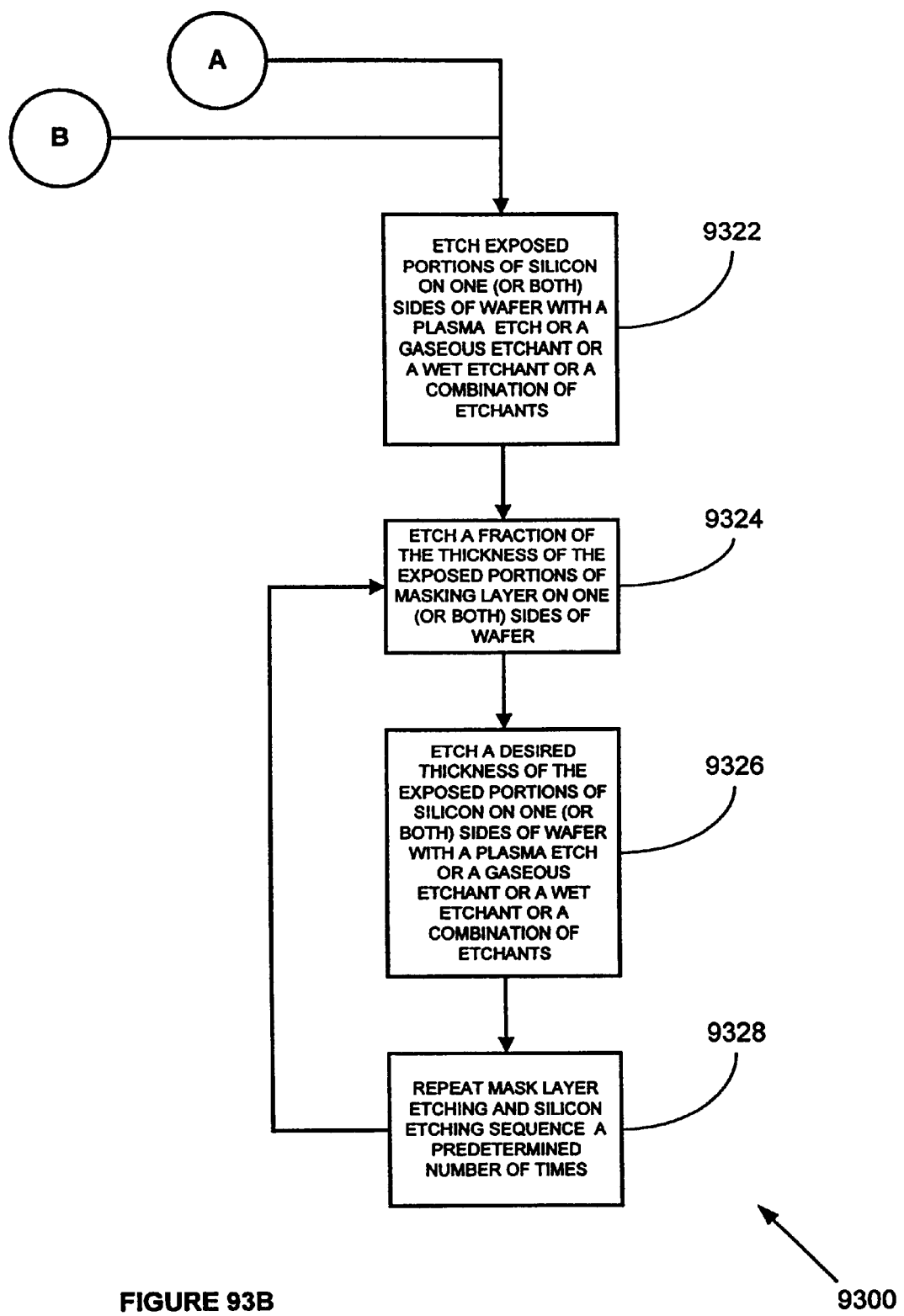

FIGS. 93a and 93b are a flow chart illustrating several embodiments of merged-mask micromachining processes including multiple etch depths and using photoresist as a mask for deep reactive ion etching of silicon.

Figure 94:
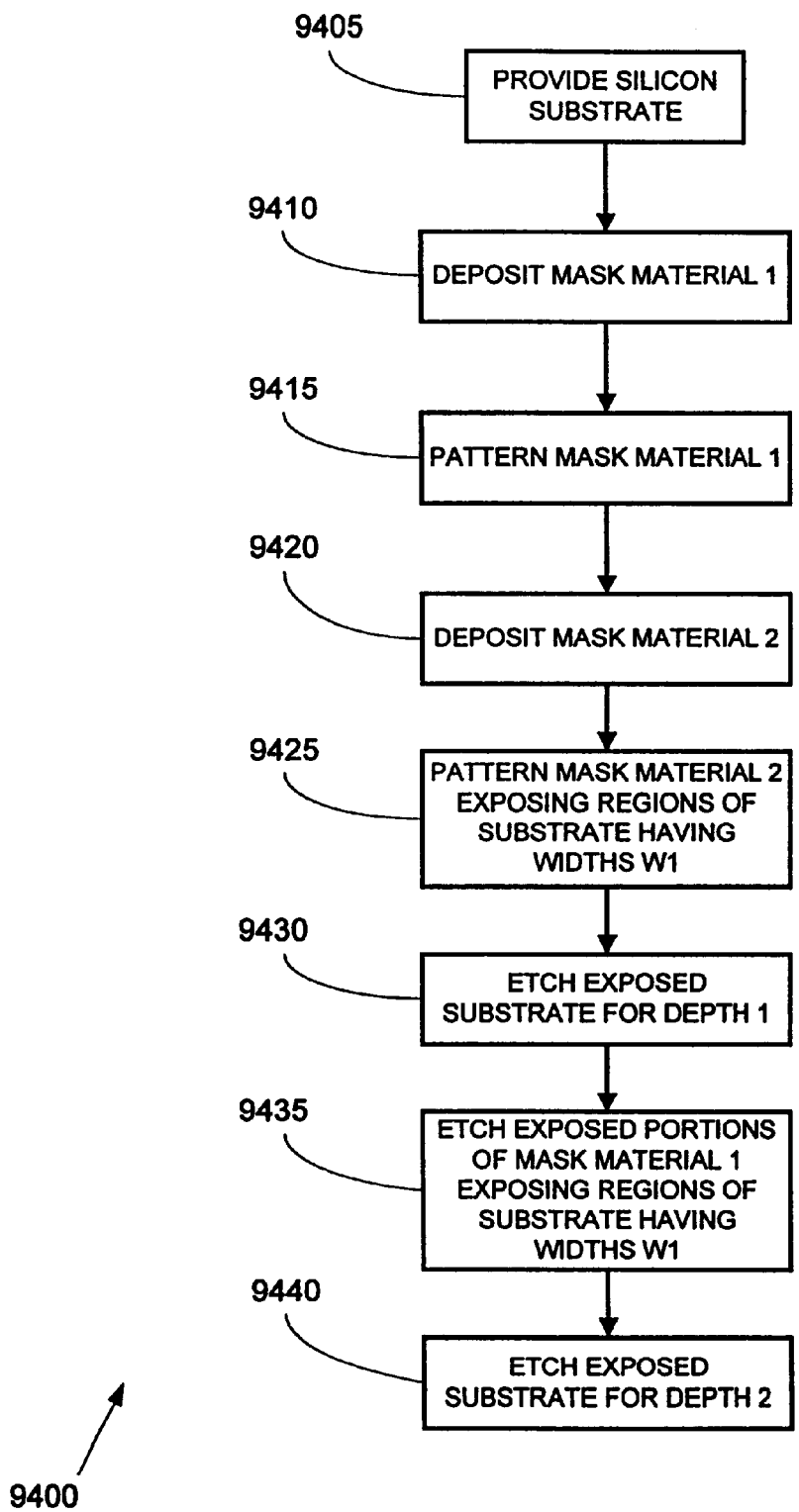

FIG. 94 is a flow chart illustrating an embodiment of a merged-mask micromachining process for etching multiple etch depths.

FIG. 95a is a cross sectional illustration of a silicon wafer.

FIG. 95b is a cross sectional illustration of the silicon wafer of FIG. 95a including a layer of a first masking material.

FIG. 95c is a cross sectional illustration of the silicon wafer of FIG. 95b after patterning the layer of the first masking material.

FIG. 95d is a cross sectional illustration of the silicon wafer of FIG. 95c including a layer of a second masking material.

Figure 95E:
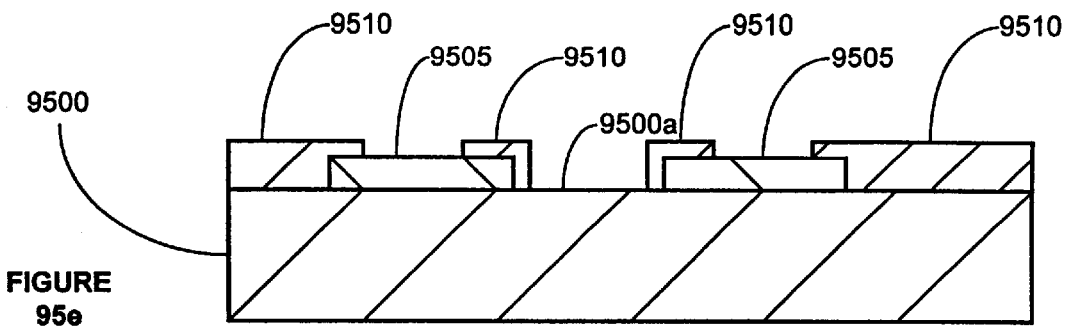

FIG. 95e is a cross sectional illustration of the silicon wafer of FIG. 95d after patterning the layer of the second masking material.

Figure 95F:
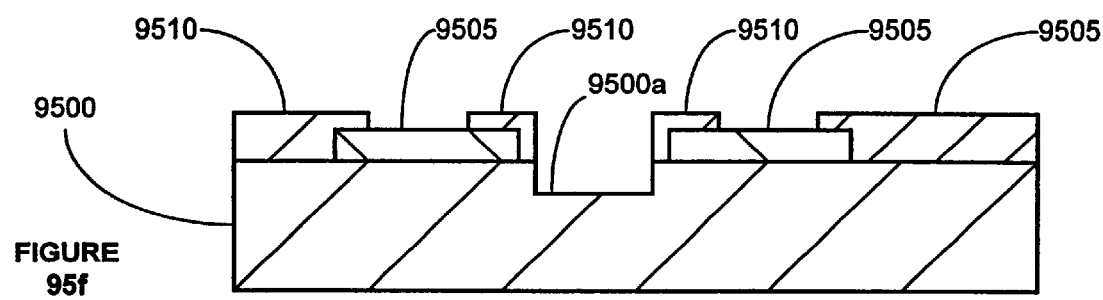

FIG. 95f is a cross sectional illustration of the silicon wafer of FIG. 95e after etching the exposed portions of the silicon wafer.

Figure 95G:
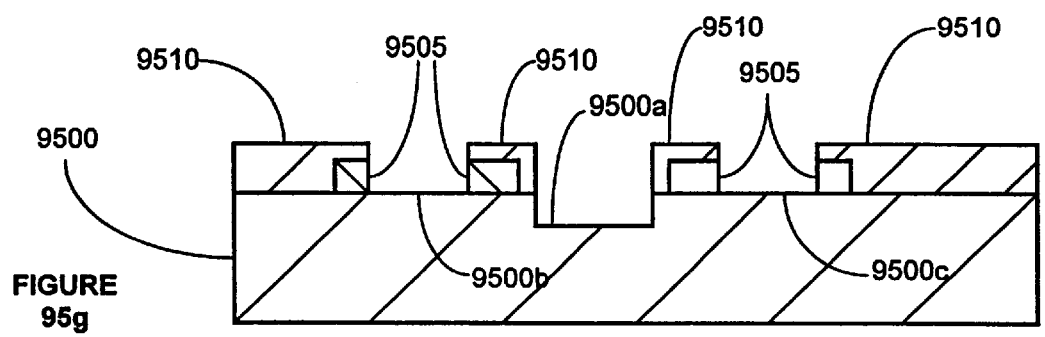

FIG. 95g is a cross sectional illustration of the silicon wafer of FIG. 95f after etching the exposed portions of-the layer of the first masking material.

Figure 95H:
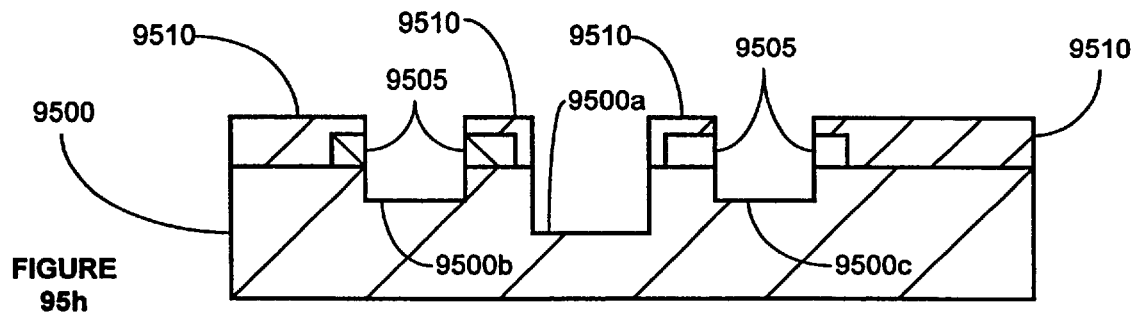

FIG. 95h is a cross sectional illustration of the silicon wafer of FIG. 95g after etching the exposed portions of the silicon wafer.

Figure 96:
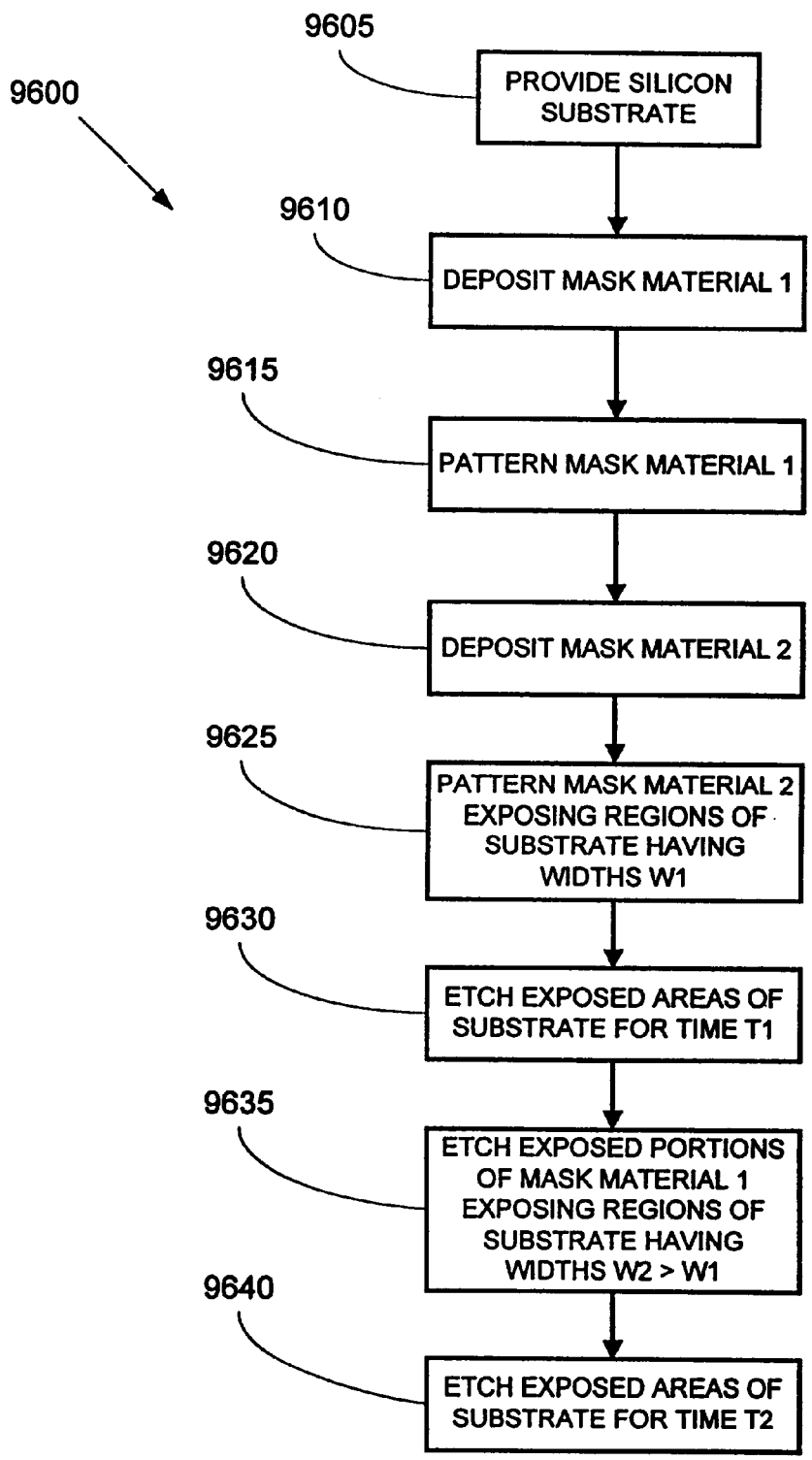

FIG. 96 is a flow chart illustrating an embodiment of a merged-mask micromachining process for etching different sized exposed areas to the same etch depth.

Figure 97A:

FIG. 97a is a cross sectional illustration of a silicon wafer.

Figure 97B:
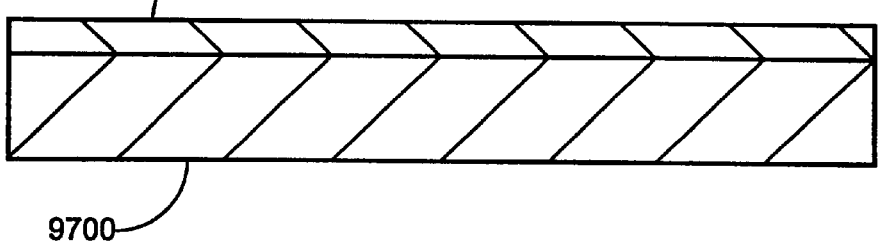

FIG. 97b is a cross sectional illustration of the silicon wafer of FIG. 97a including a layer of a first masking material.

Figure 97C:
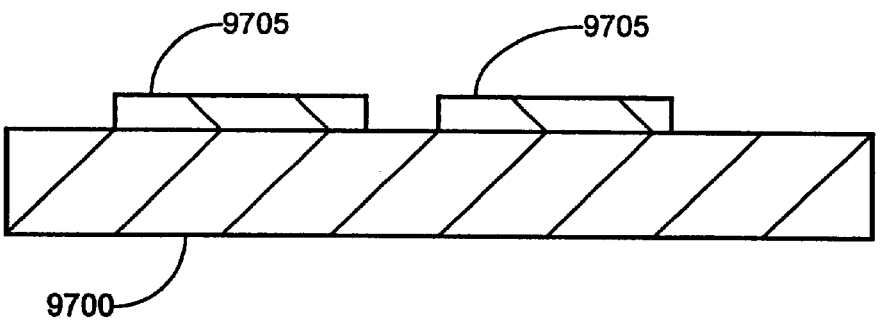

FIG. 97c is a cross sectional illustration of the silicon wafer of FIG. 97b after patterning the layer of the first masking material.

Figure 97D:
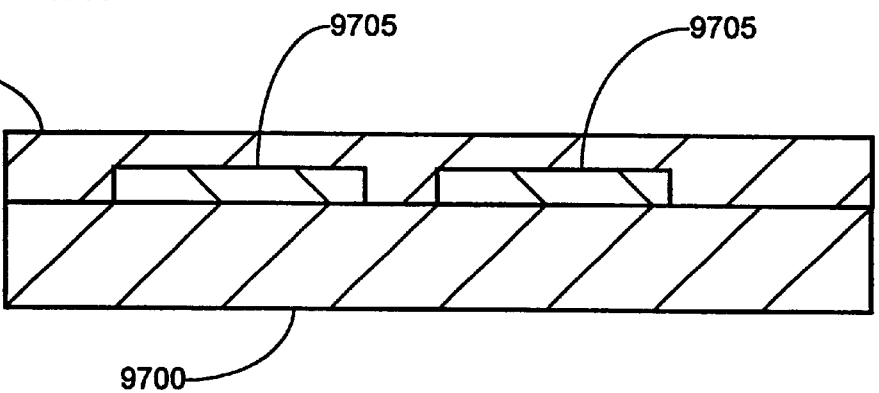

FIG. 97d is a cross sectional illustration of the silicon wafer of FIG. 97c including a layer of a second masking material.

FIG. 97e is a cross sectional illustration of the silicon wafer of FIG. 97d after patterning the layer of the second masking material.

FIG. 97f is a cross sectional illustration of the silicon wafer of FIG. 97e after etching the exposed portions of the silicon wafer.

FIG. 97g is a cross sectional illustration of the silicon wafer of FIG. 97f after etching the exposed portions of the layer of the first masking material.

FIG. 97h is a cross sectional illustration of the silicon wafer of FIG. 97g after etching the exposed portions of the silicon wafer.

DETAILED DESCRIPTION OF THE ILLUSTRATIVE EMBODIMENTS

A merged-mask micro-machining process for forming a micro-machined structure is provided. The merged-mask micro-machining process is preferably used to fabricate a mirror assembly for use in a bar code reader is provided. The mirror assembly preferably includes a micro-machined three dimensional mirror having a "T" shaped hinge. The mirror assembly further preferably includes one or more travel stops for limiting the movement of the mirror. The mirror assembly further preferably includes one or more tapered edge surfaces and cut-outs for minimizing clipping of incident and reflected laser beams.

Figure 1:
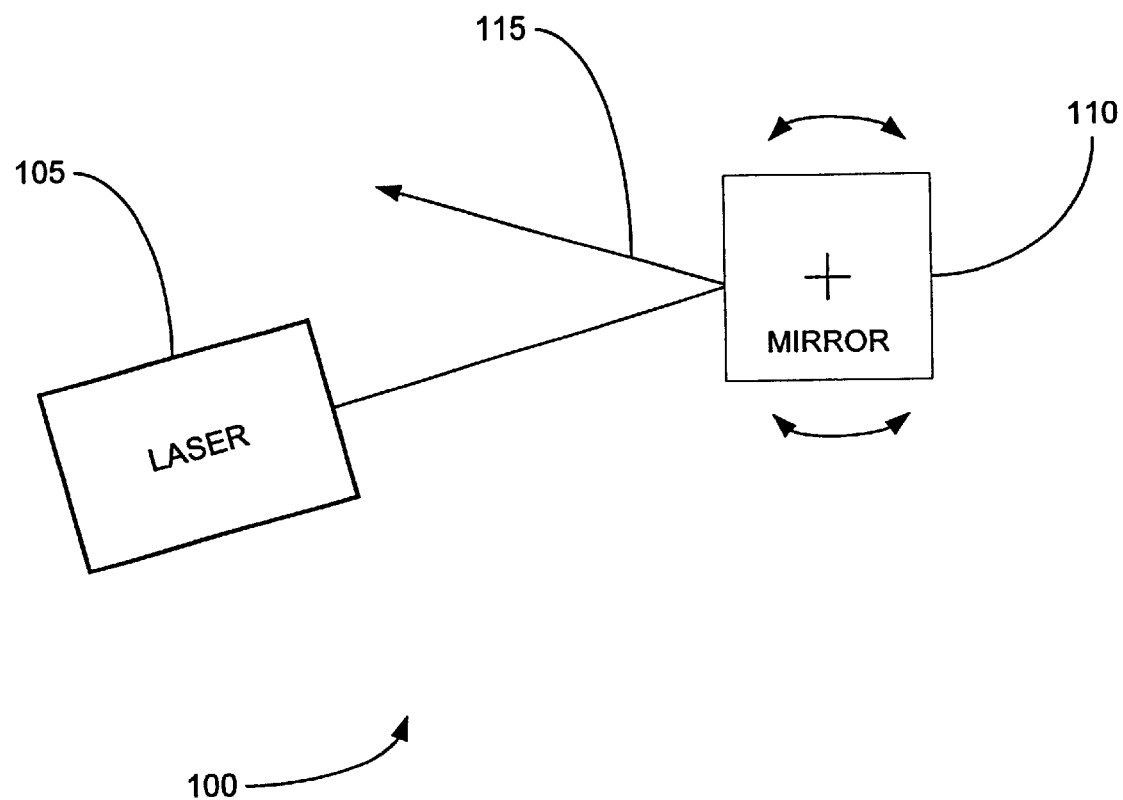
FIG. 1 is a schematic illustration of a mirror assembly and laser for use in a bar code scanner.
Figure 2:
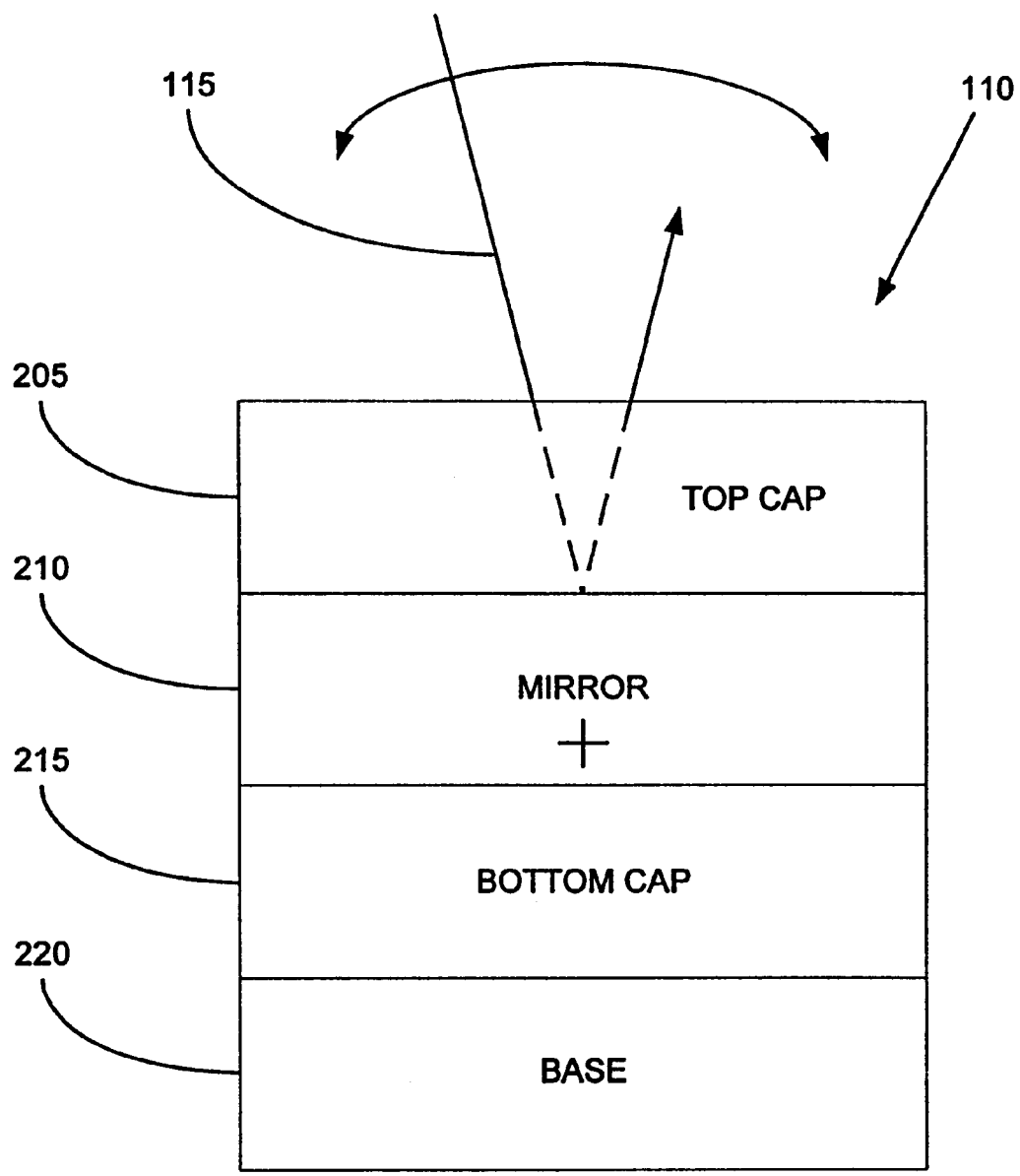
FIG. 2 is a schematic side view of a preferred embodiment of the mirror assembly of FIG. 1.

Referring initially to FIG. 1, a bar code scanner 100 includes a laser 105 and a mirror assembly 110. As will be recognized by persons having ordinary skill in the art, during the operation of the bar code scanner 100, the optically reflective portion of the mirror assembly 110 is preferably oscillated to permit the laser 105 to scan a surface by reflecting the laser beam 115 off of the optically reflective portion of the mirror assembly 110. The laser beam 105 may comprise any number of conventional commercially available laser beams.

Referring to FIGS. 2–19, in a preferred embodiment, the mirror assembly 110 includes a top cap 205, a mirror 210, a bottom cap 215, and a base member 220. In a preferred embodiment, the top cap 205 includes an opening that permits the laser beam 115 to reflect off of the mirror 210. In this manner, the mirror 210 is sandwiched between and protected by the top cap 205 and the bottom cap 215. The sub-assembly including the top cap 205, mirror 210 and bottom cap 215 are then mounted onto the base member 220.

Figure 3:
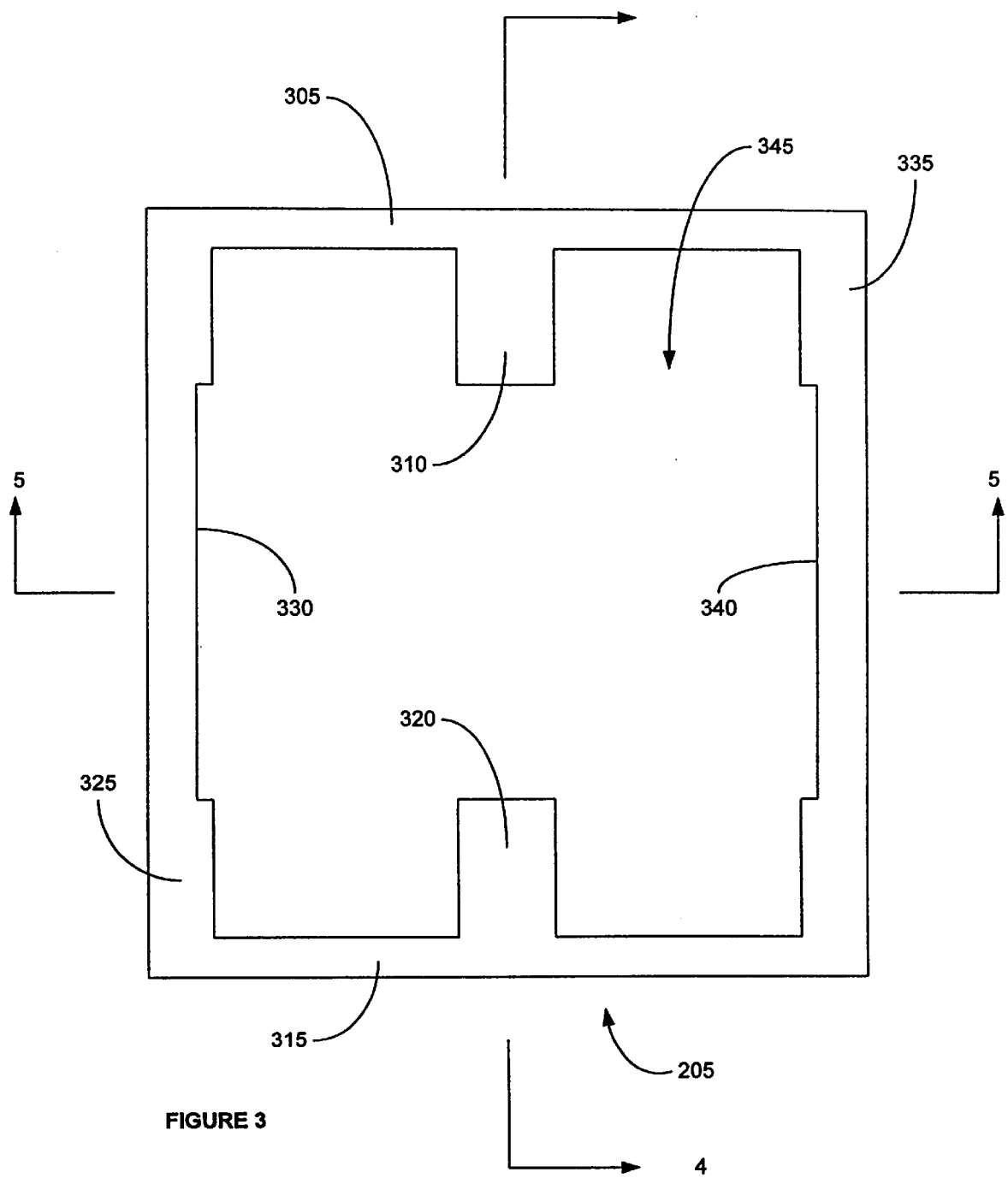
FIG. 3 is a top view of the top cap of the mirror assembly of FIG. 2.
Figure 4:
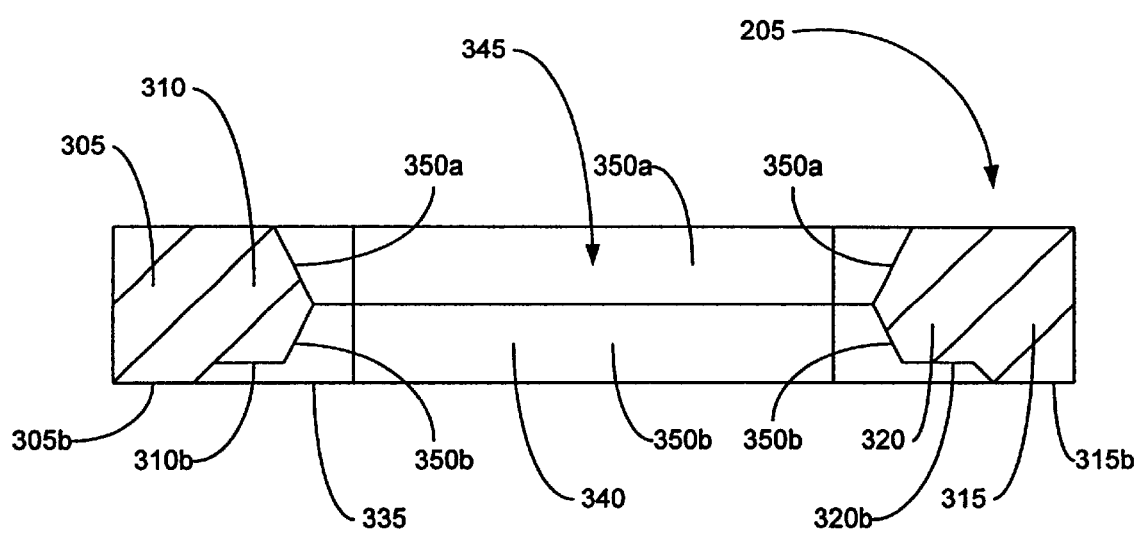
FIG. 4 is a cross-sectional view of the top cap of 3.
Figure 5:
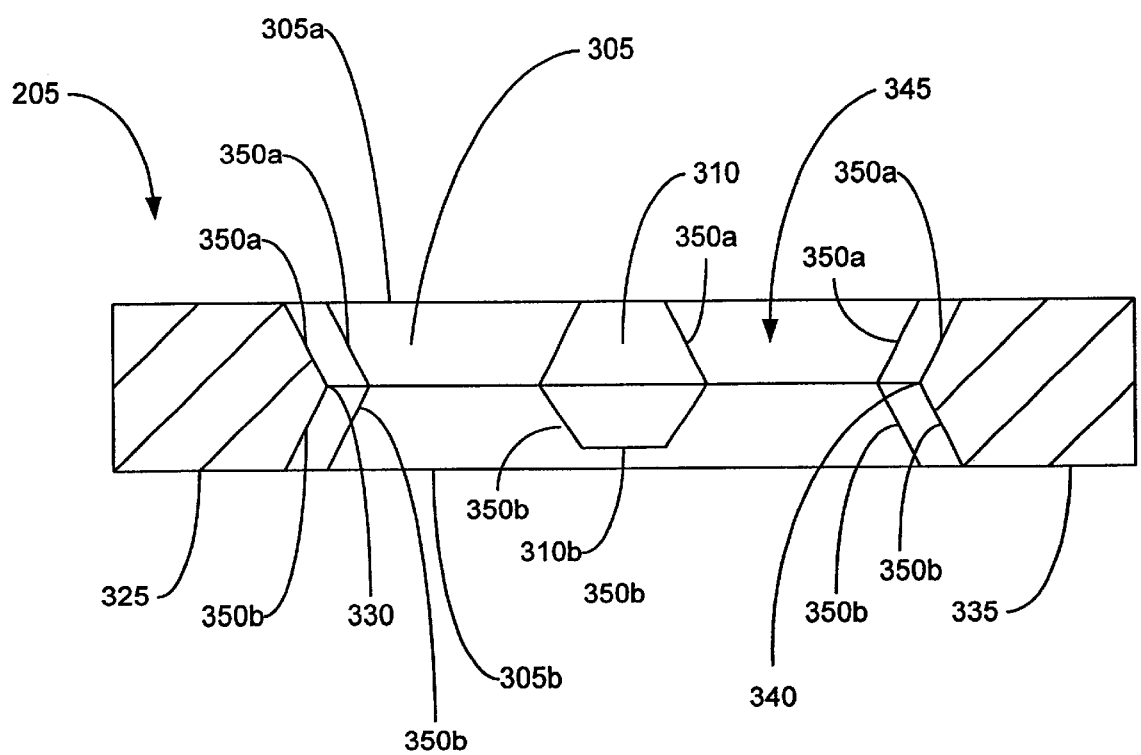
FIG. 5 is a cross-sectional view of the top cap of FIG. 3.

As illustrated in FIGS. 3–5, in a preferred embodiment, the top cap 205 includes a top support member 305, a top travel stop member 310, a bottom support member 315, a bottom travel stop member 320, a left support member 325, a left rim cut-out 330, a right support member 335, a right rim cut-out 340, and an opening 345.

The top support member 305 is coupled to the top travel stop member 310, the left support member 325 and the right support member 335. The top travel stop member 310 is coupled to the top support member 305. The bottom support member 315 is coupled to the bottom travel stop member 320, the left support member 325 and the right support member 335. The bottom travel stop member 320 is coupled the bottom support member 315.

The top, bottom, left and right support members, 305, 315, 325 and 335, together provide the overall support structure for the top cap 205. The thickness of the top, bottom, left and right support members, 305, 315, 325 and 335, may range, for example, from about 400 to 600 microns. In a preferred embodiment, the thickness of the top, bottom, left and right support members, 305, 315, 325 and 335, ranges from about 390 to 400 microns in order to provide a compact structure having a low mass.

The top travel stop 310 preferably limits the motion of the reflective portion of the mirror 210 in the direction normal to the plane of the reflective portion of the mirror 210. The top travel stop 310 preferably extends is a substantially orthogonal direction from the top support member 305. In a preferred embodiment, the top travel stop 310 is positioned within the plane of the top support member 305. The thickness of the top travel stop 310 may range, for example, from about 340 to 580 microns. In a preferred embodiment, the thickness of the top travel stop 310 ranges from about 350 to 380 microns in order to provide optimum shock protection, freedom of motion, and a compact structure having a low mass. In a particularly preferred embodiment, the bottom surface 310b of the top travel stop 310 is recessed below the level of the bottom surface 305b of the top support member 305. In this manner, the bottom surface 310b of the top travel stop 310 is preferably positioned above the level of the reflective surface of the mirror 210. The length of the top travel stop member 310 may range, for example, from about 800 to 2800 microns. In a preferred embodiment, the length of the top travel stop member 310 ranges from about 2000 to 2500 microns. In a particularly preferred embodiment, the length of the top travel stop member 310 is selected to overlap with the mirror collection plate 610 of the mirror by about 300 microns.

The bottom travel stop 320 preferably limits the motion of the reflective portion of the mirror 210 in the direction normal to the plane of the reflective portion of the mirror 210. The bottom travel stop 320 preferably extends is a substantially orthogonal direction from the bottom support member 315. In a preferred embodiment the bottom travel stop 320 is positioned within the plane of the bottom support member 305. The thickness of the bottom travel stop 320 may range, for example, from about 340 to 580 microns. In a preferred embodiment, the thickness of the bottom travel stop 320 ranges from about 350 to 380 microns in order to provide optimum shock protection, freedom of motion, and a compact structure having a low mass. In a particularly preferred embodiment, the bottom surface 320b of the bottom travel stop 320 is recessed below the level of the bottom surface 315b of the bottom support member 315. In this manner, the bottom surface 320b of the bottom travel stop 320 is preferably positioned above the level of the reflective surface of the mirror 210. The length of the bottom travel stop member 320 may range, for example, from about 800 to 2800 microns. In a preferred embodiment, the length of the bottom travel stop member 320 ranges from about 2000 to 2500 microns. In a particularly preferred embodiment, the length of the bottom travel stop member 320 is selected to overlap with the mirror collection plate 610 of the mirror by about 300 microns.

The opening 345 preferably permits light to reflect off of the reflective surface of the mirror 210. The opening 345 preferably includes a left rim cut out 330 and a right rim cut out 340. The left and right rim cut outs, 330 and 340, are preferably provided positioned on opposite sides in surrounding relation to the reflective surface of the mirror 210. In this manner, the left and right rim cut-outs, 330 and 340, provide optical access to the reflective surface of the mirror 210.

In a preferred embodiment, the top support member 305, the top travel stop finger 310, the bottom support member 315, the bottom travel stop finger 320, the left support member 325, the left rim cut-out 330, the right support member 335, the right rim cut-out 340, and the opening 345 all include tapered edges, 350a and 350b, to facilitate optical access to the reflective surface of the mirror 210. In this manner, laser light that is directed at the reflective surface of the mirror 210 at an angle is able to impact the edge portions of the reflective surface of the mirror 210. In a preferred embodiment, the taper angle of the tapered edges, 350a and 350b, ranges from about 50 to 60 degrees in order to optimally facilitate the reflection of laser light transmitted at an angle towards the edge portions of the reflective surface of the mirror 210.

The top cap 205 may be fabricated from any number of conventional commercially available materials such as, for example, silicon glass, ceramic or plastic. In a preferred embodiment, the top cap 205 is fabricated by micromachining a silicon wafer using any one, or combination, of the embodiments for micro-machining disclosed in the present disclosure.

As illustrated in FIGS. 6–9, in a preferred embodiment, the mirror 210 includes a top support member 602, a bottom support member 604, a left support member 606, a right support member 608, a mirror collection plate 610, a top T-shaped hinge 612, a bottom T-shaped hinge 614, a top left travel stop finger 616, a top right travel stop finger 618, a bottom left travel stop finger 620, a bottom right travel stop finger 622, an opening 624, a conductive layer 626, and a reflective surface 628.

The top support member 602 is coupled to the left support member 606, the right support member 608, and the conductive layer 616. The bottom support member 604 is coupled to the left support member 606, the right support member 608, and the conductive layer. The left support member 606 is coupled to the top support member. 602, the bottom support member 604, the top T-shaped hinge 612, the bottom T-shaped hinge 614, and the conductive layer 626. The right support member 608 is coupled to the top support member 602, the bottom support member 604, the top T-shaped hinge 612, the bottom T-shaped hinge 614, and the conductive layer 626. The mirror collection plate 610 is coupled to the top T-shaped hinge 612 and the bottom T-shaped hinge 614. The top T-shaped hinge 612 is coupled to the left support member 606, the right support member 608, and the mirror collection plate 610. The bottom T-shaped hinge 614 is coupled to the left support member 606, the right support member 608, and,the mirror collection plate 610. The top left travel stop finger 616 is coupled to the mirror collection plate 610. The top right travel stop finger 618 is coupled to the mirror collection plate 610. The bottom left travel stop finger 620 is coupled to the mirror collection plate 610. The bottom right travel stop finger 622 is coupled to the mirror collection plate 610. The conductive layer 626 is coupled to the top, bottom, left and right support members, 602, 604, 606 and 608. The reflective surface 628 is coupled to the mirror collection plate 610.

The top, bottom, left and right support members, 602, 604, 606 and 608, together provide the overall support structure for the mirror 210. The thickness of the top, bottom, left and right support members, 602, 604, 606 and 608, may range, for example, from about 400 to 600 microns. In a preferred embodiment, the thickness of the top, bottom, left and right support members, 602, 604, 606 and 608, ranges from about 400 to 450 microns in order to provide a compact structure having a low mass. In a preferred embodiment, the support members 602, 604, 606, and 608 provide effective beam lengths ranging from about 500–2500 microns and cross sections of about 8,000 microns$^2$ to 160,000 microns$^2$ in order to optimally absorb shock loads of about 2000 g/0.5 mS half sine wave input.

The mirror collection plate 610 is coupled to the top T-shaped hinge 612 and the bottom T-shaped hinge 614. In this manner, the mirror collection plate 610 rotates about the axis 630. In a preferred embodiment, the axis 630 is positioned substantially along the centerline of the mirror collection plate 610. In a preferred embodiment, the axis 630 is coincident with the center of the T-shaped hinges, 612 and 614. The reflective surface 628 is coupled to the top 632 of the mirror collection plate 610. In this manner, rotation of the mirror collection plate 610 about the axis 630 causes laser light from a stationary laser to reflect off of the reflective surface in a plurality of directions.

The thickness of the mirror collection plate 610 may range, for example, from about 100 to 600 microns. In a preferred embodiment, the thickness of the mirror collection plate 610 ranges from about 100 to 250 microns in order to provide a low mass and maximize the effective natural frequency of the mirror 210.

The reflective surface 628 may be comprised of any number of conventional commercially available optically reflective surfaces such as, for example, gold, silver or aluminum. In a preferred embodiment, the reflective surface 628 comprises gold in order to optimize the amount of optical energy that is reflected. In a preferred embodiment, the surface roughness of the reflective surface 628 is less than about 0.1 wavelengths of the reflected light in order to optimize the amount of optical energy that is reflected.

Figure 7:
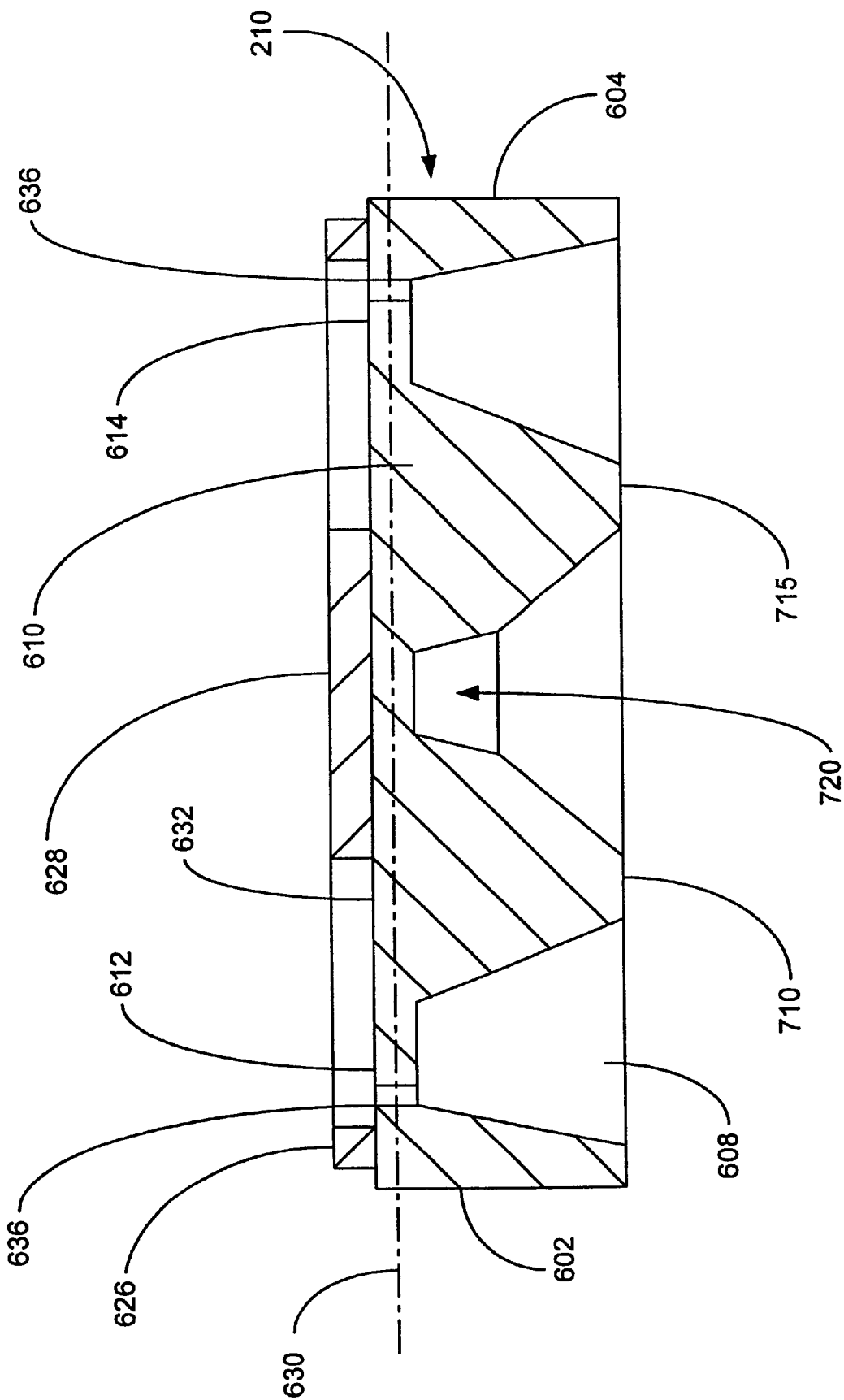
FIG. 7 is a cross-sectional view of the mirror of FIG. 6.
Figure 8:
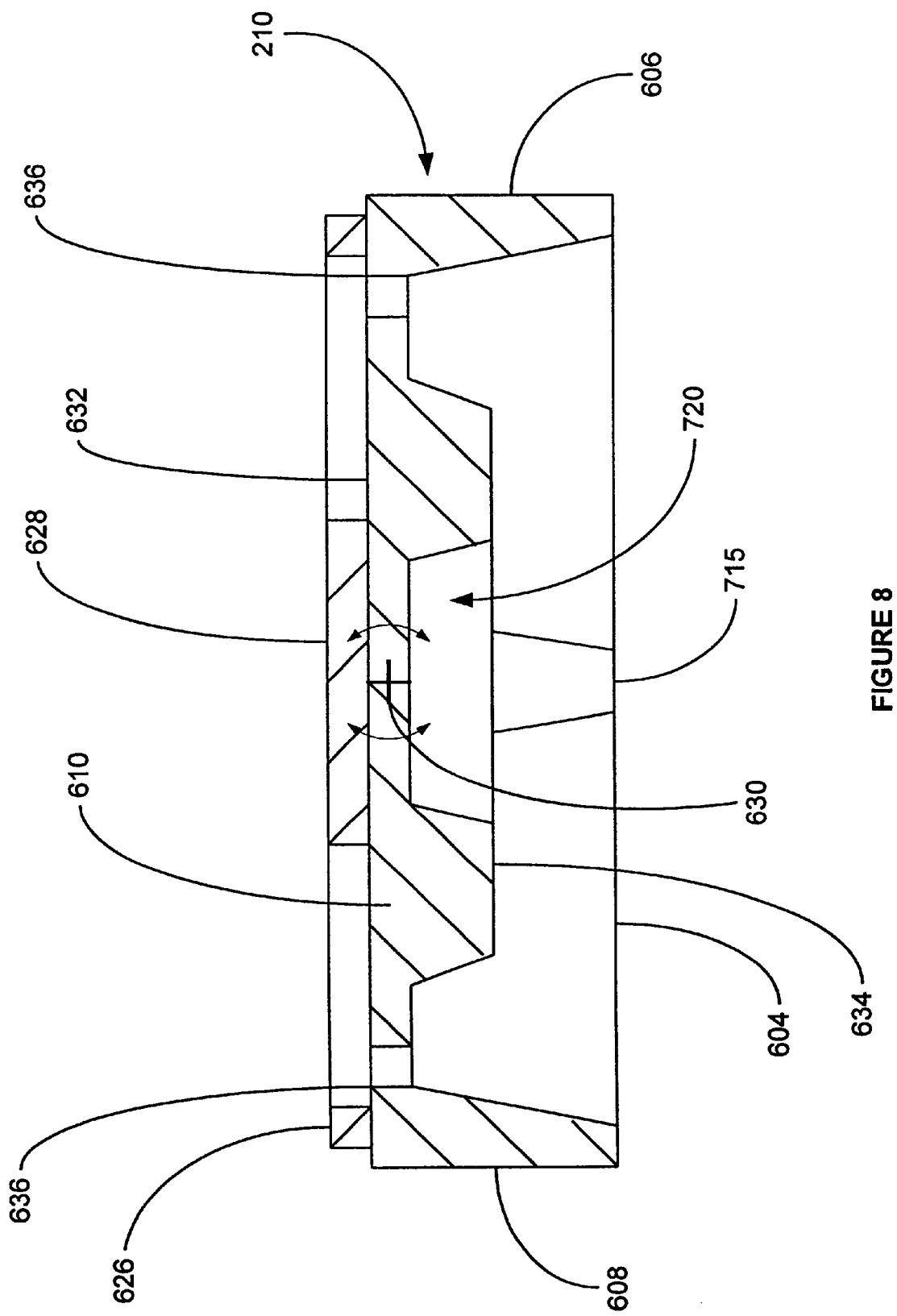
FIG. 8 is a cross-sectional view of the mirror of FIG. 6.
Figure 9:
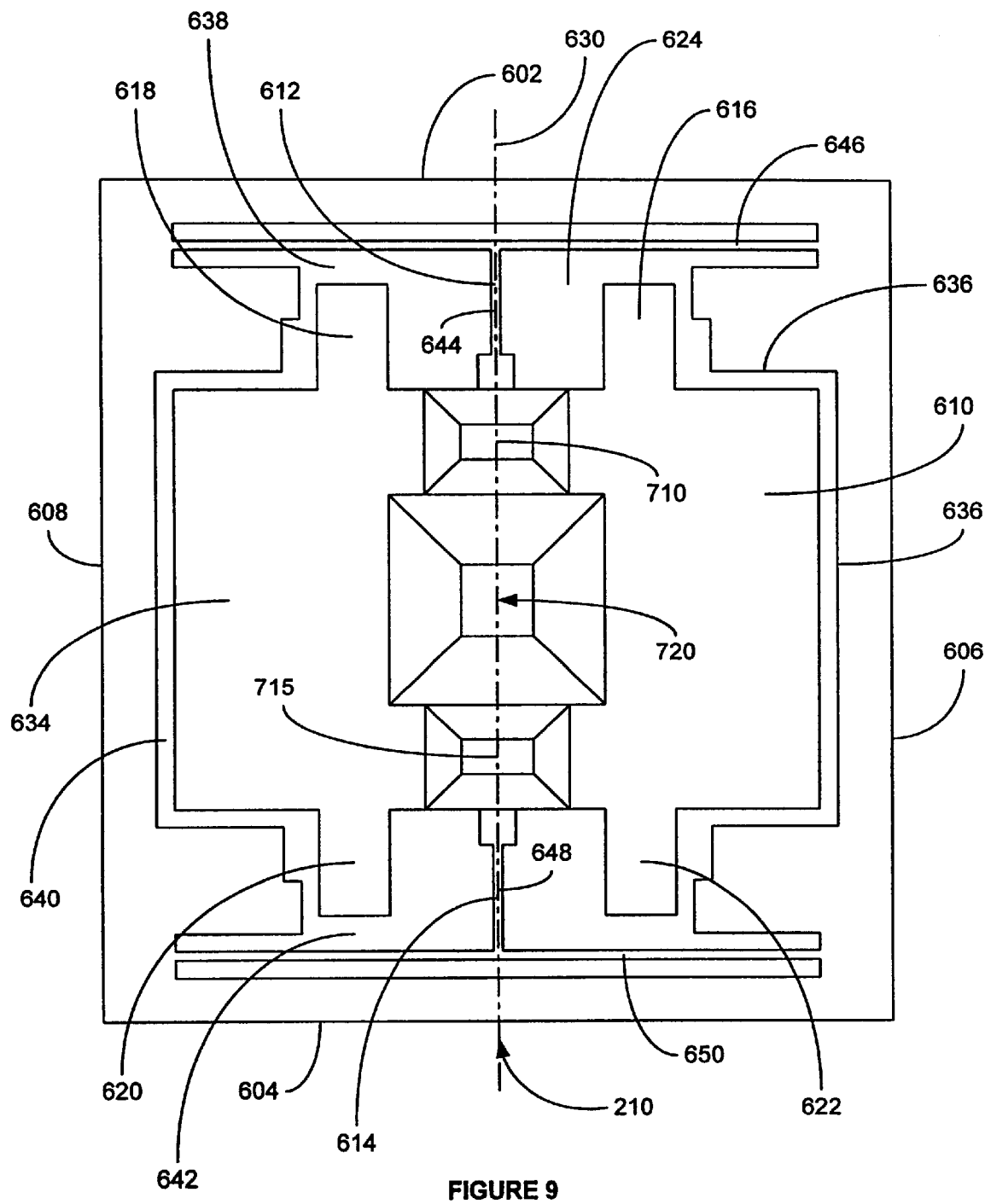
FIG. 9 is a bottom view of the mirror of FIG. 6.

As illustrated in FIGS. 7–9, in a preferred embodiment, the bottom 634 of the mirror collection plate 610 includes a top travel stop 710, a bottom travel stop 715, and a cavity 720.

The top travel stop 710 extends from the bottom 634 of the mirror collection plate 610. The top travel stop 710 preferably limits movement of the mirror collection plate 610 in the z-direction. The top travel stop 710 preferably extends from the bottom 634 of the mirror collection plate 610 in a substantially orthogonal direction. The top travel stop 710 may extend from the bottom 634 of the mirror collection plate 610 for a distance ranging, for example, from about 200 to 400 microns. In a preferred embodiment, the top travel stop 710 extends from the bottom 634 of the mirror collection plate 610 for a distance ranging from about 200 to 250 microns in order to optimally limit movement of the mirror collection plate 610. In a preferred embodiment, the top travel stop 710 is centered about the axis 630. In a preferred embodiment, the top travel stop 710 is positioned adjacent to and on one side of the cavity 720.

The bottom travel stop 715 extends from the bottom 634 of the mirror collection plate 610. The bottom travel stop 715 preferably limits movement of the mirror collection plate in the z-direction. The bottom travel stop 715 preferably extends from the bottom 634 of the mirror collection plate 610 in a substantially orthogonal direction. The bottom travel stop 715 may extend from the bottom 634 of the mirror collection plate 610 for a distance ranging, for example, from about 200 to 400 microns. In a preferred embodiment, the bottom travel stop 715 extends from the bottom 634 of the mirror collection plate 610 for a distance ranging from about 200 to 250 microns in order to optimally limit movement of the mirror collection plate 610. In a preferred embodiment, the bottom travel stop 715 is centered about the axis 630. In a preferred embodiment, the bottom travel stop 715 is positioned adjacent to and on one side of the cavity 720. In a preferred embodiment, the top travel stop 710 and the bottom travel stop 715 are portioned in opposing relation on opposite sides of the cavity 720.

The cavity 720 extends into the bottom of the mirror collection plate 610. The cavity 720 reduces the mass of the mirror collection plate 610. In this manner, the droop of the mirror 210 is reduced. In a preferred embodiment, the depth and volume of the cavity 720 ranges from about 200 to 500 microns and $8 \times 10^6$ to $1 \times 10^9$ microns.$^3$ In a preferred embodiment, the cavity 720 is centrally positioned along the axis 630. In a preferred embodiment, the cavity 720 is centrally positioned within the back side 634 of the mirror collection plate 610.

For typical bar code scanner applications, the rotational accuracy of the laser beam may be required to be within 1.3° when the mirror collection plate 610 is subjected to an across-the-hinge self-induced gravity torque. Where torque T=mg*h/2, with mg=mirror collection plate weight and h=mirror collection plate thickness. The mirror accuracy is a function of the pointing accuracy and mirror droop. The torsional spring constant $K_r$ of the T-shaped hinges, 612 and 614, is determined by the resonant frequency F of the mirror collection plate 610 and the size and mass of the mirror collection plate 610. The mirror tilt angle θ due to a gravity torque is determined by the relation, θ=T/$K_r$. Consequently, the thickness and mass of the mirror collection plate 610, are preferably selected to provide a mirror tilt angle θ less than 1.3°. In a preferred embodiment, the thickness and mass of the mirror collection plate 610 are reduced by reducing the thickness of the mirror collection plate 610 and by providing one or more cavities in the mirror collection plate 610.

The top T-shaped hinge 612 is coupled to the left support member 606, the right support member 608, and the top portion of the mirror collection plate 610. The top T-shaped hinge 612 preferably includes a vertical support member 644 and a horizontal support member 646. The horizontal support member 646 preferably is supported at opposite ends by the left support member 606 and the right support member 608. In a preferred embodiment, the horizontal support member 646 is substantially orthogonal to both the left support member 606 and the right support member 608. The vertical support member 644 is coupled to the horizontal support member 646. In a preferred embodiment, the vertical support member 644 is substantially orthogonal to the horizontal support member 646. In a preferred embodiment, the vertical support member 644 is coupled to the mid-point of the horizontal support member 646. In a preferred embodiment, the vertical support member 644 is positioned along the axis 630. The length, width and thickness of the vertical support member 644 may range, for example, from about 100 to 2500 microns, 2 to 100 microns and 2 to 100 microns, respectively. In a preferred embodiment, the length, width and thickness of the vertical support member 644 range from about 800 to 1000 microns, 8 to 15 microns and 8 to 15 microns, respectively. The torsional spring constant of the vertical support member 644 may range, for example, from about $2\times10^{-9}$ to $10\times10^{-7}$ lbf-ft/radian. In a preferred embodiment, the torsional spring constant of the vertical support member 644 ranges from about $2\times10^{-8}$ to $10\times10^{-8}$ lbf-ft/radian. The length, width and thickness of the horizontal support member 646 may range, for example, from about 500 to 4500 microns, 6 to 100 microns and 6 to 100 microns, respectively. In a preferred embodiment, the length, width and thickness of the horizontal support member 646 range from about 2200 to 2500 microns, 15 to 25 microns and 15 to 25 microns, respectively.

The bottom T-shaped hinge 614 is coupled to the left support member 606, the right support member 608, and the bottom portion of the mirror collection plate 610. The bottom T-shaped hinge 612 preferably includes a vertical support member 648 and a horizontal support member 650. The horizontal support member 650 preferably is supported at opposite ends by the left support member 606 and the right support member 608. In a preferred embodiment, the horizontal support member 650 is substantially orthogonal to both the left support member 606 and the right support member 608. The vertical support member 648 is coupled to the horizontal support member 650. In a preferred embodiment, the vertical support member 648 is substantially orthogonal to the horizontal support member 650. In a preferred embodiment, the vertical support member 648 is coupled to the mid-point of the horizontal support member 650. In a preferred embodiment, the vertical support member 648 is positioned along the axis 630. The length, width and thickness of the vertical support member 648 may range, for example, from about 100 to 2500 microns, 2 to 100 micron and 2 to 100 microns, respectively. In a preferred embodiment, the length, width and thickness of the vertical support member 648 range from about 800 to 1000 microns, 8 to 15 microns and 8 to 15 microns, respectively. The torsional spring constant of the vertical support member 648 may range, for example, from about $2\times10^{-9}$ to $30\times10^{-7}$ lbf-ft/radian. In a preferred embodiment, the torsional spring constant of the vertical support member 648 ranges from about $2\times10^{-8}$ to $10\times10^{-8}$ lbf-ft/radian. The length, width and thickness of the horizontal support member 650 may range, for example, from about 1000 to 3000 microns, 6 to 50 microns and 6 to 50 microns, respectively. In a preferred embodiment, the length, width and thickness of the horizontal support member 650 range from about 2200 to 2500 microns, 15 to 25 microns and 15 to 25 microns, respectively. In a preferred embodiment, the dimensions of the top and bottom T-shaped hinges 612 and 614 are substantially identical.

Figure 6:
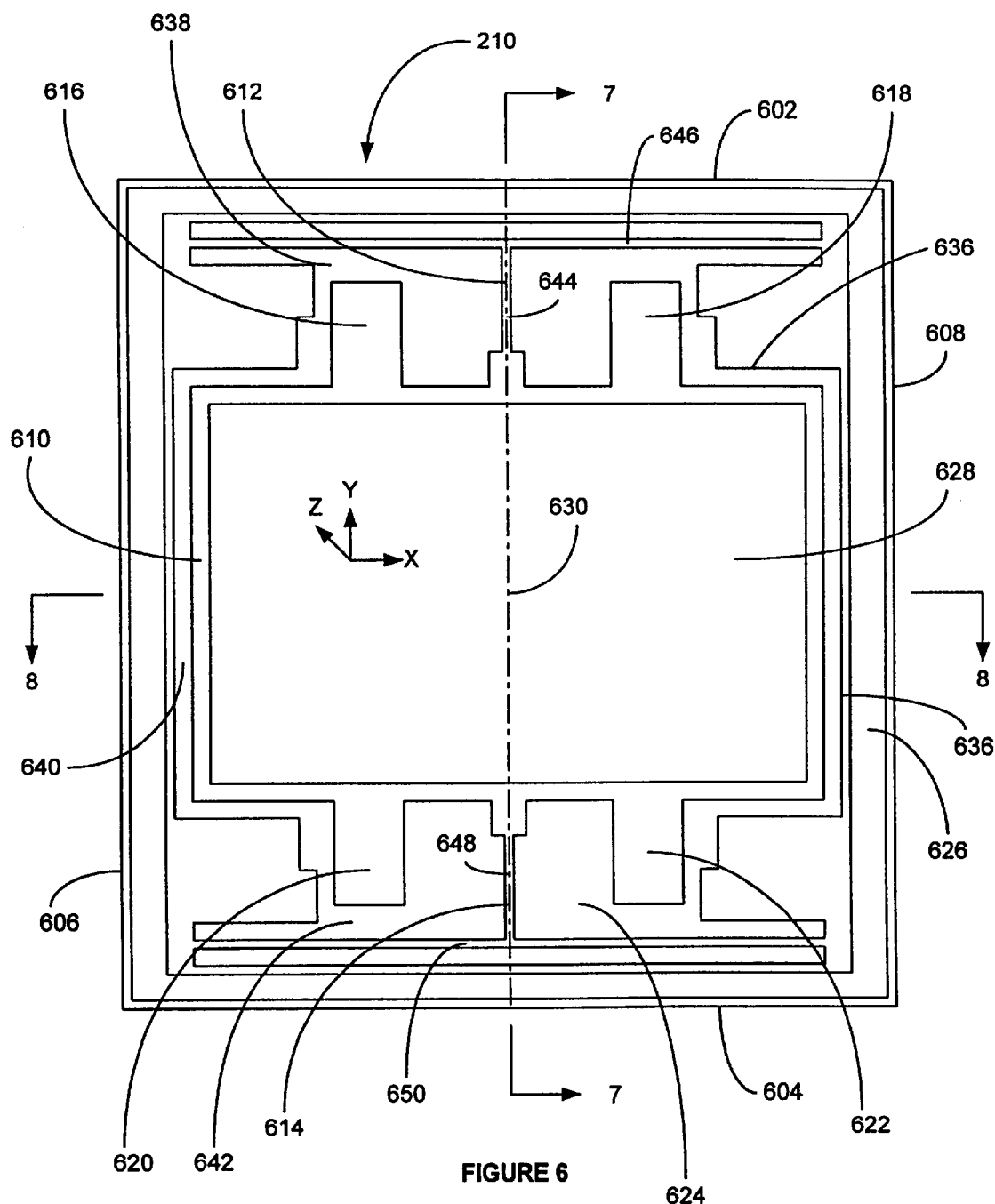
FIG. 6 is a top view of the mirror of the mirror assembly of FIG. 2.
Figure 6A:
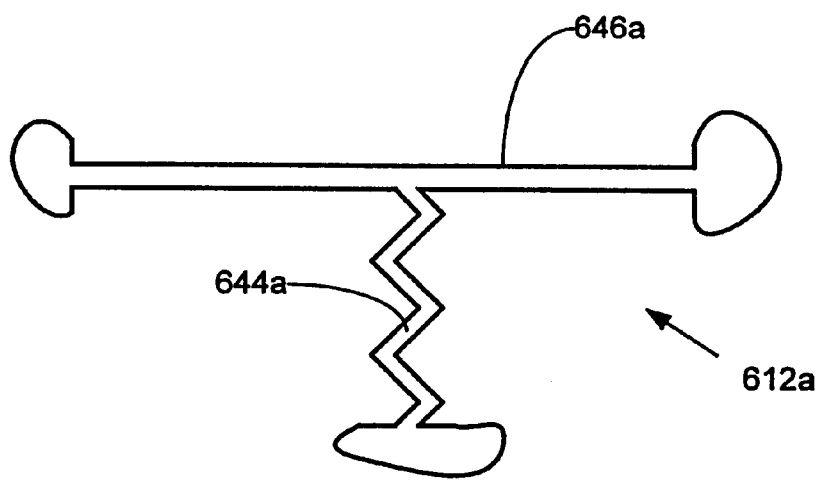
FIG. 6a is a top view of an alternative embodiment of the hinge of the mirror assembly of FIG. 2.

In an alternative embodiment, as illustrated in FIG. 6*a*, an alternative embodiment of a T-shaped hinge 612*a* includes a vertical support member 644*a* having a serpentine shape and a horizontal support member 646*a* having a substantially linear shape. In this manner, the frequency response characteristics of the T-shaped hinge 612*a* optimally provides enhanced sensitivity for sensing acceleration loading conditions.

Figure 6B:
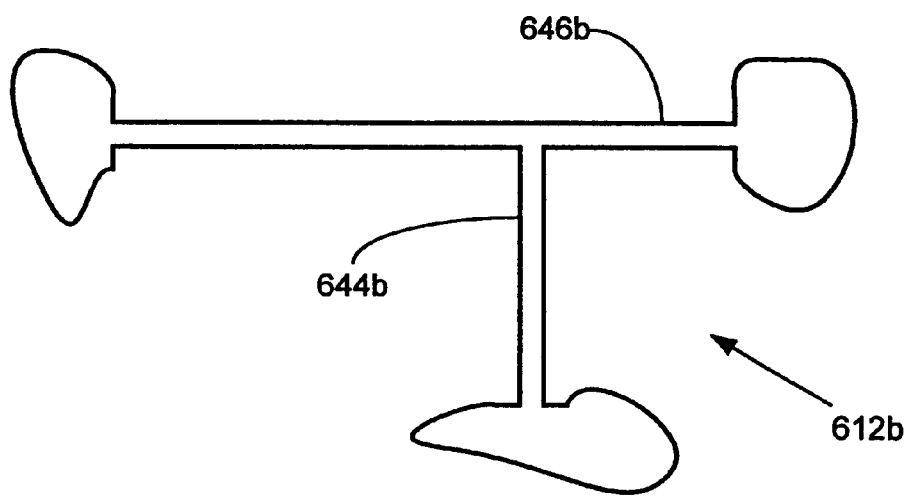
FIG. 6b is a top view of an alternative embodiment of the hinge of the mirror assembly of FIG. 2.

In an alternative embodiment, as illustrated in FIG. 6*b*, an alternative embodiment of a T-shaped hinge 612*b* includes a vertical support member 644*b* coupled to a horizontal support member 646*b* at location that is off-center. In this manner, the frequency response characteristics of the T-shaped hinge 612*b* optimally provides enhanced sensitivity for sensing acceleration loading conditions.

Figure 6C:
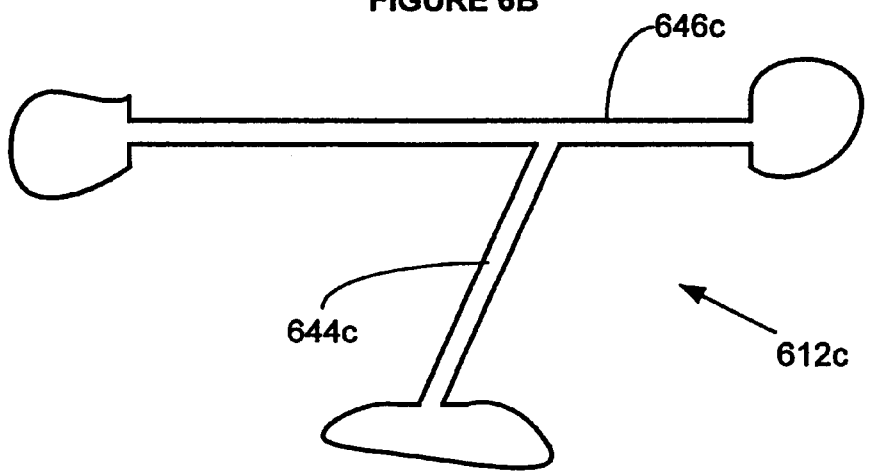
FIG. 6c is a top view of an alternative embodiment of the hinge of the mirror assembly of FIG. 2.

In an alternative embodiment, as illustrated in FIG. 6*c*, one or both of the T-shaped hinges 612 and 614 are modified to include an alternative embodiment of a T-shaped hinge 612*c* includes a vertical support member 644*c* that intersects a horizontal support member 646*c* at an acute angle and is also coupled to the horizontal support member 646*c* at location that is off-center. In this manner, the frequency response characteristics of the T-shaped hinge 612*c* optimally provides enhanced sensitivity for sensing acceleration loading conditions.

The top left travel stop 616 extends from and is coupled to the top left portion of the mirror collection plate 610. The top left travel stop 616 preferably limits the motion of the mirror collection plate 610 in the x-direction. The top left travel stop 616 preferably is positioned in the plane of the mirror collection plate 610. In a preferred embodiment, the top left travel stop 616 extends from the mirror collection plate 610 in a substantially orthogonal direction. The thickness of the top left travel stop 616 may range, for example, from about 200 to 600 microns. In a preferred embodiment, the thickness of the top left travel stop 616 ranges from about 250 to 350 microns in order to optimally provide shock protection, and a resilient compact structure having a low mass. The length of the top left travel stop 616 may range, for example, from about 500 to 2000 microns. In a preferred embodiment, the length of the top left travel stop 616 ranges from about 900 to 1100 microns. In a particularly preferred embodiment, the top surface of the top left travel stop 616 is planar with the top surface of the mirror collection plate 610. In a particularly preferred embodiment, the bottom surface of the top left travel stop 616 is planar with the bottom surface of the mirror collection plate 610.

The top right travel stop 618 extends from and is coupled to the top right portion of the mirror collection plate 610. The top right travel stop 618 preferably limits the motion of the mirror collection plate 610 in the x-direction. The top right travel stop 618 preferably is positioned in the plane of the mirror collection plate 610. In a preferred embodiment, the top right travel stop 618 extends from the mirror collection plate 610 in a substantially orthogonal direction. The thickness of the top right travel stop 618 may range, for example, from about 200 to 600 microns. In a preferred embodiment, the thickness of the top right travel stop 618 ranges from about 250 to 350 microns in order to optimally provide shock protection, and a resilient compact structure having a low mass. In a particularly preferred embodiment, the top surface of the top right travel stop 618 is planar with the top surface of the mirror collection plate 610. In a particularly preferred embodiment, the bottom surface of the top right travel stop 618 is planar with the bottom surface of the mirror collection plate 610. The length of the top right travel stop 618 may range, for example, from about 500 to 2000 microns. In a preferred embodiment, the length of the top right travel stop 618 ranges from about 900 to 1100 microns. In a preferred embodiment, the top left travel stop 616 and the top right travel stop 618 are positioned on opposite sides of the top T-shaped hinge 612. In a preferred embodiment, the top left travel stop 616 and the top right travel stop 618 are equidistantly positioned from and parallel to the axis 630. In a preferred embodiment, the dimensions of the left and right top travel stops, 616 and 618, are substantially identical.

The bottom left travel stop 620 extends from and is coupled to the bottom left portion of the mirror collection plate 610. The bottom left travel stop 620 preferably limits the motion of the mirror collection plate 610 in the x-direction. The bottom left travel stop 620 preferably is positioned in the plane of the mirror collection plate 610. In a preferred embodiment, the bottom left travel stop 620 extends from the mirror collection plate 610 in a substantially orthogonal direction. The thickness of the bottom left travel stop 620 may range, for example, from about 200 to 600 microns. In a preferred embodiment, the thickness of the bottom left travel stop 620 ranges from about 250 to 350 microns in order to optimally provide shock resistance, and a resilient compact structure having a low mass. In a particularly preferred embodiment, the top surface of the bottom left travel stop 620 is planar with the top surface of the mirror collection plate 610. In a particularly preferred embodiment, the bottom surface of the bottom left travel stop 620 is planar with the bottom surface of the mirror collection plate 610. The length of the bottom left travel stop 620 may range, for example, from about 500 to 2000 microns. In a preferred embodiment, the length of the bottom left travel stop 620 ranges from about –900 to 1100 microns.

The bottom right travel stop 622 extends from and is coupled to the bottom right portion of the mirror collection plate 610. The bottom right travel stop 622 preferably limits the motion of the mirror collection plate 610 in the x-direction. The bottom right travel stop 622 preferably is positioned in the plane of the mirror collection plate 610. In a preferred embodiment, the bottom right travel stop 622 extends from the mirror collection plate 610 in a substantially orthogonal direction. The thickness of the bottom right travel stop 622 may range, for example, from about 200 to 600 microns. In a preferred embodiment, the thickness of the bottom right travel stop 622 ranges from about 250 to 350 microns in order to optimally provide shock resistance, and a resilient compact structure having a low mass. In a particularly preferred embodiment, the top surface of the bottom right travel stop 622 is planar with the top surface of the mirror collection plate 610. In a particularly preferred embodiment, the bottom surface of the bottom right travel stop 622 is planar with the bottom surface of the mirror collection plate 610. The length of the bottom right travel stop 622 may range, for example, from about 500 to 2000 microns. In a preferred embodiment, the length of the bottom right travel stop 622 ranges from about 900 to 1100 microns. In a preferred embodiment, the bottom left travel stop 620 and the bottom right travel stop 622 are positioned on opposite sides of the bottom T-shaped hinge 614. In a preferred embodiment, the bottom left travel stop 620 and the bottom travel stop 622 are equidistantly positioned from and parallel to the axis 630. In a preferred embodiment, the dimensions of the left and right bottom travel stops, 620 and 622, are substantially identical. In a preferred embodiment, the dimensions of the travel stops, 616, 618, 620 and 622, are substantially identical.

The travel stops, 616, 618, 620 and 622, preferably provide overswing protection for the mirror collection plate 610 during operation. In this manner, the mirror collection plate 610 is protected from shocks during operation. The travel stops, 616, 618, 620 and 622, preferably provide shock protection for the mirror collection plate 610 during the manufacturing process. The travel stops, 616, 618, 620 and 622, preferably provide shock protection for the mirror collection plate 610 for X-axis shocks. In a preferred embodiment, the travel stops 616, 618, 620, and 622 are formed as integral parts of the mirror collection plate 610. In a preferred embodiment, the travel stops 616, 618, 620, and 622 provide effective beam lengths greater than about 500 microns and cross sections of about 40,000 microns$^2$ to 240,000 microns$^2$ in order to optimally absorb shock loads of about 2000 g/0.5 mS half sine wave input.

The opening 624 preferably permits the mirror collection plate 610 to rotate about the axis 630. The walls 636 of the opening 624 preferably limit movement of the mirror collection plate 610 in the x-direction and the y-direction. The opening 624 preferably includes a top section 638, a middle section 640, and a bottom section 642. The top section 638 of the opening 624 preferably contains the top T-shaped hinge 612 and the top left and right travel stops, 616 and 618. The middle section 640 of the opening 624 preferably contains the mirror collection plate 610. The bottom section 642 of the opening 624 preferably contains the bottom T-shaped hinge 614 and the bottom left and right travel stops, 620 and 622.

The walls of the middle section 640 of the opening 624 may be spaced apart from the opposing edges of the mirror collection plate 610 by a distance ranging, for example, from about 30 to 150 microns. In a preferred embodiment, the walls of the middle section 640 of the opening 624 are spaced apart from the opposing edges of the mirror collection plate 610 by a distance ranging from about 60 to 100 microns in order to optimally minimize movement of the mirror collection plate 610 in the x and y directions. In a preferred embodiment, the gap in the x-direction is different from the gap in the y-direction in order to optimally protect the mirror collection plate 610 from shocks. In a preferred embodiment, the gap between the mirror collection plate 610 and the middle section 640 of the opening 624 provides a spacing in the y-direction ranging from about 15 to 45 microns and a spacing in the x-direction ranging from about 50 to 180 microns in order to optimally limit shock loads on the mirror collection plate 610.

The conductive layer 626 is preferably coupled to the outer periphery of the top surface of the mirror 210. The conductive surface 626 preferably provides a conductive electrical path. The conductive layer 626 may be fabricated from any number of conventional commercially available materials such as, for example, gold, aluminum, or silver. In a preferred embodiment, the conductive layer 626 is fabricated from gold. In a preferred embodiment, the conductive layer 626 is bonded to the underlying substrate by an intermediate layer of titanium.

The mirror 210 may be fabricated from any number of conventional commercially available materials such as, for example, silicon, plated metal or plastic. In a preferred embodiment, the mirror 210 is fabricated by micro-machining a silicon wafer using any one, or combination, of the embodiments for micro-machining disclosed in the present disclosure.

In a preferred embodiment, the released and free-standing mirror collection plate 610 is preferably connected to the surrounding support frame, 602, 604, 606 and 608, region by the T-shaped hinges, 612 and 614. In a preferred embodiment, the travel stop fingers, 616, 618, 620 and 622, provide overswing protection for the mirror collection plate 610. In a preferred embodiment, a 200-micron deep anisotropic deep reactive ion etching (DRIE) process is used to form very precise, narrow gaps for X-axis shock protection and Y-axis shock protection, where the mirror collection plate 610 is preferably completely confined within the frame, 602, 604, 606 and 608, for X-axis and Y-axis translational motion. Persons having ordinary skill in the art and the benefit of the present disclosure will recognize that the term DRIE refers to deep reactive ion etching of a substrate. In a preferred implementation, the DRIE process is provided substantially as disclosed in U.S. Pat. Nos. 5,498,312 and 5,501,893, the disclosures of which are incorporated herein by reference. The T-shaped hinges, 612 and 614, preferably provide the collection plate 610 with optimal translational motion in X-axis and Y-axis directions, in which the mirror collection plate 610 is shock-stopped by the frame, 602, 604, 606 and 608, while also simultaneously maintaining low stress levels within the T-shaped hinges, 612 and 614, to avoid fracture. In a preferred embodiment, the T-shape hinges, 612 and 614, are relatively compliant in the X-axis and Y-axis directions, while they are sufficiently rigid for rotational motion about the axis 630 for establishing the resonant frequency of the mirror collection plate 610.

As illustrated in FIGS. 7–9, the mirror 210 preferably includes portions, 602, 604, 606 and 608, that are full-wafer thickness (e.g., 400 microns), and portions, 610, that are half-wafer thickness (e.g., 200 microns). The cavity 720 in the center of the mirror collection plate 610 is preferably etched 150-microns down from the bottom surface 634 of the mirror collection plate 610, and the T-shape hinges, 612 and 614, are preferably about 8–15 microns thick. The half-thickness mirror collection plate 610 reduces the amount of deep reactive ion etching (DRIE) and also improves the position accuracy of the mirror collection plate 610. The cavity 720, preferably etched in the center of the mirror collection plate 610, is preferably primarily used to improve the position accuracy of the mirror collection plate 610 and reduce the mass of the mirror collection plate 610 without substantially altering the resonant frequency.

The backside of the mirror collection plate 610 preferably includes the Z travel-stops, 710 and 715, that preferably are full-wafer thickriess (e.g., 400-microns). Since the mirror collection plate 610, is preferably 200-icrons thick, the thicker travel-stops, 710 and 715, optimally maintain the 50-micron gap with the travel-stop fingers, 1010 and 1020, of the bottom cap 215 and, therefore, help provide shock protection in the Z-direction.

In an exemplary embodiment, a mirror collection plate 610 having minimum x-y plane dimensions of about 3-mm×3-mm is preferred.

Figure 6D:
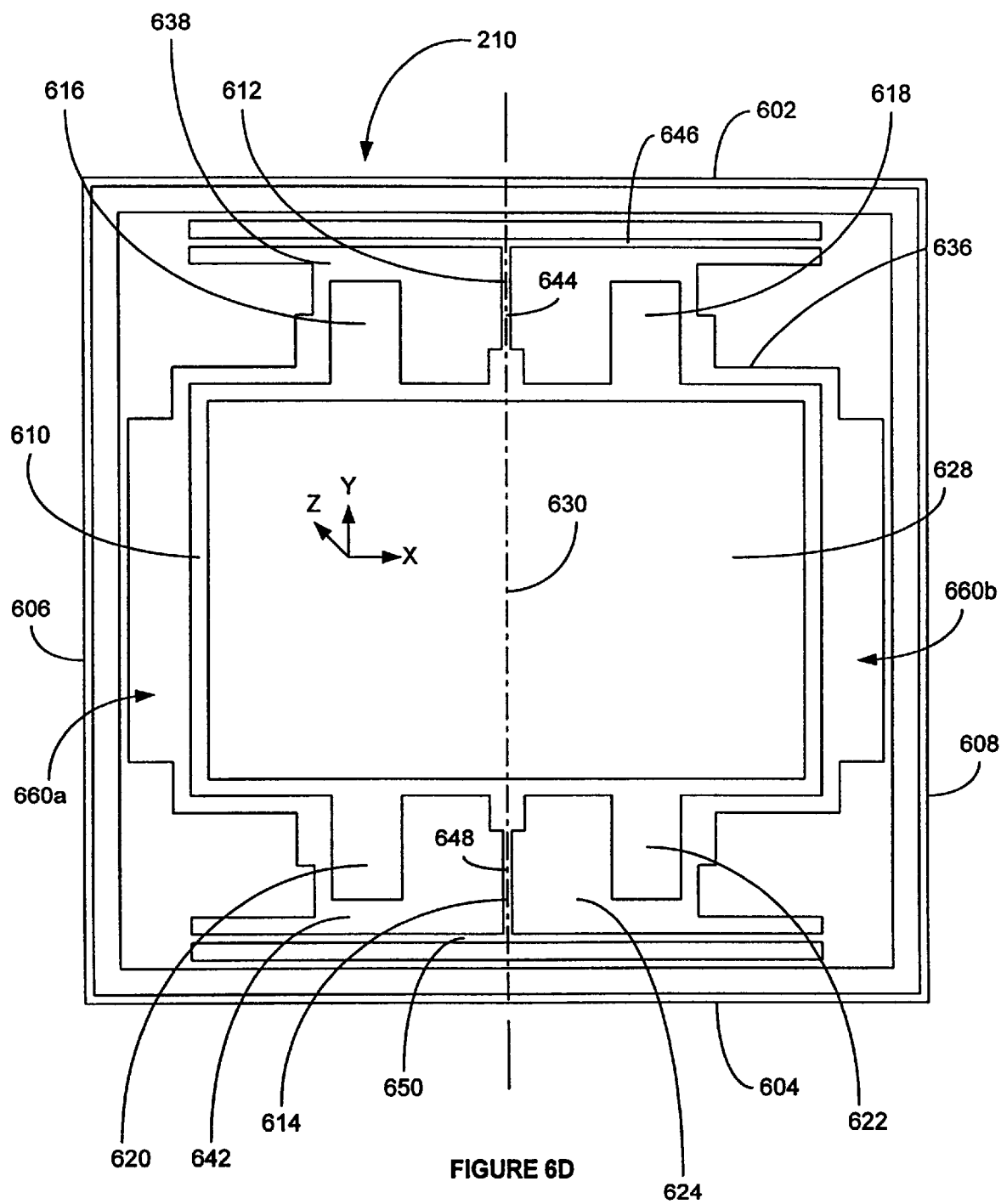
FIG. 6d is a top view of an alternative embodiment of the mirror of the mirror assembly of FIG. 2.

In an alternative embodiment, as illustrated in FIG. 6d, the left and right support members, 606 and 608, of the mirror 210 further include cut-outs, 660a and 660b, positioned on opposite sides of the mirror collection plate 610. In this manner, the amount of viscous damping due to the resistance to the passage of air between the mirror collection plate 610 and the left and right support members, 606 and 608, is reduced. In this manner, the frequency response characteristics of the mirror 210 are enhanced.

Figure 10:
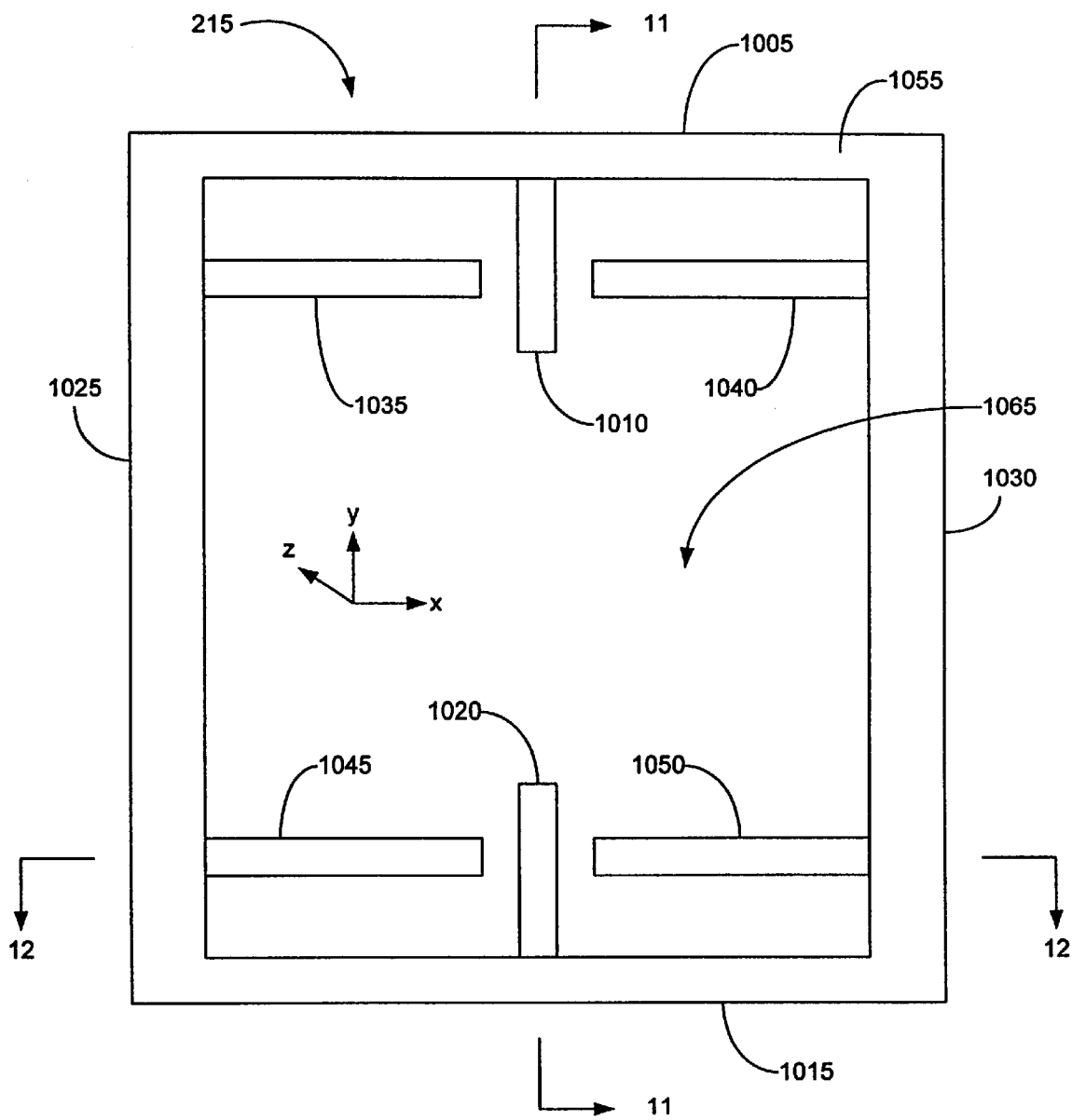
FIG. 10 is a top view of the bottom cap of the mirror assembly of FIG. 2.
Figure 11:
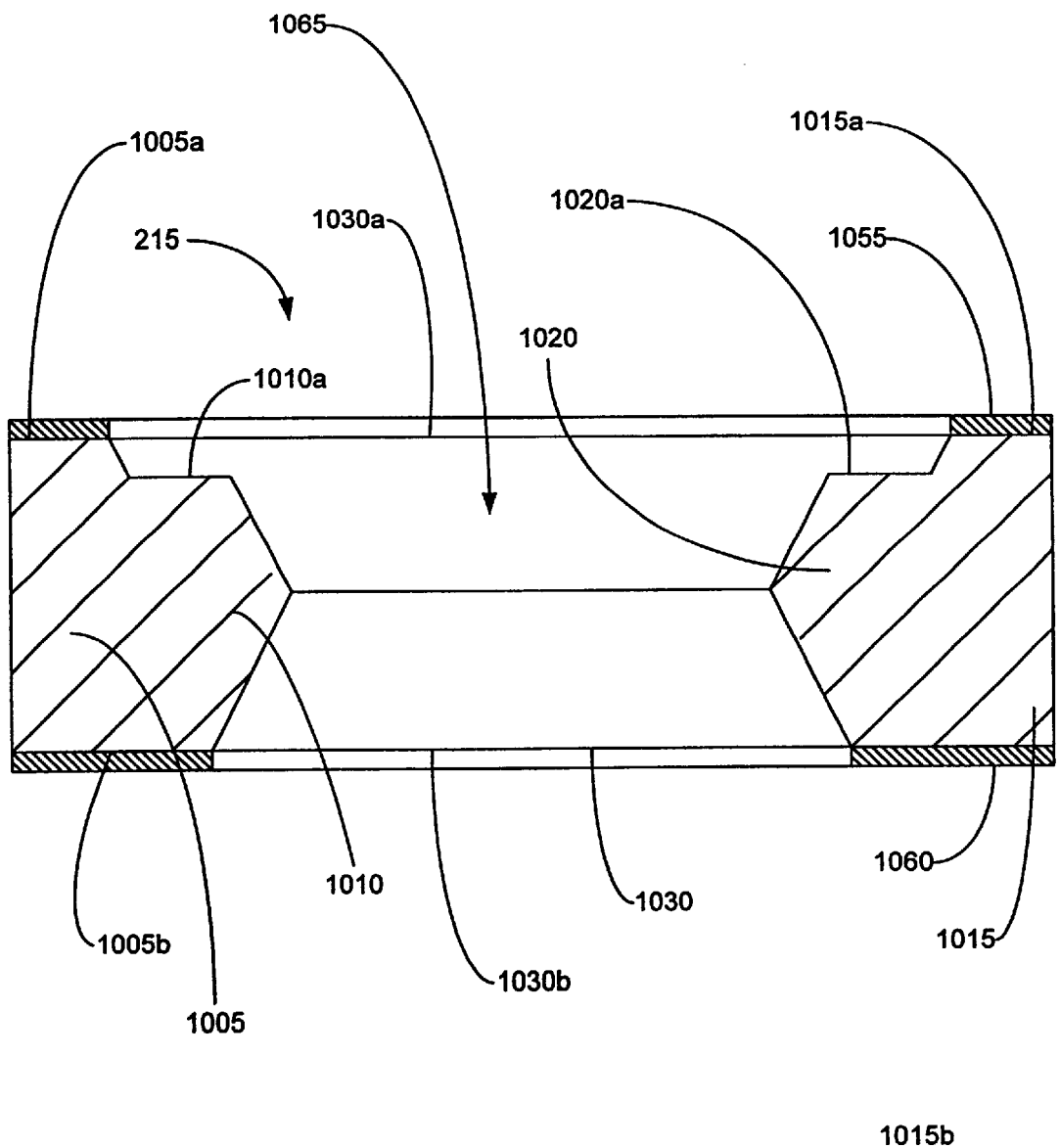
FIG. 11 is a cross-sectional view of the bottom cap of FIG. 10.
Figure 12:
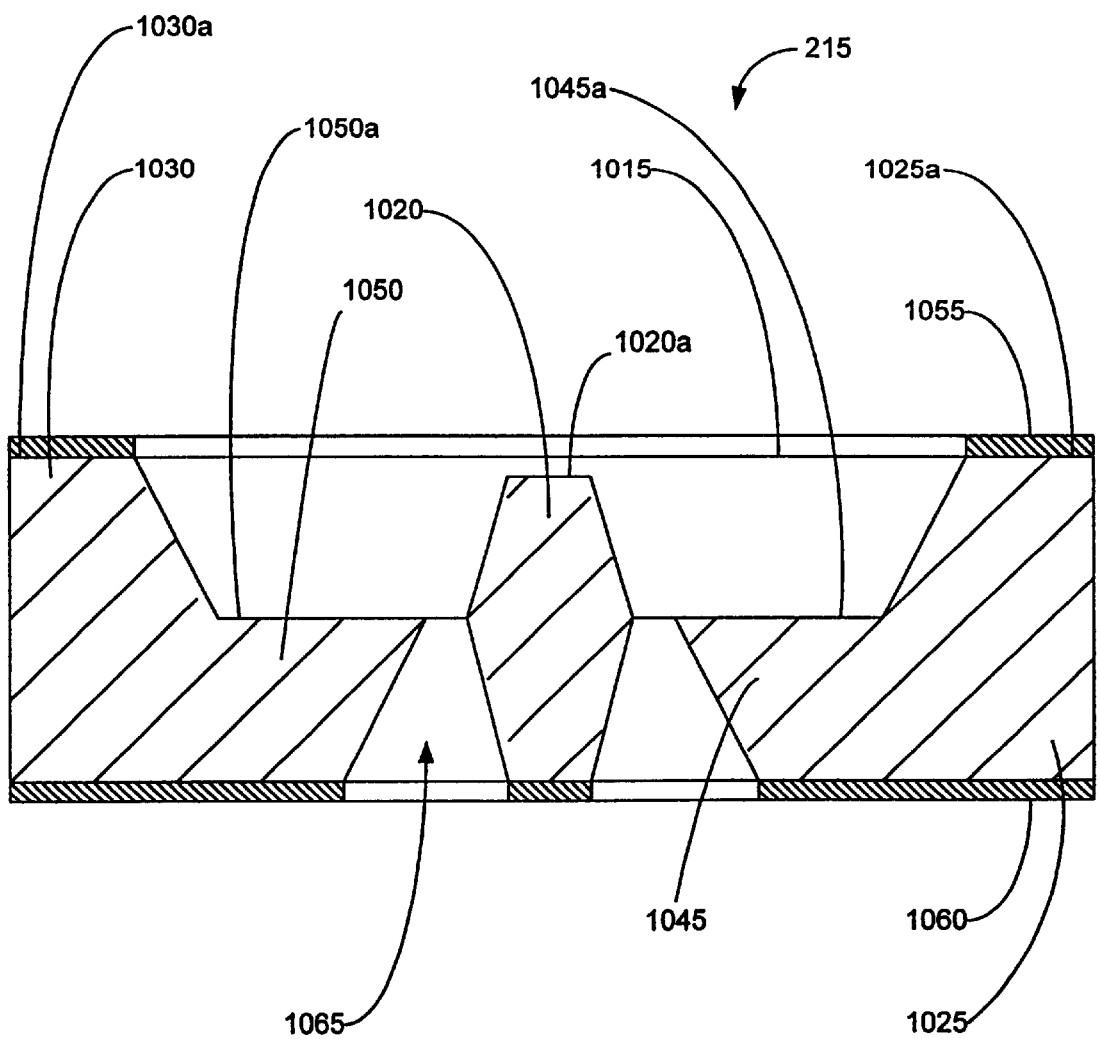
FIG. 12 is a cross-sectional view of the bottom cap of FIG. 10.

As illustrated in FIGS. 10–12, in a preferred embodiment, the bottom cap 215 includes a top support member 1005, a top travel stop member 1010, a bottom support member 1015, a bottom travel stop member 1020, a left support member 1025, a right support member 1030, an upper left beam 1035, an upper right beam 1040, a lower left beam 1045, a lower right beam 1050, a top conductive surface 1055, a bottom conductive surface 1060, and an opening 1065.

The top support member 1005 is coupled to the top travel stop member 1010, the left support member 1025, the right support member 1030, the top conductive surface 1055, and the bottom conductive surface 1060. The top travel stop member 1010 is coupled to the top support member 1005. The bottom support member 1015 is coupled to the bottom travel stop member 1020, the left support member 1025, the right support member 1030, the top conductive surface 1055, and the bottom conductive surface 1060. The bottom travel stop member 1020 is coupled the bottom support member 1015. The upper left beam 1035 is coupled to the left support member 1025. The upper right beam 1040 is coupled to the right support member 1030. The lower left beam 1045 is coupled to the left support member 1025. The lower right beam 1050 is coupled to the right support member 1030. The top conductive surface 1055 is coupled to the top, bottom, left and right support members, 1005, 1015, 1025 and 1030. The bottom conductive surface 1060 is coupled to the top, bottom, left and right support members, 1005, 1015, 1025 and 1030.

The top, bottom, left and right support members, 1005, 1015, 1025 and 1030, together provide the overall support structure for the bottom cap 215. The thickness of the top, bottom, left and right support members, 1005, 1015, 1025 and 1030, may range, for example, from about 400 to 600 microns. In a preferred embodiment, the thickness of the top, bottom, left and right support members, 1005, 1015, 1025 and 1030, ranges from about 400 to 450 microns in order to provide a compact structure having a low mass.

The top travel stop member 1010 preferably limits the motion of the reflective portion of the mirror 210 in the z-direction. The top travel stop member 1010 preferably extends is a substantially orthogonal direction from the top support member 1005. In a preferred embodiment, the top travel stop member 1010 is positioned within the plane of the top support member 1005. The thickness of the top travel stop member 1010 may range, for example, from about 350 to 550 microns. In a preferred embodiment, the thickness of the top travel stop 1010 ranges from about 350 to 380 microns in order to provide a compact structure having a low mask. In a particularly preferred embodiment, the top surface 1010a of the top travel stop member 1010 is recessed below the level of the top surface 1005a of the top support member 1005. In this manner, the top surface 1010a of the top travel stop 1010 is preferably positioned below the level of the mirror collection plate 610 of the mirror 210. The length of the top travel stop member 1010 may range, for example, from about 1200 to 2800 microns. In a preferred embodiment, the length of the top travel stop member 1010 ranges from about 2000 to 2500 microns. In a particularly preferred embodiment, the length of the top travel stop member 1010 is selected to overlap with the mirror collection plate 610 of the mirror by about 300 microns.

The bottom travel stop member 1020 preferably limits the motion of the reflective portion of the mirror 210 in the z-direction. The bottom travel stop member 1020 preferably extends is a substantially orthogonal direction from the bottom support member 1015. In a preferred embodiment, the bottom travel stop member 1020 is positioned within the plane of the bottom support member 1015. The thickness of the bottom travel stop member 1020 may range, for example, from about 350 to 550 microns. In a preferred embodiment, the thickness of the bottom travel stop member 1020 ranges from about 350 to 380 microns in order to provide a compact structure having a low mass. In a particularly preferred embodiment, the top surface 1020a of the bottom travel stop 1020 is recessed below the level of the top surface 1015a of the bottom support member 1015. In this manner, the top surface 1020a of the bottom travel stop member 1020 is preferably positioned below the level of the mirror collection plate 610 of the mirror 210. The length of the bottom travel stop member 1020 may range, for example, from about 1200 to 2800 microns. In a preferred embodiment, the length of the bottom travel stop member 1020 ranges from about 2000 to 2500 microns. In a particularly preferred embodiment, the length of the bottom travel stop member 1020 is selected to overlap with the mirror collection plate 610 of the mirror by about 300 microns.

The upper left beam 1035 preferably provides support and limits the motion of the mirror collection plate 610 of the mirror 210 in the z-direction during the manufacturing process. In this manner, defective mirrors 210 are protected from shock, catastrophic failure and from falling into the process equipment during the manufacturing process. The upper left beam 1035 preferably extends is a substantially orthogonal direction from the left support member 1025. In a preferred embodiment, the upper left beam 1035 is positioned within the plane of the left support member 1025. The thickness of the upper left beam 1035 may range, for example, from about 150 to 250 microns. In a preferred embodiment, the thickness of the upper left beam 1035 ranges from about 200 to 220 microns in order to optimally provide a compact structure having a low mass. In a particularly preferred embodiment, the top surface of the upper left beam 1035 is recessed below the level of the top surface 1025a of the left support member 1025. In this manner, the top surface of the upper left beam 1035 is preferably positioned below the level of the top left travel stop member 616 of the mirror 210. The length of the upper left beam 1035 may range, for example, from about 1500 to 2200 microns. In a preferred embodiment, the length of the upper left beam 1035 is about 1800 microns.

The upper right beam 1040 preferably provides support and limits the motion of the mirror collection plate 610 of the mirror 210 in the z-direction during the manufacturing process. In this manner, defective mirrors 210 are protected from shock, catastrophic failure, and from falling into process equipment during the manufacturing process. The upper right beam 1040 preferably extends is a substantially orthogonal direction from the right support member 1030. In a preferred embodiment, the upper right beam 1040 is positioned within the plane of the right support member 1030. The thickness of the upper right beam 1040 may range, for example, from about 150 to 250 microns. In a preferred embodiment, the thickness of the upper right beam 1040 ranges from about 200 to 220 microns in order to provide a compact structure having a low mass. In a particularly preferred embodiment, the top surface of the upper right beam 1040 is recessed below the level of the top surface 1030a of the right support member 1030. In this manner, the top surface of the upper right beam 1040 is preferably positioned below the level of the top right travel stop member 618 of the mirror 210. The length of the upper right beam 1040 may range, for example, from about 1500 to 2200 microns. In a preferred embodiment, the length of the upper right beam 1040 is about 1800 microns.

The lower left beam 1045 preferably provides support and limits the motion of the mirror collection plate 610 of the mirror 210 in the z-direction during the manufacturing process. In this manner, defective mirrors 210 are protected from shock, catastrophic failure, and from falling into process equipment during the manufacturing process. The lower left beam 1045 preferably extends is a substantially orthogonal direction from the left support member 1025. In a preferred embodiment, the lower left beam 1045 is positioned within the plane of the left support member 1025. The thickness of the lower left beam 1045 may range, for example, from about 150 to 250 microns. In a preferred embodiment, the thickness of the lower left beam 1045 ranges from about 200 to 220 microns in order to provide a compact structure having a low mass. In a particularly preferred embodiment, the top surface 1045a of the upper left beam 1045 is recessed below the level of the top surface 1025a of the left support member 1025. In this manner, the top surface 1045a of the lower left beam 1045 is preferably positioned below the level of the bottom left travel stop member 620 of the mirror 210. The length of the lower left beam 1045 may range, for example, from about 1500 to 2200 microns. In a preferred embodiment, the length of the lower left beam 1045 is about 1800 microns.

The lower right beam 1050 preferably provides support and limits the motion of the mirror collection plate 610 of the mirror 210 in the z-direction during the manufacturing process. In this manner, defective mirrors 210 are protected from shock, catastrophic failure, and from falling into process equipment during the manufacturing process. The lower right beam 1050 preferably extends is a substantially orthogonal direction from the right support member 1030. In a preferred embodiment, the lower right beam 1050 is positioned within the plane of the right support member 1030. The thickness of the lower right beam 1050 may range, for example, from about 150 to 250 microns. In a preferred embodiment, the thickness of the lower right beam 1050 ranges from about 200 to 220 microns in order to provide a compact structure having a low mass. In a particularly preferred embodiment, the top surface 1050a of the lower right beam 1050 is recessed below the level of the top surfaces 1030a of the right support member 1030. In this manner, the top surface 1050a of the lower right beam 1050 is preferably positioned below the level of the bottom right travel stop member 622 of the mirror 210. The length of the lower right beam 1050 may range, for example, from about 1500 to 2200 microns. In a preferred embodiment, the length of the lower right beam 1050 is about 1800 microns.

The top conductive surface 1055 is preferably coupled to the outer periphery of the top surface of the bottom cap 215.

The top conductive surface 1055 preferably provides a conductive electrical path. The top conductive surface 1055 further preferably provides a bonding ring for subsequent compression bonding of the bottom cap 215 to the mirror 210. The top conductive surface 1055 may be fabricated from any number of conventional commercially available materials such as, for example, gold, aluminum, or silver. In a preferred embodiment, the top conductive surface 1055 is fabricated from gold. In a preferred embodiment, the top conductive surface 1055 is bonded to the bottom cap 215 using an intermediate layer of titanium.

The bottom conductive surface 1060 is preferably coupled to the outer periphery of the bottom surface of the bottom cap 215. The bottom conductive surface 1060 preferably provides a conductive electrical path. The bottom conductive surface 1060 further preferably provides a bonding ring for subsequent compression bonding of the bottom cap 215 to the base 220. The bottom conductive surface 1060 may be fabricated from any number of conventional commercially available materials such as, for example, gold, aluminum, or silver. In a preferred embodiment, the bottom conductive surface 1060 is fabricated from gold. In a preferred embodiment, the bottom conductive surface 1060 is bonded to the bottom cap 215 using an intermediate layer of titanium.

In a preferred embodiment, the conductive surfaces 1055 and 1060 conformally coat all of the exposed surfaces of the bottom cap 215.

The opening 1065 preferably permits the drive pad electrodes, 1310 and 1315, of the base member 220 to electrostatically drive and capacitatively sense the position of the mirror collection plate 610 of the mirror 210. The opening 1065 preferably comprises a substantially rectangular opening of greater size than the mirror collection plate 610 of the mirror 210.

The bottom cap 215 may be fabricated from any number of conventional commercially available materials such as, for example, silicon, glass or plastic. In a preferred embodiment, the bottom cap 215 is fabricated by micro-machining a silicon wafer using any one, or combination, of the embodiments for micro-machining disclosed in the present disclosure.

Figure 13:
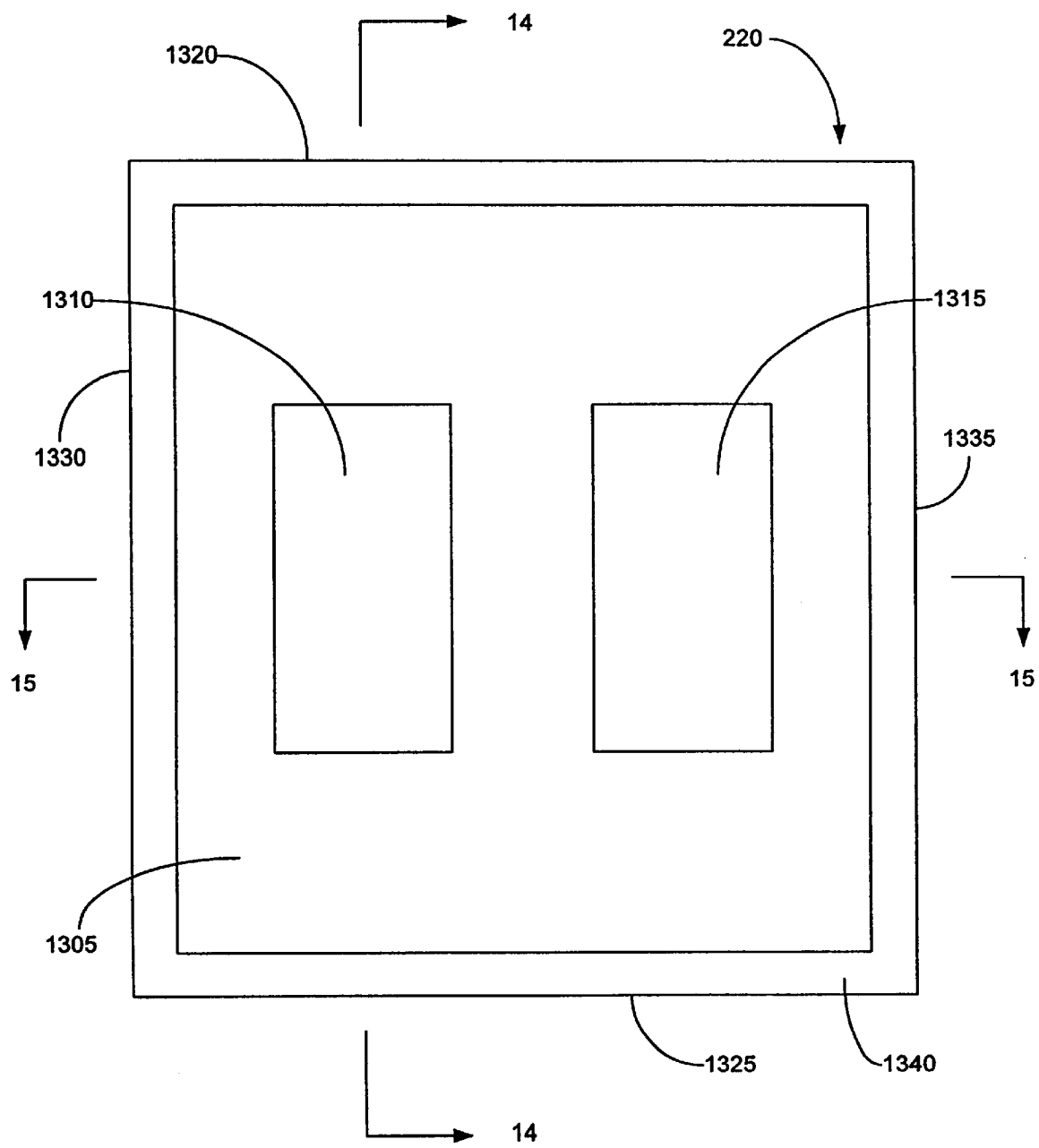
FIG. 13 is a top view of the base member of the mirror assembly of FIG. 2.
Figure 14:
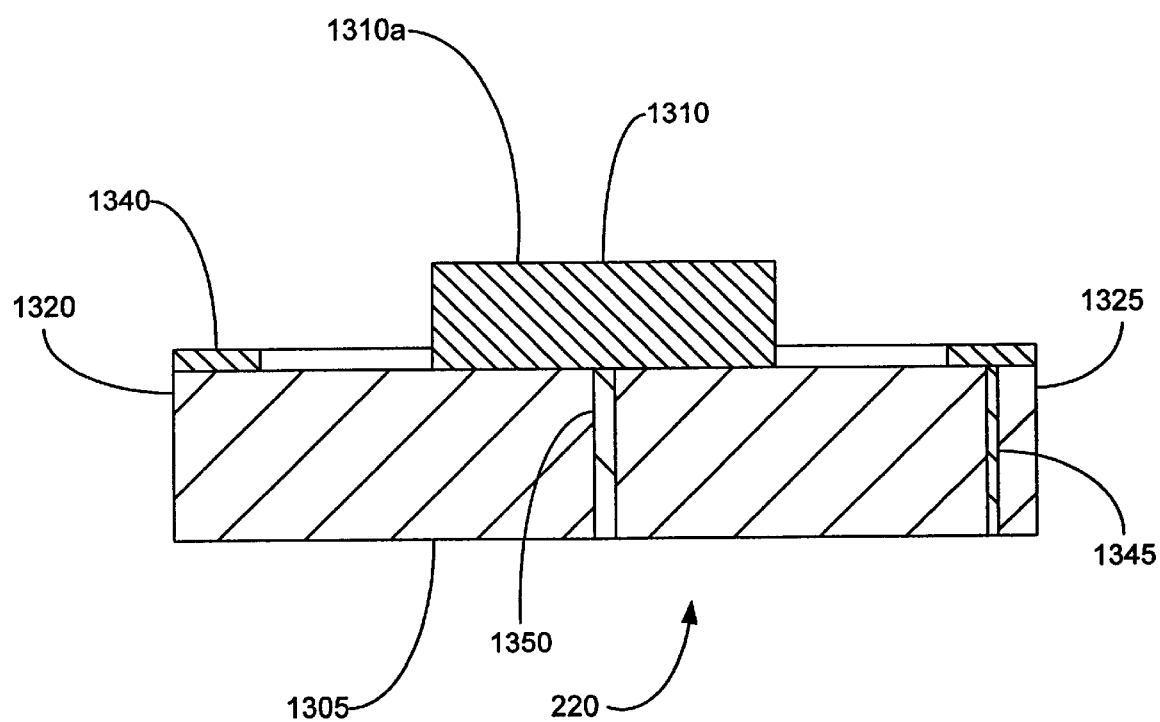
FIG. 14 is a cross-sectional view of the base member of FIG. 13.
Figure 15:
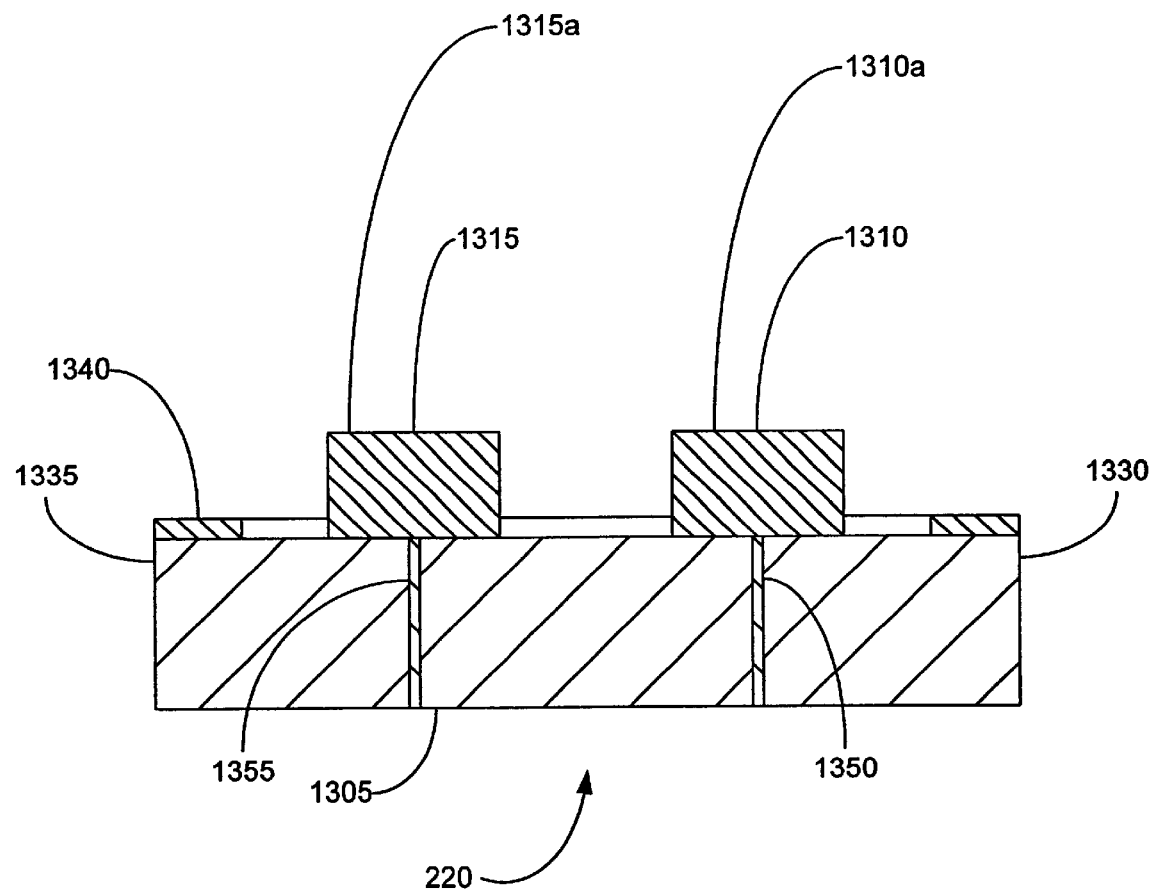
FIG. 15 is a cross-sectional view of the base member of FIG. 13.

As illustrated in FIGS. 13–15, in a preferred embodiment, the base member 220 includes a bottom plate 1305, a left drive pad electrode 1310, a right drive pad electrode 1315, a top support member 1320, a bottom support member 1325, a left support member 1330, a right support member 1335, a conductive layer 1340, and conductive paths 1345, 1350 and 1355.

The bottom plate 1305 is coupled to the left drive pad electrode 1310, the right drive pad electrode 1315, the top support member 1320, the bottom support member 1325, the left support member 1330, and the right support member 1335. The top support member 1320 is coupled to the bottom plate 1305, the left support member 1330, the right support member 1335, and the conductive layer 1340. The bottom support member 1325 is coupled to the bottom plate 1305, the left support member 1330, the right support member 1335, and the conductive layer 1340. The left support member 1330 is coupled to the bottom plate 1305, the top support member 1320, the bottom support member 1325, and the conductive layer 1340. The right support member 1335 is coupled to the bottom plate 1305, the top support member 1320, the bottom support member 1325, and the conductive layer 1340.

The bottom plate 1305, and the top, bottom, left and right support members, 1320, 1325, 1330, and 1335, preferably together provide structural support for the base member 220. The base member 220 preferably supports the bottom cap 215, mirror 210 and the top cap 205.

The bottom plate 1305 preferably comprises a solid member fabricated from any number of conventional commercially available materials such as, for example, ceramic, silicon or glass. In a preferred embodiment, the thickness of the bottom plate 1305 ranges from about 200 to 400 microns.

The left drive pad electrode 1310 is coupled to the bottom plate 1305. The left drive pad electrode 1310 preferably permits the mirror collection plate 610 of the mirror 210 to be driven using electrostatic force and/or the position of the mirror collection plate 610 of the mirror 210 to be capacitively sensed. In this manner, the mirror collection plate 610 of the mirror 210 oscillates about the axis 630. In a preferred embodiment, the left drive pad electrode 1310 includes a conductive layer 1310$a$ that is coupled to the conductive path 1350. In this manner, an electrical connection can be provided to the conductive layer 1310$a$. The conductive layer 1310$a$ may be fabricated from any number of conventional commercially available materials such as, for example, metal, polysilicon or conductive epoxy. In a preferred embodiment, the conductive layer 1310$a$ is fabricated from metal.

The left drive pad electrode 1310 may have a top surface area ranging, for example, from about $3 \times 10^6$ to $10 \times 10^6$ microns.$^2$ In a preferred embodiment, the top surface area of the left drive pad electrode 1310 is about $4.5 \times 10^6$ microns$^2$ in order to optimally drive the mirror collection plate 610 of the mirror 210. The left drive pad electrode 1310 preferably extends from the bottom plate 1305 in a substantially orthogonal direction. The left drive pad electrode 1310 may extend from the bottom plate 1305 for a distance ranging, for example, from about 50 to 200 microns. In a preferred embodiment, the left drive pad electrode 1310 extends from the bottom plate 1305 for a distance ranging from about 50 to 100 microns. In a particularly preferred embodiment, gap between the top of the left drive pad electrode 1310 and the bottom of the mirror collection plate 610 of the mirror 210 ranges from about 300 to 400 microns.

The right drive pad electrode 1315 is coupled to the bottom plate 1305. The right drive pad electrode 1310 preferably permits the mirror collection plate 610 of the mirror 210 to be driven using electrostatic force and/or the position of the mirror collection plate 610 of the mirror 210 to be capacitively sensed. In this manner, the mirror collection plate 610 of the mirror 210 oscillates about the axis 630. In a preferred embodiment, the right drive pad electrode 1315 includes a conductive layer 1315$a$ that is coupled to the conductive path 1355. In this manner, an electrical connection can be provided to the conductive layer 1315$a$. The conductive layer 1315$a$ may be fabricated from any number of conventional commercially available materials such as, for example, metal, polysilicon or conductive epoxy. In a preferred embodiment, the conductive layer 1315$a$ is fabricated from metal.

The right drive pad electrode 1315 may have a top surface area ranging, for example, from about $3 \times 10^6$ to $10 \times 10^6$ microns.$^2$ In a preferred embodiment, the top surface area of the right drive pad electrode 1315 is about $4.5 \times 10^6$ microns$^2$ in order to optimally drive the mirror collection plate 610 of the mirror 210. The right drive pad electrode 1315 preferably extends from the bottom plate 1305 in a substantially orthogonal direction. The right drive pad electrode 1315 may extend from the bottom plate 1305 for a distance ranging, for example, from about 50 to 200 microns. In a preferred embodiment, the right drive pad electrode 1315 extends from the bottom plate 1305 for a distance ranging from about 50 to 100 microns. In a particularly preferred embodiment, gap between the top of the right drive pad electrode 1315 and the bottom of the mirror collection plate 610 of the mirror 210 ranges from about 300 to 400 microns.

In a preferred embodiment, the left and right drive pad electrodes, 1310 and 1315, are positioned substantially equidistant from the axis 630.

The top support member 1320 is coupled to the bottom plate 1305, the left support member 1330, the right support member 1335 and the conductive layer 1340. The top support member 1320 may have a length, width and height ranging, for example, from about 4000 to 6000 microns, 400 to 600 microns, and 400 to 600 microns. In a preferred embodiment, the top support member 1320 length, width and height are about 4900 microns, 375 microns, and 400 microns.

The bottom support member 1325 is coupled to the bottom plate 1305, the left support member 1330, the right support member 1335 and the conductive layer 1340. The bottom support member 1325 may have a length, width and height ranging, for example, from about 4000 to 6000 microns, 400 to 600 microns, and 400 to 600 microns. In a preferred embodiment, the bottom support member 1325 length, width and height are about 4900 microns, 375 microns, and 400 microns.

The left support member 1330 is coupled to the bottom plate 1305, the top support member 1320, the bottom support member 1325 and the conductive layer 1340. The left support member 1330 may have a length, width and height ranging, for example, from about 6000 to 4000 microns, 400 to 600 microns, and 400 to 600 microns. In a preferred embodiment, the left support member 1330 length, width and height are about 6800 microns, 375 microns, and 400 microns.

The right support member 1335 is coupled to the bottom plate 1305, the top support member 1320, the bottom support member 1325 and the conductive layer 1340. The right support member 1335 may have a length, width and height ranging, for example, from about 6000 to 9000 microns, 400 to 600 microns, and 400 to 600 microns. In a preferred embodiment, the right support member 1335 length, width and height are about 6800 microns, 375 microns, and 400 microns.

In a preferred embodiment, the bottom plate 1305, the top support member 1320, the bottom support member 1325, the left support member 1330, and the right support member 1335 are integrally formed.

The conductive layer 1340 preferably extends around the periphery of the top surface of the base member 220. The conductive layer 1340 preferably provides a conductive electric path for use in actuating the mirror collection plate 610 of the mirror 210. The conductive layer 220 may be fabricated from any number of conventional commercially available materials such as, for example, metal, polysilicon or conductive epoxy. In a preferred embodiment, the conductive layer 1340 is fabricated from gold. The conductive layer 1340 may be coupled to the conductive path 1345 using conventional methods.

The base member 220 may be fabricated from any number of conventional commercially available materials such as, for example, ceramic, silicon or glass using any number of conventional fabrication processes. In a preferred embodiment, the base member 220 is fabricated by micro-machining and/or thick film printing a ceramic substrate using any one, or combination, of the embodiments for micro-machining disclosed in the present disclosure.

The base 220 preferably provides electrode access to the mirror collection plate 610 for electrostatic actuation and capacitive position sensing using drive pad electrodes, 1310 and 1315. The design and operation of the electrostatic actuation and capacitative position sensing is preferably provided in accordance with the teachings described in U.S. Pat. No. 5,852,242, issued on Dec. 22, 1998, the disclosure of which is incorporated herein by reference.

The metal ring 1340 around the perimeter of the base member 220, in combination with conductive-epoxy bonding of the base member 220 to the bottom cap 215, preferably provides electrical contact between the base member 220 and the bottom cap 215. In a preferred embodiment, the wafer bonding process preferably allows the bottom cap 215 to be in direct electrical contact with the mirror collection plate 610. Consequently, the mirror collection plate 610 preferably can be electrically accessed, controlled, and monitored using the base member 220. The electrode drive pad and mirror contact metallization, 1310a, 1315a, and 1340, on the base member 220 are preferably connected to electrical contact pads on the backside of the base member 220, utilizing conventional thick-film through-hole via technology, which effectively makes the mirror assembly 110 a surface-mount component.

Figure 16:
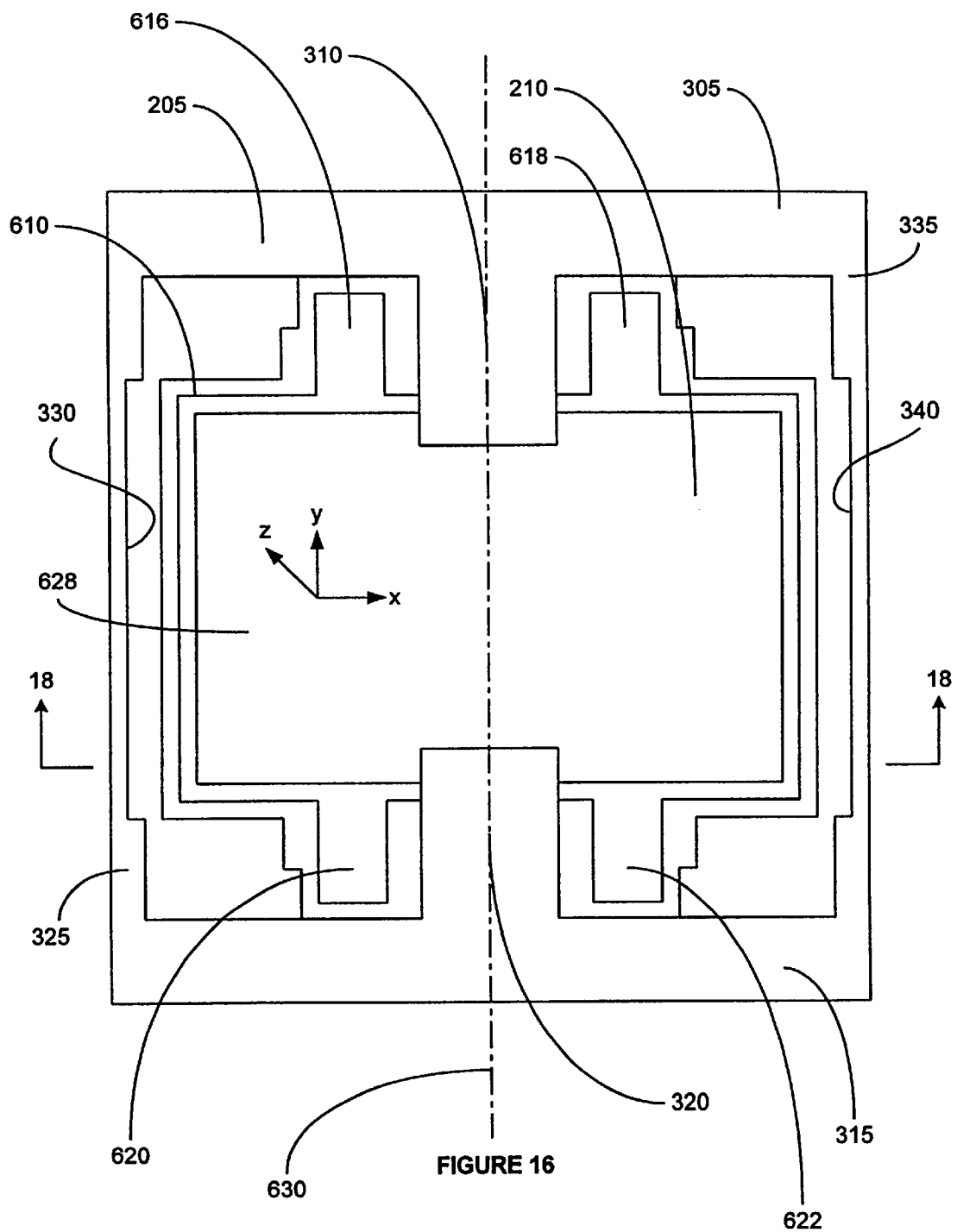
FIG. 16 is a top view of the top cap and mirror of the mirror assembly of FIG. 2.

Referring now to FIG. 16, a sub-assembly including the top cap 205 and the mirror 210 is illustrated. As illustrated in FIG. 16, the travel stops, 310 and 320, of the top cap 205 protect the mirror collection plate 610 from z-axis shock while also minimizing the shadowing/overlapping of the reflective surface 628 of the mirror collection plate 610. Furthermore, the side rim cut-outs, 330 and 340, of the top cap 205 maximize the optical path to the reflective surface 628 of the mirror collection plate 610.

Figure 17:
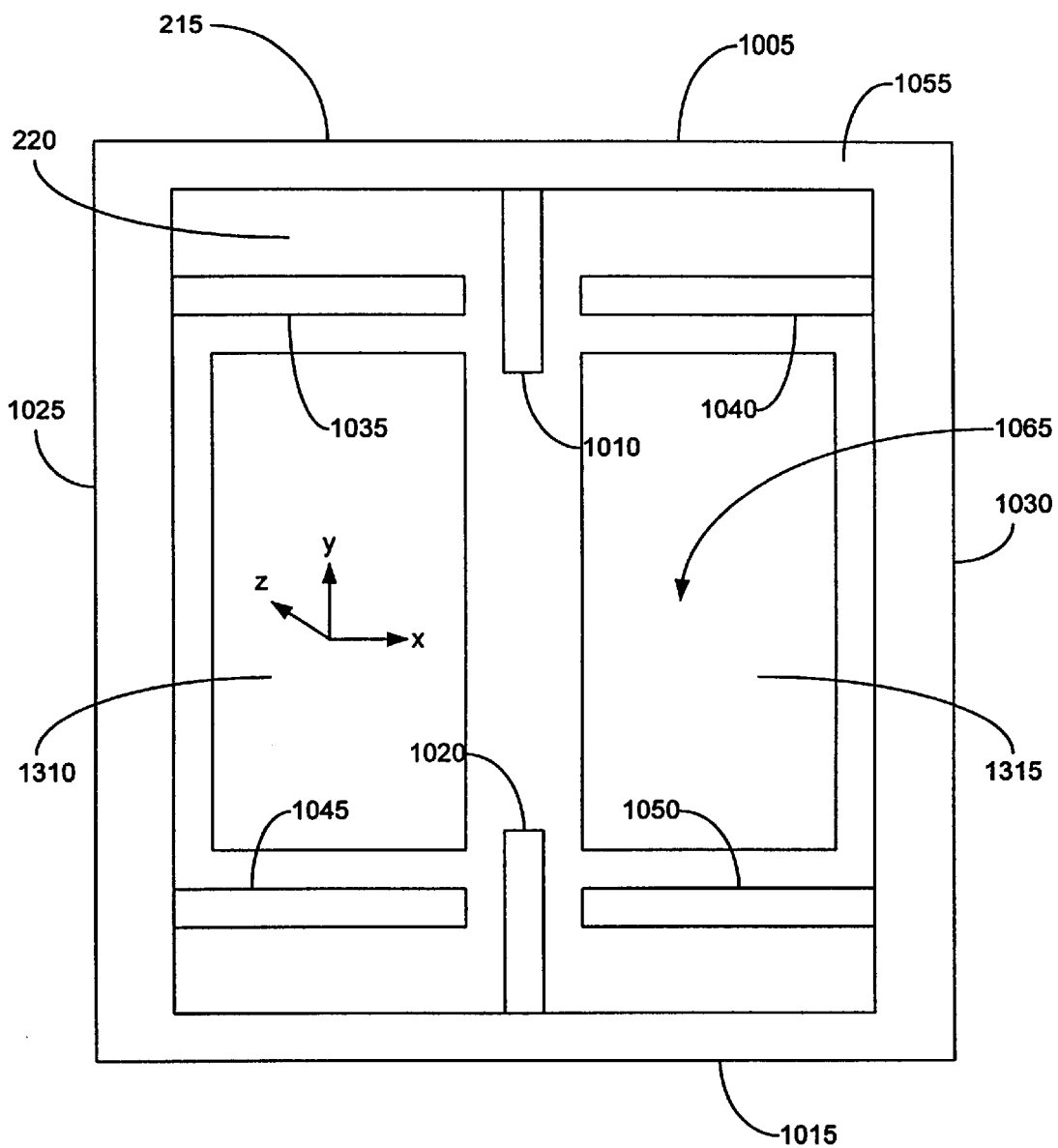
FIG. 17 is a top view of the bottom cap and base member of the mirror assembly of FIG. 2.

Referring now to FIG. 17, a sub-assembly including the bottom cap 215 and the base member 220 is illustrated. As illustrated in FIG. 17, the travel stop fingers, 1010 and 1020, protect the mirror collection plate 610 from z-axis shock while also maximizing the drive area of the drive pad electrodes, 1310 and 1315.

Figure 18:
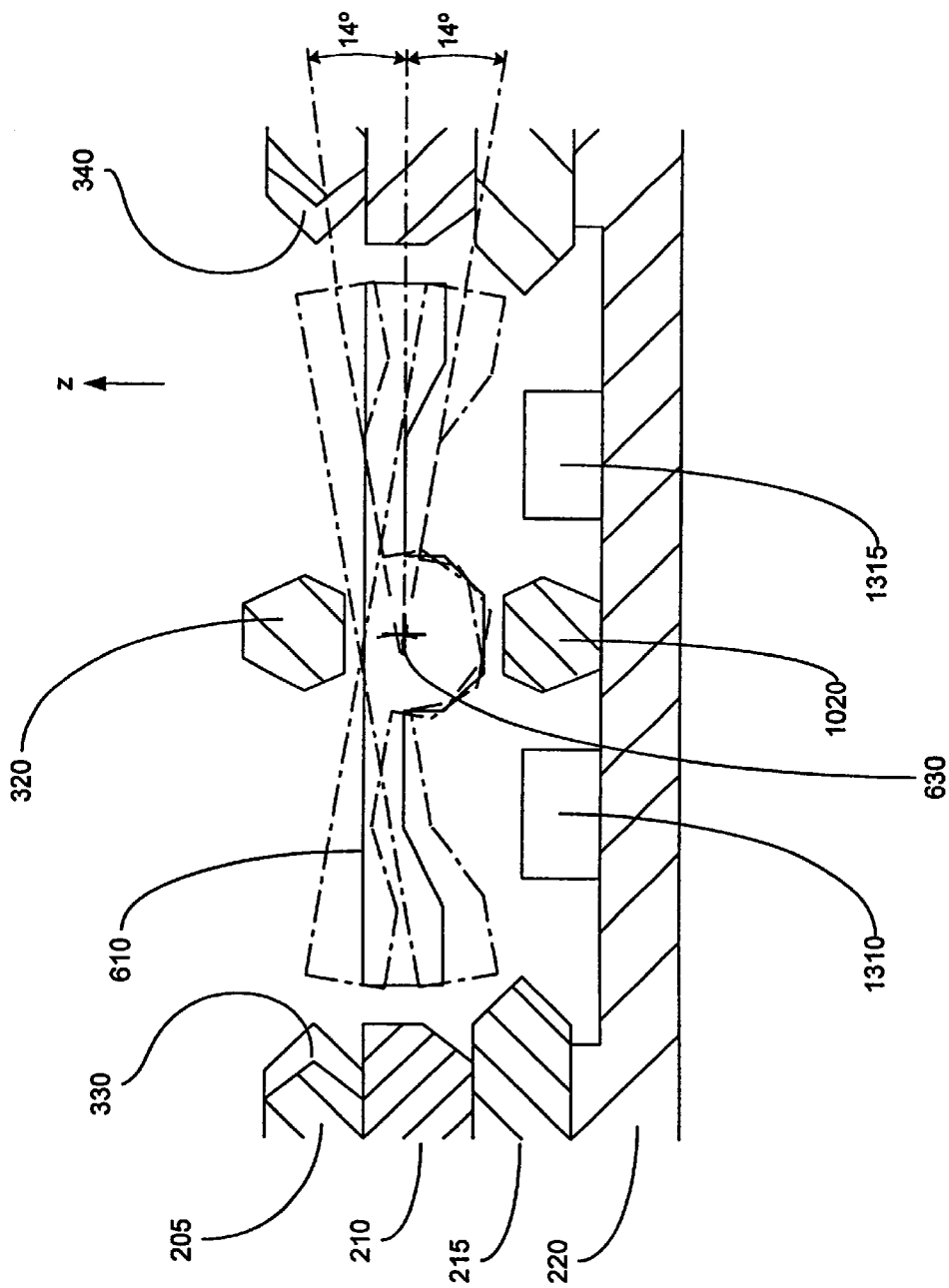
FIG. 18 is a cross-sectional view of the mirror assembly of FIG. 16 illustrating the oscillation of the mirror collection plate.

Referring now to FIG. 18, additional shock protection features of the mirror assembly 110 will be described. As illustrated in FIG. 18, preferably all of the interior walls of the top cap 205 and bottom cap 215 include tapered walls. In a preferred embodiment, the mirror collection plate 610 may be rotated out of plane by about 14° in both directions. In a preferred embodiment, the clearance between the mirror collection plate 610 and the interior walls of the top cap 205, bottom cap 215, and the support structure of the mirror 210 is about 60±10 microns for rotation ranging from −14° to +14°. As also illustrated in FIG. 18, the travel stops, 320 and 1020, protect the mirror collection plate 610 from z-axis shocks. In a preferred embodiment, the clearance between the mirror collection plate 610 and the travel stops, 320 and 1020, is about 20–60 microns.

As illustrated in FIG. 18, the travel-stop fingers, 310 and 320, of the top cap 205 protect the mirror 210 from Z-axis shock while minimizing the shadowing/overlap of the mirror collection plate 610, thus providing the external laser optical access to the micromirror. The travel-stop fingers, 310 and 320, are preferably recessed about 20–60 microns from the surfaces of the top cap 205, which preferably sets the gap between the mirror collection plate 610 and the travel-stop fingers, 310 and 320, to be about 20–60 microns in the Z-direction. The tapered walls around the inside perimeter of the top cap 205 are preferably for capturing the mirror collection plate 610 during an input shock while the mirror collection plate 610 is rotated out-of-plane. The left and right rim cut-outs, 330 and 340, in the top cap 205 preferably provide clipping reduction. The travel-stop fingers, 1010 and 1020, of the bottom cap 215 preferably protect the mirror collection plate 610 from Z-axis shock while maximizing the area of the drive pad electrodes, 1310 and 1315. The travel-stop finger arrangement of the top and bottom caps, 205 and 215, preferably constrain the mirror collection plate 610 from Z-axis translational motion, while promoting torsional rotation of the mirror collection plate 610 about the axis 630. The bottom cap 215 also preferably includes the beams, 1025, 1040, 1045, and 1050, for facilitating the handling of defective mirrors during the fabrication process.

As illustrated in FIGS. 6, 6a, 6b and 6c, the design of the T-shaped hinges 612 and 614, decouples the rotational spring constants from the translational spring constants. In this manner, the mirror collection plate 610 is optimally protected from vibration and shock loads.

Figure 19:
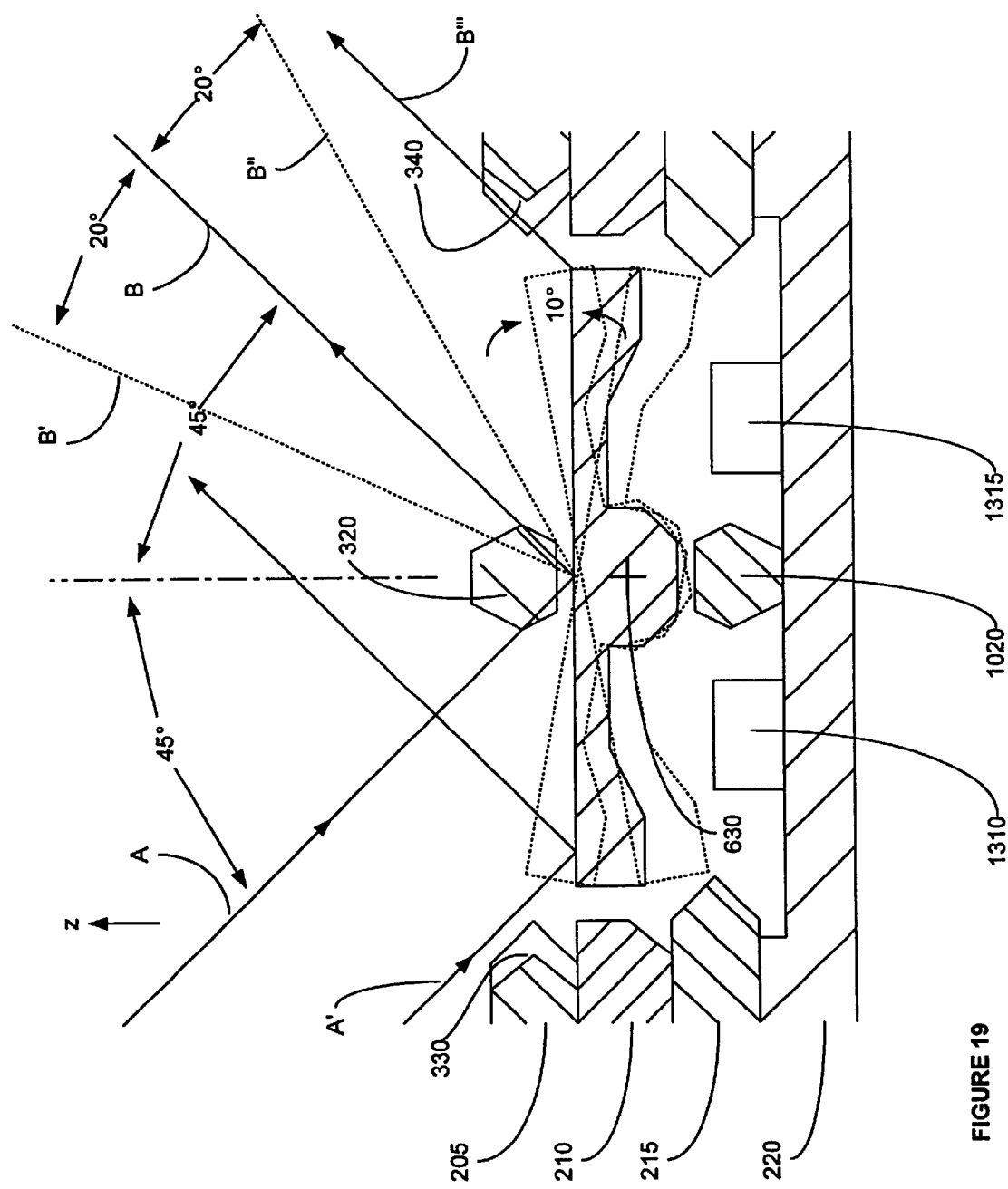
FIG. 19 is a view of the mirror assembly of FIG. 18 illustrating the use of tapered surfaces to minimize clipping of the laser light.

Referring now to FIG. 19, additional features of the mirror assembly 110 for optimizing the reflection of incident laser beams will be described. In an exemplary application of the sensor assembly 110, an incident laser beam A is directed to the mirror collection plate 610 at an angle of 45° and results in the reflected beam B. For a scanning range of ±10°, the reflected laser beams are bound by the rays B' and B". In order to avoid laser beam clipping, the tapered walls and rim cut-outs, 330 and 340, of the top cap 205 minimize clipping of the incident and reflected laser beams. These features are particularly advantageous in the situation where the incident laser beam is displaced resulting in the incident laser beam A' or the reflected laser beam B'''.

As illustrated in FIGS. 18 and 19, the tapered walls of the bottom cap 215 provide optimal shock protection to the mirror collection plate 610, and the tapered walls of the top cap 205 minimize clipping of the incident and reflected laser beams. The rim cut-outs, 330 and 340, of the top cap 205 further minimize shadowing and clipping of the incident and reflected laser beams.

Figure 20:
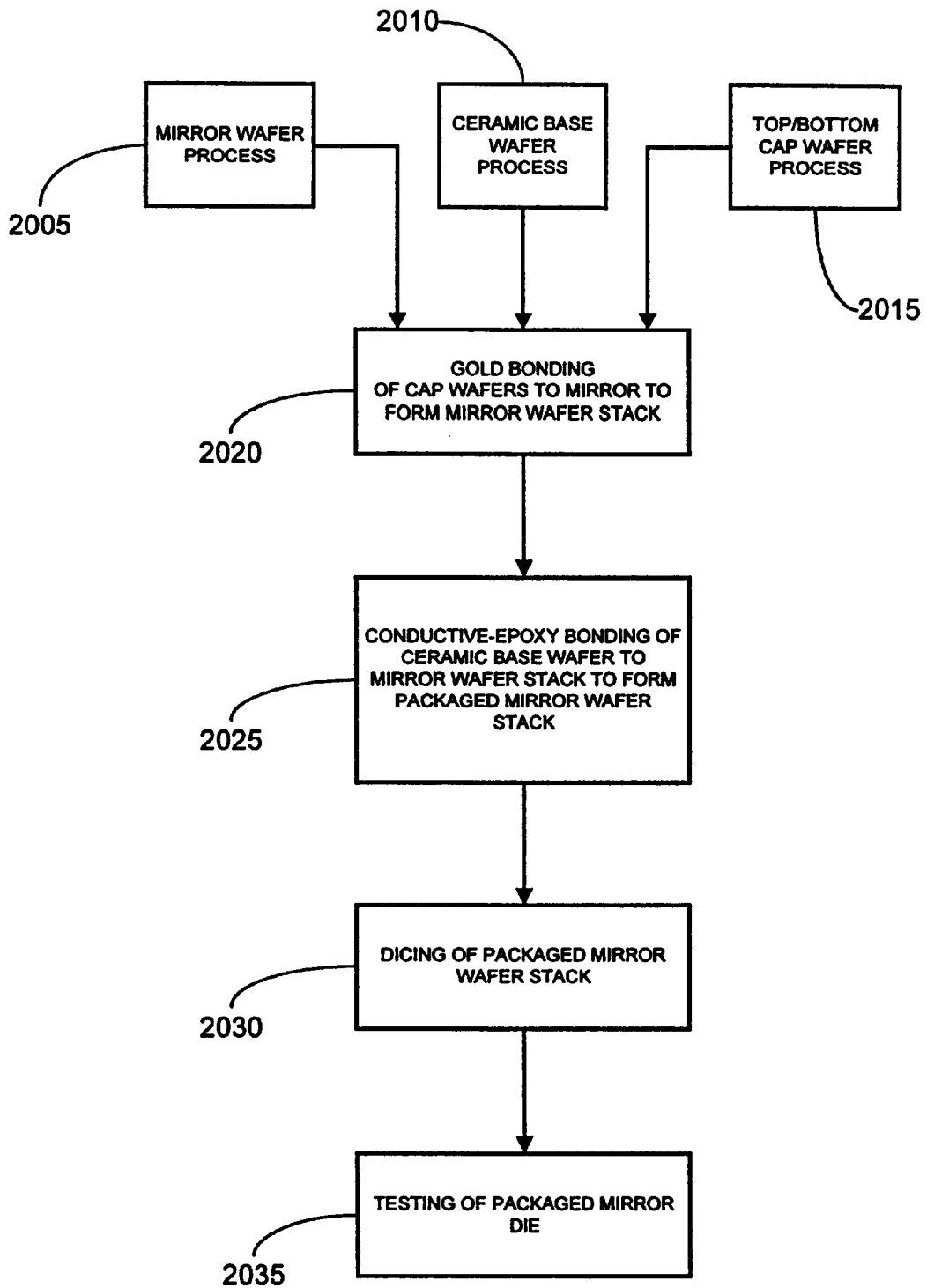
FIG. 20 is a flow chart illustrating the fabrication of the mirror assembly of FIG. 2.

Referring now to FIG. 20, in a preferred embodiment, the fabrication of the mirror assembly 110 includes the steps of: (1) the mirror wafer process 2005, (2) the ceramic base wafer process 2010, (3) the top/bottom cap wafer processes 2015, (4) gold bonding of the cap wafers to the mirror wafer to form a mirror wafer stack 2020, (5) conductive epoxy bonding of the ceramic base wafer to the mirror wafer stack to form a packaged mirror wafer stack 2025, (6) dicing of the packaged mirror wafer stack 2030, and (7) testing of the packaged mirror die 2035.

Figure 21A:
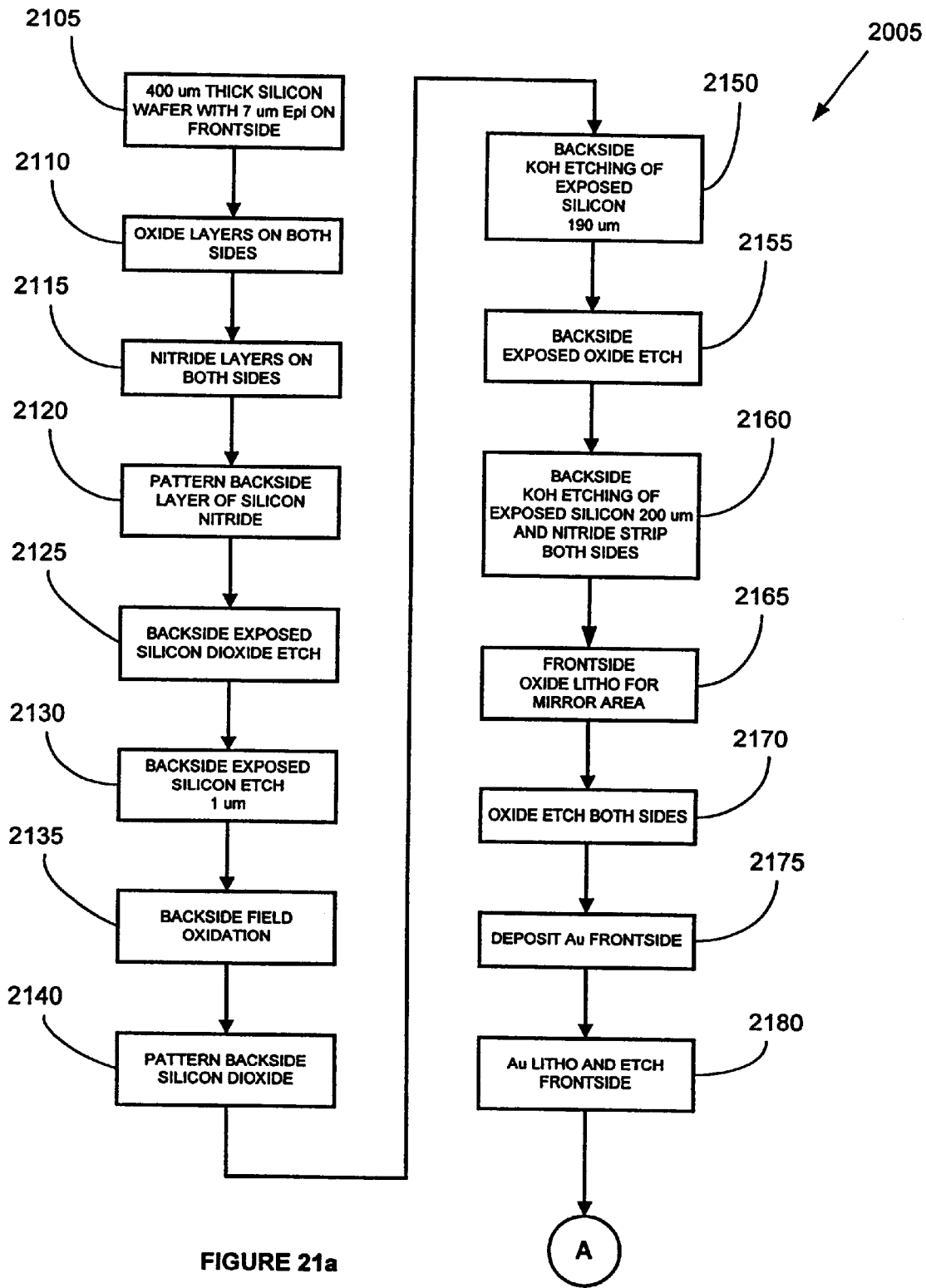
FIG. 21a is a flow chart illustrating the fabrication of the mirror of the mirror assembly of FIG. 2.
Figure 21B:
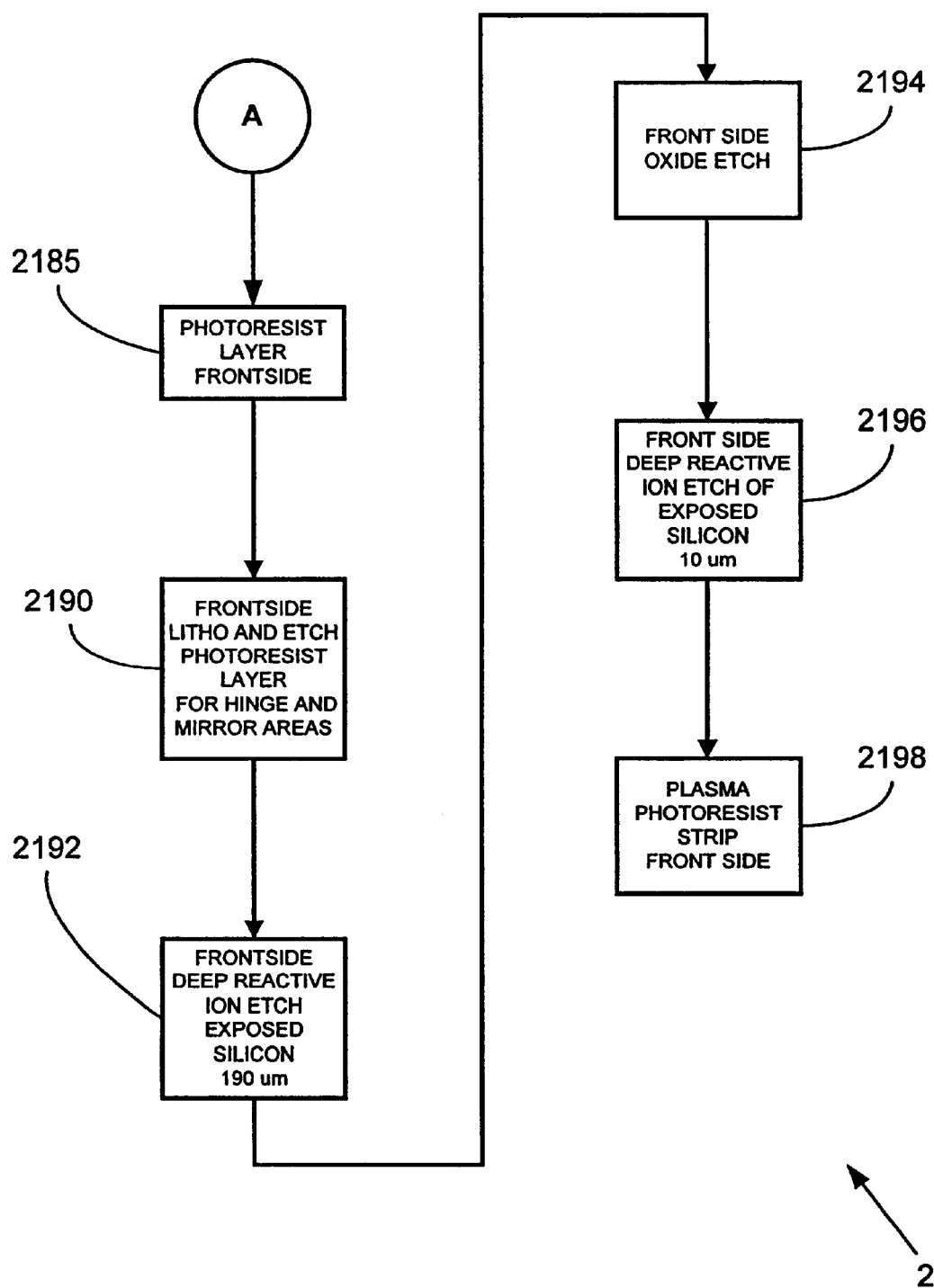
FIG. 21b is a flow chart illustrating the fabrication of the mirror of the mirror assembly of FIG. 2.

The mirror wafer process 2005 preferably provides the mirror 210. In a preferred embodiment, as illustrated in FIGS. 21a and 21b, the mirror wafer process 2005 preferably includes the steps of: (1) providing a silicon wafer in step 2105, (2) growing pad layers of silicon dioxide on both sides of the silicon wafer in step 2110, (3) applying layers of silicon nitride to both sides of the silicon wafer in step 2115, (4) patterning the silicon nitride layer on the backside of the silicon wafer in step 2120, (5) etching the exposed areas of silicon dioxide on the backside of the silicon wafer in step 2125, (6) thin etching of the exposed areas of silicon on the backside of the silicon wafer in step 2130, (7) growing a field layer of silicon dioxide on the areas of the backside of the wafer not covered by the layer of silicon nitride in step 2135, (8) patterning the field layer of silicon dioxide on the backside of the silicon wafer in step 2140, (9) KOH etching of the exposed portions of silicon on the backside of the silicon wafer in-step 2150, (10) etching of the exposed portions of the field layer of silicon dioxide on the backside of the silicon wafer in step 2155, (11) KOH etching of the exposed portions of silicon on the backside of the silicon wafer and stripping of the silicon nitride layers on both sides of the silicon wafer in step 2160, (12) photolithography of the exposed portions of the silicon dioxide layer on the front side of silicon wafer in step 2165, (13) etching the silicon dioxide layers on both sides of the silicon wafer in step 2170, (14) depositing gold on the frontside of the silicon wafer in step 2175, (15) photolithography and etching of the gold layer on the front side of the silicon wafer in step 2180, (16) applying a photo resist layer to the front side of silicon wafer in step 2185, (17) photolithography and etching of the photo resist layer on the front side of the silicon wafer in step 2190, (18) deep reactive ion etching (DRIE) of the exposed portions of silicon on the frontside of the silicon wafer in step 2192, (19) etching the exposed portions of the silicon dioxide layer on the frontside of silicon wafer in step 2194, (20) deep reactive ion etching (DRIE) of the exposed portions of silicon on the front side of the silicon wafer in step 2196, and (21) plasma stripping of the photo resist layer on the front side of the silicon wafer in step 2198.

As will be recognized by persons having ordinary skill in the art and having the benefit of the present disclosure, patterning refers to the sequential operations of conventional photolithography and etching in order to produce patterns in a layer of material or a substrate. As will also be recognized by persons having ordinary skill in the art and having the benefit of the present disclosure, etching refers to the removal of at least a portion of the exposed portions of a layer of material or a substrate.

In a preferred implementation, the DRIE process is provided substantially as disclosed in U.S. Pat. Nos. 5,498,312 and 5,501,893, the disclosures of which are incorporated herein by reference.

Figure 22:
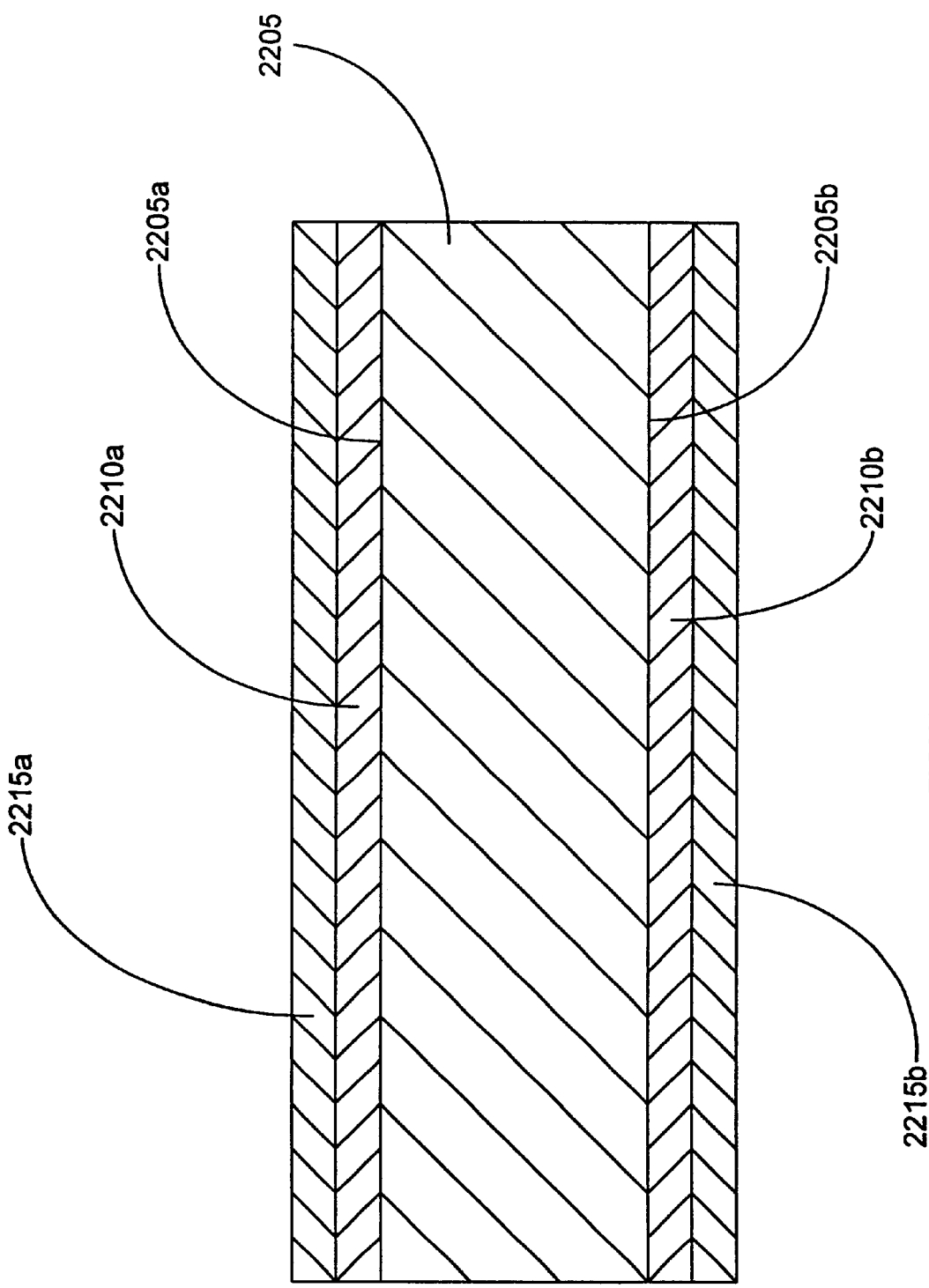
FIG. 22 is a cross-sectional illustration of a silicon wafer having layers of silicon dioxide and silicon nitride applied to its front and back sides.

As illustrated in FIG. 22, in process step 2105, a silicon wafer 2205 is provided having a frontside 2205a and a backside 2205b. In a preferred embodiment, the silicon wafer 2205 comprises a 400 micron thick wafer of silicon. In a preferred embodiment, the silicon wafer 2205 receives a doping of boron-doped epi on the frontside of the silicon wafer 2205. Heavily-doped boron silicon layers form an etch stop for KOH. In a preferred embodiment, the doping of boron-doped epi on the frontside of the silicon wafer 2205 is provided for a depth of about 7 microns.

In a preferred embodiment, the starting material specifications for the top/bottom cap and mirror wafers are double-side polish, thickness control of 400±7.5 microns, and a doping concentration of $10^{18}$ cm$^{-3}$ of boron. For the mirror wafers, the starting wafers preferably are deposited with 7-microns of heavily boron-doped epi on the frontside and the wafers are then polished back to approximately the 400-icron starting thickness. In a preferred embodiment, the electrical connection from the released mirror collection plate 610 to the ceramic base member 220 is through the thickness of the mirror wafer and the bottom cap wafer. The high doping concentration of these wafers optimally provides a good, ohmic electrical contact between the mirror/bottom cap and bottom cap/base member metallization. In an alternative embodiment, double-side implanting of the bottom cap 220 and backside implanting of the mirror 210 are provided.

In process step 2110, pad layers, 2210a and 2210b, of silicon dioxide are then grown on both sides of the silicon wafer 2205. The layers, 2210a and 2210b, of silicon dioxide may be grown using any number of conventional commercially available processes. In a preferred embodiment, the layers, 2210a and 2210b, of silicon dioxide are grown by the process of thermal oxidation. The layers, 2210a and 2210b, of silicon dioxide may be grown to depths ranging, for example, from 300 to 10000 Angstroms. In a preferred embodiment, the layers, 2210a and 2210b, of silicon dioxide are grown to depths ranging from about 3000 to 6000 Angstroms. The pad layers, 2210a and 2210b, provide a buffer layer of silicon dioxide between the layers, 2215a and 2215b, of silicon nitride and the surface of the silicon wafer 2205.

In process step 2115, layers, 2215a and 2215b, of silicon nitride are then applied onto the layers, 2210a and 2210b, of silicon dioxide. The layers, 2215a and 2215b, of silicon nitride may be deposited using any number of conventional commercially available processes. In a preferred embodiment, the layers, 2215a and 2215b, of silicon nitride are deposited by the process of chemical vapor deposition. The layers, 2215a and 2215b, of silicon nitride may be applied to depths ranging, for example, from about 1000 to 20000 Angstroms. In a preferred embodiment, the layers, 2215a and 2215b, of silicon nitride are applied to depths ranging from about 1200 to 1500 Angstroms.

Figure 23:
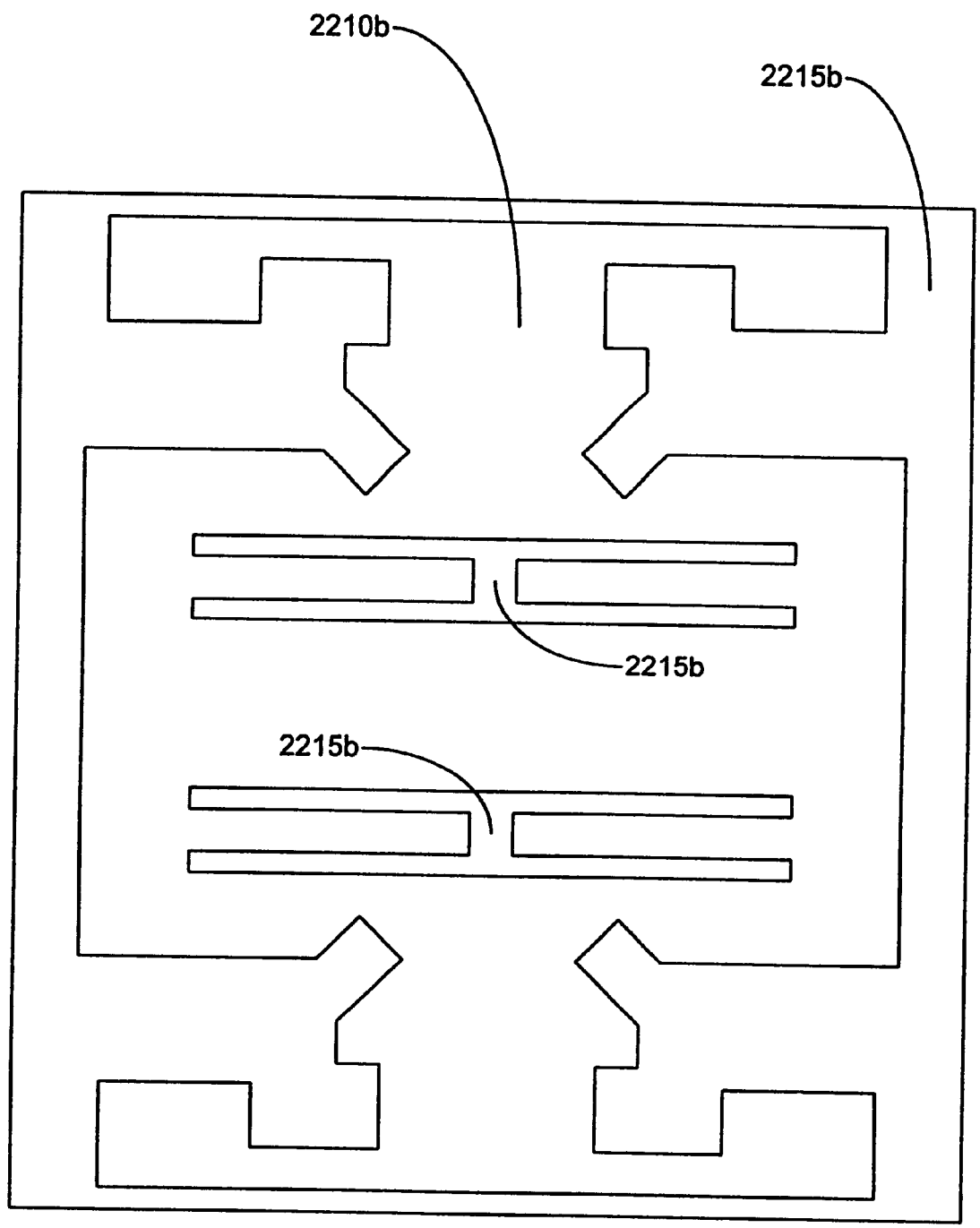
FIG. 23 is an illustration of the nitride photolithography and etching of the backside of the silicon wafer.

As illustrated in FIG. 23, in process step 2120, the layer 2215b of silicon nitride is then etched to expose portions of the pad layer 2210b of silicon dioxide. The unetched portions of the layer 2215b of silicon nitride provide protection for the regions of the backside 2205b of the silicon wafer 2205 that are going to remain unetched which preferably includes the support structure for the mirror 210 and the travel stops, 710 and 715, of the mirror collection plate 610.

Figure 23A:
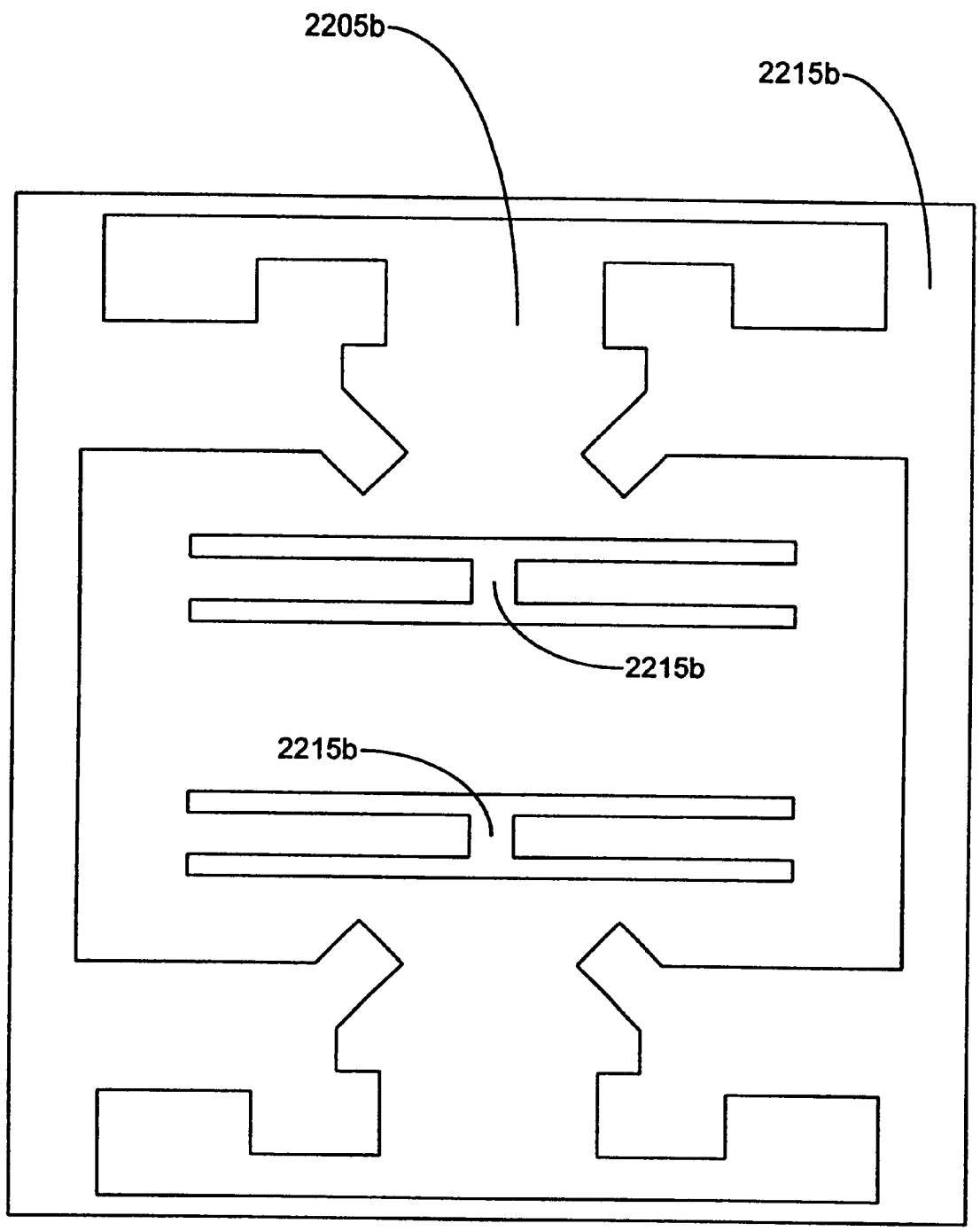
FIG. 23a is an illustration of the etching of the exposed areas of the pad layer of silicon dioxide.

As illustrated in FIG. 23a, in process step 2125, the exposed portions of the pad layer of 2210b silicon dioxide are then etched to expose portions of the backside 2205b of the silicon wafer.

Figure 23B:
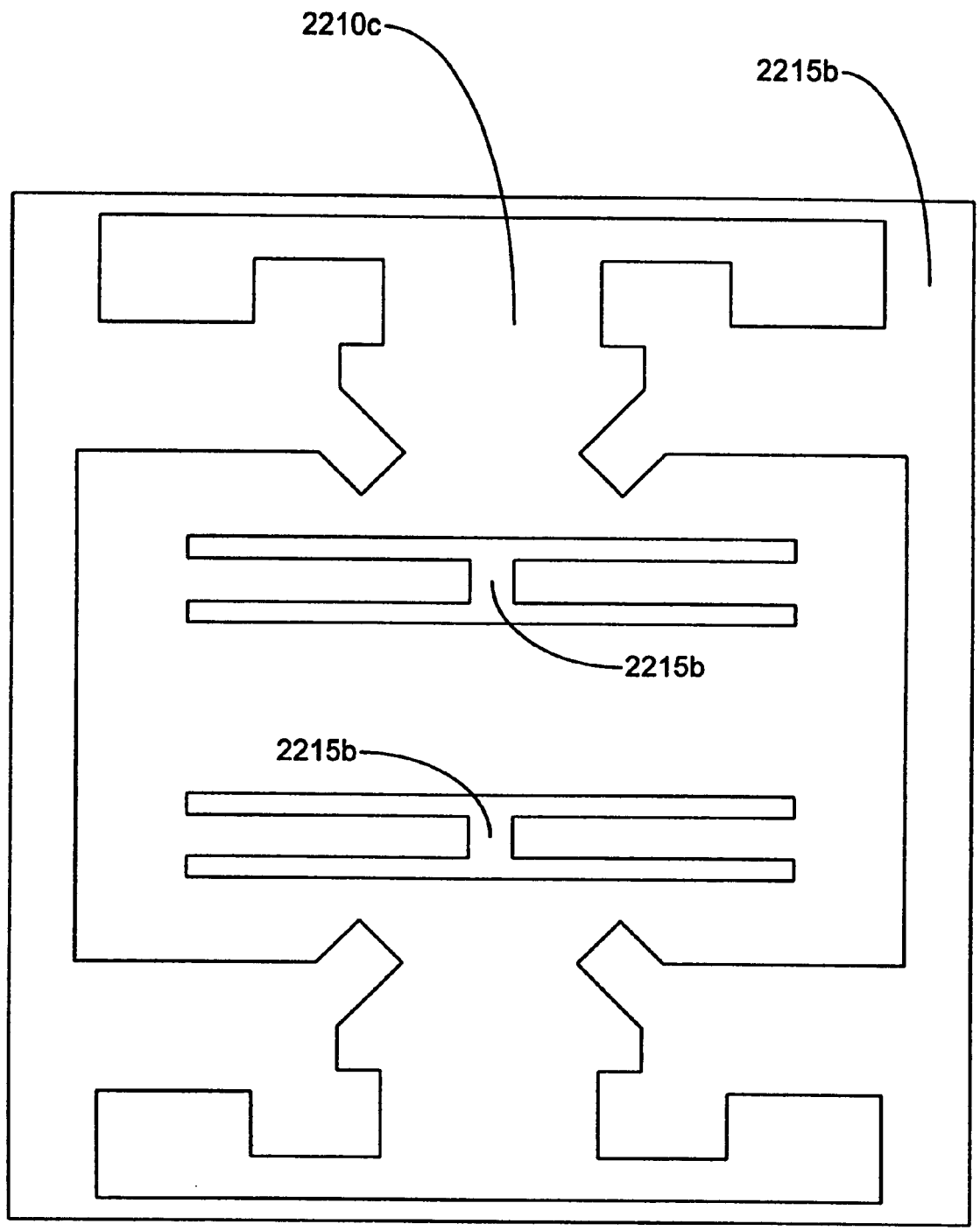

As illustrated in FIG. 23b, in process steps 2130 and 2135, the exposed portions of the backside 2205 of the silicon wafer are thin etched, and then a field layer 2210c of silicon dioxide is then grown on the areas of the backside 2205 of the silicon wafer not covered by the layer 2215b of silicon nitride. In a preferred embodiment, the depth of the thin etch of the backside 2205 of the silicon wafer ranges from about 0.5 to 1.5 microns in order to optimally facilitate the growth of the layer 2210c of field oxide. In a preferred embodiment, the thickness of the field layer 2210c of silicon dioxide is greater than or equal to the combined thicknesses of the pad layer 2210a of the silicon dioxide and the layer 2210b of silicon nitride.

Figure 24:
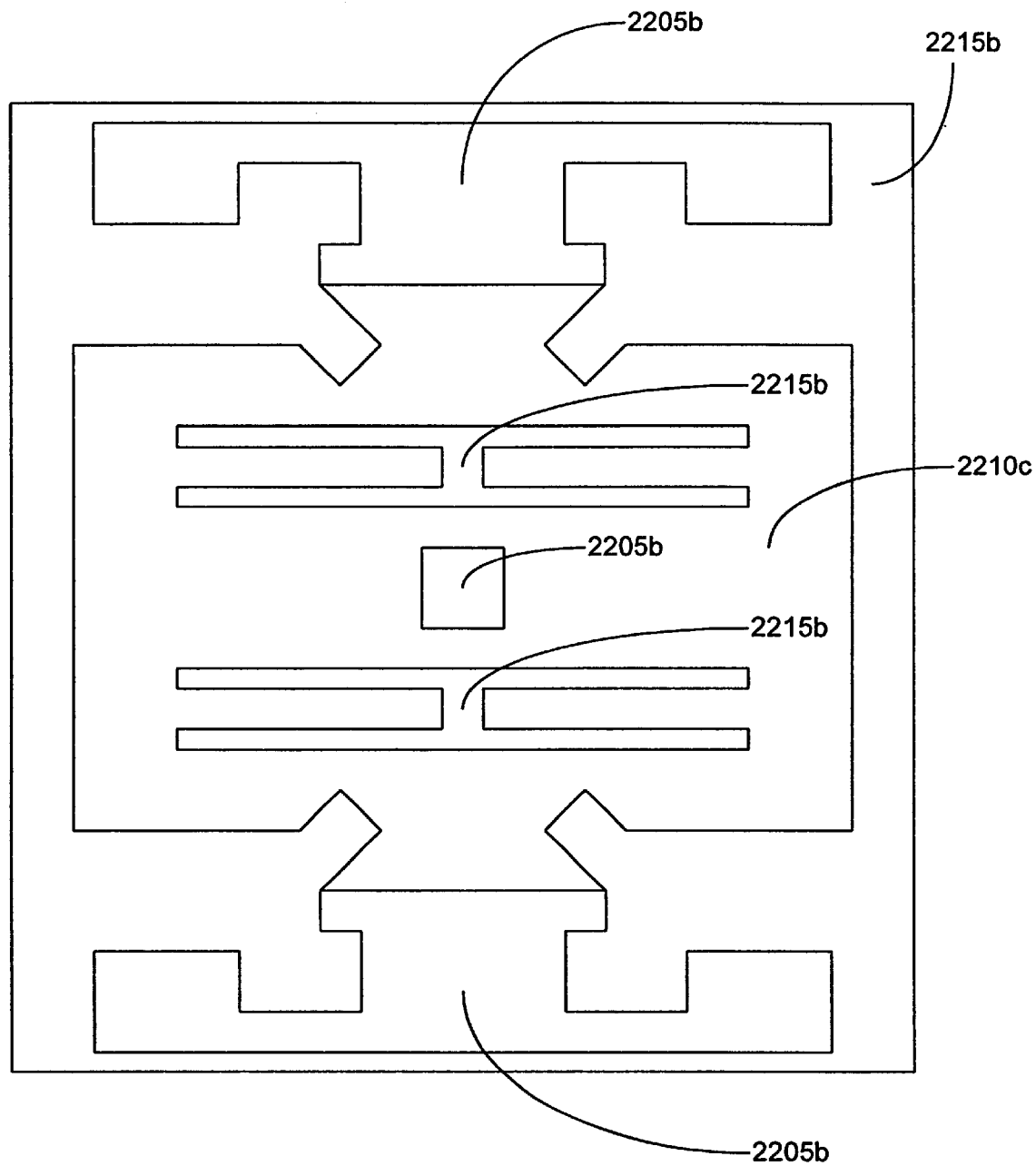
FIG. 24 is a composite illustration of the silicon nitride and silicon dioxide photolithography and etching of the backside of the silicon wafer.

As illustrated in FIG. 24, in process step 2140, the exposed portions of the field layer 2210c of silicon dioxide are then etched to expose portions of the backside 2205b of the silicon wafer 2205. These exposed portions of the backside 2205b of the silicon wafer 2205 are preferably then etched down to the 7-micron thick epi layer in subsequent processing steps. In a preferred embodiment, the 7-micron thick epi layer provides a chemical etch stop.

The etched layers, 2210c and 2215b, of silicon dioxide and silicon nitride preferably provide etching masks for a plurality of etching depths. In a preferred embodiment, the exposed portions of the silicon wafer 2205 are first etched to a first depth through openings in the etched field layer 2210c of silicon dioxide. In a preferred embodiment, the exposed portions of the etched field layer 2210c of silicon dioxide are then removed. In a preferred embodiment, the exposed portions of the silicon wafer are then etched to a second depth through openings in the etched layer 2215b of silicon nitride. In this manner, process steps 2110 to 2160 preferably provide a localized oxidation of silicon (LOCOS) merged-mask micro-machining process. As will be recognized by persons having ordinary skill in the art and, the benefit of the present disclosure, LOCOS refers to the localized growth of silicon dioxide onto a substrate. In an alternative embodiment, additional masking layers are provided to permit micro-machining to additional etch depths. In an alternative embodiment, the masking layers comprise alternating layers of silicon dioxide and silicon nitride.

Figure 25:
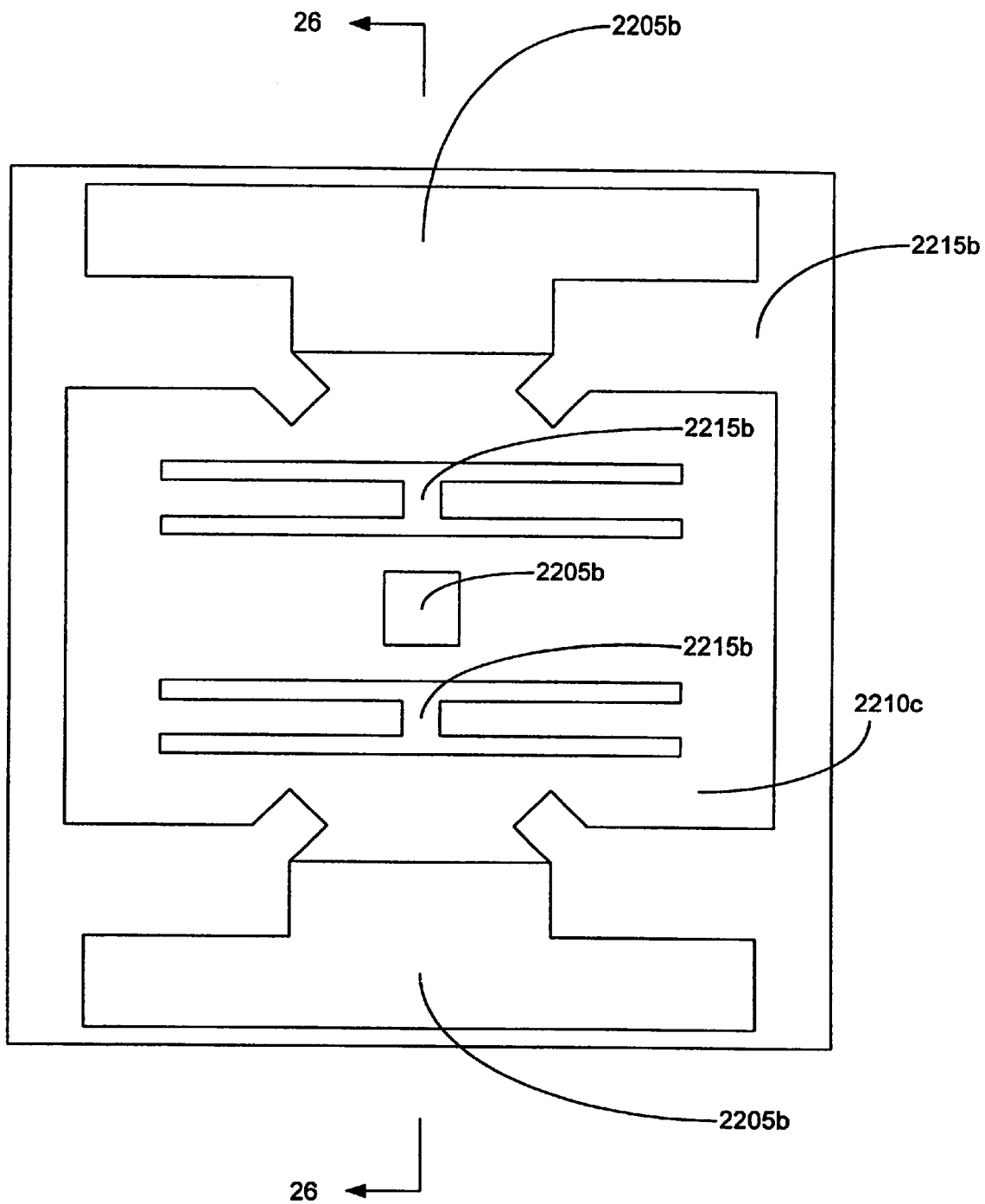
FIG. 25 is an illustration of the KOH etching of the backside of the silicon wafer of FIG. 24.
Figure 26:
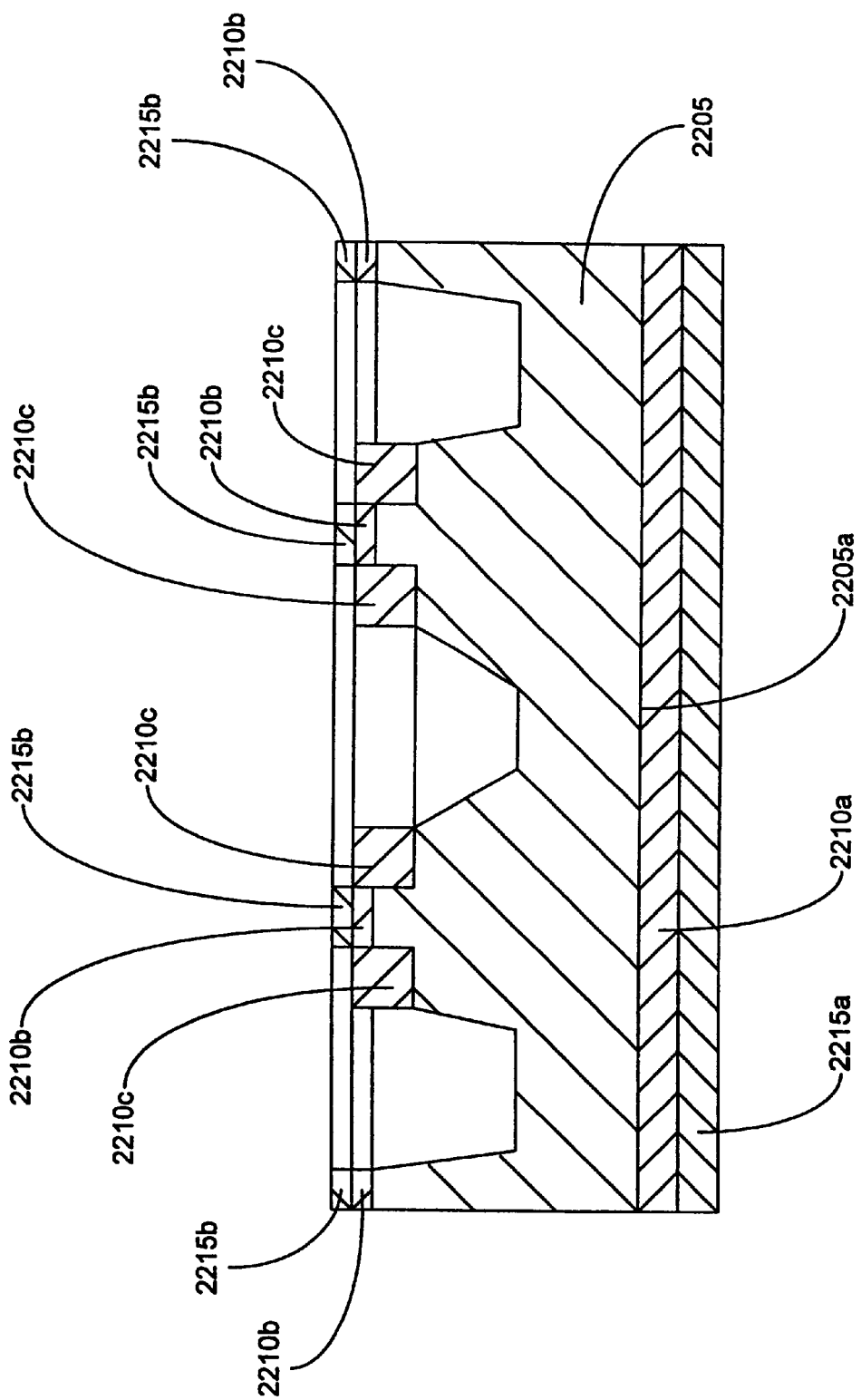
FIG. 26 is a cross-sectional illustration of the silicon wafer of FIG. 25.

As illustrated in FIGS. 25 and 26, in process step 2150, the backside 2205b of the silicon wafer is then etched using KOH. In a preferred embodiment, the backside 2205b of the silicon wafer is then etched using KOH to a depth of 190 microns. The KOH etching process preferably defines the hinges, 612 and 614, the mirror collection plate 610, and the cavity 720 of the mirror collection plate 610.

Figure 27:
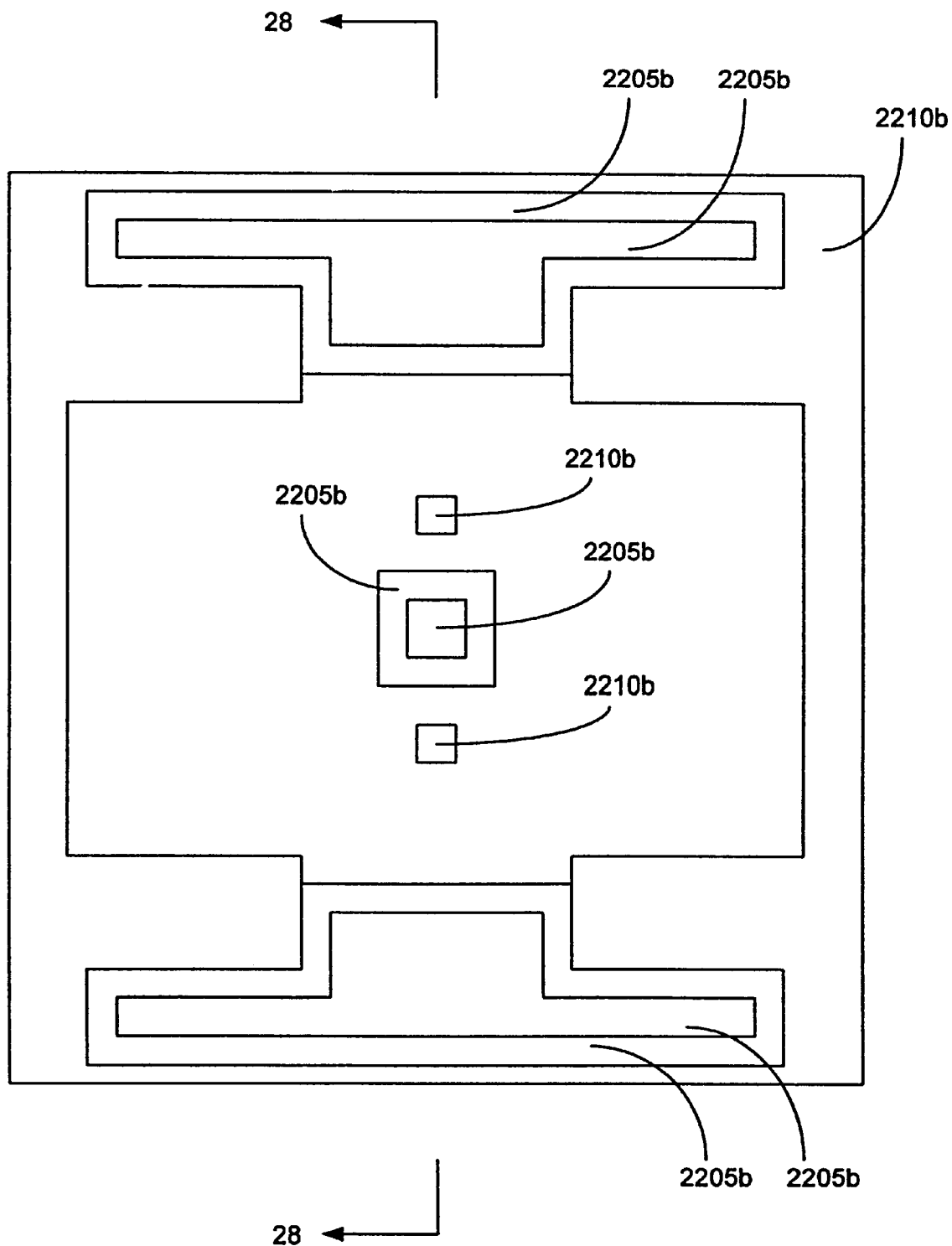
FIG. 27 is an illustration of the etching of the exposed layer of silicon dioxide on the backside of the silicon wafer, KOH etching of the exposed silicon on the backside of the silicon wafer, and stripping of both silicon nitride layers off of the silicon wafer of FIG. 25.
Figure 28:
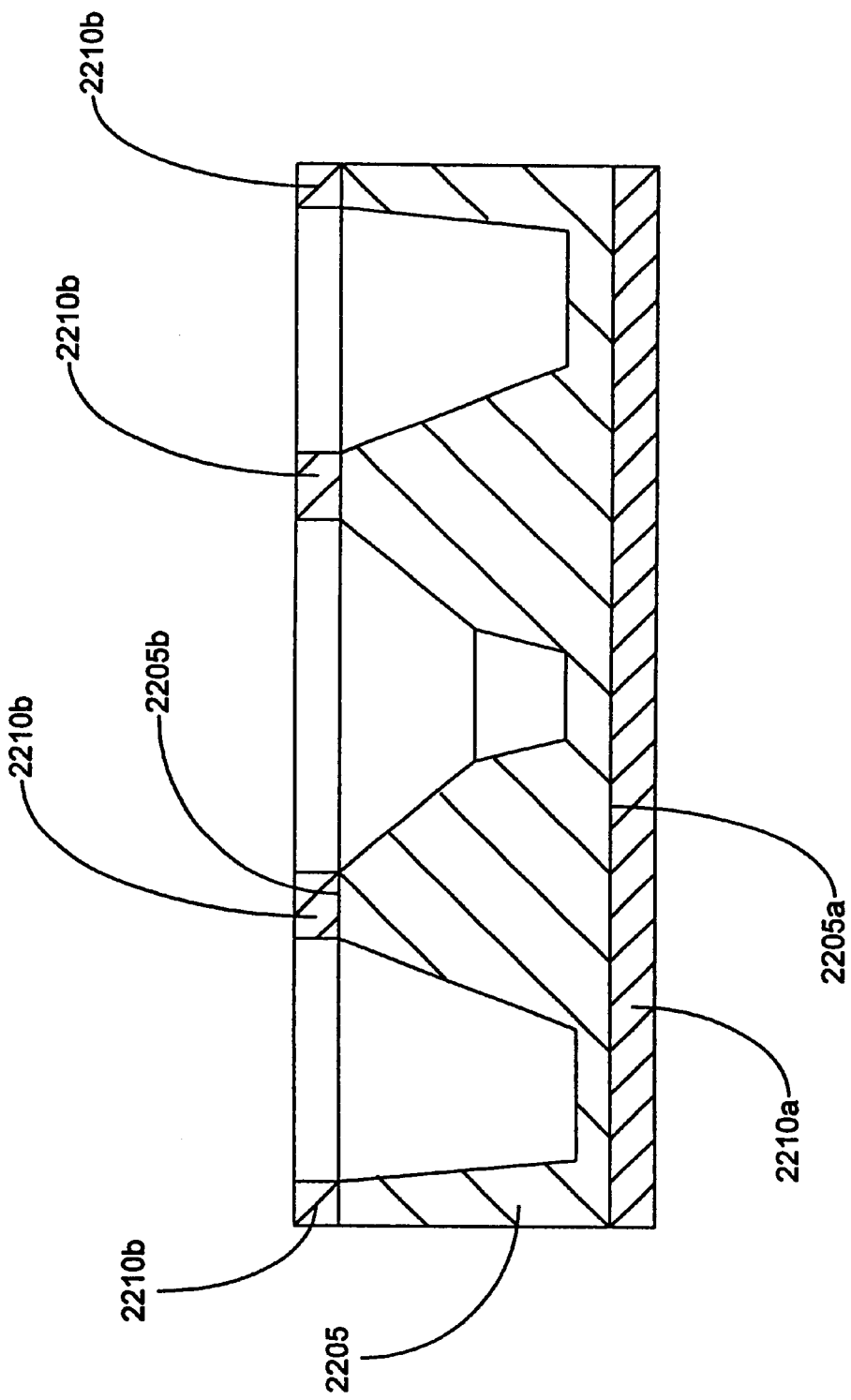
FIG. 28 is a cross-sectional view of the silicon wafer of FIG. 27.

As illustrated in FIGS. 27 and 28, in process steps 2155 and 2160, the exposed portions of the field layer 2210c of silicon dioxide on the backside 2205b of the silicon wafer 2205 are removed. The exposed portions of the backside 2205b of the silicon wafer 2205 are then etched using KOH to a depth of 200 microns. The KOH etching process preferably further defines the hinges, 612 and 614, the mirror collection plate 610, and the cavity 720 of the mirror collection plate 610. Finally, the remaining portions of the layers, 2215a and 2215b, of silicon nitride are then removed from both sides of the silicon wafer 2205. The heavily boron-doped epi layer provided in the silicon wafer 2205 provides a chemical etch stop for the KOH process. In this manner, the cavity 720 in the mirror collection plate 610 and the T-shape hinge regions, 612 and 614, are formed.

In an alternative embodiment, the cavity 720 in the mirror collection plate 610 is defined by the openings provided in the masking layers used to form the cavity 720. In an alternative embodiment, the cavity 720 in the mirror collection plate 610 has a V-shaped cross section.

As illustrated in FIG. 21a, process steps 2110–2160 provide a localized oxidation of silicon (LOCOS) merged-mask KOH micro-machining process in which the masks required for etching to several different etch depths of the silicon wafer 2205 are provided by applying a plurality of etch-resistant layers and etching those etch-resistant layers to provide a plurality of masking layers. As will be recognized by persons having ordinary skill in the art and having the benefit of the present disclosure, LOCOS refers to the localized oxidation of a substrate or layer containing silicon to produce an overlying layer of silicon dioxide. This allows regions with different topologies to be defined with only one lithography and multiple etch cycles.

Figure 29A:
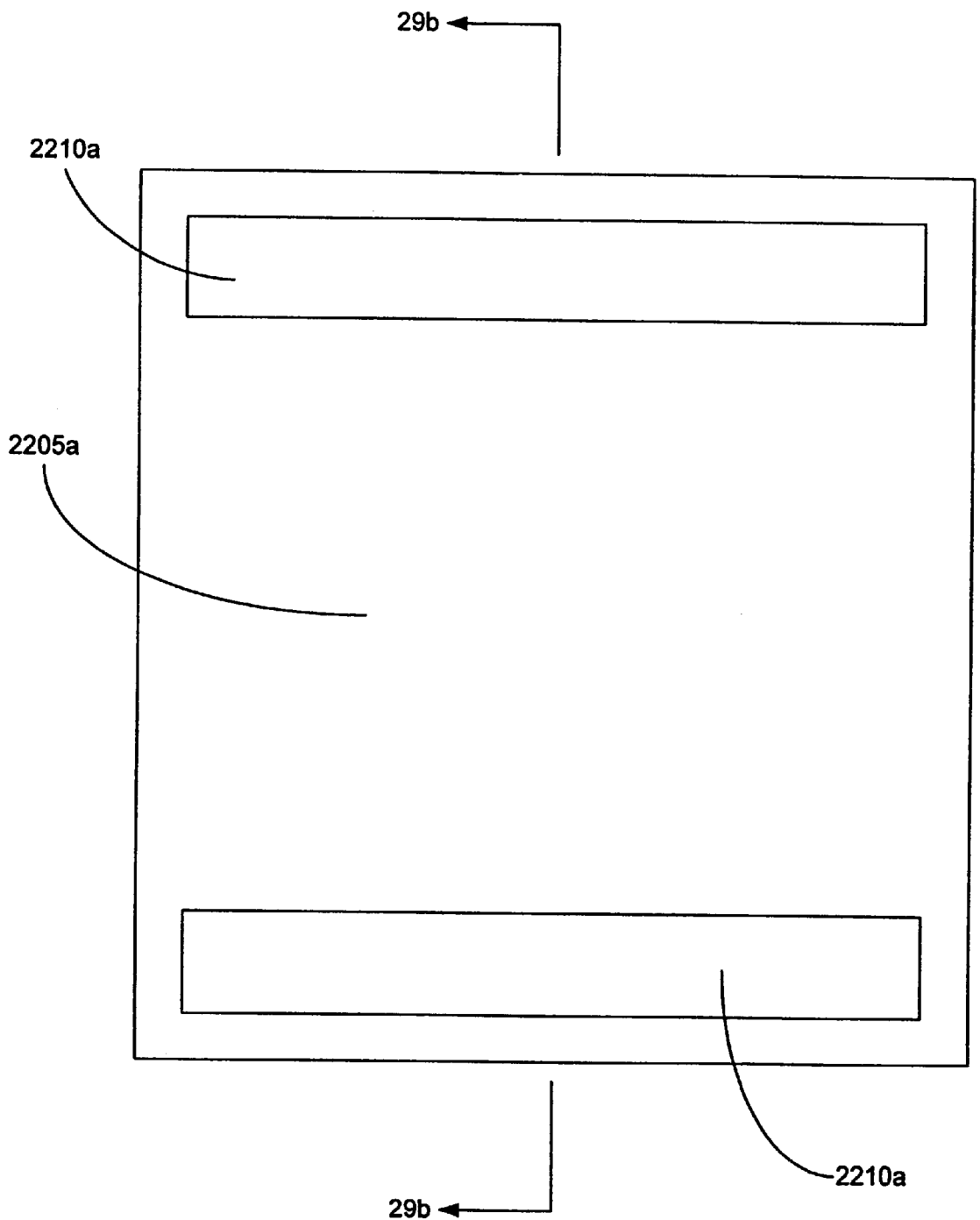
FIG. 29a is an illustration of the patterning of the layer of silicon dioxide on the front side of the silicon wafer of FIG. 27.
Figure 29B:
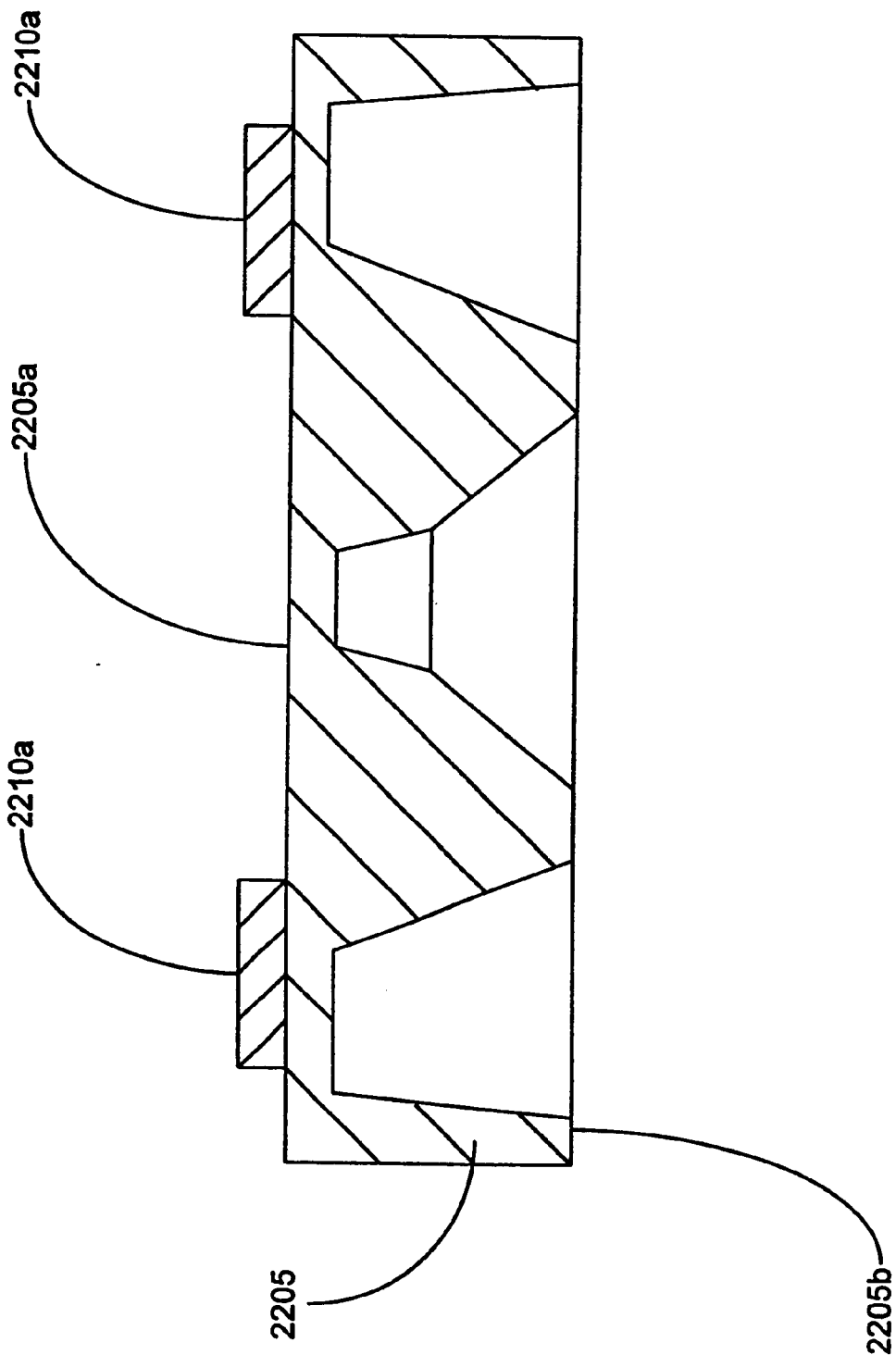

As illustrated in FIGS. 29a and 29b, in process steps 2165 and 2170, the pad layer 2210a of silicon dioxide on the frontside 2205a of the silicon wafer 2205 is then masked and etched to define a portion of the etching mask for the mirror collection plate 610 on the frontside 2205a of the silicon wafer 2205. The remaining exposed portions of the pad layer 2210b of silicon dioxide on the backside 2205b of the silicon wafer are also etched.

Figure 30A:
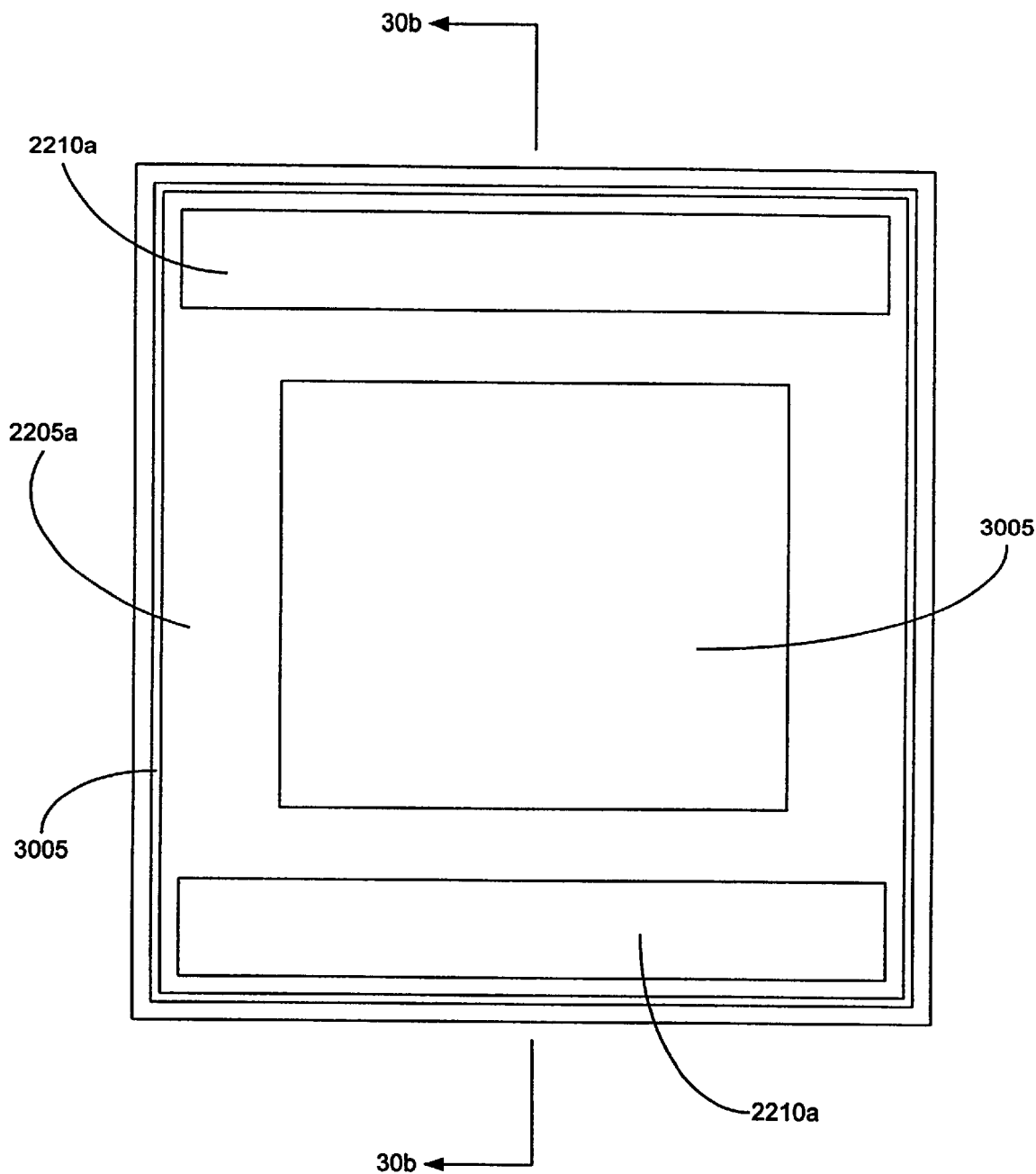
Figure 30B:
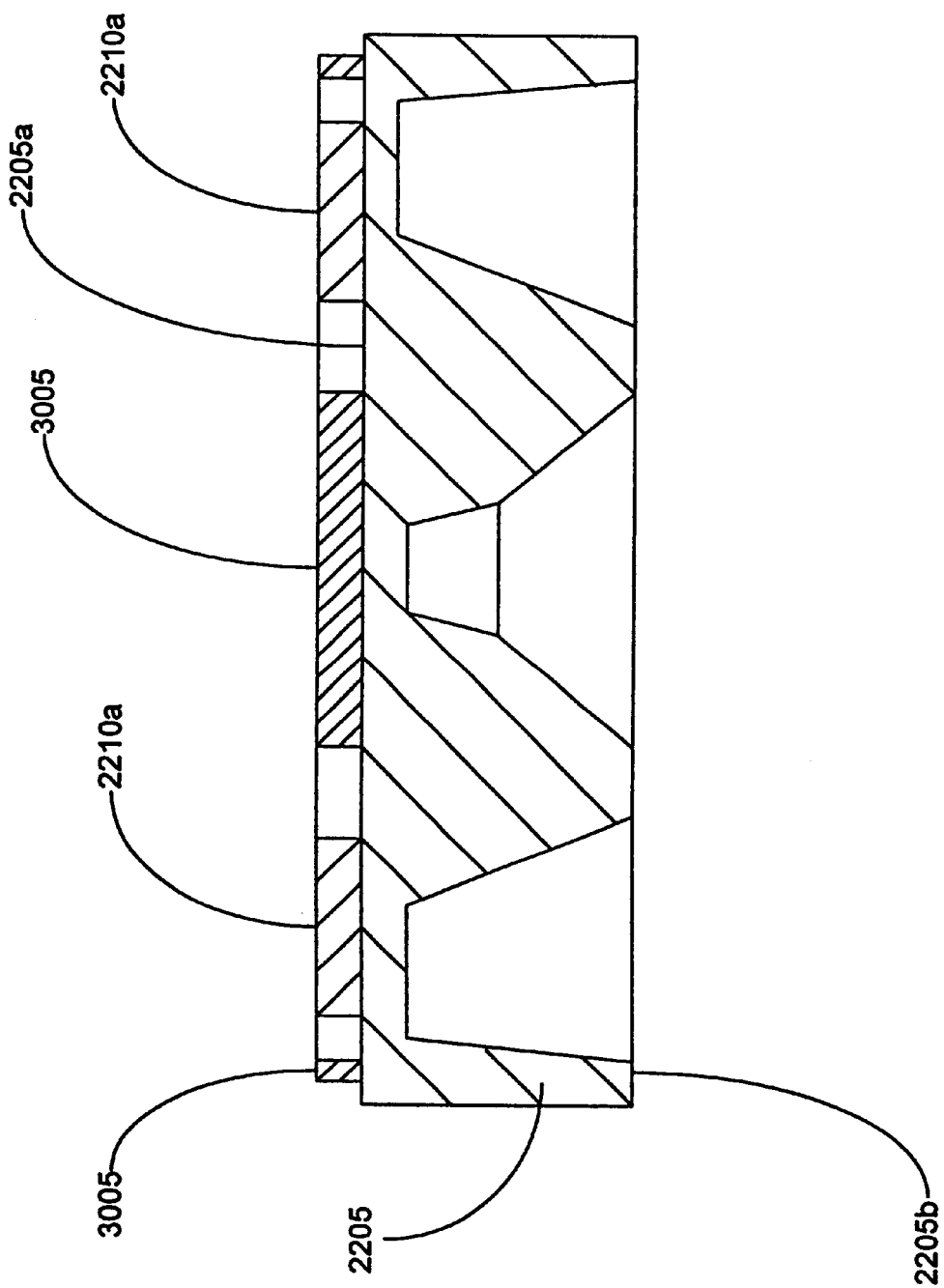

As illustrated in FIGS. 30a and 30b, in process step 2175, a layer 3005 of gold is then applied to the frontside 2205a of the silicon wafer 2205. The layer 3005 of gold is then patterned in process step 2180 to provide the reflective surface 628 of the mirror collection plate 610 and the outer perimeter conductive layer 626 for compression bonding the mirror to the top cap. In a preferred embodiment, the layer 3005 of gold is bonded to the frontside 2205a of the silicon wafer 2205 using an intermediate layer of titanium.

Figure 30C:
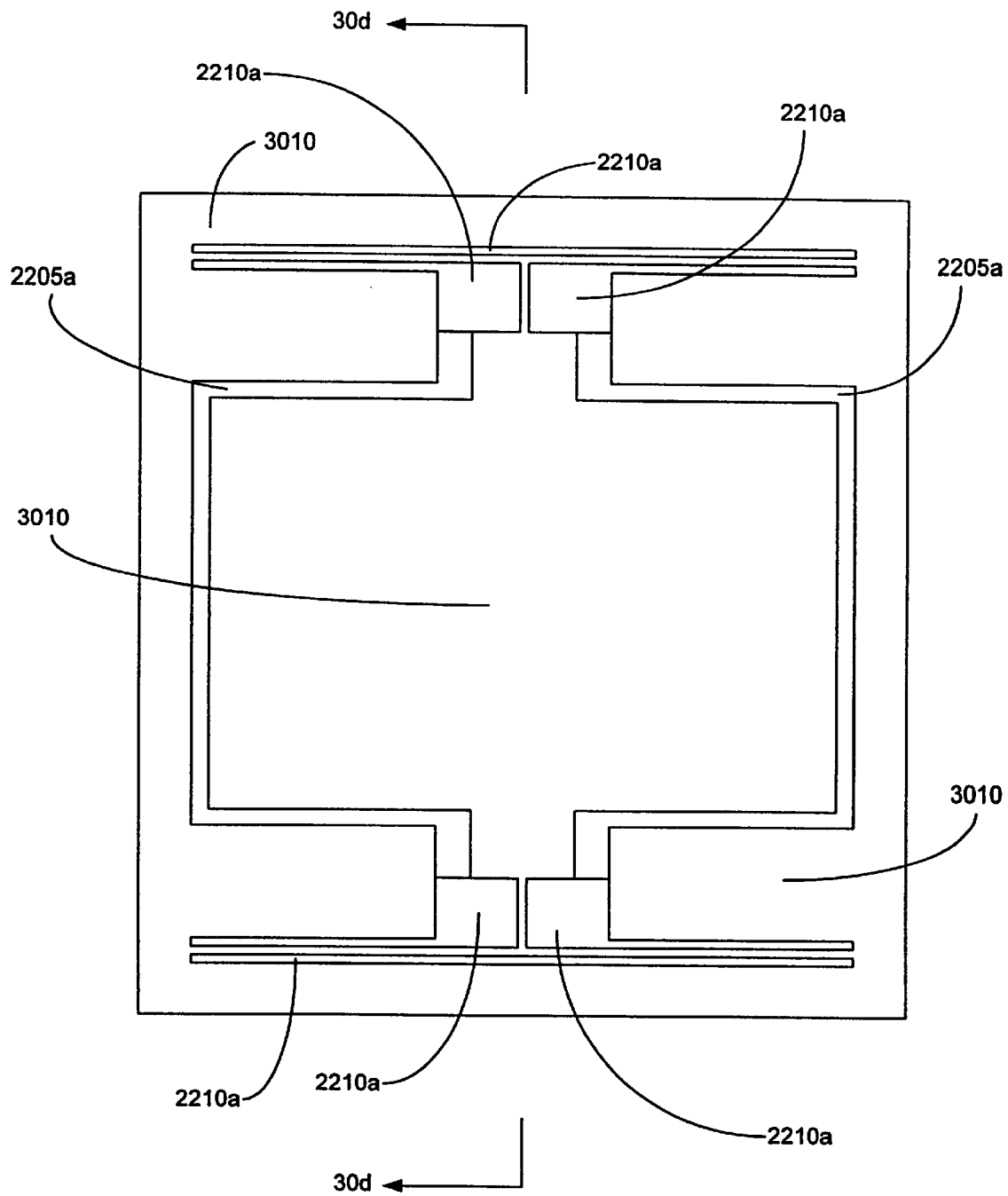
Figure 30D:
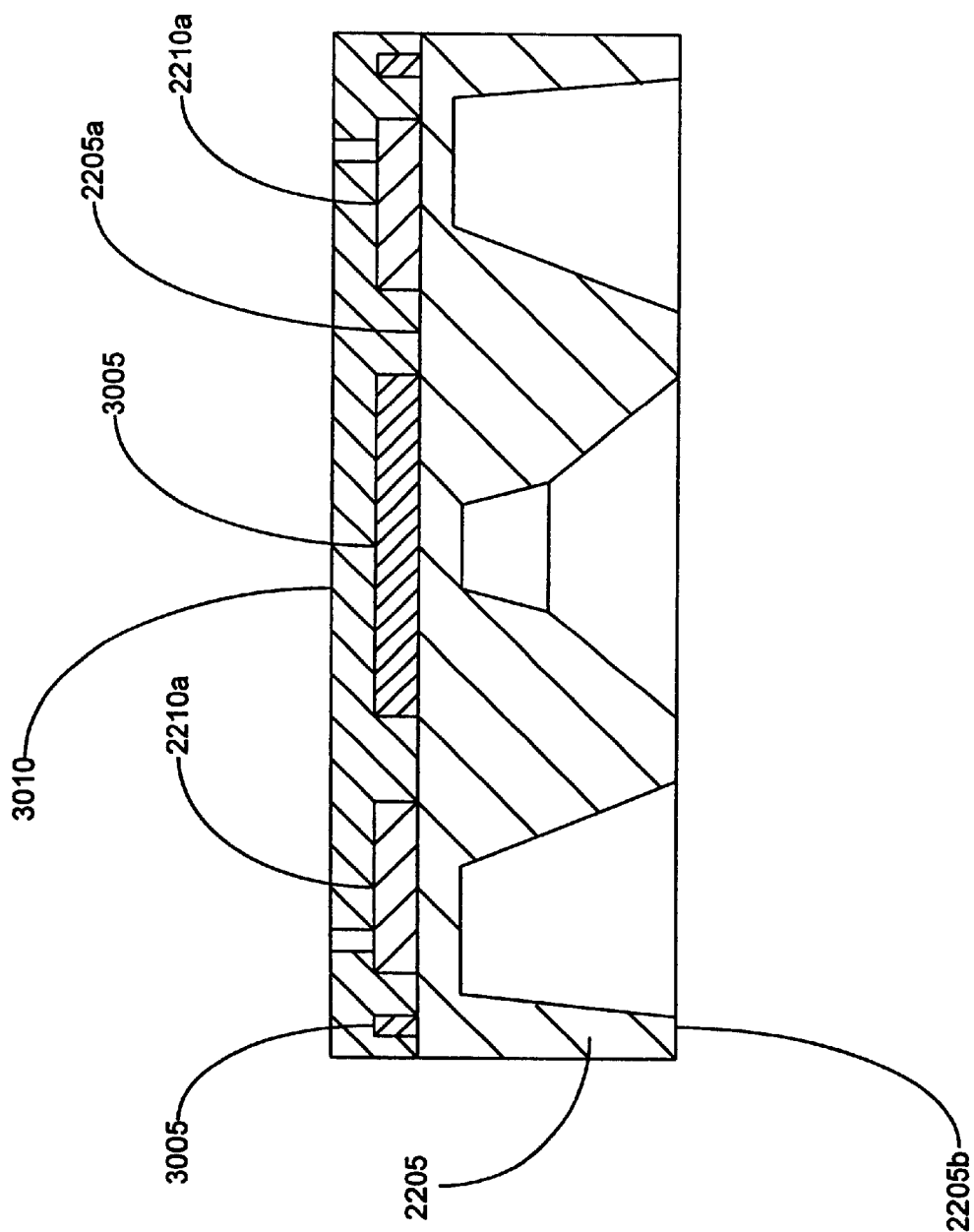
FIG. 30d is a cross-sectional illustration of the silicon wafer of FIG. 30c.

As illustrated in FIGS. 30c and 30d, in process steps 2185 and 2190, a layer 3010 of photoresist is applied and patterned on the frontside 2205a of the silicon wafer 2205. The patterned layer 3010 of photoresist is then used as an etch mask for etching and defining the T-shaped hinges, 612 and 614, and the mirror collection plate 610.

Figure 31:
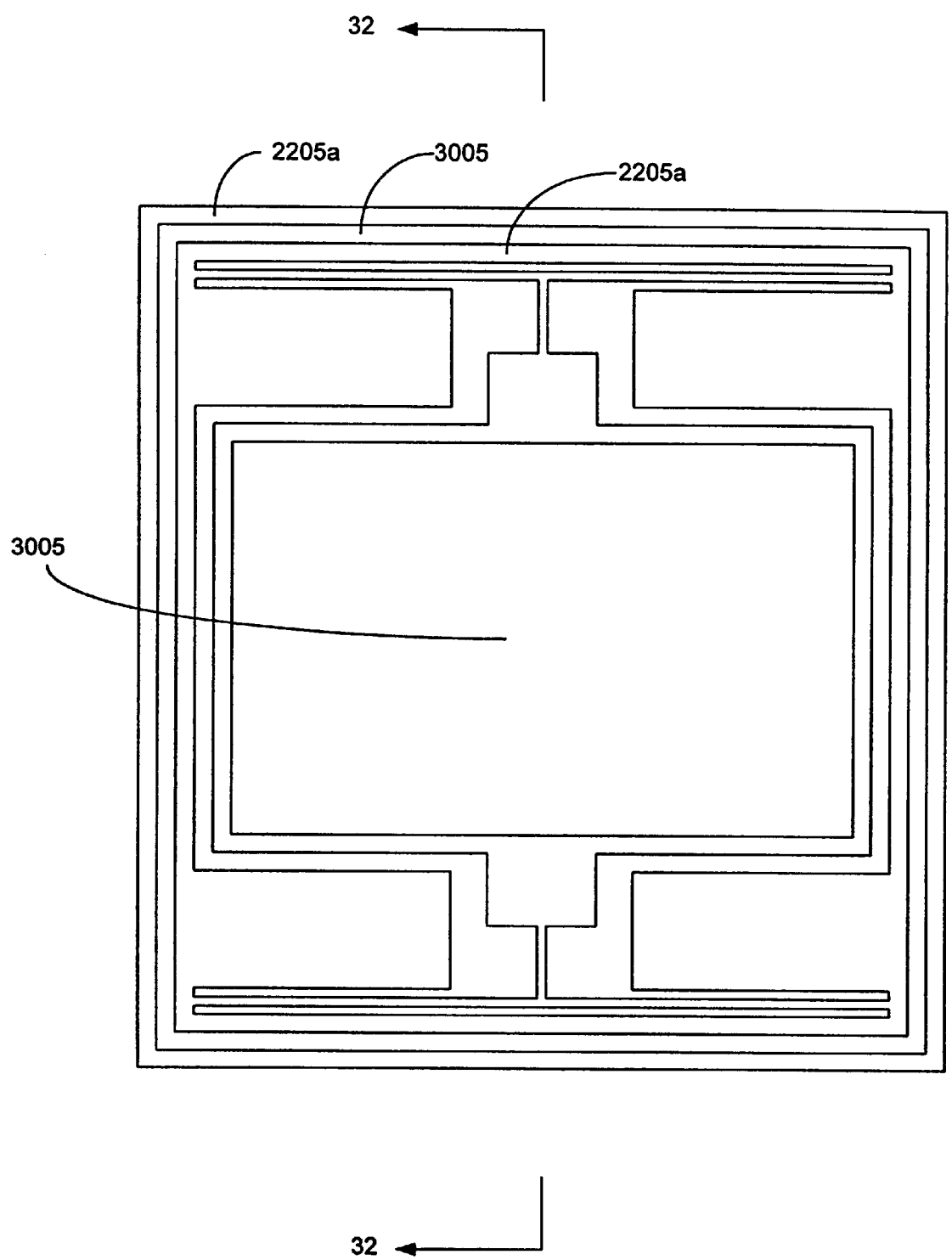
FIG. 31 is an illustration of deep reactive ion etching of exposed silicon, etching exposed silicon dioxide, deep reactive ion etching of exposed silicon, and removal of the photoresist on the front side of the silicon wafer of FIG. 30c.
Figure 32:
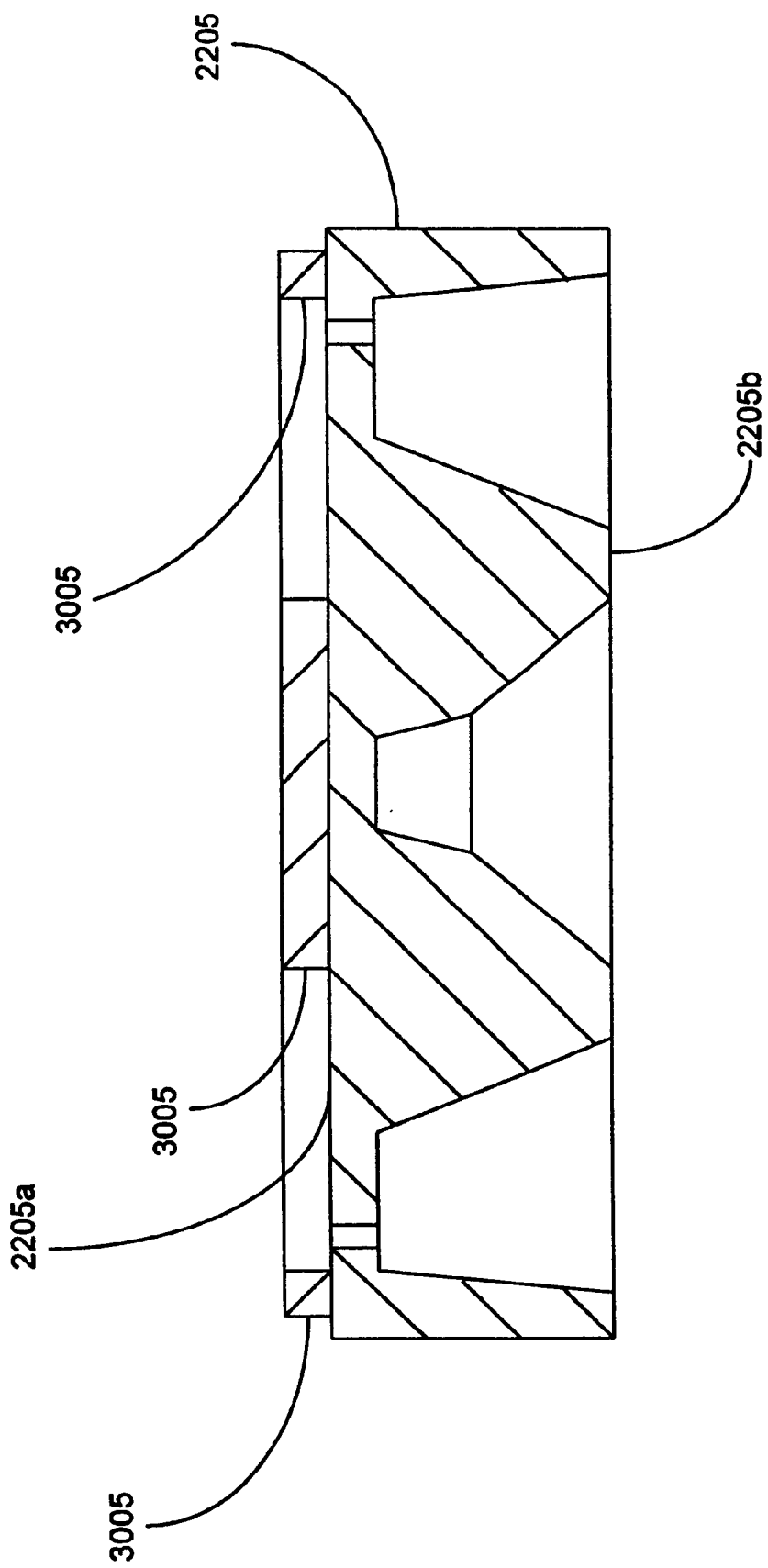
FIG. 32 is a cross-sectional illustration of the silicon wafer of FIG. 31.

As illustrated in FIGS. 31 and 32, in process steps 2192, 2194, 2196 and 2198, the exposed portions of the frontside 2205a of the silicon wafer are then etched using a deep reactive ion etch (DRIE) of the exposed silicon on the frontside 2205a of the silicon wafer to a depth of 190 microns to define the mirror collection plate 610. The exposed portions of the layer 2210a of silicon dioxide are then etched. The frontside 2205a of the silicon wafer 2205 is then etched using a deep reactive ion etch (DRIE) to a depth of 10 microns to form the T-shaped hinges. Finally, the photo resist layer is removed from the frontside 2205a of the silicon wafer 2205. In a preferred embodiment, the DRIE performed in steps 2192 and 2196 provides sidewalls having an angle of 90°±45° relative to horizontal.

The etched layers of silicon dioxide and photoresist on the frontside 2205a of the silicon substrate 2205 preferably provide etching masks for a plurality of etching depths. In a preferred embodiment, the exposed portions of the silicon wafer 2205 are first etched to a first depth through openings in the etched pad layer 2210a of silicon dioxide. In a preferred embodiment, the exposed portions of the etched layer 2210a of silicon dioxide are then removed. In a preferred embodiment, the exposed portions of the silicon wafer 2205 are then etched to a second depth through openings in the etched layer of photoresist. In this manner, process steps 2155 to 2185 provide a merged-mask micromachining process that utilizes a photoresist layer as an etching mask.

As illustrated in FIGS. 21a and 21b, process steps 2110 to 2160 also provide a wet KOH merged-mask micro-machining process, while process steps 2165 to 2198 provide a dry DRIE merged-mask micro-machining process. More generally, process steps 2110 to 2160 provide a merged-mask micro-machining process including the steps of: (1) providing a silicon substrate; (2) applying a buffer layer of silicon dioxide onto the silicon substrate; (3) applying a masking layer onto the buffer layer; (4) patterning the buffer and masking layer; (5) thin etching the exposed portions of the silicon substrate; (6) growing a field layer:of silicon dioxide onto the exposed portions of the silicon substrate; (7) patterning the field layer of silicon dioxide; (8) etching the exposed portions of the silicon substrate using the field oxide as an etch mask; (9) removing the exposed portions of the field layer of silicon dioxide; and (10) etching the exposed portions of the silicon substrate using the silicon nitride as an etch mask. More generally, process steps 2165 to 2198 provide a merged-mask micro-machining process including the steps of: (1) providing a silicon substrate; (2) applying a first masking layer onto the silicon substrate; (3) patterning the first layer of masking material; (4) applying a second masking layer onto the patterned first layer of masking material; (5) etching the exposed portions of the silicon substrate; (6) removing the exposed portions of the first layer of masking material; (7) etching the exposed portions of the silicon substrate; and (8) removing the exposed portions of the second layer of masking material.

As illustrated in FIGS. 21a–32, in a preferred embodiment, the mirror. fabrication process begins by providing a 400 micron silicon wafer 2205 with 7-microns of heavily boron-doped epi deposited on the frontside; The silicon wafer 2205 then has silicon dioxide, 2210, and silicon nitride, 2215, films deposited on both sides of the silicon wafer 2205 to form an etch-mask for the wet KOH etching. On the backside of the wafer 2205 the silicon nitride layer 2215b is patterned to protect the regions that are going to remain unetched (i.e., the mirror frame region and Z travel stop features. The underlying, exposed pad oxide layer 2210b is then etched to expose the backside 2205b of the silicon wafer 2205. The exposed portions of the backside 2205b of the silicon wafer 2205 are then thin etched to a depth of about 1 micron. A layer 2210c of field oxide is then grown on the backside 2205b of the silicon wafer 2205. The field oxide layer 2210c is then patterned to expose the regions that are going to be etched down to the epi layer. The silicon wafer 2205 is then placed in wet KOH etchant, which etches the exposed silicon regions and does not etch the regions protected with either silicon dioxide or silicon nitride. The exposed silicon is then etched to a depth of 190 microns. The exposed silicon dioxide field layer 2210c is then etched away, leaving the silicon nitride protected regions as the etch mask. The silicon wafer 2205 is then placed back into the wet KOH etchant and etched for another 200 microns. The regions that were previously etched in the first round of KOH etching stop etching when the heavily boron-doped epi layer is reached, and these regions form the cavity 720 and T-shape hinge regions. Heavily-doped boron silicon layers form a chemical etch-stop for KOH. Therefore, the newly exposed silicon regions are etched to a depth of 200 microns during this second round of KOH etching and form the half-thickness mirror collection plate 610. This merged-mask KOH process allows regions with different etch topologies to be defined with only one lithography and etch cycle. This manufacturing process avoids the significant yield issues associated with conventional deep-cavity lithography.

As illustrated in FIGS. 21a, 31 and 32, a deep reactive ion etching (DRIE) dry etching micro-machining process is preferably used to define the T-shaped hinges, 612 and 614, and release the mirror collection plate 610 from the frame, 602, 604, 606 and 608. In a preferred embodiment, the DRIE dry etching process provides minimal lateral undercutting and provides near-vertical side-wall profiles. In this manner, the DRIE dry etching process optimally provides X-gaps and Y-gaps, between the mirror collection plate 610 and the frame, 602, 604, 606, and 608, that optimally function as shock travel stops for the mirror collection plate 610. In a preferred embodiment, the X-gap and Y-gap sidewall profiles of the mirror collection plate 610 and support frame, 602, 604, 606, and 608, are substantially vertical. In a preferred embodiment, the X-gap and Y-gap between the mirror collection plate 610 and the support structure, 602, 604, 606 and 608, is maintained for all rotational orientations of the mirror collection plate 610. In this manner, the mirror collection plate 610 is shock stopped by the frame, 602, 604, 606 and 608. Excessive taper of the mirror collection plate 610 or the sidewalls of the frame, 602, 604, 606, and 608, makes the X-gaps or Y-gaps effectively larger for a given rotation angle, and therefore will not provide as much shock protection for the T-shaped hinges, 612 and 614. In a preferred embodiment, the degree of taper of the mirror collection plate 610 or the sidewalls of the frame, 602, 604, 606, and 608 is about 54.7°.

In a preferred embodiment, the release etching process for the mirror collection plate 610 and the etch for the T-shaped hinges, 612 and 614, are de-coupled. In an exemplary embodiment, the T-shaped hinge etch is only 10-microns deep and the mirror collection plate release etch depth is 200 microns. If the etches were done concurrently, the hinges, 612 and 614, would be subjected to an additional 190-microns of etching which can lead to lateral undercutting, backside etching, and sidewall taper which affects the shock robustness of the hinges, 612 and 614.

Furthermore, since the mirror collection plate 610 is not protected by the top/bottom cap wafers prior to gold-bonding of the mirror wafer 210 to the top/bottom caps, 205 and 215, when the mirror collection plate 610 is DRIE dry-etch released, the mirror collection plates 610 are fragile and are free to move in X, Y, Z, and theta. Consequently, the handling of the released mirror collection plate wafers has a critical impact on yield. Also, there is always the possibility of having some "defective" mirrors 210 whose hinges, 612 and 614, are compromised so that they cannot support the mirror collection plate 610 after the DRIE dry etch release process.

As illustrated in FIGS. 21a and 21b, a merged mask DRIE process is preferably used to micromachine the T-shaped hinges, 612 and 614, and release the mirror collection plate 610. The merged mask DRIE process preferably includes a composite silicon dioxide and photoresist mask that defines various etching regions for a 2-phase DRIE dry etch process. In a preferred embodiment, the exposed silicon dioxide mask is stripped prior to the second phase of the DRIE dry etch process. In a preferred embodiment, the mirror collection plate release etch is defined in photoresist, and the hinge release areas are protected by a silicon dioxide mask. In an exemplary embodiment, the first phase of the DRIE dry etch process, etches the mirror collection plate release lanes to a 190-micron depth. In a preferred embodiment, the silicon dioxide mask is then selectively removed by a wet etch. In an exemplary embodiment, the second phase of the DRIE dry etch process utilizes a 10-micron deep etch to fully release the mirror collection plate 610 and to also release the T-shaped hinges, 612 and 614. The merged mask DRIE dry etch process de-couples the deep mirror collection plate release etch from the shallow T-shaped hinge release etch. This optimally permits the two etch processes to be individually optimized for near-vertical sidewall profile, minimal undercutting, and no backside hinge etching.

In an alternative embodiment, the mirror collection plate 610 is protected after the release etching process through the attachment of a temporary backing wafer that provides the mirror collection plate 610 with structural support and also catches any defective mirror collection plates.

In an alternative embodiment, the mirror collection plate 610 is protected after the release etching process by using the bottom cap 215 wafer as a backing wafer. In a preferred embodiment, the bottom cap 215 wafer is gold bonded to the mirror 210 wafer prior to the DRIE dry etch-process. In an alternative embodiment, during the DRIE dry etch process, the bottom cap 215 provides structural support for the mirror collection plate 610 and the beams, 1035, 1040, 1045, and 1050, catch any defective mirror collection plates 610, preventing them from being left inside the etch chamber. In a preferred embodiment, the top cap 205 is then gold bonded to mirror wafer/bottom cap wafer stack after the DRIE dry etch process.

The fabrication process for the-mirror assembly 110 preferably utilizes one or more of the following processes: merged mask KOH wet etching, merged mask DRIE dry etching, gold eutectic bonding of cap wafers to mirror wafer, and wafer-level conductive-epoxy bonding of the ceramic wafer to the mirror wafer-stack. The focus of the process modules and the overall fabrication process is improved manufacturability and yield for reduced production prices.

In a preferred embodiment, the merged-mask DRIE dry etching process further incorporates one or more manufacturing options for handling the mirror 210 during fabrication.

In an alternative embodiment, the mirror wafers 210 are attached to a temporary backing wafer for merged-mask DRIE dry etch processing. The backing wafer catches any "defective" mirror collection plate due to automated wafer handling. After merged-mask DRIE dry etching and removal of the backing wafer, both caps, 205 and 215, are then be bonded to the mirror wafer 210 with one gold-bonding step.

In another alternative embodiment, the mirror collection plate 610 is bonded to the bottom cap wafer 215 prior to the merged-mask DRIE etching process. The bottom cap 215 catches any defective mirror collection plates 610 during the merged-mask DRIE dry etching process and, therefore, acts as an inherent backing wafer. After the completion of the merged-mask DRIE dry etching process, the top cap 205 is gold-bonded to the composite mirror/bottom cap wafer stack.

The ceramic base wafer process 2010 preferably provides the base member 220. In a preferred embodiment, the base member 220 is fabricated using conventional ceramic machining processes.

Figure 33:
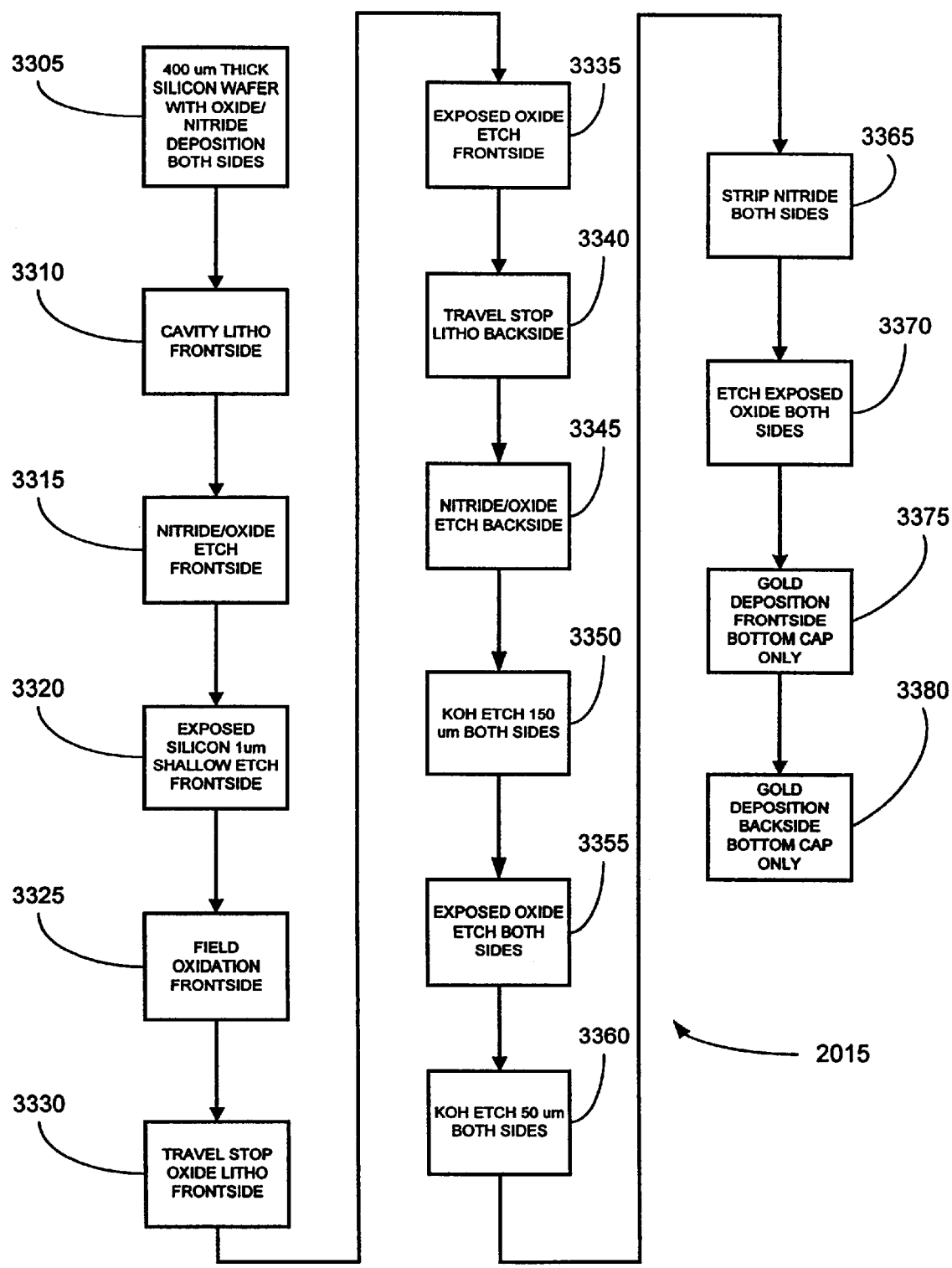
FIG. 33 is a flow chart illustrating the fabrication of the top and bottom caps of the mirror assembly of FIG. 2.

The top/bottom cap wafer process 2015 preferably provides the top cap 205 and bottom cap 215. As illustrated in FIG. 33, the top/bottom cap wafer process 2015 preferably includes the steps of: (1) provide 400 micron thick silicon wafers with pad layers of silicon dioxide and layers of silicon nitride on both sides in step 3305, (2) photolithography of the front sides of the silicon wafers for the central cavities in step 3310, (3) etch the exposed portions of the layers of silicon nitride and pad layers of silicon dioxide on the front sides of the silicon wafers in step 3315, (4) thin etch of the exposed areas of silicon on the front sides of the silicon wafers in step 3320, (5) grow field layers of silicon dioxide onto the thin etched portions of the front sides of the silicon wafers in step 3325, (6) photolithography of the front sides of the silicon wafers for the travel stops in step 3330, (7) etch the exposed portions of the field layers of silicon dioxide on the front sides of the silicon wafers in step 3335, (8) photolithography of the back sides of the silicon wafers for the travel stops in step 3340, (9) etch the exposed portions of the pad layers of silicon dioxide and layers of silicon nitride on the back sides of the silicon wafers in step 3345, (10) KOH etch the exposed silicon on both sides of the silicon wafers to depth of 150 microns in step 3350, (11) etch the exposed field layers of silicon dioxide on both sides-of the silicon wafers in step 3355, (12) KOH etch exposed portions of silicon on both sides of the silicon wafers to a depth of 50 microns in step 3360, (13) strip the layers of silicon nitride on both side of the silicon wafers in step 3365, (14) etch the exposed layers of silicon dioxide on both sides of the silicon wafers in step 3370, (15) deposit a layer of gold on the front side of the bottom cap in step 3375, and (16) deposit a layer of gold on the backside of the bottom cap in step 3380.

Figure 34:
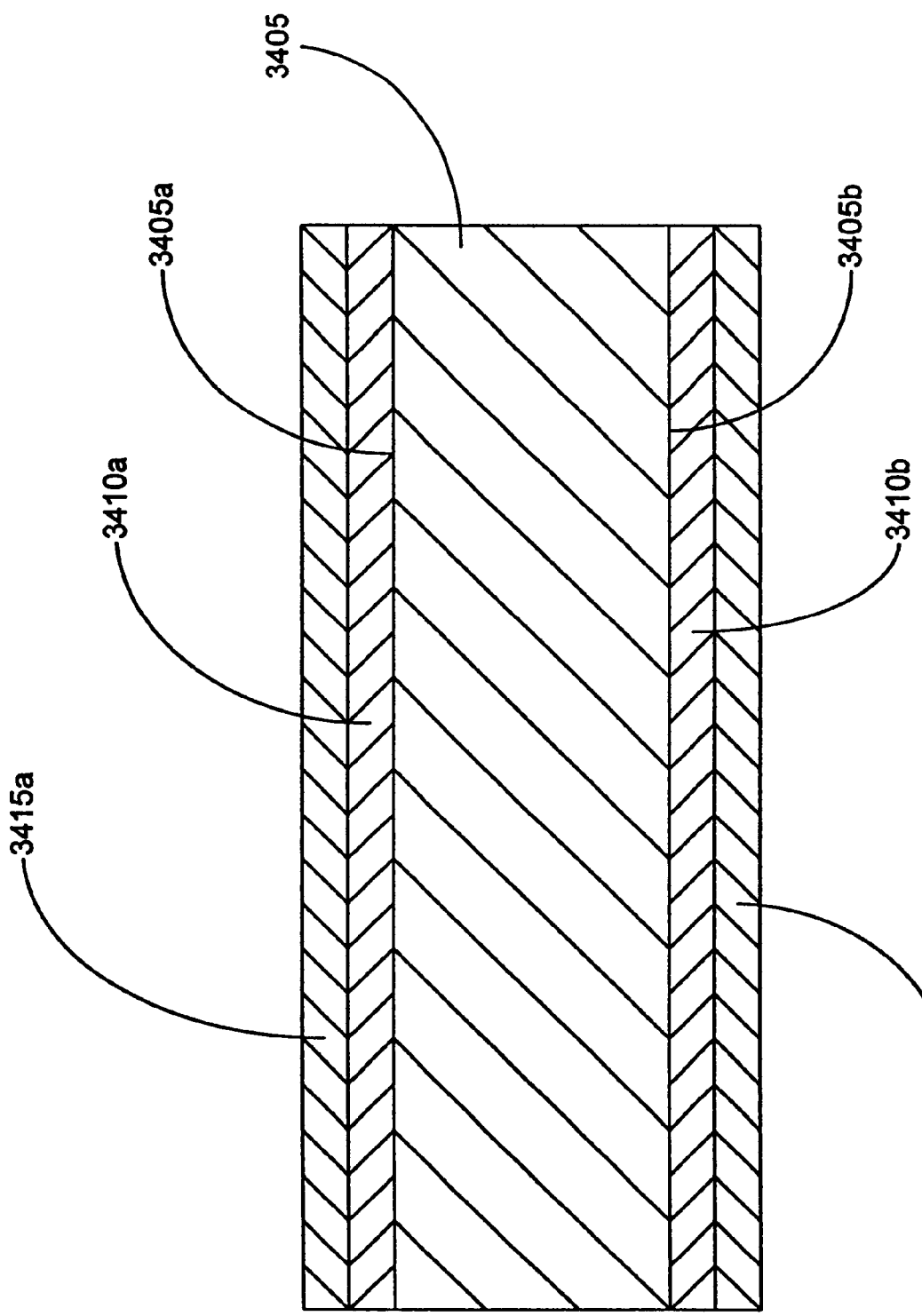
FIG. 34 is a cross-sectional illustration of a silicon wafer with pad layers of silicon dioxide and layers of silicon nitride on its front and backsides.

As illustrated in FIG. 34, in process step 3305, silicon wafers 3405 are provided having a frontside 3405a and a backside 3405b. In a preferred embodiment, the silicon wafers 3405 comprise 400 micron thick wafers of silicon. In process step 3305, pad layers, 3410a and 3410b, of silicon dioxide are then grown on both sides of the silicon wafers 3405.

In a preferred embodiment, the starting material specifications for the top/bottom cap and mirror wafers are double-side polish, thickness control of 400±7.5 microns, and a doping concentration of $10^{18}$ cm$^{-3}$ of boron. For the mirror wafers, the starting wafers preferably are deposited with 7-microns of heavily boron-doped epi on the frontside and the wafers are then polished back to approximately the 400-icron starting thickness. In a preferred embodiment, the electrical connection from the released mirror collection plate 610 to the ceramic base member 220 is through the thickness of the mirror wafer and the bottom cap wafer. The high doping of these wafers optimally provides a good, ohmic electrical contact between the mirror/bottom cap and bottom cap/base member metallization. In an alternative embodiment, double-side implanting of the bottom cap 220 and backside implanting of the mirror 210 are provided.

The pad layers, 3410a and 3410b, of silicon dioxide may be grown using any number of conventional commercially available processes. In a preferred embodiment, the layers, 3410a and 3410b, of silicon dioxide are grown by the process of thermal oxidation. The layers, 3410a and 3410b, of silicon dioxide may be grown to depths ranging, for example, from about 300 to 10000 Angstroms. In a preferred embodiment, the layers, 3410a and 3410b, of silicon dioxide are grown to depths ranging from 300 to 600 Angstroms. In process step 3305, layers, 3415a and 3415b, of silicon nitride are then applied onto the layers, 3410a and 3410b, of silicon dioxide. The layers, 3415a and 3415b, of silicon nitride may be applied using any number of conventional commercially available processes. In a preferred embodiment, the layers, 3415a and 3415b, of silicon nitride are applied by the process of chemical vapor deposition. The layers, 3415a and 3415b, of silicon nitride may be applied to depths ranging, for example, from about 0.1 to 2 microns. In a preferred embodiment, the layers, 3415a and 3415b, of silicon nitride are applied to depths ranging from about 0.12 to 0.15 microns.

Figure 35A:
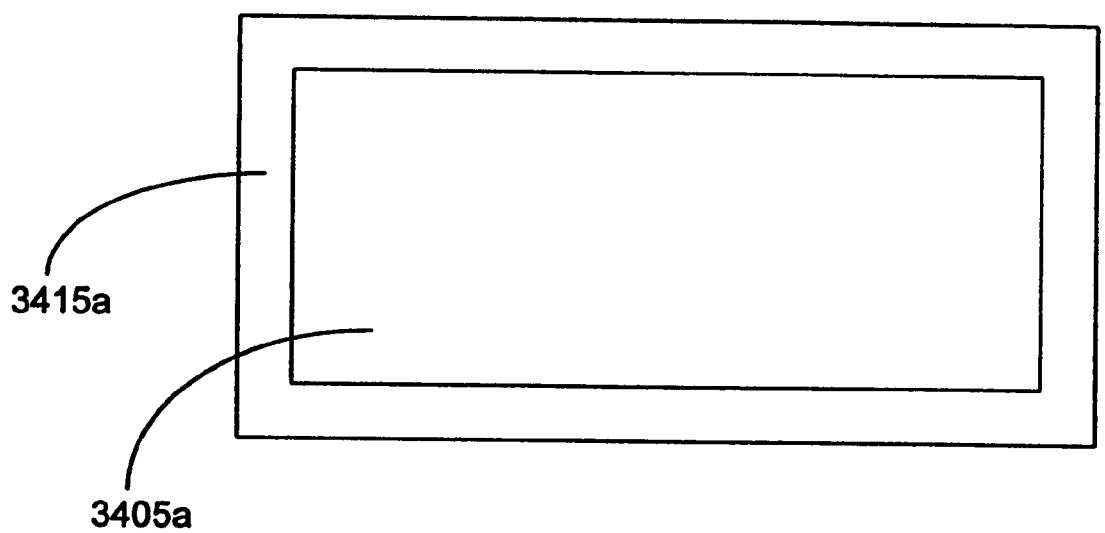
FIG. 35a is an illustration of the photolithography and etching of the layers of silicon nitride and pad layers of silicon dioxide on the frontside of the silicon wafer of FIG. 34.

As illustrated in FIG. 35a, in process steps 3310 and 3315, the pad layers 3410a of silicon dioxide and the layers 3415a of silicon nitride on the front sides 3405a of the silicon wafers 3405 are patterned and etched to provide subsequent definition for the central cavities of the top and bottom caps.

Figure 35B:
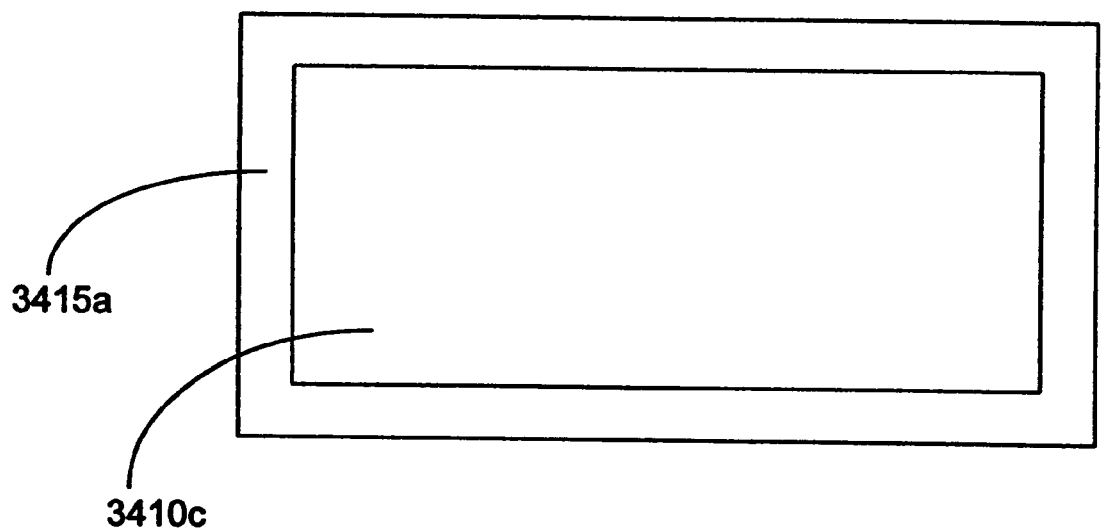

As illustrated in FIG. 35b, in process steps 3320 and 3325, the exposed portions of silicon on the frontsides 3405a of the silicon wafers 3405 are then thin etched. In a preferred embodiment, the depth of the thin etch ranges from about 0.5 to 1.5 microns in order to facilitate the growth of the field layers of silicon dioxide. Field layers 3410c of silicon dioxide are then grown onto the exposed areas of silicon on the frontsides 3405a of the silicon wafers 3405. The thickness of the field layers 3410c of the silicon dioxide is preferably greater than or equal to the combined thickness of the pad layers 3410a of silicon dioxide and the layers 3410b of the silicon nitride.

Figure 36:
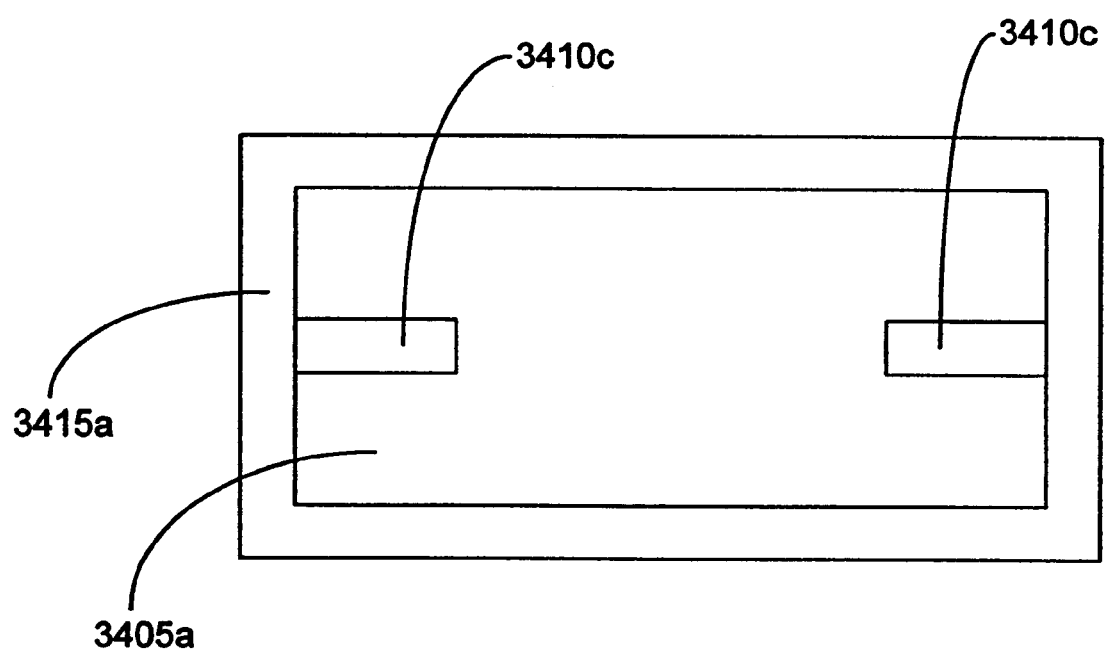
FIG. 36 is an illustration of the photolithography and etching of the field layer of silicon dioxide on the frontside of the silicon wafer of FIG. 35b.

As illustrated in FIG. 36, in process steps 3330 and 3335, the exposed portions of the field layer 3410c of silicon dioxide on the front sides 3405a of the silicon wafers 3405 are patterned and etched to provide subsequent definition for the travel stops of the top and bottom caps.

Figure 37:
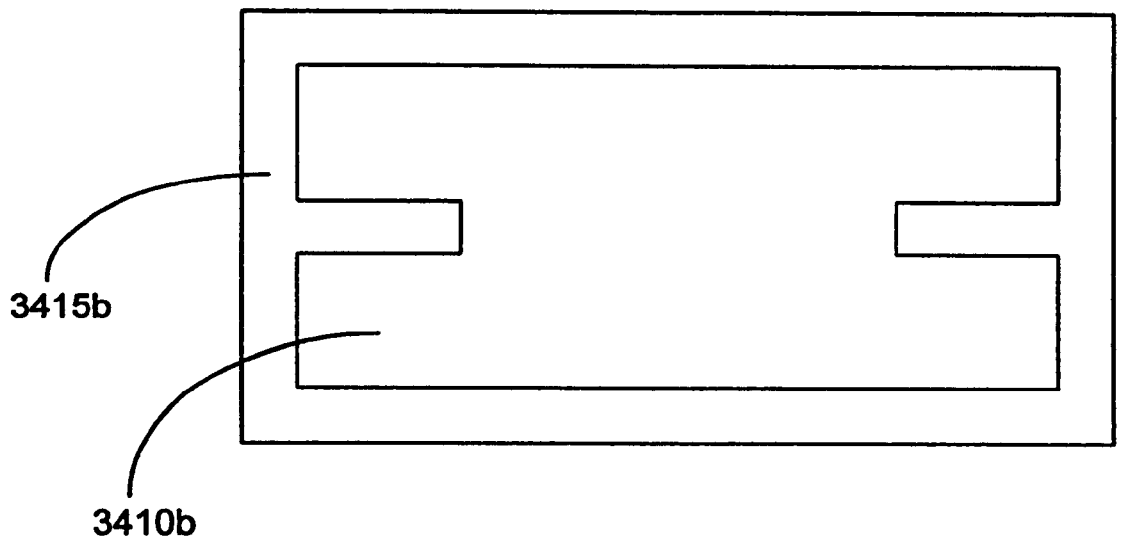
FIG. 37 is an illustration of the photolithography and etching of the layer of silicon nitride on the backside of the silicon wafer of FIG. 36.
Figure 38:
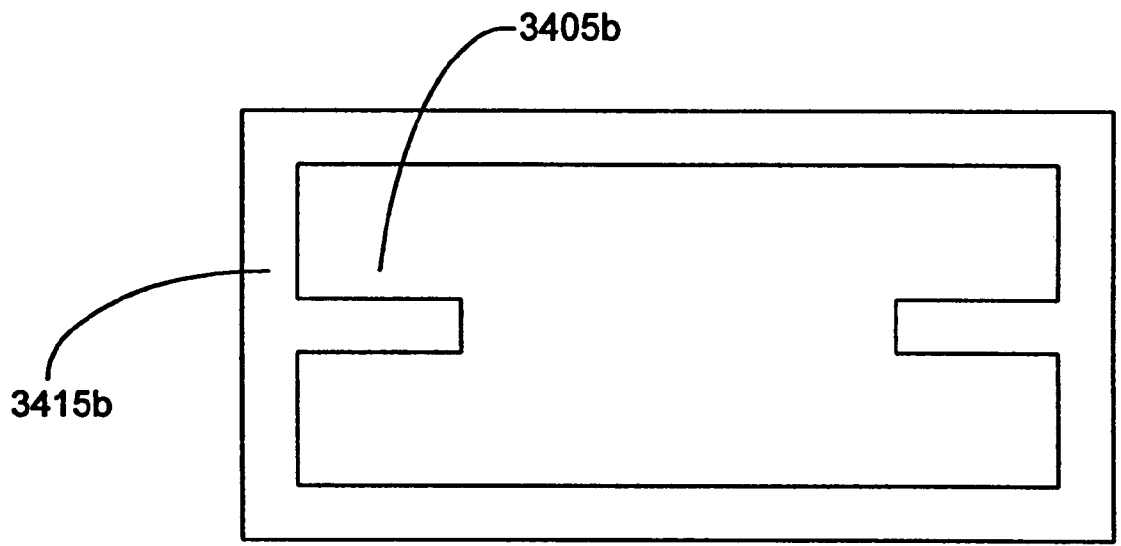
FIG. 38 is an illustration of the photolithography and etching of the pad layer of silicon dioxide on the backside of the silicon wafer of FIG. 37.
Figure 39:
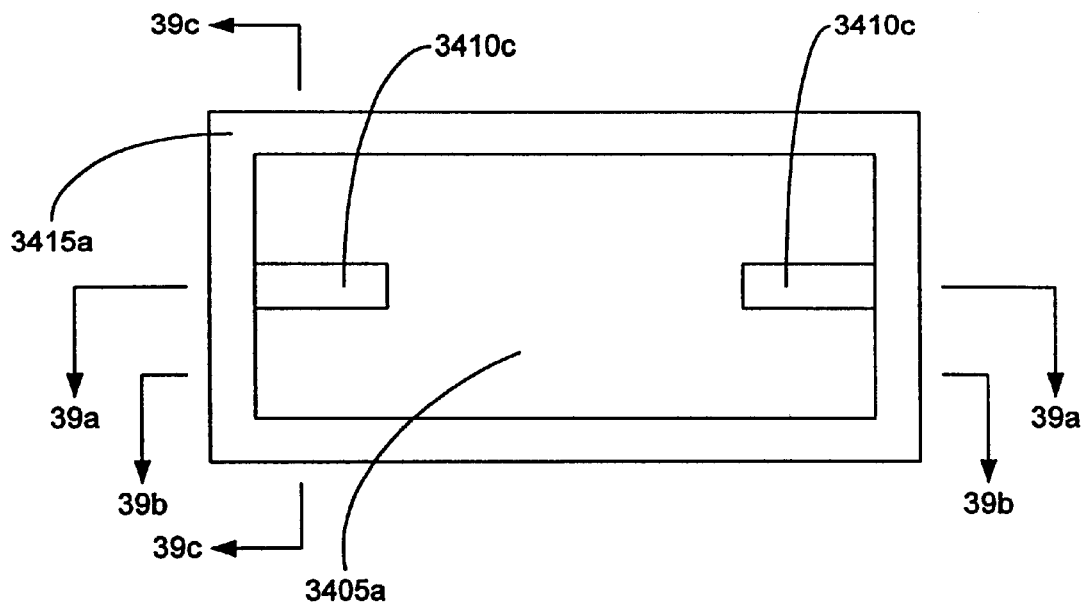
FIG. 39 is an illustration of the KOH etching to a depth of 150 microns of the exposed areas of silicon on the front and back sides of the silicon wafer of FIG. 38.
Figure 39A:
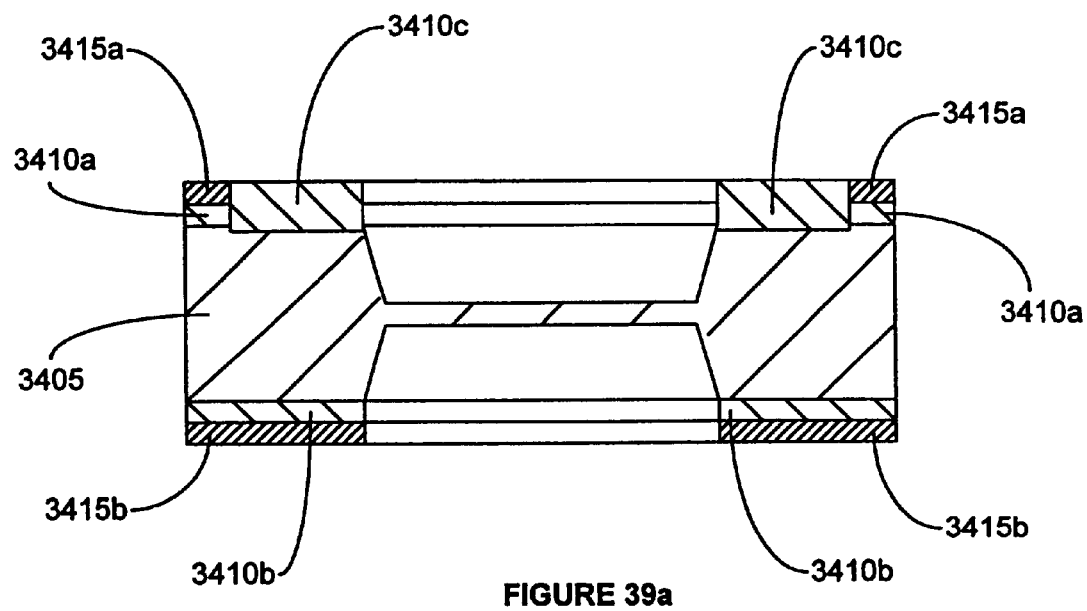
FIG. 39a is a cross-sectional illustration of the silicon wafer of FIG. 39.
Figure 39B:
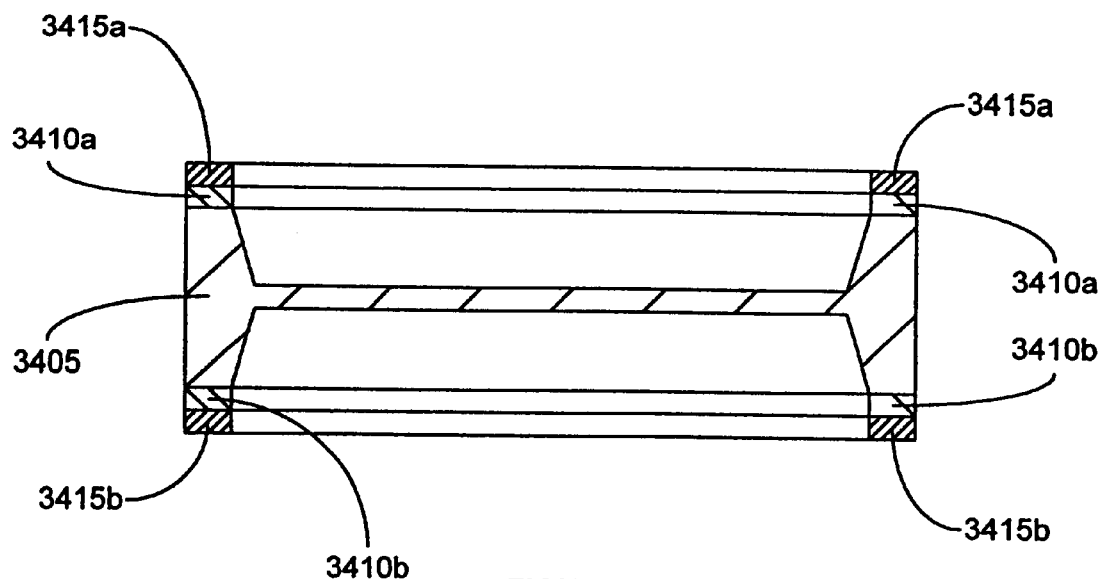
FIG. 39b is a cross-sectional illustration of the silicon wafer of FIG. 39.
Figure 39C:
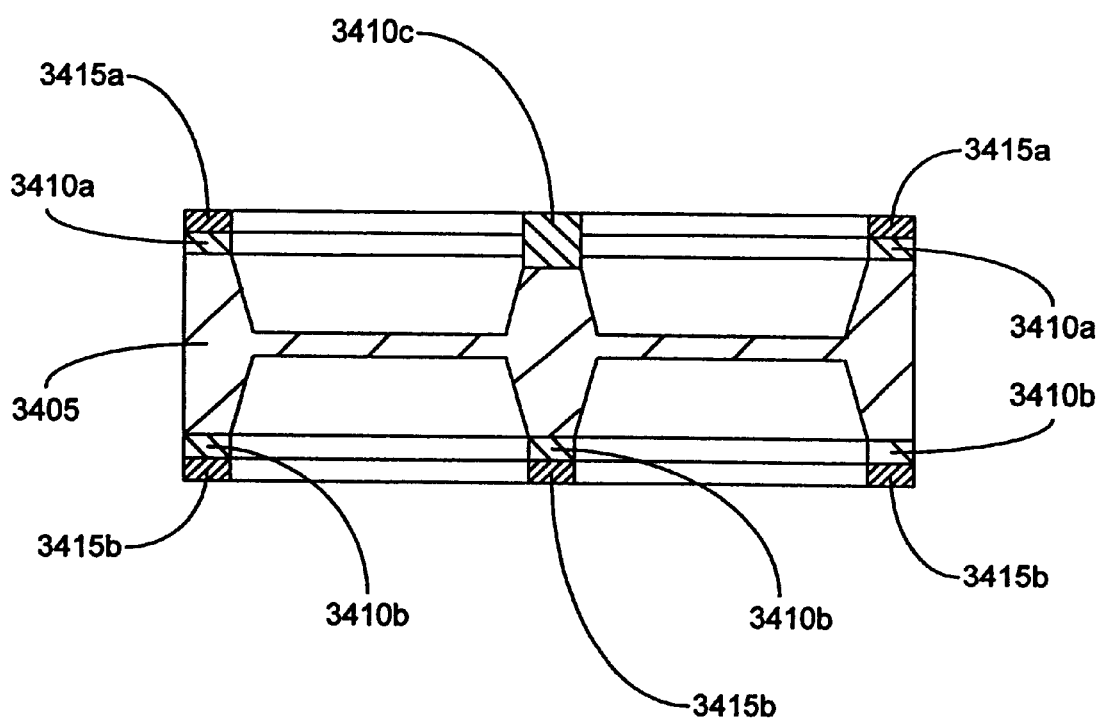
FIG. 39c is a cross-sectional illustration of the silicon wafer of FIG. 39.

As illustrated in FIGS. 37 and 38, in process steps 3340 and 3345, the pad layers 3415a of silicon dioxide and layers 3415b of silicon nitride on the back sides 3405b of the silicon wafers 3405 are patterned to provide subsequent definition for the travel stops and central cavities of the top and bottom caps.

As illustrated in FIGS. 39, 39a, 39b and 39c, in process step 3350, the exposed portions of silicon on both sides of the silicon wafers 3405 are KOH etched to a depth of 150 microns. This defines the cavities and travel stops for the top and bottom caps. This KOH etching process preferably results in a central membrane of silicon having a thickness of about 100 microns.

Figure 40:
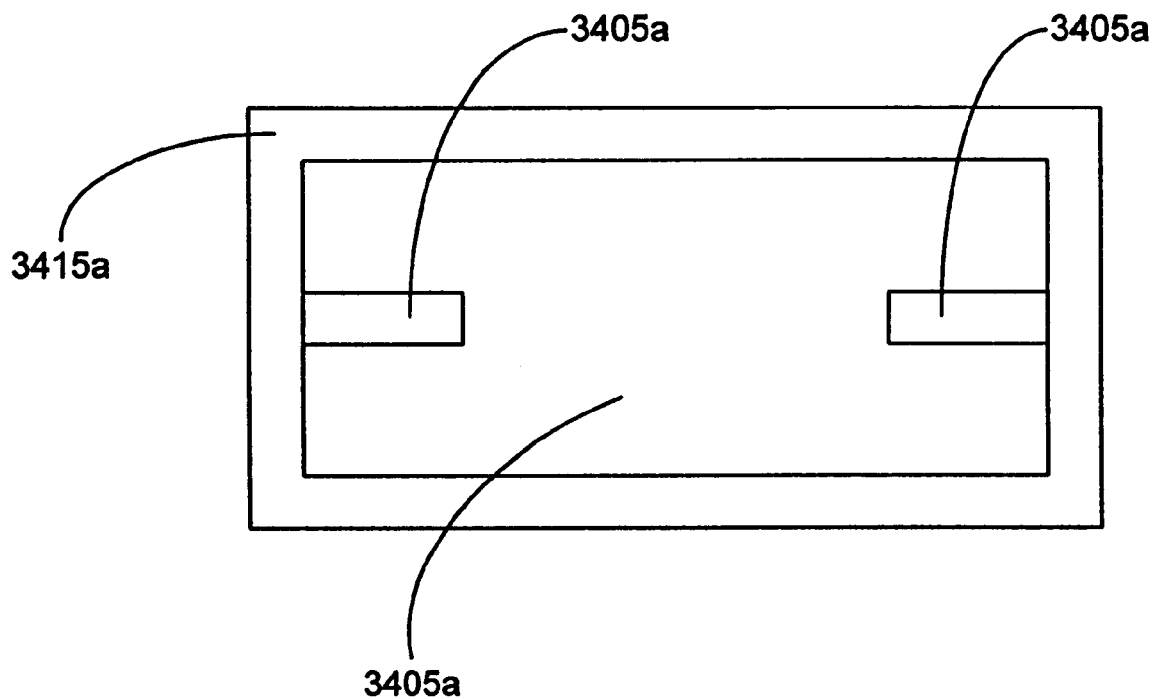
FIG. 40 is an illustration of the etching of the exposed portions of the field layer of silicon dioxide on the front side of the silicon wafer of FIG. 39.
Figure 41:
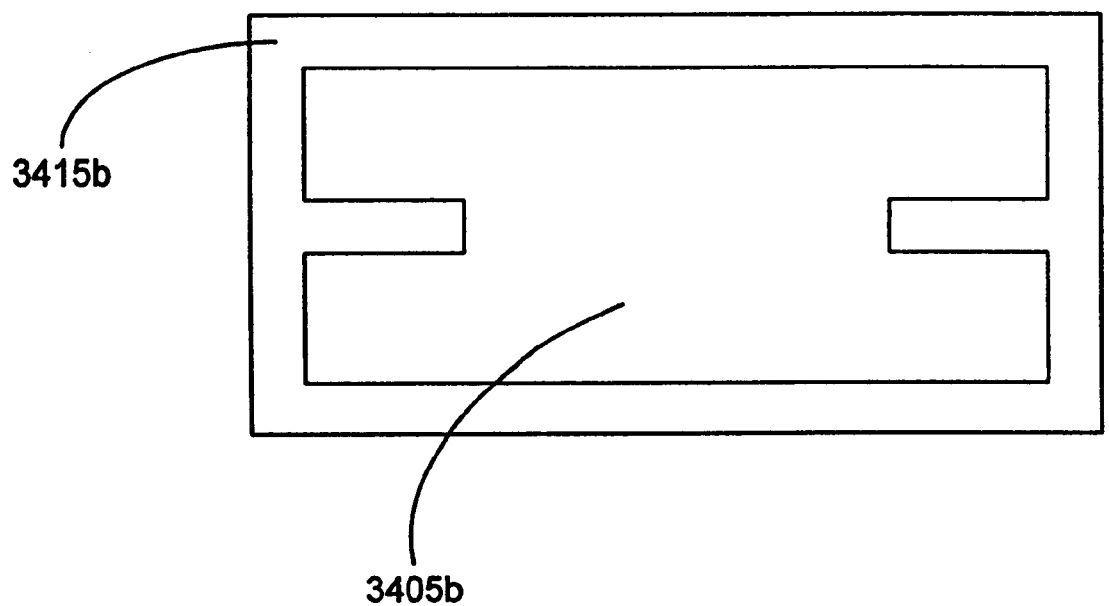
FIG. 41 is an illustration of the etching of the exposed portions of the layer of silicon dioxide on the back side of the silicon wafer of FIG. 40.
Figure 42:
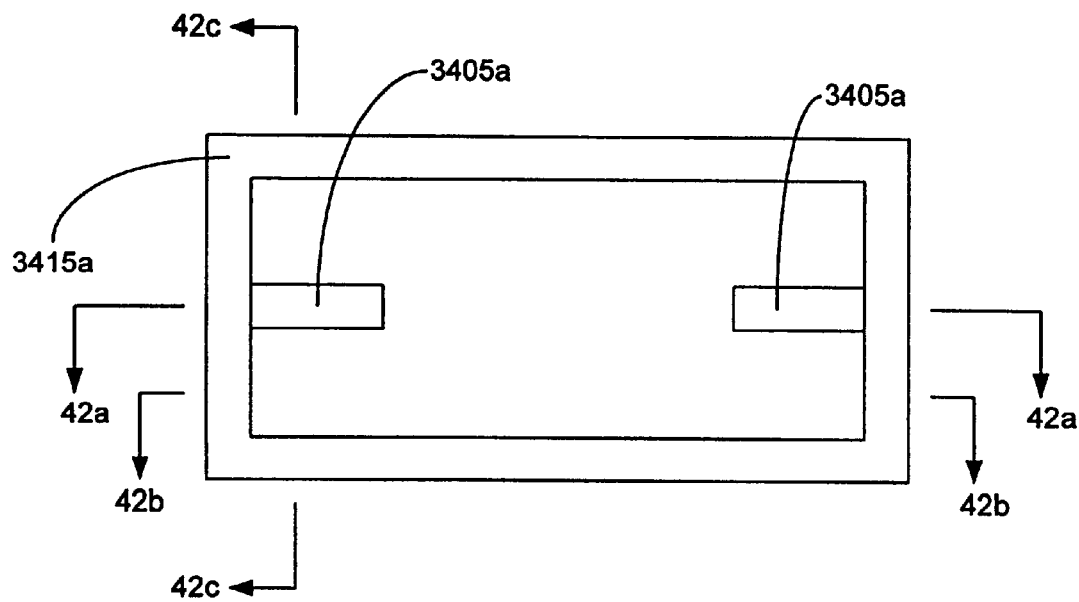
FIG. 42 is an illustration of the KOH etching of the exposed areas of silicon to a depth of 50 microns of the front and back sides of the silicon wafer of FIG. 41.
Figure 42A:
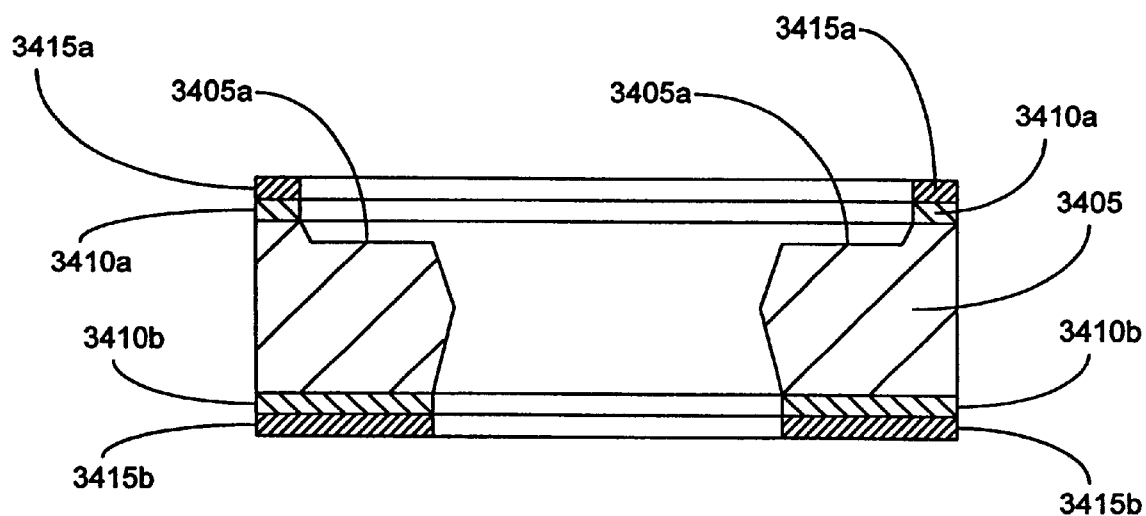
FIG. 42a is a cross-sectional illustration of the silicon wafer of FIG. 42.
Figure 42B:
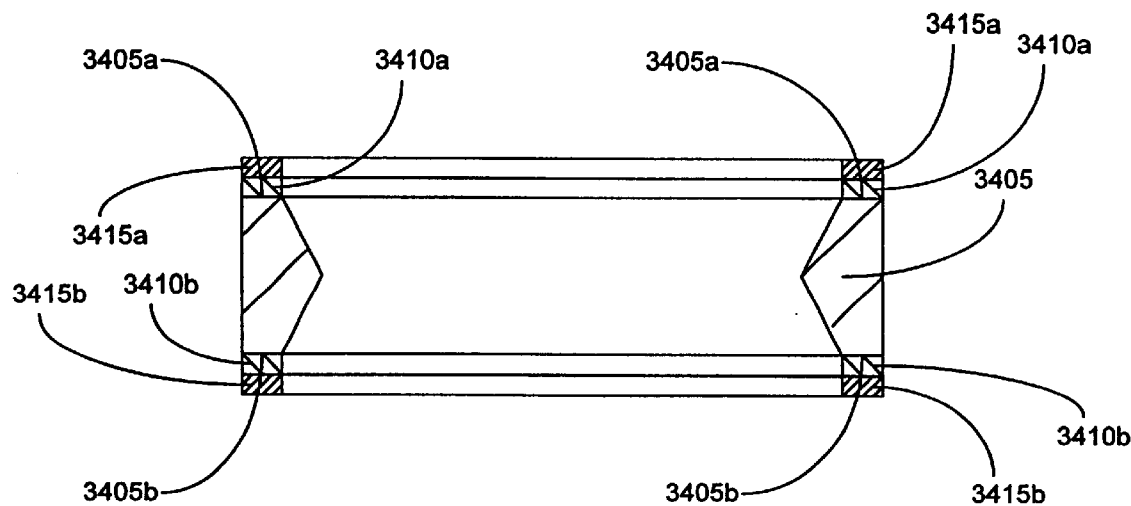
FIG. 42b is a cross-sectional illustration of the silicon wafer of FIG. 42.
Figure 42C:
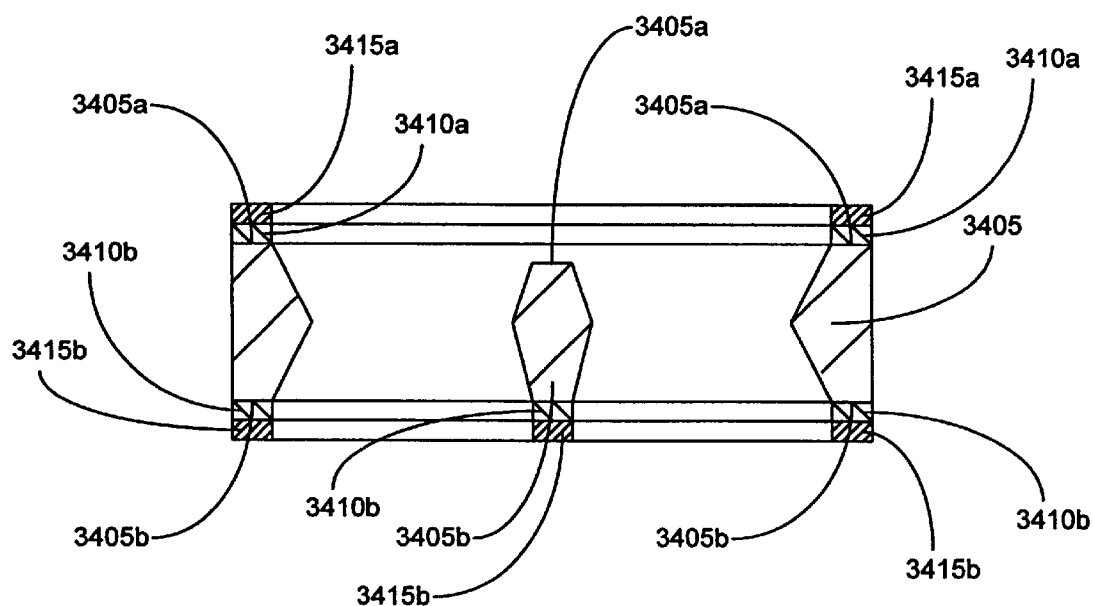
FIG. 42c is a cross-sectional illustration of the silicon wafer of FIG. 42.

As illustrated in FIGS. 40 and 41, in process step 3355, the exposed portions of the pad layers 3410a and field layers 3410c of silicon dioxide on both sides of the silicon wafers 3405 are etched. This etching process permits the subsequent recessing of the top surfaces of the travel stops.

As illustrated in FIGS. 42, 42a, 42b, and 42c, in process step 3360, the exposed portions of silicon on both sides of the silicon wafers 3405 are KOH etched to a depth of about 50 microns. This provides final definition for the cavities and travel stops of the top and bottom caps. It further preferably recesses the top surfaces of the travel stops by about 50 microns.

As illustrated in FIGS. 43, 43a, 43b and 43c, in process steps 3365, 3370, 3375, and 3380, the remaining portions of the layers, 3410a, 3410b, 3415a and 3415b, of silicon dioxide and silicon nitride are stripped from both sides of the silicon wafers 3405. For the top cap 205, this preferably completes the manufacturing process. For the bottom cap 215, layers, 4305a and 4305b, of gold are then applied to the top and bottom surfaces of the silicon wafer 3405. In a preferred embodiment, the layers, 4305a and 4305b, of gold are bonded to the silicon substrate 3405 using intermediate layers of titanium.

In an alternative embodiment, the processing of the bottom cap 215 includes modified masking steps to provide the beams 1035, 1040, 1045, and 1050. For example, these may be provided by modifying process steps 3330 and 3340 to include provision for the beams, 1035, 1040, 1045, and 1050.

As illustrated in FIG. 33, process steps 3305 to 3370 provide a wet KOH LOCOS merged-mask micro-machining process. More generally, process steps 3305 to 3370 provide a merged-mask micro-machining process including the steps of: (1) providing a silicon substrate; (2) successively applying a plurality of masking layers onto the silicon substrate; (3) successively patterning the layers of masking material; (4) thin etching the exposed regions of silicon; (5) growing a field layer of silicon dioxide; (6) patterning the field layer of silicon dioxide; (6) etching the exposed portions of the silicon substrate; (7) etching the exposed portions of the field layer of silicon dioxide; and (8) etching the exposed portions of the silicon substrate.

Figure 43:
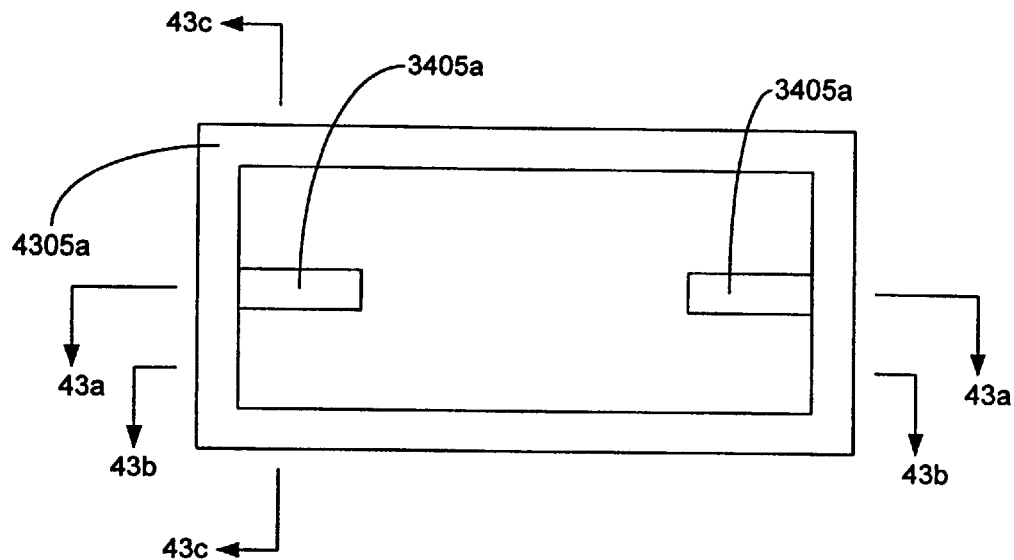
FIG. 43 is an illustration of the application of a layer of gold to both sides of the silicon wafer of FIG. 42.
Figure 43A:
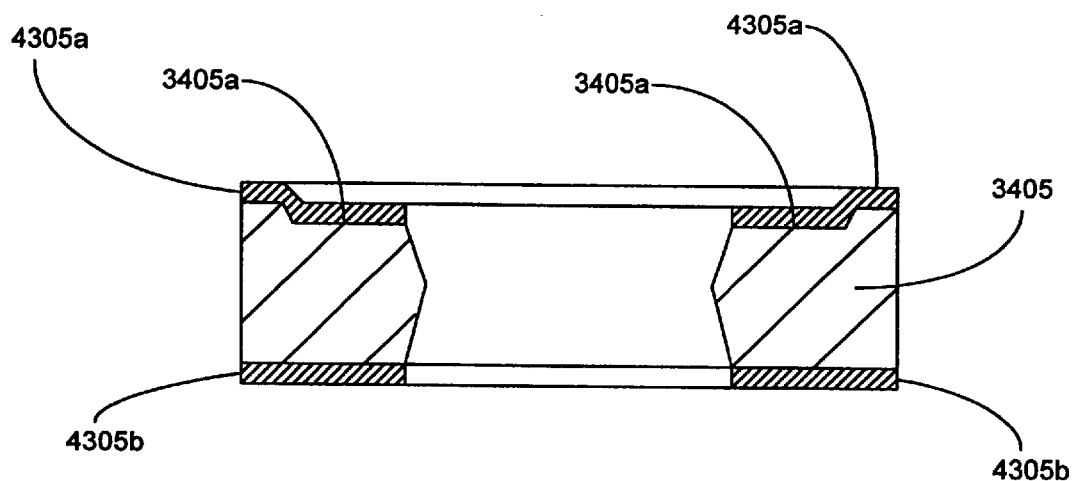
FIG. 43a is a cross-sectional illustration of the silicon wafer of FIG. 43.
Figure 43B:
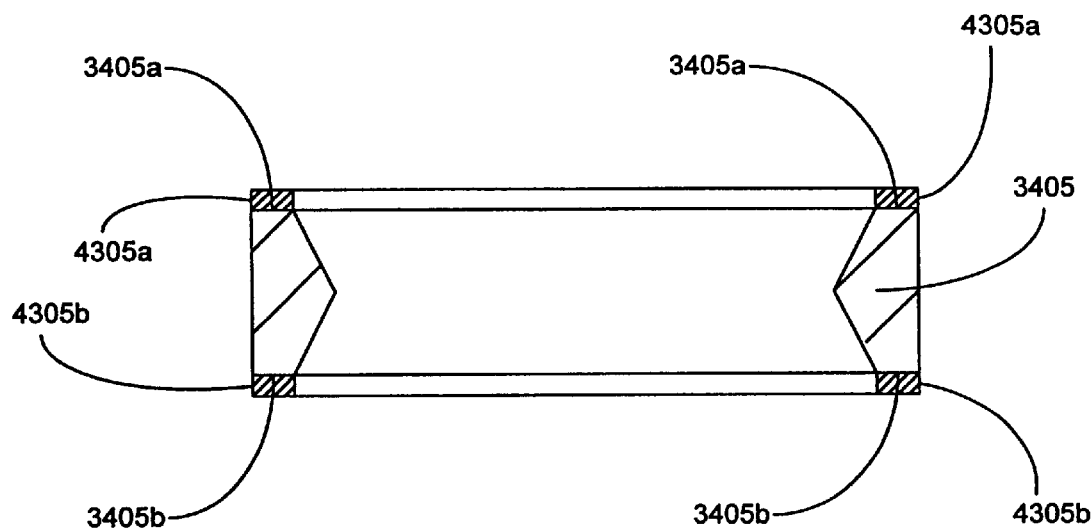
FIG. 43b is a cross-sectional illustration of the silicon wafer of FIG. 43.
Figure 43C:
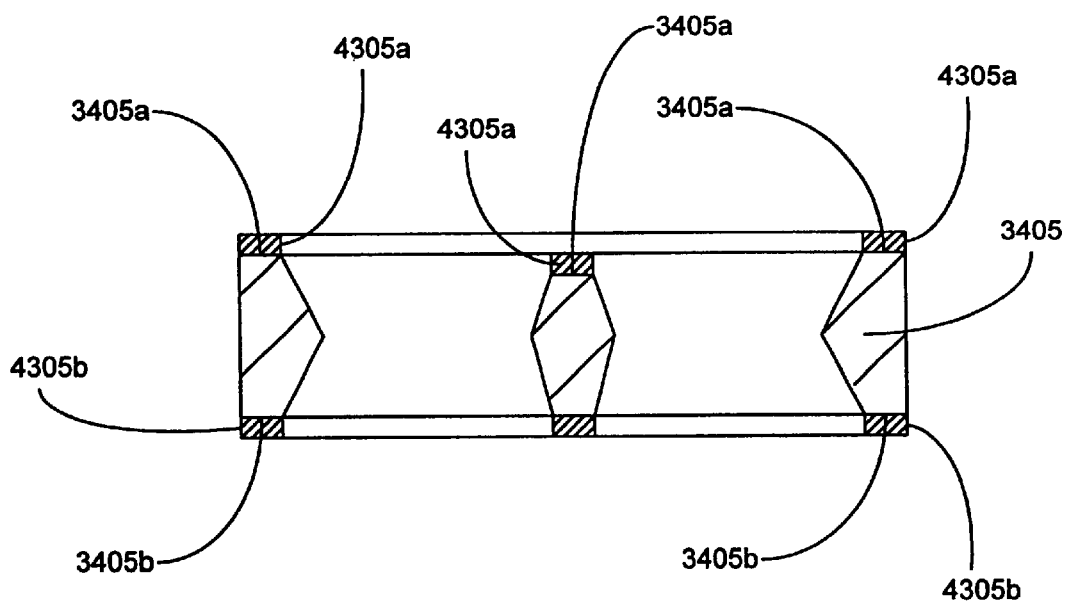
FIG. 43c is a cross-sectional illustration of the silicon wafer of FIG. 43.
Figure 43D:
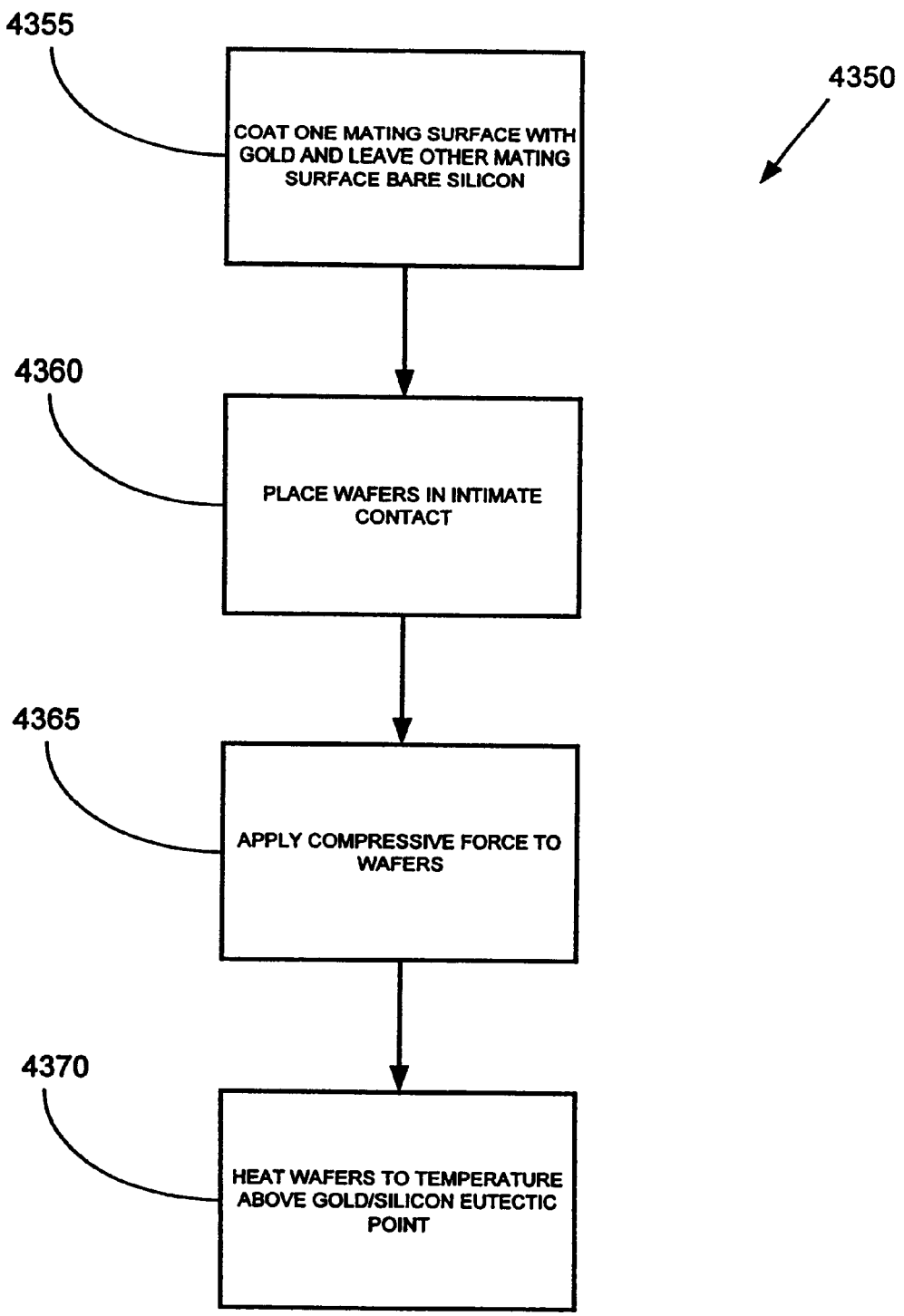
FIG. 43d is a flow chart illustrating an embodiment of a process for bonding the top/bottom caps to the mirror.

The gold bonding of cap wafers to mirror process 2020 preferably provides a sub-assembly including the top cap 205, the mirror 210 and the bottom cap 215. Referring to FIG. 43d, in a preferred embodiment, the gold bonding comprises a gold eutectic wafer bonding process 4350 that includes the steps of: coating one mating wafer surface with a layer of gold, while the mating surface of the other wafer comprises bare silicon in step 4355, placing the mating surfaces of the wafers in intimate contact in step 4360, compressing the mating surfaces together in step 4365, and heating the wafers in step 4370 above the gold/eutectic temperature. In a preferred embodiment, the process 4350 provides a hermetic bond between the wafers.

In a preferred embodiment, to minimize the number of gold deposition steps (reduce cost) and to avoid deep cavity lithography to define metallization on the backside of the mirror (yield), both top/bottom cap, 205 and 215, wafers are bonded to the mirror 210 using gold eutectic bonding. For gold eutectic wafer bonding, one wafer surface is coated with gold while the wafer surface is bare silicon, and the wafers are placed into contact with a large force applied and heated beyond the gold/silicon eutectic point. The gold diffuses into the bare silicon wafer and forms a strong, hermetic wafer bond.

The conductive-epoxy bonding of the ceramic base wafer 220 to the mirror wafer stack process 2025 preferably provides an assembly including the top cap 205, the mirror 210, the bottom cap 215, and the base member 220. In a preferred embodiment, the conductive-epoxy bonding process includes the use of a conventional conductive epoxy preform. In a preferred embodiment, the metal ring 1340 around the perimeter of the base member 220, in combination with the conductive-epoxy bonding of the base member 220 to the bottom cap 215, preferably provides electrical contact to the bottom cap 215. The wafer bonding process preferably allows the bottom cap 215 to be in direct electrical contact with the mirror collection plate 610. Consequently, the mirror collection plate 610 preferably can be electrically accessed, controlled, and monitored using the base member 220. The electrode drive pad and mirror contact metallization, 1310a, 1315a, and 1340, on the base member 220 are preferably further connected to electrical contact pads on the backside of the base member 220, utilizing conventional thick-film through-hole via technology, which effectively makes the mirror assembly 110 a surface-mount component.

The dicing of the packaged mirror wafer stack 2030 preferably provides the mirror assembly 110. In a preferred embodiment, the mirror 210 is gold bonded to the top cap 205 and the bottom cap 215. This gold-bonded sub-assembly is then preferably bonded to the ceramic base member 220. The gold-bonded sub-assembly, including the top cap 205, mirror 210 and bottom cap 215, is preferably bonded to the ceramic base member 220 using a wafer-scale conductive-epoxy preform. In a preferred embodiment, the 4-wafer stacked sub-assembly including the top cap 205, mirror 210, bottom cap 215 and base member 220, defines a packaged mirror wafer stack. In a preferred embodiment, wafer-size sheets of dicing tape are then applied to both the top cap 205 and to the bottom cap 215 to hermetically protect the 4-wafer stack from the dicing saw water. The 4-wafer stack is then diced using a conventional automated dicing saw into individual packaged mirror dies. The tape is then removed.

The testing of the packaged mirror die process 2035 preferably tests the electrical, optical, and mechanical performance of the mirror assembly 110.

A mirror assembly has been described that preferably includes a half-thickness micromirror, silicon T-shaped hinges, and wafer-level micromachined silicon top/bottom caps. The mirror assembly preferably includes the following technical elements: (1) design for reduced cost and improved manufacturability; (2) improved mirror position accuracy (i.e., combination of "droop" and pointing accuracy); (3) robust shock protection for more demanding shock specification; and (4) capping (packaging) of the mirror while addressing laser clipping issues.

The manufacturing process for the mirror assembly 110 includes a number of significant manufacturing cost reductions.

First, the micromachined silicon cap wafers, 205 and 215; significantly reduce the material costs of the packaging, as compared with conventional packaging. For example, the top/bottom caps, 205 and 215, are bonded at the wafer level, which is a batch process. This is more cost-effective than the conventional die level (piece part) assembly process.

Second, the half-thickness mirror collection plate 601 is preferably achieved through a balanced combination of wet etching (inexpensive) and dry etching (expensive) techniques. In anexemplary embodiment, the silicon-hinge/half-thickness mirror process typically provides a 72% reduction in DRIE etch time compared to a full-thickness mirror process.

Third, die size is minimized as much as possible by minimizing the frame area of the mirror. Also, the use of double-side wet etching of the top/bottom cap wafers minimizes the sidewall taper which, in an exemplary embodiment, resulted in a 20% reduction in die size while still optimally addressing the top cap laser clipping issues.

The mirror assembly 110 also provides a number of advantages with regarding to positional accuracy and shock survivability.

For example, in several exemplary bar code scanner applications, the rotational position accuracy of the laser beam may be required to be within 1.3° when the mirror is subject to an, across-the-hinge, self-induced gravity torque, Torque=T=mg*h/2 (where mg=mirror self-weight, h=mirror thickness). The mirror collection plate 610 position accuracy is composed of the pointing accuracy and "droop" components. Since the torsional spring constant Kr and the mass of the mirror collection plate 610 is predetermined by the mirror resonant frequency F and mirror size, the tilt angle θ of the mirror collection plate 610 is also determined by the relation θ=T/Kr. In an exemplary embodiment, the tilt angle of the mirror collection plate 610 is greater than 1.3° for a full-thickness mirror. The positional accuracy of the mirror collection plate 610 accuracy is improved, in an exemplary embodiment, (i.e., reduction in mirror tilt angle) by increasing the resonant frequency specification to 50 Hz since this increases the torsional spring constant. The half-thickness mirror collection plate design and, backside mirror collection plate cavity etch, by reducing the mirror collection plate self weight about the T-shaped hinges, 612 and 614, allow the exemplary position accuracy specification to be met.

As shown in FIG. 19, in an exemplary embodiment, an incident laser shines on the mirror collection plate surface at a 45° angle along line A and reflects back to space along line B. In an exemplary embodiment, the laser beam has a finite spot size that is about 500-microns wide and 1000-microns long. The 500-micron wide laser beam is centered along line A and B. In an exemplary embodiment, the mirror collection plate 610 is required to scan ±10°. In this exemplary embodiment, the reflected laser beam scan range is bounded by B' and B". To avoid laser clipping, it is required that there is no obstruction along the light path. The use of double-side wet etching of the top/bottom caps 205 and 215 provides the double-side tapers in the interior edges of the top/bottom caps, 205 and 210, that minimize laser clipping and provide "cap capture" shock protection. Furthermore, the "cap capture" preferably accommodates variations in the x-direction gap ranging from 10 to 100 microns when the mirror collection plate 610 is rotated out of plane. In this manner, the "cap capture" preferably provides shock protection up to about 2000 g/1.1 ms half sine wave input. Finally, the left and right rim cut-outs, 330 and 340, of the top cap 205 preferably minimize the obstruction path along the light path and the clipping effects.

In an exemplary embodiment, to avoid right side clipping, a clear optical pathway is provided in the column space defined by B"±250 microns, which is not a problem for a perfect alignment of the laser beam to the mirror collection plate 610. The clipping problem typically arises when there is a large misalignment from the manual scan engine assembly operation, shifting the laser source rightwards or leftwards from the mirror centerline. As illustrated in FIG. 19, the right most line could be line B''' which is parallel to B''. Intersecting B''' with the plane of the mirror collection plate 610, results in a clipping distance of 600 microns. Consequently, the usable portion of the mirror collection plate 610 on the right half is 1250 microns (50% of the 2.5-mm mirror size)–600 microns (clipping distance)=650 microns. The allowable misalignment to the right is 650 microns –250 microns (50% laser spot size)=400 microns (16 mils). Similarly, in an exemplary embodiment, the clipping on the left side is. 240 microns and allowable misalignment to the left can be as large as 760 microns (30 mils). If the laser/mirror alignment is better than 16 mils, then there is no clipping issue. Furthermore, if the position accuracy of the laser is improved, it provides an opportunity to considerably reduce the mirror die size, since the collection area can be reduced and there would be a corresponding reduction in the left/right cap rim cuts. It is understood that this linear position accuracy is coupled with angular position accuracy of the light source at 45°. For example, if the mounting angle happened to be 55°, laser clipping would be much worse.

In an exemplary embodiment, the top cap wafer travel-stop fingers, 310 and 320, overshadow the mirror collection plate 610 by 300 microns in the y-direction. In an exemplary embodiment, the minimum overlap required for the travel stop fingers, 310 and 320, to function as Z-direction travel stops. Therefore, in an exemplary embodiment, the usable mirror collection plate area is 1250 microns (50% of the 2.5-mm mirror size)–300 microns (clipping distance)=950 microns and the allowable misalignment is 950 microns–500 microns (50% of laser spot size)=450 microns (18 mils).

One method for alleviating the laser clipping effect is to mount the laser source at an angle of less than 45°. In several exemplary embodiments, as illustrated in Table 1, the relationship, between the laser mounting angle and the clipping length resulted in the following:

TABLE 1

Mounting Angle and Clipping Length Relationship

| Mounting Angle | Clipping (microns) | | Top Cap Rim Width (microns) | |
|---|---|---|---|---|
| | Left | Right | Left | Right |
| 45 | 240 | 600 | 200 | 50 |
| 40 | 180 | 430 | 200 | 50 |
| 35 | 80 | 280 | 200 | 50 |
| 28 | 0 | 100 | 200 | 50 |
| 35 | 180 | 280 | 300 | 50 |
| 25 | 0 | 100 | 200 | 100 |

In an exemplary embodiment, the shock survivability specification for the mirror assembly 110 is a 2,000 g, 1.0 milliseconds duration half-sine pulse. This correlates to a 6-foot drop with 100% rebound. This is a demanding shock specification for a micromachined device. Furthermore, this exemplary specification is for the bare capped mirror assembly 110, which does not take into account the inherent shock absorbency of a conventional external barcode scanner product package. In an exemplary embodiment, the mirror assembly 110 satisfies these stringent requirements using a variety of shock protection features. For example, as described above, the mirror collection plate 610 is preferably shock protected by the frame, 602, 604, 606 and 608, for translational shock inputs in the plane of the mirror collection plate 610 in either the X-axis and/or Y-axis. As also described above, the travel-stop fingers, 310, 320, 1010, and 1020 of the top/bottom caps, 205 and 215, preferably provide shock protection for the mirror collection plate 610 for out-of-plane translational shock inputs in the Z-direction. The most difficult shock protection to provide the mirror collection plate 610 is translational shock while the mirror collection plate 610 is rotated out-of-plane. For the exemplary 3-mm×3-mm mirror collection plate 610, when the mirror collection plate 610 rotates more than 7.5°, the half-thickness mirror collection plate 610 is out of the plane of the frame, 602, 604, 606 and 608, so the frame, 602, 604, 606, and 608, no longer provides shock protection for shock inputs with an X-axis component. For this situation, the tapered inside perimeter walls of the top/bottom caps, 205 and 215, preferably capture the mirror collection plate 610 ("cap capture"). For any degree of rotation, the frame, 602, 604, 606, and 608, still provides shock protection for the Y-axis component of a shock input since some portion of the half-thickness mirror collection plate 610 will always be in the plane of the frame, 602, 604, 606 and 608 near the region of the T-shaped hinges. 612 and 614.

Furthermore, as illustrated in FIG. 18, the interior tapered walls of the top/bottom caps, 205 and 215, provide the mirror collection plate 610 with shock protection for shock inputs with an X-axis component when the mirror collection plate 610 is rotated out of the plane of the frame, 602, 604, 606 and 608. All of these shock protection design features preferably provide the mirror collection plate 610 with three-dimensional shock protection and preferably permit the mirror collection plate to withstand a 2000 g/1.0 mS half-sine shock input in any of the (3) directional axes, any combination of directional axes, and any combination of directional axes with the mirror collection plate rotated up to ±14°.

In a preferred embodiment, the primary purpose of the auxiliary travel-stop fingers, 616, 618, 620 and 622, attached to the mirror collection plate 610 is to provide overswing protection for the mirror collection plate 610 during operation. In an exemplary embodiment, the shock protection capability of these 200-icron thick travel stop fingers, 616, 618, 620 and 622, is 2000 g/0.5 mS (for any combination of translational and rotational shock inputs). The addition of the "cap capture" design preferably further enhances this shock protection to a level of 2000 g/1. OmS shock-specification. The auxiliary travel stops, 616, 618, 620 and 622, also serve a secondary purpose, which is to provide some limited shock protection to the bare mirror wafers for the normal handling that occurs during the fabrication process—in particular, after the DRIE etch to release the mirror collection plate 610 and prior to the top/bottom cap wafer bonding process.

In an alternative embodiment, the mirror assembly 110 is further modified in a well known manner, for example, as disclosed in Marc Madou, Fundamentals Of Microfabrication, CRC Press, New York, N.Y., Volume A43, pp. 466, to provide a variable capacitance accelerometer.

In an alternative embodiment, the mirror assembly 110 is further modified in a well known manner, for example, as disclosed in Jan Soderkvist, Micromachined Gyroscopes, Sensor and Actuators, Vol. A43, 1994, pp. 65–71 and H. Hashimoto, C. Cabuz, K. Minami and M. Esashi, Silicon Resonant Angular Rate Sensor Using Electromagnetic Excitation And Capacitive Detection, Journal Of Micromechanics and Microengineering, Volume 5, No. 3, 1995, pp. 219–225 to provide a gyroscope.

Figure 44:
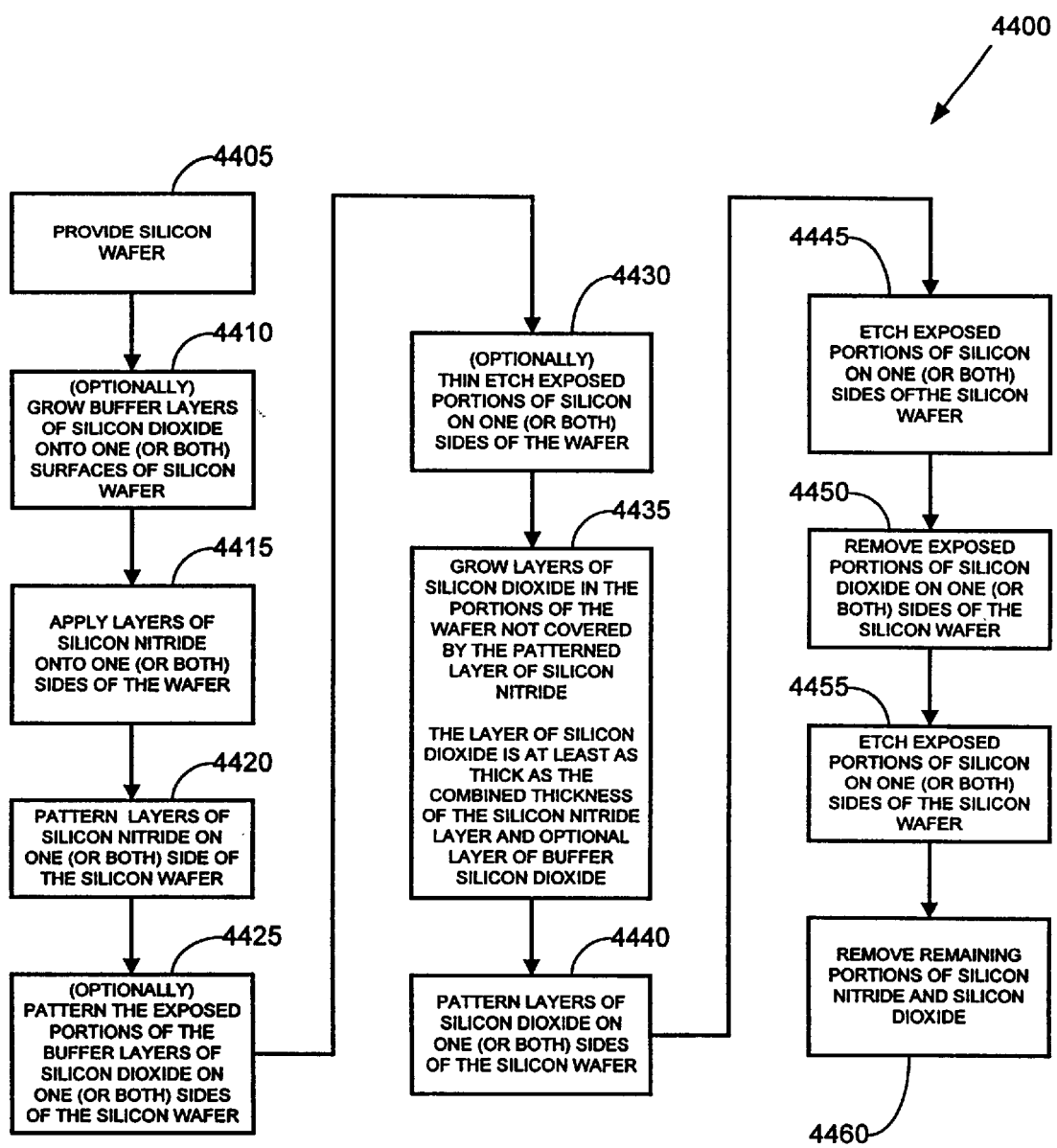
FIG. 44 is an illustration of a flow chart for various alternative embodiments of LOCOS merged-mask micromachining processes.

Referring to FIG. 44, several alternative embodiments of a localized oxidation of silicon (LOCOS) merged-mask micro-machining processes 4400 are illustrated. In a preferred embodiment, one of these processes 4400 is used in forming at least a portion of the mirror 210 and/or the top and bottom caps, 205 and 215. As illustrated in FIG. 44, the LOCOS merged-mask micro-machining process 4400 preferably includes the following process steps: (1) provide a silicon wafer in step 4405, (2) (optionally) grow a buffer layer of silicon dioxide onto the surface of the silicon wafer in step 4410, (3) apply a layer of silicon nitride onto the silicon wafer in step 4415, (4) pattern the layer of silicon nitride in step 4420, (5) (optionally) pattern the exposed portions of the buffer layer of silicon dioxide in step 4425, (6) (optionally) thin etch the exposed portions of the surface of the silicon wafer in step 4430, (7) grow field layers of silicon dioxide onto the portions of the silicon wafer not covered by the patterned layer of silicon nitride in step 4435 (the field layer of silicon dioxide is preferably at least as thick as the combined thicknesses of the layer of silicon nitride and the optional buffer layer of silicon dioxide), (8) pattern the layer(s) of silicon dioxide in step 4440, (9) etch the exposed portions of the silicon wafer in step 4445, (10) remove the exposed portions of the layer(s) of silicon dioxide in step 4450, (11) etch the exposed portions of the silicon wafer in step 4455, and finally (12) remove the remaining portions of the layers of silicon dioxide and silicon nitride in step 4460. In this manner, five alternative LOCOS merged-mask micro-machining process embodiments are provided for etching a substrate to multiple etch depths.

As will be recognized by persons having ordinary skill in the art and having the benefit of the present disclosure, patterning refers to the sequential operations of conventional photolithography and etching in order to produce patterns in a layer of material or a substrate. As will also be recognized by persons having ordinary skill in the art and having the benefit of the present disclosure, etching refers to the removal of at least a portion of the exposed portions of a layer of material or a substrate.

In a preferred implementation of the processes 4400, the same photoresist layer is used as a masking layer for all of the etching steps of steps 4420, 4425, 4430 and 4440 in order to minimize the amount of patterning operations. Alternatively, a separate photoresist patterning is used for each patterning in steps 4420, 4425, 4430 and 4440.

In a preferred implementation of the processes 4400, the etching of the exposed portions of the silicon wafer in steps 4445 and 4455 is provided using KOH.

Referring to FIGS. 44 and 45a–45i, the first embodiment of the LOCOS merged-mask micro-machining process, without the use of a buffer layer of silicon dioxide, includes the steps of: (1) providing a silicon wafer 4500 in step 4405 as illustrated in FIG. 45a, (2) applying a layer 4505 of silicon nitride onto the silicon wafer 4500 in step 4415 as illustrated in FIG. 45b, (3) patterning the layer 4505 of silicon nitride in step 4420 as illustrated in FIG. 45c, (4) growing a field layer of silicon dioxide 4510 onto the portions of the silicon wafer 4500 not covered by the patterned layer 4505 of silicon nitride in step 4435 (the field layer of silicon dioxide is preferably at least as thick as the layer of silicon nitride) as illustrated in FIG. 45d, (5) patterning the layer 4510 of silicon dioxide in step 4440 as illustrated in FIG. 45e, (6) etching the exposed portions of the silicon wafer 4500 in step 4445 as illustrated in FIG. 45f, (7) removing the exposed portions of the layer 4510 of silicon dioxide in step 4450 as illustrated in FIG. 45g, (8) etching of the exposed portions of the silicon wafer 4500 in step 4455 as illustrated in FIG. 45h, and finally (9) removing the remaining portions of the layers, 4505 and 4510, of silicon dioxide and silicon nitride in step 4460 as illustrated in FIG. 45i.

In a preferred implementation of the first embodiment of the LOCOS merged-mask micro-machining process 4400, the following process parameters are employed: thickness of layer 4505 of silicon nitride ranging from about 0.1 to 2.0 microns, and the thickness of layer 4510 of silicon dioxide ranging from about 0.2 to 3 microns.

Referring to FIGS. 44 and 46a–46j, a second embodiment of the LOCOS merged-mask micro-machining process, without the use of a buffer layer of silicon dioxide but with a thin etch of the exposed portions of the silicon wafer, includes the steps of (1) providing a silicon wafer 4600 in step 4405 as illustrated in FIG. 46a, (2) applying a layer 4605 of silicon nitride onto the silicon wafer 4600 in step 4415 as illustrated in FIG. 46b, (3) patterning the layer 4605 of silicon nitride in step 4420 as illustrated in FIG. 46c, (4) thin etching the exposed portions of the surface of the silicon wafer 4600 in step 4430 as illustrated in FIG. 46d, (5) growing a field layer 4610 of silicon dioxide onto the portions of the silicon wafer 4600 not covered by the patterned layer of silicon nitride 4605 in step 4435 (the layer 4610 of silicon dioxide is preferably at least as thick as the layer 4605 of silicon nitride) as illustrated in FIG. 46e, (6) patterning the layer 4610 of silicon dioxide in step 4440 as illustrated in FIG. 46f, (7) etching the exposed portions of the silicon wafer 4600 in step 4445 as illustrated in FIG. 46g, (8) removing the exposed portions of the layer 4610 of silicon dioxide in step 4450 as illustrated in FIG. 46h, (9) etching of the exposed portions of the silicon wafer 4600 in step 4455 as illustrated in FIG. 46i, and finally (10) removing the remaining portions of the layers, 4605 and 4610, of silicon dioxide and silicon nitride in step 4460 as illustrated in FIG. 46j.

In a preferred implementation of the second embodiment of the LOCOS merged-mask micro-machining process 4400, the following process parameters are employed: thickness of layer 4605 of silicon nitride ranging from about 0.1 to 2.0 microns, depth of the thin etch of the exposed portions of the silicon wafer 4600 ranging from about 0.5 to 1 microns, thickness of layer 4610 of silicon dioxide ranging from about 0.2 to 3 microns.

Figure 47A:
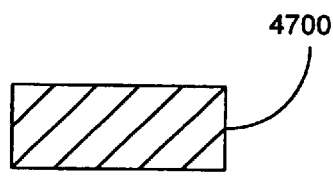
FIG. 47a is a cross-sectional illustration of a silicon wafer.
Figure 47B:
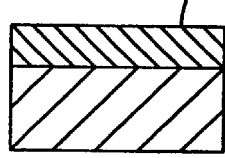
FIG. 47b is a cross-sectional illustration of the silicon wafer of FIG. 47a including a buffer layer of silicon dioxide.
Figure 47E:
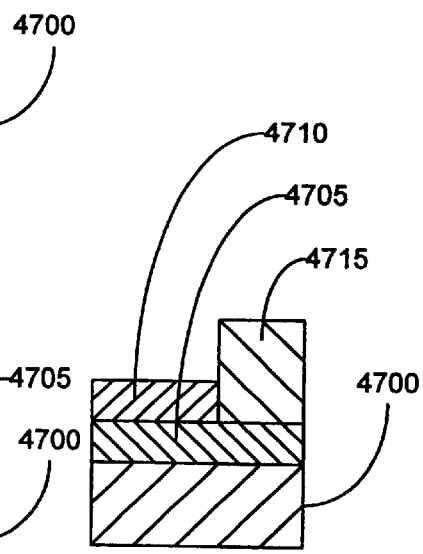
FIG. 47e is a cross-sectional illustration of the silicon wafer of FIG. 47d after growing a layer of silicon dioxide on the portions not covered by the patterned layer of silicon nitride.
Figure 47G:
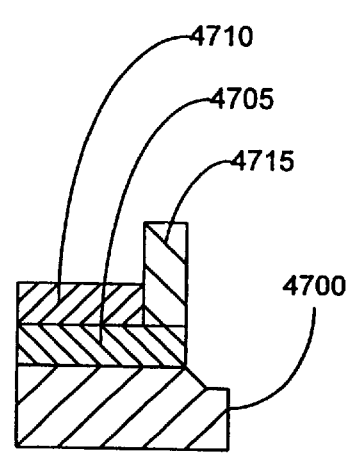
FIG. 47g is a cross-sectional illustration of the silicon wafer of FIG. 47f after etching the exposed portions of the silicon wafer.
Figure 47C:
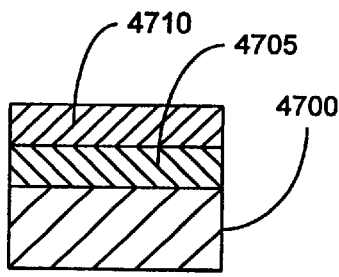
FIG. 47c is a cross-sectional illustration of the silicon wafer of FIG. 47b including a layer of silicon nitride on the buffer layer of silicon dioxide.
Figure 47F:
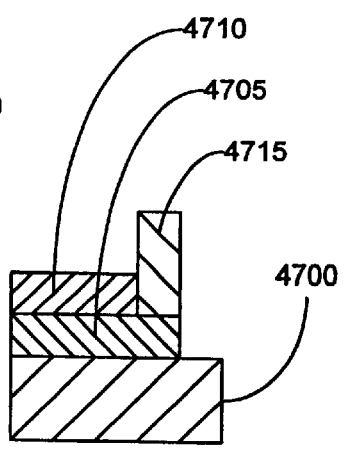
FIG. 47f is a cross-sectional illustration of the silicon wafer of FIG. 47e after patterning the layer of silicon dioxide.
Figure 47H:
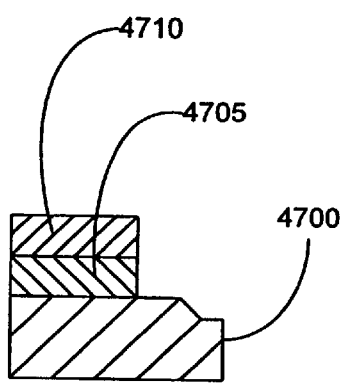
FIG. 47h is a cross-sectional illustration of the silicon wafer of FIG. 47g after removing the exposed portions of the layers of silicon dioxide.
Figure 47D:
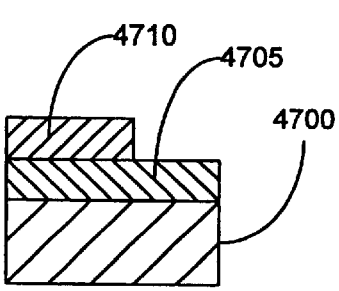
FIG. 47d is a cross-sectional illustration of a silicon wafer of FIG. 47c after patterning the layer of silicon nitride.
Figure 47I:
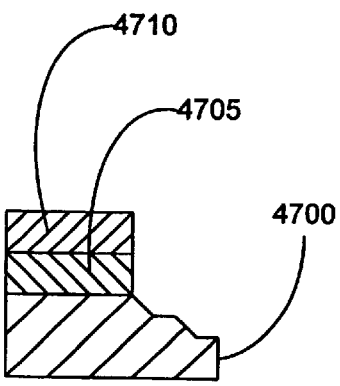
FIG. 47i is a cross-sectional illustration of the silicon wafer of FIG. 47h after etching the exposed portions of the silicon wafer.
Figure 47J:
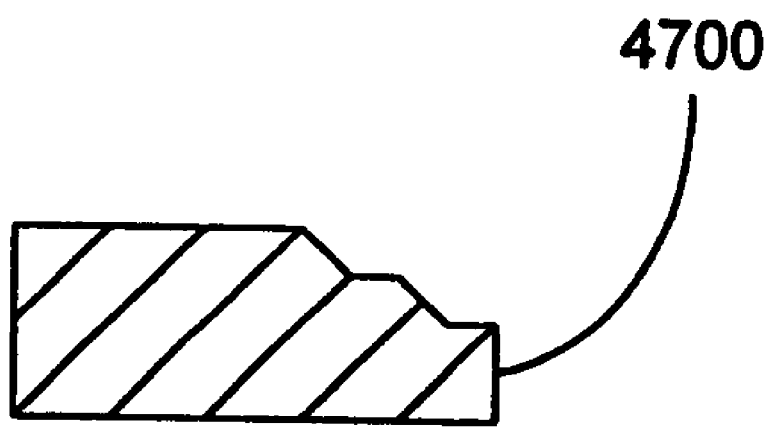
FIG. 47j is a cross-sectional illustration of the silicon wafer of FIG. 46i after removing the remaining portions of the layers of silicon dioxide and silicon nitride.

Referring to FIGS. 44 and 47a–47j, a third embodiment of the LOCOS merged-mask micro-machining process, with a buffer layer of silicon dioxide that is not patterned separately, includes the steps of: (1) providing a silicon wafer 4700 in step 4405 as illustrated in FIG. 47a, (2) growing a buffer layer 4705 of silicon dioxide onto the surface of the silicon wafer 4700 in step 4410 as illustrated in FIG. 47b, (3) applying a layer 4710 of silicon nitride onto the silicon wafer 4700 in step 4415 as illustrated in FIG. 47c, (4) patterning the layer 4710 of silicon nitride in step 4420 as illustrated in FIG. 47d, (5) growing a field layer 4715 of silicon dioxide onto the portions of the silicon wafer 4700 not covered by the patterned layer of silicon nitride in step 4435 (the layer of silicon dioxide 4715 is preferably at least as thick as the combined thicknesses of the layer 4710 of silicon nitride and the buffer layer 4705 of silicon dioxide) as illustrated in FIG. 47e, (6) patterning the layers, 4705 and 4715, of silicon dioxide in step 4440 as illustrated in FIG. 47f, (7) etching the exposed portions of the silicon wafer 4700 in step 4445 as illustrated in FIG. 47g, (8) removing the exposed portions of the layers, 4705 and 4715, of silicon dioxide in step 4450 as illustrated in FIG. 47h, (9) etching of the exposed portions of the silicon wafer 4700 in step 4455 as illustrated in FIG. 47*i*, and finally (10) removing the remaining portions of the layers, 4705, 4710 and 4715, of silicon dioxide and silicon nitride in step 4460 as illustrated in FIG. 47*j*.

In a preferred implementation of the third embodiment of the LOCOS merged-mask micro-machining process 4400, the following process parameters are employed: thickness of the buffer layer 4705 of silicon dioxide ranging from about 0.03 to 1 microns, thickness of layer 4710 of silicon nitride ranging from about 0.1 to 2 microns, thickness of layer 4715 of silicon dioxide ranging from about 0.2 to 3 microns.

Figure 48A:
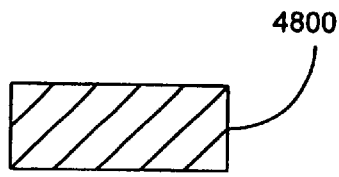
FIG. 48a is a cross-sectional illustration of a silicon wafer.
Figure 48B:
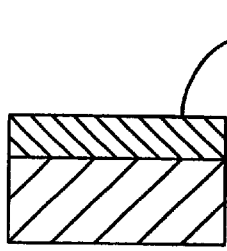
FIG. 48b is a cross-sectional illustration of the silicon wafer of FIG. 48a including a buffer layer of silicon dioxide.
Figure 48E:
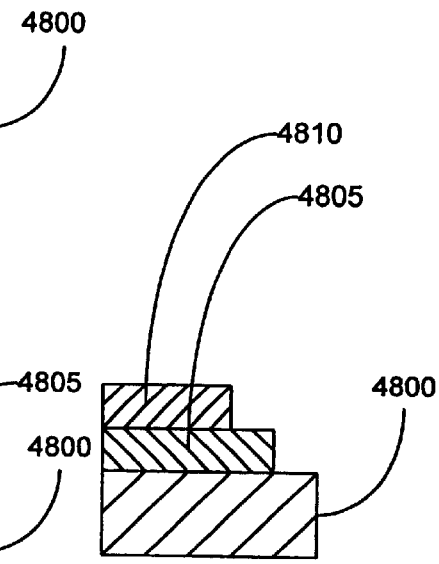
FIG. 48e is a cross-sectional illustration of the silicon wafer of FIG. 48d after patterning the exposed portions of the buffer layer of silicon dioxide.
Figure 48G:
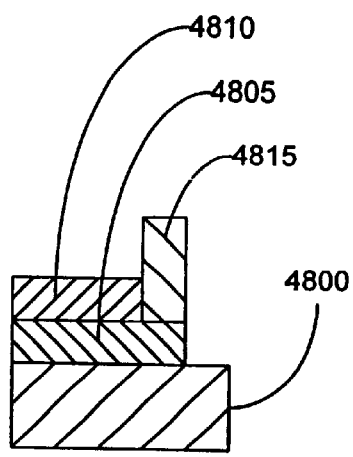
FIG. 48g is a cross-sectional illustration of the silicon wafer of FIG. 48f after patterning the layer of silicon dioxide.
Figure 48C:
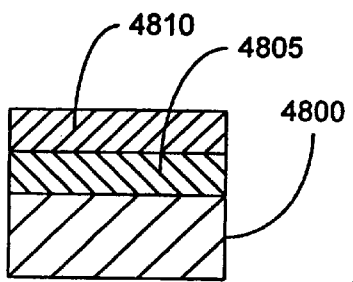
FIG. 48c is a cross-sectional illustration of the silicon wafer of FIG. 48b including a layer of silicon nitride on the buffer layer of silicon dioxide.
Figure 48F:
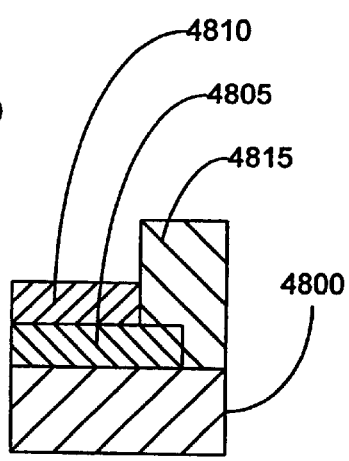
FIG. 48f is a cross-sectional illustration of the silicon wafer of FIG. 48e after growing a layer of silicon dioxide on the portions not covered by the patterned layer of silicon nitride.
Figure 48H:
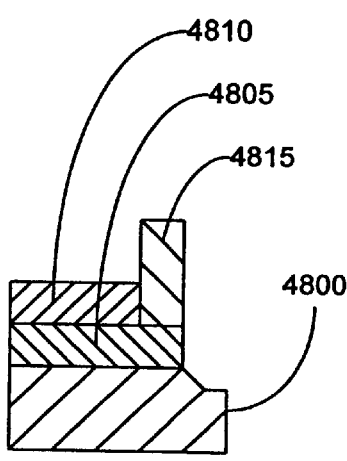
FIG. 48h is a cross-sectional illustration of the silicon wafer of FIG. 48g after etching the exposed portions of the silicon wafer.
Figure 48D:
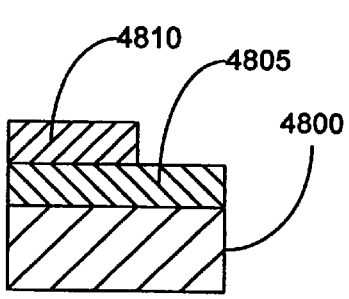
FIG. 48d is a cross-sectional illustration of a silicon wafer of FIG. 48c after patterning the layer of silicon nitride.
Figure 48I:
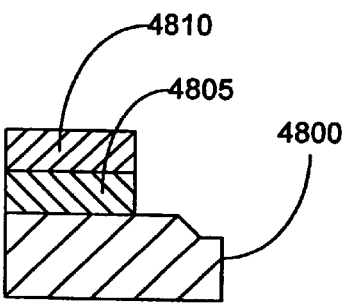
FIG. 48i is a cross-sectional illustration of the silicon wafer of FIG. 48h after removing the exposed portions of the layers of silicon dioxide.
Figure 48J:
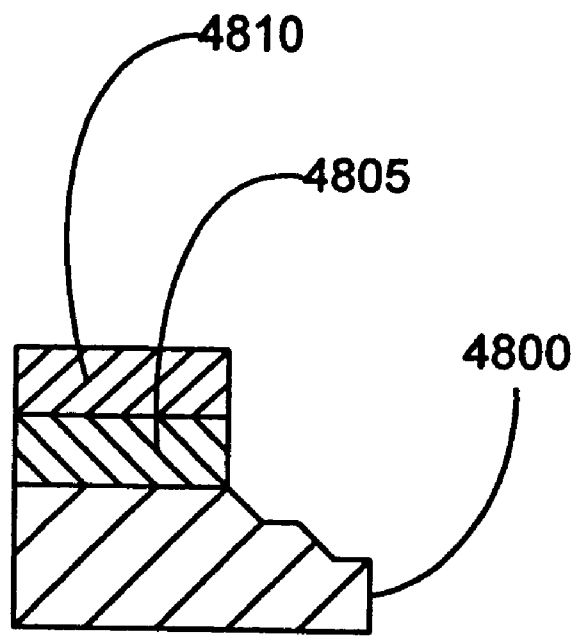
FIG. 48j is a cross-sectional illustration of the silicon wafer of FIG. 48i after etching the exposed portions of the silicon wafer.
Figure 48K:
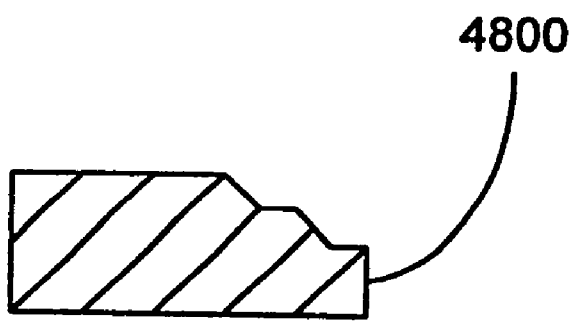
FIG. 48k is a cross-sectional illustration of the silicon wafer of FIG. 48j after removing the remaining portions of the layers of silicon dioxide and silicon nitride.

Referring to FIGS. 44 and 48*a*–48*k*, a fourth embodiment of the LOCOS merged-mask micro-machining process, with a buffer layer of silicon dioxide that is separately patterned, includes the steps of: (1) providing a silicon wafer 4800 in step 4405 as illustrated in FIG. 48*a*, (2) growing a buffer layer 4805 of silicon dioxide onto the surface of the silicon wafer 4800 in step 4410 as illustrated in FIG. 48*b*, (3) applying a layer 4810 of silicon nitride onto the silicon wafer 4800 in step 4415 as illustrated in FIG. 48*c*, (4) patterning the layer 4810 of silicon nitride in step 4420 as illustrated in FIG. 48*d*, (5) patterning the exposed portions of the buffer layer 4805 of silicon dioxide in step 4425 as illustrated in FIG. 48*e*, (6) growing a field layer 4815 of silicon dioxide onto the portions of the silicon wafer 4800 not covered by the patterned layer 4810 of silicon nitride in step 4435 (the-layer 4815 of silicon dioxide is preferably at least as thick as the combined thicknesses of the layer 4810 of silicon nitride and the buffer layer 4805 of silicon dioxide) as illustrated in FIG. 48*f*, (7) patterning the layers, 4805 and 4815, of silicon dioxide in step 4440 as illustrated in FIG. 48*g*, (8) etching the exposed portions of the silicon wafer 4800 in step 4445 as illustrated in FIG. 48*h*, (9) removing the exposed portions of the layers, 4805 and 4815, of silicon dioxide in step 4450 as illustrated in FIG. 48*i*, (10) etching of the exposed portions of the silicon wafer 4800 in step 4455 as illustrated in FIG. 48*j*, and finally (11) removing the remaining portions of the layers, 4805, 4810 and 4815, of silicon dioxide and silicon nitride in step 4460 as illustrated in FIG. 48*k*.

In a preferred implementation of the fourth embodiment of the LOCOS merged-mask micro-machining process 4400, the following process parameters are employed: thickness of the buffer layer 4805 of silicon dioxide ranging from about 0.03 to 1 microns, thickness of layer 4810 of silicon nitride ranging from about 0.1 to 1.8 microns, thickness of layer 4815 of silicon dioxide ranging from about 0.2 to 3.0 microns.

In a preferred implementation of the fourth embodiment of the LOCOS merged-mask micro-machining process 4400, the patterned layer 4810 of silicon nitride is used as an etch mask for patterning the exposed portions of the buffer layer 4805 of silicon dioxide in step 4425.

Figure 49A:
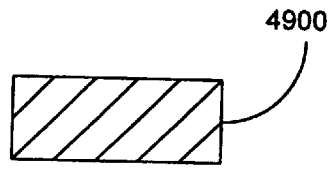
FIG. 49a is a cross-sectional illustration of a silicon wafer.
Figure 49E:
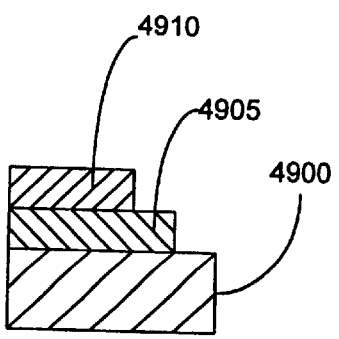
FIG. 49e is a cross-sectional illustration of the silicon wafer of FIG. 49d after patterning the exposed portions of the buffer layer of silicon dioxide.
Figure 49H:
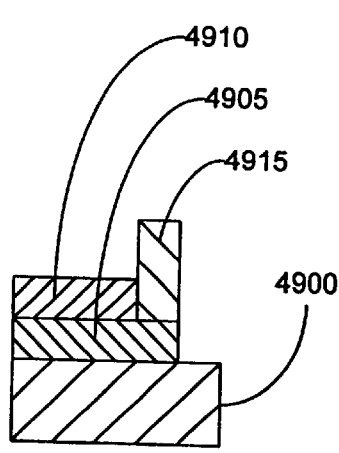
FIG. 49h is a cross-sectional illustration of the silicon wafer of FIG. 49g after patterning the layer of silicon dioxide.
Figure 49B:
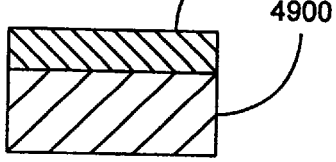
FIG. 49b is a cross-sectional illustration of the silicon wafer of FIG. 49a including a buffer layer of silicon dioxide.
Figure 49F:
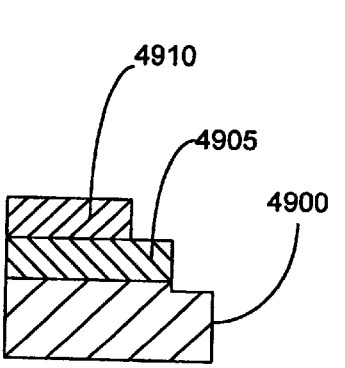
FIG. 49f is a cross-sectional illustration of the silicon wafer of FIG. 49e after thin etching the exposed portions of the silicon wafer.
Figure 49I:
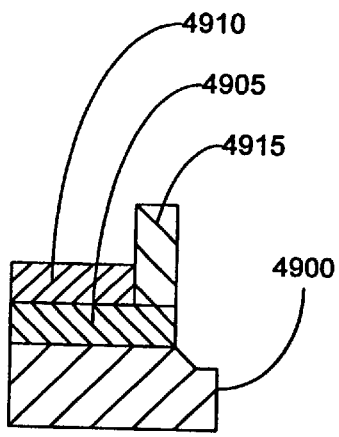
FIG. 49i is a cross-sectional illustration of the silicon wafer of FIG. 49h after etching the exposed portions of the silicon wafer.
Figure 49C:
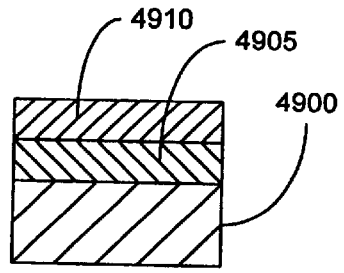
FIG. 49c is a cross-sectional illustration of the silicon wafer of FIG. 49b including a layer of silicon nitride on the buffer layer of silicon dioxide.
Figures 49D, 49G:
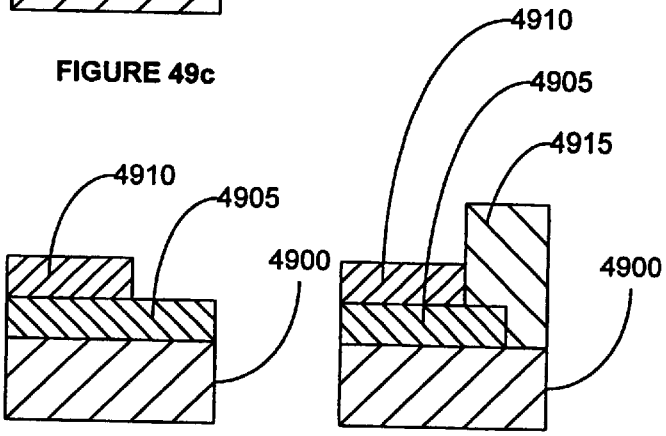
FIG. 49d is a cross-sectional illustration of a silicon wafer of FIG. 49c after patterning the layer of silicon nitride.
FIG. 49g is a cross-sectional illustration of the silicon wafer of FIG. 49f after growing a layer of silicon dioxide on the portions not covered by the patterned layer of silicon nitride.
Figure 49J:
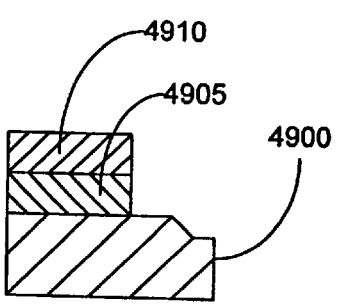
FIG. 49j is a cross-sectional illustration of the silicon wafer of FIG. 49i after removing the exposed portions of the layers of silicon dioxide.
Figure 49K:
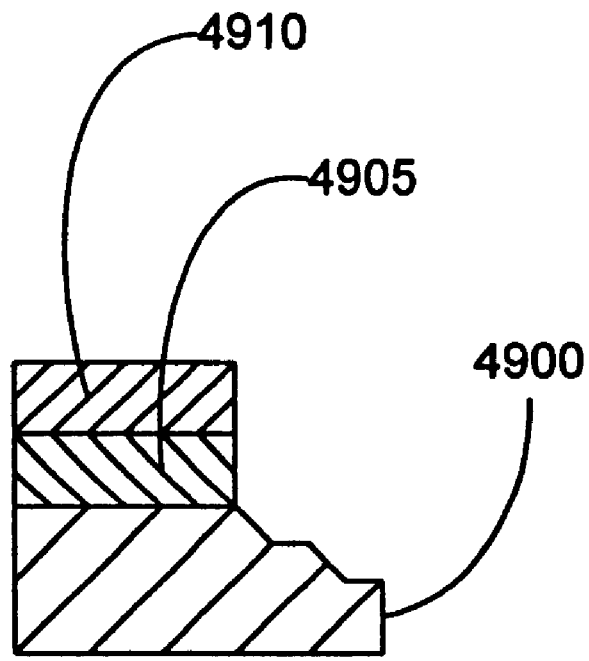
FIG. 49k is a cross-sectional illustration of the silicon wafer of FIG. 49j after etching the exposed portions of the silicon wafer.
Figure 49L:
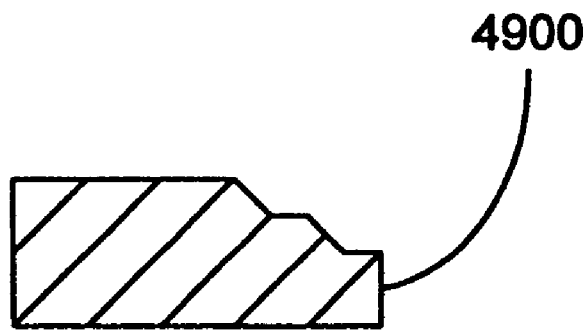
FIG. 49l is a cross-sectional illustration of the silicon wafer of FIG. 49k after removing the remaining portions of the layers of silicon dioxide and silicon nitride.

Referring to FIGS. 44 and 49*a*–49*l*, a fifth embodiment of the LOCOS merged-mask micro-machining process, with a buffer layer of silicon dioxide that is separately patterned and a thin etch of the silicon wafer, includes the steps of: (1) providing a silicon wafer 4900 in step 4405 as illustrated in FIG. 49*a*, (2) growing a buffer layer 4905 of silicon dioxide onto the surface of the silicon wafer 4900 in step 4410 as illustrated in FIG. 49*b*, (3) applying a layer 4910 of silicon nitride onto the silicon wafer 4900 in step 4415 as illustrated in FIG. 49*c*, (4) patterning the layer 4910 of silicon nitride in step 4420 as illustrated in FIG. 49*d*, (5) patterning the exposed portions of the buffer layer 4905 of silicon dioxide in step 4425 as illustrated in FIG. 49*e*, (6) thin etching the exposed portions of the surface of the silicon wafer 4900 in step 4430 as illustrated in FIG. 49*f*, (7) growing a field layer 4915 of silicon dioxide onto the portions of the silicon wafer 4900 not covered by the patterned layer 4910 of silicon nitride in step 4435 (the layer 4915 of silicon dioxide is preferably at least as thick as the combined thicknesses of the layer 4910 of silicon nitride and the buffer layer 4905 of silicon dioxide) as illustrated in FIG. 49*g*, (8) patterning the layers, 4905 and 4915, of silicon dioxide in step 4440 as illustrated in FIG. 49*h*, (9) etching the exposed portions of the silicon wafer 4900 in step 4445 as illustrated in FIG. 49*i*, (10) removing the exposed portions of the layers, 4905 and 4915, of silicon dioxide in step 4450 as illustrated in FIG. 49*j*, (11) etching the exposed portions of the silicon wafer 4900 in step 4455 as illustrated in FIG. 49*k*, and finally (12) removing the remaining portions of the layers, 4905, 4910 and 4915, of silicon dioxide and silicon nitride in step 4460 as illustrated in FIG. 49*l*.

In a preferred implementation of the fifth embodiment of the LOCOS merged-mask micro-machining process 4400, the following process parameters are employed: thickness of the buffer layer 4905 of silicon dioxide ranging from about 0.03 to 1 microns, thickness of layer 4910 of silicon nitride ranging from about 0.1 to 2.0 microns, depth of the thin etch of the exposed portions of the silicon wafer 4900 ranging from about 0.5 to 1 microns, and the thickness of field layer 4915 of silicon dioxide ranging from about 0.2 to 3.0 microns.

In a preferred implementation of the fifth embodiment of the LOCOS merged-mask micro-machining process 4400, the patterned layer 4910 of silicon nitride is used as an etch mask for patterning the exposed portions of the buffer layer 4905 of silicon dioxide in step 4425.

Figure 50:
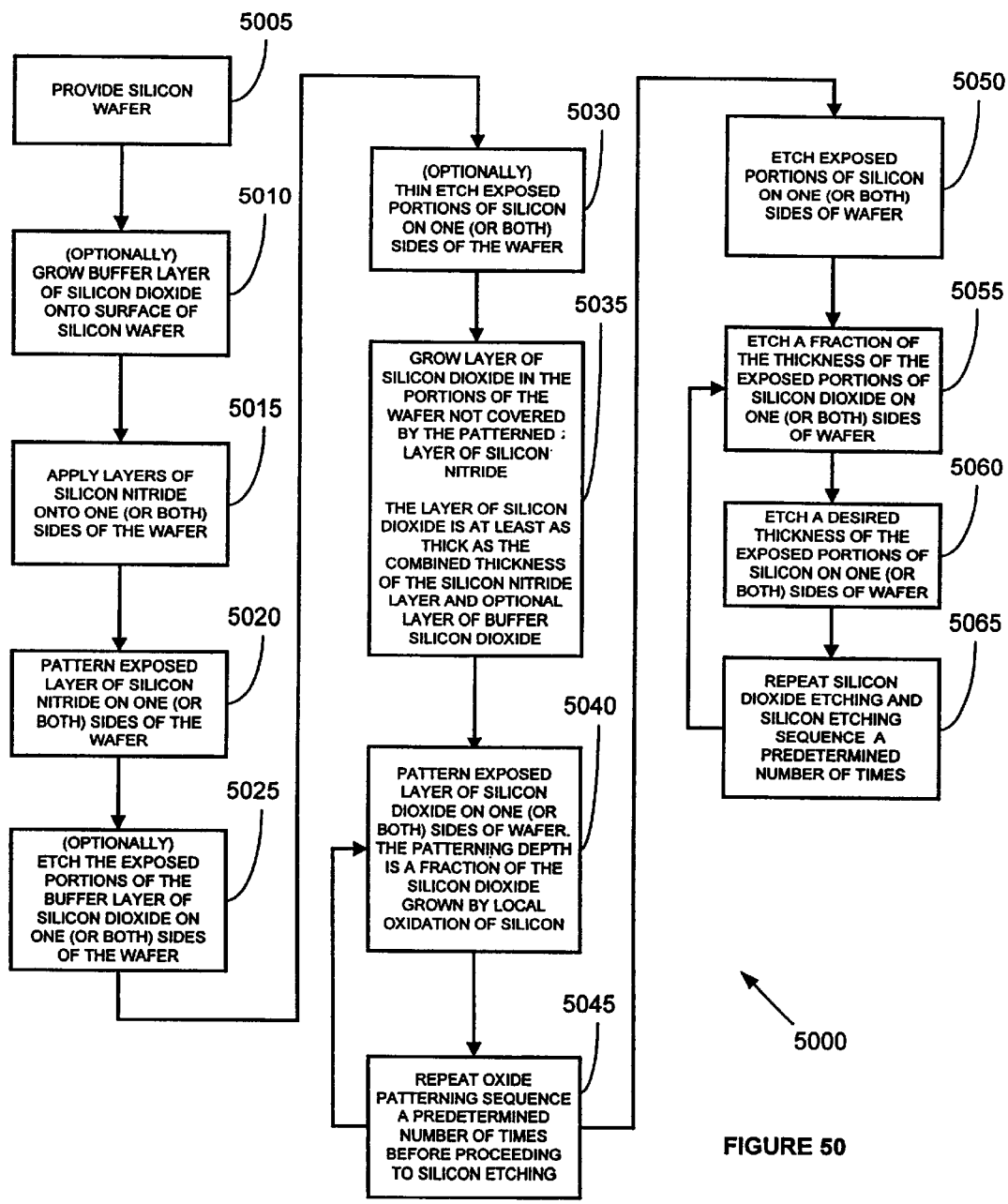
FIG. 50 is a flow chart illustrating several embodiments of LOCOS merged-mask micromachining processes including multiple etch depths.

Referring to FIG. 50, several alternative embodiments of a localized oxidation of silicon (LOCOS) merged-mask micro-machining processes 5000 including multiple etch depths are illustrated. In a preferred embodiment, one of these processes 5000 is used in forming at least a portion of the mirror 210 and/or the top and bottom caps, 205 and 215. As illustrated in FIG. 50, the LOCOS merged-mask micro-machining process 5000 preferably includes the following process steps: (1) provide a silicon wafer in step 5005, (2) (optionally) grow a buffer layer of silicon dioxide onto the surface of the silicon wafer in step 5010, (3) apply a layer of silicon nitride onto the silicon wafer in step 5015, (4) pattern the layer of silicon nitride in step 5020, (5) (optionally) pattern the exposed portions of the buffer layer of silicon dioxide in step 5025, (6) (optionally) thin etch the exposed portions of the surface of the silicon wafer in step 5030, (7) grow field layers of silicon dioxide onto the portions of the silicon wafer not covered by the patterned layer of silicon nitride in step 5035 (the field layer of silicon dioxide is preferably at least as thick as the combined thicknesses of the layer of silicon nitride and the optional buffer layer of silicon dioxide), (8) pattern a fraction of the thickness of the layer(s) of silicon dioxide in step 5040, (9) repeat the patterning of the thickness of the layer(s) of silicon dioxide for a predetermined number of times in step 5045, (10) etch the exposed portions of the silicon wafer in step 5050, (11) remove a portion of the exposed portions of the layer(s) of silicon dioxide in step 5055, (12) etch a portion of the exposed portions of the silicon wafer in step 5060, and finally (13) repeat the oxide etching and silicon etching sequence a predetermined number of times in step 5065. In this manner, five alternative LOCOS merged-mask micro-machining process embodiments are provided for etching a substrate to multiple etch depths.

As will be recognized by persons having ordinary skill in the art and having the benefit of the present disclosure, patterning refers to the sequential operations of conventional photolithography and etching in order to produce patterns in a layer of material or a substrate. As will also be recognized by persons having ordinary skill in the art and having the benefit of the present disclosure, etching refers to the removal of at least a portion of the exposed portions of a layer of material or a substrate.

In a preferred implementation of the processes 5000, the etching of the exposed portions of the silicon wafer in steps 5050 and 5060 is provided using KOH.

Referring to FIGS. 50 and 51a–51k, the first embodiment of the LOCOS merged-mask micro-machining process 5000, without the use of a buffer layer of silicon dioxide, includes the steps of: (1) provide a silicon wafer 5100 in step 5005, as illustrated in FIG. 51a, (2) apply a layer 5105 of silicon nitride onto the silicon wafer in step 5015, as illustrated in FIG. 51b, (3) pattern the layer 5105 of silicon nitride in step 5020, as illustrated in FIG. 51c, (4) grow a field layer 5110 of silicon dioxide onto the portions of the silicon wafer 5100 not covered by the patterned layer 5105 of silicon nitride in step 5035 (the field layer of silicon dioxide is preferably at least as thick as the combined thicknesses of the layer of silicon nitride and the optional buffer layer of silicon dioxide), as illustrated in FIG. 51d, (5) repeatedly pattern the layer 5110 of silicon dioxide in steps 5040 and 5045, as illustrated in FIG. 51e, (6) etch the exposed portions of the silicon wafer 5100 in step 5050, as illustrated in FIG. 51f, (7) remove a portion of the exposed portions of the layer 5110 of silicon dioxide in step 5055, as illustrated in FIG. 51g, (8) etch a portion of the exposed portions of the silicon wafer 5100 in step 5060, as illustrated in FIG. 51h, (9) repeat the oxide etching and silicon etching sequence in step 5065, as illustrated in FIGS. 51i and 51j, and (10) remove the remaining portions of the layer 5105 of silicon nitride, as illustrated in FIG. 51k.

In a preferred implementation of the first embodiment of the LOCOS merged-mask micro-machining process 5100, the following process parameters are employed: the thickness of layer 5105 of silicon nitride ranges from about 0.1 to 2.0 microns, and the thickness of layer 5110 of silicon dioxide ranges from about 0.2 to 3.0 microns.

Referring to FIGS. 50 and 52a–52l, a second embodiment of the LOCOS merged-mask micro-machining process 5000, without the use of a buffer layer of silicon dioxide but with a thin etch of the exposed portions of the silicon wafer, includes the steps of: (1) provide a silicon wafer 5200 in step 5005, as illustrated in FIG. 52a, (2) apply a layer 5205 of silicon nitride onto the silicon wafer 5200 in step 5015, as illustrated in FIG. 52b, (3) pattern the layer 5205 of silicon nitride in step 5020, as illustrated in FIG. 52c, (4) thin etch the exposed portions of the silicon wafer 5200 in step 5030, as illustrated in FIG. 52d, (5) grow a field layer 5210 of silicon dioxide onto the portions of the silicon wafer 5200 not covered by the patterned layer 5205 of silicon nitride in step 5035 (the field layer of silicon dioxide is preferably at least as thick as the combined thicknesses of the layer of silicon nitride and the optional buffer layer of silicon dioxide), as illustrated in FIG. 52e, (6) repeatedly pattern the layer 5210 of silicon dioxide in steps 5040 and 5045, as illustrated in FIG. 52f, (7) etch the exposed portions of the silicon wafer 5200 in step 5050, as illustrated in FIG. 52g, (8) remove a portion of the exposed portions of the layer 5210 of silicon dioxide in step 5055, as illustrated in FIG. 52h, (9) etch a portionof the exposed portions of the silicon wafer 5200 in step 5060, as illustrated in FIG. 52i, (10) repeat the oxide etching and silicon etching sequence in step 5065, as illustrated in FIGS. 52j and 52k, and (10) remove the remaining portions of the layer 5205 of silicon nitride, as illustrated in FIG. 52l.

In a preferred implementation of the second embodiment of the LOCOS merged-mask micro-machining process 5000, the following process parameters are employed: the thickness of the layer 5205 of silicon nitride ranges from about 0.1 to 2.0 microns, the depth of the thin etch of the exposed portions of the silicon wafer 5200 ranges from about 0.5 to 1 microns, and the thickness of layer 5210 of silicon dioxide ranges from about 0.2 to 3.0 microns.

Referring to FIGS. 50 and 53a–53l, a third embodiment of the LOCOS merged-mask micro-machining process 5000, with a buffer layer of silicon dioxide that is not patterned separately, includes the steps of: (1) provide a silicon wafer 5300 in step 5005, as illustrated in FIG. 53a, (2) apply a buffer layer 5305 of silicon dioxide in step 5010, as illustrated in FIG. 53b, (3) apply a layer 5310 of silicon nitride onto the silicon wafer 5300 in step 5015, as illustrated in FIG. 53c, (4) pattern the layer 5310 of silicon nitride in step 5020, as illustrated in FIG. 53d, (5) grow a field layer 5315 of silicon dioxide onto the portions of the silicon wafer 5300 not covered by the patterned layer 5310 of silicon nitride in step 5035 (the field layer of silicon dioxide is preferably at least as thick as the combined thicknesses of the layer of silicon nitride and the optional buffer layer of silicon dioxide), as illustrated in FIG. 53e, (6) repeatedly pattern the layers, 5305 and 5315, of silicon dioxide in steps 5040 and 5045, as illustrated in FIG. 53f (7) etch the exposed portions of the silicon wafer 5300 in step 5050, as illustrated in FIG. 53g, (8) remove a portion of the exposed portions of the layers, 5305 and 5315, of silicon dioxide in step 5055, as illustrated in FIG. 53h, (9) etch a portion of the exposed portions of the silicon wafer 5300 in step 5060, as illustrated in FIG. 53i, (10) repeat the oxide etching and silicon etching sequence in step 5065, as illustrated in FIGS. 53j and 53k, and (10) remove the remaining portions of the layers, 5305 and 5310, of silicon dioxide and silicon nitride, as illustrated in FIG. 53l.

In a preferred implementation of the third embodiment of the LOCOS merged-mask micro-machining process 5000, the following process parameters are employed: the thickness of the buffer layer 5305 of silicon dioxide ranges from about 0.03 to 1.0 microns, the thickness of layer 5310 of silicon nitride ranges from about 0.1 to 2.0 microns, and the thickness of layer 5315 of silicon dioxide ranges from about 0.2 to 3.0 microns.

In a preferred implementation of the third embodiment of the LOCOS merged-mask micro-machining process 5000, the patterned layer 5310 of silicon nitride is used as an etch mask for patterning the exposed portions of the buffer layer 5305 of silicon dioxide in step 5025.

Referring to FIGS. 50 and 54a–54m, a fourth embodiment of the LOCOS merged-mask micro-machining process 5000, with a buffer layer of silicon dioxide that is separately patterned, includes the steps of: (1) provide a silicon wafer 5400 in step 5005, as illustrated in FIG. 54a, (2) apply a buffer layer 5405 of silicon dioxide in step 5010, as illustrated in FIG. 54b, (3) apply a layer 5410 of silicon nitride onto the silicon wafer 5400 in step 5015, as illustrated in FIG. 54c, (4) pattern the layer 5410 of silicon nitride in step 5020, as illustrated in FIG. 54d, (5) pattern the buffer layer 5405 of silicon dioxide in step 5025, as illustrated in FIG. 54e, (6) grow a field layer 5415 of silicon dioxide onto the portions of the silicon wafer 5400 not covered by the patterned layer 5410 of silicon nitride in step 5035 (the field layer of silicon dioxide is preferably at least as thick as the combined thicknesses of the layer of silicon nitride and the optional buffer layer of silicon dioxide), as illustrated in FIG. 54*f*, (7) repeatedly pattern the layers, 5405 and 5415, of silicon dioxide in steps 5040 and 5045, as illustrated in FIG. 54*g*, (8) etch the exposed portions of the silicon wafer 5400 in step 5050, as illustrated in FIG. 54*h*, (9) remove a portion of the exposed portions of the layers, 5405 and 5415, of silicon dioxide in step 5055, as illustrated in FIG. 54*i*, (10) etch a portion of the exposed portions of the silicon wafer 5400 in step 5060, as illustrated in FIG. 54*j*, (11) repeat the oxide etching and silicon etching sequence in step 5065, as illustrated in FIGS. 54*k* and 54*l*, and (12) remove the remaining portions of the layers, 5405 and 5410, of silicon dioxide and silicon nitride, as illustrated in FIG. 54*m*.

In a preferred implementation of the fourth embodiment of the LOCOS merged-mask micro-machining process 5000, the following process parameters are employed: the thickness of the buffer layer 5405 of silicon dioxide ranges from about 0.03 to 1.0 microns, the thickness of layer 5410 of silicon nitride ranges from about 0.2 to 3.0 microns, and the thickness of layer 5415 of silicon dioxide ranges from about 0.2 to 3.0 microns.

In a preferred implementation of the fourth embodiment of the LOCOS merged-mask micro-machining process 5000, the patterned layer 5410 of silicon nitride is used as an etch mask for patterning the exposed portions of the buffer layer 5405 of silicon dioxide in step 5025.

Referring to FIGS. 50 and 55*a*–55*n*, a fifth embodiment of the LOCOS merged-mask micro-machining process 5000, with a buffer layer of silicon dioxide that is separately patterned and a thin etch of the silicon wafer, includes the steps of: (1) provide a silicon wafer 5500 in step 5005, as illustrated in FIG. 55*a*, (2) apply a buffer layer 5505 of silicon dioxide in step 5010, as illustrated in FIG. 55*b*, (3) apply a layer 5510 of silicon nitride onto the silicon wafer 5500 in step 5015, as illustrated in FIG. 55*c*, (4) pattern the layer 5510 of silicon nitride in step 5020, as illustrated in FIG. 55*d*, (5) pattern the layer 5505 of silicon dioxide in step 5025, as illustrated in FIG. 55*e*, (6) thin etch the exposed portions of the silicon wafer 5500 in step 5030, as illustrated in FIG. 55*f*, (7) grow a field layer 5515 of silicon dioxide onto the portions of the silicon wafer 5500 not covered by the patterned layer 5510 of silicon nitride in step 5035 (the field layer of silicon dioxide is preferably at least as thick as the combined thicknesses of the layer of silicon nitride and the optional buffer layer of silicon dioxide), as illustrated in FIG. 55*g*, (8) repeatedly pattern the layers, 5505 and 5515, of silicon dioxide in steps 5040 and 5045, as illustrated in FIG. 55*h*, (9) etch the exposed portions of the silicon wafer 5500 in step 5050, as illustrated in FIG. 55*i*, (10) remove a portion of the exposed portions of the layers, 5505 and 5515, of silicon dioxide in step 5055, as illustrated in FIG. 55*j*, (11) etch a portion of the exposed portions of the silicon wafer 5500 in step 5060, as illustrated in FIG. 55*k*, (12) repeat the oxide etching and silicon etching sequence in step 5065, as illustrated in FIGS. 55*l* and 55*m*, and (13) remove the remaining portions of the layers, 5505 and 5510, of silicon dioxide and silicon nitride, as illustrated in FIG. 55*n*.

In a preferred implementation of the fifth embodiment of the LOCOS merged-mask micro-machining process 5000, the following process parameters are employed: the thickness of the buffer layer 5505 of silicon dioxide ranges from about 0.03 to 1.0 microns, the thickness of the layer 5510 of silicon nitride ranges from about 0.1 to 2.0 microns, the depth of the thin etch of the exposed portions of the silicon wafer 5500 ranges from about 0.5 to 1 microns, and the thickness of field layer 5515 of silicon dioxide ranges from about 0.2 to 3.0 microns.

In a preferred implementation of the fifth embodiment of the LOCOS merged-mask micro-machining process 5000, the patterned layer 5510 of silicon nitride is used as an etch mask for patterning the exposed portions of the buffer layer 5505 of silicon dioxide in step 5025.

Referring to FIGS. 56*a* and 56*b*, several alternative embodiments of localized oxidation of silicon (LOCOS) merged-mask micro-machining processes 5600 including the use of photoresist as an etching mask are illustrated. In a preferred embodiment, one of these processes 5600 is used in forming at least a portion of the mirror 210 and/or the top and bottom caps, 205 and 215. As illustrated in FIGS. 56*a* and 56*b*, the LOCOS merged-mask micro-machining process 5600 preferably includes the following process steps: (1) provide a silicon wafer in step 5602, (2) (optionally) grow a buffer layer of silicon dioxide onto the surface of the silicon wafer in step 5604, (3) apply a layer of silicon nitride onto the silicon wafer in step 5606, (4) pattern the layer of silicon nitride in step 5608, (5) (optionally) pattern the exposed portions of the buffer layer of silicon dioxide in step 5610, (6) (optionally) thin etch the exposed portions of the surface of the silicon wafer in step 5612, (7) grow field layers of silicon dioxide onto the portions of the silicon wafer not covered by the patterned layer of silicon nitride in step 5614 (the field layer of silicon dioxide is preferably at least as thick as the combined thicknesses of the layer of silicon nitride and the optional buffer layer of silicon dioxide), (8) pattern the layer(s) of silicon dioxide in step 5616, (9) (optionally) etch the exposed portions of the silicon wafer using photoresist as an etch mask in step 5618, (10) (optionally) apply and pattern a layer of photoresist onto the silicon wafer in step 5620, (11) (optionally) etch the exposed portions of the silicon wafer using a plasma or gaseous etchant in step 5622, (12) (optionally) remove the exposed portions of the layer(s) of silicon dioxide in step 5624, (13) (optionally) etch a portion of the exposed portions of the silicon wafer in step 5626, (14) remove the layer of photoresist in step 5628; (15) etch the exposed portions of the silicon wafer in step 5630, (16) etch the exposed portions of the layers of silicon dioxide in step 5632, and (17) etch the exposed portions of the silicon wafer in step 5634. If the LOCOS merged-mask micro-machining processes 5600 are performed without using photoresist as an etching mask in step 5618, then the process flow is identical to that illustrated in FIG. 44. Alternatively, if the LOCOS merged-mask micro-machining processes 5600 are performed using photoresist as an etching mask in step 5618, then an additional thirty-five alternative LOCOS merged-mask micro-machining process embodiments are provided for etching a substrate to multiple etch depths including the use of photoresist as an etching mask.

As will be recognized by persons having ordinary skill in the art and having the benefit of the present disclosure, patterning refers to the sequential operations of conventional photolithography and etching in order to produce patterns in a layer of material or a substrate. As will also be recognized by persons having ordinary skill in the art and having the benefit of the present disclosure, etching refers to the removal of at least a portion of the exposed portions of a layer of material or a substrate.

In a preferred implementation of the processes 5600, the etching of the exposed portions of the silicon wafer in steps 5630 and 5634 is provided using KOH.

In a preferred implementation of the processes 5600, the etching of the exposed portions of the silicon wafer in steps 5622 and 5626 is provided using DRIE. In a preferred implementation of the processes 5600, the etchings steps 5622 and 5626 provide sidewalls having an angle of 90°±45° relative to horizontal.

Referring to FIGS. 56a, 56b, and 57a–57l, the first embodiment of the LOCOS merged-mask micro-machining process 5600, using photoresist as an etching mask without the use of a buffer layer of silicon dioxide, includes the steps of: (1) provide a silicon wafer 5700 in step 5602, as illustrated in FIG. 57a, (2) apply a layer of silicon nitride 5705 onto the silicon wafer 5700 in step 5606, as illustrated in FIG. 57b, (3) pattern the layer 5705 of silicon nitride in step 5608, as illustrated in FIG. 57c, (4) grow a field layer 5710 of silicon dioxide onto the portions of the silicon wafer 5700 not covered by the patterned layer 5705 of silicon nitride in step 5614 (the field layer of silicon dioxide is preferably at least as thick as the combined thicknesses of the layer of silicon nitride and the optional buffer layer of silicon dioxide), as illustrated in FIG. 57d, (5) pattern the layer 5710 of silicon dioxide in step 5616, as illustrated in FIG. 57e, (6) apply and pattern a layer 5715 of photoresist onto the silicon wafer 5700 in step 5620, as illustrated in FIG. 57f, (7) etch the exposed portions of the silicon wafer using a plasma or gaseous etchant in step 5622, as illustrated in FIG. 57g, (8) remove the layer of photoresist 5715 in step 5628, as illustrated in FIG. 57h, (9) etch the exposed portions of the silicon wafer 5700 in step 5630, as illustrated in FIG. 57i, (10) etch the exposed portions of the layer 5710 of silicon dioxide in step 5632, as illustrated in FIG. 57j, (11) etch the exposed portions of the silicon wafer 5700 in step 5634, as illustrated in FIG. 57k, and (12) remove the remaining portions of the layer 5705 of silicon nitride, as illustrated in FIG. 57l.

In a preferred implementation of the first embodiment of the LOCOS merged-mask micro-machining process 5600, the following process parameters are employed: the thickness of layer 5705 of silicon nitride ranges from about 0.1 to 2.0 microns, the thickness of layer 5710 of silicon dioxide ranges from about 0.2 to 3.0 microns, and the thickness of layer 5715 of photoresist ranges from about 1 to 10 microns.

In a preferred implementation of the first embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 58a–58m, the second embodiment of the LOCOS merged-mask micro-machining process 5600, using photoresist as an etching mask without the use of a buffer layer of silicon dioxide, includes the steps of: (1) provide a silicon wafer 5800 in step 5602, as illustrated in FIG. 58a, (2) apply a layer 5805 of silicon nitride onto the silicon wafer 5800 in step 5606, as illustrated in FIG. 58b, (3) pattern the layer 5805 of silicon nitride in step 5608, as illustrated in FIG. 58c, (4) grow a field layer 5810 of silicon dioxide onto the portions of the silicon wafer 5800 not covered by the patterned layer 5805 of silicon nitride in step 5614 (the field layer of silicon dioxide is preferably at least as thick as the combined thicknesses of the layer of silicon nitride and the optional buffer layer of silicon dioxide), as illustrated in FIG. 58d, (5) pattern the layer 5810 of silicon dioxide in step 5616, as illustrated in FIG. 58e, (6) apply and pattern a layer 5815 of photoresist onto the silicon wafer 5800 in step 5620, as illustrated in FIG. 58f, (7) etch the exposed portions of the silicon wafer 5800 using a plasma or gaseous etchant in step 5622, as illustrated in FIG. 58g, (8) etch the exposed portions of the layer 5810 of silicon dioxide in step 5624, as illustrated in FIG. 58h, (9) remove the layer 5715 of photoresist in step 5628, as illustrated in FIG. 58i, (10) etch the exposed portions of the silicon wafer 5800 in step 5630, as illustrated in FIG. 58j, (11) etch the exposed portions of the layer 5810 of silicon dioxide in step 5632, as illustrated in FIG. 58k, (12) etch the exposed portions of the silicon wafer 5800 in step 5634, as illustrated in FIG. 58l, and (13) remove the remaining portions of the layer 5805 of silicon nitride, as illustrated in FIG. 58m.

In a preferred implementation of the second embodiment of the LOCOS merged-mask micro-machining process 5600, the following process parameters are employed: the thickness of layer 5805 of silicon nitride ranges from about 0.1 to 2.0 microns, the thickness of layer 5810 of silicon dioxide ranges from about 0.2 to 3.0 microns, and the thickness of layer 5815 of photoresist ranges from about 1 to 10 microns.

In a preferred implementation of the second embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 59a–59m, the third embodiment of the LOCOS merged-mask micro-machining process 5600, using photoresist as an etching mask without the use of a buffer layer of silicon dioxide, includes the steps of: (1) provide a silicon wafer 5900 in step 5602, as illustrated in FIG. 59a, (2) apply a layer 5905 of silicon nitride onto the silicon wafer 5900 in step 5606, as illustrated in FIG. 59b, (3) pattern the layer 5905 of silicon nitride in step 5608, as illustrated in FIG. 59c, (4) grow a field layer 5910 of silicon dioxide onto the portions of the silicon wafer 5900 not covered by the patterned layer 5905 of silicon nitride in step 5614 (the field layer of silicon dioxide is preferably at least as thick as the combined thicknesses of the layer of silicon nitride and the optional buffer layer of silicon dioxide), as illustrated in FIG. 59d, (5) pattern the layer 5910 of silicon dioxide in step 5616, as illustrated in FIG. 59e, (6) apply and pattern a layer 5915 of photoresist onto the silicon wafer 5900 in step 5620, as illustrated in FIG. 59f, (7) etch the exposed portions of the silicon wafer 5900 using a plasma or gaseous etchant in step 5622, as illustrated in FIG. 59g, (8) etch the exposed portions of the silicon wafer 5900 using a plasma or gaseous etchant in step 5626, as illustrated in FIG. 59h, (9) remove the layer 5915 of photoresist in step 5628, as illustrated in FIG. 59i, (10) etch the exposed portions of the silicon wafer 5900 in step 5630, as illustrated in FIG. 59j, (11) etch the exposed portions of the layer 5910 of silicon dioxide in step 5632, as illustrated in FIG. 59k, (12) etch the exposed portions of the silicon wafer 5900 in step 5634, as illustrated in FIG. 59l, and (13) remove the remaining portions of the layer 5905 of silicon nitride, as illustrated in FIG. 59m.

In a preferred implementation of the third embodiment of the LOCOS merged-mask micro-machining process 5600, the following process parameters are employed: the thickness of layer 5905 of silicon nitride ranges from about 0.1 to 2.0 microns, the thickness of layer 5910 of silicon dioxide ranges from about 0.2 to 3.0 microns, and the thickness of layer 5915 of photoresist ranges from about 1 to 10 microns.

In a preferred implementation of the third embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 60a–60n, the fourth embodiment of the LOCOS merged-mask micro-machining process 5600, using photoresist as an etching mask without the use of a buffer layer of silicon dioxide, includes the steps of: (1) provide a silicon wafer 6000 in step 5602, as illustrated in FIG. 60*a*, (2) apply a layer 6005 of silicon nitride onto the silicon wafer 6000 in step 5606, as illustrated in FIG. 60*b*, (3) pattern the layer 6005 of silicon nitride in step 5608, as illustrated in FIG. 60*c*, (4) grow a field layer 6010 of silicon dioxide onto the portions of the silicon wafer 6000 not covered by the patterned layer 6005 of silicon nitride in step 5614 (the field layer of silicon dioxide is preferably at least as thick as the combined thicknesses of the layer of silicon nitride and the optional buffer layer of silicon dioxide), as illustrated in FIG. 60*d*, (5) pattern the layer 6010 of silicon dioxide in step 5616, as illustrated in FIG. 60*e*, (6) apply and pattern a layer 6015 of photoresist onto the silicon wafer 6000 in step 5620, as illustrated in FIG. 60*f*, (7) etch the exposed portions of the silicon wafer 6000 using a plasma or gaseous etchant in step 5622, as illustrated in FIG. 60*g*, (8) etch the exposed portions of the layer 6010 of silicon dioxide in step 5624, as illustrated in FIG. 60*h*; (9) etch the exposed portions of the silicon wafer 6000 using a plasma or gaseous etchant in step 5626, as illustrated in FIG. 60*i*, (10) remove the layer 6015 of photoresist in step 5628, as illustrated in FIG. 60*j*, (11) etch the exposed portions of the silicon wafer 6000 in step 5630, as illustrated in FIG. 60*k*, (12) etch the exposed portions of the layer 6010 of silicon dioxide in step 5632, as illustrated in FIG. 60*l*, (13) etch the exposed portions of the silicon wafer 6000 in step 5634, as illustrated in FIG. 60*m*, and (14) remove the remaining portions of the layer 6005 of silicon nitride, as illustrated in FIG. 60*n*.

In a preferred implementation of the fourth embodiment of the LOCOS merged-mask micro-machining process 5600, the following process parameters are employed: the thickness of layer 6005 of silicon nitride ranges from about 0.1 to 2.0 microns, the thickness of layer 6010 of silicon dioxide ranges from about 0.2 to 3.0 microns, and the thickness of layer 6015 of photoresist ranges from about 1 to 10 microns.

In a preferred implementation of the fourth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56*a*, 56*b*, and 61*a*–61*l*, the fifth embodiment of the LOCOS merged-mask micro-machining process 5600, using photoresist as an etching mask without the use of a buffer layer of silicon dioxide, includes the steps of: (1) provide a silicon wafer 6100 in step 5602, as illustrated in FIG. 61*a*, (2) apply a layer 6105 of silicon nitride onto the silicon wafer 6100 in step 5606, as illustrated in FIG. 61*b*, (3) pattern the layer 6105 of silicon nitride in step 5608, as illustrated in FIG. 61*c*, (4) grow a field layer 6110 of silicon dioxide onto the portions of the silicon wafer 6100 not covered by the patterned layer 6105 of silicon nitride in step 5614 (the field layer of silicon dioxide is preferably at least as thick;, as the combined thicknesses of the layer of silicon nitride and the optional buffer layer of silicon dioxide), as illustrated in FIG. 61*d*, (5) pattern the layer 6110 of silicon dioxide in step 5616, as illustrated in FIG. 61*e*, (6) apply and pattern a layer 6115 of photoresist onto the silicon wafer 6100 in step 5620, as illustrated in FIG. 61*f*, (7) etch the exposed portions of the layer 6110 of silicon dioxide in step 5624, as illustrated in FIG. 61*g*; (8) remove the layer 6115 of photoresist in step 5628, as illustrated in FIG. 61*h*, (9) etch the exposed portions of the silicon wafer 6100 in step 5630, as illustrated in FIG. 61*i*, (10) etch the exposed portions of the layer 6110 of silicon dioxide in step 5632, as illustrated in FIG. 61*j*, (11) etch the exposed portions of the silicon wafer 6100 in step 5634, as illustrated in FIG. 61*k*, and (12) remove the remaining portions of the layer 6105 of silicon nitride, as illustrated in FIG. 61*l*.

In a preferred implementation of the fifth embodiment of the LOCOS merged-mask micro-machining process 5600, the following process parameters are employed: the thickness of layer 6105 of silicon, nitride ranges from about 0.1 to 2.0 microns, the thickness of layer 6110 of silicon dioxide ranges from about 0.2 to 3.0 microns, and the thickness of layer 6115 of photoresist ranges from about 1 to 10 microns.

In a preferred implementation of the fifth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56*a*, 56*b*, and 6²*a*–62*m*, the sixth embodiment of the LOCOS merged-mask micro-machining process 5600, using photoresist as an etching mask without the use of a buffer layer of silicon dioxide, includes the steps of: (1) provide a silicon wafer 6200 in step 5602, as illustrated in FIG. 62*a*, (2) apply a layer 6205 of silicon nitride onto the silicon wafer 6200 in step 5606, as illustrated in FIG. 62*b*, (3) pattern the layer 6205 of silicon nitride in step 5608, as illustrated in FIG. 62*c*, (4) grow a field layer 6210 of silicon dioxide onto the portions of the silicon wafer 6200 not covered by the patterned layer 6205 of silicon nitride in step 5614 (the field layer of silicon dioxide is preferably at least as thick as the combined thicknesses of the layer of silicon nitride and the optional buffer layer of silicon dioxide), as illustrated in FIG. 62*d*, (5) pattern the layer 6210 of silicon dioxide in step 5616, as illustrated in FIG. 62*e*, (6) apply and pattern a layer 6215 of photoresist onto the silicon wafer 6200 in step 5620, as illustrated in FIG. 62*f*, (7) etch the exposed portions of the layer 6210 of silicon dioxide in step 5624, as illustrated in FIG. 62*g*; (8) etch the exposed portions of the silicon wafer 6200 using a plasma or gaseous etchant in step 5626, as illustrated in FIG. 62*h*; (9) remove the layer 6215 of photoresist in step 5628, as illustrated in FIG. 62*i*, (10) etch the exposed portions of the silicon wafer 6200 in step 5630, as illustrated in FIG. 62*j*, (11) etch the exposed portions of the layer 6210 of silicon dioxide in step 5632, as illustrated in FIG. 62*k*, (12) etch the exposed portions of the silicon wafer 6200 in step 5634, as illustrated in FIG. 62*l*, and (13) remove the remaining portions of the layer 6205 of silicon nitride, as illustrated in FIG. 62*m*.

In a preferred implementation of the sixth embodiment of the LOCOS merged-mask micro-machining process 5600, the etching performed in steps 5622 and 5626 comprises DRIE and provides sidewalls having an angle of 90°±45° relative to horizontal.

In a preferred implementation of the sixth embodiment of the LOCOS merged-mask micro-machining process 5600, the following process parameters are employed: the thickness of layer 6205 of silicon nitride ranges from about 0.1 to 2.0 microns, the thickness of layer 6210 of silicon dioxide ranges from about 0.2 to 3.0 microns, and the thickness of layer 6215 of photoresist ranges from about 1 to 10 microns.

Referring to FIGS. 56*a*, 56*b*, and 63*a*–63*l*, the seventh embodiment of the LOCOS merged-mask micro-machining process 5600, using photoresist as an etching mask without the use of a buffer layer of silicon dioxide, includes the steps of: (1) provide a silicon wafer 6300 in step 5602, as illustrated in FIG. 63a, (2) apply a layer 6305 of silicon nitride onto the silicon wafer 6300 in step 5606, as illustrated in FIG. 63b, (3) pattern the layer 6305 of silicon nitride in step 5608, as illustrated in FIG. 63c, (4) grow a field layer 6310 of silicon dioxide onto the portions of the silicon wafer 6300 not covered by the patterned layer 6305 of silicon nitride in step 5614 (the field layer of silicon dioxide is preferably at least as thick as the combined thicknesses of the layer of silicon nitride and the optional buffer layer of silicon dioxide), as illustrated in FIG. 63d, (5) pattern the layer 6310 of silicon dioxide in step 5616, as illustrated in FIG. 63e, (6) apply and pattern a layer 6315 of photoresist onto the silicon wafer 6300 in step 5620, as illustrated in FIG. 63f, (7) etch the exposed portions of the silicon wafer 6300 using a plasma or gaseous etchant in step 5626, as illustrated in FIG. 63g, (9) remove the layer 6315 of photoresist in step 5628, as illustrated in FIG. 63h, (10) etch the exposed portions of the silicon wafer 6300 in step 5630, as illustrated in FIG. 63i, (11) etch the exposed portions of the layer 6310 of silicon dioxide in step 5632, as illustrated in FIG. 63j, (12) etch the exposed portions of the silicon wafer 6300 in step 5634, as illustrated in FIG. 63k, and (13) remove the remaining portions of the layer 6305 of silicon nitride, as illustrated in FIG. 63l.

In a preferred implementation of the seventh embodiment of the LOCOS merged-mask micro-machining process 5600, the following process parameters are employed: the thickness of layer 6305 of silicon nitride ranges from about 0.1 to 2.0 microns, the thickness of layer 6310 of silicon dioxide ranges from about 0.2 to 3.0 microns, and the thickness of layer 6315 of photoresist ranges from about 1 to 10 microns.

In a preferred implementation of the seventh embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 64a–64m, the eighth embodiment of the LOCOS merged-mask micro-machining process 5600, using photoresist as an etching mask, with a thin etch of the exposed portions of the silicon wafer, and without the use of a buffer layer of silicon dioxide, includes the steps of: (1) provide a silicon wafer 6400 in step 5602, as illustrated in FIG. 64a, (2) apply a layer of silicon nitride 6405 onto the silicon wafer 6400 in step 5606, as illustrated in FIG. 64b, (3) pattern the layer 6405 of silicon nitride in step 5608, as illustrated in FIG. 64c, (4) thin etch the exposed portions of the silicon wafer 6400 in step 5610, as illustrated in FIG. 64d, (5) grow a field layer 6410 of silicon dioxide onto the portions of the silicon wafer 6400 not covered by the patterned layer 6405 of silicon nitride in step 5614 (the field layer of silicon dioxide is preferably at least as thick as the combined thicknesses of the layer of silicon nitride and the optional buffer layer of silicon dioxide), as illustrated in FIG. 64e, (6) pattern the layer 6410 of silicon dioxide in step 5616, as illustrated in FIG. 64f, (7) apply and pattern a layer 6415 of photoresist onto the silicon wafer 6400 in step 5620, as illustrated in FIG. 64g, (8) etch the exposed portions of the silicon wafer 6400 using a plasma or gaseous etchant in step 5622, as illustrated in FIG. 64h, (9) remove the layer 6415 of photoresist in step 5628, as illustrated in FIG. 64i, (10) etch the exposed portions of the silicon wafer 6400 in step 5630, as illustrated in FIG. 64j, (11) etch the exposed portions of the layer 6410 of silicon dioxide in step 5632, as illustrated in FIG. 64k, (12) etch the exposed portions of the silicon wafer 6400 in step 5634, as illustrated in FIG. 64l, and (13) remove the remaining portions of the layer 6405 of silicon nitride, as illustrated in FIG. 64m.

In a preferred implementation of the eighth embodiment of the LOCOS merged-mask micro-machining process 5600, the following process parameters are employed: the thickness of layer 6405 of silicon nitride ranges from about 0.1 to 2.0 microns, the thickness of layer 6410 of silicon dioxide ranges from about 0.2 to 3.0 microns, the thickness of layer 6415 of photoresist ranges from about 1 to 10 microns, and the depth of the thin etch of the exposed portions of the silicon wafer 6400 ranges from about 0.5 to 1 microns.

In a preferred implementation of the eighth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 65a–65n, the ninth embodiment of the LOCOS merged-mask micro-machining process 5600, using photoresist as an etching mask, with a thin etch of the exposed portions of the silicon wafer, and without the use of a buffer layer of silicon dioxide, includes the steps of: (1) provide a silicon wafer 6500 in step 5602, as illustrated in FIG. 65a, (2) apply a layer 6505 of silicon nitride onto the silicon wafer 6500 in step 5606, as illustrated in FIG. 65b, (3) pattern the layer 6505 of silicon nitride in step 5608, as illustrated in FIG. 65c, (4) thin etch the exposed portions of the silicon wafer 6500 in step 5610, as illustrated in FIG. 65d, (5) grow a field layer 6510 of silicon dioxide onto the portions of the silicon wafer 6500 not covered by the patterned layer 6505 of silicon nitride in step 5614 (the field layer of silicon dioxide is preferably at least as thick as the combined thicknesses of the layer of silicon nitride and the optional buffer layer of silicon dioxide), as illustrated in FIG. 65e, (6) pattern the layer 6510 of silicon dioxide in step 5616, as illustrated in FIG. 65f, (7) apply and pattern a layer 6515 of photoresist onto the silicon wafer 6500 in step 5620, as illustrated in FIG. 65g, (8) etch the exposed portions of the silicon wafer 6500 using a plasma or gaseous etchant in step 5622, as illustrated in FIG. 65h, (9) etch the exposed portions of the layer 6510 of silicon dioxide in step 5624, as illustrated in FIG. 65i, (10) remove the layer 6515 of photoresist in step 5628, as illustrated in FIG. 65j, (11) etch the exposed portions of the silicon wafer 6500 in step 5630, as illustrated in FIG. 65k, (12) etch the exposed portions of the layer 6510 of silicon dioxide in step 5632, as illustrated in FIG. 65l, (13) etch the exposed portions of the silicon wafer 6500 in step 5634, as illustrated in FIG. 65m, and (14) remove the remaining portions of the layer 6505 of silicon nitride, as illustrated in FIG. 58n.

In a preferred implementation of the ninth embodiment of the LOCOS merged-mask micro-machining process 5600, the following process parameters are employed: the thickness of layer 6505 of silicon nitride ranges from about 0.1 to 2.0 microns, the thickness of layer 6510 of silicon dioxide ranges from about 0.2 to 3.0 microns, the thickness of layer 6515 of photoresist ranges from about 1 to 10 microns, and the depth of the thin etch of the exposed portions of the silicon wafer 6500 ranges from about 0.5 to 1 microns.

In a preferred implementation of the ninth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 66a–66n, the tenth embodiment of the LOCOS merged-mask micro-machining process 5600, using photoresist as an etching mask, with a thin etch of the exposed portions of the silicon wafer, and without the use of a buffer layer of silicon dioxide, includes the steps of: (1) provide a silicon wafer 6600 in step 5602, as illustrated in FIG. 66*a*, (2) apply a layer 6605 of silicon nitride onto the silicon wafer 6600 in step 5606, as illustrated in FIG. 66*b*, (3) pattern the layer 6605 of silicon nitride in step 5608, as illustrated in FIG. 66*c*, (4) thin etch the exposed portions of the silicon wafer 6600 in step 5610, as illustrated in FIG. 66*d*, (5) grow a field layer 6610 of silicon dioxide onto the portions of the silicon wafer 6600 not covered by the patterned layer 6605 of silicon nitride in step 5614 (the field layer of silicon dioxide is preferably at least as thick as the combined thicknesses of the layer of silicon nitride and the optional buffer layer of silicon dioxide), as illustrated in FIG. 66*e*, (6) pattern the layer 6610 of silicon dioxide in step 5616, as illustrated in FIG. 66*f*, (7) apply and pattern a layer 5615 of photoresist onto the silicon wafer 6600 in step 5620, as illustrated in FIG. 66*g*, (8) etch the exposed portions of the silicon wafer 6600 using a plasma or gaseous etchant in step 5622, as illustrated in FIG. 66*h*, (9) etch the exposed portions of the silicon wafer 6600 using a plasma or gaseous etchant in step 5626, as illustrated in FIG. 66*i*, (10) remove the layer 6615 of photoresist in step 5628, as illustrated in FIG. 66*j*, (11) etch the exposed portions of the silicon wafer 6600 in step 5630, as illustrated in FIG. 66*k*, (12) etch the exposed portions of the layer 6610 of silicon dioxide in step 5632, as illustrated in FIG. 66*l*, (13) etch the exposed portions of the silicon wafer 6600 in step 5634, as illustrated in FIG. 66*m*, and (13) remove the remaining portions of the layer 6605 of silicon nitride, as illustrated in FIG. 66*n*.

In a preferred implementation of the tenth embodiment of the LOCOS merged-mask micro-machining process 5600, the following process parameters are employed: the thickness of layer 6605 of silicon nitride ranges from about 0.1 to 2.0 microns, the thickness of layer 6610 of silicon dioxide ranges from about 0.2 to 3.0 microns, the thickness of layer 6615 of photoresist ranges from about 1 to 10 microns, and the depth of the thin etch of the exposed portions of the silicon wafer 6600 ranges from about 0.5 to 1 microns.

In a preferred implementation of the tenth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56*a*, 56*b*, and 67*a*–67*o*, the eleventh embodiment of the LOCOS merged-mask micro-machining process 5600, using photoresist as an etching mask, with a thin etch of the exposed portions of the silicon wafer, and without the use of a buffer layer of silicon dioxide, includes the steps of: (1) provide a silicon wafer 6700 in step 5602, as illustrated in FIG. 67*a*, (2) apply a layer 6705 of silicon nitride onto the silicon wafer 6700 in step 5606, as illustrated in FIG. 67*b*, (3) pattern the layer 6705 of silicon nitride in step 5608, as illustrated in FIG. 67*c*, (4) thin etch the exposed portions of the silicon wafer 6700 in step 5610, as illustrated in FIG. 67*d*, (5) grow a field layer 6710 of silicon dioxide onto the portions of the silicon wafer 6700 not covered by the patterned layer 6705 of silicon nitride in step 5614 (the field layer of silicon dioxide is preferably at least as thick as the combined thicknesses of the layer of silicon nitride and the optional buffer layer of silicon dioxide), as illustrated in FIG. 67*e*, (6) pattern the layer 6710 of silicon dioxide in step 5616, as illustrated in FIG. 67*f*, (7) apply and pattern a layer 6715 of photoresist onto the silicon wafer 6700 in step 5620, as illustrated in FIG. 67*g*, (8) etch the exposed portions of the silicon wafer 6700 using a plasma or gaseous etchant in step 5622, as illustrated in FIG. 67*h*, (9) etch the exposed portions of the layer 6710 of silicon dioxide in step 5624, as illustrated in FIG. 67*i*; (10) etch the exposed portions of the silicon wafer 6700 using a plasma or gaseous etchant in step 5626, as illustrated in FIG. 67*j*, (11) remove the layer 6715 of photoresist in step 5628, as illustrated in FIG. 67*k*, (12) etch the exposed portions of the silicon wafer 6700 in step 5630, as illustrated in FIG. 67*l*, (13) etch the exposed portions of the layer 6710 of silicon dioxide in step 5632, as illustrated in FIG. 67*m*, (14) etch the exposed portions of the silicon wafer 6700 in step 5634, as illustrated in FIG. 67*n*, and (15) remove the remaining portions of the layer 6705 of silicon nitride, as illustrated in FIG. 67*o*.

In a preferred implementation of the eleventh embodiment of the LOCOS merged-mask micro-machining process 5600, the following process parameters are employed: the thickness of layer 6705 of silicon nitride ranges from about 0.1 to 2.0 microns, the thickness of layer 6710 of silicon dioxide ranges from about 0.2 to 3.0 microns, the thickness of layer 6715 of photoresist ranges from about 1 to 10 microns, and the depth of the thin etch of the exposed portions of the silicon wafer 6700 ranges from about 0.5 to 1 microns.

In a preferred implementation of the eleventh embodiment of the LOCOS merged-mask micro-machining process 5600, the etching performed in steps 5622 and 5626 comprises DRIE and provides sidewalls having an angle of 90°±45° relative to horizontal.

Referring to FIGS. 56*a*, 56*b*, and 68*a*–68*m*, the twelfth embodiment of the LOCOS merged-mask micro-machining process 5600, using photoresist as an etching mask, with a thin etch of the exposed portions of the silicon wafer, and without the use of a buffer layer of silicon dioxide, includes the steps of: (1) provide a silicon wafer 6800 in step 5602, as illustrated in FIG. 68*a*, (2) apply a layer 6805 of silicon nitride onto the silicon wafer 6800 in step 5606, as illustrated in FIG. 68*b*, (3) pattern the layer 6805 of silicon nitride in step 5608, as illustrated in FIG. 68*c*, (4) thin etch the exposed portions of the silicon wafer 6800 in step 5610, as illustrated in FIG. 68*d*, (5) grow a field layer 6810 of silicon dioxide onto the portions of the silicon wafer 6800 not covered by the patterned layer 6805 of silicon nitride in step 5614 (the field layer of silicon dioxide is preferably at least as thick as the combined thicknesses of the layer of silicon nitride and the optional buffer layer of silicon dioxide), as illustrated in FIG. 68*e*, (6) pattern the layer 6810 of silicon dioxide in step 5616, as illustrated in FIG. 68*f*, (7) apply and pattern a layer 6815 of photoresist onto the silicon wafer 6800 in step 5620, as illustrated in FIG. 68*g*, (8) etch the exposed portions of the layer 6810 of silicon dioxide in step 5624, as illustrated in FIG. 68*h*; (9) remove the layer 6815 of photoresist in step 5628, as illustrated in FIG. 68*i*, (10) etch the exposed portions of the silicon wafer 6800 in step 5630, as illustrated in FIG. 68*j*, (11) etch the exposed portions of the layer 6810 of silicon dioxide in step 5632, as illustrated in FIG. 68*k*, (12) etch the exposed portions of the silicon wafer 6800 in step 5634, as illustrated in FIG. 68*l*, and (13) remove the remaining portions of the layer 6805 of silicon nitride, as illustrated in FIG. 68*m*.

In a preferred implementation of the twelfth embodiment of the LOCOS merged-mask micro-machining process 5600, the following process parameters are employed: the thickness of layer 6805 of silicon nitride ranges from about 0.1 to 2.0 microns, the thickness of layer 6810 of silicon dioxide ranges from about 0.2 to 3.0 microns, the thickness of layer 6815 of photoresist ranges from about 1 to 10 microns, and the depth of the thin etch of the exposed portions of the silicon wafer 6800 ranges from about 0.5 to 1 microns.

In a preferred implementation of the twelfth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56*a*, 56*b*, and 69*a*–69*n*, the thirteenth embodiment of the LOCOS merged-mask micro-machining process 5600, using photoresist as an etching mask, with a thin etch of the exposed portions of the silicon wafer, and without the use of a buffer layer of silicon dioxide, includes the steps of: (1) provide a silicon wafer 6900 in step 5602, as illustrated in FIG. 69*a*, (2) apply a layer 6905 of silicon nitride onto the silicon wafer 6900 in step 5606, as illustrated in FIG. 69*b*, (3) pattern the layer 6905 of silicon nitride in step 5608, as illustrated in FIG. 69*c*, (4) thin etch the exposed portions of the silicon wafer 6900 in step 5610, as illustrated in FIG. 69*d*, (5) grow a field layer 6910 of silicon dioxide onto the portions of the silicon wafer 6900 not covered by the patterned layer 6905 of silicon nitride in step 5614 (the field layer of silicon dioxide is preferably at least as thick as the combined thicknesses of the layer of silicon nitride and the optional buffer layer of silicon dioxide), as illustrated in FIG. 69*e*, (6) pattern the layer 6910 of silicon dioxide in step 5616, as illustrated in FIG. 69*f*, (7) apply and pattern a layer 6915 of photoresist onto the silicon wafer 6900 in step 5620, as illustrated in FIG. 69*g*, (8) etch the exposed portions of the layer 6910 of silicon dioxide in step 5624, as illustrated in FIG. 69*h*; (9) etch the exposed portions of the silicon wafer 6900 using a plasma or gaseous etchant in step 5626, as illustrated in FIG. 69*i*; (10) remove the layer 6915 of photoresist in step 5628, as illustrated in FIG. 69*j*, (11) etch the exposed portions of the silicon wafer 6900 in step 5630, as illustrated in FIG. 69*k*, (12) etch the exposed portions of the layer 6910 of silicon dioxide in step 5632, as illustrated in FIG. 69*l*, (13) etch the exposed portions of the silicon wafer 6900 in step 5634, as illustrated in FIG. 69*m*, and (14) remove the remaining portions of the layer 6905 of silicon nitride, as illustrated in FIG. 69*n*.

In a preferred implementation of the thirteenth embodiment of the LOCOS merged-mask micro-machining process 5600, the etching performed in steps 5622 and 5626 comprises DRIE and provides sidewalls having an angle of 90°±45° relative to horizontal.

In a preferred implementation of the thirteenth embodiment of the LOCOS merged-mask micro-machining process 5600, the following process parameters are employed: the thickness of layer 6905 of silicon nitride ranges from about 0.1 to 2.0 microns, the thickness of layer 6910 of silicon dioxide ranges from about 0.2 to 3.0 microns, the thickness of layer 6915 of photoresist ranges from about 1 to 10 microns, and the depth of the thin etch of the exposed portions of the silicon wafer 6900 ranges from about 0.5 to 1 microns.

Referring to FIGS. 56*a*, 56*b*, and 70*a*–70*m*, the fourteenth embodiment of the LOCOS merged-mask micro-machining process 5600, using photoresist as an etching mask, with a thin etch of the silicon wafer, and without the use of a buffer layer of silicon dioxide, includes the steps of: (1) provide a silicon wafer 7000 in step 5602, as illustrated in FIG. 70*a*, (2) apply a layer 7005 of silicon nitride onto the silicon wafer 7000 in step 5606, as illustrated in FIG. 70*b*, (3) pattern the layer 7005 of silicon nitride in step 5608, as illustrated in FIG. 70*c*, (4) thin etch the exposed portions of the silicon wafer 7000 in step 5610, as illustrated in FIG. 70*d*, (5) grow a field layer 7010 of silicon dioxide onto the portions of the silicon wafer 7000 not covered by the patterned layer 7005 of silicon nitride in step 5614 (the field layer of silicon dioxide is preferably at least as thick as the combined thicknesses of the layer of silicon nitride and the optional buffer layer of silicon dioxide), as illustrated in FIG. 70*e*, (6) pattern the layer 7010 of silicon dioxide in step 5616, as illustrated in FIG. 70*f*, (7) apply and pattern a layer 7015 of photoresist onto the silicon wafer 7000 in step 5620, as illustrated in FIG. 70*g*, (8) etch the exposed portions of the silicon wafer 7000 using a plasma or gaseous etchant in step 5626, as illustrated in FIG. 70*h*, (9) remove the layer 7015 of photoresist in step 5628, as illustrated in FIG. 70*i*, (10) etch the exposed portions of the silicon wafer 7000 in step 5630, as illustrated in FIG. 70*j*, (11) etch the exposed portions of the layer 7010 of silicon dioxide in step 5632, as illustrated in FIG. 70*k*, (12) etch the exposed portions of the silicon wafer 7000 in step 5634, as illustrated in FIG. 70*l*, and (13) remove the remaining portions of the layer 7005 of silicon nitride, as illustrated in FIG. 70*m*.

In a preferred implementation of the fourteenth embodiment of the LOCOS merged-mask micro-machining process 5600, the following process parameters are employed: the thickness of layer 7005 of silicon nitride ranges from about 0.1 to 2.0 microns, the thickness of layer 7010 of silicon dioxide ranges from about 0.2 to 3.0 microns, the thickness of layer 7015 of photoresist ranges from about 1 to 10 microns, and the depth of the thin etch of the exposed portions of the silicon wafer 7000 ranges from about 0.5 to 1 microns.

In a preferred implementation of the fourteenth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56*a*, 56*b*, and 71*a*–71*m*, the fifteenth embodiment of the LOCOS merged-mask micro-machining process 5600, using photoresist as an etching mask with the use of a buffer layer of silicon dioxide, includes the steps of: (1) provide a silicon wafer 7100 in step 5602, as illustrated in FIG. 71*a*, (2) apply a buffer pad layer 7105 of silicon dioxide onto the silicon wafer 7100 in step 5604, as illustrated in FIG. 71*b*, (3) apply a layer of silicon nitride 7110 onto the silicon wafer 7100 in step 5606, as illustrated in FIG. 71*c*, (4) pattern the layer 7110 of silicon nitride in step 5608, as illustrated in FIG. 71*d*, (5) grow a field layer 7115 of silicon dioxide onto the portions of the silicon wafer 7100 not covered by the patterned layer 7110 of silicon nitride in step 5614 (the field layer of silicon dioxide is preferably at least as thick as the combined thicknesses of the layer of silicon nitride and the optional buffer layer of silicon dioxide), as illustrated in FIG. 71*e*, (6) pattern the layers 7105 and 7115 of silicon dioxide in step 5616, as illustrated in FIG. 71*f*, (7) apply and pattern a layer 7120 of photoresist onto the silicon wafer 7100 in step 5620, as illustrated in FIG. 71*g*, (8) etch the exposed portions of the silicon wafer 7100 using a plasma or gaseous etchant in step 5622, as illustrated in FIG. 71*h*, (9) remove the layer 7120 of photoresist in step 5628, as illustrated in FIG. 71*i*, (10) etch the exposed portions of the silicon wafer 7100 in step 5630, as illustrated in FIG. 71*j*, (11) etch the exposed portions of the layers 7105 and 7115 of silicon dioxide in step 5632, as illustrated in FIG. 71*k*, (12) etch the exposed portions of the silicon wafer 7100 in step 5634, as illustrated in FIG. 71*l*, and (13) remove the remaining portions of the layers 7105, 7110 and 7115 of silicon dioxide and silicon nitride, as illustrated in FIG. 71*m*.

In a preferred implementation of the fifteenth embodiment of the LOCOS merged-mask micro-machining process 5600, the following process parameters are employed: the thickness of the pad buffer layer 7105 of silicon dioxide ranges from about 0.03 to 1 microns, the thickness of the layer 7110 of silicon nitride ranges from about 0.1 to 2.0 microns, the thickness of the field layer 7115 of silicon dioxide ranges from about 0.2 to 3.0 microns, and the thickness of layer 7120 of photoresist ranges from about 1 to 10 microns.

In a preferred implementation of the fifteenth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 72a–72n, the sixteenth embodiment of the LOCOS merged-mask micro-machining process 5600, using photoresist as an etching mask with the use of a buffer layer of silicon dioxide, includes the steps of: (1) provide a silicon wafer 7200 in step 5602, as illustrated in FIG. 72a, (2) apply a buffer pad layer 7205 of silicon dioxide onto the silicon wafer in step 5604, as illustrated in FIG. 72b, (3) apply a layer 7210 of silicon nitride onto the silicon wafer 7200 in step 5606, as illustrated in FIG. 72c, (4) pattern the layer 7210 of silicon nitride in step 5608, as illustrated in FIG. 72d, (5) grow a field layer 7215 of silicon dioxide onto the portions of the silicon wafer 7200 not covered by the patterned layer 7210 of silicon nitride in step 5614 (the field layer of silicon dioxide is preferably at least as thick as the combined thicknesses of the layer of silicon nitride and the optional buffer layer of silicon dioxide), as illustrated in FIG. 72e, (6) pattern the layers 7205 and 7215 of silicon dioxide in step 5616, as illustrated in FIG. 72f, (7) apply and pattern a layer 7220 of photoresist onto the silicon wafer 7200 in step 5620, as illustrated in FIG. 72g, (8) etch the exposed portions of the silicon wafer 7200 using a plasma or gaseous etchant in step 5622, as illustrated in FIG. 72h, (9) etch the exposed portions of the layers 7205 and 7215 of silicon dioxide in step 5624, as illustrated in FIG. 72i, (10) remove the layer 7220 of photoresist in step 5628, as illustrated in FIG. 72j, (11) etch the exposed portions of the silicon wafer 7200 in step 5630, as illustrated in FIG. 72k, (12) etch the exposed portions of the layers 7205 and 7215 of silicon dioxide in step 5632, as illustrated in FIG. 72l, (13) etch the exposed portions of the silicon wafer 7200 in step 5634, as illustrated in FIG. 72m, and (14) remove the remaining portions of the layers 7205, 7210 and 7215 of silicon dioxide and silicon nitride, as illustrated in FIG. 72n.

In a preferred implementation of the sixteenth embodiment of the LOCOS merged-mask micro-machining process 5600, the following process parameters are employed: the thickness of the pad buffer layer 7205 of silicon dioxide ranges from about 0.03 to 1 microns, the thickness of the layer 7210 of silicon nitride ranges from about 0.1 to 2.0 microns, the thickness of the field layer 7215 of silicon dioxide ranges from about 0.2 to 3.0 microns, and the thickness of layer 7220 of photoresist ranges from about 1 to 10 microns.

In a preferred implementation of the sixteenth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 73a–73n, the seventeenth embodiment of the LOCOS merged-mask micro-machining process 5600, using photoresist as an etching mask with the use of a buffer layer of silicon dioxide, includes the steps of: (1) provide a silicon wafer 7300 in step 5602, as illustrated in FIG. 73a, (2) apply a buffer pad layer 7305 of silicon dioxide onto the silicon wafer 7300 in step 5604, as illustrated in FIG. 73b, (3) apply a layer 7310 of silicon nitride onto the silicon wafer 7300 in step 5606, as illustrated in FIG. 73c, (4) pattern the layer 7310 of silicon nitride in step 5608, as illustrated in FIG. 73d, (5) grow a field layer 7315 of silicon dioxide onto the portions of the silicon wafer 7300 not covered by the patterned layer 7310 of silicon nitride in step 5614 (the field layer of silicon dioxide is preferably at least as thick as the combined thicknesses of the layer of silicon nitride and the optional buffer layer of silicon dioxide), as illustrated in FIG. 73e, (6) pattern the layers 7305 and 7315 of silicon dioxide in step 5616, as illustrated in FIG. 73f, (7) apply and pattern a layer 7320 of photoresist onto the silicon wafer 7300 in step 5620, as illustrated in FIG. 73g, (8) etch the exposed portions of the silicon wafer 7300 using a plasma or gaseous etchant in step 5622, as illustrated in FIG. 73h, (9) etch the exposed portions of the silicon wafer 7300 using a plasma or gaseous etchant in step 5626, as illustrated in FIG. 73i, (10) remove the layer 7320 of photoresist in step 5628, as illustrated in FIG. 73j, (11) etch the exposed portions of the silicon wafer 7300 in step 5630, as illustrated in FIG. 73k, (12) etch the exposed portions of the layers 7305 and 7315 of silicon dioxide in step 5632, as illustrated in FIG. 73l, (13) etch the exposed portions of the silicon wafer 7300 in step 5634, as illustrated in FIG. 73m, and (14) remove the remaining portions of the layers 7305, 7310, and 7315 of silicon dioxide and silicon nitride, as illustrated in FIG. 73n.

In a preferred implementation of the seventeenth embodiment of the LOCOS merged-mask micro-machining process 5600, the following process parameters are employed: the thickness of the pad buffer layer 7305 of silicon dioxide ranges from about 0.03 to 1 microns, the thickness of the layer 7310 of silicon nitride ranges from about 0.1 to 2.0 microns, the thickness of the field layer 7315 of silicon dioxide ranges from about 0.2 to 3.0 microns, and the thickness of layer 7320 of photoresist ranges from about 1 to 10 microns.

In a preferred implementation of the seventeenth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 74a–74o, the eighteenth embodiment of the LOCOS merged-mask micro-machining process 5600, using photoresist as an etching mask with the use of a buffer layer of silicon dioxide, includes the steps of (1) provide a silicon wafer 7400 in step 5602, as illustrated in FIG. 74a, (2) apply a buffer pad layer 7405 of silicon dioxide onto the silicon wafer 7400 in step 5604, as illustrated in FIG. 74b, (3) apply a layer 7410 of silicon nitride onto the silicon wafer 7400 in step 5606, as illustrated in FIG. 74c, (4) pattern the layer 7410 of silicon nitride in step 5608, as illustrated in FIG. 74d, (5) grow a field layer 7415 of silicon dioxide onto the portions of the silicon wafer 7400 not covered by the patterned layer 7410 of silicon nitride in step 5614 (the field layer of silicon dioxide is preferably at least as thick as the combined thicknesses of the layer of silicon nitride and the optional buffer layer of silicon dioxide), as illustrated in FIG. 74e, (6) pattern the layers 7405 and 7415 of silicon dioxide in step 5616, as illustrated in FIG. 74f, (7) apply and pattern a layer 7420 of photoresist onto the silicon wafer 7400 in step 5620, as illustrated in FIG. 74g, (8) etch the exposed portions of the silicon wafer

7400 using a plasma or gaseous etchant in step 5622, as illustrated in FIG. 74h, (9) etch the exposed portions of the layers 7405 and 7415 of silicon dioxide in step 5624, as illustrated in FIG. 74i; (10) etch the exposed portions of the silicon wafer 7400 using a plasma or gaseous etchant in step 5626, as illustrated in FIG. 74j, (11) remove the layer 7420 of photoresist in step 5628, as illustrated in FIG. 74k, (12) etch the exposed portions of the silicon wafer 7400 in step 5630, as illustrated in FIG. 74l, (13) etch the exposed portions of the layers 7405 and 7415 of silicon dioxide in step 5632, as illustrated in FIG. 74m, (14) etch the exposed portions of the silicon wafer 7400 in step 5634, as illustrated in FIG. 74n, and (15) remove the remaining portions of the layers 7405, 7410 and 7415 of silicon dioxide and silicon nitride, as illustrated in FIG. 74o.

In a preferred implementation of the eighteenth embodiment of the LOCOS merged-mask micro-machining process 5600, the following process parameters are employed: the thickness of the pad buffer layer 7405 of silicon dioxide ranges from about 0.03 to 1 microns, the thickness of the layer 7410 of silicon nitride ranges from about 0.1 to 2.0 microns, the thickness of the field layer 7415 of silicon dioxide ranges from about 0.2 to 3.0 microns, and the thickness of layer 7420 of photoresist ranges from about 1 to 10 microns.

In a preferred implementation of the eighteenth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 75a–75m, the nineteenth embodiment of the LOCOS merged-mask micro-machining process 5600, using photoresist as an etching mask with the use of a buffer layer of silicon dioxide, includes the steps of: (1) provide a silicon wafer 7500 in step 5602, as illustrated in FIG. 75a, (2) apply a buffer pad layer 7505 of silicon dioxide onto the silicon wafer 7500 in step 5604, as illustrated in FIG. 75b, (3) apply a layer 7510 of silicon nitride onto the silicon wafer 7500 in step 5606, as illustrated in FIG. 75c, (4) pattern the layer 7510 of silicon nitride in step 5608, as illustrated in FIG. 75d, (5) grow a field layer 7515 of silicon dioxide onto the portions of the silicon wafer 7500 not covered by the patterned layer 7510 of silicon nitride in step 5614 (the field layer of silicon dioxide is preferably at least as thick as the combined thicknesses of the layer of silicon nitride and the optional buffer layer of silicon dioxide), as illustrated in FIG. 75e, (6) pattern the layers 7505 and 7515 of silicon dioxide in step 5616, as illustrated in FIG. 75f, (7) apply and pattern a layer 7520 of photoresist onto the silicon wafer 7500 in step 5620, as illustrated in FIG. 75g, (8) etch the exposed portions of the layers 7505 and 7515 of silicon dioxide in step 5624, as illustrated in FIG. 75h; (9) remove the layer 7520 of photoresist in step 5628, as illustrated in FIG. 75i, (10) etch the exposed portions of the silicon wafer 7500 in step 5630, as illustrated in FIG. 75j, (11) etch the exposed portions of the layers 7505 and 7515 of silicon dioxide in step 5632, as illustrated in FIG. 75k, (12) etch the exposed portions of the silicon wafer 7500 in step 5634, as illustrated in FIG. 75l, and (13) remove the remaining portions of the layers 7505, 7510 and 7515 of silicon dioxide and silicon nitride, as illustrated in FIG. 75m.

In a preferred implementation of the nineteenth embodiment of the LOCOS merged-mask micro-machining process 5600, the following process parameters are employed: the thickness of the pad buffer layer 7505 of silicon dioxide ranges from about 0.03 to 1 microns, the thickness of the layer 7510 of silicon nitride ranges from about 0.1 to 2.0 microns, the thickness of the field layer 7515 of silicon dioxide ranges from about 0.2 to 3.0 microns, and the thickness of layer 7520 of photoresist ranges from about 1 to 10 microns.

In a preferred implementation of the nineteenth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 76a–76n, the twentieth embodiment of the LOCOS merged-mask micro-machining process 5600, using photoresist as an etching mask with the use of a buffer layer of silicon dioxide, includes the steps of: (1) provide a silicon wafer 7600 in step 5602, as illustrated in FIG. 76a, (2) apply a buffer pad layer 7605 of silicon dioxide onto the silicon wafer 7600 in step 5604, as illustrated in FIG. 76b, (3) apply a layer 7610 of silicon nitride onto the silicon wafer 7600 in step 5606, as illustrated in FIG. 76c, (4) pattern the layer 7610 of silicon nitride in step 5608, as illustrated in FIG. 76d, (5) grow a field layer 7615 of silicon dioxide onto the portions of the silicon wafer 7600 not covered by the patterned layer 7610 of silicon nitride in step 5614 (the field layer of silicon dioxide is preferably at least as thick as the combined thicknesses of the layer of silicon nitride and the optional buffer layer of silicon dioxide), as illustrated in FIG. 76e, (6) pattern the layers 7605 and 7615 of silicon dioxide in step 5616, as illustrated in FIG. 76f, (7) apply and pattern a layer 7620 of photoresist onto the silicon wafer 7600 in step 5620, as illustrated in FIG. 76g, (8) etch the exposed portions of the layers 7605 and 7615 of silicon dioxide in step 5624, as illustrated in FIG. 76h; (9) etch the exposed portions of the silicon wafer 7600 using a plasma or gaseous etchant in step 5626, as illustrated in FIG. 76i; (10) remove the layer 7620 of photoresist in step 5628, as illustrated in FIG. 76j, (11) etch the exposed portions of the silicon wafer 7600 in step 5630, as illustrated in FIG. 76k, (12) etch the exposed portions of the layers 7605 and 7615 of silicon dioxide in step 5632, as illustrated in FIG. 76l, (13) etch the exposed portions of the silicon wafer 7600 in step 5634, as illustrated in FIG. 76m, and (14) remove the remaining portions of the layers 7605, 7610 and 7615 of silicon dioxide and silicon nitride, as illustrated in FIG. 76n.

In a preferred implementation of the twentieth embodiment of the LOCOS merged-mask micro-machining process 5600, the following process parameters are employed: the thickness of the pad buffer layer 7605 of silicon dioxide ranges from about 0.03 to 1 microns, the thickness of the layer 7610 of silicon nitride ranges from about 0.1 to 2.0 microns, the thickness of the field layer 7615 of silicon dioxide ranges from about 0.2 to 3.0 microns, and the thickness of layer 7620 of photoresist ranges from about 1 to 10 microns.

In a preferred implementation of the twentieth embodiment of the LOCOS merged-mask micro-machining process 5600, the etching performed in steps 5622 and 5626 comprises DRIE and provides sidewalls having an angle of 90°±45° relative to horizontal.

Referring to FIGS. 56a, 56b, and 77a–77m, the twenty-first embodiment of the LOCOS merged-mask micro-machining process 5600, using photoresist as an etching mask with the use of a buffer layer of silicon dioxide, includes the steps of: (1) provide a silicon wafer 7700 in step 5602, as illustrated in FIG. 77a, (2) apply a buffer pad layer 7705 of silicon dioxide onto the silicon wafer 7700 in step 5604, as illustrated in FIG. 77b, (3) apply a layer 7710 of silicon nitride onto the silicon wafer 7700 in step 5606, as illustrated in FIG. 77c, (4) pattern the layer 7710 of silicon nitride in step 5608, as illustrated in FIG. 77d, (5) grow a field layer 7715 of silicon dioxide onto the portions of the silicon wafer 7700 not covered by the patterned layer 7710 of silicon nitride in step 5614 (the field layer of silicon dioxide is preferably at least as thick as the combined thicknesses of the layer of silicon nitride and the optional buffer layer of silicon dioxide), as illustrated in FIG. 77e, (6) pattern the layers 7705 and 7715 of silicon dioxide in step 5616, as illustrated in FIG. 77f, (7) apply and pattern a layer 7720 of photoresist onto the silicon wafer 7700 in step 5620, as illustrated in FIG. 77g, (8) etch the exposed portions of the silicon wafer 7700 using a plasma or gaseous etchant in step 5626, as illustrated in FIG. 77h, (10) remove the layer 7720 of photoresist in step 5628, as illustrated in FIG. 77i, (11) etch the exposed portions of the silicon wafer 7700 in step 5630, as illustrated in FIG. 77j, (12) etch the exposed portions of the layers 7705 and 7715 of silicon dioxide in step 5632, as illustrated in FIG. 77k, (13) etch the exposed portions of the silicon wafer 7700 in step 5634, as illustrated in FIG. 77l, and (14) remove the remaining portions of the layers 7705, 7710, and 7715 of silicon dioxide and silicon nitride, as illustrated in FIG. 77m.

In a preferred implementation of the twenty-first embodiment of the LOCOS merged-mask micro-machining process 5600, the following process parameters are employed: the thickness of the pad buffer layer 7705 of silicon dioxide ranges from about 0.03 to 1 microns, the thickness of the layer 7710 of silicon nitride ranges from about 0.1 to 2.0 microns, the thickness of the field layer 7715 of silicon dioxide ranges from about 0.2 to 3.0 microns, and the thickness of layer 7720 of photoresist ranges from about 1 to 10 microns.

In a preferred implementation of the twenty-first embodiment of the LOCOS merged-mask micro-machining process 5600, the etching performed in steps 5622 and 5626 comprises DRIE and provides sidewalls having an angle of $90°\pm45°$ relative to horizontal.

Referring to FIGS. 56a, 56b, and 78a–78n, the twenty-second embodiment of the LOCOS merged-mask micro-machining process 5600, using photoresist as an etching mask with the use of an etched buffer layer of silicon dioxide, includes the steps of: (1) provide a silicon wafer 7800 in step 5602, as illustrated in FIG. 78a, (2) apply a buffer pad layer 7805 of silicon dioxide onto the silicon wafer 7800 in step 5604, as illustrated in FIG. 78b, (3) apply a layer 7810 of silicon nitride onto the silicon wafer 7800 in step 5606, as illustrated in FIG. 78c, (4) pattern the layer 7810 of silicon nitride in step 5608, as illustrated in FIG. 78d, (5) pattern the buffer pad layer 7805 of silicon dioxide in step 5610, as illustrated in FIG. 78e, (6) grow a field layer 7815 of silicon dioxide onto the portions of the silicon wafer 7800 not covered by the patterned layer 7810 of silicon nitride in step 5614 (the field layer of silicon dioxide is preferably at least as thick as the combined thicknesses of the layer of silicon nitride and the optional buffer layer of silicon dioxide), as illustrated in FIG. 78f, (7) pattern the layers 7805 and 7815 of silicon dioxide in step 5616, as illustrated in FIG. 78g, (8) apply and pattern a layer 7820 of photoresist onto the silicon wafer 7800 in step 5620, as illustrated in FIG. 78h, (9) etch the exposed portions of the silicon wafer 7800 using a plasma or gaseous etchant in step 5622, as illustrated in FIG. 78i, (10) remove the layer 7820 of photoresist in step 5628, as illustrated in FIG. 78j, (11) etch the exposed portions of the silicon wafer 7800 in step 5630, as illustrated in FIG. 78k, (12) etch the exposed portions of the layers 7805 and 7815 of silicon dioxide in step 5632, as illustrated in FIG. 78l, (13) etch the exposed portions of the silicon wafer 7800 in step 5634, as illustrated in FIG. 78m, and (14) remove the remaining portions of the layers 7805, 7810 and 7815 of silicon dioxide and silicon nitride, as illustrated in FIG. 78n.

In a preferred implementation of the twenty-second embodiment of the LOCOS merged-mask micro-machining process 5600, the following process parameters are employed: the thickness of the pad buffer layer 7805 of silicon dioxide ranges from about 0.03 to 1 microns, the thickness of the layer 7810 of silicon nitride ranges from about 0.1 to 2.0 microns, the thickness of the field layer 7815 of silicon dioxide ranges from about 0.2 to 3.0 microns, and the thickness of layer 7820 of photoresist ranges from about 1 to 10 microns.

In a preferred implementation of the twenty-second embodiment of the LOCOS merged-mask micro-machining process 5600, the etching performed in steps 5622 and 5626 comprises DRIE and provides sidewalls having an angle of $90°\pm4520$ relative to horizontal.

In a preferred implementation of the twenty-second embodiment of the LOCOS merged-mask micro-machining process 5600, the patterned layer 7810 of silicon nitride is used as an etch mask for patterning the exposed portions of the buffer layer 7805 of silicon dioxide in step 5610.

Referring to FIGS. 56a, 56b, and 79a–79o, the twenty-third embodiment of the LOCOS merged-mask micro-machining process 5600, using photoresist as an etching mask with the use of an etched buffer layer of silicon dioxide, includes the steps of: (1) provide a silicon wafer 7900 in step 5602, as illustrated in FIG. 79a, (2) apply a buffer pad layer 7905 of silicon dioxide onto the silicon wafer in step 5604, as illustrated in FIG. 79b, (3) apply a layer 7910 of silicon nitride onto the silicon wafer 7900 in step 5606, as illustrated in FIG. 79c, (4) pattern the layer 7910 of silicon nitride in step 5608, as illustrated in FIG. 79d, (5) pattern the buffer pad layer 7905 of silicon dioxide in step 5610, as illustrated in FIG. 79e, (6) grow a field layer 7915 of silicon dioxide onto the portions of the silicon wafer 7900 not covered by the patterned layer 7910 of silicon nitride in step 5614 (the field layer of silicon dioxide is preferably at least as thick as the combined thicknesses of the layer of silicon nitride and the optional buffer layer of silicon dioxide), as illustrated in FIG. 79f, (7) pattern the layers 7905 and 7915 of silicon dioxide in step 5616, as illustrated in FIG. 79g, (8) apply and pattern a layer 7920 of photoresist onto the silicon wafer 7900 in step 5620, as illustrated in FIG. 79h, (9) etch the exposed portions of the silicon wafer 7900 using a plasma or gaseous etchant in step 5622, as illustrated in FIG. 79i, (10) etch the exposed portions of the layers 7905 and 7915 of silicon dioxide in step 5624, as illustrated in FIG. 79j, (11) remove the layer 7920 of photoresist in step 5628, as illustrated in FIG. 79k, (12) etch the exposed portions of the silicon wafer 7900 in step 5630, as illustrated in FIG. 79l, (13) etch the exposed portions of the layers 7905 and 7915 of silicon dioxide in step 5632, as illustrated in FIG. 79m, (14) etch the exposed portions of the silicon wafer 7900 in step 5634, as illustrated in FIG. 79n, and (15) remove the remaining portions of the layers 7905, 7910 and 7915 of silicon dioxide and silicon nitride, as illustrated in FIG. 79o.

In a preferred implementation of the twenty-third embodiment of the LOCOS merged-mask micro-machining process 5600, the following process parameters are employed: the thickness of the pad buffer layer 7905 of silicon dioxide ranges from about 0.03 to 1 microns, the thickness of the layer 7910 of silicon nitride ranges from about 0.1 to 2.0 microns, the thickness of the field layer 7915 of silicon dioxide ranges from about 0.2 to 3.0 microns, and the thickness of layer 7920 of photoresist ranges from about 1 to 10 microns.

In a preferred implementation of the twenty-third embodiment of the LOCOS merged-mask micro-machining process 5600, the etching performed in steps 5622 and 5626 comprises DRIE and provides sidewalls having an angle of 90°±45° relative to horizontal.

In a preferred implementation of the twenty-third embodiment of the LOCOS merged-mask micro-machining process 5600, the patterned layer 7910 of silicon nitride is used as an etch mask for patterning the exposed portions of the buffer layer 7905 of silicon dioxide in step 5610.

Referring to FIGS. 56*a*, 56*b*, and 80*a*–80*o*, the twenty-fourth embodiment of the LOCOS merged-mask micro-machining process 5600, using photoresist as an etching mask with the use of an etched buffer layer of silicon dioxide, includes the steps of: (1) provide a silicon wafer 8000 in step 5602, as illustrated in FIG. 80*a*, (2) apply a buffer pad layer 8005 of silicon dioxide onto the silicon wafer 8000 in step 5604, as illustrated in FIG. 80*b*, (3) apply a layer 8010 of silicon nitride onto the silicon wafer 8000 in step 5606, as illustrated in FIG. 80*c*, (4) pattern the layer 8010 of silicon nitride in step 5608, as illustrated in FIG. 80*d*, (5) pattern the buffer pad layer 8005 of silicon dioxide in step 5610, as illustrated in FIG. 80*e*, (6) grow a field layer 8015 of silicon dioxide onto the portions of the silicon wafer 8000 not covered by the patterned layer 8010 of silicon nitride in step 5614 (the field layer of silicon dioxide is preferably at least as thick as the combined thicknesses of the layer of silicon nitride and the optional buffer layer of silicon dioxide), as illustrated in FIG. 80*f*, (7) pattern the layers 8005 and 8015 of silicon dioxide in step 5616, as illustrated in FIG. 80*g*, (8) apply and pattern a layer 8020 of photoresist onto the silicon wafer 8000 in step 5620, as illustrated in FIG. 80*h*, (9) etch the exposed portions of the silicon wafer 8000 using a plasma or gaseous etchant in step 5622, as illustrated in FIG. 80*i*, (10) etch the exposed portions of the silicon wafer 8000 using a plasma or gaseous etchant in step 5626, as illustrated in FIG. 80*j*, (11) remove the layer 8020 of photoresist in step 5628, as illustrated in FIG. 80*k*, (12) etch the exposed portions of the silicon wafer 8000 in step 5630, as illustrated in FIG. 80*l*, (13) etch the exposed portions of the layers 8005 and 8015 of silicon dioxide in step 5632, as illustrated in FIG. 80*m*, (14) etch the exposed portions of the silicon wafer 8000 in step 5634, as illustrated in FIG. 80*n*, and (15) remove the remaining portions of the layers 8005, 8010, and 8015 of silicon dioxide and silicon nitride, as illustrated in FIG. 80*o*.

In a preferred implementation of the twenty-fourth embodiment of the LOCOS merged-mask micro-machining process 5600, the following process parameters are employed: the thickness of the pad buffer layer 8005 of silicon dioxide ranges from about 0.03 to 1 microns, the thickness of the layer 8010 of silicon nitride ranges from about 0.1 to 2.0 microns, the thickness of the field layer 8015 of silicon dioxide ranges from about 0.2 to 3.0 microns, and the thickness of layer 8020 of photoresist ranges from about 1 to 10 microns.

In a preferred implementation of the twenty-fourth embodiment of the LOCOS merged-mask micro-machining process 5600, the etching performed in steps 5622 and 5626 comprises DRIE and provides sidewalls having an angle of 90°±45° relative to horizontal.

In a preferred implementation of the twenty-fourth embodiment of the LOCOS merged-mask micro-machining process 5600, the patterned layer 8010 of silicon nitride is used as an etch mask for patterning the exposed portions of the buffer layer 8005 of silicon dioxide in step 5610.

Referring to FIGS. 56*a*, 56*b*, and 81*a*–81*p*, the twenty-fifth embodiment of the LOCOS merged-mask micro-machining process 5600, using photoresist as an etching mask with the use of an etched buffer layer of silicon dioxide, includes the steps of: (1) provide a silicon wafer 8100 in step 5602, as illustrated in FIG. 81*a*, (2) apply a buffer pad layer 8105 of silicon dioxide onto the silicon wafer 8100 in step 5604, as illustrated in FIG. 81*b*, (3) apply a layer 8110 of silicon nitride onto the silicon wafer 8100 in step 5606, as illustrated in FIG. 81*c*, (4) pattern the layer 8110 of silicon nitride in step 5608, as illustrated in FIG. 81*d*, (5) pattern the buffer pad layer 8105 of silicon dioxide in step 5610, as illustrated in FIG. 81*e*, (6) grow a field layer 8115 of silicon dioxide onto the portions of the silicon wafer 8100 not covered by the patterned layer 8110 of silicon nitride in step 5614 (the field layer of silicon dioxide is preferably at least as thick as the combined thicknesses of the layer of silicon nitride and the optional buffer layer of silicon dioxide), as illustrated in FIG. 81*f*, (7) pattern the layers 8105 and 8115 of silicon dioxide in step 5616, as illustrated in FIG. 81*g*, (8) apply and pattern a layer 8120 of photoresist onto the silicon wafer 8100 in step 5620, as illustrated in FIG. 81*h*, (9) etch the exposed portions of the silicon wafer 8100 using a plasma or gaseous etchant in step 5622, as illustrated in FIG. 81*i*, (10) etch the exposed portions of the layers 8105 and 8115 of silicon dioxide in step 5624, as illustrated in FIG. 81*j*; (11) etch the exposed portions of the silicon wafer 8100 using a plasma or gaseous etchant in step 5626, as illustrated in FIG. 81*k*, (12) remove the layer 8120 of photoresist in step 5628, as illustrated in FIG. 81*l*, (13) etch the exposed portions of the silicon wafer 8100 in step 5630, as illustrated in FIG. 81*m*, (14) etch the exposed portions of the layers 8105 and 8115 of silicon dioxide in step 5632, as illustrated in FIG. 81*n*, (15) etch the exposed portions of the silicon wafer 8100 in step 5634, as illustrated in FIG. 81*o*, and (16) remove the remaining portions of the layers 8105, 8110 and 8115 of silicon dioxide and silicon nitride, as illustrated in FIG. 81*p*.

In a preferred implementation of the twenty-fifth embodiment of the LOCOS merged-mask micro-machining process 5600, the following process parameters are employed: the thickness of the pad buffer layer 8105 of silicon dioxide ranges from about 0.03 to 1 microns, the thickness of the layer 8110 of silicon nitride ranges from about 0.1 to 2.0 microns, the thickness of the field layer 8115 of silicon dioxide ranges from about 0.2 to 3.0 microns, and the thickness of layer 8120 of photoresist ranges from about 1 to 10 microns.

In a preferred implementation of the twenty-fifth embodiment of the LOCOS merged-mask micro-machining process 5600, the etching performed in steps 5622 and 5626 comprises DRIE and provides sidewalls having n angle of 90°±45° relative to horizontal.

In a preferred implementation of the twenty-fifth embodiment of the LOCOS merged-mask micro-machining process 5600, the patterned layer 8110 of silicon nitride is used as an etch mask for patterning the exposed portions of the buffer layer 8105 of silicon dioxide in step 5610.

Referring to FIGS. 56*a*, 56*b*, and 82*a*–82*m*, the twenty-sixth embodiment of the LOCOS merged-mask micro-machining process 5600, using photoresist as an etching mask with the use of an etched buffer layer of silicon dioxide, includes the steps of: (1) provide a silicon wafer 8200 in step 5602, as illustrated in FIG. 82*a*, (2) apply a buffer pad layer 8205 of silicon dioxide onto the silicon wafer 8200 in step 5604, as illustrated in FIG. 82*b*, (3) apply a layer 8210 of silicon nitride onto the silicon wafer 8200 in step 5606, as illustrated in FIG. 82*c*, (4) pattern the layer 8210 of silicon nitride in step 5608, as illustrated in FIG. 82*d*, (5) pattern the buffer pad layer 8205 of silicon dioxide in step 5610, as illustrated in FIG. 82*e*, (6) grow a field layer 8215 of silicon dioxide onto the portions of the silicon wafer 8200 not covered by the patterned layer 8210 of silicon nitride in step 5614 (the field layer of silicon dioxide is preferably at least as thick as the combined thicknesses of the layer of silicon nitride and the optional buffer layer of silicon dioxide), as illustrated in FIG. 82*f*, (7) pattern the layers 8205 and 8215 of silicon dioxide in step 5616, as illustrated in FIG. 82*g*, (8) apply and pattern a layer 8220 of photoresist onto the silicon wafer 8200 in step 5620, as illustrated in FIG. 82*h*, (9) etch the exposed portions of the layers 8205 and 8215 of silicon dioxide in step 5624, as illustrated in FIG. 82*i*; (10) remove the layer 8220 of photoresist in step 5628, as illustrated in FIG. 82*j*, (11) etch the exposed portions of the silicon wafer 8200 in step 5630, as illustrated in FIG. 82*k*, (12) etch the exposed portions of the layers 8205 and 8215 of silicon dioxide in step 5632, as illustrated in FIG. 82*l*, (13) etch the exposed portions of the silicon wafer 8200 in step 5634, as illustrated in FIG. 82*m*, and (14) remove the remaining portions of the layers 8205, 8210 and 8215 of silicon dioxide and silicon nitride, as illustrated in FIG. 82*n*.

In a preferred implementation of the twenty-sixth embodiment of the LOCOS merged-mask micro-machining process 5600, the following process parameters are employed: the thickness of the pad buffer layer 8205 of silicon dioxide ranges from about 0.03 to 1 microns, the thickness of the layer 8210 of silicon nitride ranges from about 0.1 to 2.0 microns, the thickness of the field layer 8215 of silicon dioxide ranges from about 0.2 to 3.0 microns, and the thickness of layer 8220 of photoresist ranges from about 1 to 10 microns.

In a preferred implementation of the twenty-sixth embodiment of the LOCOS merged-mask micro-machining process 5600, the etching performed in steps 5622 and 5626 comprises DRIE and provides sidewalls having an angle of 90°±45° relative to horizontal.

In a preferred implementation of the twenty-sixth embodiment of the LOCOS merged-mask micro-machining process 5600, the patterned layer 8210 of silicon nitride is used as an etch mask for patterning the exposed portions of the buffer layer 8205 of silicon dioxide in step 5610.

Referring to FIGS. 56*a*, 56*b*, and 83*a*–83*o*, the twenty-seventh embodiment of the LOCOS merged-mask micro-machining process 5600, using photoresist as an etching mask with the use of an etched buffer layer of silicon dioxide, includes the steps of: (1) provide a silicon wafer 8300 in step 5602, as illustrated in FIG. 83*a*, (2) apply a buffer pad layer 8305 of silicon dioxide onto the silicon wafer 8300 in step 5604, as illustrated in FIG. 83*b*, (3) apply a layer 8310 of silicon nitride onto the silicon wafer 8300 in step 5606, as illustrated in FIG. 83*c*, (4) pattern the layer 8310 of silicon nitride in step 5608, as illustrated in FIG. 83*d*, (5) pattern the buffer pad layer 8305 of silicon dioxide in step 5610, as illustrated in FIG. 83*e*, (6) grow a field layer 8315 of silicon dioxide onto the portions of the silicon wafer 8300 not covered by the patterned layer 8310 of silicon nitride in step 5614 (the field layer of silicon dioxide is preferably at least as thick as the combined thicknesses of the layer of silicon nitride and the optional buffer layer of silicon dioxide), as illustrated in FIG. 83*f*, (7) pattern the layers 8305 and 8315 of silicon dioxide in step 5616, as illustrated in FIG. 83*g*, (8) apply and pattern a layer 8320 of photoresist onto the silicon wafer 8300 in step 5620, as illustrated in FIG. 83*h*, (9) etch the exposed portions of the layers 8305 and 8315 of silicon dioxide in step 5624, as illustrated in FIG. 83*i*; (10) etch the exposed portions of the silicon wafer 8300 using a plasma or gaseous etchant in step 5626, as illustrated in FIG. 83*j*; (11) remove the layer 8320 of photoresist in step 5628, as illustrated in FIG. 83*k*, (12) etch the exposed portions of the silicon wafer 8300 in step 5630, as illustrated in FIG. 83*l*, (13) etch the exposed portions of the layers 8305 and 8315 of silicon dioxide in step 5632, as illustrated in FIG. 83*m*, (14) etch the exposed portions of the silicon wafer 8300 in step 5634, as illustrated in FIG. 83*n*, and (15) remove the remaining portions of the layers 8305, 8310 and 8315 of silicon dioxide and silicon nitride, as illustrated in FIG. 83*o*.

In a preferred implementation of the twenty-seventh embodiment of the LOCOS merged-mask micro-machining process 5600, the following process parameters are employed: the thickness of the pad buffer layer 8305 of silicon dioxide ranges from about 0.03 to 1 microns, the thickness of the layer 8310 of silicon nitride ranges from about 0.1 to 2.0 microns, the thickness of the field layer 8315 of silicon dioxide ranges from about 0.2 to 3.0 microns, and the thickness of layer 8320 of photoresist ranges from about 1 to 10 microns.

In a preferred implementation of the twenty-seventh embodiment of the LOCOS merged-mask micro-machining process 5600, the etching performed in steps 5622 and 5626 comprises DRIE and provides sidewalls having an angle of 90°±45° relative to horizontal.

In a preferred implementation of the twenty-seventh embodiment of the LOCOS merged-mask micro-machining process 5600, the patterned layer 8310 of silicon nitride is used as an etch mask for patterning the exposed portions of the buffer layer 8305 of silicon dioxide in step 5610.

Referring to FIGS. 56*a*, 56*b*, and 84*a*–84*n*, the twenty-eighth embodiment of the LOCOS merged-mask micro-machining process 5600, using photoresist as an etching mask with the use of an etched buffer layer of silicon dioxide, includes the steps of: (1) provide a silicon wafer 8400 in step 5602, as illustrated in FIG. 84*a*, (2) apply a buffer pad layer 8405 of silicon dioxide onto the silicon wafer 8400 in step 5604, as illustrated in FIG. 84*b*, (3) apply a layer 8410 of silicon nitride onto the silicon wafer 8400 in step 5606, as illustrated in FIG. 84*c*, (4) pattern the layer 8410 of silicon nitride in step 5608, as illustrated in FIG. 84*d*, (5) pattern the buffer pad layer 8405 of silicon dioxide in step 5610, as illustrated in FIG. 84*e*, (6) grow a field layer 8415 of silicon dioxide onto the portions of the silicon wafer 8400 not covered by the patterned layer 8410 of silicon nitride in step 5614 (the field layer of silicon dioxide is preferably at least as thick as the combined thicknesses of the layer of silicon nitride and the optional buffer layer of silicon dioxide), as illustrated in FIG. 84*f*, (7) pattern the layers 8405 and 8415 of silicon dioxide in step 5616, as illustrated in FIG. 84*g*, (8) apply and pattern a layer 8420 of photoresist onto the silicon wafer 8400 in step 5620, as illustrated in FIG. 84*h*, (9) etch the exposed portions of the silicon wafer 8400 using a plasma or gaseous etchant in step 5626, as illustrated in FIG. 84*i*, (10) remove the layer 8420 of photoresist in step 5628, as illustrated in FIG. 84*j*, (11) etch the exposed portions of the silicon wafer 8400 in step 5630, as illustrated in FIG. 84k, (12) etch the exposed portions of the layers 8405 and 8415 of silicon dioxide in step 5632, as illustrated in FIG. 84l, (13) etch the exposed portions of the silicon wafer 8400 in step 5634, as illustrated in FIG. 84m, and (14) remove the remaining portions of the layers 8405, 8410, and 8415 of silicon dioxide and silicon nitride, as illustrated in FIG. 84n.

In a preferred implementation of the twenty-eighth embodiment of the LOCOS merged-mask micro-machining process 5600, the following process parameters are employed: the thickness of the pad buffer layer 8405 of silicon dioxide ranges from about 0.03 to 1 microns, the thickness of the layer 8410 of silicon nitride ranges from about 0.1 to 2.0 microns, the thickness of the field layer 8415 of silicon dioxide ranges from about 0.2 to 3.0 microns, and the thickness of layer 8420 of photoresist ranges from about 1 to 10 microns.

In a preferred implementation of the twenty-eighth embodiment of the LOCOS merged-mask micro-machining process 5600, the etching performed in steps 5622 and 5626 comprises DRIE and provides sidewalls having an angle of 90°±45° relative to horizontal.

In a preferred implementation of the twenty-eighth embodiment of the LOCOS merged-mask micro-machining process 5600, the patterned layer 8410 of silicon nitride is used as an etch mask for patterning the exposed portions of the buffer layer 8405 of silicon dioxide in step 5610.

Referring to FIGS. 56a, 56b, and 85a–85o, the twenty-ninth embodiment of the LOCOS merged-mask micro-machining process 5600, using photoresist as an etching mask with the use of an etched buffer layer of silicon dioxide and a thin etch of the exposed portions of the silicon wafer, includes the steps of: (1) provide a silicon wafer 8500 in step 5602, as illustrated in FIG. 85a, (2) apply a buffer pad layer 8505 of silicon dioxide onto the silicon wafer 8500 in step 5604, as illustrated in FIG. 85b, (3) apply a layer 8510 of silicon nitride onto the silicon wafer 8500 in step 5606, as illustrated in FIG. 85c, (4) pattern the layer 8510 of silicon nitride in step 5608, as illustrated in FIG. 85d, (5) pattern the buffer pad layer 8505 of silicon dioxide in step 5610, as illustrated in FIG. 85e, (6) thin etch the exposed portions of the silicon wafer 8500 in step 5612, as illustrated in FIG. 85f, (7) grow a field layer 8515 of silicon dioxide onto the portions of the silicon wafer 8500 not covered by the patterned layer 8510 of silicon nitride in step 5614 (the field layer of silicon dioxide is preferably at least as thick as the combined thicknesses of the layer of silicon nitride and the; optional buffer layer of silicon dioxide), as illustrated in FIG. 85g, (8) pattern the layers 8505 and 8515 of silicon dioxide in step 5616, as illustrated in FIG. 85h, (9) apply and pattern a layer 8520 of photoresist onto the silicon wafer 8500 in step 5620, as illustrated in FIG. 85i, (10) etch the exposed portions of the silicon wafer 8500 using a plasma or gaseous etchant in step 5622, as illustrated in FIG. 85j, (11) remove the layer 8520 of photoresist in step 5628, as illustrated in FIG. 85k, (12) etch the exposed portions of the silicon wafer 8500 in step 5630, as illustrated in FIG. 85l, (13) etch the exposed portions of the layers 8505 and 8515 of silicon dioxide in step 5632, as illustrated in FIG. 85m, (14) etch the exposed portions of the silicon wafer 8500 in step 5634, as illustrated in FIG. 85n, and (15) remove the remaining portions of the layers 7805, 7810 and 7815 of silicon dioxide and silicon nitride, as illustrated in FIG. 85o.

In a preferred implementation of the twenty-ninth embodiment of the LOCOS merged-mask micro-machining process 5600, the following process parameters are employed: the thickness of the pad buffer layer 8505 of silicon dioxide ranges from about 0.03 to 1 microns, the thickness of the layer 8510 of silicon nitride ranges from about 0.1 to 2.0 microns, the thickness of the field layer 8515 of silicon dioxide ranges from about 0.2 to 3.0 microns, the thickness of layer 8520 of photoresist ranges from about 1 to 10 microns, and the depth of the thin etch of the exposed portions of the silicon wafer 8500 ranges from about 0.5 to 1 microns.

In a preferred implementation of the twenty-ninth embodiment of the LOCOS merged-mask micro-machining process 5600, the etching performed in steps 5622 and 5626 comprises DRIE and provides sidewalls having an angle of 90°±45° relative to horizontal.

In a preferred implementation of the twenty-ninth embodiment of the LOCOS merged-mask micro-machining process 5600, the thin etch of the exposed portions of the silicon wafer 8500 in step 5612 is performed using a layer of photoresist as a masking layer.

Referring to FIGS. 56a, 56b, and 86a–86p, the thirtieth embodiment of the LOCOS merged-mask micro-machining process 5600, using photoresist as an etching mask with the use of an etched buffer layer of silicon dioxide and a thin etch of the exposed portions of the silicon wafer, includes the steps of: (1) provide a silicon wafer 8600 in step 5602, as illustrated in FIG. 86a, (2) apply a buffer pad layer 8605 of silicon dioxide onto the silicon wafer 8600 in step 5604, as illustrated in FIG. 86b, (3) apply a layer 8610 of silicon nitride onto the silicon wafer 8600 in step 5606, as illustrated in FIG. 86c, (4) pattern the layer 8610 of silicon nitride in step 5608, as illustrated in FIG. 86d, (5) pattern the buffer pad layer 8605 of silicon dioxide in step 5610, as illustrated in FIG. 86e, (6) thin etch the exposed portions of the silicon wafer 8600 in step 5612, as illustrated in FIG. 86f, (7) grow a field layer 8615 of silicon dioxide onto the portions of the silicon wafer 8600 not covered by the patterned layer 8610 of silicon nitride in step 5614 (the field layer of silicon dioxide is preferably at least as thick as the combined thicknesses of the layer of silicon nitride and the optional buffer layer of silicon dioxide), as illustrated in FIG. 86g, (8) pattern the layers 8605 and 8615 of silicon dioxide in step 5616, as illustrated in FIG. 86h, (9) apply and pattern a layer 8620 of photoresist onto the silicon wafer 8600 in step 5620, as illustrated in FIG. 86i, (10) etch the exposed portions of the silicon wafer 8600 using a plasma or gaseous etchant in step 5622, as illustrated in FIG. 86j, (11) etch the exposed portions of the layers 8605 and 8615 of silicon dioxide in step 5624, as illustrated in FIG. 86k, (12) remove the layer 8620 of photoresist in step 5628, as illustrated in FIG. 86l, (13) etch the exposed portions of the silicon wafer 8600 in step 5630, as illustrated in FIG. 86m, (14) etch the exposed portions of the layers 8605 and 8615 of silicon dioxide in step 5632, as illustrated in FIG. 86n, (15) etch the exposed portions of the silicon wafer 8600 in step 5634, as illustrated in FIG. 86o, and (16) remove the remaining portions of the layers 8605, 8610 and 8615 of silicon dioxide and silicon nitride, as illustrated in FIG. 86p.

In a preferred implementation of the thirtieth embodiment of the LOCOS merged-mask micro-machining process 5600, the following process parameters are employed: the thickness of the pad buffer layer 8605 of silicon dioxide ranges from about 0.03 to 1 microns, the thickness of the layer 8610 of silicon nitride ranges from about 0.1 to 2.0 microns, the thickness of the field layer 8615 of silicon dioxide ranges from about 0.2 to 3.0 microns, the thickness of layer 8620 of photoresist ranges from about 1 to 10 microns, and the depth of the thin etch of the exposed portions of the silicon wafer 8600 ranges from about 0.5 to 1 microns.

In a preferred implementation of the thirtieth embodiment of the LOCOS merged-mask micro-machining process 5600, the etching performed in steps 5622 and 5626 comprises DRIE and provides sidewalls having an angle of 90°±45° relative to horizontal.

5 In a preferred implementation of the thirtieth embodiment of the LOCOS merged-mask micro-machining process 5600, the thin etch of the exposed portions of the silicon wafer 8600 in step 5612 is performed using a layer of photoresist as a masking layer.

Referring to FIGS. 56a, 56b, and 87a–87p, the thirty-first embodiment of the LOCOS merged-mask micro-machining process 5600, using photoresist as an etching mask with the use of an etched buffer layer of silicon dioxide and a thin etch of the exposed portions of the silicon wafer, includes the steps of: (1) provide a silicon wafer 8700 in step 5602, as illustrated in FIG. 87a, (2) apply a buffer pad layer 8705 of silicon dioxide onto the silicon wafer 8700 in step 5604, as illustrated in FIG. 87b, (3) apply a layer 8710 of silicon nitride onto the silicon wafer 8700 in step 5606, as illustrated in FIG. 87c, (4) pattern the layer 8710 of silicon nitride in step 5608, as illustrated in FIG. 87d, (5) pattern the buffer pad layer 8705 of silicon dioxide in step 5610, as illustrated in FIG. 87e, (6) thin etch the exposed portions of the silicon wafer 8700 in step 5612, as illustrated in FIG. 87f, (7) grow a field layer 8715 of silicon dioxide onto the portions of the silicon wafer 8700 not covered by the patterned layer 8710 of silicon nitride in step 5614 (the field layer of silicon dioxide is preferably at least as thick as the combined thicknesses of the layer of silicon nitride and the optional buffer layer of silicon dioxide), as illustrated in FIG. 87g, (8) pattern the layers 8705 and 8715 of silicon dioxide in step 5616, as illustrated in FIG. 87h, (9) apply and pattern a layer 8720 of photoresist onto the silicon wafer 8700 in step 5620, as illustrated in FIG. 87i, (10) etch the exposed portions of the silicon wafer 8700 using a plasma or gaseous etchant in step 5622, as illustrated in FIG. 87j, (11) etch the exposed portions of the silicon wafer 8700 using a plasma or gaseous etchant in step 5626, as illustrated in FIG. 87k, (12) remove the layer 8720 of photoresist in step 5628, as illustrated in FIG. 87l, (13) etch the exposed portions of the silicon wafer 8700 in step 5630, as illustrated in FIG. 87m, (14) etch the exposed portions of the layers 8705 and 8715 of silicon dioxide in step 5632, as illustrated in FIG. 87n, (15) etch the exposed portions of the silicon wafer 8700 in step 5634, as illustrated in FIG. 87o, and (16) remove the remaining portions of the layers 8705, 8710, and 8715 of silicon dioxide and silicon nitride, as illustrated in FIG. 87p.

In a preferred implementation of the thirty-first embodiment of the LOCOS merged-mask micro-machining process 5600, the following process parameters are employed: the thickness of the pad buffer layer 8705 of silicon dioxide ranges from about 0.03 to 1 microns, the thickness of the layer 8710 of silicon nitride ranges from about 0.1 to 2.0 microns, the thickness of the field layer 8715 of silicon dioxide ranges from about 0.2 to 3.0 microns, the thickness of layer 8720 of photoresist ranges from about 1 to 10 microns, and the depth of the thin etch of the exposed portions of the silicon wafer 8700 ranges from about 0.5 to 1 microns.

In a preferred implementation of the thirty-first embodiment of the LOCOS merged-mask micro-machining process 5600, the etching performed in steps 5622 and 5626 comprises DRIE and provides sidewalls having an angle of 90°±45° relative to horizontal.

In a preferred implementation of the thirty-first embodiment of the LOCOS merged-mask micro-machining process 5600, the thin etch of the exposed portions of the silicon wafer 8700 in step 5612 is performed using a layer of photoresist as a masking layer.

Referring to FIGS. 56a, 56b, and 88a–88q, the thirty-second embodiment of the LOCOS merged-mask micro-machining process 5600, using photoresist as an etching mask with the use of an etched buffer layer of silicon dioxide and a thin etch of the exposed portions of the silicon wafer, includes the steps of: (1) provide a silicon wafer 8800 in step 5602, as illustrated in FIG. 88a, (2) apply a buffer pad layer 8805 of silicon dioxide onto the silicon wafer 8800 in step 5604, as illustrated in FIG. 88b, (3) apply a layer 8810 of silicon nitride onto the silicon wafer 8800 in step 5606, as illustrated in FIG. 88c, (4) pattern the layer 8810 of silicon nitride in step 5608, as illustrated in FIG. 88d, (5) pattern the buffer pad layer 8805 of silicon dioxide in step 5610, as illustrated in FIG. 88e, (6) thin etch the exposed portions of the silicon wafer 8800 in step 5612, as illustrated in FIG. 88f, (7) grow a field layer 8815 of silicon dioxide onto the portions of the silicon wafer 8800 not covered by the patterned layer 8810 of silicon nitride in step 5614 (the field layer of silicon dioxide is preferably at least as thick as the combined thicknesses of the layer of silicon nitride and the optional buffer layer of silicon dioxide), as illustrated in FIG. 88g, (8) pattern the layers 8805 and 8815 of silicon dioxide in step 5616, as illustrated in FIG. 88h, (9) apply and pattern a layer 8820 of photoresist onto the silicon wafer 8800 in step 5620, as illustrated in FIG. 88i, (10) etch the exposed portions of the silicon wafer 8800 using a plasma or gaseous etchant in step 5622, as illustrated in FIG. 88j, (11) etch the exposed portions of the layers 8805 and 8815 of silicon dioxide in step 5624, as illustrated in FIG. 88k; (12) etch the exposed portions of the silicon wafer 8800 using a plasma or gaseous etchant in step 5626, as illustrated in FIG. 88l, (13) remove the layer 8820 of photoresist in step 5628, as illustrated in FIG. 88m, (14) etch the exposed portions of the silicon wafer 8800 in step 5630, as illustrated in FIG. 88n, (15) etch the exposed portions of the layers 8805 and 8815 of silicon dioxide in step 5632, as illustrated in FIG. 88o, (16) etch the exposed portions of the silicon wafer 8800 in step 5634, as illustrated in FIG. 88p, and (17) remove the remaining portions of the layers 8805, 8810 and 8815 of silicon dioxide and silicon nitride, as illustrated in FIG. 88q.

In a preferred implementation of the thirty-second embodiment of the LOCOS merged-mask micro-machining process 5600, the following process parameters are employed: the thickness of the pad buffer layer 8805 of silicon dioxide ranges from about 0.03 to 1 microns, the thickness of the layer 8810 of silicon nitride ranges from about 0.1 to 2.0 microns, the thickness of the field layer 8815 of silicon dioxide ranges from about 0.2 to 3.0 microns, the thickness of layer 8820 of photoresist ranges from about 1 to 10 microns, and the depth of the thin etch of the exposed portions of the silicon wafer 8800 ranges from about 0.5 to 1 microns.

In a preferred implementation of the thirty-second embodiment of the LOCOS merged-mask micro-machining process 5600, the etching performed in steps 5622 and 5626 comprises DRIE and provides sidewalls having an angle of 90°±45° relative to horizontal.

In a preferred implementation of the thirty-second embodiment of the LOCOS merged-mask micro-machining process 5600, the thin etch of the exposed portions of the silicon wafer 8800 in step 5612 is performed using a layer of photoresist as a masking layer.

Referring to FIGS. 56a, 56b, and 89a–89o, the thirty-third embodiment of the LOCOS merged-mask micro-machining process 5600, using photoresist as an etching mask with the use of an etched buffer layer of silicon dioxide and a thin etch of the exposed portions of the silicon wafer, includes the steps of: (1) provide a silicon wafer 8900 in step 5602, as illustrated in FIG. 89*a*, (2) apply a buffer pad layer 8905 of silicon dioxide onto the silicon wafer 8900 in step 5604, as illustrated in FIG. 89*b*, (3) apply a layer 8910 of silicon nitride onto the silicon wafer 8900 in step 5606, as illustrated in FIG. 89*c*, (4) pattern the layer 8910 of silicon nitride in step 5608, as illustrated in FIG. 89*d*, (5) pattern the buffer pad layer 8905 of silicon dioxide in step 5610, as illustrated in FIG. 89*e*, (6) thin etch the exposed portions of the silicon wafer 8900 in step 5612, as illustrated in FIG. 89*f*, (7) grow a field layer 8915 of silicon dioxide onto the portions of the silicon wafer 8900 not covered by the patterned layer 8910 of silicon nitride in step 5614 (the field layer of silicon dioxide is preferably at least as thick as the combined thicknesses of the layer of silicon nitride and the optional buffer layer of silicon dioxide), as illustrated in FIG. 89*g*, (8) pattern the layers 8905 and 8915 of silicon dioxide in step 5616, as illustrated in FIG. 89*h*, (9) apply and pattern a layer 8920 of photoresist onto the silicon wafer 8900 in step 5620, as illustrated in FIG. 89*i*, (10) etch the exposed portions of the layers 8905 and 8915 of silicon dioxide in step 5624, as illustrated in FIG. 89*j*; (11) remove the layer 8920 of photoresist in step 5628, as illustrated in FIG. 89*k*, (12) etch the exposed portions of the silicon wafer 8900 in step 5630, as illustrated in FIG. 89*l*, (13) etch the exposed portions of the layers 8905 and 8915 of silicon dioxide in step 5632, as illustrated in FIG. 89*m*, (14) etch the exposed portions of the silicon wafer 8900 in step 5634, as illustrated in FIG. 89*n*, and (15) remove the remaining portions of the layers 8905, 8910 and 8915 of silicon dioxide and silicon nitride, as illustrated in FIG. 89*o*.

In a preferred implementation of the thirty-third embodiment of the LOCOS merged-mask micro-machining process 5600, the following process parameters are employed: the thickness of the pad buffer layer 8905 of silicon dioxide ranges from about 0.03 to 1 microns, the thickness of the layer 8910 of silicon nitride ranges from about 0.1 to 2.0 microns, the thickness of the field layer 8915 of silicon dioxide ranges from about 0.2 to 3.0 microns, the thickness of layer 8920 of photoresist ranges from about 1 to 10 microns, and the depth of the thin etch of the exposed portions of the silicon wafer 8900 ranges from about 0.5 to 1 microns.

In a preferred implementation of the thirty-third embodiment of the LOCOS merged-mask micro-machining process 5600, the etching performed in steps 5622 and 5626 comprises DRIE and provides sidewalls having an angle of 90°±45° relative to horizontal.

In a preferred implementation of the thirty-third embodiment of the LOCOS merged-mask micro-machining process 5600, the thin etch of the exposed portions of the silicon wafer 8800 in step 5612 is performed using a layer of photoresist as a masking layer.

Referring to FIGS. 56*a*, 56*b*, and 90*a*–90*p*, the thirty-fourth embodiment of the LOCOS merged-mask micromachining process 5600, using photoresist as an etching mask with the use of an etched buffer layer of silicon dioxide and a thin etch of the exposed portions of the silicon wafer, includes the steps of: (1) provide a silicon wafer 9000 in step 5602, as illustrated in FIG. 90*a*, (2) apply a buffer pad layer 9005 of silicon dioxide onto the silicon wafer 9000 in step 5604, as illustrated in FIG. 90*b*, (3) apply a layer 9010 of silicon nitride onto the silicon wafer 9000 in step 5606, as illustrated in FIG. 90*c*, (4) pattern the layer 9010 of silicon nitride in step 5608, as illustrated in FIG. 90*d*, (5) pattern the buffer pad layer 9005 of silicon dioxide in step 5610, as illustrated in FIG. 90*e*, (6) thin etch the exposed portions of the silicon wafer 9000 in step 5612, as illustrated in FIG. 90*f*, (7) grow a field layer 9015 of silicon dioxide onto the portions of the silicon wafer 9000 not covered by the patterned layer 9010 of silicon nitride in step 5614 (the field layer of silicon dioxide is preferably at least as thick as the combined thicknesses of the layer of silicon nitride and the optional buffer layer of silicon dioxide), as illustrated in FIG. 90*g*, (8) pattern the layers 9005 and 9015 of silicon dioxide in step 5616, as illustrated in FIG. 90*h*, (9) apply and pattern a layer 9020 of photoresist onto the silicon wafer 9000 in step 5620, as illustrated in FIG. 90*i*, (10) etch the exposed portions of the layers 9005 and 9015 of silicon dioxide in step 5624, as illustrated in FIG. 90*j*; (11) etch the exposed portions of the silicon wafer 9000 using a plasma or gaseous etchant in step 5626, as illustrated in FIG. 90*k*; (12) remove the layer 9020 of photoresist in step 5628, as illustrated in FIG. 90*l*, (13) etch the exposed portions of the silicon wafer 9000 in step 5630, as illustrated in FIG. 90*m*, (14) etch the exposed portions of the layers 9005 and 9015 of silicon dioxide in step 5632, as illustrated in FIG. 90*n*, (15) etch the exposed portions of the silicon wafer 9000 in step 5634, as illustrated in FIG. 90*o*, and (16) remove the remaining portions of the layers 9005, 9010 and 9015 of silicon dioxide and silicon nitride, as illustrated in FIG. 90*p*.

In a preferred implementation of the thirty-fourth embodiment of the LOCOS merged-mask micro-machining process 5600, the following process parameters are employed: the thickness of the pad buffer layer 9005 of silicon dioxide ranges from about 0.03 to 1 microns, the thickness of the layer 9010 of silicon nitride ranges from about 0.1 to 2.0 microns, the thickness of the field layer 9015 of silicon dioxide ranges from about 0.2 to 3.0 microns, the thickness of layer 9020 of photoresist ranges from about 1 to 10 microns, and the depth of the thin etch of the exposed portions of the silicon wafer 9000 ranges from about 0.5 to 1 microns.

In a preferred implementation of the thirty-fourth embodiment of the LOCOS merged-mask micro-machining process 5600, the etching performed in steps 5622 and 5626 comprises DRIE and provides sidewalls having an angle of 90°±45° relative to horizontal.

In a preferred implementation of the thirty-fourth embodiment of the LOCOS merged-mask micro-machining process 5600, the thin etch of the exposed portions of the silicon wafer 9000 in step 5612 is performed using a layer of photoresist as a masking layer.

Referring to FIGS. 56*a*, 56*b*, and 91*a*–91*o*, the thirty-fifth embodiment of the LOCOS merged-mask micro-machining process 5600, using photoresist as an etching mask with the use of an etched buffer layer of silicon dioxide and a thin etch of the exposed portions of the silicon wafer, includes the steps of: (1) provide a silicon wafer 9100 in step 5602, as illustrated in FIG. 91*a*, (2) apply a buffer pad layer 9105 of silicon dioxide onto the silicon wafer 9100 in step 5604, as illustrated in FIG. 91*b*, (3) apply a layer 9110 of silicon nitride onto the silicon wafer 9100 in step 5606, as illustrated in FIG. 91*c*, (4) pattern the layer 9110 of silicon nitride in step 5608, as illustrated in FIG. 91*d*, (5) pattern the buffer pad layer 9105 of silicon dioxide in step 5610, as illustrated in FIG. 91*e*, (6) thin etch the exposed portions of the silicon wafer 9100 in step 5612, as illustrated in FIG. 91*f*, (7) grow a field layer 9115 of silicon dioxide onto the portions of the silicon wafer 9100 not covered by the patterned layer 9110 of silicon nitride in step 5614 (the field layer of silicon dioxide is preferably at least as thick as the combined thicknesses of the layer of silicon nitride and the optional buffer layer of silicon dioxide), as illustrated in FIG. 91g, (8) pattern the layers 9105 and 9115 of silicon dioxide in step 5616, as illustrated in FIG. 91h, (9) apply and pattern a layer 9120 of photoresist onto the silicon wafer 9100 in step 5620, as illustrated in FIG. 91i, (10) etch the exposed portions of the silicon wafer 9100 using a plasma or gaseous etchant in step 5626, as illustrated in FIG. 91j, (11) remove the layer 9120 of photoresist in step 5628, as illustrated in FIG. 91k, (12) etch the exposed portions of the silicon wafer 9100 in step 5630, as illustrated in FIG. 91l, (13) etch the exposed portions of the layers 9105 and 9115 of silicon dioxide in step 5632, as illustrated in FIG. 91m, (14) etch the exposed portions of the silicon wafer 9100 in step 5634, as illustrated in FIG. 91n, and (15) remove the remaining portions of the layers 9105, 9110, and 9115 of silicon dioxide and silicon nitride, as illustrated in FIG. 91o.

In a preferred implementation of the thirty-fifth embodiment of the LOCOS merged-mask micro-machining process 5600, the following process parameters are employed: the thickness of the pad buffer layer 9105 of silicon dioxide ranges from about 0.03 to 1 microns, the thickness of the layer 9110 of silicon nitride ranges from about 0.1 to 2.0 microns, the thickness of the field layer 9115 of silicon dioxide ranges from about 0.2 to 3.0 microns, the thickness of layer 9120 of photoresist ranges from about 1 to 10 microns, and the depth of the thin etch of the exposed portions of the silicon wafer 9100 ranges from about 0.5 to 1 microns.

In a preferred implementation of the thirty-fifth embodiment of the LOCOS merged-mask micro-machining process 5600, the etching performed in steps 5622 and 5626 comprises DRIE and provides sidewalls having an angle of 90°±45° relative to horizontal.

In a preferred implementation of the thirty-fifth embodiment of the LOCOS merged-mask micro-machining process 5600, the thin etch of the exposed portions of the silicon wafer 9100 in step 5612 is performed using a layer of photoresist as a masking layer.

In an alternative embodiment, wet anisotropic etchants such as, for example, (1) aqueous KOH mixed with isopropyl alcohol, (2) tetramethyl ammonium hydroxide, (3) a mixture of ethylenediamine and pyrocatechol, (4) cesium hydroxide, (5) a mixture of ethylene diamine pyrocatechol and water, (6) a mixture of ethanol amine, gallic acid and water, or (7) hydrazine are used in place of KOH.

In an alternative embodiment, where a masking layer of silicon dioxide is used with KOH etching, a thicker layer of silicon dioxide is used and then successively patterned and thinned to create a multiple thickness structure. A layer of a different masking material such as, for example, silicon nitride or silicon carbide is then applied and patterned. This combination of masking layers then provides a merged-mask.

In an alternative embodiment, where DRIE is combined with KOH etching, a number of masking layers are patterned for use with KOH, while other masking layers are patterned for use with DRIE. A combination of DRIE and KOH etching steps interspersed with mask removal steps are then used to form multiple etching depth structures in a substrate.

In an alternative embodiment, gaseous or plasma etching is used in combination with DRIE. In this manner, a merged-mask can be provided having multiple photoresist layers or photoresist layers in combination with metal masking layers.

In an alternative embodiment, DRIE and plasma etching are alternatively used.

In an alternative embodiment, masking materials that include diamond, SiC, metals and polymers are used in conjunction with the use of a combination of wet etching and dry etching.

In an alternative embodiment, timed erosion of a multiple thickness etch resistant layer of material is used to provide the different masking layers.

In an alternative embodiment, gaseous etchants such as, for example, xenon difluoride, chlorine trofluoride, bromine trofluoride, bromine heptafluoride, or iodine heptafluoride are used in place of, or in addition, to DRIE.

In an alternative embodiment, masking materials such as, for example, silicon carbide, polycrystalline diamond, etch resistant polymers, or aluminum are used in place of silicon dioxide and/or silicon nitride.

Referring now to FIGS. 92a and 92b, several alternative embodiments of localized oxidation of silicon (LOCOS) merged-mask micro-machining processes 9200 including multiple etch depths and optionally including the use of photoresist as an etching mask are illustrated. The processes 9200 are substantially a combination of the processes 5000 and 5600, described above with reference to FIGS. 50–91o. In a preferred embodiment, one of these processes 9200 is used in forming at least a portion of the mirror 210 and/or the top and bottom caps, 205 and 215. As illustrated in FIGS. 92a and 92b, the LOCOS merged-mask micro-machining process 9200 preferably includes the following process steps: (1) provide a silicon wafer in step 9202, (2) (optionally) grow a buffer layer of silicon dioxide onto the surface of the silicon wafer in step 9204, (3) apply a layer of silicon nitride onto the silicon wafer in step 9206, (4) pattern the layer of silicon nitride in step 9208, (5) (optionally) pattern the exposed portions of the buffer layer of silicon dioxide in step 9210, (6) (optionally) thin etch the exposed portions of the surface of the silicon wafer in step 9212, (7) grow field layers of silicon dioxide onto the portions of the silicon wafer not covered by the patterned layer of silicon nitride in step 9214 (the field layer of silicon dioxide is preferably at least as thick as the combined thicknesses of the layer of silicon nitride and the optional buffer layer of silicon dioxide), (8) pattern layer(s) of silicon dioxide in step 9216 (the etch depth is a fraction of the total thickness of the layers of silicon dioxide), (9) repeat step 9216 a predetermined number of times in step 9218, (10) (optionally) etch the exposed portions of the silicon wafer using photoresist as an etch mask in step 9220, (11) (optionally) apply and pattern a layer of photoresist onto the silicon wafer in step 9222, (12) (optionally) etch the exposed portions of the silicon wafer using a plasma or gaseous etchant in step 9224, (13) (optionally) remove the exposed portions of the layer(s) of silicon dioxide in step 9226, (14) (optionally) etch the exposed portions of the silicon wafer in step 9228, (15) remove the layer of photoresist in step 9230, (16) etch the exposed portions of the silicon wafer in step 9232, (17) etch the exposed portions of the layers of silicon dioxide in step 9234 (the etch depth is a fraction of the total thickness of the layers of silicon dioxide), (18) etch the exposed portions of the silicon wafer in step 9236, and (19) repeat steps 9234 and 9236 a predetermined number of times.

As will be recognized by persons having ordinary skill in the art and having the benefit of the present disclosure, patterning refers to the sequential operations of conventional photolithography and etching in order to produce patterns in a layer of material or a substrate. As will also be recognized by persons having ordinary skill in the art and having the benefit of the present disclosure, etching refers to the removal of at least a portion of the exposed portions of a layer of material or a substrate.

In a preferred implementation of the processes 9200, the following process parameters are employed: the thickness of the pad buffer layer of silicon dioxide ranges from about 0.03 to 1 microns, the thickness of the layer of silicon nitride ranges from about 0.1 to 2.0 microns, the thickness of the field layer of silicon dioxide ranges from about 0.2 to 3.0 microns, the thickness of the layer of photoresist ranges from about 1 to 10 microns, the depth of the thin etch of the exposed portions of the silicon wafer ranges from about 0.5 to 1 microns, the partial etching of the layers of silicon dioxide is repeated from 1 to 10 times for etch depths ranging from about 0.01 to 3 microns, and the partial etching of the silicon substrate is repeated from 1 to times for etch depths ranging from about 1 to 500 microns.

In a preferred implementation of the processes 9200, the etching performed in steps 9224 and 9228 comprises DRIE and provides sidewalls having an angle of 90°±45° relative to horizontal. In a preferred implementation of the processes 9200, the etching performed in steps 9232 and 9236 preferably comprises KOH etching.

In a preferred implementation of the processes 9200, the etching of the exposed portions of the silicon wafer in steps 9232 and 9236 is provided using KOH.

Referring now to FIGS. 93*a* and 93*b*, several alternative embodiments of merged-mask micro-machining processes 9300 including the use of various alternative masking materials, multiple etch depths, and optionally including the use of photoresist as an etching mask are illustrated. The processes 9300 are substantially identical to the processes 9200 with the subtraction of the various alternative methods of LOCOS, but with the addition of various alternative masking materials. In a preferred embodiment, one of these processes 9300 is used in forming at least a portion of the mirror 210 and/or the top and bottom caps, 205 and 215. As illustrated in FIGS. 93*a* and 93*b*, the merged-mask micro-machining process 9300 preferably includes the following process steps: (1) provide a silicon wafer in step 9302, (2) apply a masking layer of one of several alternative materials in step 9304, (3) pattern the masking layer in step 9306 (the etch depth is a fraction of the total thickness of the masking layer), (4) repeat step 9306 a predetermined number of times in step 9308, (5) (optionally) etch the exposed portions of the silicon wafer using photoresist as an etch mask in step 9310, (6) (optionally) apply and pattern a layer of photoresist onto the silicon wafer in step 9312, (7) (optionally) etch the exposed portions of the silicon wafer using a plasma or gaseous etchant in step 9314, (8) (optionally) remove the exposed portions of the masking layer in step 9316, (9) (optionally) etch the exposed portions of the silicon wafer in step 9318, (10) remove the layer of photoresist in step 9320, (11) etch the exposed portions of the silicon wafer in step 9322, (12) etch a fraction of the exposed portions of the masking layer in step 9324 (the etch depth is a fraction of the total thickness of the masking layer), (13) etch the exposed portions of the silicon wafer in step 9326 (the etch depth is a fraction of the total thickness of the silicon wafer), and (14) repeat steps 9324 and 9326 a predetermined number of times in step 9328.

As will be recognized by persons having ordinary skill in the art and having the benefit of the present disclosure, patterning refers to the sequential operations of conventional photolithography and etching in order to produce patterns in a layer of material or a substrate. As will also be recognized by persons having ordinary skill in the art and having the benefit of the present disclosure, etching refers to the removal of at least a portion of the exposed portions of a layer of material or a substrate.

In a preferred implementation of processes 9300, the following process parameters are employed: the partial etching of the masking layer is repeated from 1 to 10 times for etch depths ranging from about 0.01 to 3 microns, and the partial etching of the silicon substrate is repeated from 1 to 10 times for etch depths ranging from about 1 to 500 microns.

In a preferred implementation of the processes 9300, the etching performed in steps 9314 and 9318 comprises DRIE and provides sidewalls having an angle of 90°±45° relative to horizontal. In a preferred implementation of the processes 9300, the etching performed in steps 9322 and 9326 comprises KOH etching.

In a preferred implementation of the processes 9300, the etching of the exposed portions of the silicon wafer in steps 9322 and 9326 is provided using KOH.

Referring now to FIGS. 94–95*h*, an embodiment of a merged mask process 9400 for providing multiple etch depths in a substrate will now be described. In a preferred embodiment, the process 9400 includes the steps of: (1) provide a silicon substrate 9500 in step 9405, as illustrated in FIG. 95*a*; (2) deposit a layer 9505 of a first masking material onto the silicon substrate 9500 in step 9410, as illustrated in FIG. 95*b*; (3) pattern the layer 9505 of the first masking material in step 9415, as illustrated in FIG. 95*c*; (4) deposit a layer 9510 of a second masking material onto the silicon substrate 9500 in step 9420, as illustrated in FIG. 95*d*; (5) pattern the layer 9510 of the second masking material in step 9425, as illustrated in FIG. 95*e*; (6) etch the exposed portions 9500*a* of the silicon substrate 9500 to a first depth in step 9430, as illustrated in FIG. 95*f*, (7) etch the exposed portions of the layer 9505 of the first masking material in step 9435, as illustrated in FIG. 95*g*; and (8) etch the exposed portions, 9500*a*, 9500*b* and 9500*c*, of the silicon substrate 9500 to a second depth in step 9440, as illustrated in FIG. 95*h*.

As will be recognized by persons having ordinary skill in the art and having the benefit of the present disclosure, patterning refers to the sequential operations of conventional photolithography and etching in order to produce patterns in a layer of material or a substrate. As will also be recognized by persons having ordinary skill in the art and having the benefit of the present disclosure, etching refers to the removal of at least a portion of the exposed portions of a layer of material or a substrate.

In a preferred embodiment, as illustrated in FIG. 95*e*–95*h*, the exposed portions, 9500*a*, 9500*b* and 9500*c* of the silicon substrate 9500 have approximately the same width. In this manner, in a preferred embodiment, the region 9500 a has a deeper final etch depth than that of the regions 9500 b and 9500*c*.

In a preferred implementation of the process 9400, the first masking material comprises silicon dioxide; the second masking material comprises photoresist; the thickness of the first masking material ranges from about 1000 to 6000 angstroms; the thickness of the second masking material ranges from about 3 to 4 microns; the first etch depth ranges from about 10 to 250 microns; and the second etch depth range from about 10 to 300 microns. In an alternative embodiment of the process 9400, the first masking material comprises metal and the second masking material comprises photoresist or an etch resistant polymer.

In a preferred implementation of the process 9400, the etching performed in steps 9430 and 9440 comprises DRIE or plasma etching and provides sidewalls having an angle of 90°±45° relative to horizontal.

Referring now to FIGS. 96–97h, an embodiment of a merged-mask process 9600 for etching a silicon substrate will be described. In a preferred embodiment, the process 9600 includes the steps of: (1) provide a silicon substrate 9700 in step 9605, as illustrated in FIG. 97a; (2) deposit a layer 9705 of a first masking material onto the silicon substrate 9700 in step 9610, as illustrated in FIG. 97b; (3) pattern the layer 9705 of the first masking material in step 9615, as illustrated in FIG. 97c; (4) deposit a layer 9710 of a second masking material onto the silicon substrate 9700 in step 9620, as illustrated in FIG. 97d; (5) pattern the layer 9710 of the second masking material in step 9625, as illustrated in FIG. 97e; (6) etch the exposed portions of the silicon substrate 9700 for a first time period, as illustrated in FIG. 97f; (7) etch the exposed portions of the layer 9705 of the first masking material, as illustrated in FIG. 97g; and (8) etch the exposed portions of the silicon substrate 9700 for a second time period, as illustrated in FIG. 97h. In this manner, the etch depths of all of the etched areas of the silicon substrate 9700 are substantially equal.

As will be recognized by persons having ordinary skill in the art and having the benefit of the present disclosure, patterning refers to the sequential operations of conventional photolithography and etching in order to produce patterns in a layer of material or a substrate. As will also be recognized by persons having ordinary skill in the art and having the benefit of the present disclosure, etching refers to the removal of at least a portion of the exposed portions of a layer of material or a substrate.

In a preferred embodiment, as illustrated in FIG. 97e–97h, the exposed portion 9700a of the silicon substrate 9500 has a smaller width than that for the portions 9700b and 9700c. In this manner, in a preferred embodiment, the regions 9700a, 9700b and 9700c have final etch depths that are substantially equal. In a preferred embodiment, the etching time periods are adapted as a function of the widths of the exposed portions 9700a, 9700b and 9700c of the silicon substrate 9500 to provide substantially equal final etch depths wherein the smaller exposed portion 9700 a is etched more often than the larger exposed portions 9700b and 9700c.

In a preferred implementation of the process 9600, the first masking material comprises silicon dioxide; the second masking material comprises photoresist; the thickness of the first masking material ranges from about 1000 to 6000 angstroms; the thickness of the second masking material ranges from about 3 to 4 microns; the first time period ranges from about 5 to 30 minutes; and the second time period range from about 30 minutes to 2 hours. More generally, in a preferred embodiment, the first time period and the second time period are empirically determined by measuring the etch rates for different regions of a substrate having dissimilar widths.

In an alternative embodiment of the process 9600, the first masking material is silicon dioxide, metal, or an etch resistant polymer. In an alternative embodiment of the process 9600, the second masking material is photoresist or an etch resistant polymer.

In a preferred implementation of the process 9600, the etching performed in steps 9630 and 9640 comprises DRIE and provides sidewalls having an angle of 90°±45° relative to horizontal.

In a preferred embodiment, the process 9600 is used to eliminate the so-called microloading effect of plasma dry etching in which smaller exposed areas of silicon are etched at slower rates than larger exposed areas. Thus, the process 9600 provides multiple etching areas, having dissimilar exposed areas, in a silicon substrate having substantially equal final etching depths. In this manner, the microloading effect of plasma dry etching, as well as other types of etching, is optimally overcome.

In several alternative embodiments of the merged mask micro machining processes described in the present disclosure, as illustrated, for example, in FIG. 44–97h, the etching of the silicon substrate may be carried out using a variety of methods. For example, energetic ions produced in a plasma may be used to etch the silicon. Examples of gases used in a plasma for etching silicon include: sulfur hexafluoride, chlorine, and bromine. A preferred etching technique for high-aspect-ratio trench etching, also called deep-reactive ion etching (DRIE), is to time multiplex an etching gas such as, for example, sulfur hexafluoride with a gas used to form a passivating layer on the sidewalls of the trench. $C_4F_8$ is an example of a gas used for passivation of silicon sidewalls. Another alternative method of etching silicon is using a gas that is sufficiently reactive that etching of silicon takes place even without the activation by a plasma. Examples of reactive gases for etching silicon include, for example, xenon difluoride, chlorine trifluoride, bromine trifluoride, bromine heptafluoride, and iodine heptafluoride. Still another alternative method of etching silicon using a merged mask process includes the use of liquid etchants. The liquid may etch single crystal silicon in an anisotropic fashion. Examples of wet anisotropic etchants of silicon include, for example, aqueous potassium hydroxide (KOH), aqueous KOH mixed with isopropyl alcohol, tetramethyl ammonium hydroxide, aqueous cesium hydroxide, a mixture of: ethylene diamine, pyrocatecthol, and water, and a mixture of: ethanolamine, gallic acid, and water. The liquid may etch single crystal silicon isotropically. An example of an isotropic etchant of silicon is a mixture of nitric acid, ammonium fluoride, and water.

In several alternative embodiments, for the merged mask processes described in this application, as illustrated for example in FIGS. 44–97h, the etching of the silicon substrate may be carried out, for example, by a combination of methods. For example, the etching of the silicon substrate may proceed with one wet anisotropic etchant, and then the silicon substrate may be inserted into a different anisotropic etchant or etch chamber. A preferred embodiment of the use of a combination of etchants includes the use of: (1) aqueous KOH to etch silicon to achieve the advantage of a relatively high etch rate of silicon, and then (2) aqueous KOH mixed with isopropyl alcohol to etch the silicon to achieve a large ratio of etching rates between lightly doped single-crystal silicon and single-crystal silicon with substantial boron doping. In general, in a preferred embodiment, the etching process includes: (1) one etchant from any of the classes of wet etchants, plasma etchants, and reactive gaseous etchants, and then (2) switching to another etchant from one of the three classes. In a preferred embodiment, the changing of the silicon etch method may take place a multiplicity of times. The switching between etchants preferably takes advantage of the different etching properties to allow the creation of etch profiles desired for a particular micromechanical structure.

In several alternative embodiments, for the merged mask processes described in this application, as illustrated for example in FIGS. 44–97h, the preferred embodiment for etching of the silicon substrate is selected such that the etching method causes insignificant erosion of the masking material.

In several alternative embodiments, referring to FIG. 44, silicon etchants from any of the three classes of wet etchants, plasma etchants, and reactive gaseous etchants are preferred for both silicon etching steps 4445 and 4455. Again referring to FIG. 44, silicon etchants from any of the three classes of wet etchants, plasma etchants, and reactive gaseous etchants, for example, may be used for the optional thin silicon etch steps 4430; however, a preferred embodiment uses a plasma etchant.

In several alternative embodiments, referring to FIG. 50, silicon etchants from any of the three classes of wet etchants, plasma etchants, and reactive gaseous etchants are preferred for silicon etching steps 5050, 5060, and 5065. Among the class of wet etchants, tetramethyl ammonium hydroxide, with its relatively low etch rate of silicon dioxide in comparison to the etch rate of silicon, is preferred.

In several alternative embodiments, referring to FIGS. 56*a*–56*b*, silicon etchants from any of the three classes of wet etchants, plasma etchants, and reactive gaseous etchants are preferred for silicon etching steps 5630, and 5634. A silicon etchant from the class of plasma etchants or reactive gaseous etchants is preferred for the silicon etching steps 5622 and 5626.

In several alternative embodiments, referring to FIG. 92*a*–92*b*, silicon etchants from any of the three classes of wet etchants, plasma etchants, and reactive gaseous etchants are preferred for silicon etching steps 9232, 9236, and 9238. A silicon etchant from the class of plasma etchants or reactive gaseous etchants are preferred for the silicon etching steps 9224 and 9228.

In several alternative embodiments, referring to FIGS. 93*a*–93*b*, silicon etchants from any of the three classes of wet etchants, plasma etchants, and reactive gaseous etchants are preferred for silicon etching steps 9322, 9326, and 9328. A silicon etchant from the class of plasma etchants or reactive gaseous etchants are preferred for the silicon etching steps 9314 and 9318.

In several alternative embodiments, referring to FIGS. 94 through 97*h*, the preferred silicon etching method is with a plasma etchant, and the particular preferred etching method is plasma etching with time multiplexing of an etch gas and a gas for passivating the silicon sidewalls.

Referring to FIGS. 44–97*h*, the illustrative merged-mask micro-machining processes include features on one wafer surface only; however, in a preferred embodiment, these processes are conducted on both sides of the wafer. In this manner, etching is provided on both sides of the wafer.

A mirror assembly has been described that includes a mirror, a top cap and a bottom cap. The mirror includes a mirror support structure, a pair of T-shaped hinges coupled to the mirror support structure and a mirrored plate coupled to the T-shaped hinges. The mirrored plate includes one or more travel stops for limiting movement of the mirrored plate. The top cap is coupled to one side of the mirror. The top cap includes a top cap support structure including an opening for permitting light to reflect off of the mirrored plate and one or more travel stops coupled to the top cap support structure for limiting movement of the mirrored plate. The bottom cap is coupled to another side of the mirror. The bottom cap includes a bottom cap support structure including an opening and one or more travel stops coupled to the bottom cap support structure for limiting movement of the mirrored plate. In a preferred embodiment, the mirror support structure includes a top support member, a bottom support member, a right side support member and a left side support member. In a preferred embodiment, the mirror support structure includes an opening. In a preferred embodiment, the support structure opening includes a pair of oppositely positioned cut-outs. In a preferred embodiment, the support structure opening is complementary shaped with respect to the mirrored plate. In a preferred embodiment, the spacing between the edges of the support structure opening and the mirrored plate ranges from about 15 to 180 microns. In a preferred embodiment, the pair of T-shaped hinges include a top T-shaped hinge and a bottom T-shaped hinge positioned in opposing relation to the top T-shaped hinge. In a preferred embodiment, the mirrored plate includes a plate member including a first side and a second side, a reflective surface coupled to the first side of the plate member, a cavity formed in the second side of the plate member and a pair of travel stops coupled to the second side of the plate member. In preferred embodiment, the plate member cavity includes a V-shaped cross section. In a preferred embodiment, the mirrored plate includes a plate member and one or more travel stops extending from the plate member. In a preferred embodiment, the travel stops are positioned in the plane of the plate member. In a preferred embodiment, the plate member travel stops that are positioned in the plane of the plate member have a length and thickness ranging from about 500 to 2000 microns and 200 to 600 microns. In a preferred embodiment, the plate member extend from the plane of the plate member. In a preferred embodiment, the plate member travel stops that extend from the plane of the plate member have a length ranging from about 200 to 250 microns. In a preferred embodiment, the mirrored plate includes a plate member and a plurality of travel stops extending from the plate member. In a preferred embodiment, at least one of the plate member travel stops in positioned in the plane of the plate member and at least one of the travel stops extends from the plane of the plate member. In a preferred embodiment, each T-shaped hinge includes a first member and a second member coupled to the first member. In a preferred embodiment, the first and second members are substantially orthogonal. In a preferred embodiment, the length, width and thickness of the first hinge member ranges from about 500 to 4500 microns, 10 to 100 microns and 10 to 100 microns. In a preferred embodiment, the length, width and thickness of the second hinge member ranges from about 400 to 1800 microns, 2 to 35 micron and 2 to 35 microns. In a preferred embodiment, each T-shaped hinge provides a torsional spring. In a preferred embodiment, the spring constant ranges from about $2 \times 10^{-9}$ to $10 \times 10^{-7}$ lbf-ft/radian. In a preferred embodiment, the top cap travel stops are positioned in the plane of the top cap support structure. In a preferred embodiment, the thickness of the top cap travel stops are less than the thickness of the top cap support structure. In a preferred embodiment, the opening in the top cap support structure includes a pair of oppositely positioned cut-outs. In a preferred embodiment, the cut-outs include tapered walls. In a preferred embodiment, the taper angle of the tapered walls ranges from about 55 to 60 degrees. In a preferred embodiment, the top cap opening includes tapered walls. In a preferred embodiment, the taper angle of the tapered walls ranges from about 55 to 60 degrees. In a preferred embodiment, the bottom cap travel stops are positioned in the plane of the bottom cap support structure. In a preferred embodiment, the thickness of the bottom cap travel stops are less than the thickness of the bottom cap support structure. In a preferred embodiment, the bottom cap opening includes tapered walls.

In a preferred embodiment, the taper angle of the tapered walls ranges from about 55 to 60 degrees. In a preferred embodiment, the mirror assembly further includes a base member coupled to the bottom cap. In a preferred embodiment, the base member includes one or more drive pads for actuating the mirrored plate. In a preferred embodiment, the base member includes one or more sensing members for sensing the position of the mirrored plate. In a preferred embodiment, the bottom cap further includes one or more support members for supporting the mirrored plate during the manufacturing process. In a preferred embodiment, the length and thickness of the top cap travel stops range from about 800 to 2800 microns and 340 to 580 microns. In a preferred embodiment, the length and thickness of the bottom cap travel stops range from about 800 to 2800 microns and 340 to 580 microns. In a preferred embodiment, one or more of the T-shaped hinges include a first member and a second member coupled to the first member, wherein the second member is perpendicular to the first member. In a preferred embodiment, one or more of the T-shaped hinges include a first member and a second member coupled to the first member, wherein the second member is serpentine. In a preferred embodiment, one or more of the T-shaped hinges include a first member and a second member coupled to the first member, wherein the second member is offset from the center of the first member. In a preferred embodiment, one or more of the T-shaped hinges include a first member and a second member coupled to the first member, wherein the second member intersects the first member at an acute angle. In a preferred embodiment, the mirror assembly is fabricated using one or more of the merged-mask micro-machining processes disclosed in the present disclosure. In a preferred embodiment, each T-shaped hinge includes a translational spring constant and a rotational spring constant that are decoupled from one another.

A mirror assembly has also been described that includes a support structure, a pair of T-shaped hinges coupled to the support structure and a mirrored plate coupled to the T-shaped hinges. The mirrored plate includes one or more travel stops for limiting movement of the mirrored plate. In a preferred embodiment, each T-shaped hinge includes a rotational spring constant and a translational spring constant that are decoupled. In a preferred embodiment, the support structure includes a top support member, a bottom support member, a right side support member and a left side support member. In a preferred embodiment, the support structure includes an opening. In a preferred embodiment, the opening includes a pair of oppositely positioned cut-outs. In a preferred embodiment, the opening is complementary shaped with respect to the mirrored plate. In a preferred embodiment, the spacing between the edges of the opening and the mirrored plate ranges from about 15 to 180 microns. In a preferred embodiment, the pair of T-shaped hinges include a top T-shaped hinge and a bottom T-shaped hinge positioned in opposing relation to the top T-shaped hinge. In a preferred embodiment, the mirrored plate includes a plate member including a first side and a second side, a reflective surface coupled to the first side of the plate member, a cavity formed in the second side of the plate member and a pair of travel stops coupled to the second side of the plate member. In a preferred embodiment, the cavity includes a V-shaped cross section. In a preferred embodiment, the mirrored plate includes a plate member and one or more travel stops extending from the plate member. In a preferred embodiment, the travel stops are positioned in the plane of the plate member. In a preferred embodiment, the travel stops that are positioned in the plane of the plate member have a length and thickness that range from about 500 to 2000 microns and 200 to 600 microns. In a preferred embodiment, the travel stops extend from the plane of the plate member. In a preferred embodiment, the travel stops that extend from the plane of the plate member have a length that extends from about 200 to 250 microns. In a preferred embodiment, the mirrored plate includes a plate member and a plurality of travel stops extending from the plate member. In a preferred embodiment, at least one of the travel stops in positioned in the plane of the plate member and at least one of the travel stops extends from the plane of the plate member. In a preferred embodiment, each T-shaped hinge includes a first member and a second member coupled to the first member. In a preferred embodiment, the first and second members are substantially orthogonal. In a preferred embodiment, the length, width and thickness of the first member ranges from about 500 to 4500 microns, 10 to 100 microns and 10 to 100 microns. In a preferred embodiment, the length, width and thickness of the second member ranges from about 400 to 1800 microns, 20 to 35 microns and 2 to 35 microns. In a preferred embodiment, each T-shaped hinge provides a torsional spring. In a preferred embodiment, the spring constant ranges from about $2\times10^{-9}$ to $10\times10^{-7}$ lbf-ft/radian. In a preferred embodiment, one or more of the T-shaped hinges include a first member and a second member coupled to the first member, wherein the second member is perpendicular to the first member. In a preferred embodiment, one or more of the T-shaped hinges include a first member and a second member coupled to the first member, wherein the second member is serpentine. In a preferred embodiment, one or more of the T-shaped hinges include a first member and a second member coupled to the first member, wherein the second member is offset from the center of the first member. In a preferred embodiment, one or more of the T-shaped hinges include a first member and a second member coupled to the first member, wherein the second member intersects the first member at an acute angle. In a preferred embodiment, the mirror assembly is fabricated using one or more of the merged-mask micro-machining processes disclosed in the present disclosure.

An apparatus has also been described that includes one or more T-shaped springs and a mass coupled to the T-shaped springs. In a preferred embodiment, the mass includes a reflective surface. In a preferred embodiment, the mass includes one or more travel stops for limiting movement of the mass. In a preferred embodiment, the apparatus further includes a top cap coupled to the top of the mass, wherein the top cap includes one or more travel stops for limiting movement of the mass. In a preferred embodiment, the apparatus further includes a bottom cap coupled to bottom of the mass, wherein the bottom cap includes one or more travel stops for limiting movement of the mass. In a preferred embodiment, the apparatus further includes a top cap coupled to the top of the mass and a bottom cap coupled to the bottom of the mass, wherein the top and bottom caps each include one or more travel stops for limiting movement of the mass. In a preferred embodiment, the apparatus is fabricated using one or more of the merged-mask micro-machining processes disclosed in the present disclosure. In a preferred embodiment, each T-shaped hinge includes a rotational spring constant and a translational spring constant that are decoupled. In a preferred embodiment, the apparatus comprises an accelerometer. In a preferred embodiment, the apparatus comprises a gyroscope.

An apparatus also has been described that includes a housing, a mass, and one or more springs for coupling the mass to the housing. Each spring includes a rotational spring constant and a translational spring constant. The rotational spring constant is decoupled from the translational spring constant. In a preferred embodiment, the springs are fabricated by a process including micromachining a substrate. In a preferred embodiment, the housing, mass and springs are fabricated by a process including micromachining a substrate. In a preferred embodiment, each spring comprises a plurality of springs. In a preferred embodiment, each spring is T-shaped. In a preferred embodiment, the apparatus further includes a top cap coupled to the top of the housing including a top cap cutout and a bottom cap coupled to the bottom of the housing including a bottom cap cutout. The top and bottom cap cutouts limit movement of the mass when the mass is rotated away from its rest position. In a preferred embodiment, each cutout includes tapered side walls. In a preferred embodiment, the tapered side walls are rotated from the vertical direction at an angle ranging from about 15 to 45 degrees.

A method of resiliently supporting a mass in a housing also has been described that includes coupling the mass to the housing using one or more springs having translational spring constants and rotational spring constants and decoupling the translational spring constants from the rotational spring constants. In a preferred embodiment, the springs are fabricated by a process including micromachining a substrate. In a preferred embodiment, the housing, mass and springs are fabricated by a process including micromachining a substrate. In a preferred embodiment, each spring comprises a plurality of springs. In a preferred embodiment, each spring is T-shaped. In a preferred embodiment, method further includes limiting movement of the mass when it is rotated from a rest position. In a preferred embodiment, limiting movement of the mass when it is rotated from a rest position includes limiting translation of the mass when it is rotated from the rest position.

A method of resiliently supporting a mass in a housing also has been described that includes limiting translational movement of the mass in the X, Y and Z directions and limiting rotational movement of the mass. In a preferred embodiment, the housing and mass are fabricated by a process including micromachining a substrate. In a preferred embodiment, the method further includes limiting movement of the mass when it is rotated from a rest position. In a preferred embodiment, limiting movement of the mass when it is rotated from a rest position includes limiting translation of the mass when it is rotated from the rest position.

An apparatus also has been described that includes a housing and a mass resiliently coupled to the housing, the mass including one or more travel stops for limiting rotational and translational movement of the mass. In a preferred embodiment, the housing includes an opening for receiving the mass that limits the translational movement of the mass. In a preferred embodiment, the apparatus further includes a top cap coupled to the top of the housing and a bottom cap coupled to the bottom of the housing. The top and bottom caps limit movement of the mass when it is rotated out of its rest position within the housing. In a preferred embodiment, the top and bottom caps includes cutouts. In a preferred embodiment, each cutout includes tapered side walls. In a preferred embodiment, the tapered side walls are rotated from the vertical direction at an angle ranging from about 15 to 45 degrees.

An apparatus also has been described that includes a housing including an opening, the opening including one or more cutouts and a reflective surface resiliently coupled to the housing. In a preferred embodiment, each cutout includes tapered side walls. In a preferred embodiment, the tapered side walls are rotated from the vertical direction at an angle ranging from about 15 to 45 degrees. In a preferred embodiment, the housing and reflective surface are fabricated by a process including micromachining a substrate.

A method of reflecting rays of light also has been described that includes providing a reflective surface and providing an optical pathway for accessing the reflective surface including one or more cutouts for minimizing clipping of the incident and reflected light rays. In a preferred embodiment, the optical pathway includes sidewalls that are rotated from the vertical direction at an angle ranging from about 15 to 45 degrees. In a preferred embodiment, the optical pathway and reflective surface are fabricated by a process including micromachining a substrate.

A method of fabricating a three-dimensional structure has also been described that includes (1) providing a substrate; (2) applying a layer of a first masking material onto the substrate; (3) patterning the layer of the first masking material; (4) applying a layer of a second masking material onto the exposed portions of the substrate, the layer of the second masking material is at least as thick as the layer of the first masking material; (5) patterning the layer of the second masking material; (6) etching the exposed portions of the substrate; (7) etching the exposed portions of the layer of the second masking material; and (8) etching the exposed portions of the substrate. In a preferred embodiment, the method further includes prior to step (4), etching the exposed portions of the substrate. In a preferred embodiment, etching the exposed portions of the substrate includes thin etching. In a preferred embodiment, step (2) includes applying a layer of a third masking material onto the substrate and applying the layer of the first masking material onto the layer of the third masking material. In a preferred embodiment, applying the layer of the third masking material includes thermal oxidation of the substrate. In a preferred embodiment, step (4) includes applying a layer of a second masking material onto the exposed portions of the substrate, the layer of the second masking material is at least as thick as the combined thickness of the layers of the first and third masking materials. In a preferred embodiment, applying the layer of the second material includes local oxidation of the substrate. In a preferred embodiment, step (5) includes patterning the layers of the second and third masking materials. In a preferred embodiment, the method further includes prior to step (4), etching the exposed portions of the substrate. In a preferred embodiment, etching the exposed portions of the substrate includes thin etching. In a preferred embodiment, step (4) includes applying a layer of a second masking material onto the exposed portions of the substrate, the layer of the second masking material is at least as thick as the combined thickness of the layers of the first and third masking materials. In a preferred embodiment, applying the layer of second masking material includes local oxidation of the substrate. In a preferred embodiment, step (5) includes patterning the layers of the second and third masking materials. In a preferred embodiment, the method further includes prior to step (4), etching the exposed portions of the substrate. In a preferred embodiment, etching the exposed portions of the substrate includes thin etching. In a preferred embodiment, step (4) includes applying a layer of a second masking material onto the exposed portions of the substrate, the layer of the second masking material is at least as thick as the combined thickness of the layers of the first and third masking materials. In a preferred embodiment, applying the layer of the second masking material includes local oxidation of the substrate. In a preferred embodiment, step (5) includes patterning the layers of the second and third masking materials. In a preferred embodiment, the first masking material comprises silicon nitride; and wherein the second masking material comprises silicon dioxide. In a preferred embodiment, the first masking material comprises silicon nitride, the second masking material comprises silicon dioxide; and the third masking material comprises silicon dioxide. In a preferred embodiment, steps (6) and (8) comprise wet etching the exposed portions of the substrate.

A method of fabricating a three-dimensional structure has also been described that includes providing a substrate, applying a layer of a first masking material onto the substrate, patterning the layer of the first masking material, applying a layer of a second masking material onto the patterned layer of the first masking material, patterning the layer of the second masking material, dry etching the exposed portions of the substrate, etching the exposed portions of the patterned layer of the first masking material, and dry etching the exposed portions of the substrate. In a preferred embodiment, applying the layer of the first masking material includes thermal oxidation of the substrate. In a preferred embodiment, the first masking material is selected from the group consisting of silicon dioxide, metal, and etch resistant polymer, and the second masking material is selected from the group consisting of photoresist and etch resistant polymer. In a preferred embodiment, dry etching comprises deep reactive ion etching.

A method of fabricating a three-dimensional structure has also been described that includes (1) providing a substrate, (2) applying a layer of a first masking material onto the substrate, (3) patterning the layer of the first masking material, (4) applying a layer of a second masking material onto the exposed portions of the substrate, the layer of the second masking material is at least as thick as the layer of the first masking material, (5) patterning a fraction of the thickness of the layer of the second masking material a plurality of times, (6) etching the exposed portions of the substrate, (7) etching a fraction of the thickness of the exposed portions of the layer of the second masking material, (8) etching the exposed portions of the substrate, and (9) repeating steps (7) and (8) a plurality of times. In a preferred embodiment, the method further includes prior to step (4), etching the exposed portions of the substrate. In a preferred embodiment, the exposed portions of the substrate are thin etched. In a preferred embodiment, step (2) includes applying a layer of a third masking material onto the substrate and applying the layer of the first masking material onto the layer of the third masking material. In a preferred embodiment, applying the layer of the third masking material includes thermal oxidation of the substrate. In a preferred embodiment, step (4) includes applying a layer of a second masking material onto the exposed portions of the substrate, the layer of the second masking material is at least as thick as the combined thickness of the layers of the first and third masking materials. In a preferred embodiment, applying the layer of the second masking material includes local oxidation of the substrate. In a preferred embodiment, step (5) includes patterning a fraction of the thickness of the layers of the second and third masking materials a plurality of times. In a preferred embodiment, the method further includes prior to step (4), patterning the layer of the third masking material. In a preferred embodiment, step (4) includes applying a layer of a second masking material onto the exposed portions of the substrate, the layer of the second masking material is at least as thick as the combined thickness of the layers of the first and third masking materials. In a preferred embodiment, applying the layer of the second masking material includes local oxidation of the substrate. In a preferred embodiment, step (5) includes patterning a fraction of the layers of the second and third masking materials a plurality of times. In a preferred embodiment, the method further includes prior to step (4), etching the exposed portions of the substrate. In a preferred embodiment, the exposed portions of the substrate are thin etched. In a preferred embodiment, step (4) includes applying a layer of a second masking material onto the exposed portions of the substrate, the layer of the second masking material is at least as thick as the combined thickness of the layers of the first and third masking materials. In a preferred embodiment, applying the layer of the second masking material includes local oxidation of the substrate. In a preferred embodiment, step (5) includes patterning a fraction of the layers of the second and third masking materials a plurality of times. In a preferred embodiment, the first masking material comprises silicon nitride; and wherein the second masking material comprises silicon dioxide. In a preferred embodiment, the first masking material comprises silicon nitride; wherein the second masking material comprises silicon dioxide; and wherein the third masking material comprises silicon dioxide. In a preferred embodiment, steps (6) and (8) comprise wet etching of the exposed portions of the substrate.

A method of fabricating a three-dimensional structure has also been described that includes (1) providing a substrate, (2) applying a layer of a first masking material onto the substrate, (3) patterning the layer of the first masking material, (4) applying a layer of a second masking material onto the exposed portions of the substrate, the layer of the second masking material is at least as thick as the layer of the first masking material, (5) patterning the layer of the second masking material, (6) applying a layer of a third masking material onto substrate, (7) patterning the layer of the third masking material, (8) etching the layer of the third masking material, (9) etching the exposed portions of the substrate, (10) etching the exposed portions of the layer of the second masking material, and (11) etching the exposed portions of the substrate. In a preferred embodiment, the first, second and third masking materials comprise silicon nitride, silicon dioxide, and photoresist. In a preferred embodiment, the method further includes prior to step (4), etching the exposed portions of the substrate. In a preferred embodiment, the exposed portions of the substrate are thin etched. In a preferred embodiment, step (2) includes applying a layer of a fourth masking material onto the substrate and applying the layer of the first masking material onto the layer of the fourth masking material. In a preferred embodiment, applying the layer of the fourth masking material includes thermal oxidation of the substrate. In a preferred embodiment, step (4) includes applying a layer of a second masking material onto the exposed portions of the substrate, the layer of the second masking material is at least as thick as the combined thickness of the layers of the first and fourth masking materials. In a preferred embodiment, applying the layer of the second masking material includes local oxidation of the substrate. In a preferred embodiment, step (5) includes patterning the layers of the second and fourth masking materials. In a preferred embodiment, the method further includes prior to step (4), patterning the layer of the fourth masking material. In a preferred embodiment, step (4) includes applying a layer of a second masking material onto the exposed portions of the substrate, the layer of the second masking material is at least as thick as the combined thickness of the layers of the first and fourth masking materials. In a preferred embodiment, applying the layer of the second masking material includes local oxidation of the substrate. In a preferred embodiment, step (5) includes patterning the layers of the second and fourth masking materials. In a preferred embodiment, the method further includes prior to step (4), etching the exposed portions of the substrate. In a preferred embodiment, the exposed portions of the substrate are thin etched. In a preferred embodiment, step (4) includes applying a layer of a second masking material onto the exposed portions of the substrate, the layer of the second masking material is at least as thick as the combined thickness of the layers of the first and fourth masking materials. In a preferred embodiment, applying the layer of the second masking material includes local oxidation of the substrate. In a preferred embodiment, step (5) includes patterning the layers of the second and fourth masking materials. In a preferred embodiment, the first masking material comprises silicon nitride; wherein the second masking material comprises silicon dioxide; and wherein the third masking material comprises a photoresist material. In a preferred embodiment, the first masking material comprises silicon nitride; wherein the second masking material comprises silicon dioxide; wherein the third masking material comprises a photoresist material; and wherein the fourth masking material comprises silicon dioxide. In a preferred embodiment, the method further includes between steps (7) and (8), etching the exposed portions of the substrate. In a preferred embodiment, the exposed portions of the substrate are thin etched. In a preferred embodiment, the method further includes between steps (7) and (8), performing the following: etching the exposed portions of the substrate and etching the exposed portions of the layer of the second masking material. In a preferred embodiment, etching the exposed portions of the substrate includes dry etching. In a preferred embodiment, the method further includes between steps (7) and (8), performing the following: etching the exposed portions of the substrate a plurality of times. In a preferred embodiment, the exposed portions of the substrate are dry etched. In a preferred embodiment, the method further includes between steps (7) and (8), performing the following: etching the exposed portions of the substrate, etching the exposed portions of the layer of the second masking material and etching the exposed portions of the substrate. In a preferred embodiment, the exposed portions of the substrate are dry etched. In a preferred embodiment, the method further includes: between steps (7) and (8), performing the following: etching the exposed portions of the layer of the second masking material. In a preferred embodiment, the exposed portions of the substrate are dry etched. In a preferred embodiment, the method further includes between steps (7) and (8), performing the following: etching the exposed portions of the layer of the second masking material and etching the exposed portions of the substrate. In a preferred embodiment, the exposed portions of the substrate are dry etched. In a preferred embodiment, steps (9) and (11) comprise wet etching of the exposed portions of the substrate.

A method of fabricating a three-dimensional structure has also been described that includes (1) providing a substrate, (2) applying a layer of a first masking material onto the substrate, (3) patterning the layer of the first masking material, (4) applying a layer of a second masking material onto the exposed portions of the substrate, the layer of the second masking material is at least as thick as the layer of the first masking material, (5) patterning a fraction of the thickness of the layer of the second masking material a plurality of times, (6) applying a layer of a third masking material onto substrate, (7) patterning the layer of the third masking material, (8) etching the layer of the third masking material, (9) etching the exposed portions of the substrate, (10) etching a fraction of the thickness of the exposed portions of the layer of the second masking material, (11) etching the exposed portions of the substrate, and (12) repeat steps (10) and (11) a plurality of times. In a preferred embodiment, the first, second and third masking materials comprise silicon nitride, silicon dioxide, and photoresist. In a preferred embodiment, the method further includes prior to step (4), etching the exposed portions of the substrate. In a preferred embodiment, the exposed portions of the substrate are thin etched. In a preferred embodiment, step (2) includes applying a layer of a fourth masking material onto the substrate and applying the layer of the first masking material onto the layer of the fourth masking material. In a preferred embodiment, applying the layer of the fourth masking material includes thermal oxidation of the substrate. In a preferred embodiment, step (4) includes applying a layer of a second masking material onto the exposed portions of the substrate, the layer of the second masking material is at least as thick as the combined thickness of the layers of the first and fourth masking materials. In a preferred embodiment, applying the layer of the second masking material includes local oxidation of the substrate. In a preferred embodiment, step (5) includes patterning a fraction of the thickness of the layers of the second and fourth masking materials a plurality of times. In a preferred embodiment, the method further includes prior to step (4), patterning the layer of the fourth masking material. In a preferred embodiment, step (4) includes applying a layer of a second masking material onto the exposed portions of the substrate, the layer of the second masking material is at least as thick as the combined thickness of the layers of the first and fourth masking materials. In a preferred embodiment, applying the layer of the second masking material includes local oxidation of the substrate. In a preferred embodiment, step (5) includes patterning a fraction of the thickness of the layers of the second and fourth masking materials a plurality of times. In a preferred embodiment, the method further includes prior to step (4), etching the exposed portions of the substrate. In a preferred embodiment, the exposed portions of the substrate are thin etched. In a preferred embodiment, step (4) includes applying a layer of a second masking material onto the exposed portions of the substrate, the layer of the second masking material is at least as thick as the combined thickness of the layers of the first and fourth masking materials. In a preferred embodiment, applying the layer of the second masking material includes local oxidation of the substrate. In a preferred embodiment, step (5) includes patterning a fraction of the thickness of the layers of the second and fourth masking materials a plurality of times. In a preferred embodiment, the first masking material comprises silicon nitride, the second masking material comprises silicon dioxide, and the third masking material comprises a photoresist material. In a preferred embodiment, the first masking material comprises silicon nitride, the second masking material comprises silicon dioxide, the third masking material comprises a photoresist material, and the fourth masking material comprises silicon dioxide. In a preferred embodiment, the method further includes between steps (7) and (8), etching the exposed portions of the substrate. In a preferred embodiment, the exposed portions of the substrate are dry etched. In a preferred embodiment, the method further includes between steps (7) and (8), performing the following: etching the exposed portions of the substrate and etching the exposed portions of the layer of the second masking material. In a preferred embodiment, the exposed portions of the substrate are dry etched. In a preferred embodiment, the method further includes between steps (7) and (8), performing the following: etching the exposed portions of the substrate a plurality of times. In a preferred embodiment, the exposed portions of the substrate are dry etched. In a preferred embodiment, the method further includes between steps (7) and (8), performing the following: etching the exposed portions of the substrate, etching the exposed portions of the layer of the second masking material, and etching the exposed portions of the substrate. In a preferred embodiment, the exposed portions of the substrate are dry etched. In a preferred embodiment, the method further includes between steps (7) and (8), performing the following: etching the exposed portions of the layer of the second masking material. In a preferred embodiment, the method further includes between steps (7) and (8), performing the following: etching the exposed portions of the layer of the second masking material and etching the exposed portions of the substrate. In a preferred embodiment, the exposed portions of the substrate are dry etched. In a preferred embodiment, steps (9) and (11) comprise wet etching.

A method of fabricating a three-dimensional structure has also been described that includes (1) providing a substrate, (2) applying a layer of a first masking material onto the substrate, (3) patterning a fraction of the thickness of the layer of the first masking material a plurality of times, (4) applying a layer of a second masking material onto substrate, (5) patterning the layer of the second masking material, (6) etching the layer of the second masking material, (7) etching the exposed portions of the substrate, (8) etching a fraction of the thickness of the exposed portions of the layer of the first masking material, (9) etching the exposed portions of the substrate, and (10) repeat steps (8) and (9) a plurality of times. In a preferred embodiment, the first masking material is selected from the group consisting of: silicon carbide, silicon nitride, polycrystalline diamond, and an etch resistant polymer. In a preferred embodiment, the second masking material comprises a photoresist material. In a preferred embodiment, the method further includes between steps (5) and (6), etching the exposed portions of the substrate. In a preferred embodiment, the exposed portions of the substrate are dry etched. In a preferred embodiment, the method further includes between steps (5) and (6), performing the following: etching the exposed portions of the substrate and etching the exposed portions of the layer of the second masking material. In a preferred embodiment, the exposed portions of the substrate are dry etched. In a preferred embodiment, the method further includes between steps (5) and (6), performing the following: etching the exposed portions of the substrate a plurality of times. In a preferred embodiment, the exposed portions of the substrate are dry etched. In a preferred embodiment, the method further includes between steps (5) and (6), performing the following: etching the exposed portions of the substrate, etching the exposed portions of the layer of the second masking material, and etching the exposed portions of the substrate. In a preferred embodiment, the exposed portions of the substrate are dry etched. In a preferred embodiment, the method further includes between steps (5) and (6), performing the following: etching the exposed portions of the layer of the second masking material. In a preferred embodiment, the method further includes between steps (5) and (6), performing the following: etching the exposed portions of the layer of the second masking material and etching the exposed portions of the substrate. In a preferred embodiment, the exposed portions of the substrate are dry etched. In a preferred embodiment, steps (7) and (9) include wet etching.

A method of fabricating a three-dimensional structure has also been described that includes providing a substrate, applying a layer of a first masking material onto the substrate, patterning the layer of the first masking material, applying a layer of a second masking material onto the patterned first layer of masking material, patterning the layer of the second masking material, dry etching the exposed portions of the substrate, etching the exposed portions of the layer of the first masking material, and dry etching the exposed portions of the substrate. In a preferred embodiment, dry etching includes deep reactive ion etching. In a preferred embodiment, the first masking material is selected from the group consisting of silicon dioxide, metal and etch resistant polymer, and the second masking material is selected from the group consisting of photoresist and etch resistant polymer.

A method of fabricating a three-dimensional structure has also been described that includes providing a substrate, applying a layer of a first masking material onto the substrate, patterning the layer of the first masking material, applying a layer of a second masking material onto the patterned first layer of masking material, patterning the layer of the second masking material, dry etching a first group of exposed portions of the substrate for a first time period, etching the exposed portions of the layer of the first masking material, and dry etching a second group of exposed portions of the substrate for a second time period, wherein the first time period and the second time period are a function of the relative sizes of the exposed portions of the substrate. In a preferred embodiment, the first group of exposed portions of the substrate include exposed portions having first cross sectional areas and the second group of exposed portions of the substrate includes exposed portions having first and second cross sectional areas. The second cross sectional areas are greater than the first cross sectional areas. In a preferred embodiment, dry etching includes deep reactive ion etching. In a preferred embodiment, the first masking material is selected from the group consisting of silicon dioxide, metal and etch resistant polymer, and the second masking material is selected from the group consisting of photoresist and etch resistant polymer.

A method of micro-machining a substrate has also been described that includes wet etching the substrate and dry etching the substrate. In a preferred embodiment, the wet etching includes a wet merged-mask micro-machining process. In a preferred embodiment, the method includes the use of masking layers comprised of silicon dioxide and silicon nitride. In a preferred embodiment, the dry etching includes a dry merged-mask micro-machining process. In a preferred embodiment, the method includes the use of masking layers comprised of silicon dioxide and photoresist.

A method of creating multiple masking layers for use in micro-machining a substrate has also been described that includes applying a layer of an etch resistant material onto the substrate and eroding different areas of the layer at different rates to form a multiple thickness layer.

A method of micromachining a substrate has also been described that includes using a combination of different etchants having different anisotropic properties.

A method of micromachining a substrate has also been described that includes decoupling a first etching process from a second etching process.

Although illustrative embodiments of the invention have been shown and described, a wide range of modification, changes and substitution is contemplated in the foregoing disclosure. In some instances, some features of the present invention may be employed without a corresponding use of the other features. Accordingly, it is appropriate that the appended claims be construed broadly and in a manner consistent with the scope of the invention.

What is claimed is:

1. A method of fabricating a three-dimensional structure, comprising:
   providing a substrate;
   applying a layer of a first masking material onto the substrate;
   patterning the layer of the first masking material;
   thin etching the exposed portions of the substrate;
   applying a layer of a second masking material onto the exposed portions of the substrate, the layer of the second masking material is at least as thick as the layer of the first masking material;
   patterning the layer of the second masking material;
   etching the exposed portions of the substrate;
   etching the exposed portions of the layer of the second masking material; and
   etching the exposed portions of the substrate.

2. The method of claim 1, wherein the first masking material comprises silicon nitride; and wherein the second masking material comprises silicon dioxide.

3. The method of claim 1, wherein applying the layer of the second masking material includes local oxidation of the substrate.

4. The method of claim 1, wherein etching the exposed portions of the substrate comprises wet etching of the exposed portions of the substrate.

5. The method of claim 1 further including between said patterning the layer of the second masking material and said etching the exposed portions of the substrate, performing the following:
   applying a layer of a third masking material onto the substrate;
   patterning the layer of the third masking material;
   etching exposed areas of the second masking material;
   applying a layer of a fourth masking material onto the substrate;
   etching the exposed portions of the substrate; and
   removing the fourth masking material.

6. The method of claim 1 further comprising patterning the layer of the first masking material.

7. A method of fabricating a three-dimensional structure, comprising:
   providing a substrate;
   applying a layer of a first masking material onto the substrate;
   applying a layer of a second masking material onto the layer of the first masking material;
   patterning the layer of the second masking material;
   applying a layer of a third masking material onto the portions not covered by the patterned layer of the second masking material, the layer of the third masking material is at least as thick as the combined thickness of the layers of the first and second masking materials;
   patterning the layers of the first and third masking materials;
   etching the exposed portions of the substrate;
   etching the exposed portions of the layers of the first and third masking materials; and
   etching the exposed portions of the substrate.

8. The method of claim 7, further including applying said layer of third masking material, etching the exposed portions of the substrate.

9. The method of claim 8, wherein etching the exposed portions of the substrate comprises thin etching the exposed portions of the substrate.

10. A method of fabricating a three-dimensional structure, comprising:
    providing a substrate;
    applying a layer of a first masking material onto the substrate;
    applying a layer of a second masking material onto the layer of the first masking material;
    patterning the layer of the second masking material;
    patterning the layer of the first masking material;
    applying a layer of a third masking material onto the portions not covered by the patterned layer of the second masking material, the layer of the third masking material is at least as thick as the combined thickness of the layers of the first and second masking materials;
    patterning the layers of the first and third masking materials;
    etching the exposed portions of the substrate;
    etching the exposed portions of the layers of the first and third masking materials; and
    etching the exposed portions of the substrate.

11. The method of claim 10, wherein the first masking material comprises silicon dioxide; wherein the second masking material comprises silicon nitride; and the third masking material comprises silicon dioxide.

12. The method of claim 10, wherein applying the layer of the first masking material includes thermal oxidation of the substrate.

13. The method of claim 10, wherein applying the layer of the third masking material includes local oxidation of the substrate.

14. The method of claim 10, wherein etching the exposed portions of the substrate comprises wet etching of the exposed portions of the substrate.

15. A method of fabricating a three-dimensional structure, comprising:
    providing a substrate;
    applying a layer of a first masking material onto the substrate;
    applying a layer of a second masking material onto the layer of the first masking material;
    patterning the layer of the second masking material;
    patterning the layer of the first masking material;
    thin etching the exposed portions of the substrate;
    applying a layer of a third masking material onto the portions not covered by the patterned layer of the second masking material, the layer of the third masking material is at least as thick as the combined thickness of the layers of the first and second masking materials;
    patterning the layers of the first and third masking materials;
    etching the exposed portions of the substrate;
    etching the exposed portions of the layers of the first and third masking materials; and
    etching the exposed portions of the substrate.

16. The method of claim 15, wherein the first masking material comprises silicon dioxide; wherein the second masking material comprises silicon nitride; and the third masking material comprises silicon dioxide.

17. The method of claim 15, wherein applying the layer of the first masking material includes thermal oxidation of the substrate.

18. The method of claim 15, wherein applying the layer of the third masking material includes local oxidation of the substrate.

19. The method of claim 15, wherein etching the exposed portions of the substrate comprises wet etching of the exposed portions of the substrate.

20. A method of fabricating a three-dimensional structure, comprising:

providing a substrate;

applying a layer of a first masking material onto the substrate, said first masking material being one of silicon dioxide aud a metal;

patterning the layer of the first masking material;

applying a layer of a second masking material onto the patterned layer of the first masking material, said second masking material being one of a photoresist and an etch resistant polymer;

patterning the layer of the second masking material;

dry etching the exposed portions of the substrate;

etching the exposed portions of the patterned layer of the first masking material; and dry etching the exposed portions of the substrate.

21. A method of fabricating a three-dimensional structure, comprising:

(1) providing a substrate;

(2) applying a layer of a first masking material onto the substrate;

(3) patterning the layer of the first masking material;

(4) applying a layer of a second masking material onto the exposed portions of the substrate, the layer of the second masking material is at least as thick as the layer of the first masking material;

(5) patterning a fraction of the thickness of the layer of the second masking material a plurality of times;

(6) etching the exposed portions of the substrate;

(7) etching a fraction of the thickness of the exposed portions of the layer of the second masking material;

(8) etching the exposed portions of the substrate; and (9) repeating steps (7) and (8) a plurality of times.

22. The method of claim 21, further including prior to step (4), etching the exposed portions of the substrate.

23. The method of claim 21, wherein step (2) comprises:

applying a layer of a third masking material onto the substrate; and applying the layer of the first masking material onto the layer of the third masking material.

24. The method of claim 23, further including prior to step (4), etching the exposed portions of the third masking material and thin etching the exposed portions of the substrate.

25. The method of claim 23, wherein step (4) comprises:

applying a layer of a second masking material onto the exposed portions of the substrate, the layer of the second masking material is at least as thick as the combined thickness of the layers of the first and third masking materials.

26. The method of claim 23, wherein step (5) comprises patterning a fraction of the thickness of the layers of the second and third masking materials a plurality of times.

27. The method of claim 23 further including prior to step (4), patterning the layer of the third masking material.

28. The method of claim 27, wherein step (4) comprises applying a layer of a second masking material onto the exposed portions of the substrate, the layer of the second masking material is at least as thick as the combined thickness of the layers of the first and third masking materials.

29. The method of claim 27, wherein step (5) comprises patterning a fraction of the layers of the second and third masking materials a plurality of times.

30. The method of claim 23, further including prior to step (4), etching the exposed portions of the substrate.

31. The method of claim 30, wherein step (4) comprises applying a layer of a second masking material onto the exposed portions of the substrate, the layer of the second masking material is at least as thick as the combined thickness of the layers of the first and third masking materials.

32. The method of claim 30, wherein step (5) comprises patterning a fraction of the layers of the second and third masking materials a plurality of times.

33. A method of fabricating a three-dimensional structure, comprising:

(1) providing a substrate;

(2) applying a layer of a first masking material onto the substrate;

(3) patterning the layer of the first masking material;

(4) applying a layer of a second masking material onto the exposed portions of the substrate, the layer of the second masking material is at least as thick as the layer of the first masking material;

(5) patterning a fraction of the thickness of the layer of the second masking material a plurality of times;

(6) applying a layer of a third masking material onto substrate;

(7) patterning the layer of the third masking material;

(8) etching the layer of the third masking material;

(9) etching the exposed portions of the substrate;

(10) etching a fraction of the thickness of the exposed portions of the layer of the second masking material;

(11) etching the exposed portions of the substrate; and

(12) repeat steps (10) and (11) a plurality of times.

34. The method of claim 33, further including prior to step (4), etching the exposed portions of the substrate.

35. The method of claim 34, wherein the step (2) comprises applying a layer of a fourth masking material onto the substrate, and applying the layer of the first masking material onto the layer of the fourth masking material.

36. The method of claim 34, wherein the exposed portions of the substrate are thin etched.

37. The method of claim 33, wherein step (2) comprises:

applying a layer of a fourth masking material onto the substrate; and applying the layer of the first masking material onto the layer of the fourth masking material.

38. The method of claim 37, wherein step (4) comprises applying a layer of a second masking material onto the exposed portions of the substrate, the layer of the second masking material is at least as thick as the combined thickness of the layers of the first and fourth masking materials.

39. The method of claim 37, wherein step (5) comprises patterning the a fraction of the thickness of the layers of the second and fourth masking materials a plurality of times.

40. The method of claim 37, further including prior to step (4), patterning the layer of the fourth masking material.

41. The method of claim 40, wherein step (4) comprises applying a layer of a second masking material onto the exposed portions of the substrate, the layer of the second masking material is at least as thick as the combined thickness of the layers of the first and fourth masking materials.

42. The method of claim 41, wherein applying the layer of the second masking material includes local oxidation of the substrate.

43. The method of claim 40, wherein step (5) comprises patterning a fraction of the thickness of the layers of the second and fourth masking materials a plurality of times.

44. The method of claim 40, wherein the first masking material comprises silicon nitride;

wherein the second masking material comprises silicon dioxide; wherein the third masking material comprises a photoresist material; and wherein the fourth masking material comprises silicon dioxide.

45. The method of claim 37, further including prior to step (4), etching the exposed portions of the substrate.

46. The method of claim 45, wherein step (4) comprises applying a layer of a second masking material onto the exposed portions of the substrate, the layer of the second masking material is at least as thick as the combined thickness of the layers of the first and fourth masking materials.

47. The method of claim 45, wherein step (5) comprises patterning a fraction of the thickness of the layers of the second and fourth masking materials a plurality of times.

48. The method of claim 37, wherein the first masking material comprises silicon nitride;

wherein the second masking material comprises silicon dioxide; wherein the third masking material comprises a photoresist material; and wherein the fourth masking material comprises silicon dioxide.

49. The method of claim 37, further including between steps (7) and (8), etching the exposed portions of the substrate.

50. The method of claim 37, further including between steps (7) and (8), performing the following:

etching the exposed portions of the substrate; and etching the exposed portions of the layer of the second masking material.

51. The method of claim 37, further including between steps (7) and (8), performing the following:

etching the exposed portions of the substrate a plurality of times.

52. The method of claim 37, further including between steps (7) and (8), performing the following:

etching the exposed portions of the substrate;

etching the exposed portions of the layer of the second masking material; and etching the exposed portions of the substrate.

53. The method of claim 37, further including between steps (7) and (8), performing the following:

etching the exposed portions of the layer of the second masking material.

54. The method of claim 37, further including between steps (7) and (8), performing the following:

etching the exposed portions of the layer of the second masking material; and etching the exposed portions of the substrate.

55. The method of claim 33, wherein the first masking material comprises silicon nitride;

wherein the second masking material comprises silicon dioxide; and wherein the third masking material comprises a photoresist material.

\* \* \* \* \*